US011991926B2

(12) United States Patent
Song et al.

(10) Patent No.: US 11,991,926 B2
(45) Date of Patent: May 21, 2024

(54) ORGANIC ELECTROLUMINESCENT DEVICE

(71) Applicant: LG DISPLAY CO., LTD., Seoul (KR)

(72) Inventors: Inbum Song, Seoul (KR); Seunghee Yoon, Seoul (KR); Sunghoon Kim, Seoul (KR); Seong-Min Park, Seoul (KR); Tae Wan Lee, Seoul (KR); Jae Ho Jeong, Incheon (KR); Jiwoong Yoo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 604 days.

(21) Appl. No.: 16/850,370

(22) Filed: Apr. 16, 2020

(65) Prior Publication Data

US 2020/0335705 A1 Oct. 22, 2020

(30) Foreign Application Priority Data

Apr. 17, 2019 (KR) ........................ 10-2019-0044980

(51) Int. Cl.

*H01L 51/54* (2006.01)
*H10K 85/30* (2023.01)
*H10K 85/60* (2023.01)
*H10K 50/11* (2023.01)
*H10K 50/15* (2023.01)

(52) U.S. Cl.

CPC ....... *H10K 85/6572* (2023.02); *H10K 85/322* (2023.02); *H10K 85/615* (2023.02); *H10K 85/631* (2023.02); *H10K 85/633* (2023.02); *H10K 85/6574* (2023.02); *H10K 85/6576* (2023.02); *H10K 50/11* (2023.02); *H10K 50/15* (2023.02)

(58) Field of Classification Search

None

See application file for complete search history.

(56) References Cited

U.S. PATENT DOCUMENTS

| | | | | |
|---|---|---|---|---|
| 10,854,821 | B2 | 12/2020 | Ikari et al. | |
| 2010/0133521 | A1* | 6/2010 | Shioya | C07C 13/567 257/E51.027 |
| 2014/0061602 | A1* | 3/2014 | Kato | C07C 211/61 257/40 |
| 2016/0163995 | A1 | 6/2016 | Kang et al. | |
| 2018/0301629 | A1* | 10/2018 | Hatakeyama | H01L 51/0052 |
| 2019/0058124 | A1* | 2/2019 | Hatakeyama | C07F 5/027 |
| 2020/0176679 | A1* | 6/2020 | Jeong | C09K 11/06 |

FOREIGN PATENT DOCUMENTS

| | | | | |
|---|---|---|---|---|
| CN | 105679946 | A | 6/2016 | |
| JP | 2014-232861 | A | 12/2014 | |
| KR | 20130121597 | A * | 11/2013 | |
| KR | 1876763 | B1 * | 7/2018 | C07F 5/027 |
| WO | WO-2016152544 | A1 * | 9/2016 | C07F 5/02 |

OTHER PUBLICATIONS

Hatakeyama et al. Adv. Mater. 2016, 28, 2777-2781. (Year: 2016).*
Machine translation of KR-20130121597-A. (Year: 2013).*
Office Action dated Jan. 9, 2022, issued in corresponding Chinese Patent Application No. 202010306046.1.
Office Action issued on Jan. 16, 2024 in Korean Patent Application No. 10-2019-0044980.

* cited by examiner

*Primary Examiner* — Andrew K Bohaty
(74) *Attorney, Agent, or Firm* — Morgan, Lewis & Bockius LLP

(57) ABSTRACT

Disclosed is an organic electroluminescent device including a first electrode, one or more organic material layers, and a second electrode, wherein the organic material layer includes a light emitting layer, wherein one or more layers of the organic material layer contain a compound represented by Chemical Formula 1, wherein the light emitting layer contains a compound represented by Chemical Formula 2. The organic electroluminescent device has lowered drive voltage, and improved efficiency and lifespan characteristics.

[Chemical Formula 1]

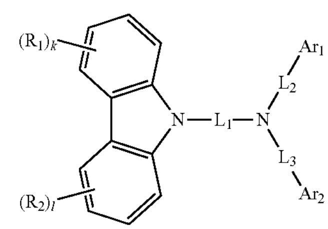

[Chemical Formula 2]

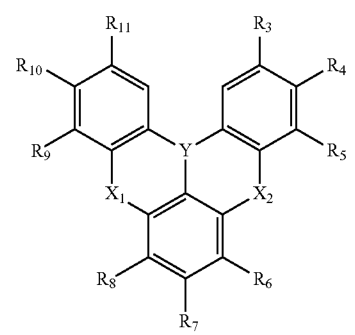

17 Claims, 2 Drawing Sheets

【FIG. 1】
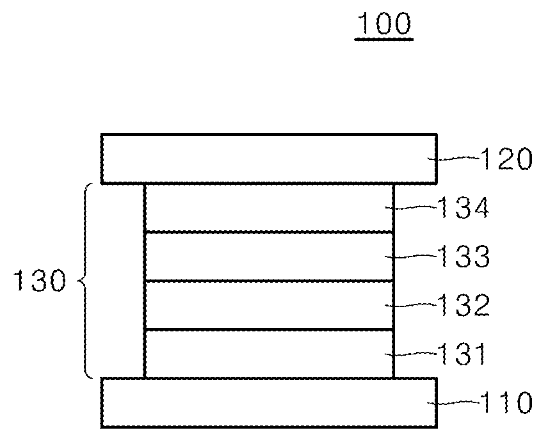
【FIG. 2】
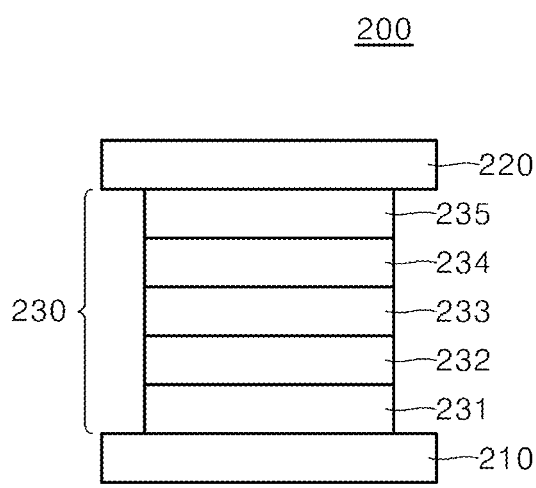

【FIG. 3】
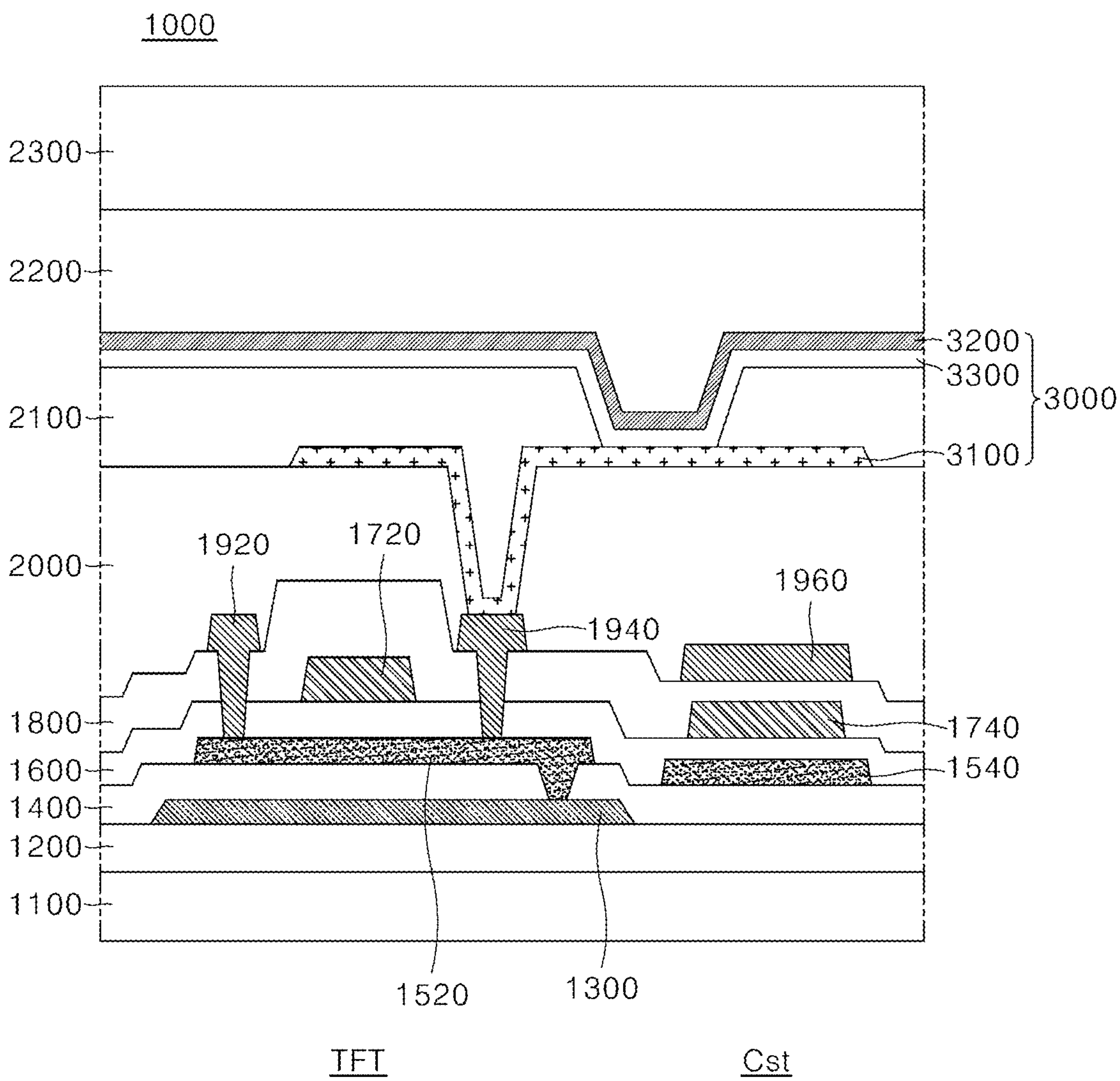

ORGANIC ELECTROLUMINESCENT DEVICE

CROSS-REFERENCE TO RELATED APPLICATION

This application claims the priority of Korean Patent Application No. 10-2019-0044980, filed on Apr. 17, 2019, in the Korean Intellectual Property Office, the disclosure of which is hereby incorporated by reference in its entirety.

BACKGROUND

Technical Field

The present disclosure relates to an organic electroluminescent device.

Description of the Related Art

As a display device becomes larger recently, a flat display device with good space utilization is getting more attention. One of such flat display devices may include an organic light-emitting display device including an organic light-emitting diode (OLED). The organic light-emitting display device is rapidly developing.

In the organic light-emitting diode (OLED), when charges are injected into a light-emitting layer formed between a first electrode and a second electrode to form paired electrons and holes to form excitons, exciton energy is converted to light for emission. The organic light emitting diode may be driven at a lower voltage and has a relatively low power consumption than a conventional display device. The organic light emitting diode may have advantages of having excellent color rendering and being able to be applied to a flexible substrate for various applications.

SUMMARY

Accordingly, embodiments of the present disclosure are directed to an organic electroluminescent device that substantially obviates one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic electroluminescent device comprises a first electrode, one or more organic material layers, and a second electrode, wherein the organic material layer includes a light emitting layer, wherein one or more layers of the organic material layer contain a compound represented by a following Chemical Formula 1, wherein the light emitting layer contains a compound represented by a following Chemical Formula 2:

[Chemical Formula 1]

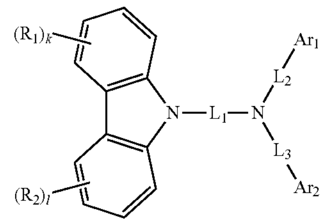

where in the Chemical Formula 1, each of $L_1$ to $L_3$ independently represents one selected from a group consisting of a single bond, a substituted or unsubstituted C6 to C30 arylene group, a substituted or unsubstituted C3 to C30 heteroarylene group, a substituted or unsubstituted C1 to C20 alkylene group, a substituted or unsubstituted C3 to C20 cycloalkylene group, a substituted or unsubstituted C2 to C20 alkenylene group, a substituted or unsubstituted C3 to C20 cycloalkenylene group, a substituted or unsubstituted C1 to C20 heteroalkylene group, a substituted or unsubstituted C3 to C20 heterocycloalkylene group, a substituted or unsubstituted C1 to C20 heteroalkenylene group, a substituted or unsubstituted C3 to C20 heterocycloalkenylene group, and combinations thereof, each of $Ar_1$ and $Ar_2$ independently represents one selected from a group consisting of a substituted or unsubstituted C6 to C30 aryl group, a substituted or unsubstituted C3 to C30 heteroaryl group, a substituted or unsubstituted C1 to C20 alkyl group, a substituted or unsubstituted C2 to C20 alkenyl group, a substituted or unsubstituted C2 to C20 alkynyl group, a substituted or unsubstituted C3 to C20 cycloalkyl group, a substituted or unsubstituted C1 to C20 heteroalkyl group, a substituted or unsubstituted C3 to C20 heterocycloalkyl group, a substituted or unsubstituted C3 to C20 cycloalkenyl group, and a substituted or unsubstituted C1 to C20 heteroalkenyl group, wherein at least one of $Ar_1$ and $Ar_2$ includes one selected from a substituted or unsubstituted C6 to C30 aryl group, and a substituted or unsubstituted C3 to C30 heteroaryl group, $R_1$ and $R_2$ are the same as or different from each other, and each of $R_1$ and $R_2$ independently represents one selected from a group consisting of hydrogen, deuterium, a trifluoromethyl group, a nitro group, a halogen group, a hydroxy group, a substituted or unsubstituted C1 to C20 alkyl group, an unsubstituted C3 to C30 cycloalkyl group, a substituted or unsubstituted C2 to C30 alkenyl group, a substituted or unsubstituted C2 to C20 alkynyl group, a substituted or unsubstituted C1 to C20 heteroalkyl group, a substituted or unsubstituted C7 to C30 aralkyl group, a substituted or unsubstituted C6 to C30 aryl group, a substituted or unsubstituted C3 to C30 heteroaryl group, a substituted or unsubstituted C3 to C20 heteroaralkyl group, a substituted or unsubstituted C1 to C30 alkylsilyl group, a substituted or unsubstituted C6 to C30 arylsilyl group, and a substituted or unsubstituted C3 to C30 heteroarylsilyl group, each of k and l independently denotes an integer from 0 to 4,

[Chemical Formula 2]

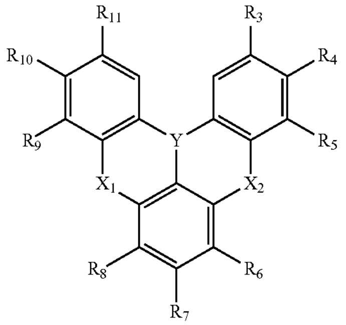

where in the Chemical Formula 2,

Y is B, P (=O) or P (=S), $X_1$ and $X_2$ are the same as or different from each other, and each of $X_1$ and $X_2$ independently represents one selected from a group consisting of O, S, Se and $N(R_{12})$, $R_3$ to $R_{12}$ are the same as or different from each other, and each of $R_3$ to $R_{12}$ independently represents one selected from a group consisting of hydrogen, deuterium, a trifluoromethyl group, a nitro group, a halogen group, a hydroxy group, a substituted or unsubstituted C1 to C20 alkyl group, an unsubstituted C3 to C30 cycloalkyl group, a substituted or unsubstituted C2 to C30 alkenyl group, a substituted or unsubstituted C2 to C20 alkynyl group, a substituted or unsubstituted C1 to C20 heteroalkyl group, a substituted or unsubstituted C7 to C30 aralkyl group, a substituted or unsubstituted C6 to C30 aryl group, a substituted or unsubstituted C3 to C30 heteroaryl group, a substituted or unsubstituted C3 to C20 heteroaralkyl group, a substituted or unsubstituted C1 to C30 alkylsilyl group, a substituted or unsubstituted C6 to C30 arylsilyl group, a substituted or unsubstituted C3 to C30 heteroarylsilyl group, a substituted or unsubstituted C1 to C20 alkoxy group, a substituted or unsubstituted C1 to C20 alkylamino group, a substituted or unsubstituted C6 to C30 arylamino group, a substituted or unsubstituted C7 to C30 aralkylamino group, a substituted or unsubstituted C2 to C30 hetero arylamino group, a substituted or unsubstituted C1 to C30 alkylsilyl group, a substituted or unsubstituted C6 to C30 arylsilyl group, and a substituted or unsubstituted C6 to C30 aryloxy group, wherein adjacent two of $R_3$ to $R_{12}$ are coupled to each other to form a substituted or unsubstituted ring.

The organic electroluminescent device containing the novel compound according to the present disclosure may have lowered drive voltage, improved efficiency, and long lifespan.

It is to be understood that both the foregoing general description and the following detailed description are exemplary and explanatory and are intended to provide further explanation of the inventive concepts as claimed.

DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 1 is a schematic cross-sectional view of an organic electroluminescent device according to one embodiment of the present disclosure.

FIG. 2 is a schematic cross-sectional view of an organic electroluminescent device according to one implementation of the present disclosure.

FIG. 3 is a schematic cross-sectional view of an organic light-emitting display device employing the organic electroluminescent device according to another implementation of the present disclosure.

DETAILED DESCRIPTIONS

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, a term "unsubstituted" means that a hydrogen atom has not been substituted. In this case, the hydrogen atom includes protium, deuterium and tritium. According to some embodiments of the present disclosure, hydrogen means protium.

As used herein, a substituent in the term "substituted" may include one selected from a group consisting of, for example, an alkyl group of 1 to 20 carbon atoms unsubstituted or substituted with halogen, an alkoxy group having 1 to 20 carbon atoms unsubstituted or substituted with halogen, halogen, a cyano group, a carboxy group, a carbonyl group, an amine group, an alkylamine group having 1 to 20 carbon atoms, a nitro group, an alkylsilyl group having 1 to 20 carbon atoms, an alkoxysilyl group having 1 to 20 carbon atoms, a cycloalkylsilyl group having 3 to 30 carbon atoms, an arylsilyl group having 5 to 30 carbon atoms, an aryl group having 5 to 30 carbon atoms, an arylamine group having 5 to 20 carbon atoms, a heteroaryl group having 4 to 30 carbon atoms, and a combination thereof. However, the present disclosure is not limited thereto.

As used herein, the term "alkyl" includes "cycloalkyl", and refer to a monovalent substituent derived from a straight chain or side chain saturated hydrocarbon having 1 to 40 carbon atoms and a monocyclic or polycyclic non-aromatic hydrocarbon having 3 to 40 carbon atoms. Examples thereof include methyl, ethyl, propyl, isobutyl, sec-butyl, pentyl, iso-amyl, hexyl, cyclopropyl, cyclobutyl, cyclopentyl, cyclohexyl, norbornyl, adamantyl, etc. However, the present disclosure is not limited thereto.

As used herein, the term "alkenyl" includes "cycloalkenyl" and refers to a monovalent substituent derived from a straight chain or side chain or cyclic unsaturated hydrocarbon having 2 to 40 carbon atoms and having one or more carbon-carbon double bonds. Examples thereof include, but are not limited to, vinyl, allyl, isopropenyl, 2-butenyl, cyclopropenyl, cyclobutenyl, cyclopentenyl, cyclohexenyl, and the like.

As used herein, the term "alkylene" includes "cycloalkylene", and refers to a divalent atomic group formed by excluding two hydrogen atoms from two different carbon atoms of aliphatic saturated hydrocarbon. Examples thereof include, but are not limited to, ethylene, propylene, butylene, amylene, hexylene, cyclopropylene, cyclobutylene, cyclopentylene, cyclohexylene, and adamantylene, etc.

As used herein, a term "heterocyclic ring" includes a hetero aromatic ring and a hetero alicyclic ring. Each of the "hetero aromatic ring" and the "hetero alicyclic ring" may contain a single ring or a polycyclic ring. Further, each of the terms "hetero aromatic ring" and "hetero alicyclic ring" may contain at least two single rings as in biphenyl.

As used herein, the term "hetero" as used in the term 'hetero ring', 'hetero aromatic ring', or 'hetero alicyclic ring' means that one or more carbon atoms, for example, 1 to 5 carbon atoms among carbon atoms constituting the aromatic or alicyclic ring are substituted with at least one hetero atom selected from a group consisting of N, O, S and combinations thereof.

As used herein, the phase "combination thereof" as used in the definition of the substituent means that two or more substituents are bonded to each other via a linking group or two or more substituents are bonded to each other via condensation, unless otherwise defined.

Hereinafter, the present disclosure describes a novel compound according to some embodiments of the present disclosure, and an organic electro-luminescent device including the compound.

According to one implementation of the present disclosure, there is provided an organic electroluminescent device including a first electrode, one or more organic material layers, and a second electrode, wherein the organic material layer includes a light emitting layer, wherein one or more layers of the organic material layer contain a compound represented by a following Chemical Formula 1, wherein the light emitting layer contains a compound represented by a following Chemical Formula 2:

[Chemical Formula 1]

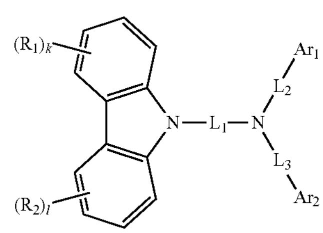

where in the Chemical Formula 1, each of $L_1$ to $L_3$ independently represents one selected from a group consisting of a single bond, a substituted or unsubstituted C6 to C30 arylene group, a substituted or unsubstituted C3 to C30 heteroarylene group, a substituted or unsubstituted C1 to C20 alkylene group, a substituted or unsubstituted C3 to C20 cycloalkylene group, a substituted or unsubstituted C2 to C20 alkenylene group, a substituted or unsubstituted C3 to C20 cycloalkenylene group, a substituted or unsubstituted C1 to C20 heteroalkylene group, a substituted or unsubstituted C3 to C20 heterocycloalkylene group, a substituted or unsubstituted C1 to C20 heteroalkenylene group, a substituted or unsubstituted C3 to C20 heterocycloalkenylene group, and combinations thereof, each of $Ar_1$ and $Ar_2$ independently represents one selected from a group consisting of a substituted or unsubstituted C6 to C30 aryl group, a substituted or unsubstituted C3 to C30 heteroaryl group, a substituted or unsubstituted C1 to C20 alkyl group, a substituted or unsubstituted C2 to C20 alkenyl group, a substituted or unsubstituted C2 to C20 alkynyl group, a substituted or unsubstituted C3 to C20 cycloalkyl group, a substituted or unsubstituted C1 to C20 heteroalkyl group, a substituted or unsubstituted C3 to C20 heterocycloalkyl group, a substituted or unsubstituted C3 to C20 cycloalkenyl group, and a substituted or unsubstituted C1 to C20 heteroalkenyl group, wherein at least one of $Ar_1$ and $Ar_2$ includes one selected from a substituted or unsubstituted C6 to C30 aryl group, and a substituted or unsubstituted C3 to C30 heteroaryl group, $R_1$ and $R_2$ are the same as or different from each other, and each of $R_1$ and $R_2$ independently represents one selected from a group consisting of hydrogen, deuterium, a trifluoromethyl group, a nitro group, a halogen group, a hydroxy group, a substituted or unsubstituted C1 to C20 alkyl group, an unsubstituted C3 to C30 cycloalkyl group, a substituted or unsubstituted C2 to C30 alkenyl group, a substituted or unsubstituted C2 to C20 alkynyl group, a substituted or unsubstituted C1 to C20 heteroalkyl group, a substituted or unsubstituted C7 to C30 aralkyl group, a substituted or unsubstituted C6 to C30 aryl group, a substituted or unsubstituted C3 to C30 heteroaryl group, a substituted or unsubstituted C3 to C20 heteroaralkyl group, a substituted or unsubstituted C1 to C30 alkylsilyl group, a substituted or unsubstituted C6 to C30 arylsilyl group, and a substituted or unsubstituted C3 to C30 heteroarylsilyl group, each of k and 1 independently denotes an integer from 0 to 4,

[Chemical Formula 2]

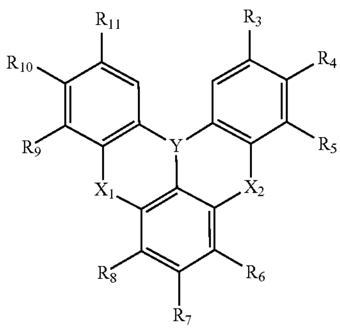

where in the Chemical Formula 2,

Y is B, P (═O) or P (═S), $X_1$ and $X_2$ are the same as or different from each other, and each of $X_1$ and $X_2$ independently represents one selected from a group consisting of O, S, Se and $N(R_{12})$, $R_3$ to $R_{12}$ are the same as or different from each other, and each of $R_3$ to $R_{12}$ independently represents one selected from a group consisting of hydrogen, deuterium, a trifluoromethyl group, a nitro group, a halogen group, a hydroxy group, a substituted or unsubstituted C1 to C20 alkyl group, an unsubstituted C3 to C30 cycloalkyl group, a substituted or unsubstituted C2 to C30 alkenyl group, a substituted or unsubstituted C2 to C20 alkynyl group, a substituted or unsubstituted C1 to C20 heteroalkyl group, a substituted or unsubstituted C7 to C30 aralkyl group, a substituted or unsubstituted C6 to C30 aryl group, a substituted or unsubstituted C3 to C30 heteroaryl group, a substituted or unsubstituted C3 to C20 heteroaralkyl group, a substituted or unsubstituted C1 to C30 alkylsilyl group, a substituted or unsubstituted C6 to C30 arylsilyl group, a substituted or unsubstituted C3 to C30 heteroarylsilyl group, a substituted or unsubstituted C1 to C20 alkoxy group, a substituted or unsubstituted C1 to C20 alkylamino group, a substituted or unsubstituted C6 to C30 arylamino group, a substituted or unsubstituted C7 to C30 aralkylamino group, a substituted or unsubstituted C2 to C30 hetero arylamino group, a substituted or unsubstituted C1 to C30 alkylsilyl group, a substituted or unsubstituted C6 to C30 arylsilyl group, and a substituted or unsubstituted C6 to C30 aryloxy group, wherein adjacent two of $R_3$ to $R_{12}$ are coupled to each other to form a substituted or unsubstituted ring.

The compound represented by the above Chemical Formula 1 may be contained in a hole transport layer or an auxiliary hole transport layer of the organic electroluminescent device.

Specifically, the compound corresponding to the Chemical Formula 1 is as follows, but is not limited thereto.

1-1

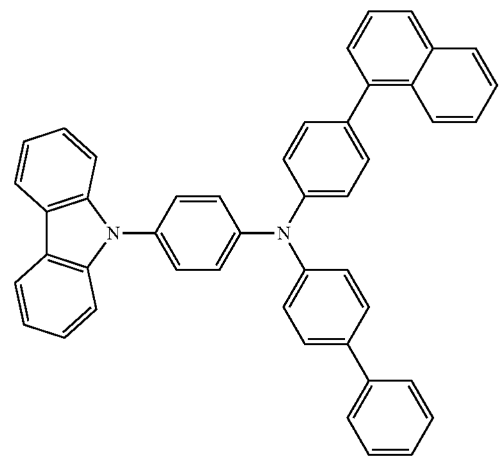

1-2

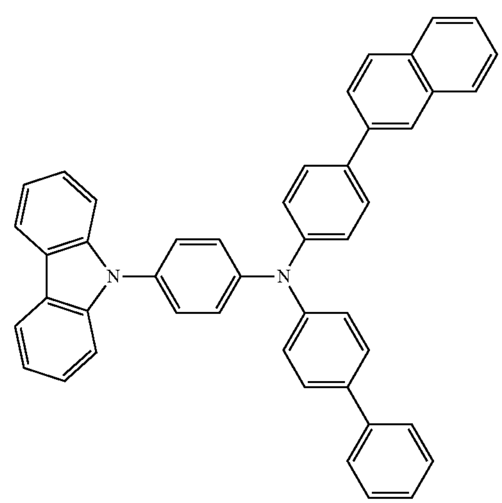

-continued
1-3
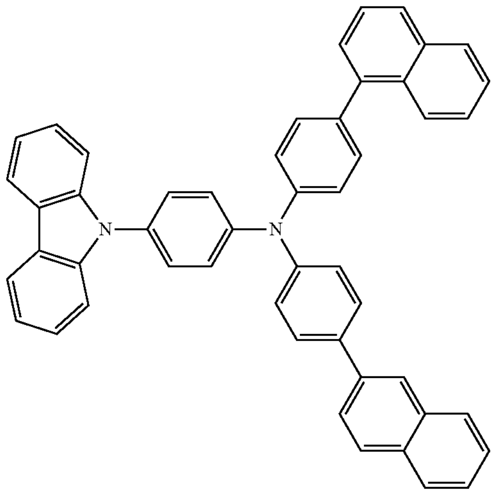
1-4
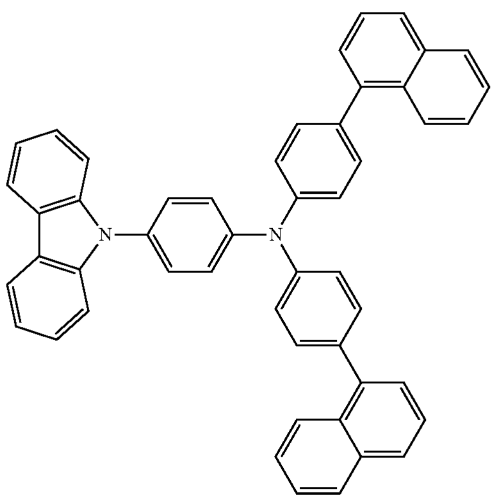
1-5
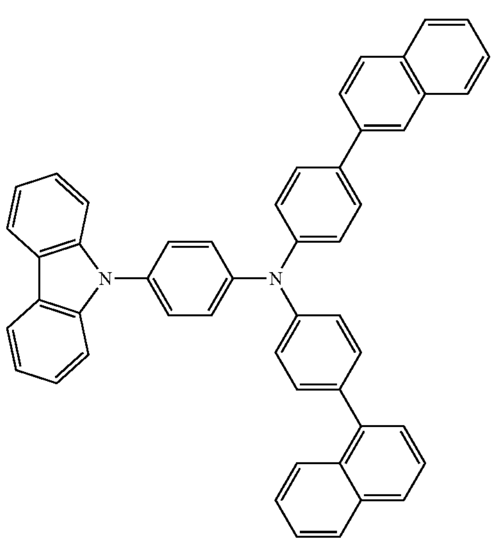
-continued
1-6
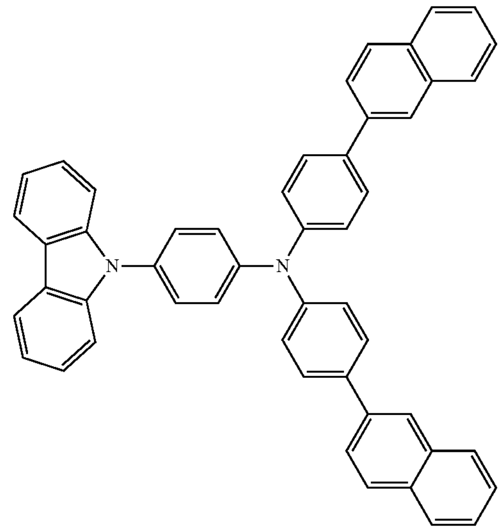
1-7
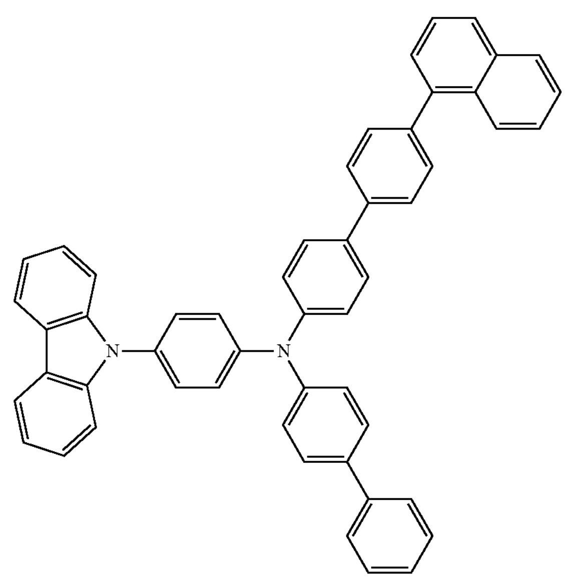

-continued
1-8
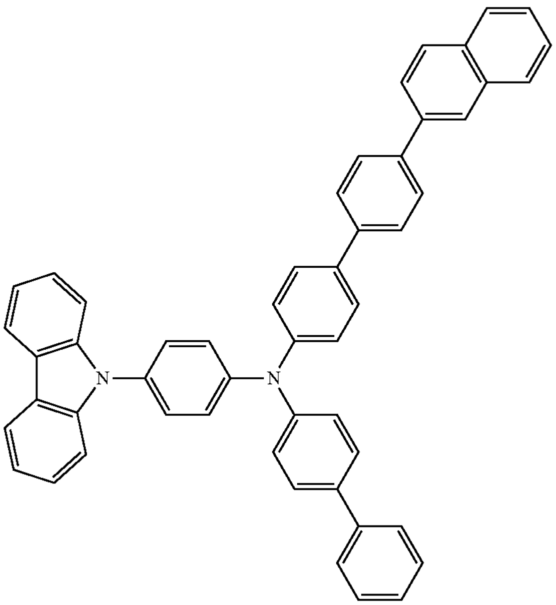
1-9
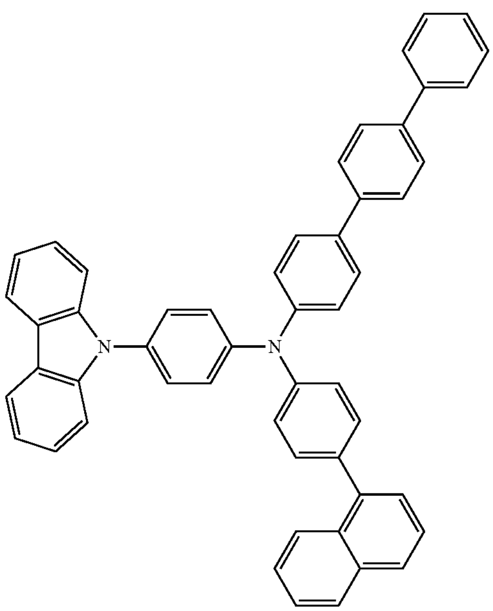
-continued
1-10
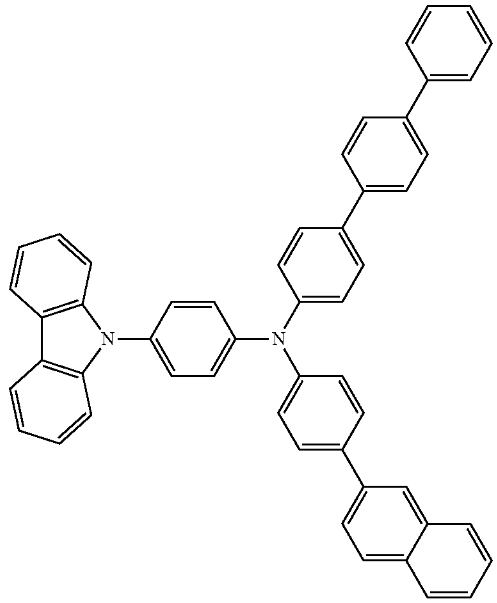
1-11
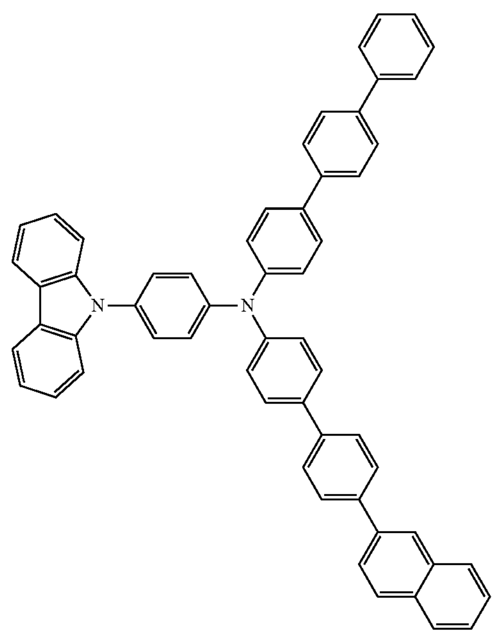

-continued
1-12
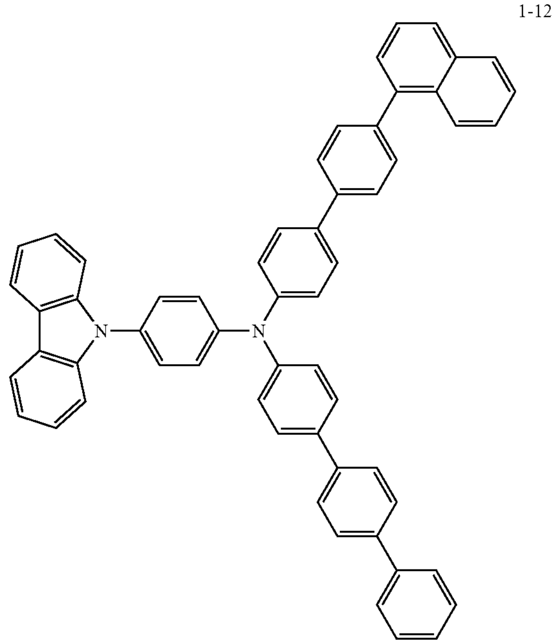
1-13
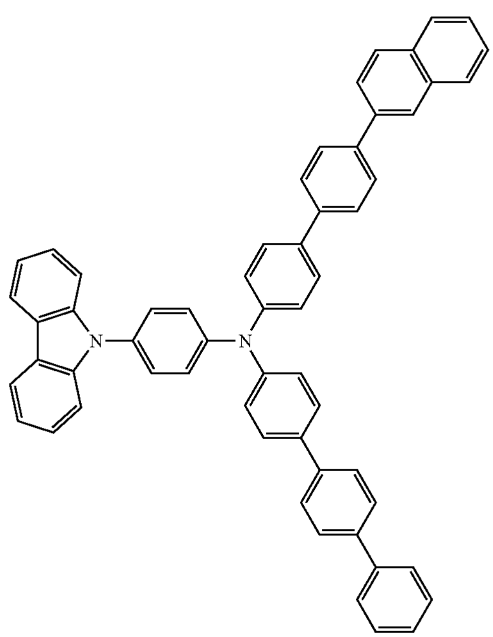
-continued
1-14
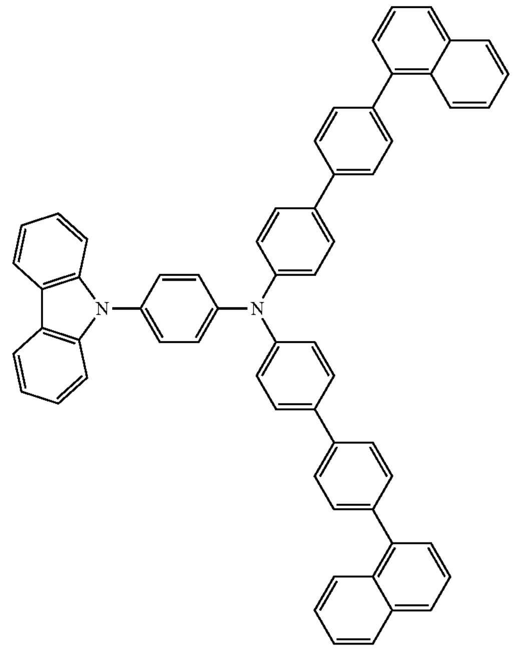
1-15
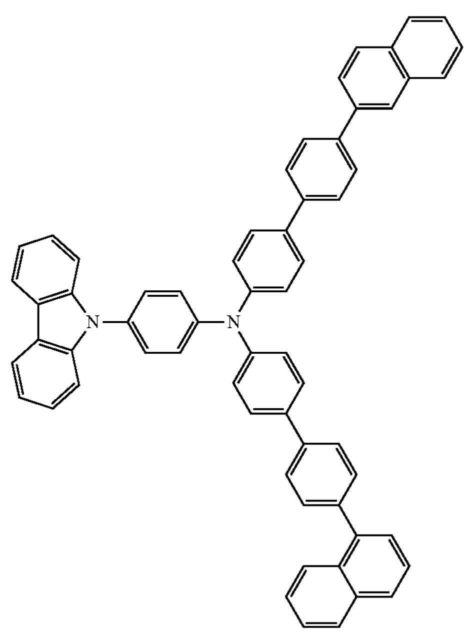

-continued
1-16
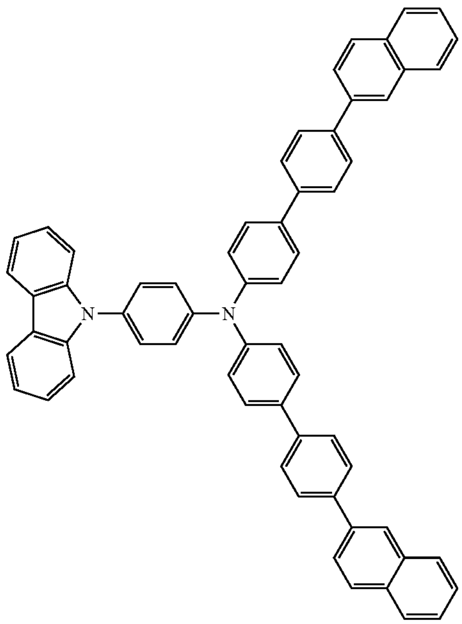
1-17
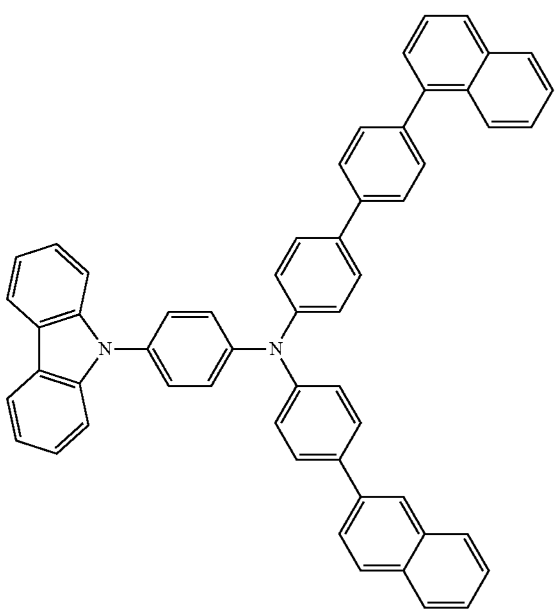
-continued
1-18
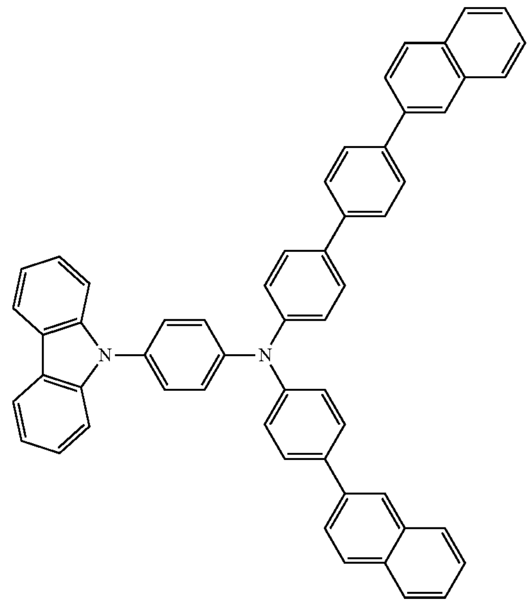
1-19
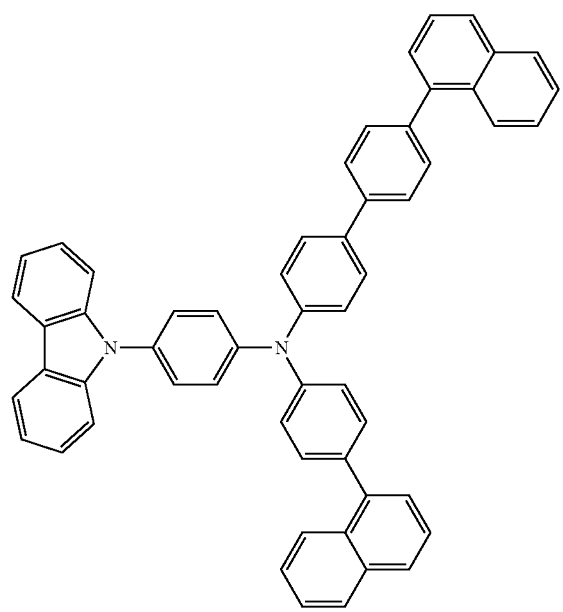

-continued
1-20
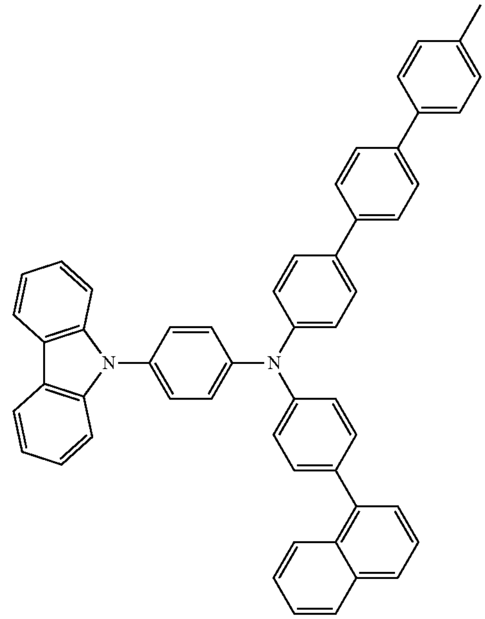
1-21
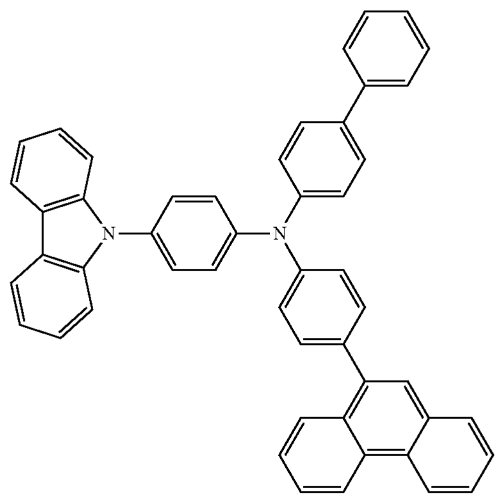
1-22
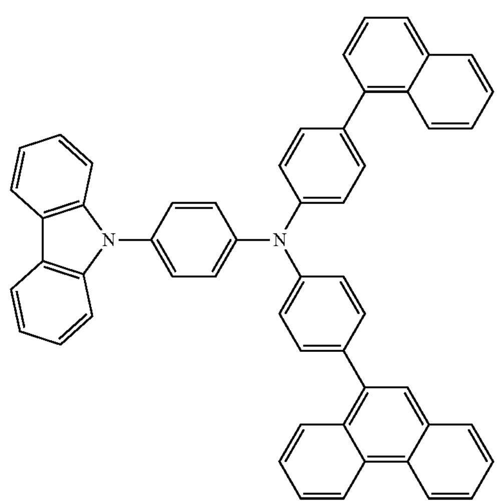
-continued
1-23
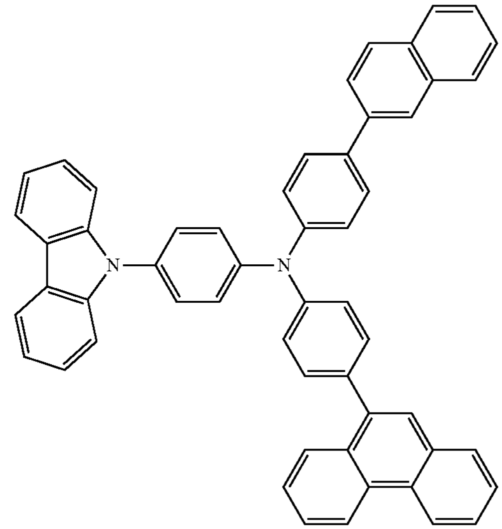
1-24
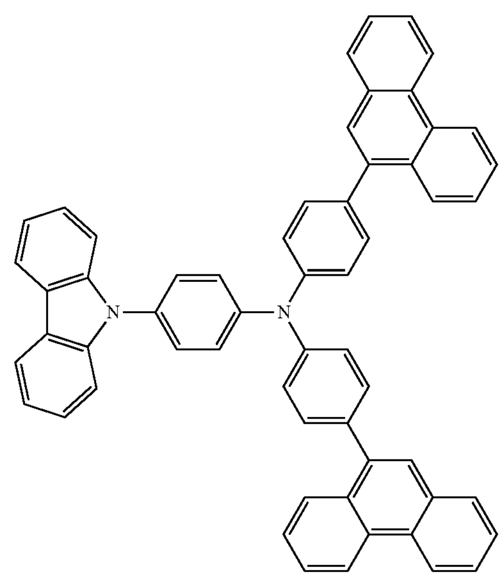

-continued
1-25
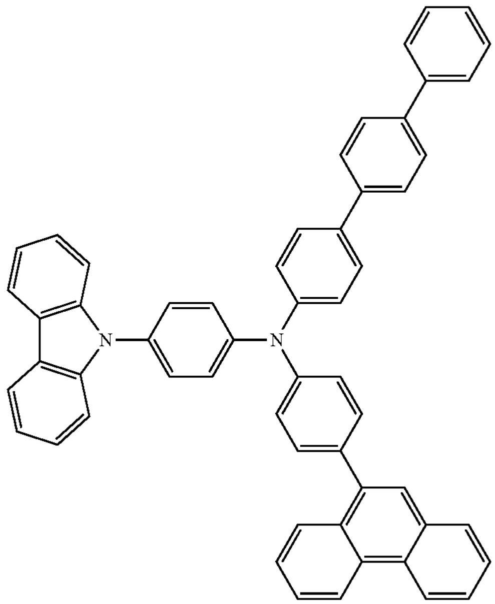
1-26
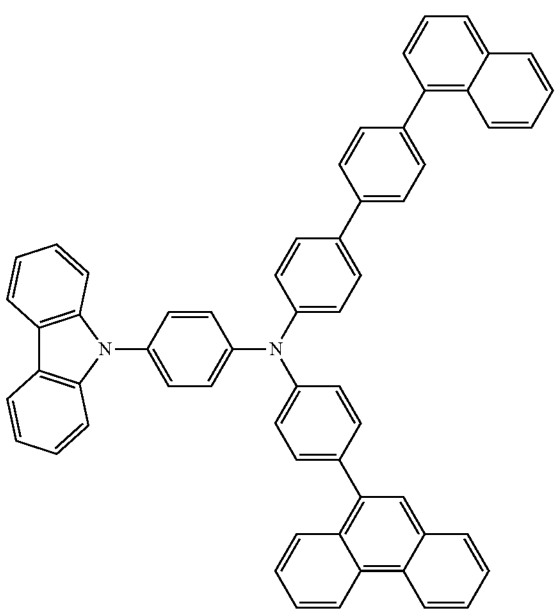
-continued
1-27
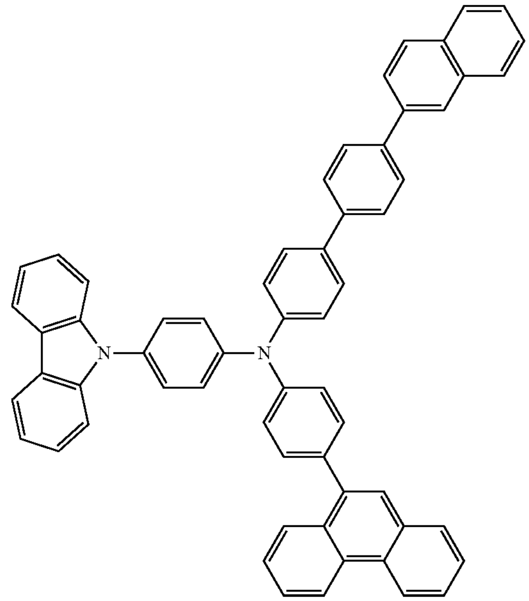
1-28
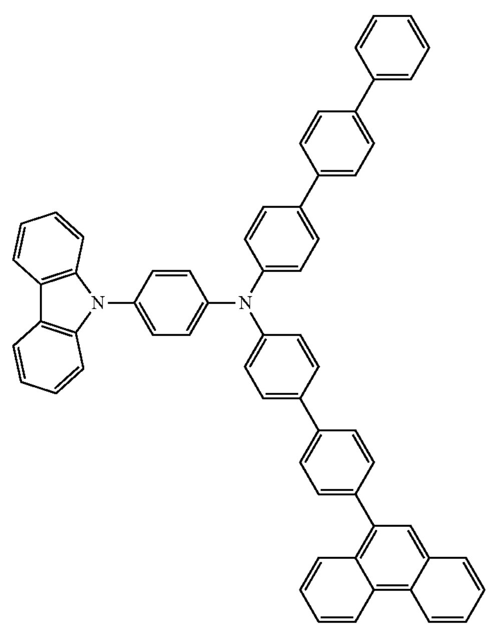

-continued
1-29
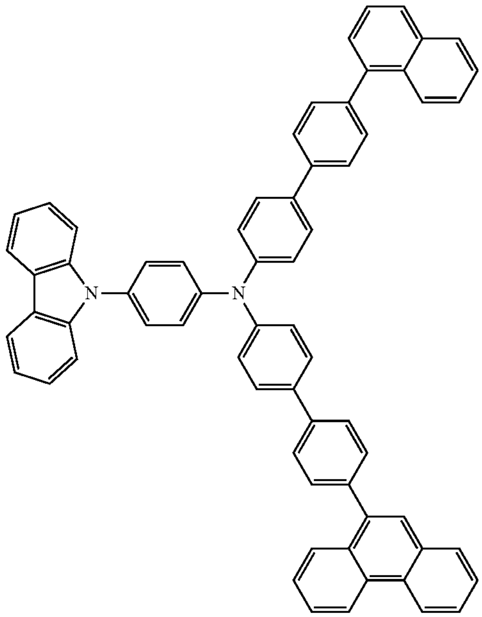
1-30
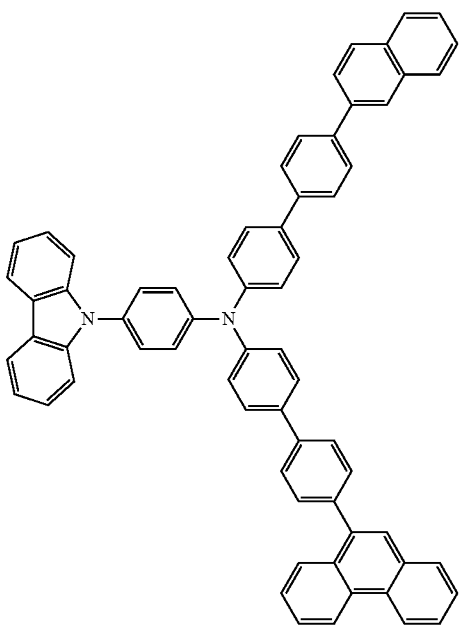
-continued
1-31
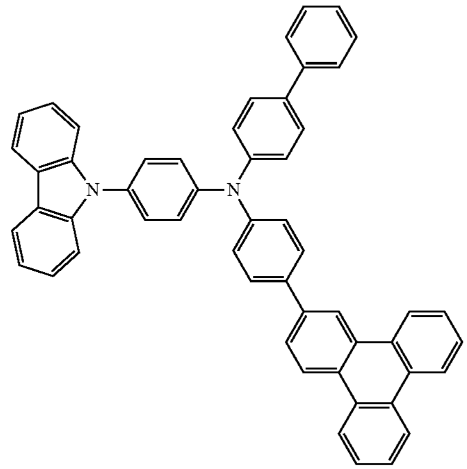
1-32
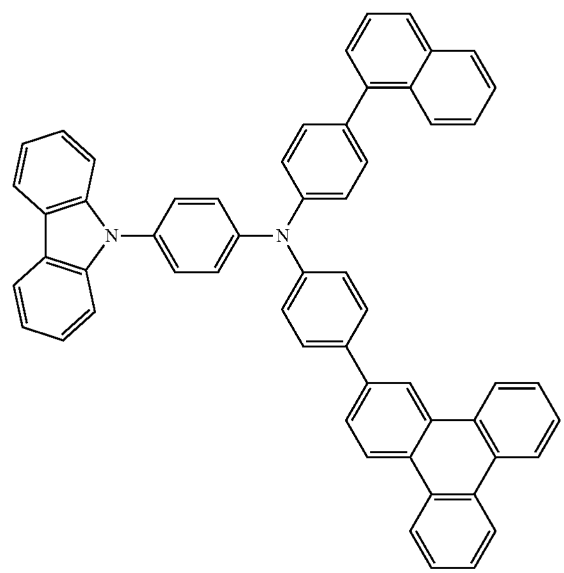

-continued
1-33
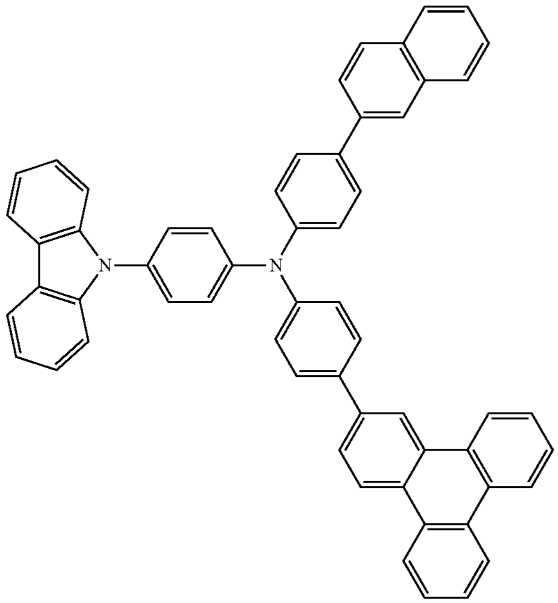
1-34
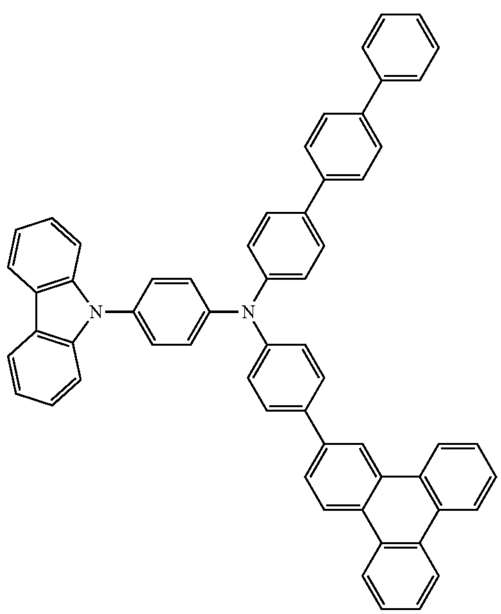
-continued
1-35
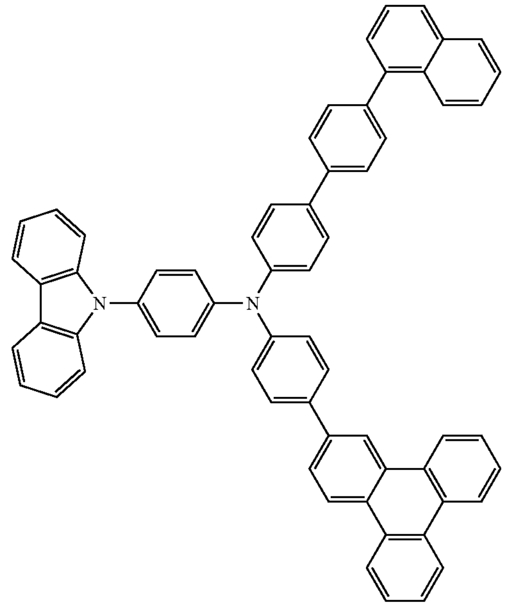
1-36
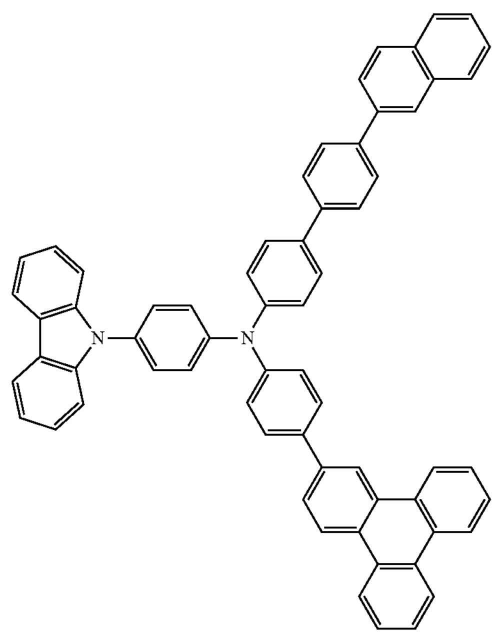

-continued
1-37
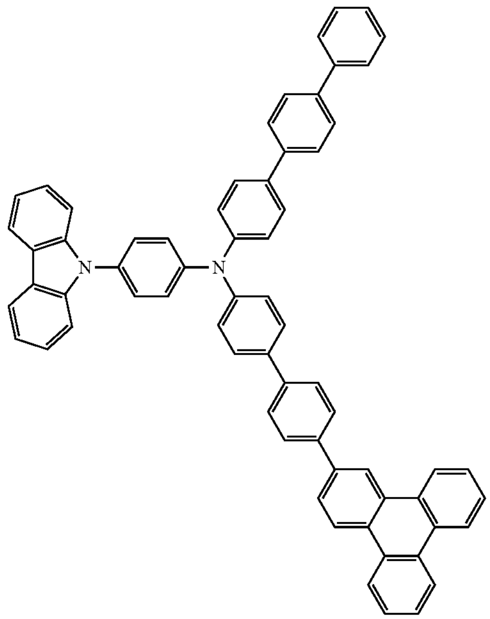
1-38
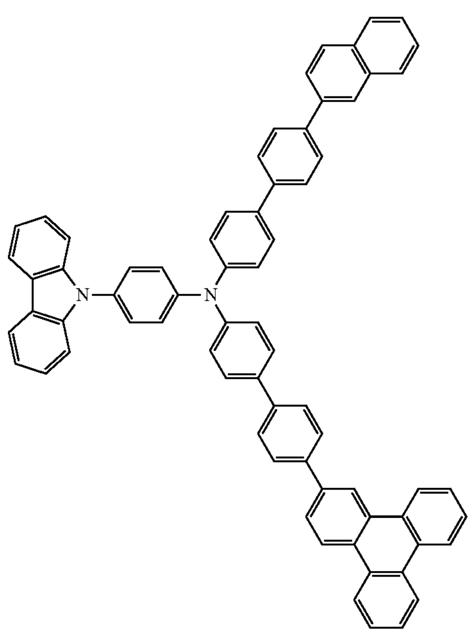
-continued
1-39
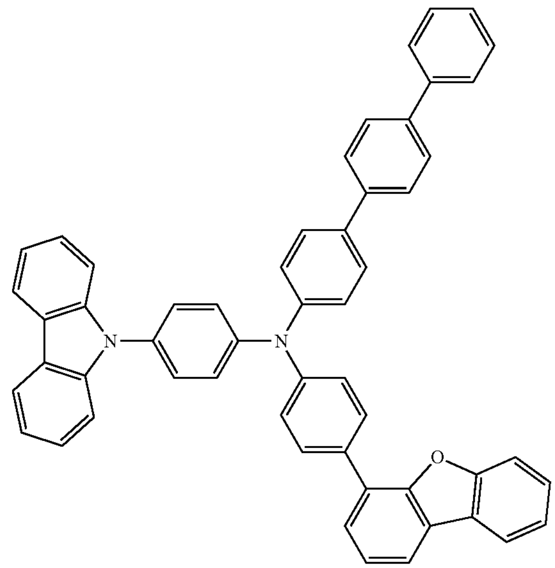
1-40
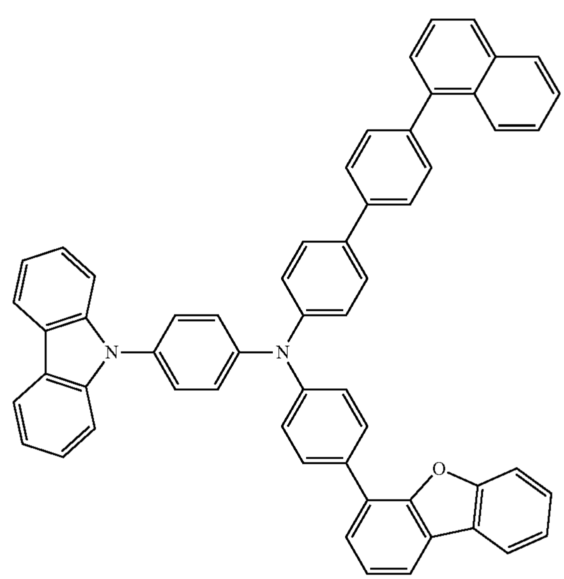

1-41
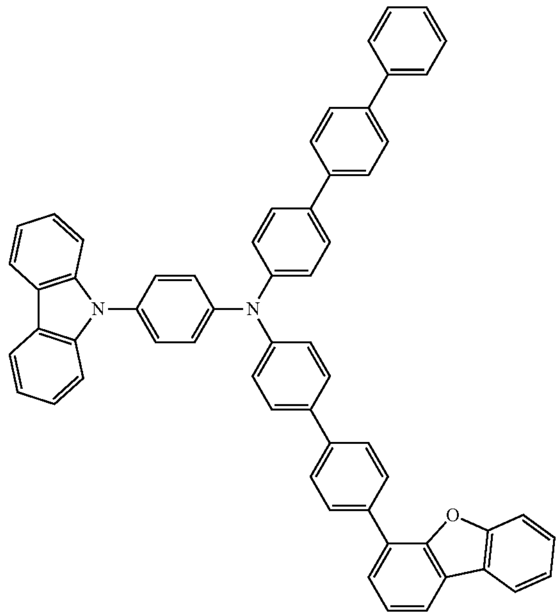
1-42
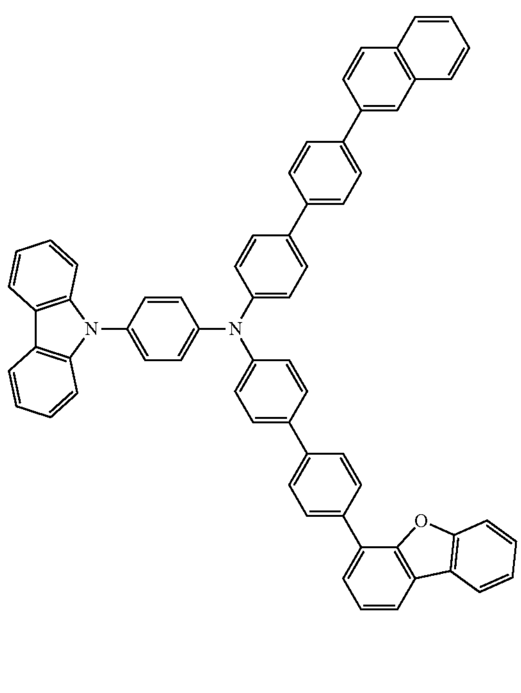
1-43
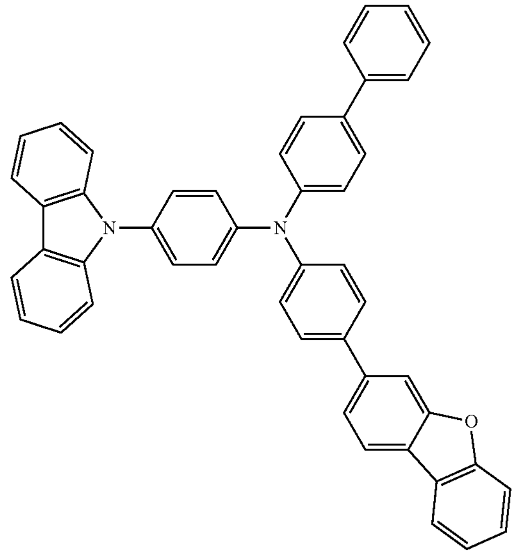
1-44
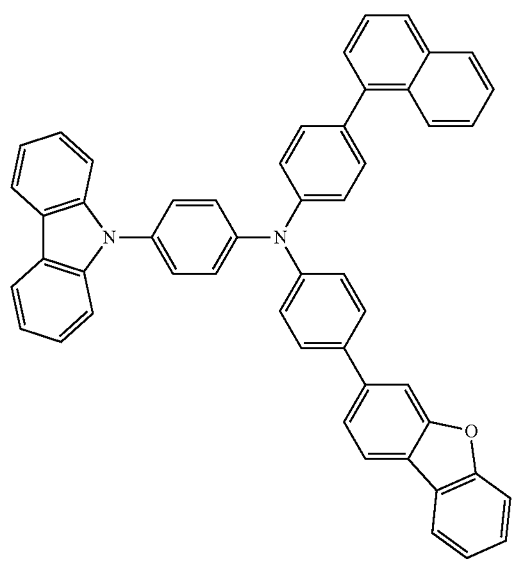

-continued
1-45
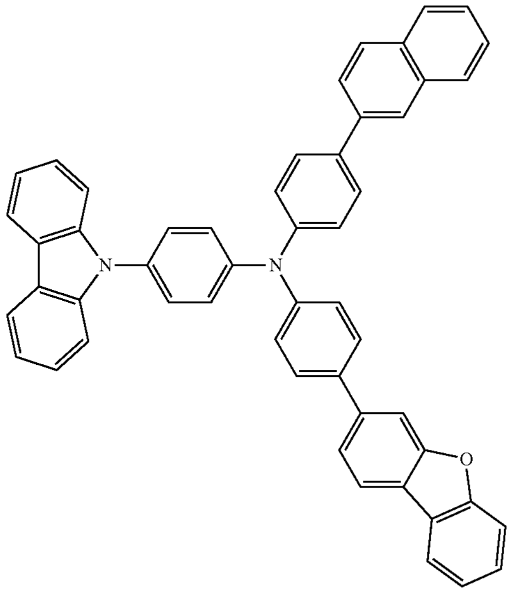
1-46
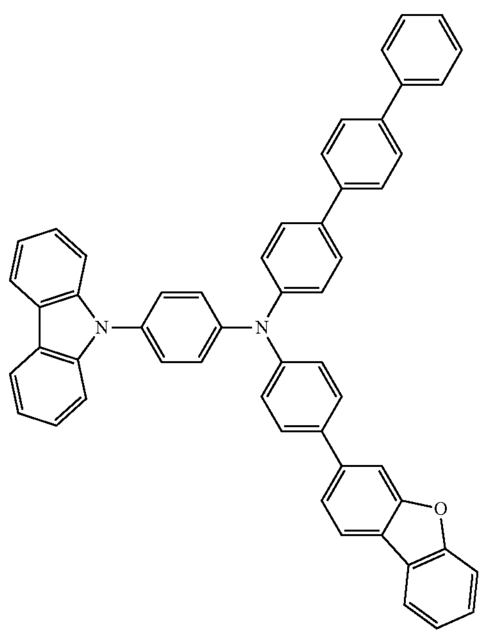
-continued
1-47
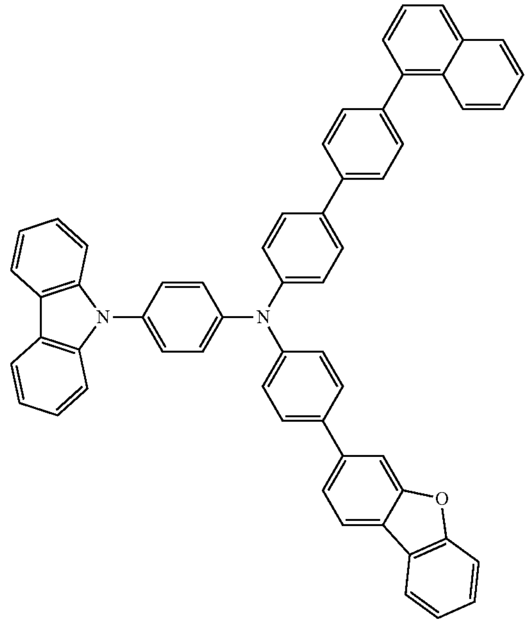
1-48
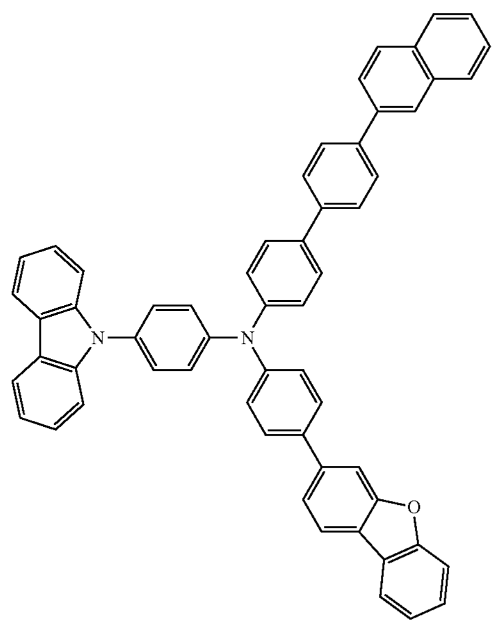

-continued
1-49
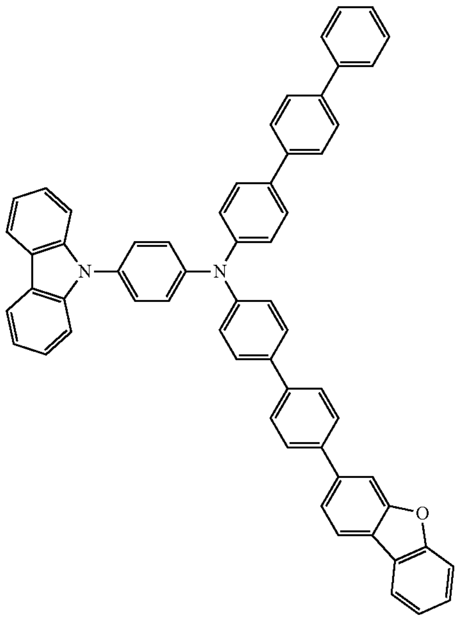
1-50
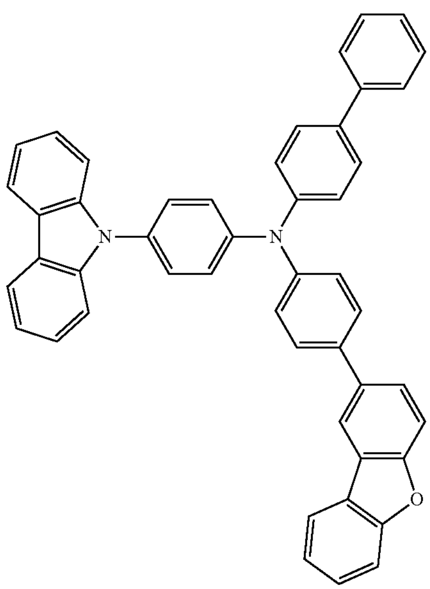
-continued
1-51
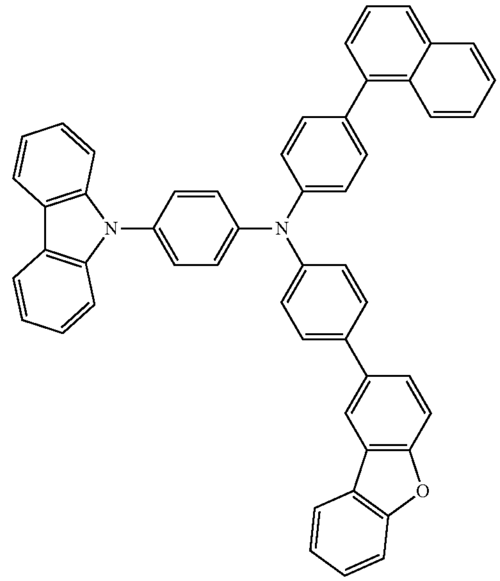
1-52
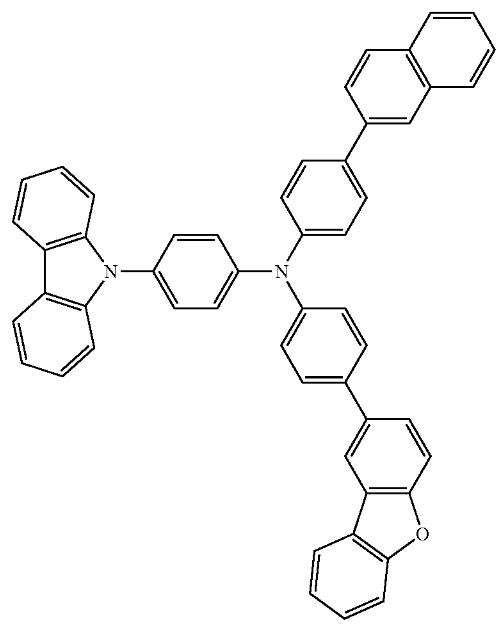

-continued
1-53
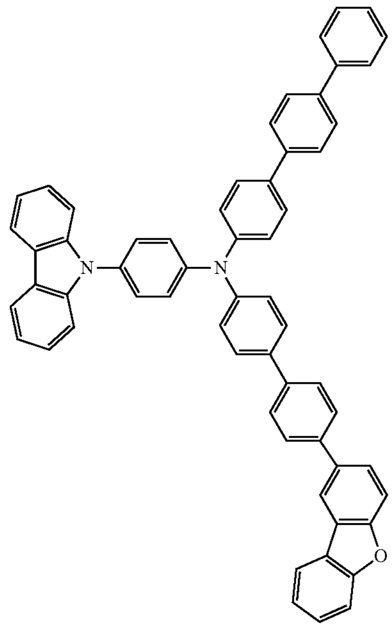
1-54
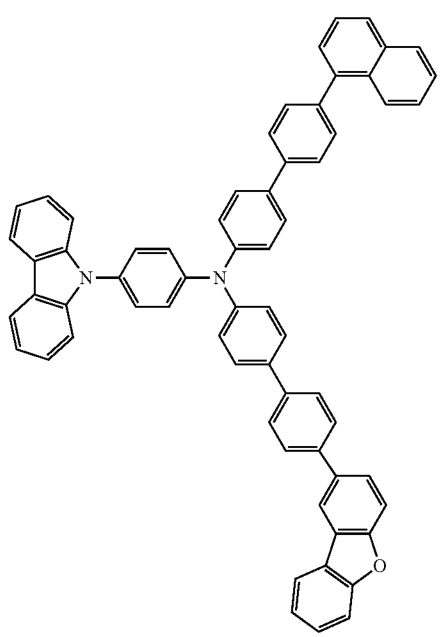
-continued
1-55
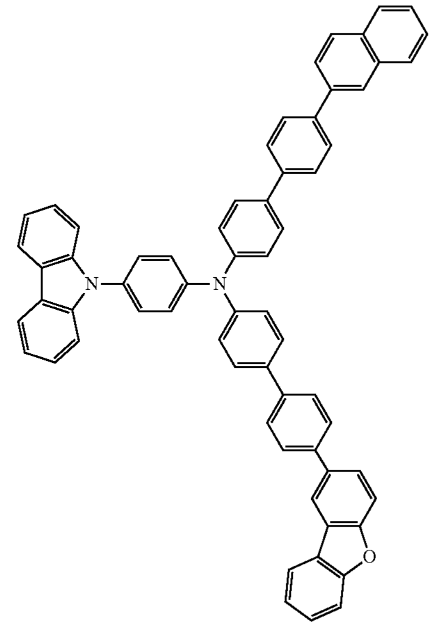
1-56
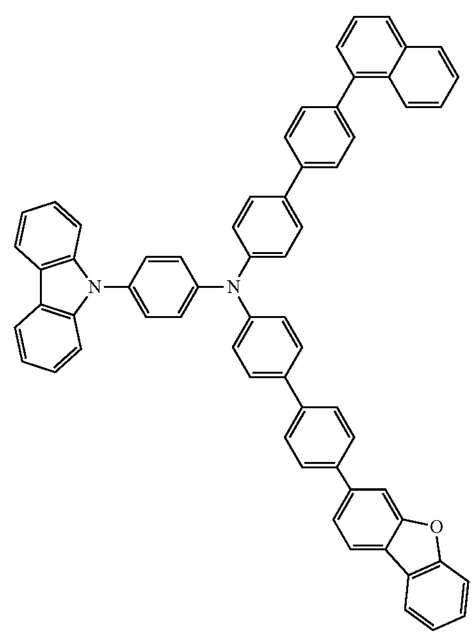

-continued
1-57
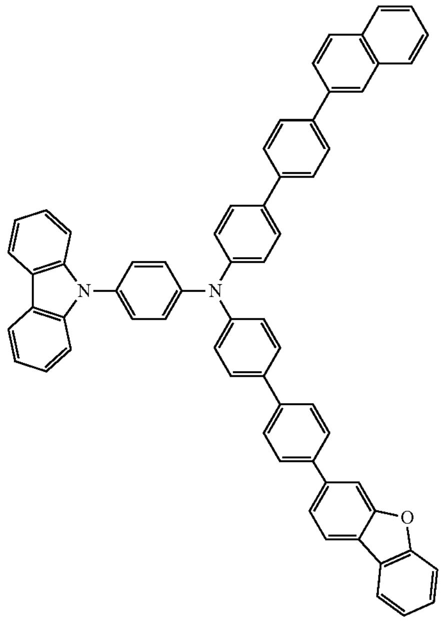
1-58
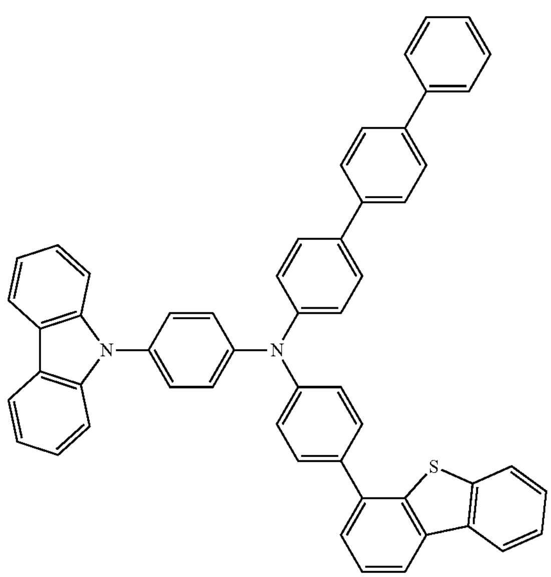
-continued
1-59
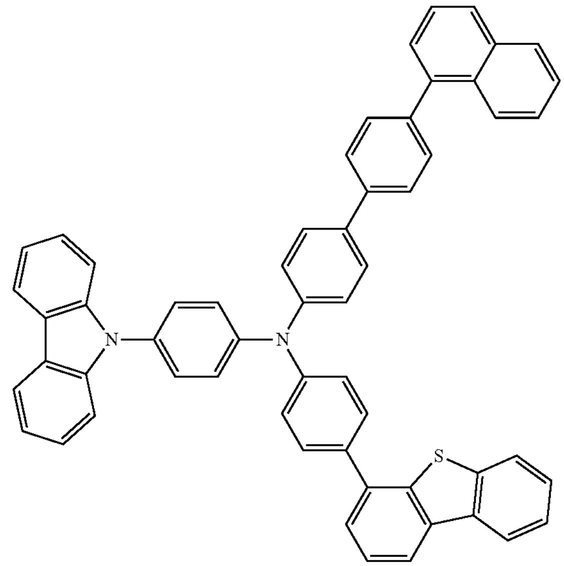
1-60
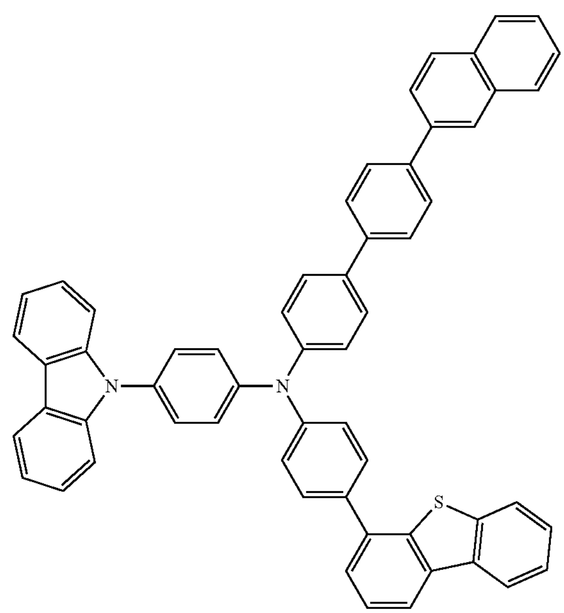

-continued
1-61
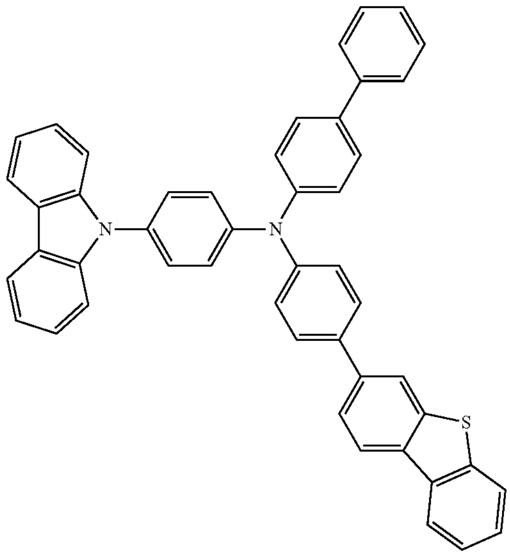
1-62
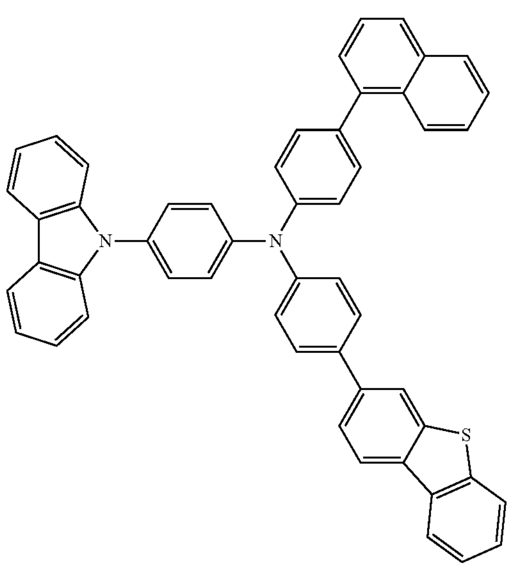
-continued
1-63
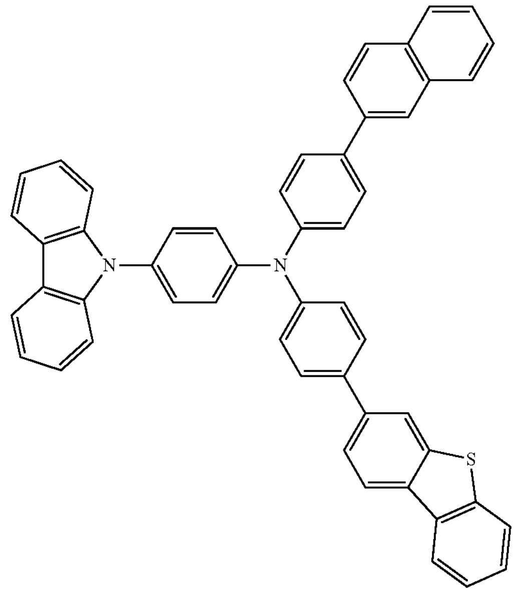
1-64
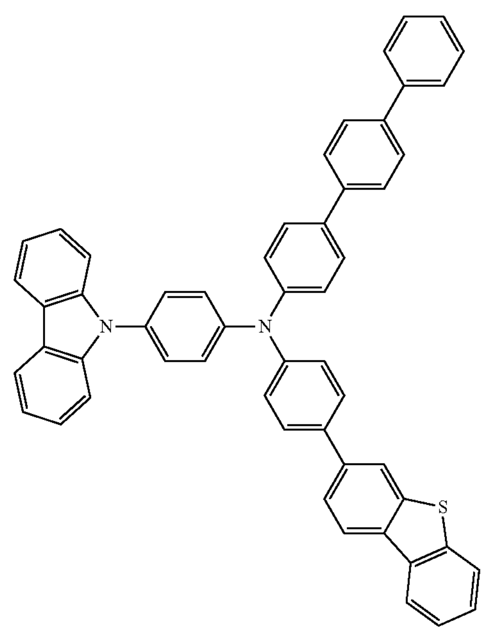

-continued
1-65
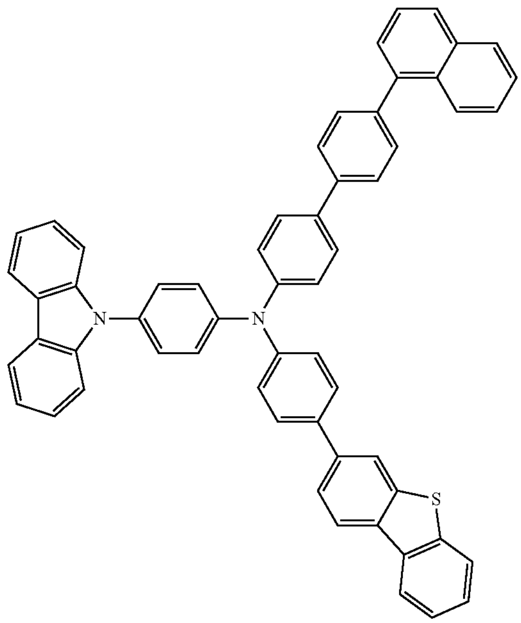
1-66
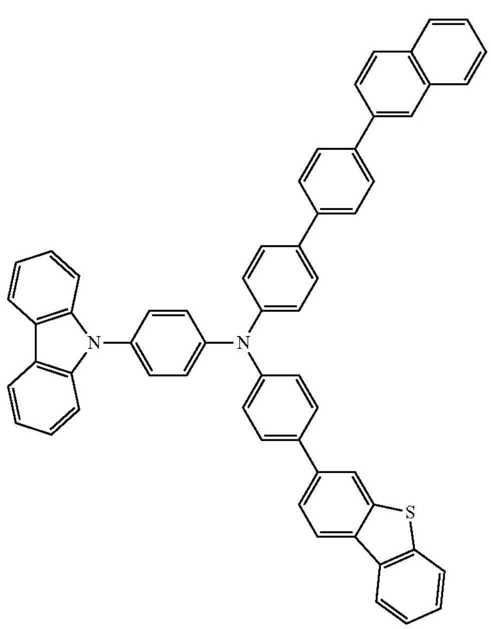
-continued
1-67
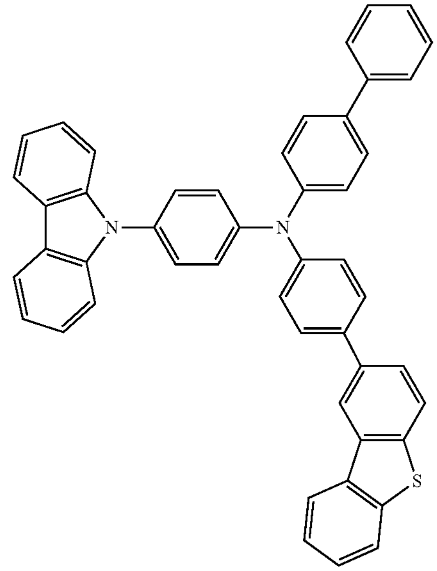
1-68
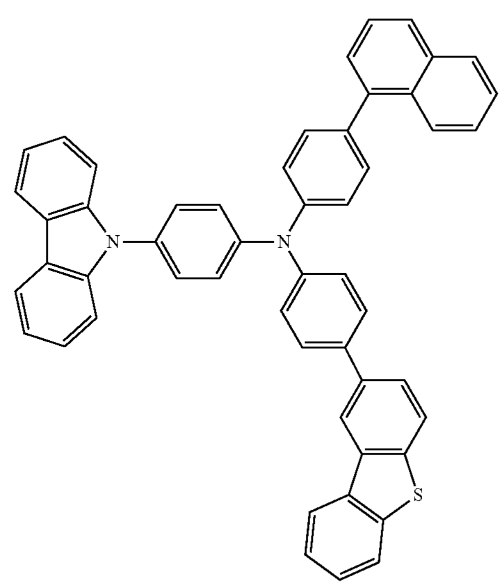

-continued
1-69
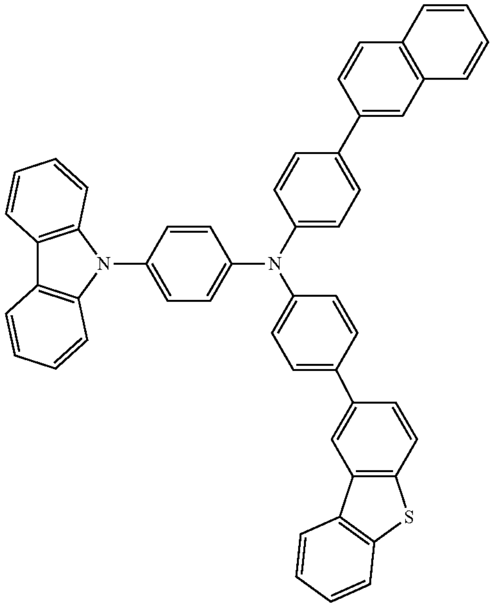
1-70
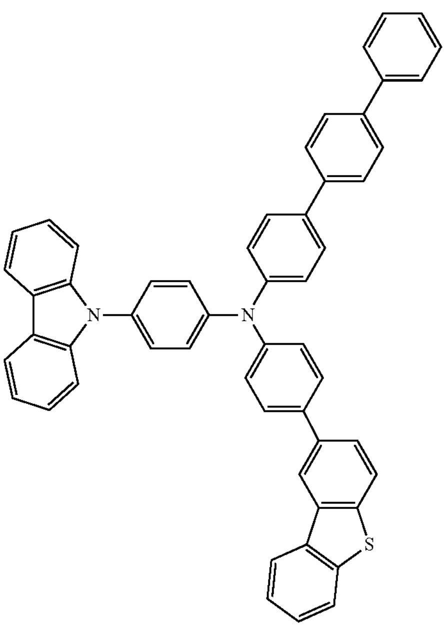
-continued
1-71
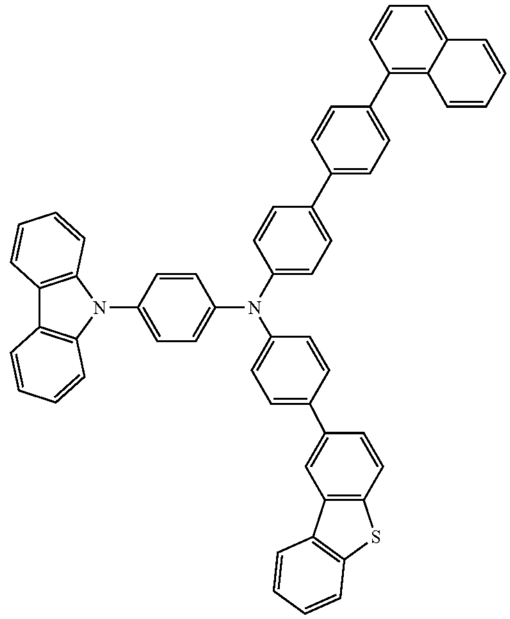
1-72
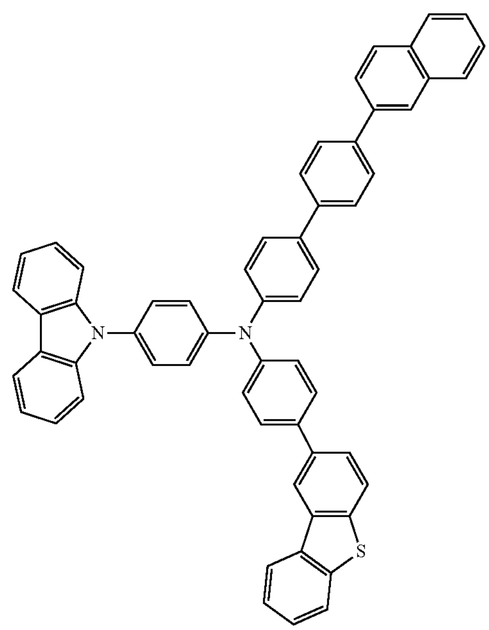

-continued
1-73
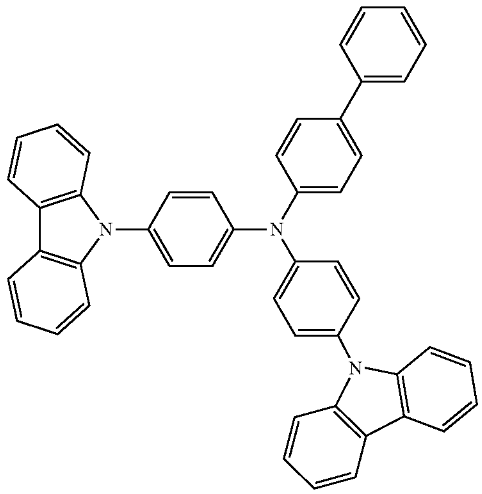
1-74
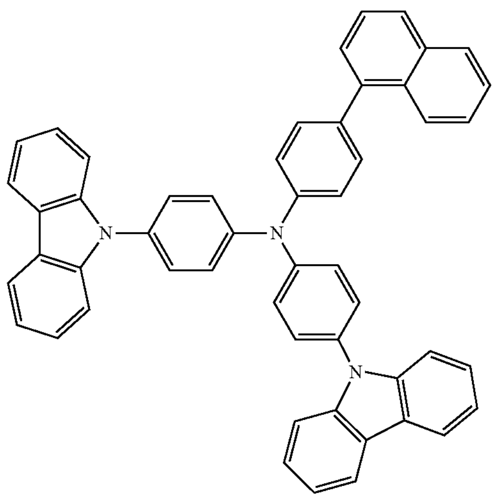
1-75
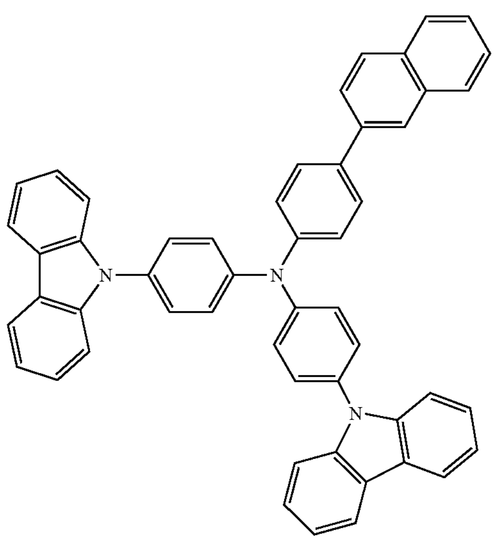
-continued
1-76
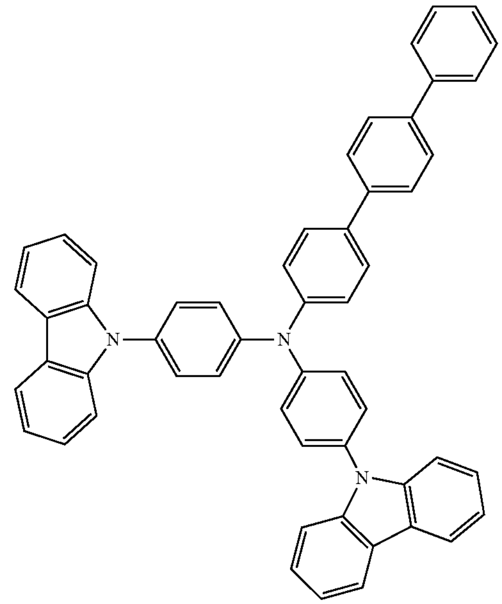
1-77
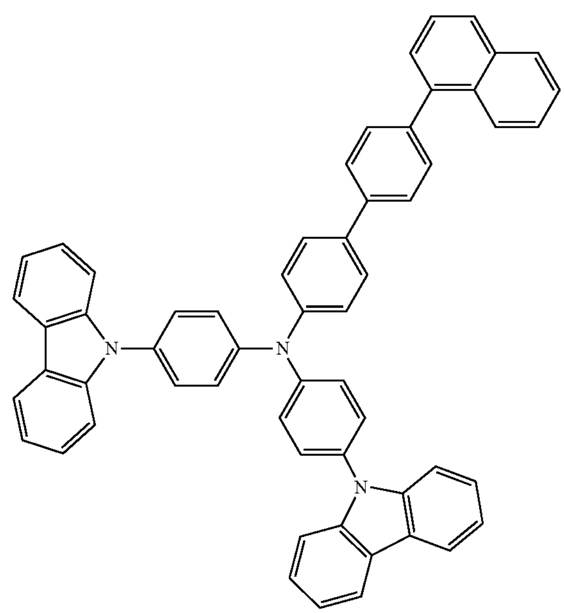

-continued
1-78
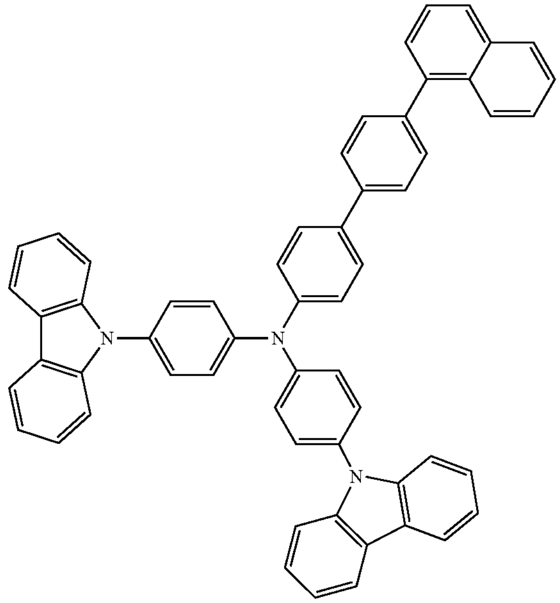
-continued
1-80
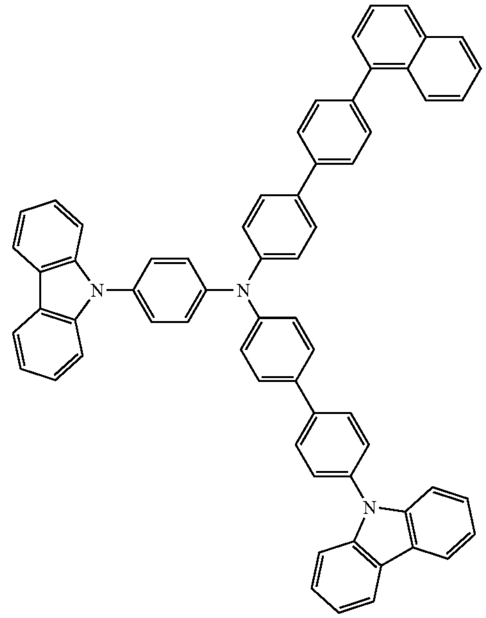
1-79
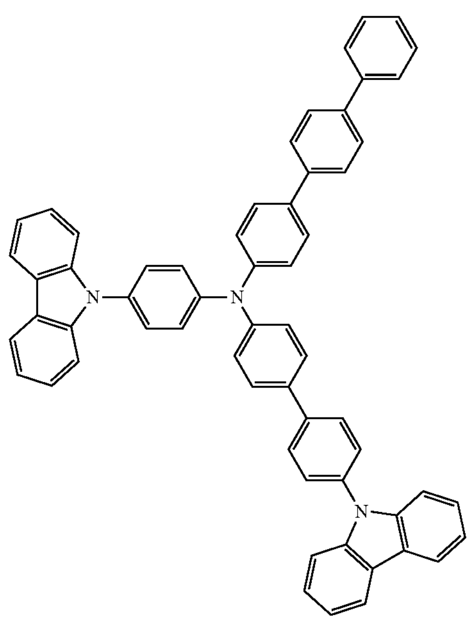
1-81
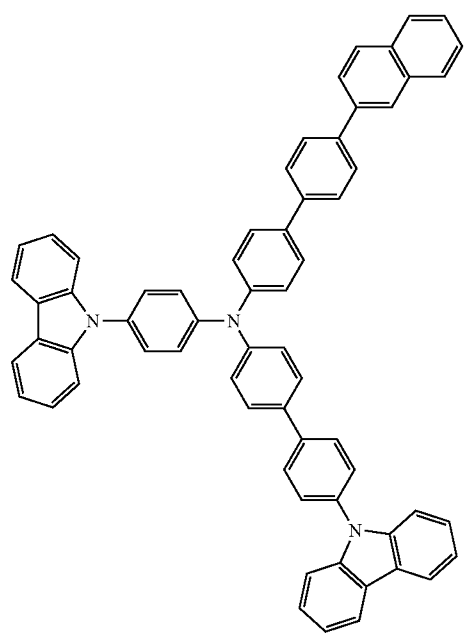

-continued
1-82
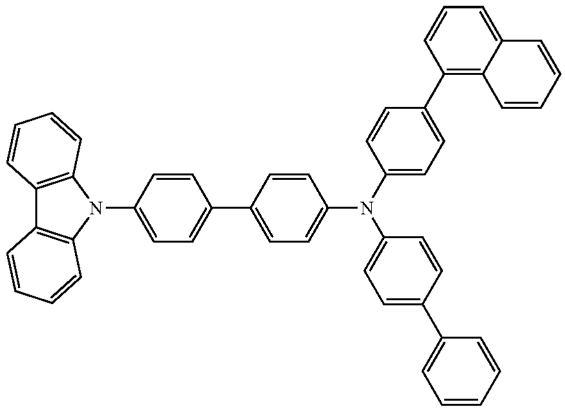
1-83
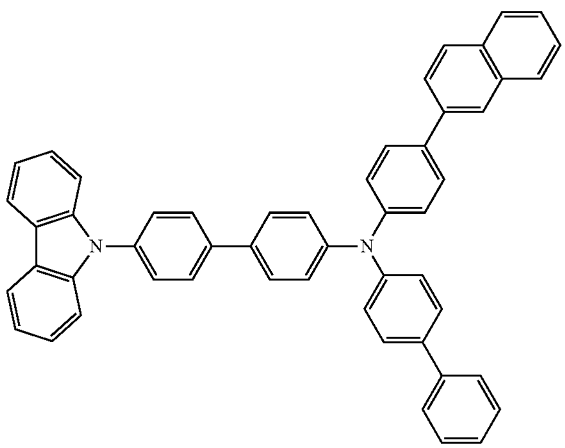
1-84
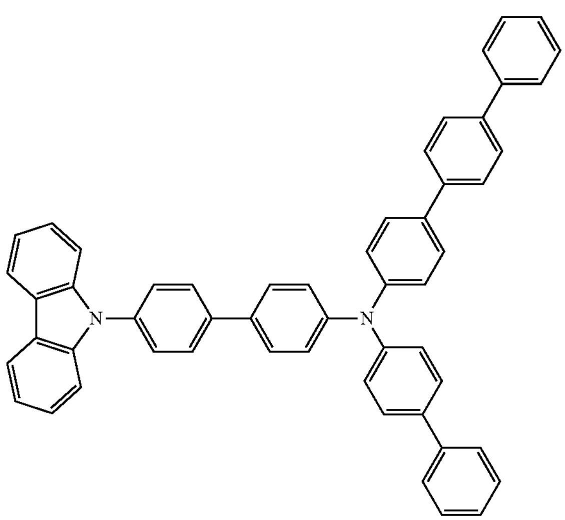
-continued
1-85
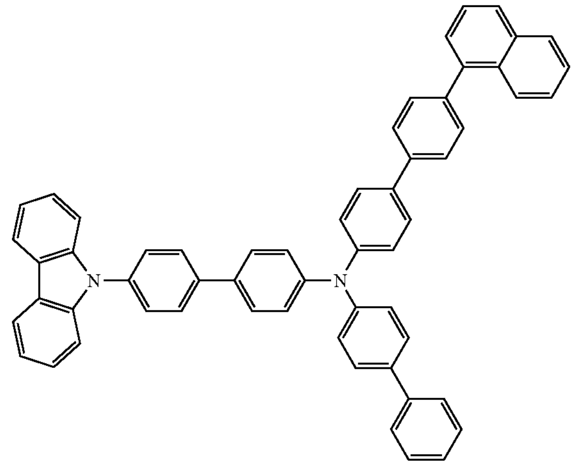
1-86
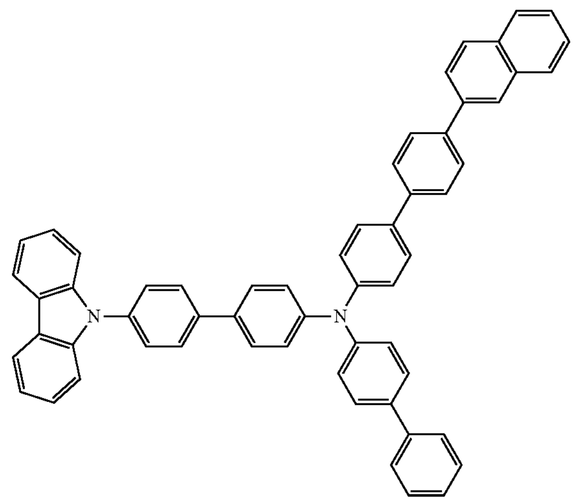
1-87
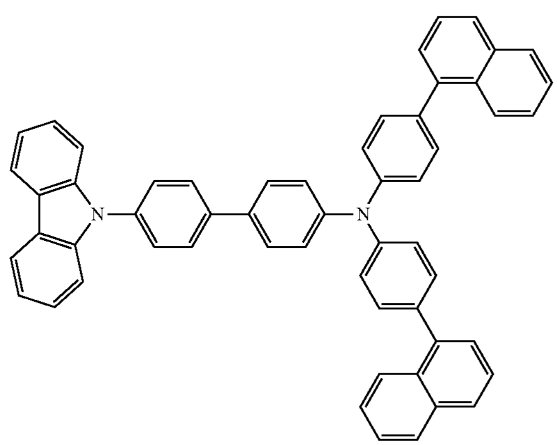

-continued
1-88
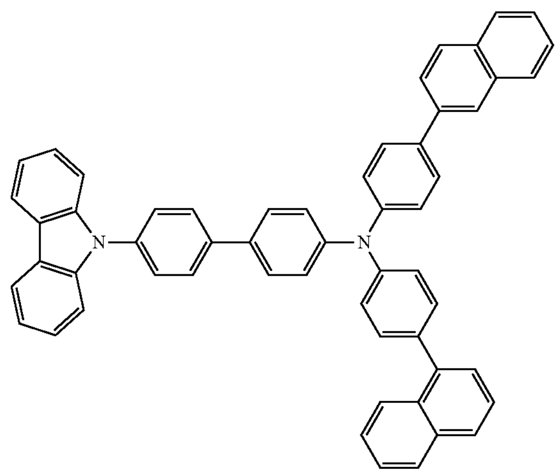
1-89
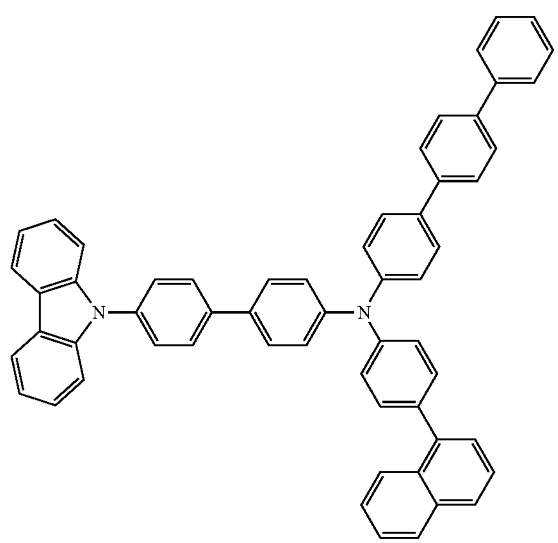
1-90
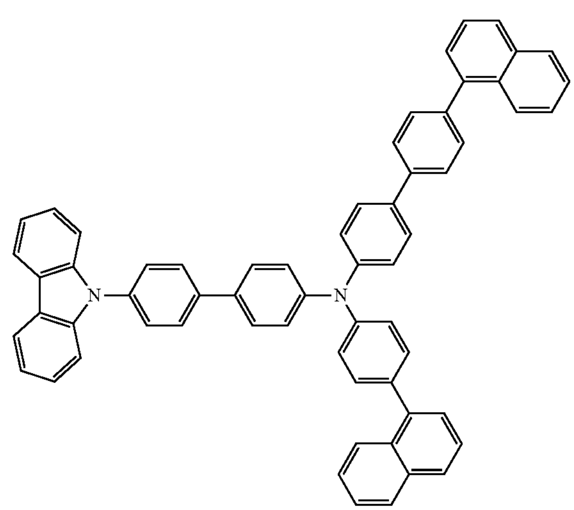
-continued
1-91
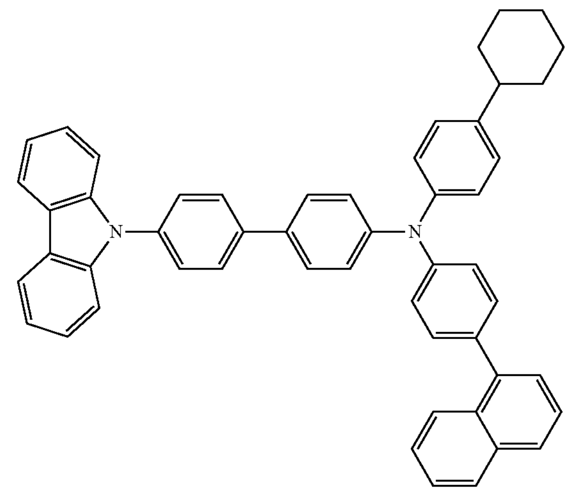
1-92
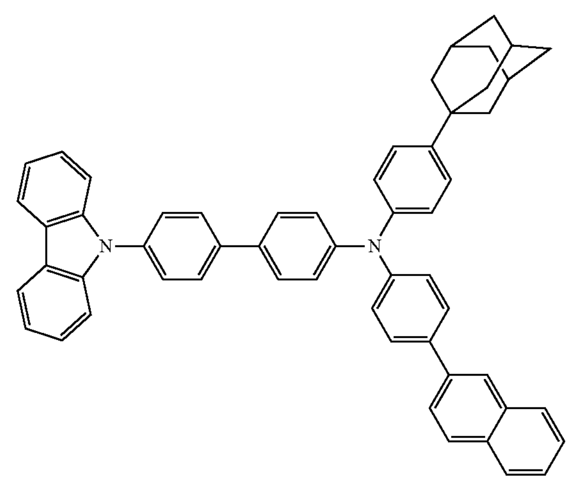
1-93
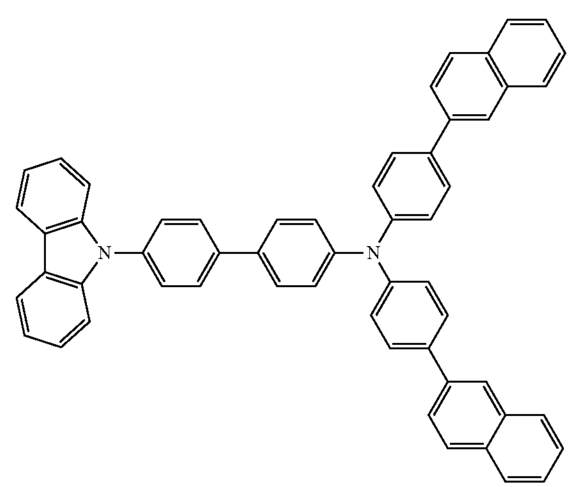

-continued
1-94
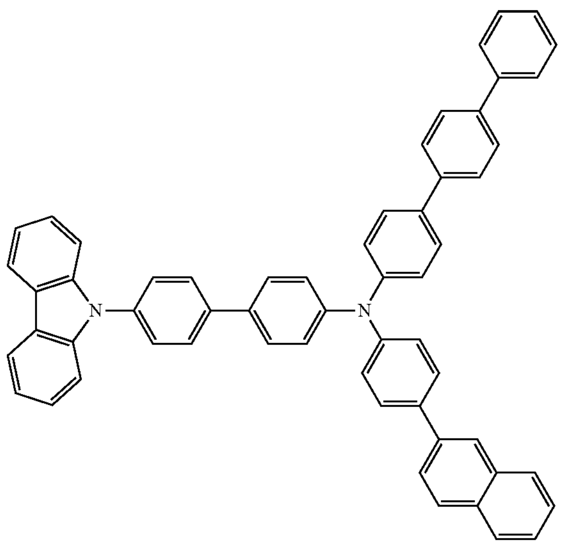
1-95
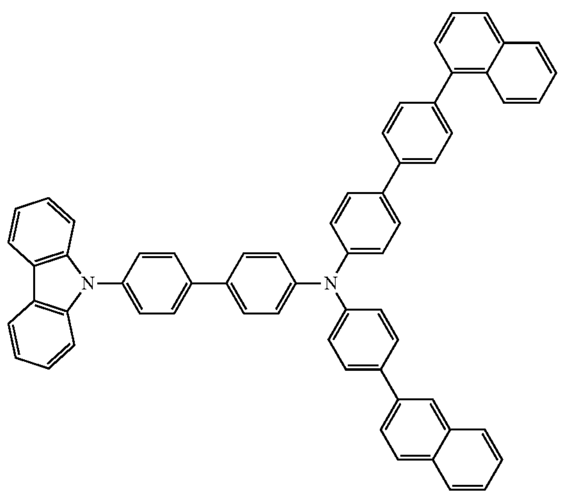
1-96
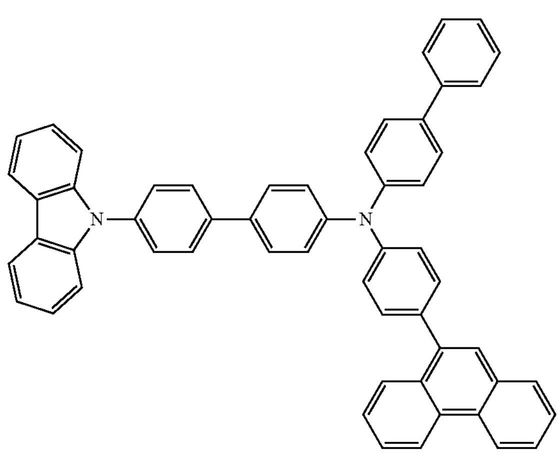
-continued
1-97
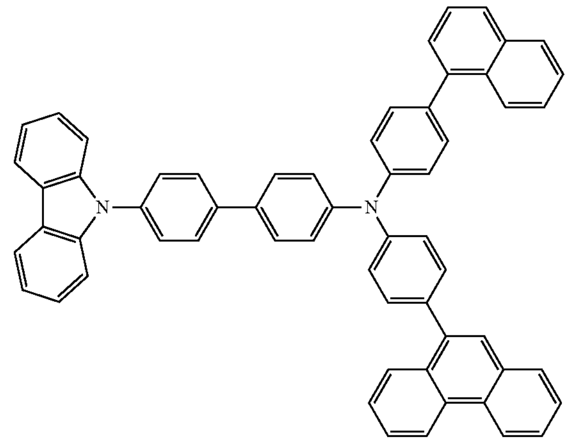
1-98
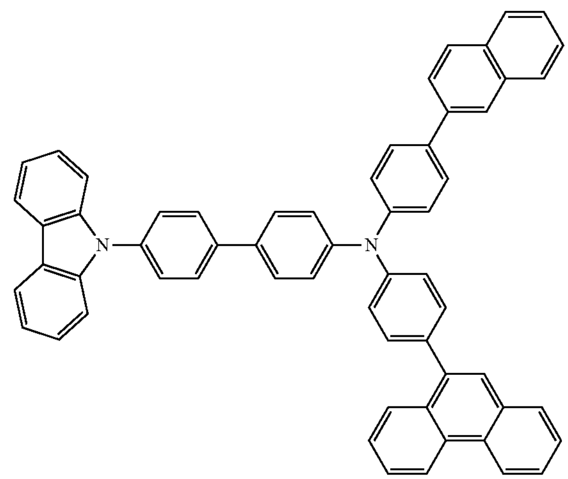
1-99
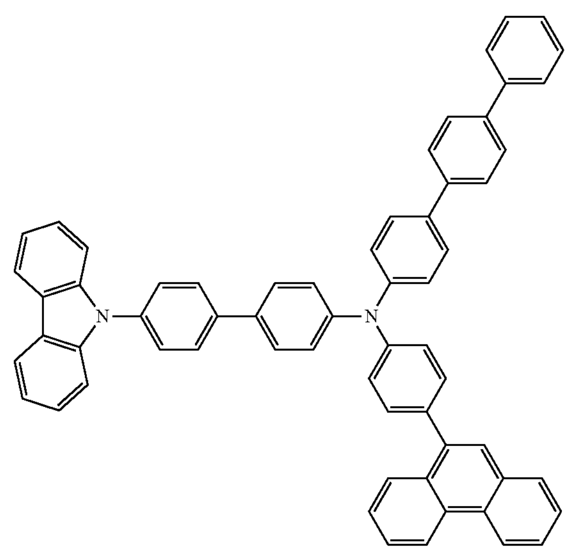

-continued
1-100
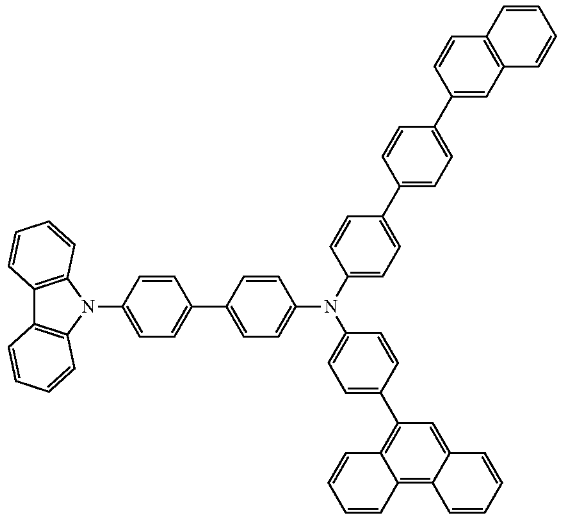
1-101
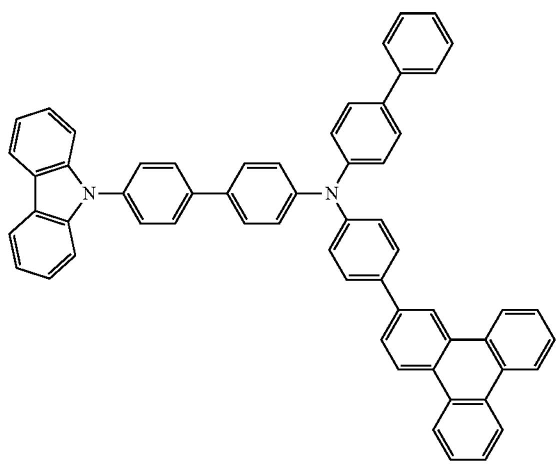
1-102
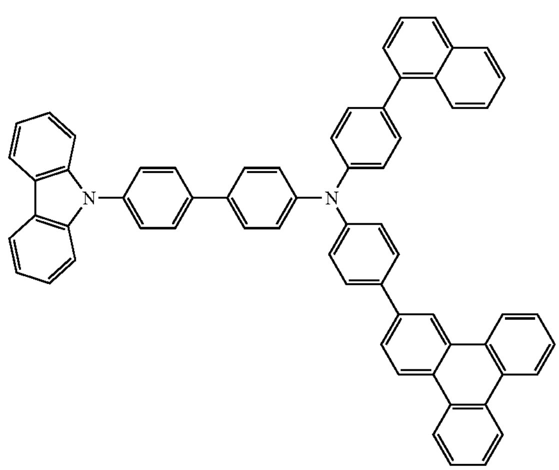
-continued
1-103
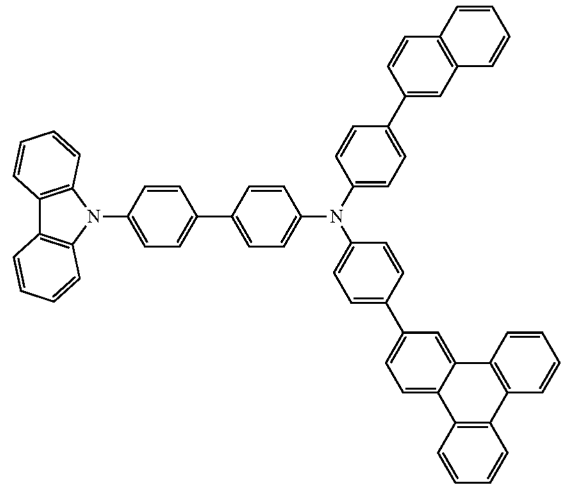
1-104
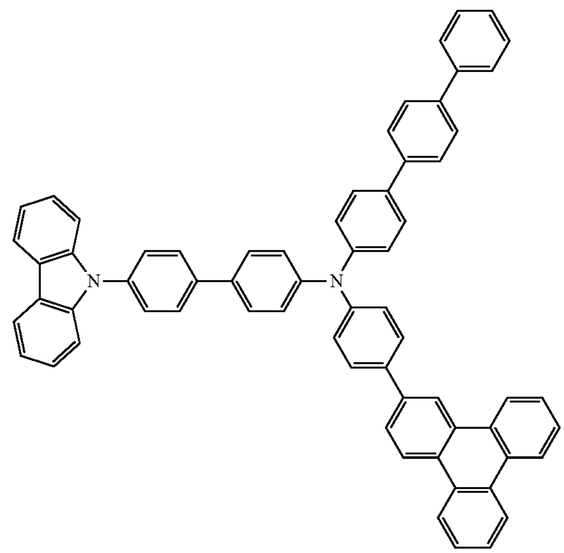
1-105
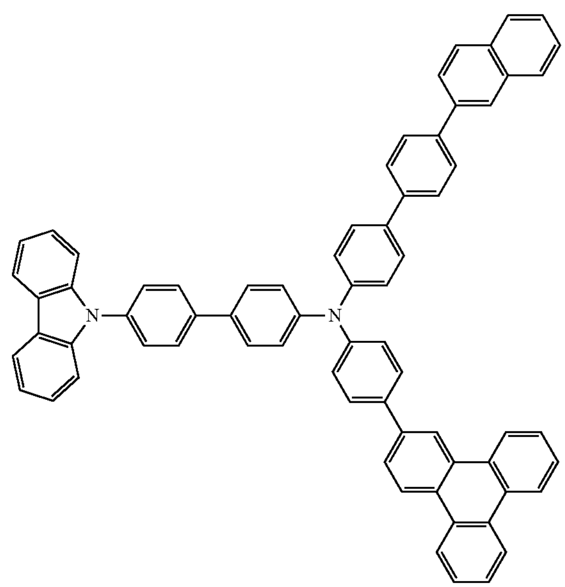

-continued
1-106
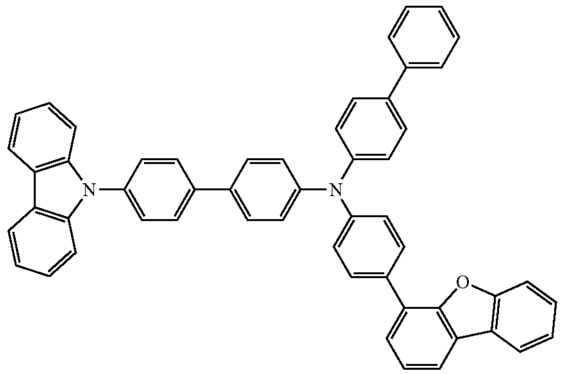
1-107
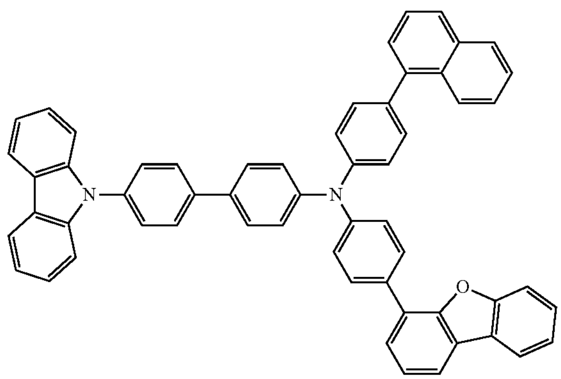
1-108
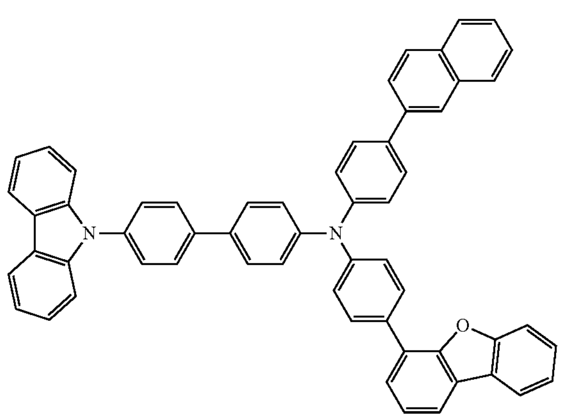
-continued
1-109
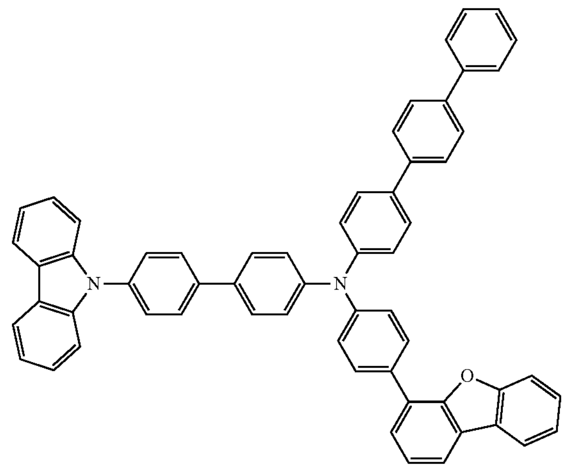
1-110
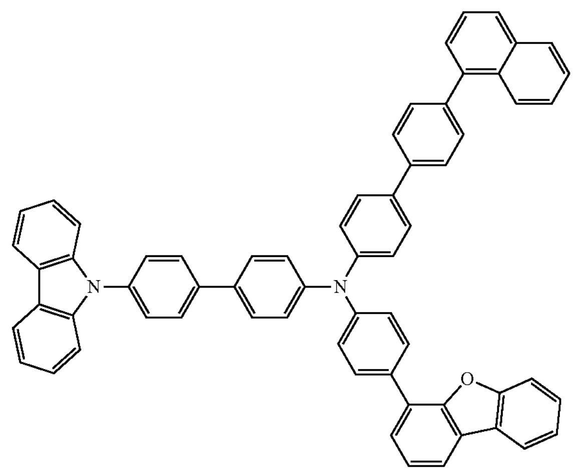
1-111
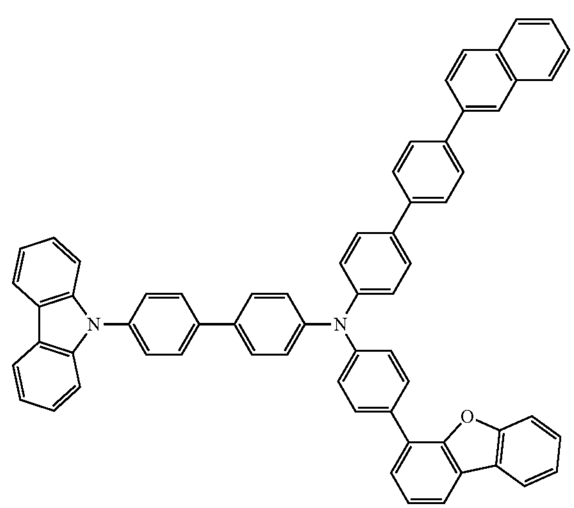

-continued
1-112
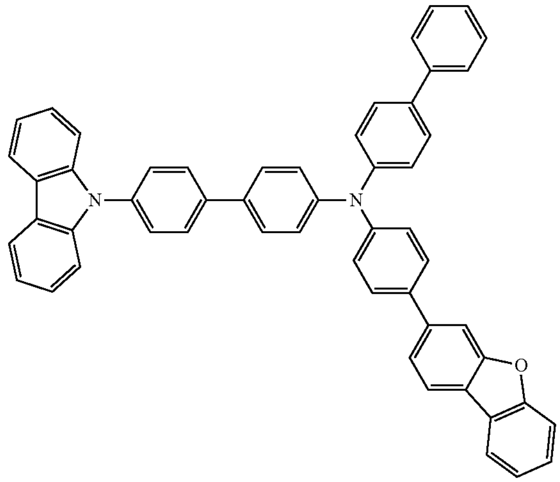
1-113
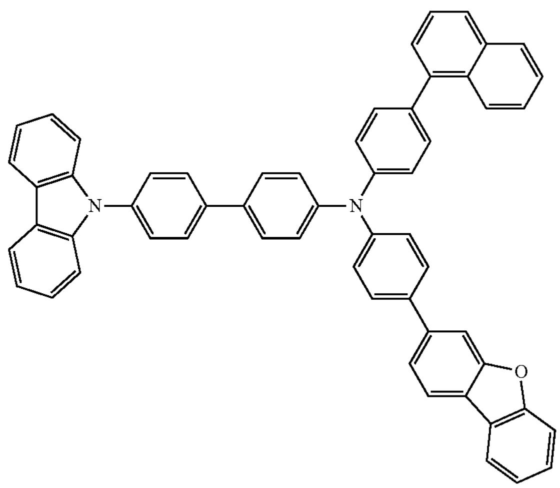
1-114
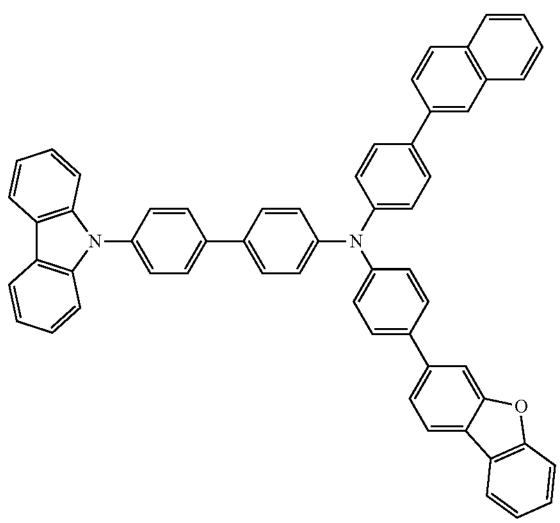
-continued
1-115
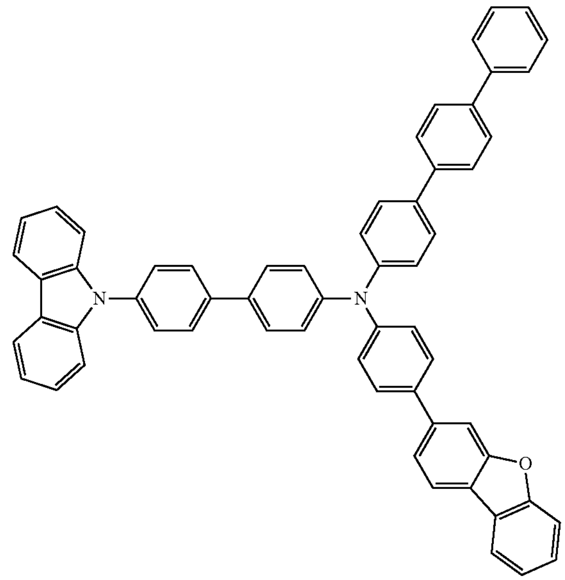
1-116
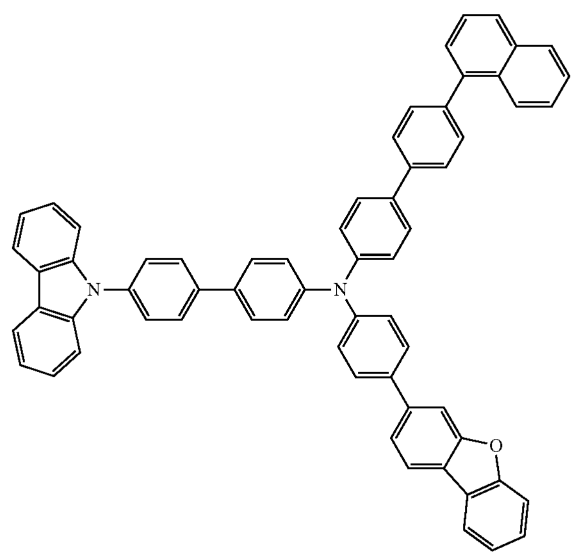

-continued
1-117
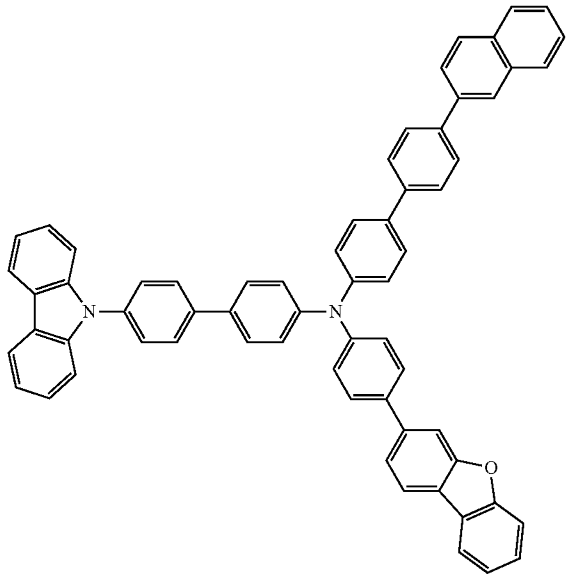
1-118
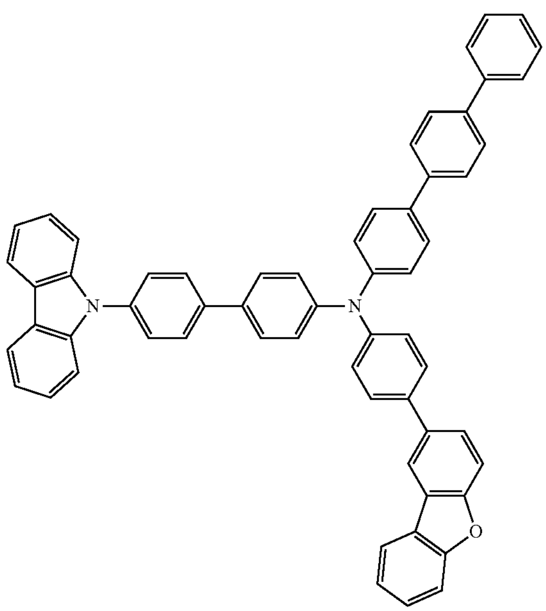
-continued
1-119
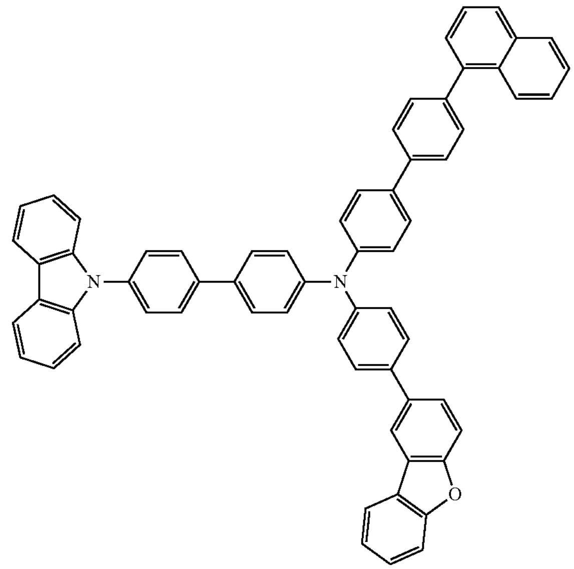
1-120
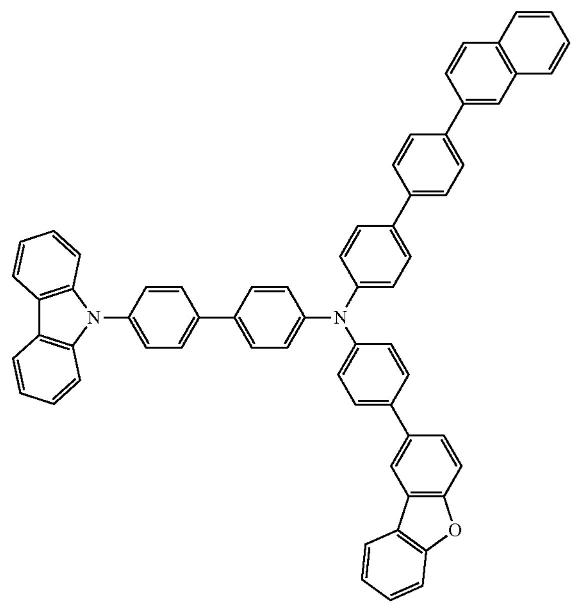
1-121
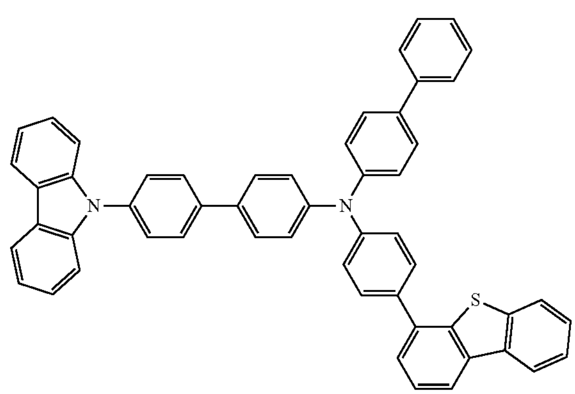

1-122
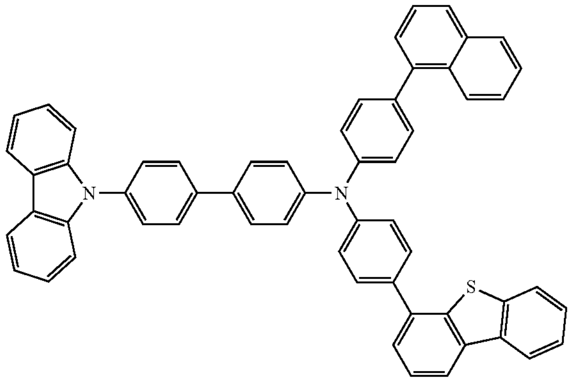
1-123
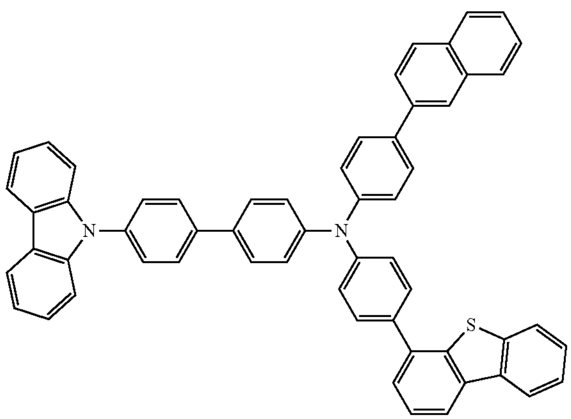
1-124
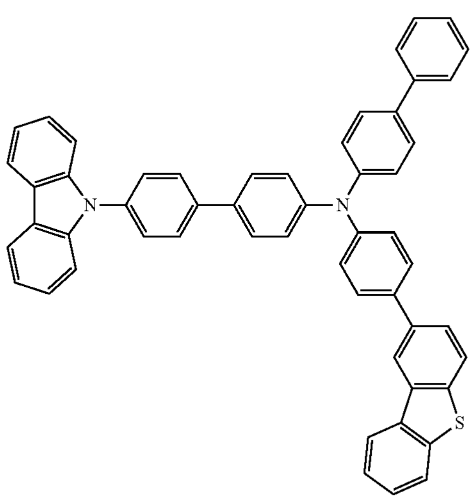
1-125
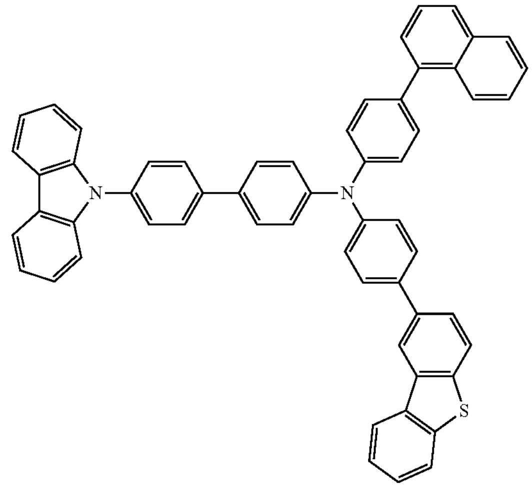
1-126
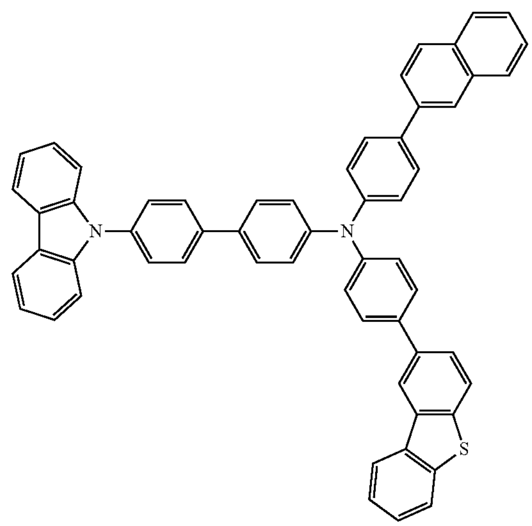
1-127
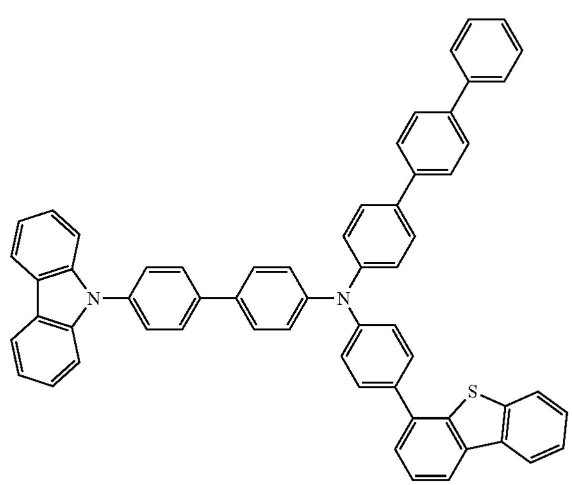

-continued
1-128
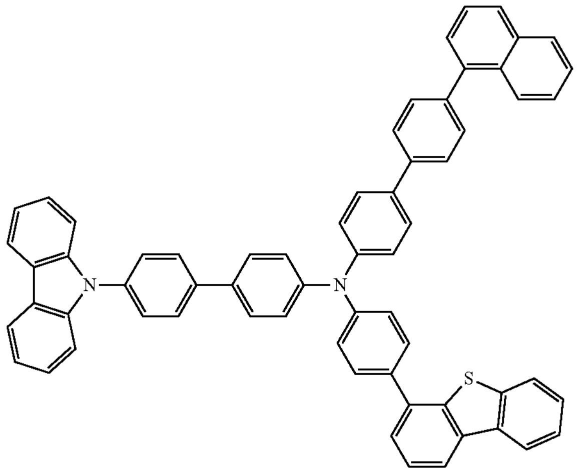
1-129
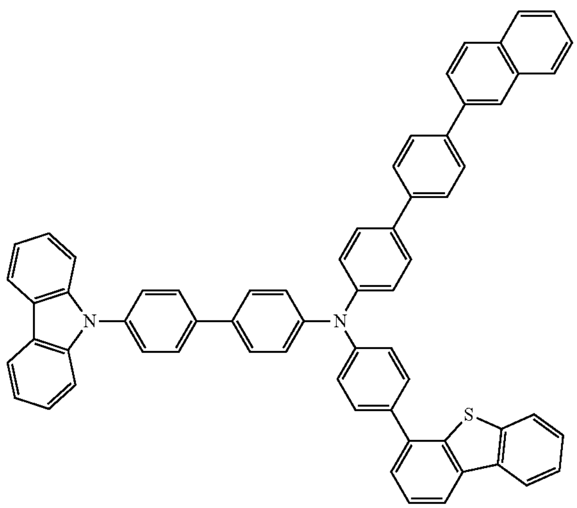
1-130
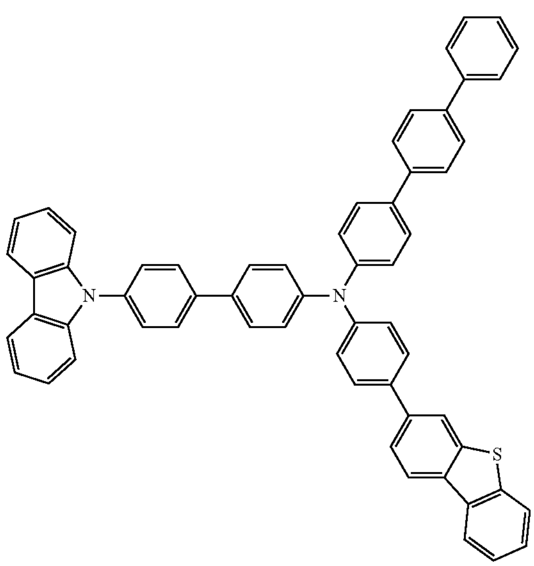
-continued
1-131
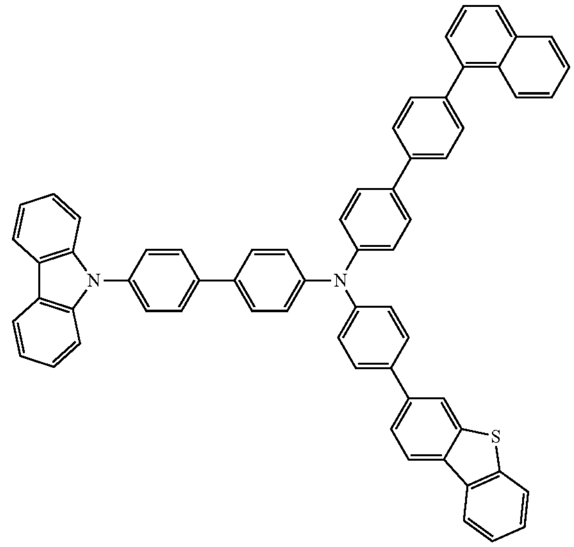
1-132
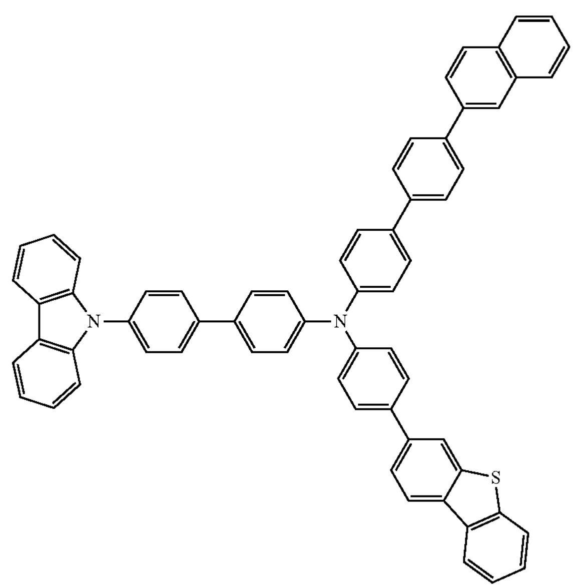

-continued
1-133
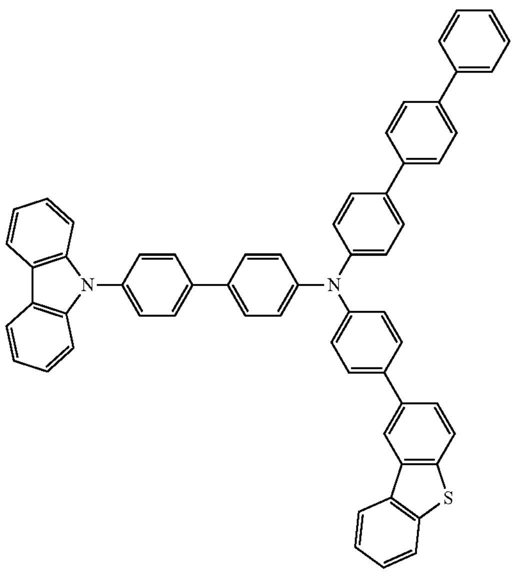
1-134
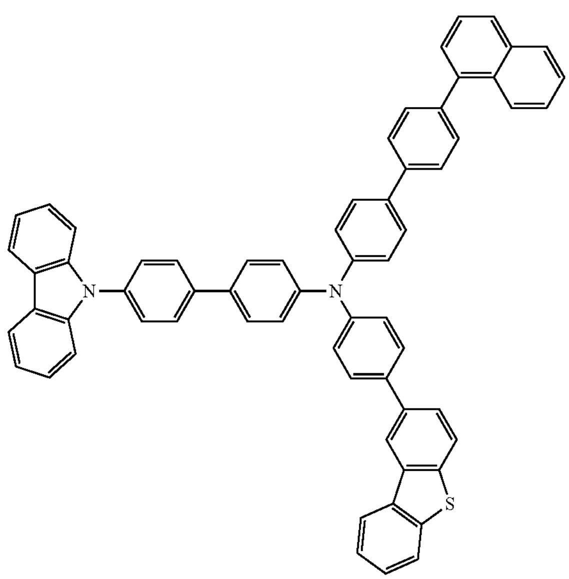
-continued
1-135
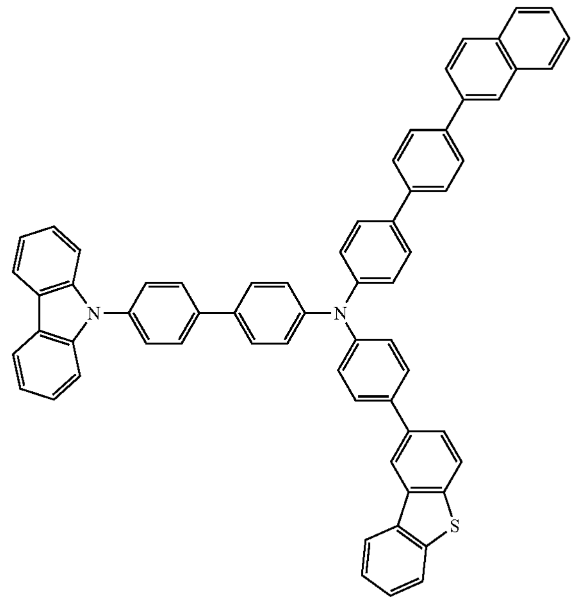
1-136
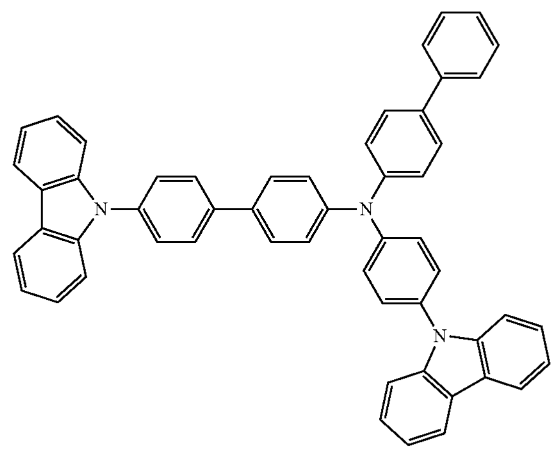
1-137
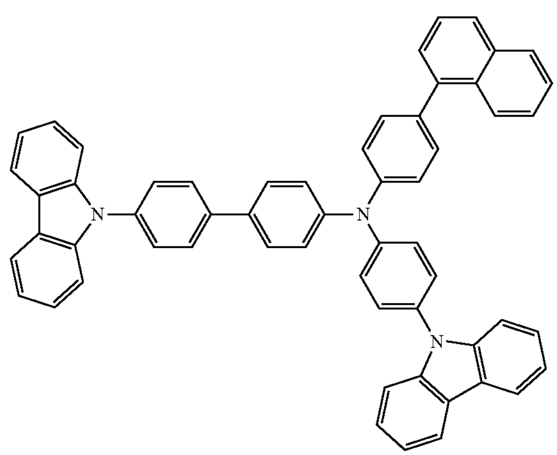

1-138
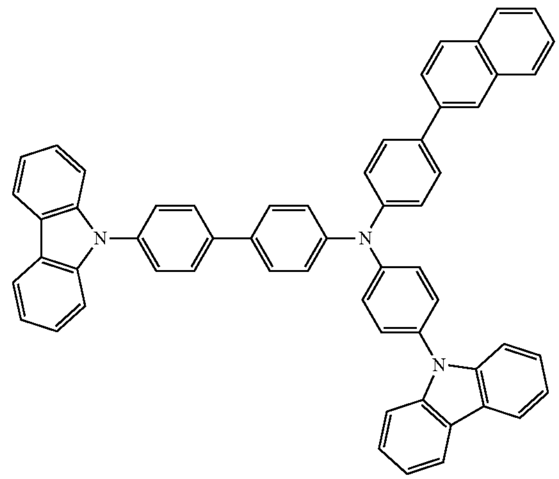
1-139
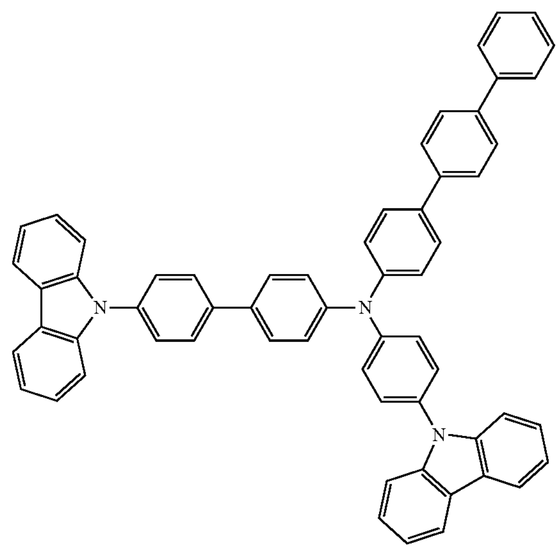
1-140
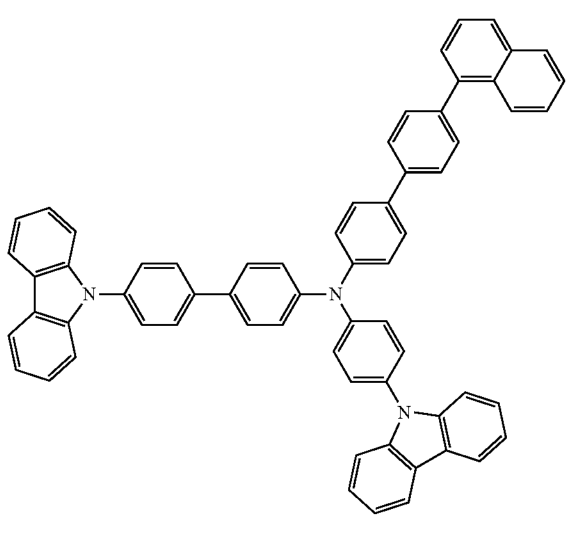
1-141
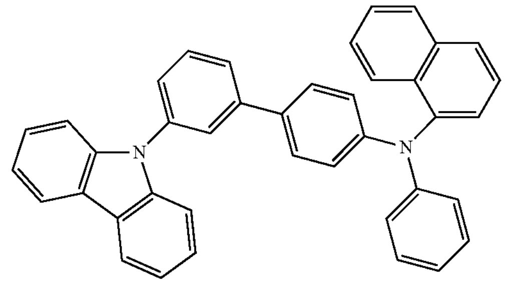
1-142
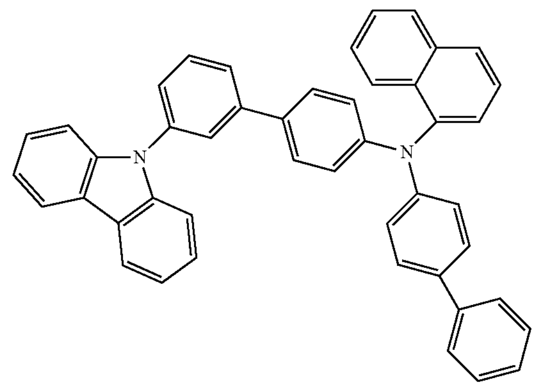
1-143
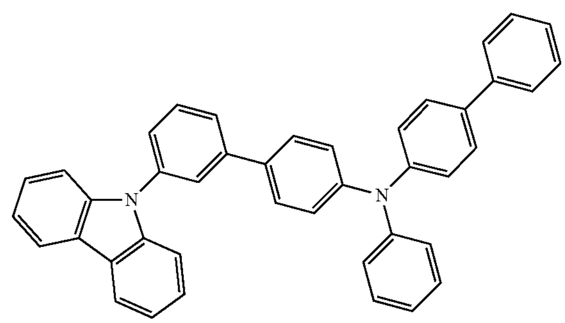
1-144
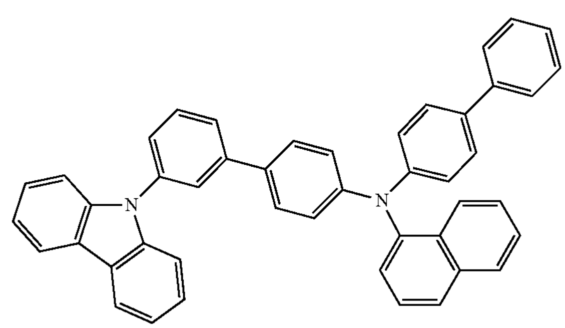

-continued
1-145
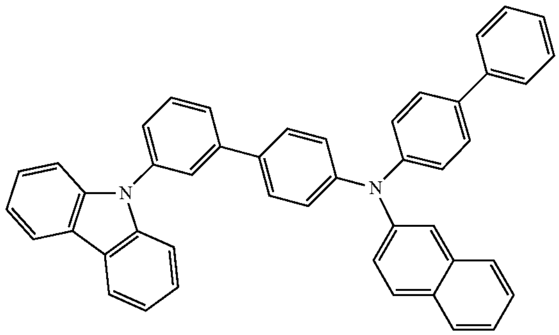
1-146
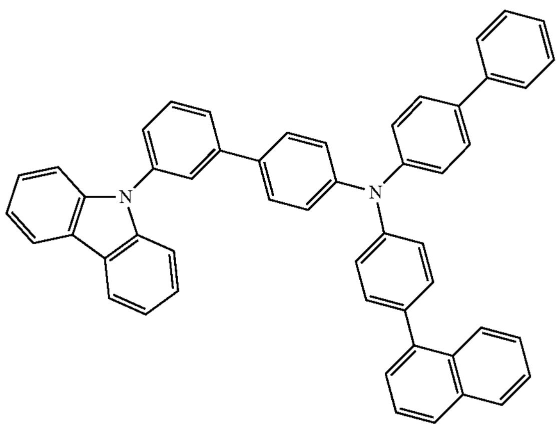
1-147
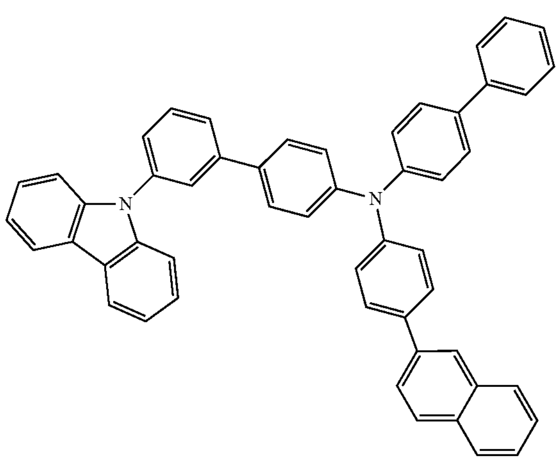
-continued
1-148
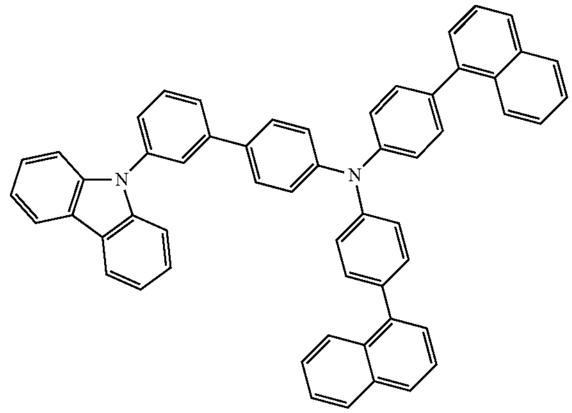
1-149
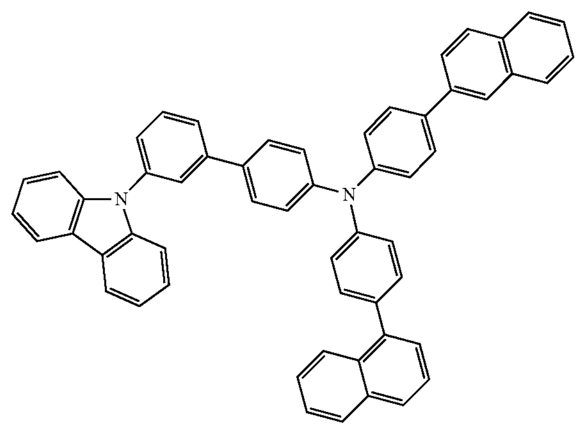
1-150
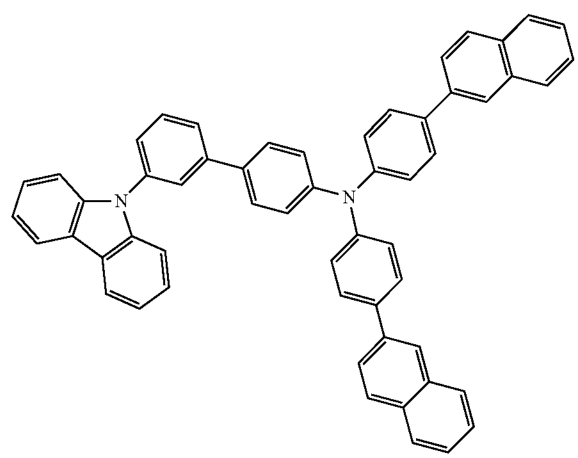

-continued
1-151
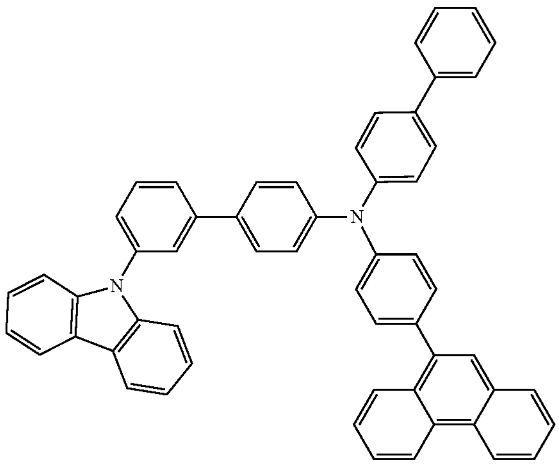
1-152
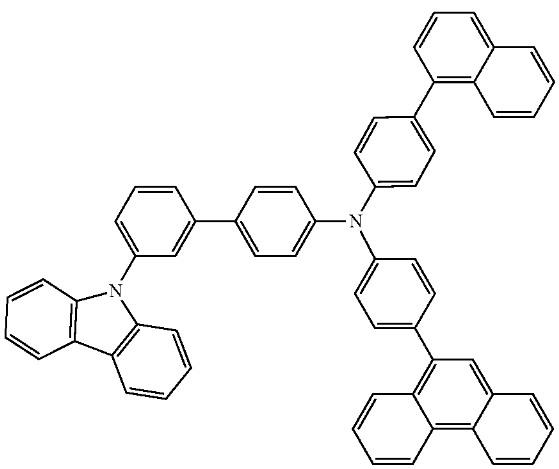
1-153
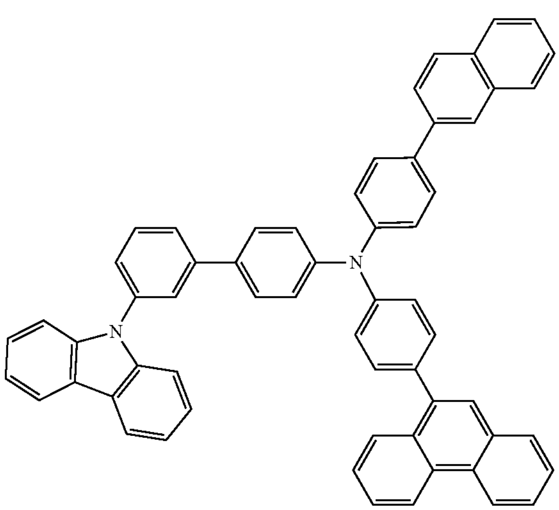
-continued
1-154
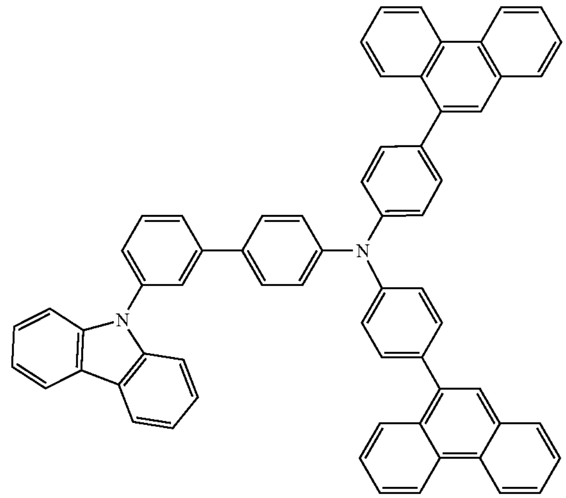
1-155
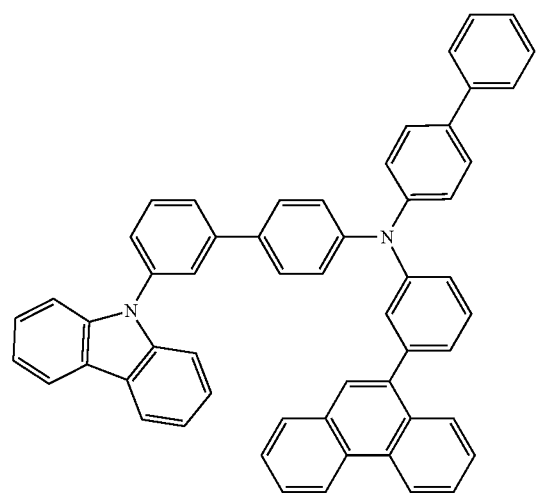
1-156
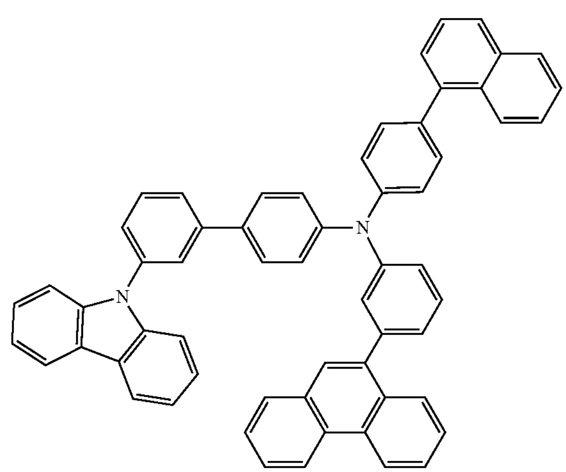

-continued
1-157
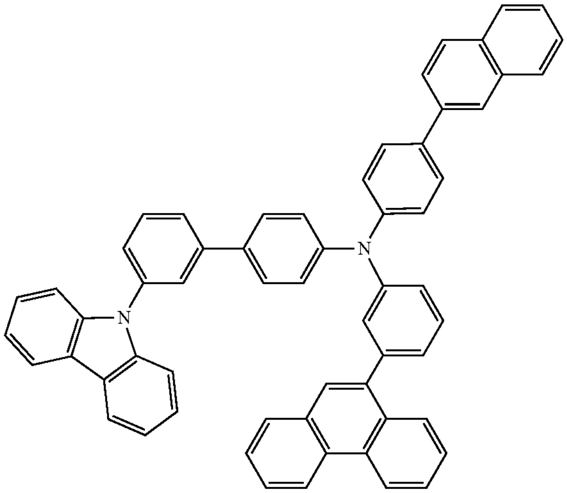
1-158
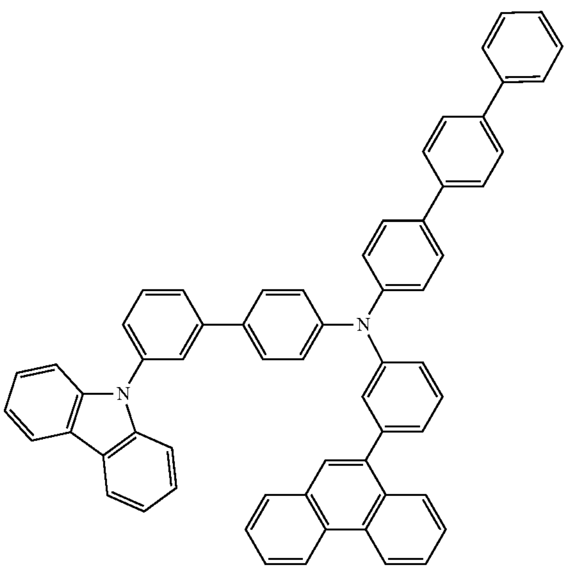
1-159
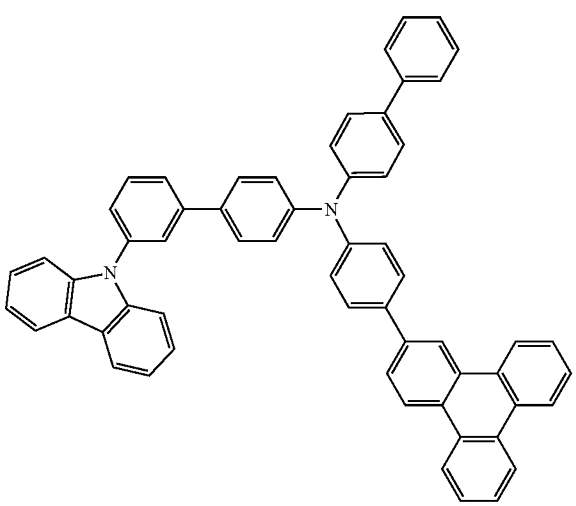
-continued
1-160
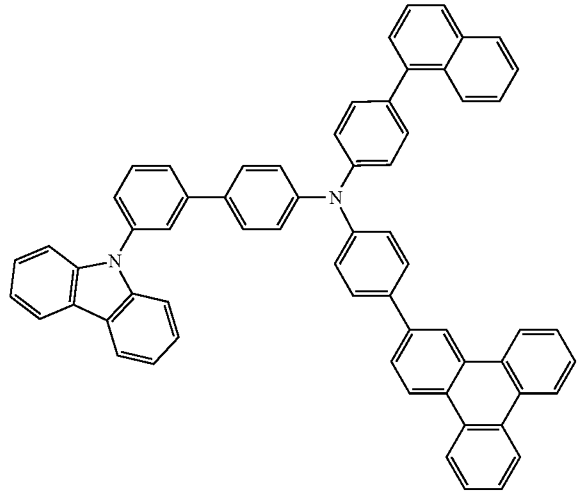
1-161
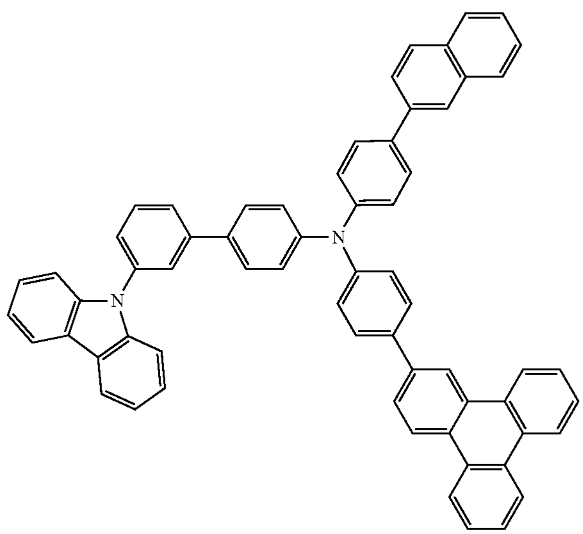
1-162
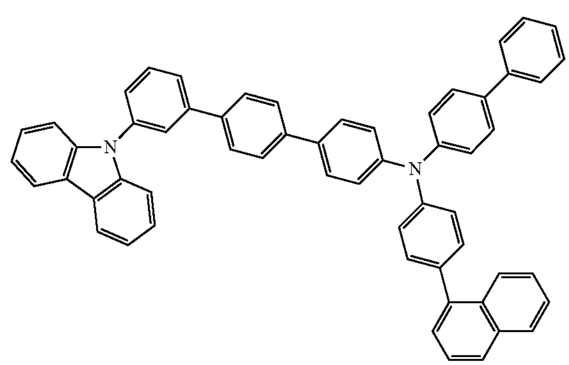

-continued
1-163
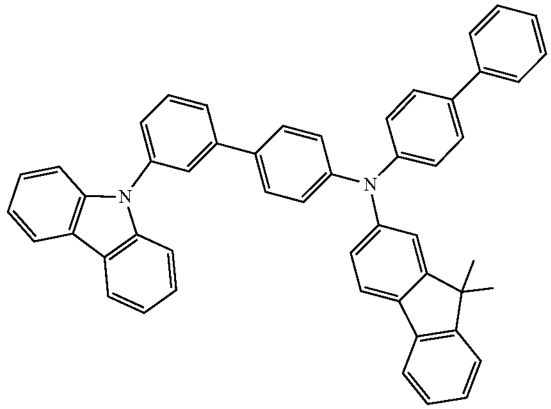
1-164
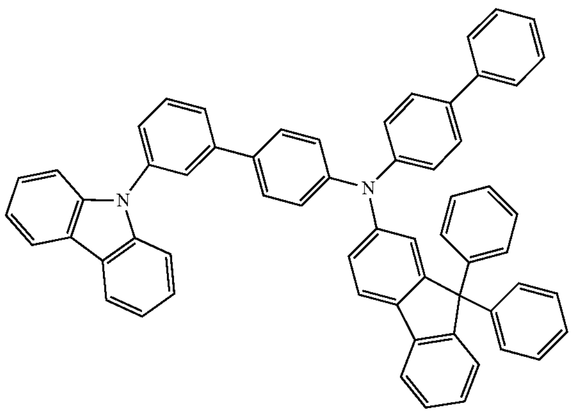
1-165
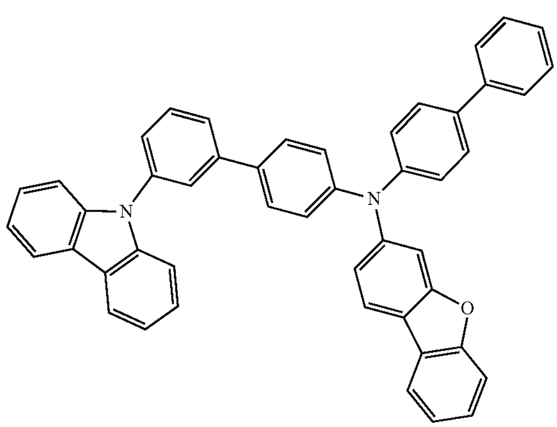
-continued
1-166
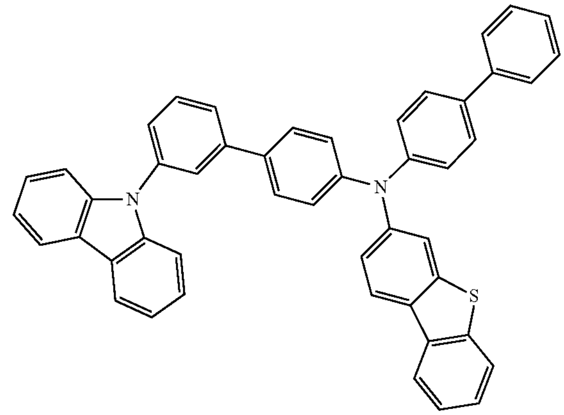
1-167
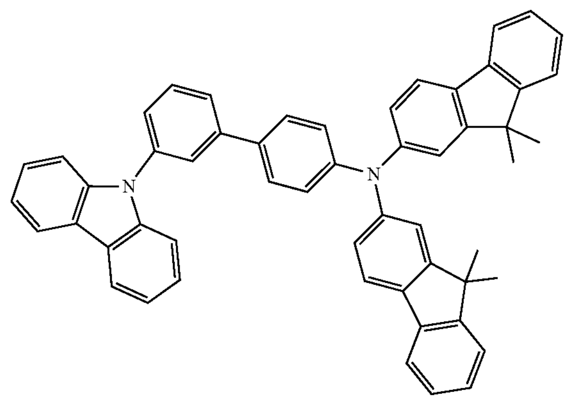
1-168
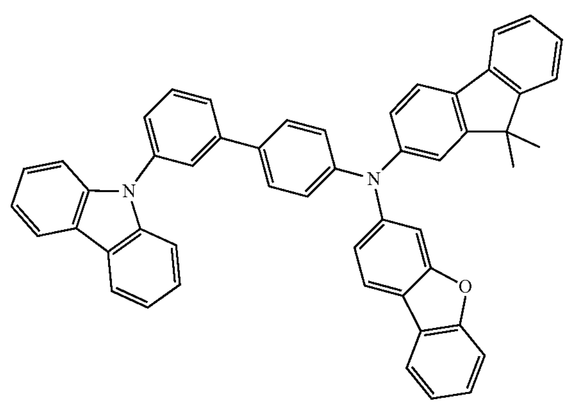

-continued
1-169
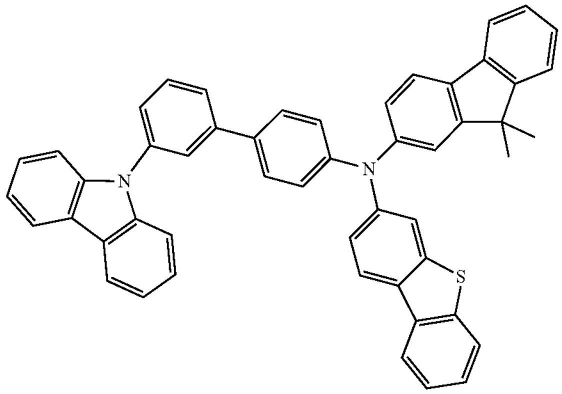
1-170
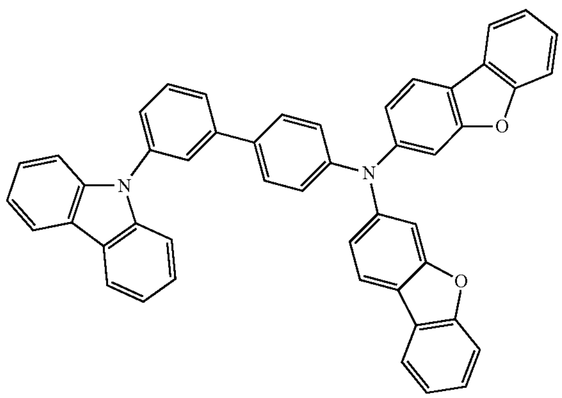
1-171
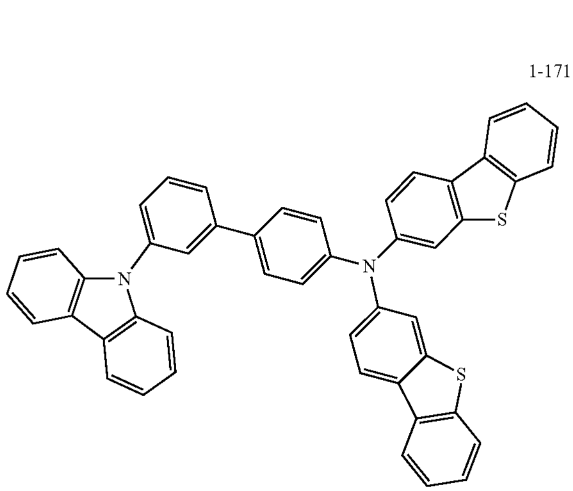
-continued
1-172
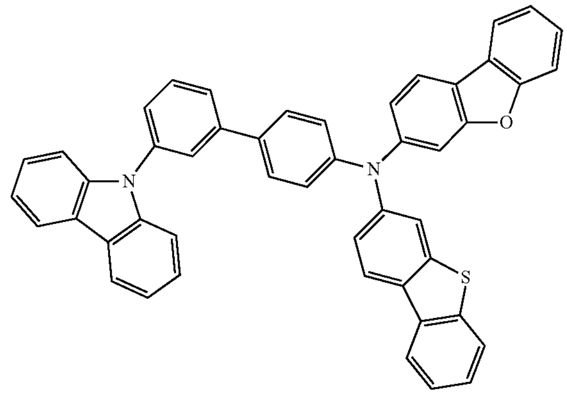
1-173
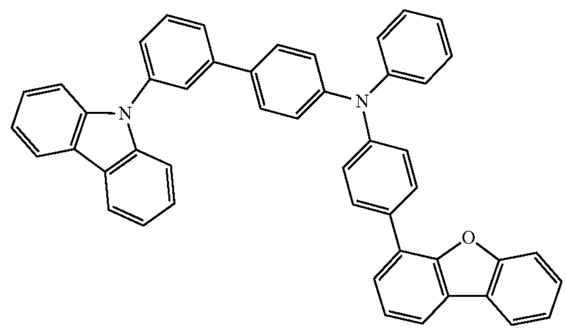
1-174
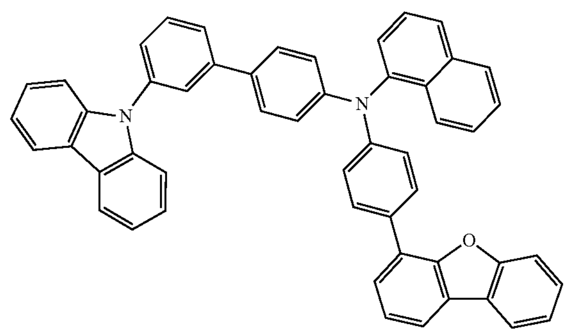
1-175
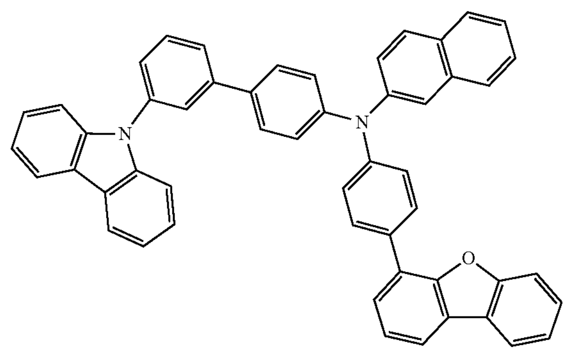

-continued
1-176
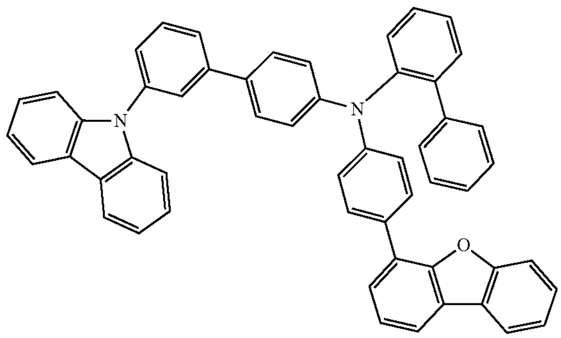
1-177
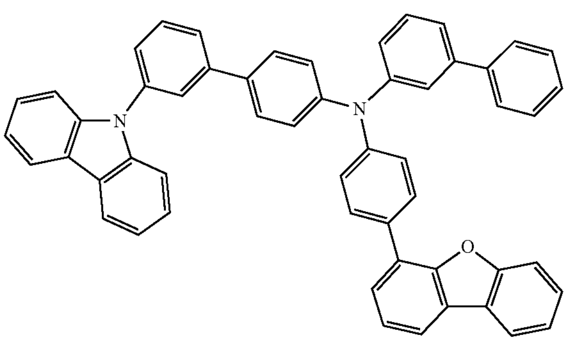
1-178
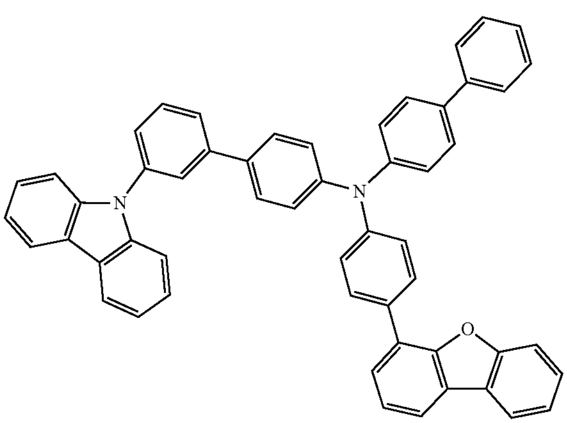
-continued
1-179
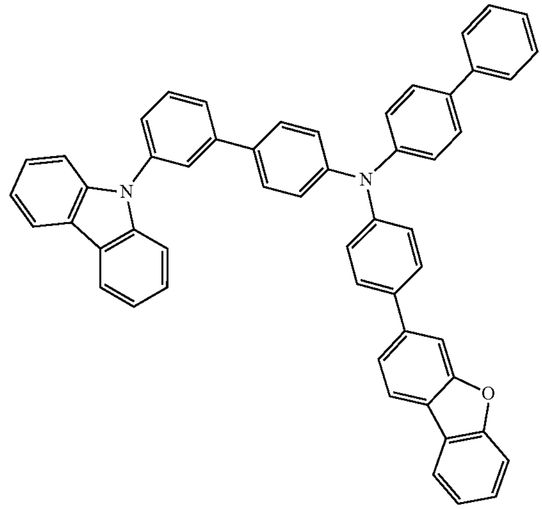
1-180
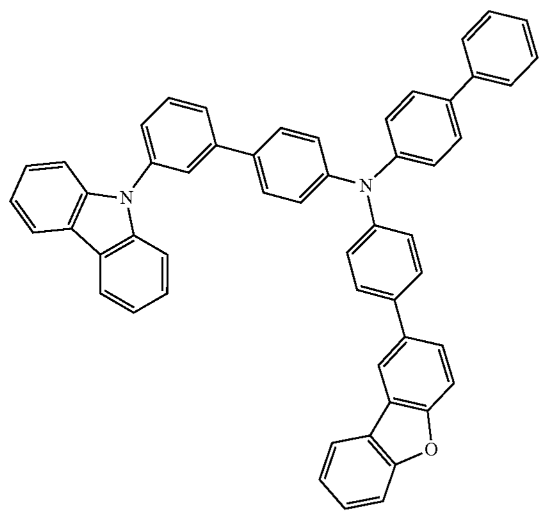
1-181
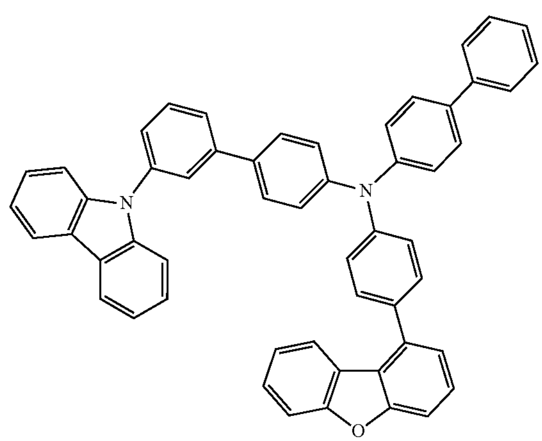

-continued
1-182
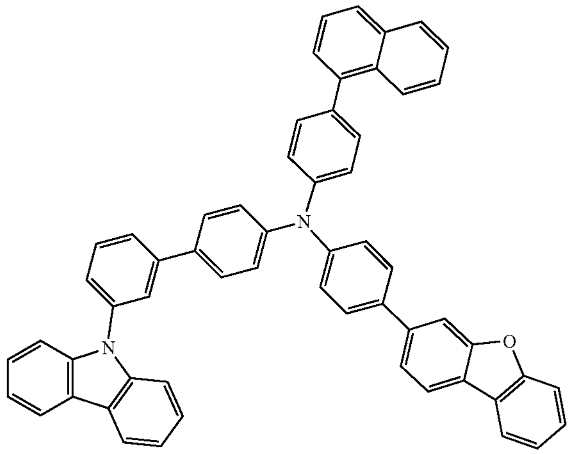
1-183
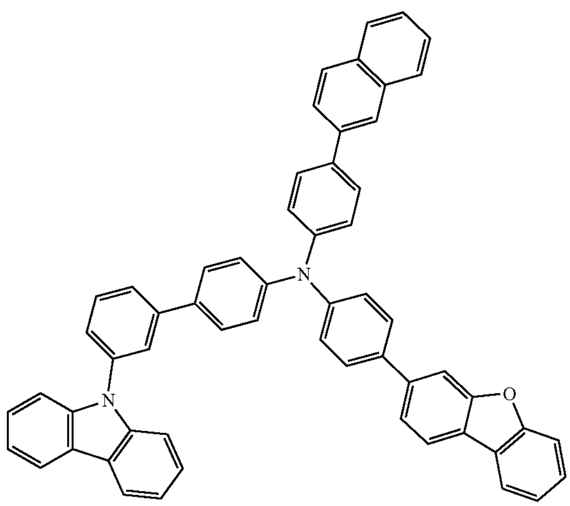
1-184
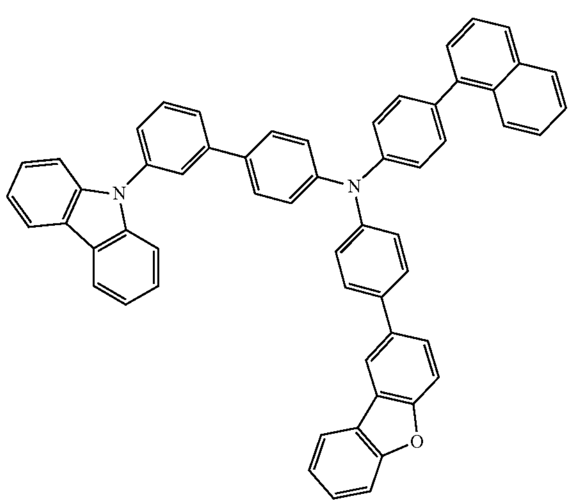
-continued
1-185
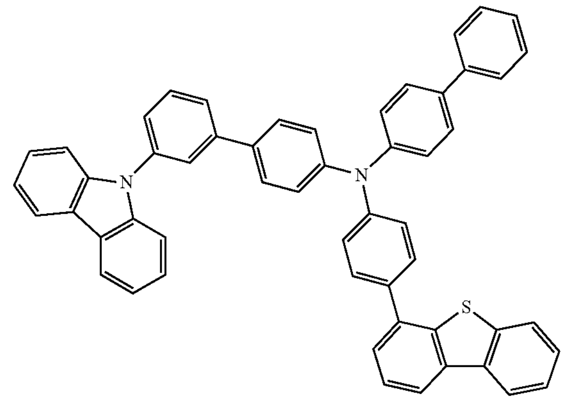
1-186
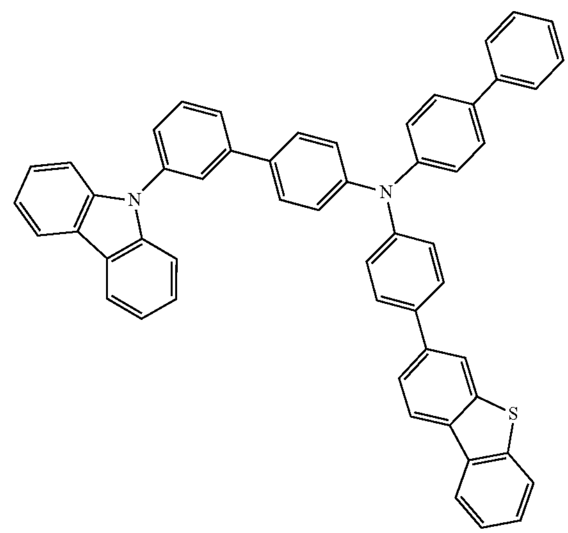
1-187
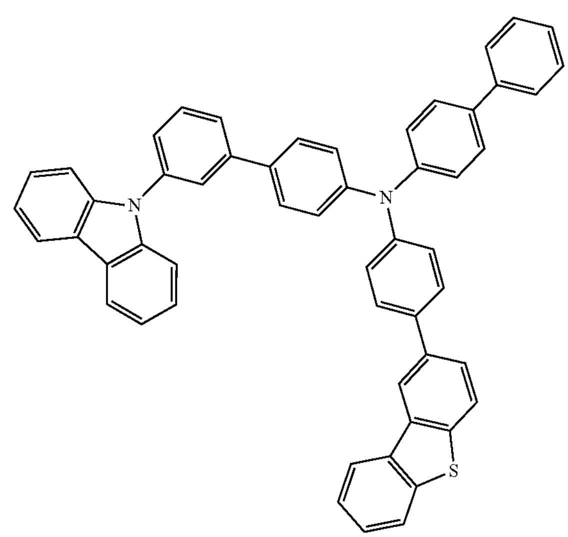

-continued
1-188
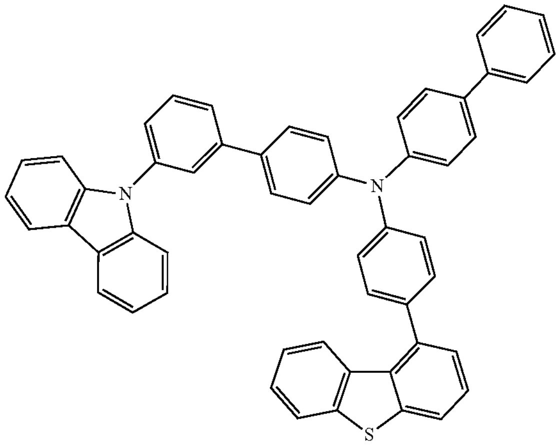
1-189
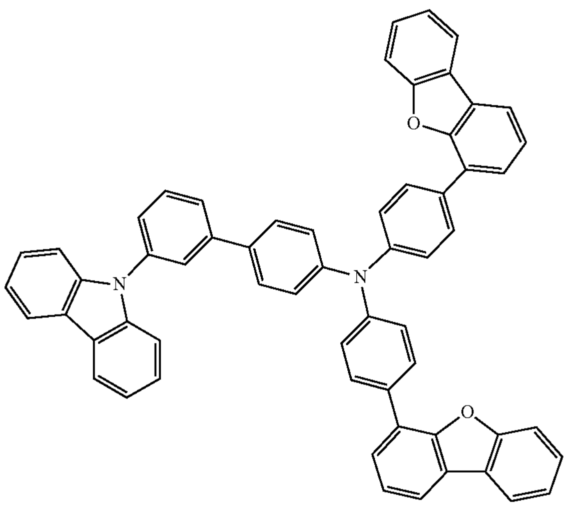
1-190
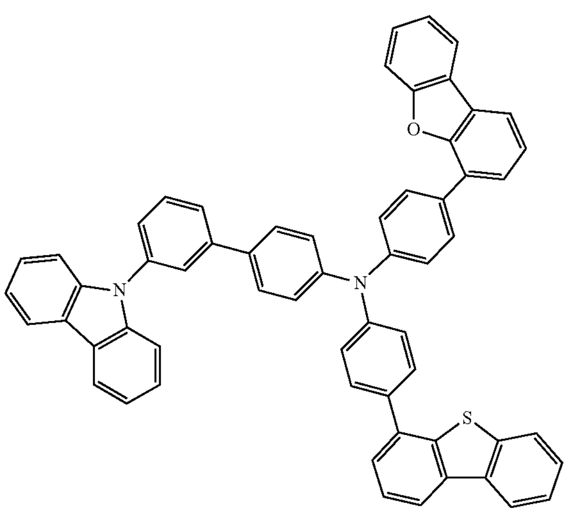
-continued
1-191
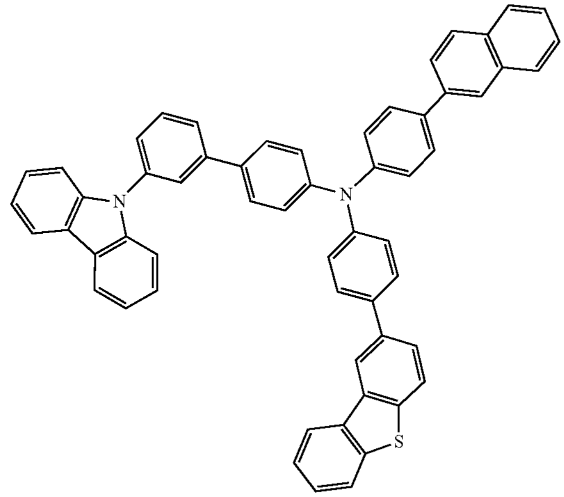
1-192
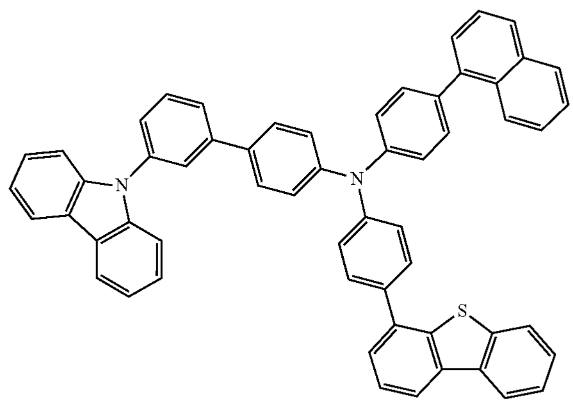
1-193
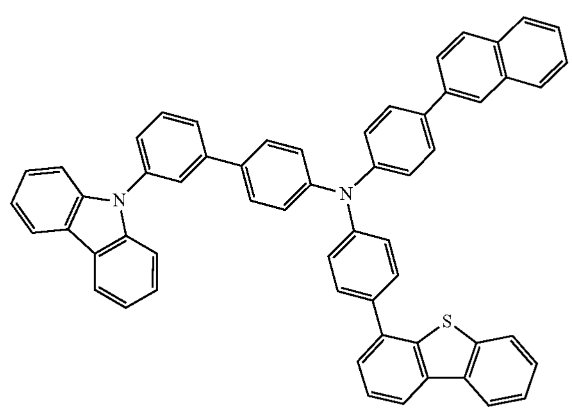

-continued
1-194
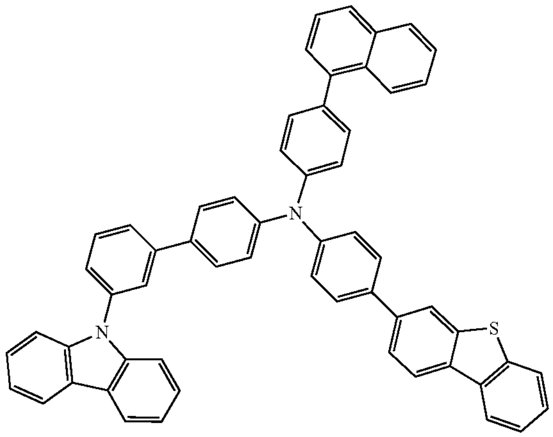
1-195
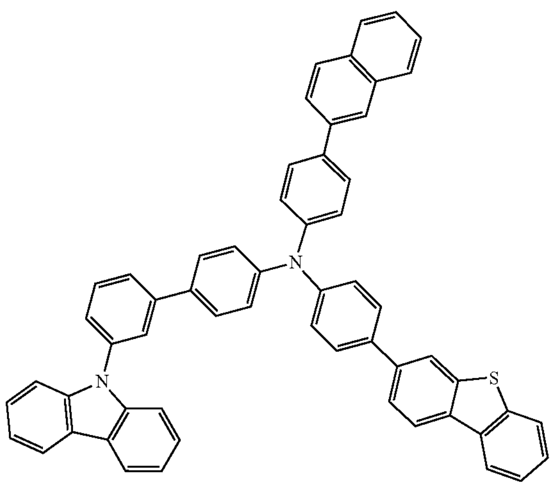
1-196
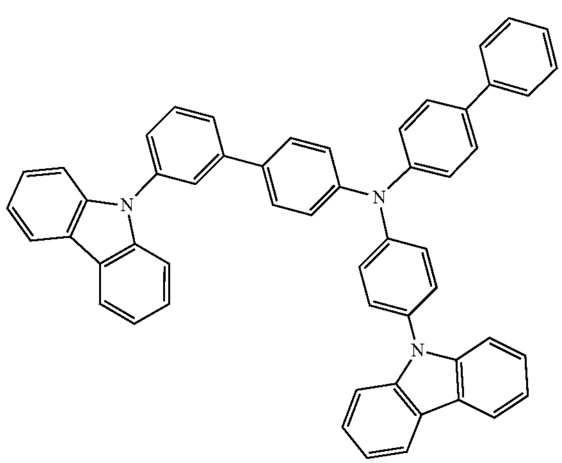
-continued
1-197
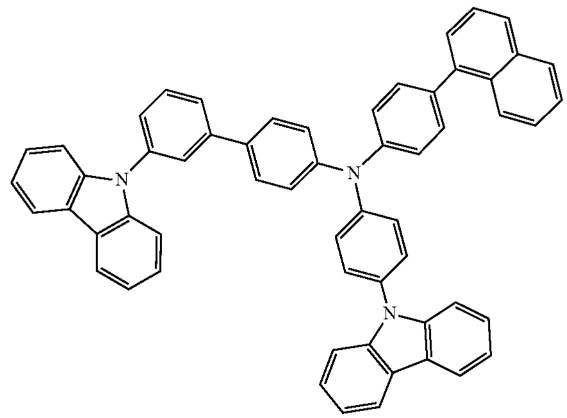
1-198
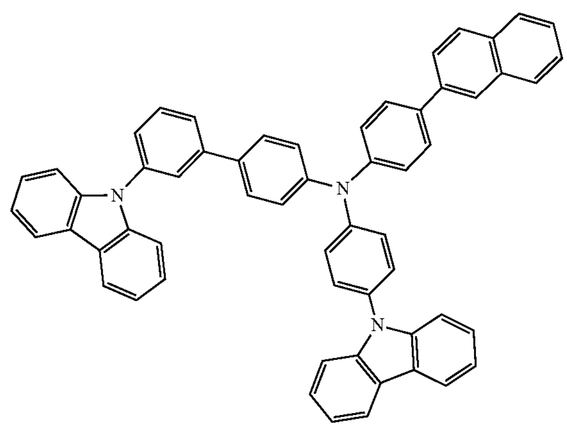
1-199
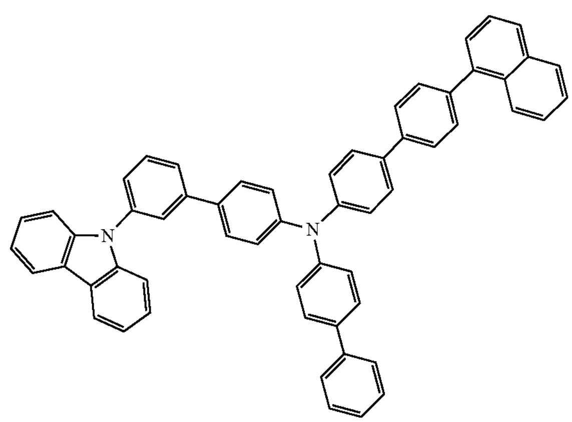

-continued
1-200
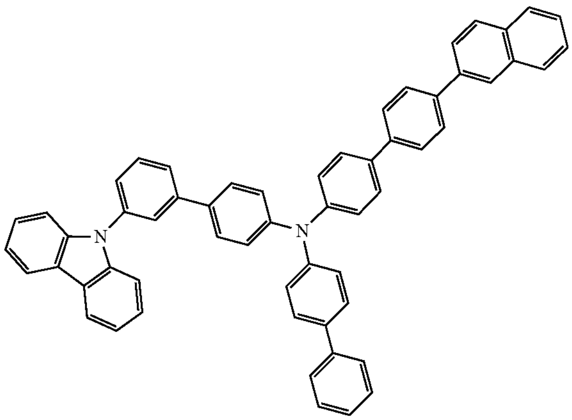
1-201
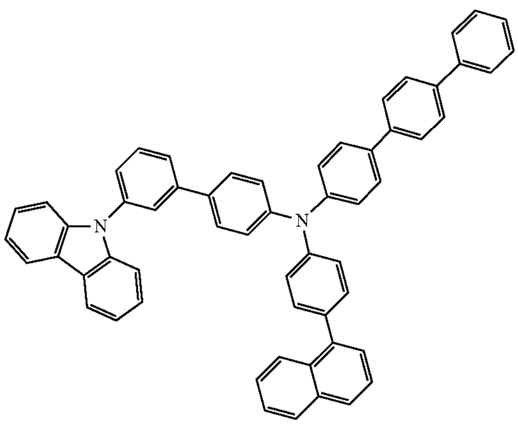
1-202
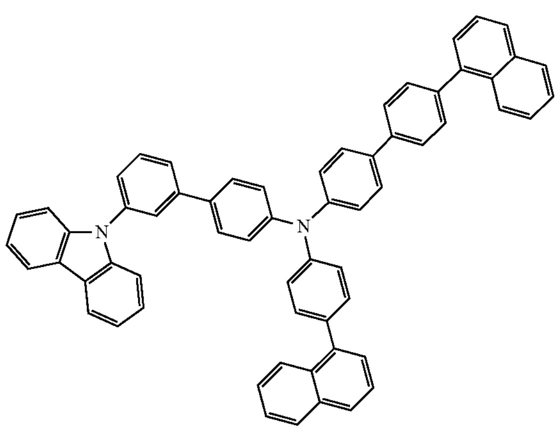
-continued
1-203
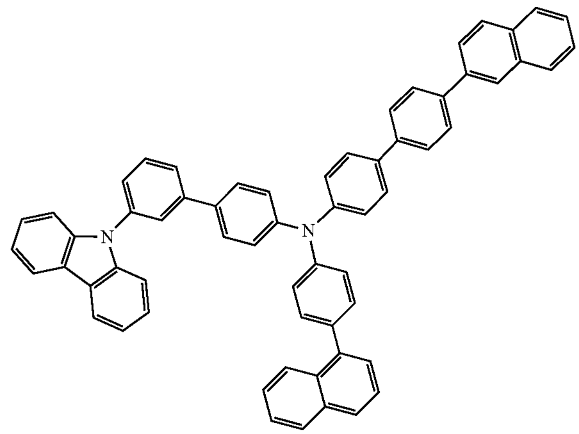
1-204
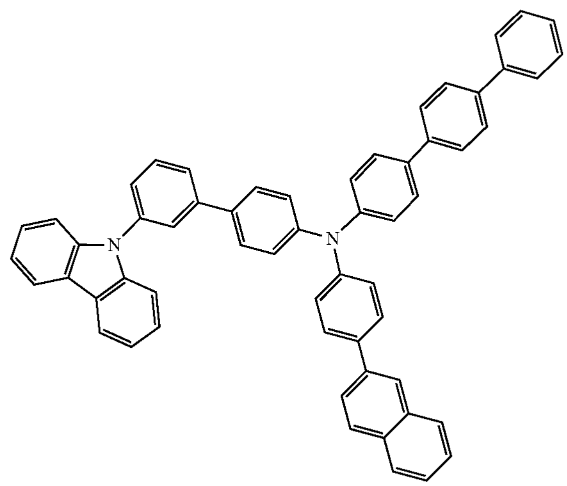
1-205
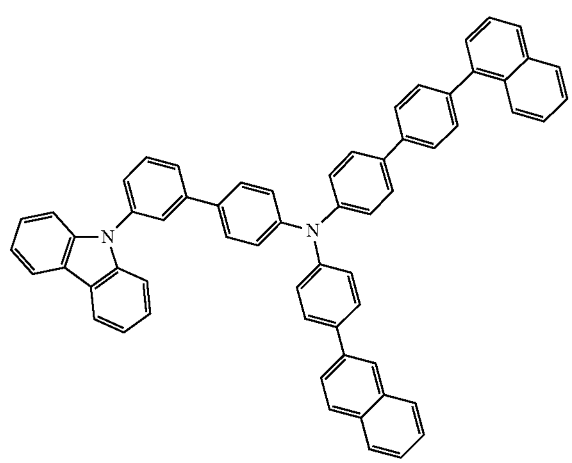

-continued
1-206
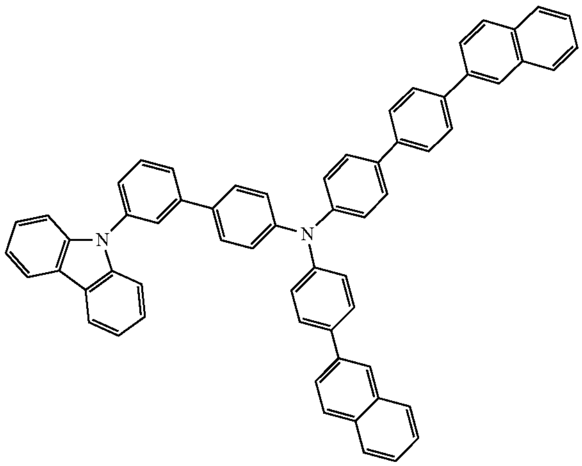
1-207
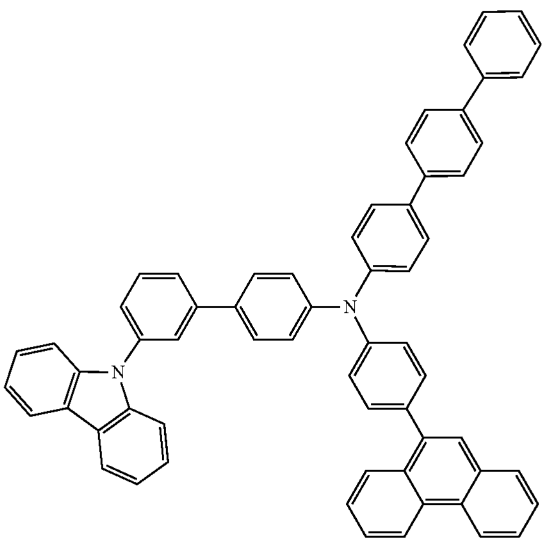
1-208
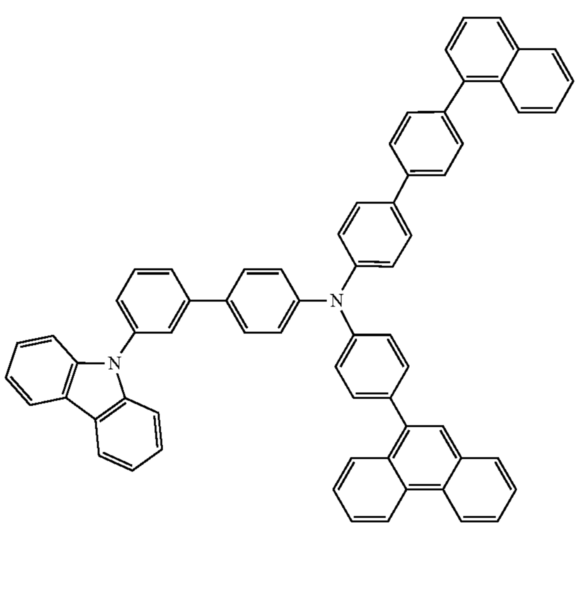
-continued
1-209
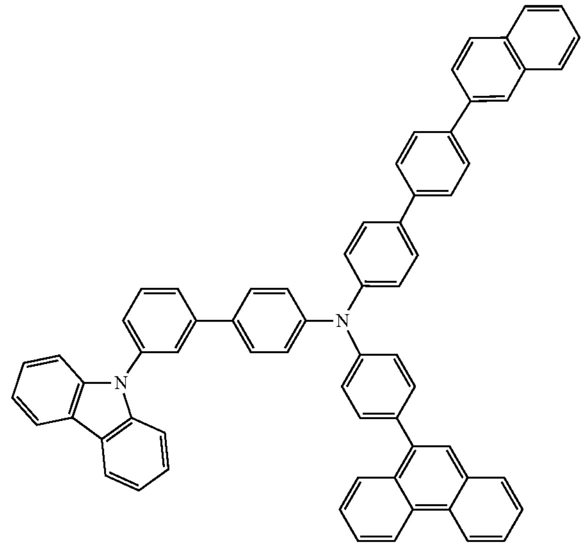
1-210
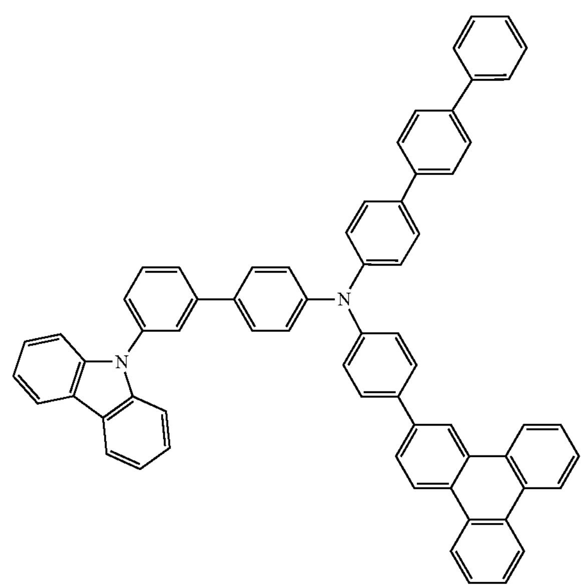

-continued
1-211
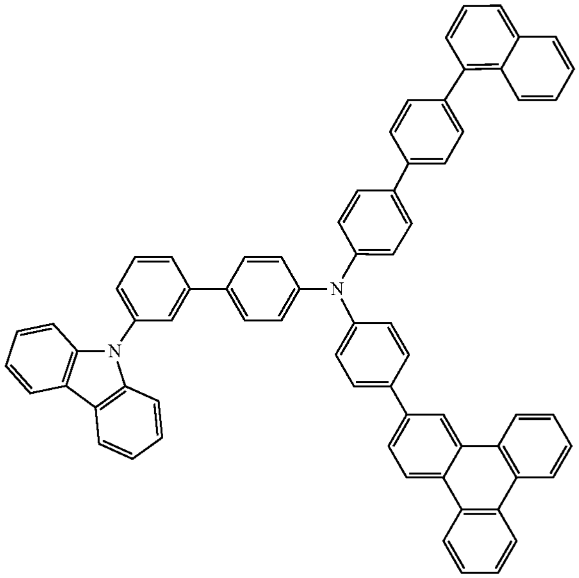
1-212
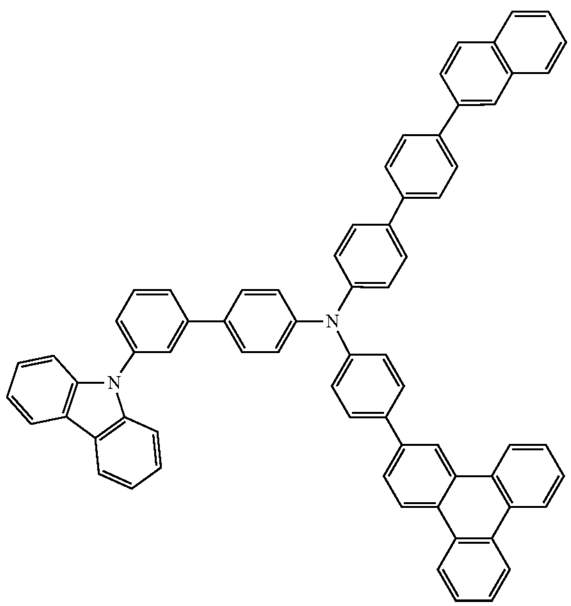
1-213
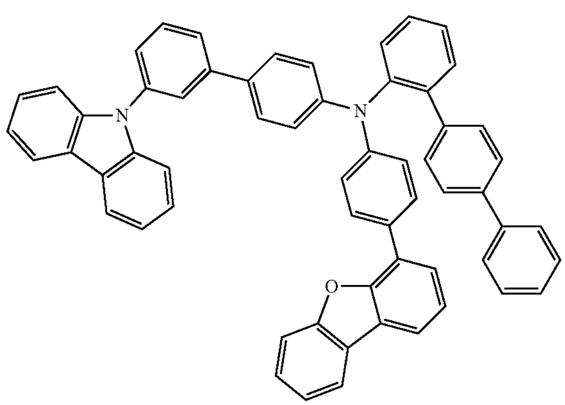
-continued
1-214
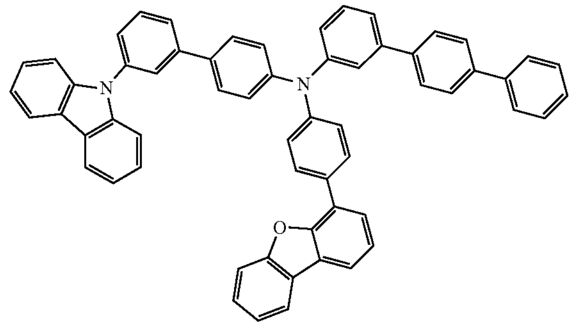
1-215
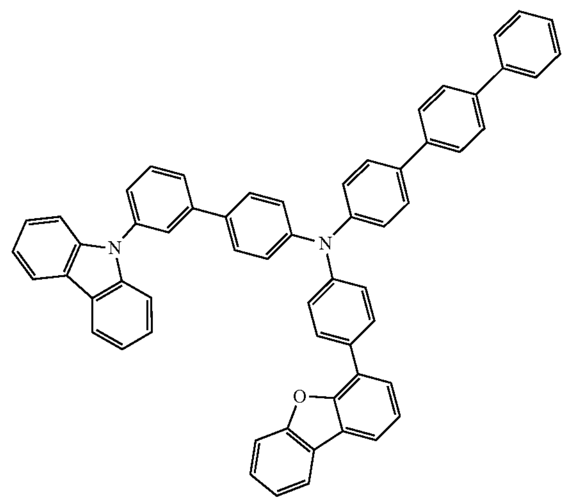
1-216
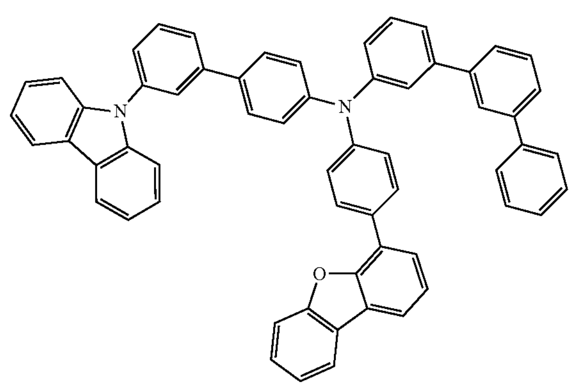

1-217
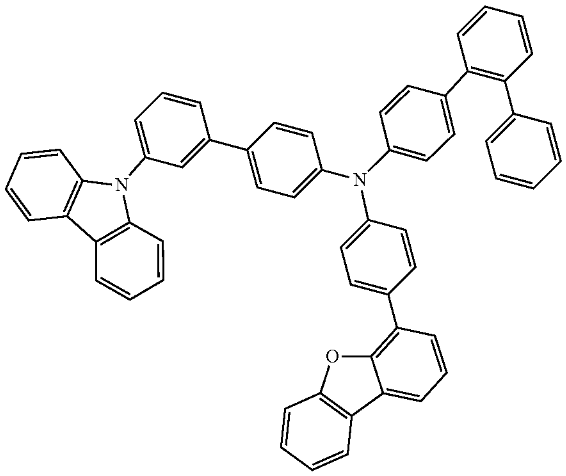
1-218
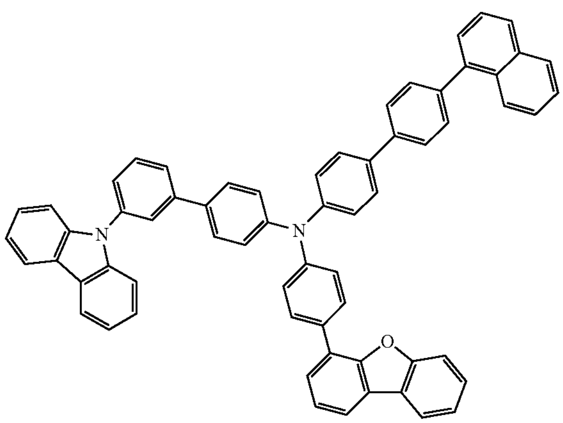
1-219
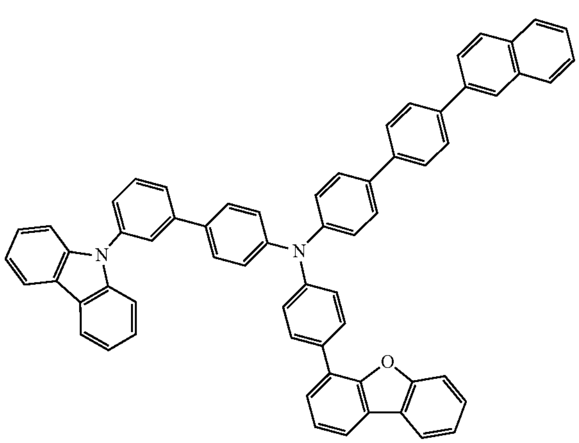
1-220
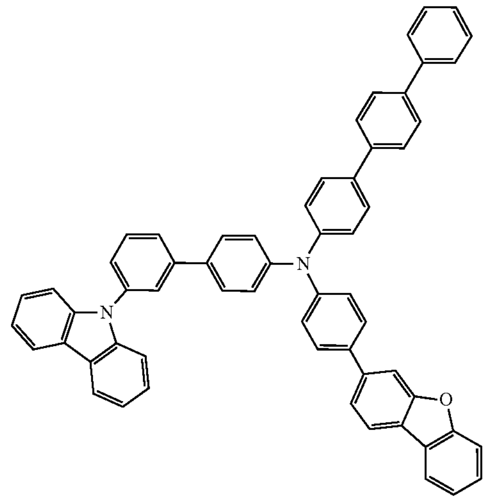
1-221
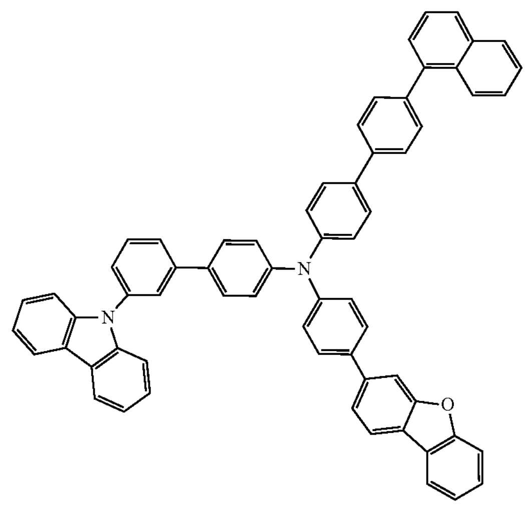
1-222
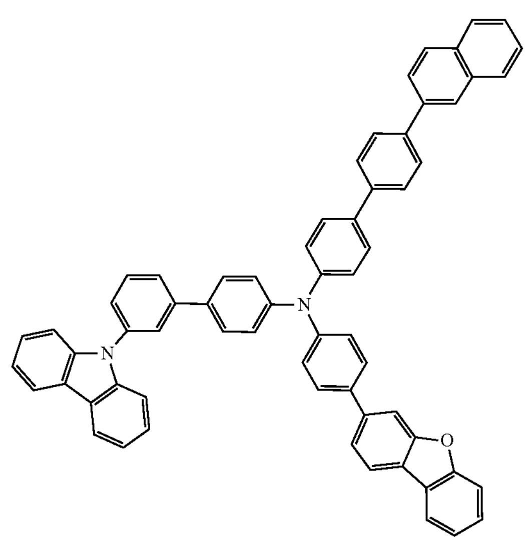

-continued
1-223
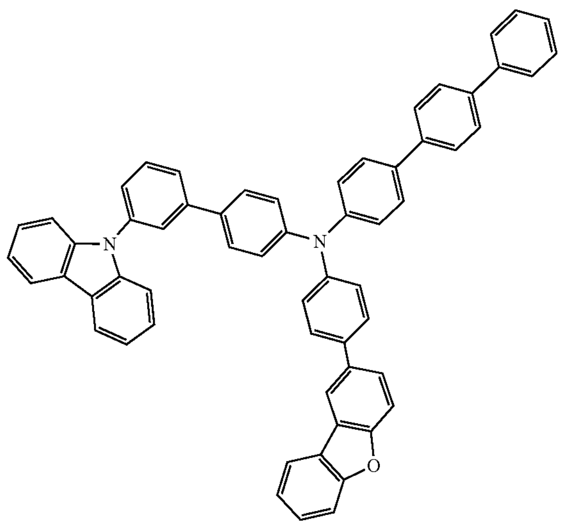
1-224
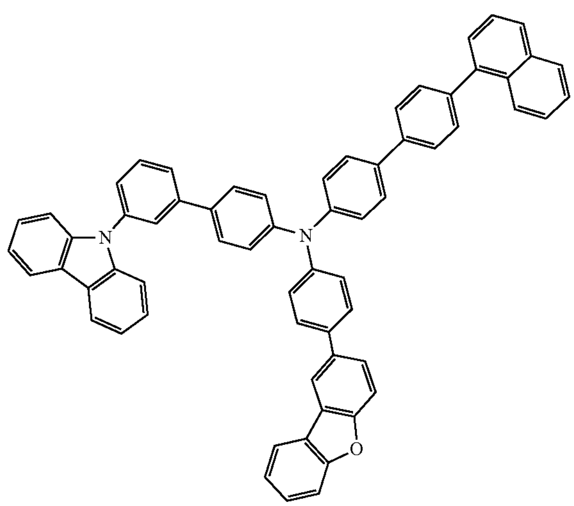
1-225
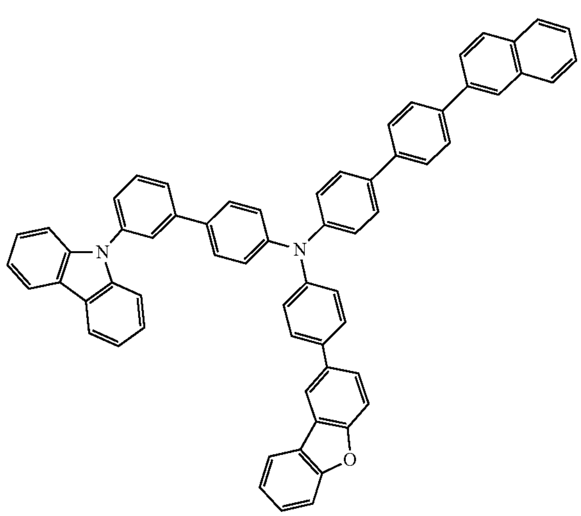
1-226
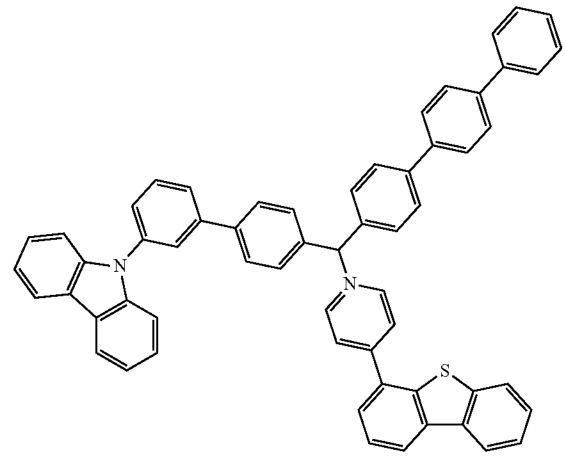
1-227
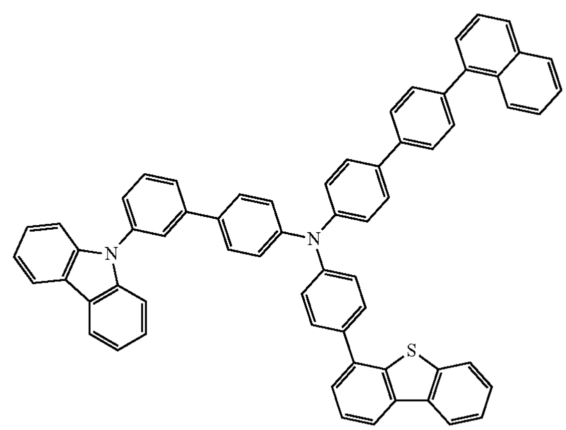
1-228
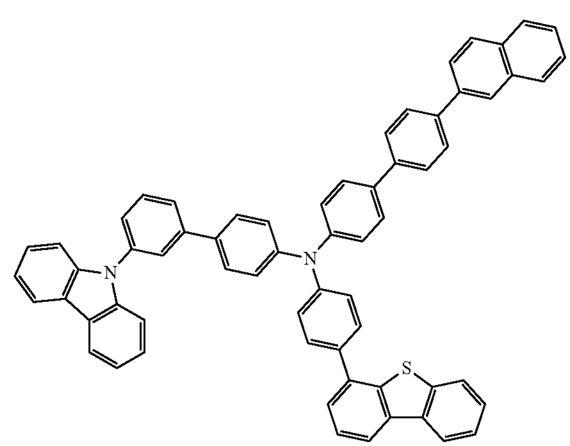

-continued
1-229
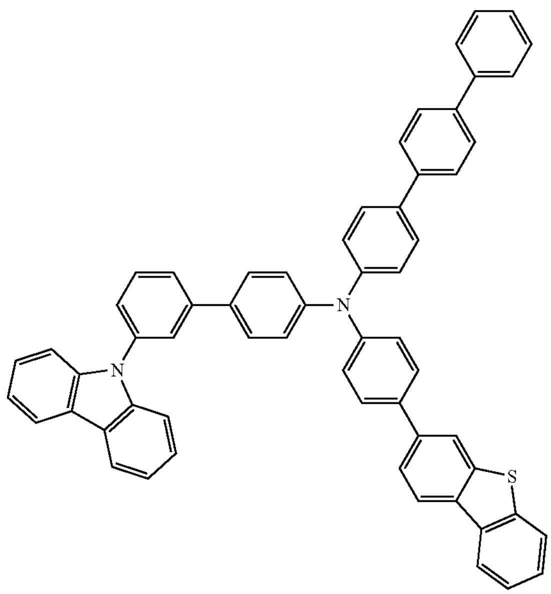
1-230
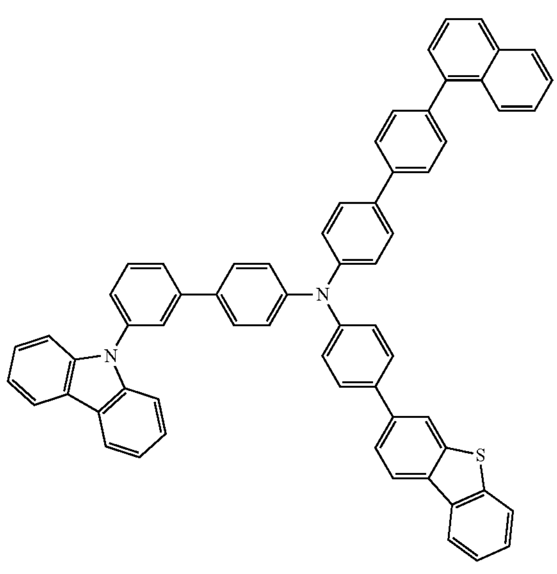
-continued
1-231
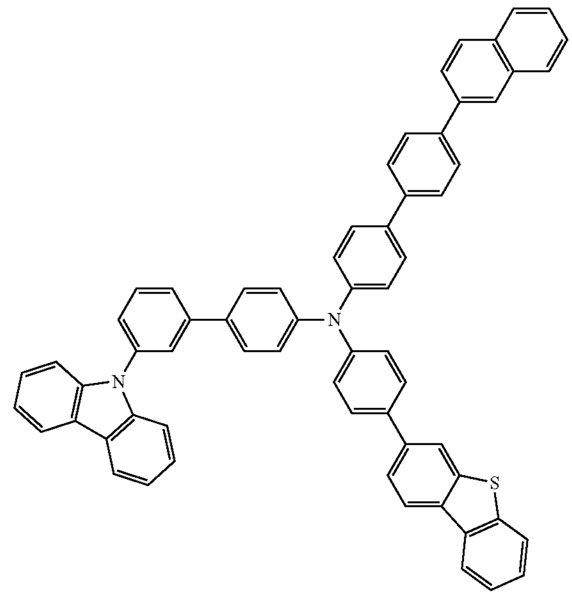
1-232
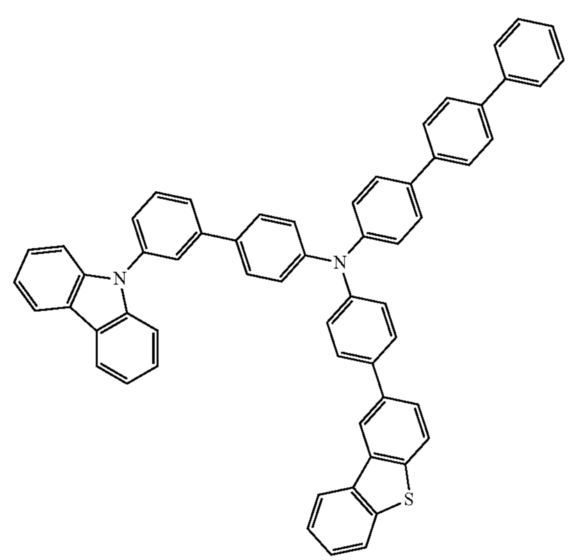

-continued
1-233
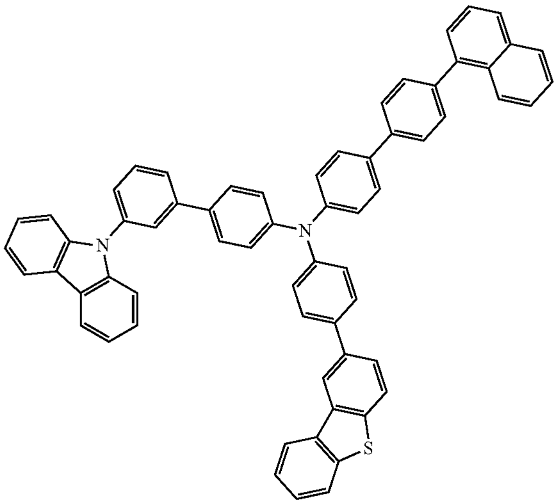
1-234
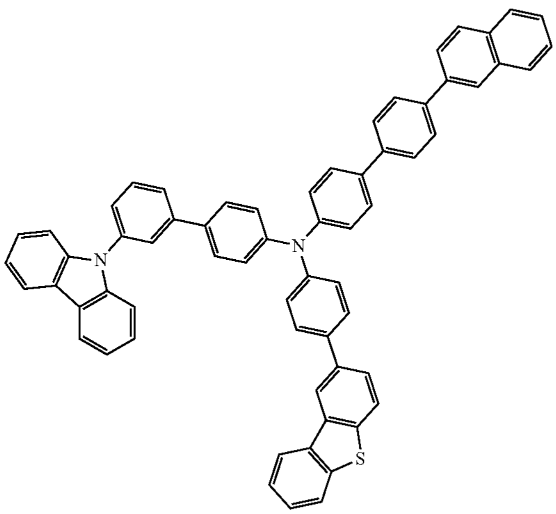
1-235
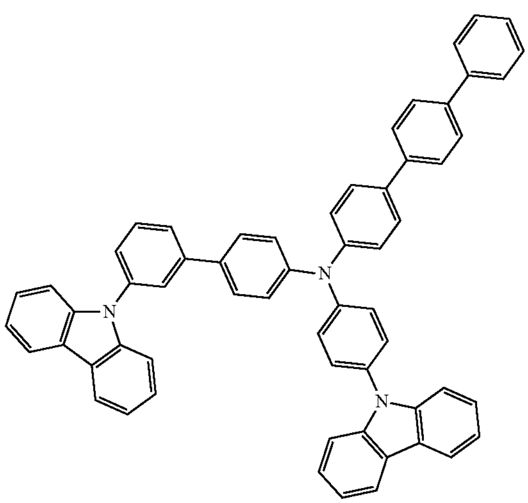
-continued
1-236
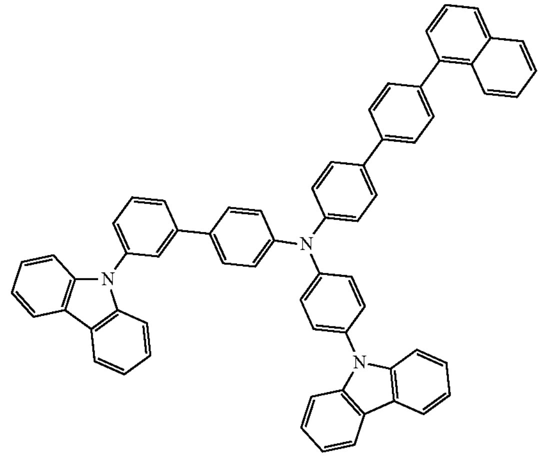
1-237
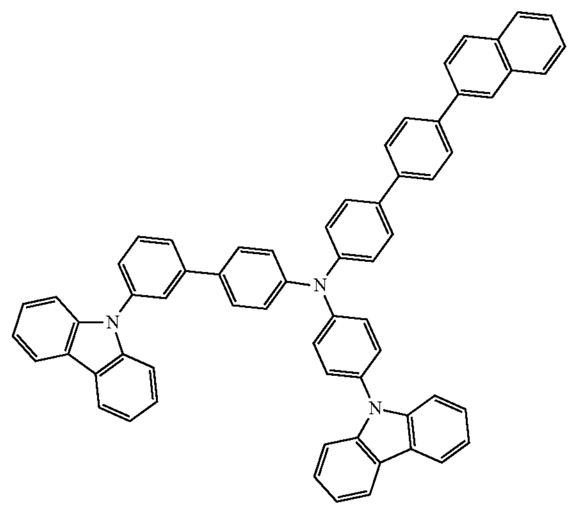
1-238
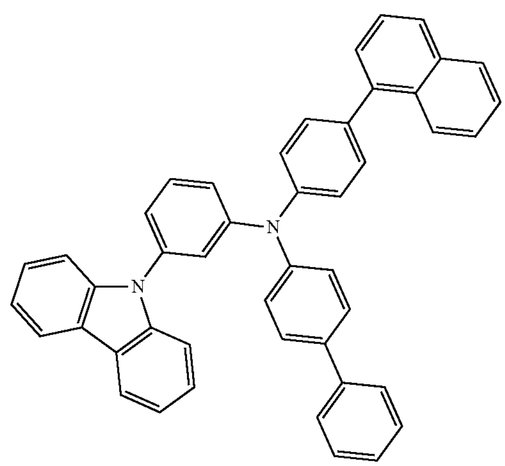

-continued
1-239
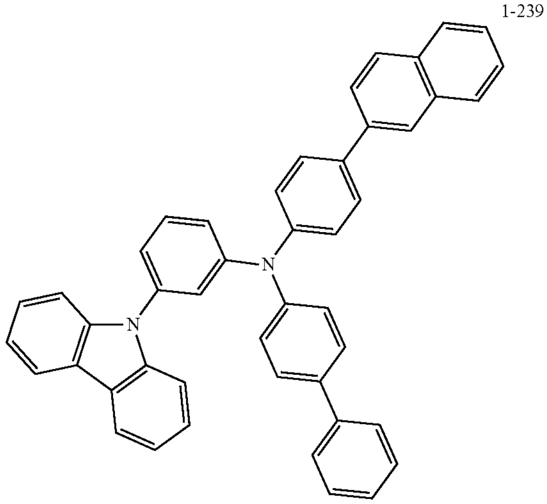
1-240
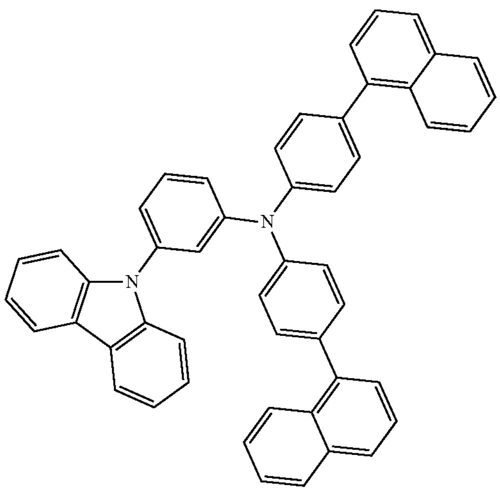
1-241
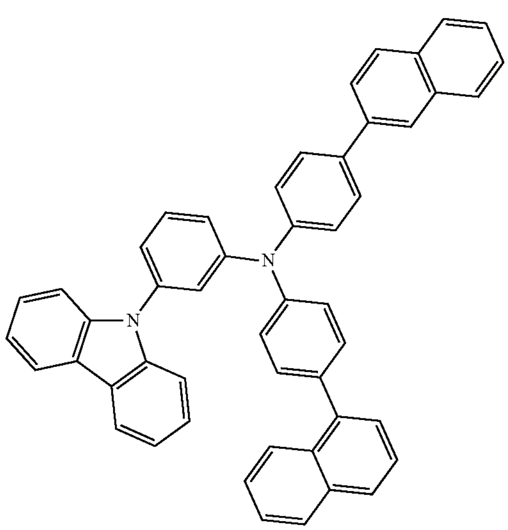
-continued
1-242
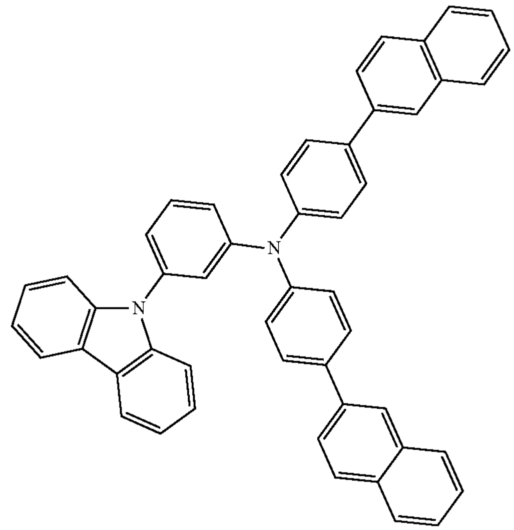
1-243
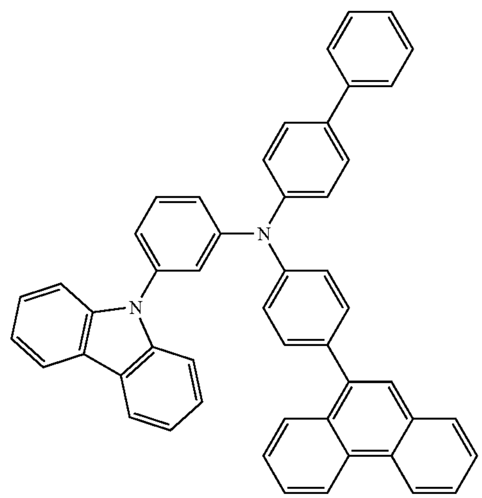
1-244
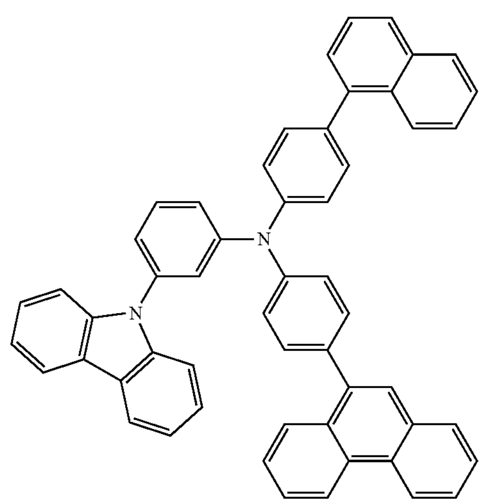

-continued
1-245
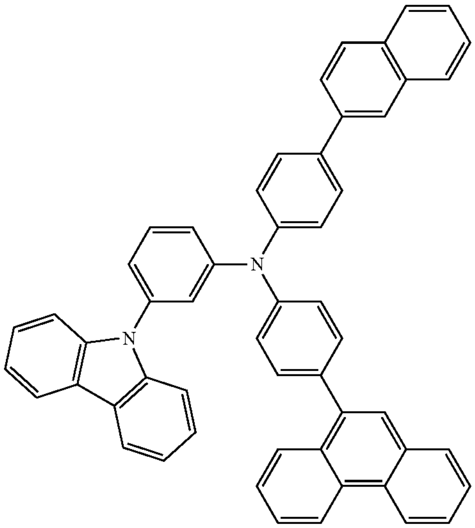
1-246
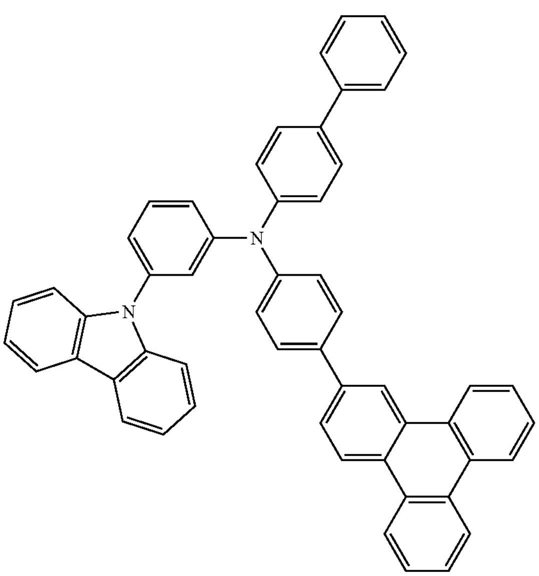
-continued
1-247
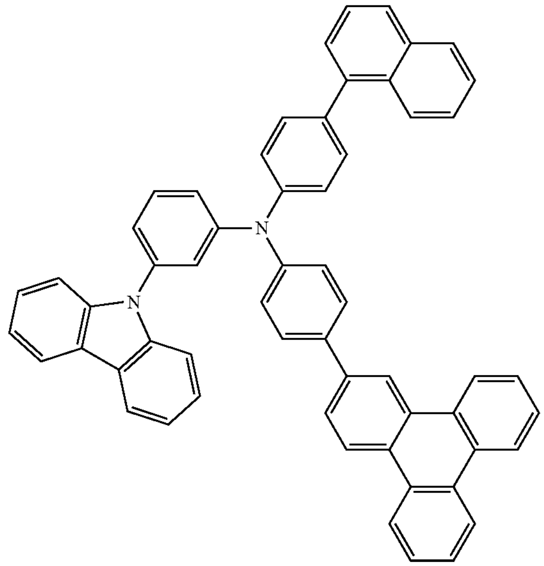
1-248
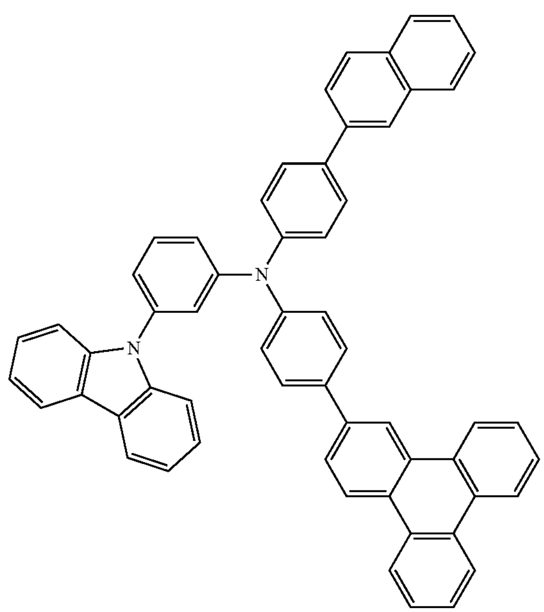

-continued
1-249
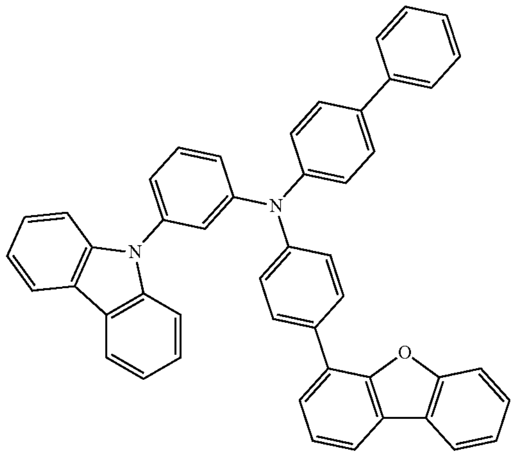
1-250
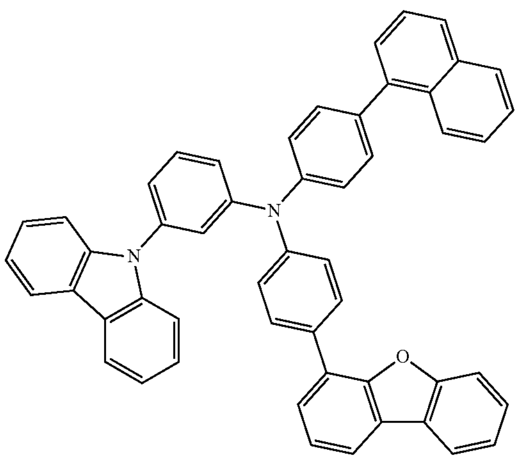
1-251
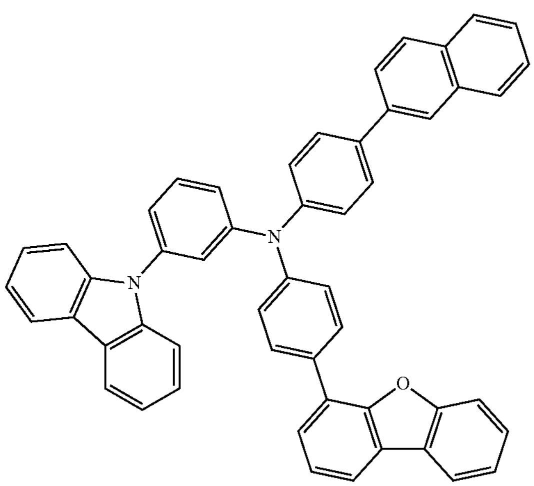
-continued
1-252
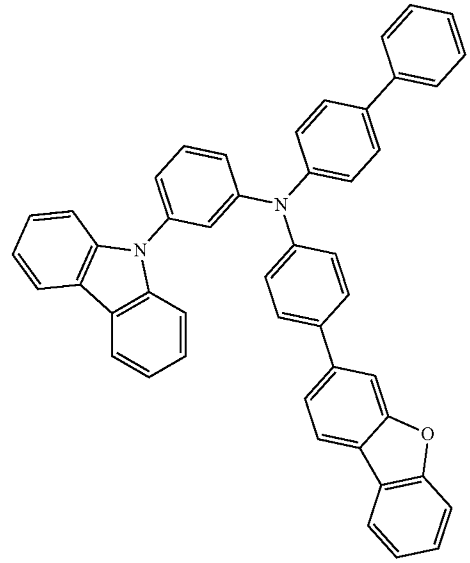
1-253
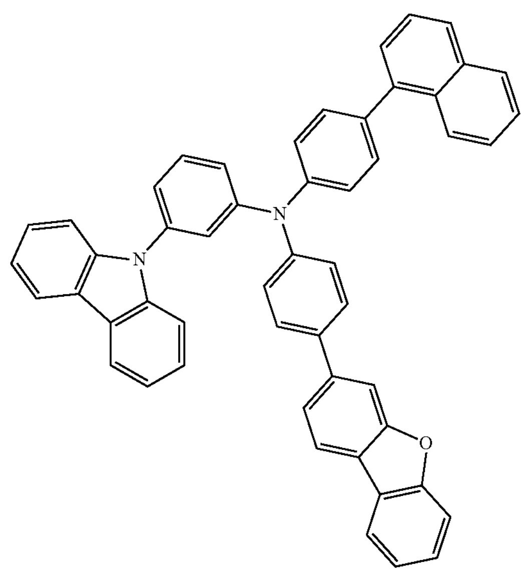

-continued
1-254
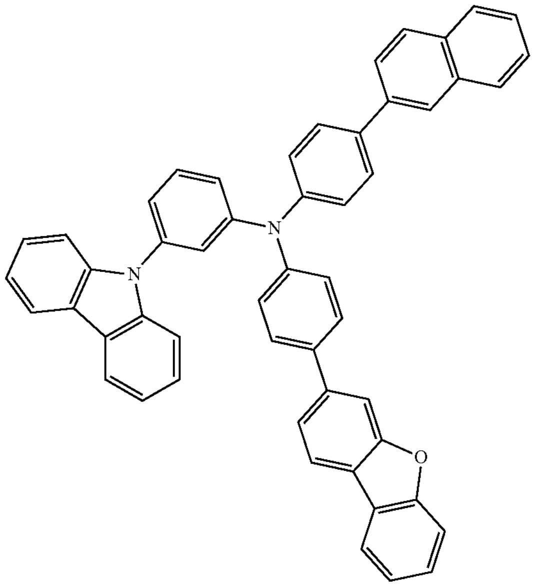
1-255
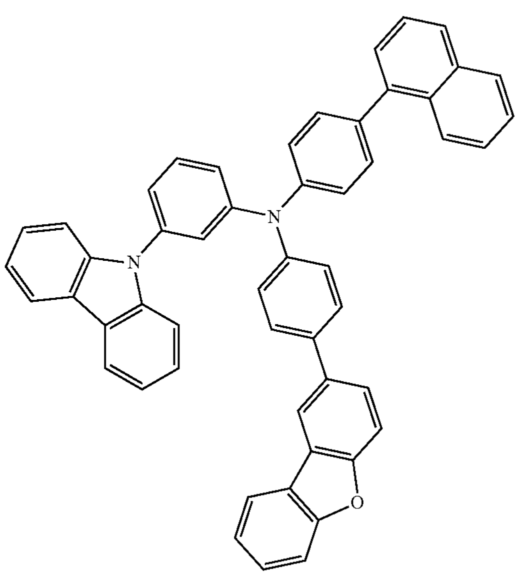
-continued
1-256
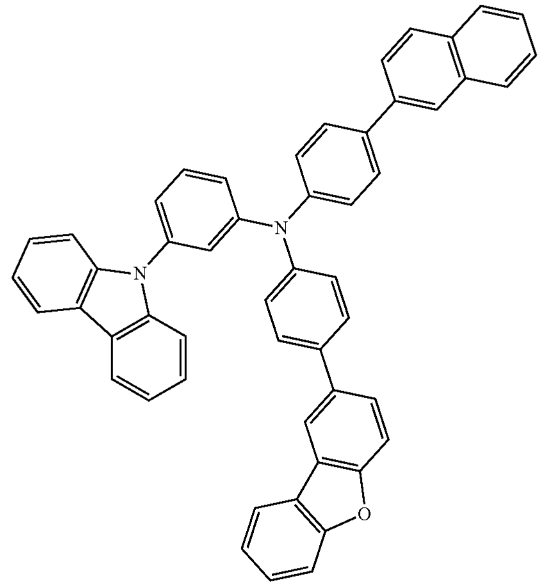
1-257
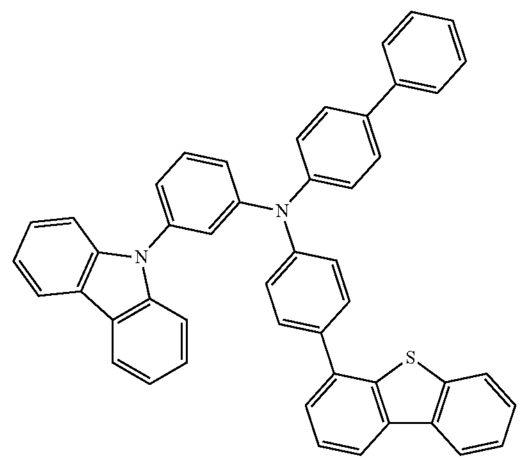
1-258
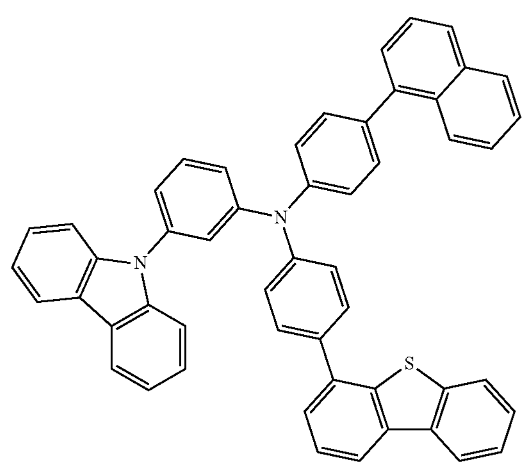

1-259
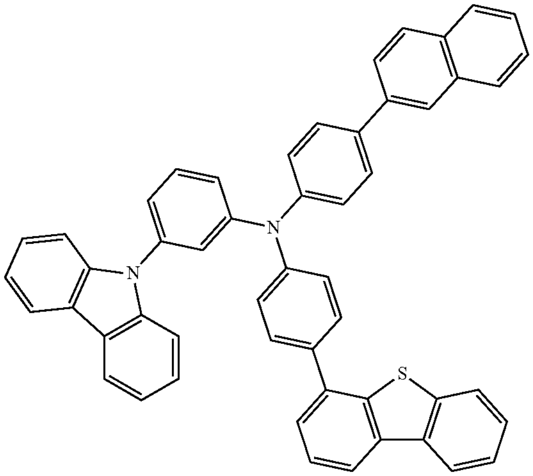
1-260
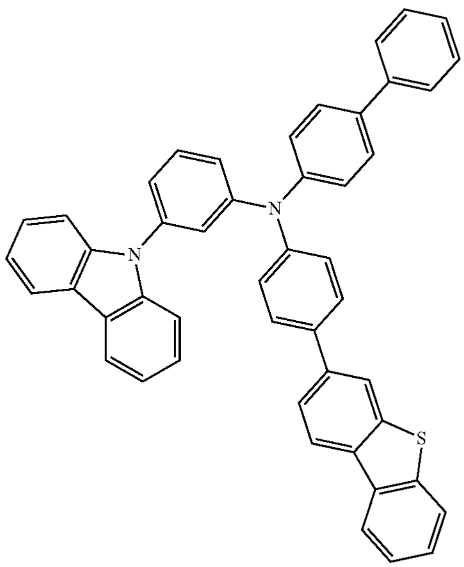
1-261
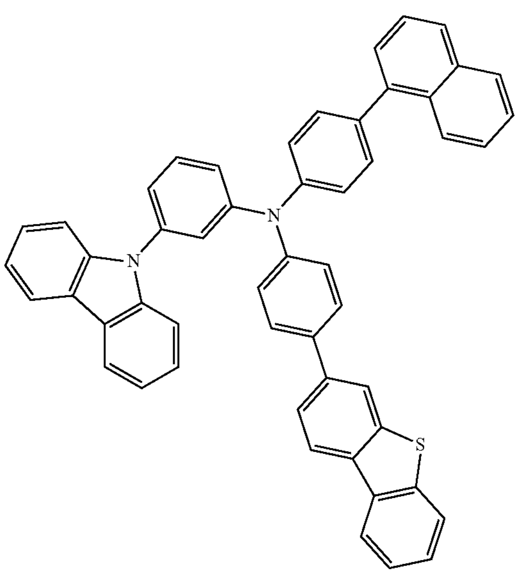
1-262
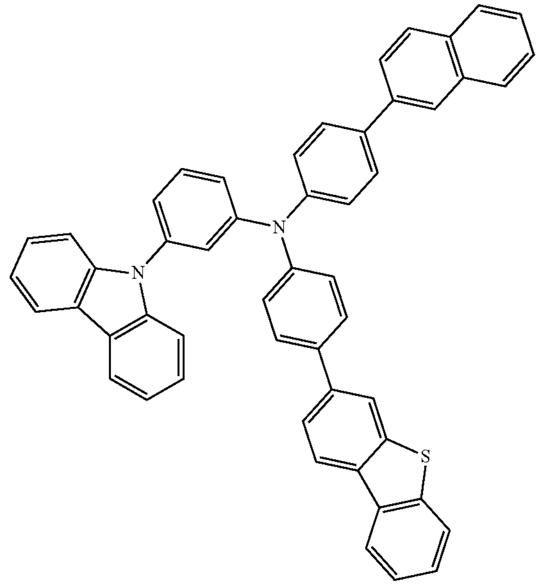
1-263
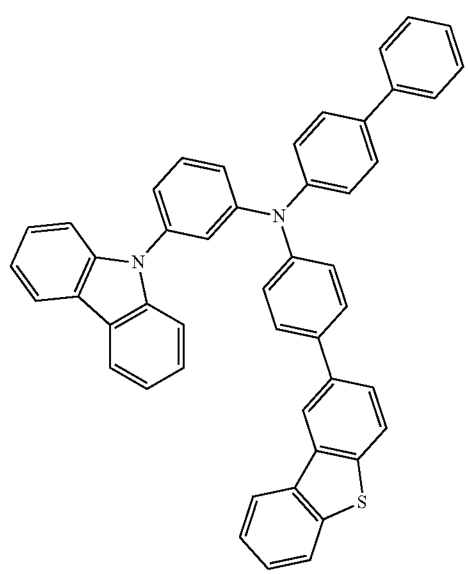

-continued
1-264
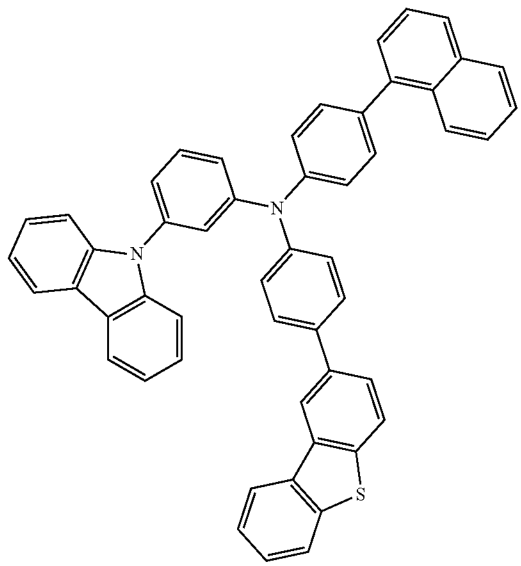
1-265
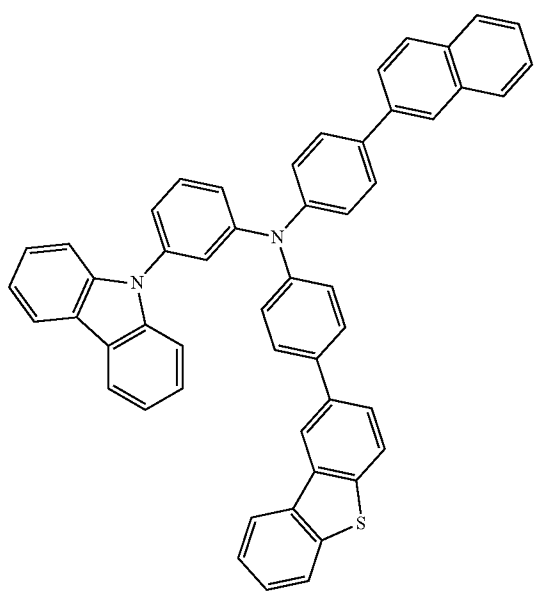
-continued
1-266
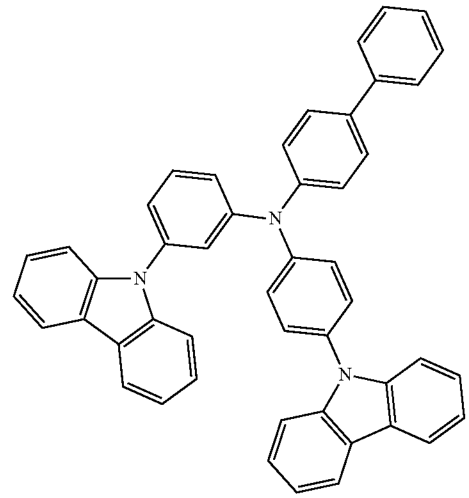
1-267
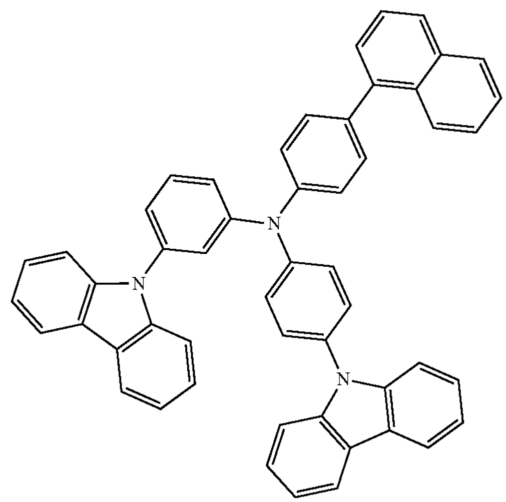
1-268
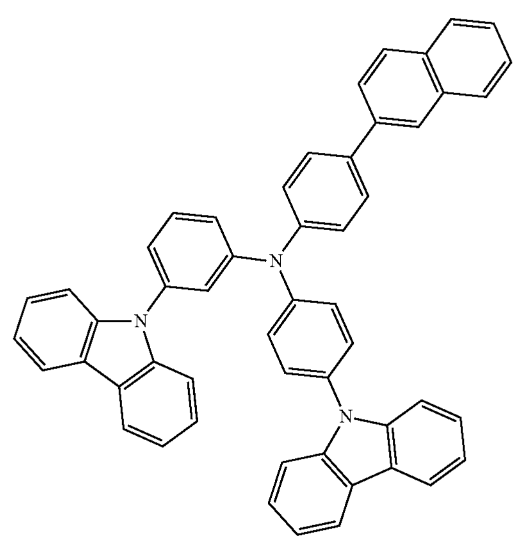

-continued
1-269
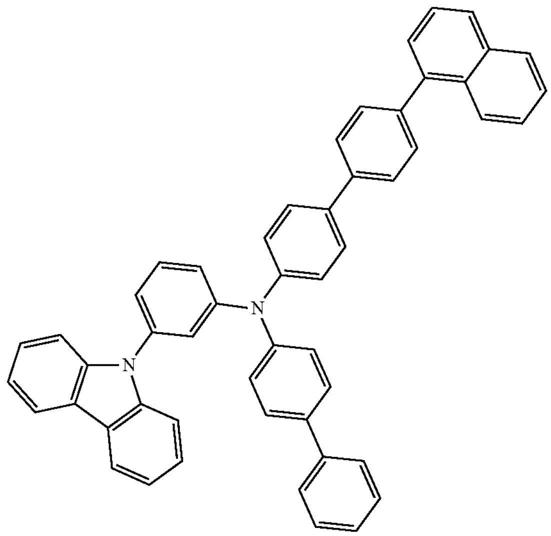
1-270
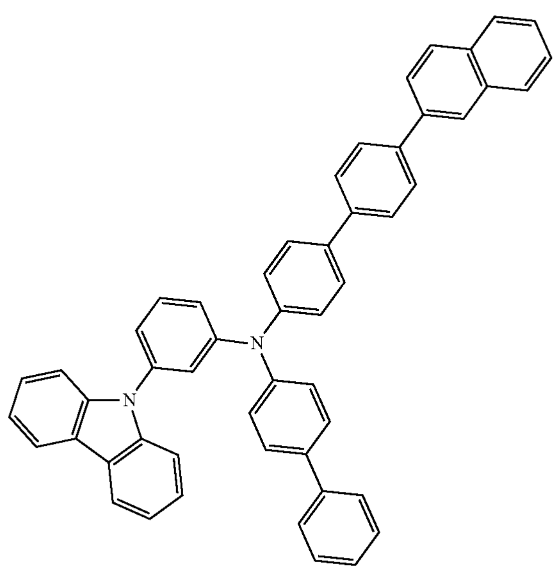
-continued
1-271
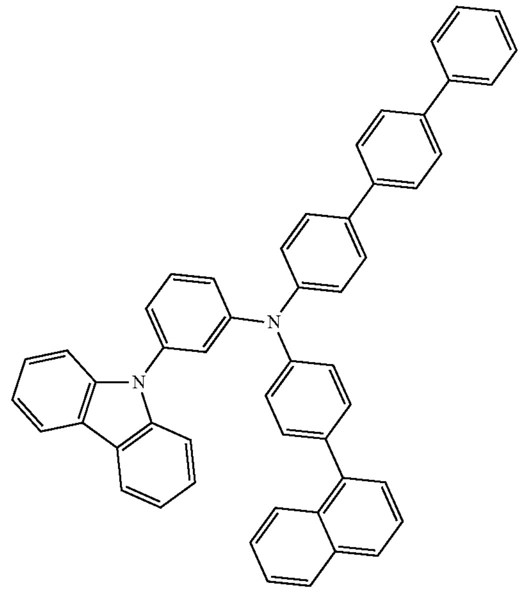
1-272
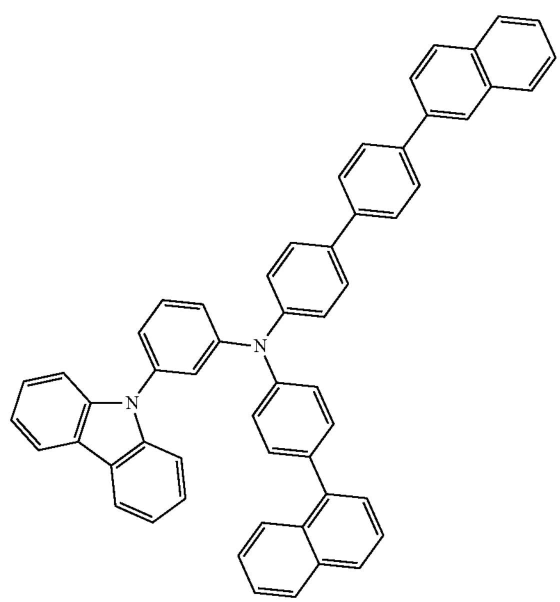

-continued
1-273
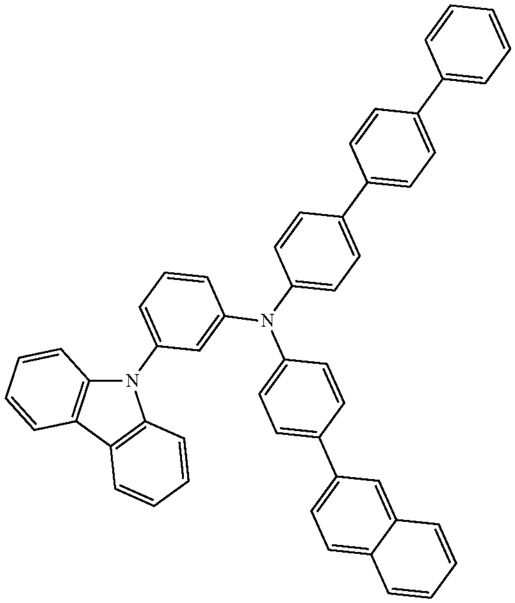
-continued
1-275
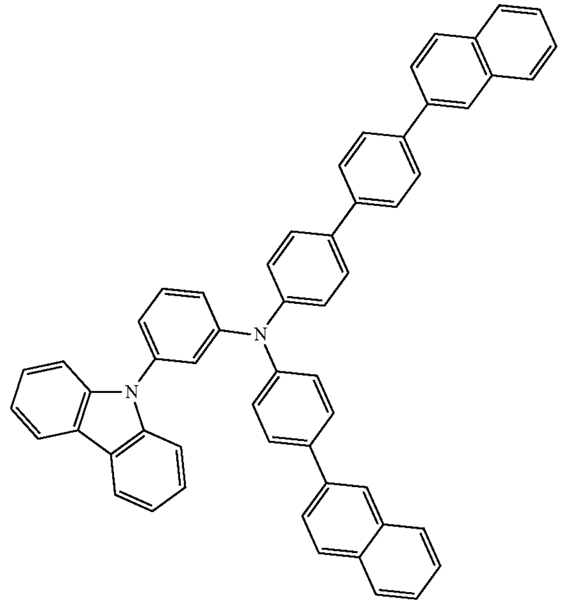
1-274
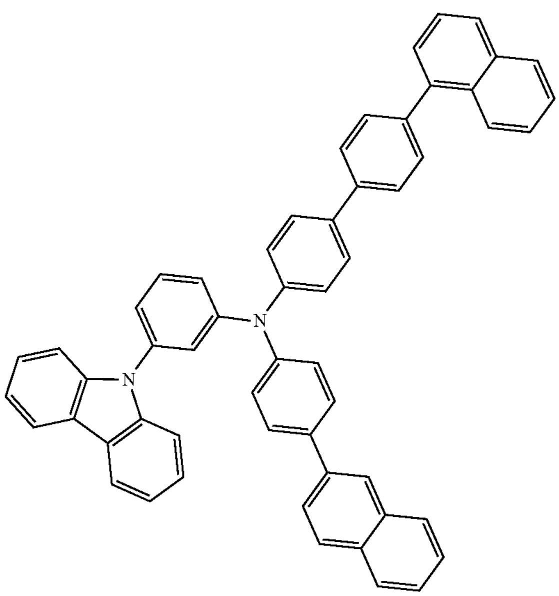
1-276
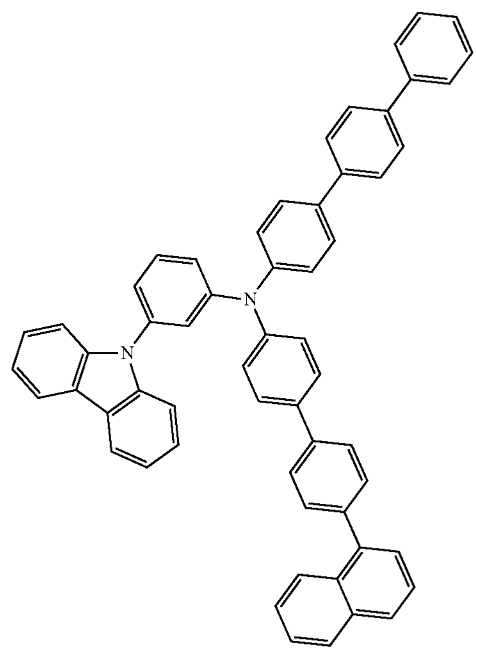

-continued
1-277
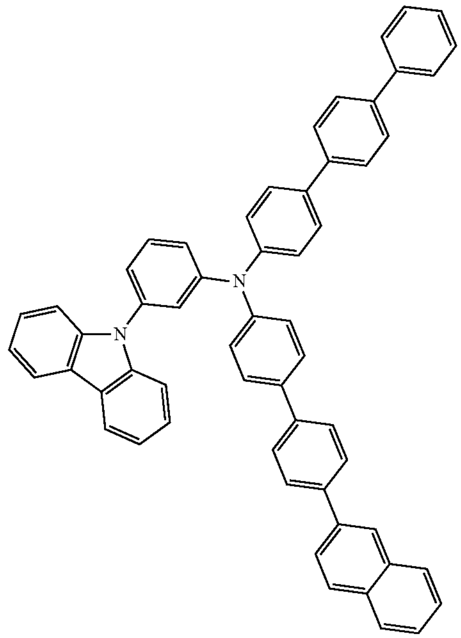
1-278
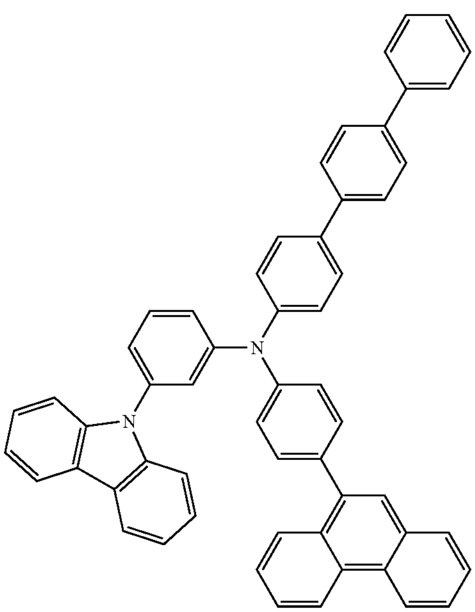
-continued
1-279
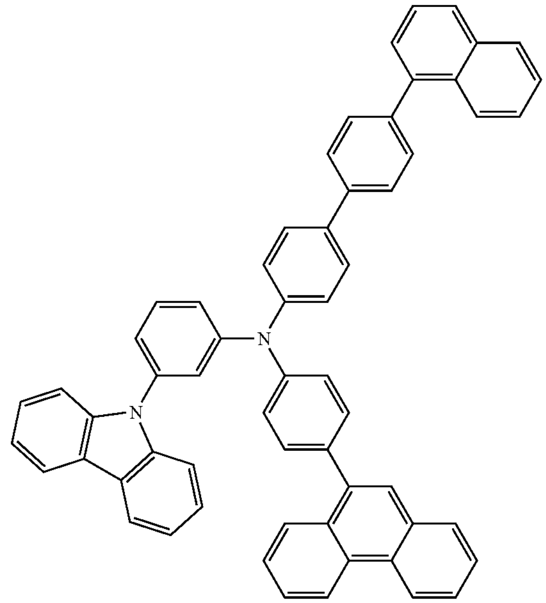
1-280
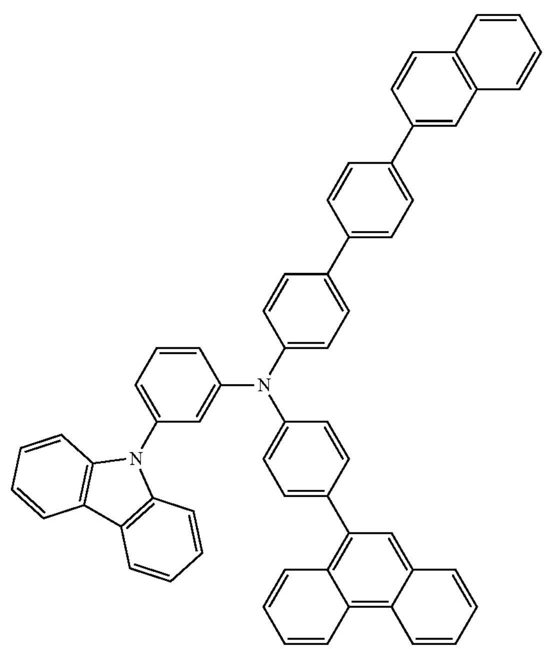

-continued
1-281
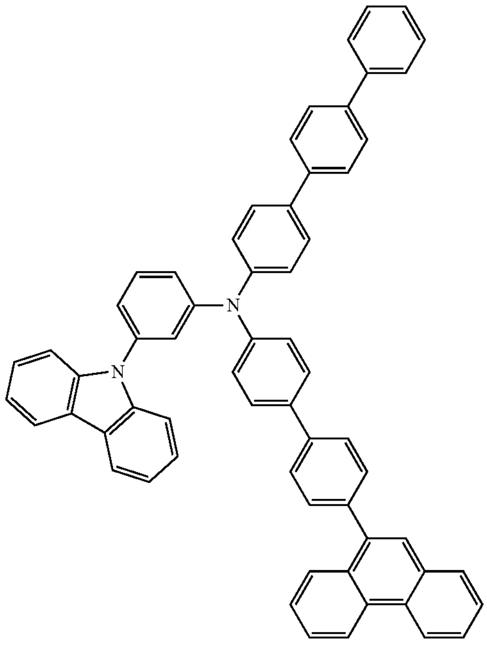
1-282
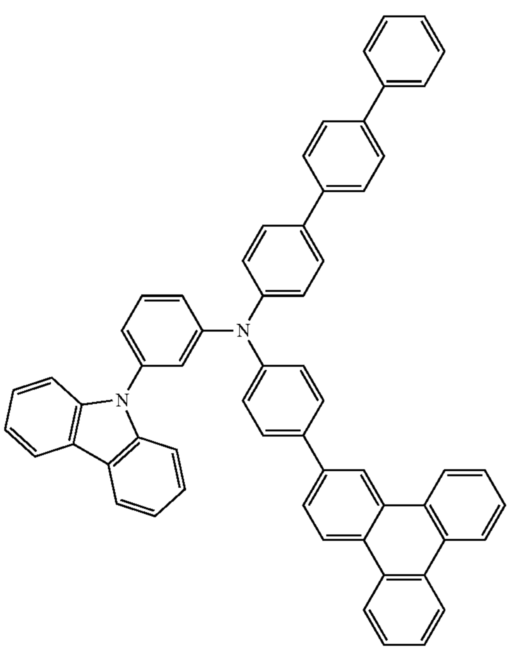
-continued
1-283
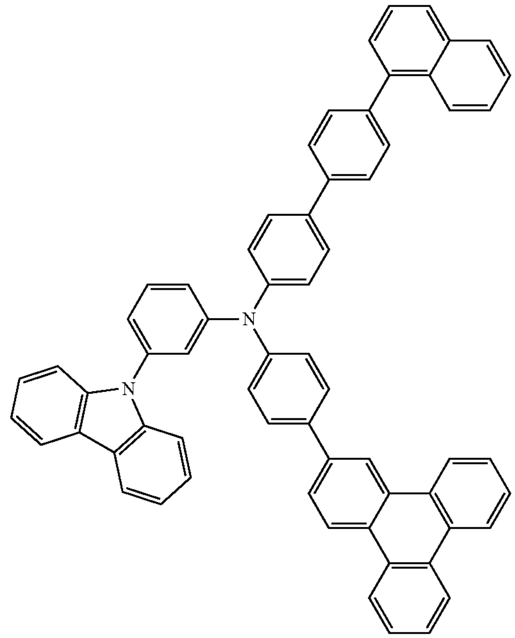
1-284
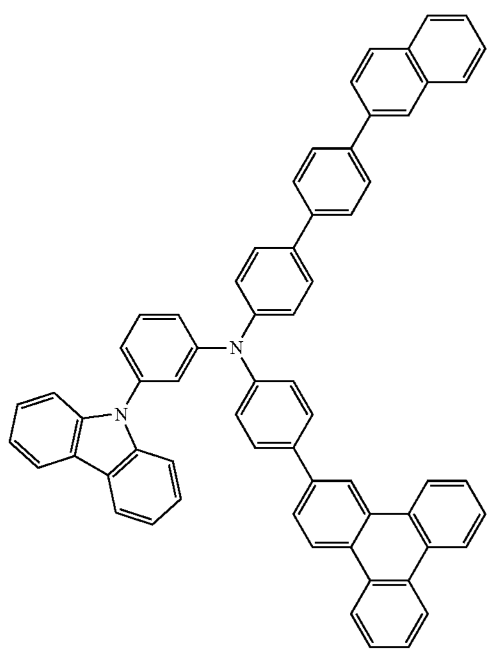

-continued
1-285
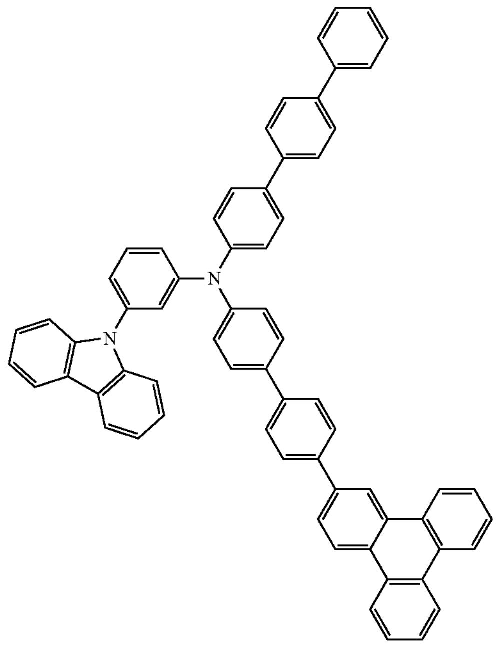
1-286
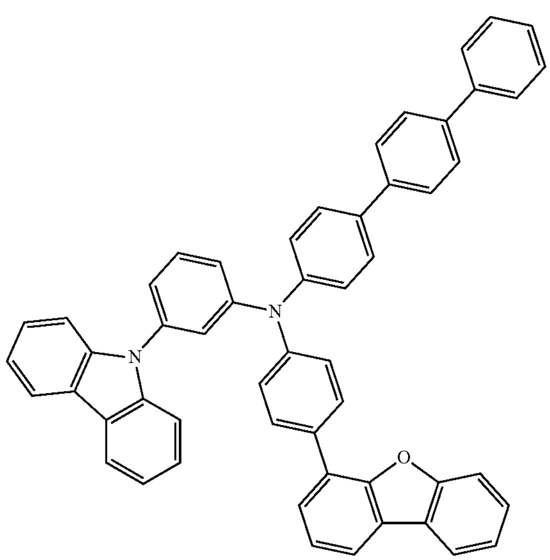
-continued
1-287
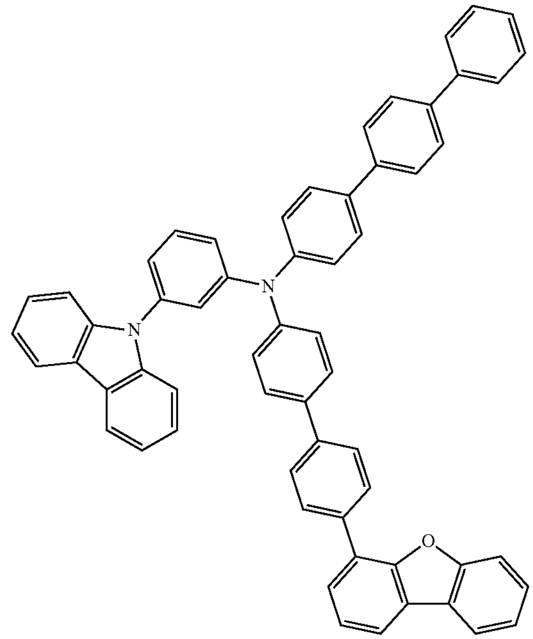
1-288
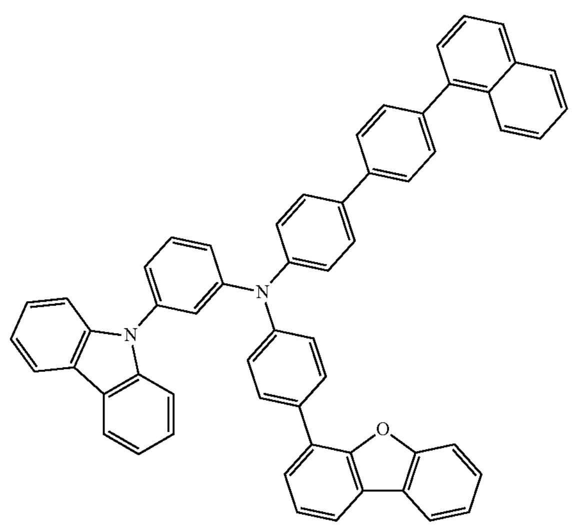

-continued
1-289
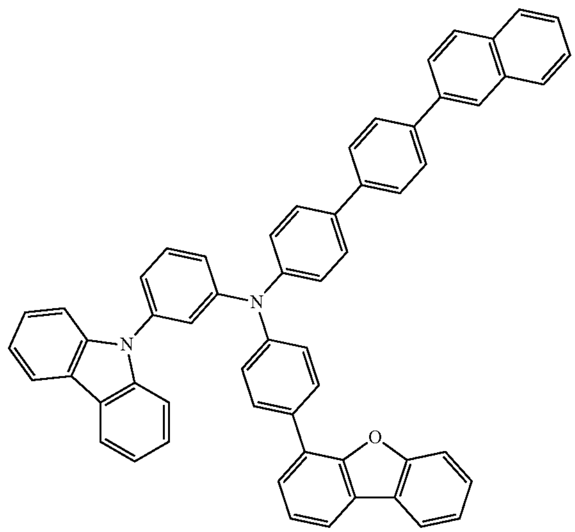
1-290
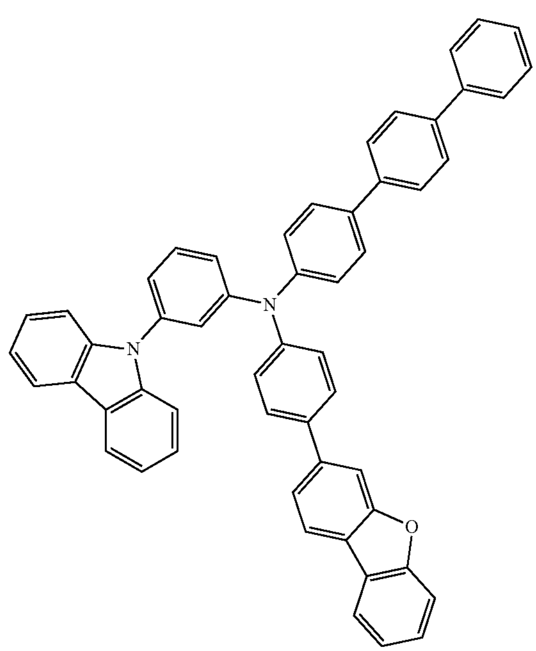
-continued
1-291
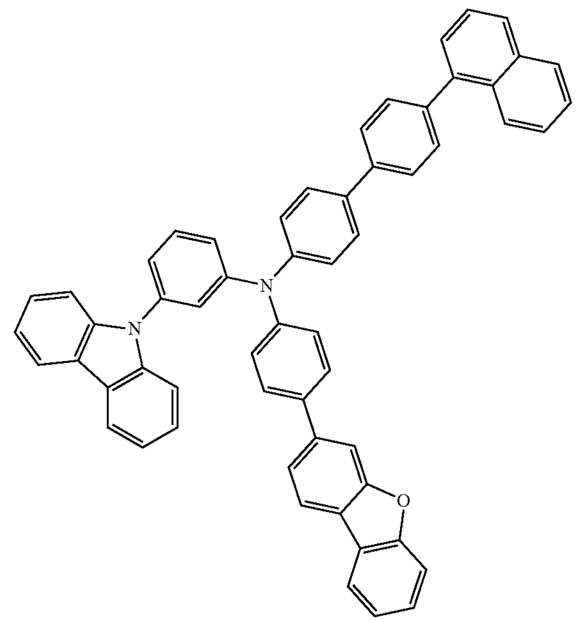
1-292
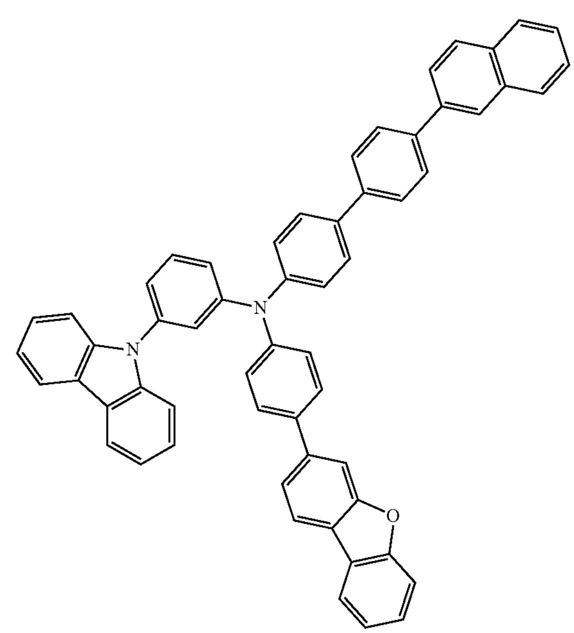

-continued
1-293
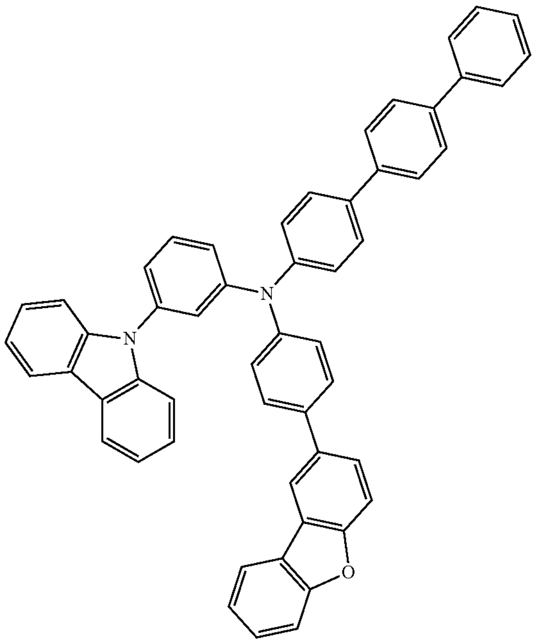
-continued
1-295
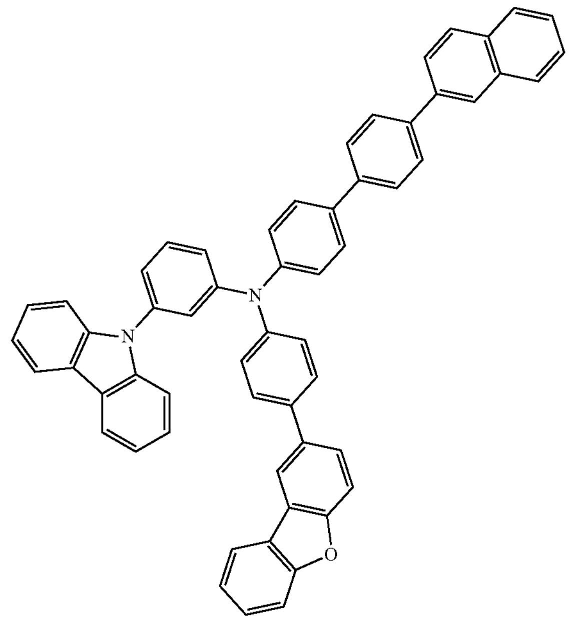
1-294
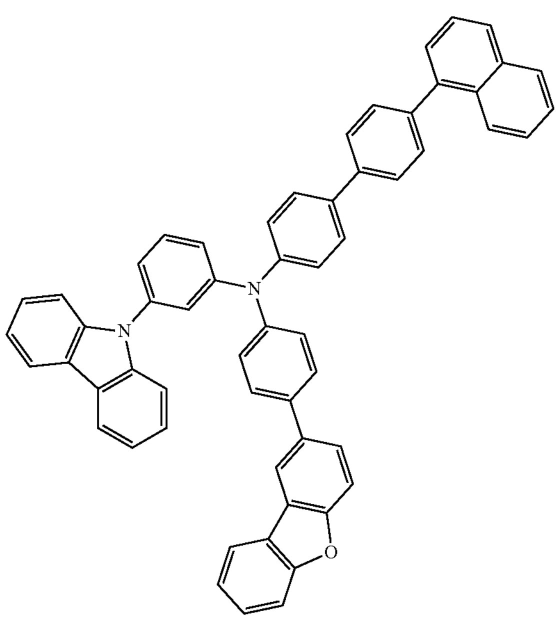
1-296
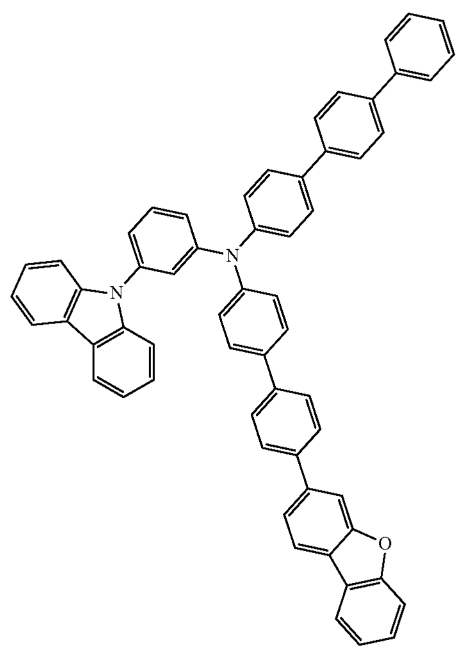

-continued
1-297
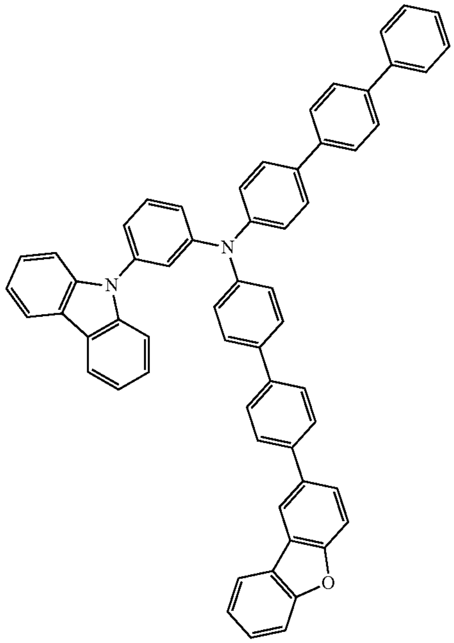
1-298
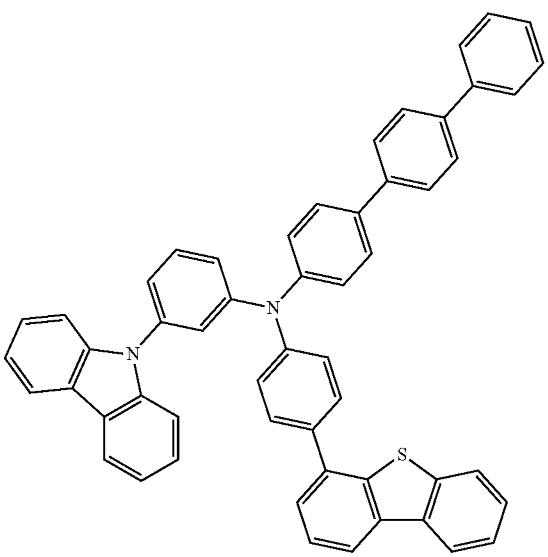
-continued
1-299
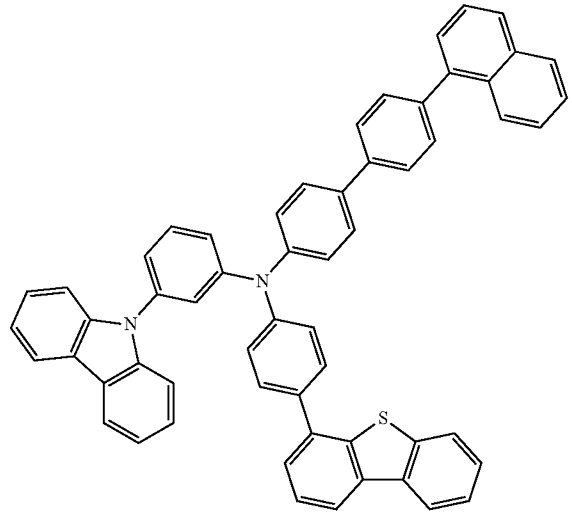
1-300
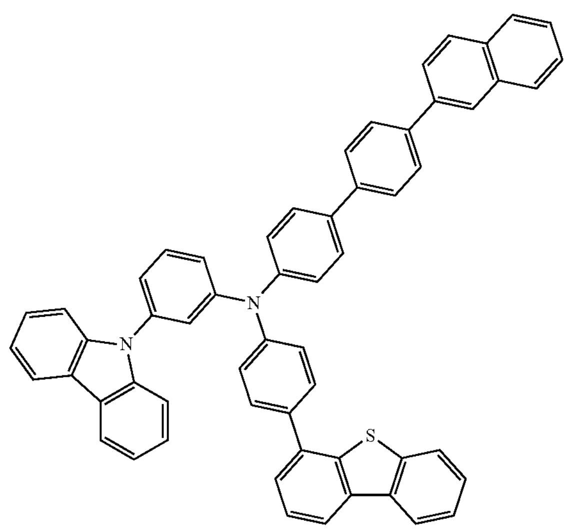

-continued
1-301
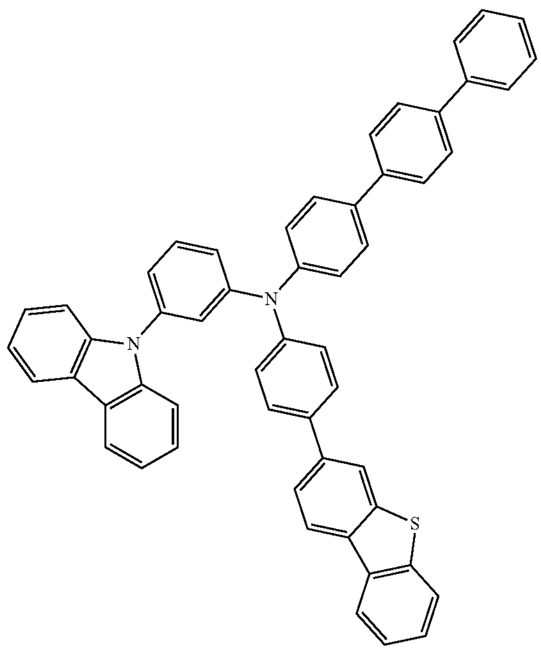
1-302
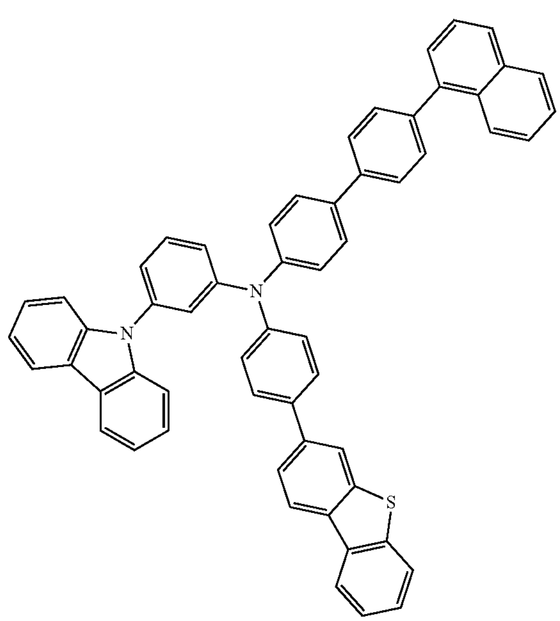
-continued
1-303
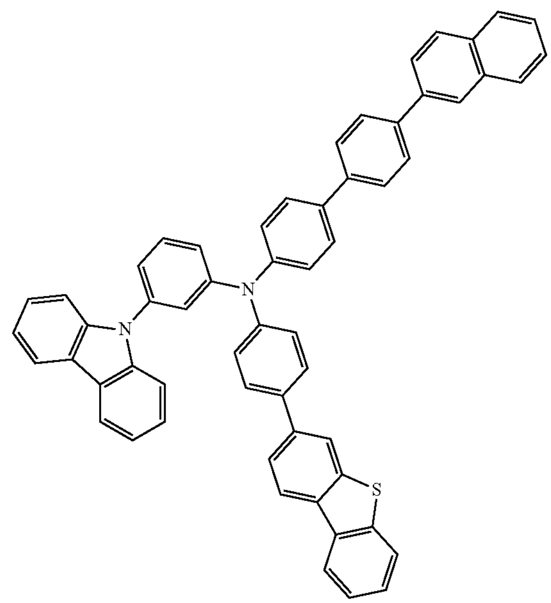
1-304
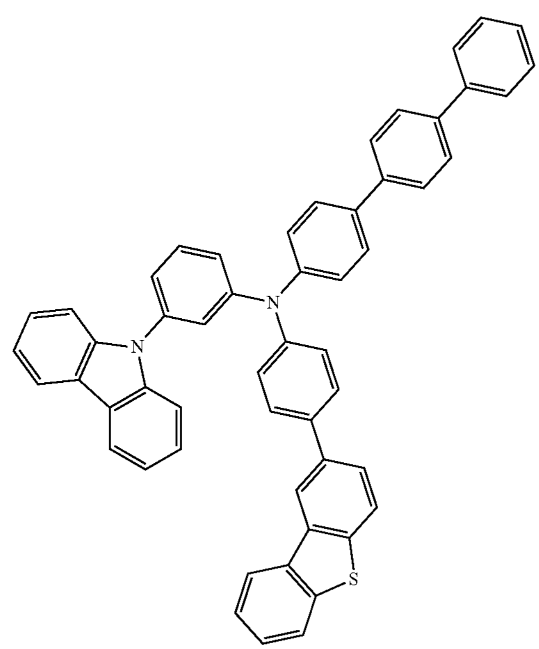

-continued
1-305
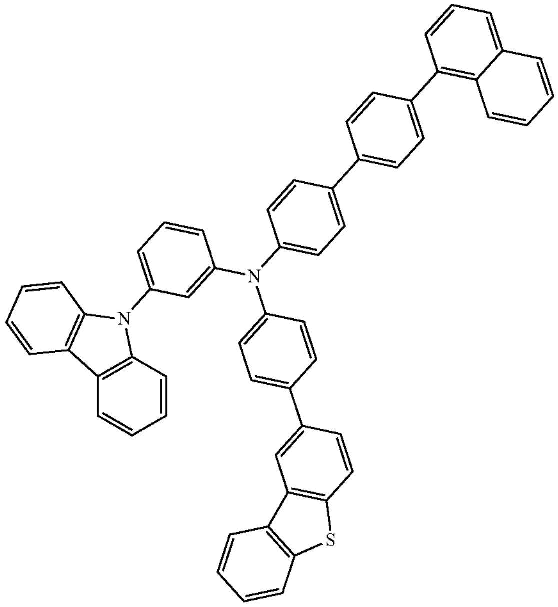
1-306
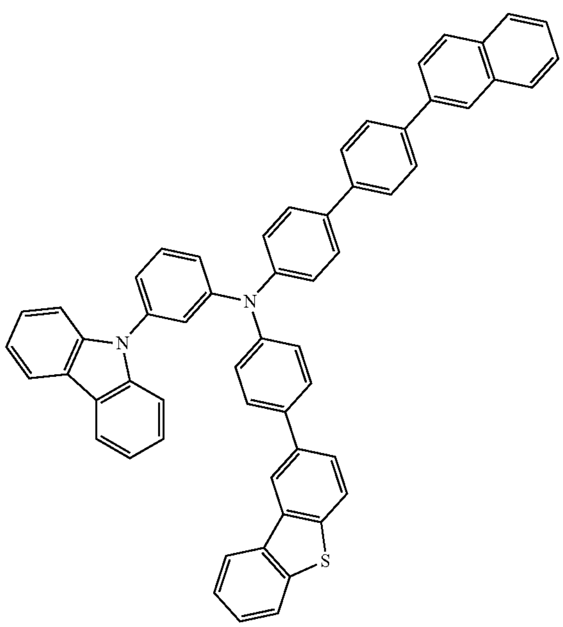
-continued
1-307
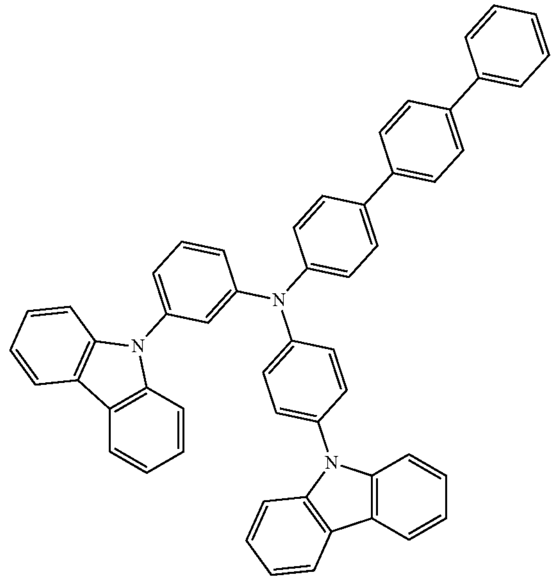
1-308
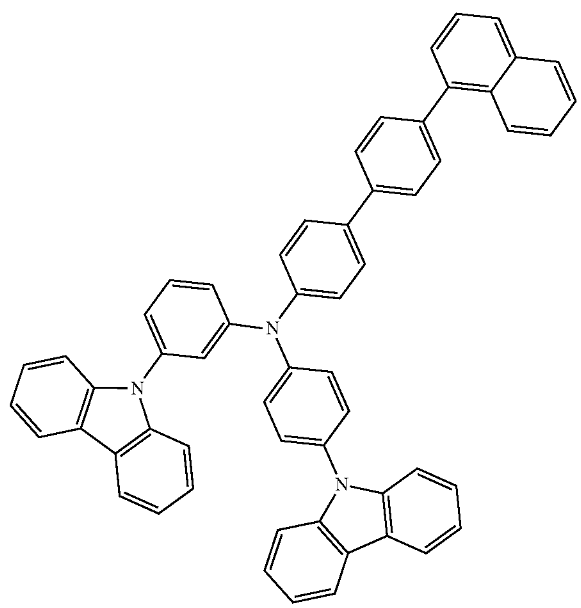

-continued
1-309
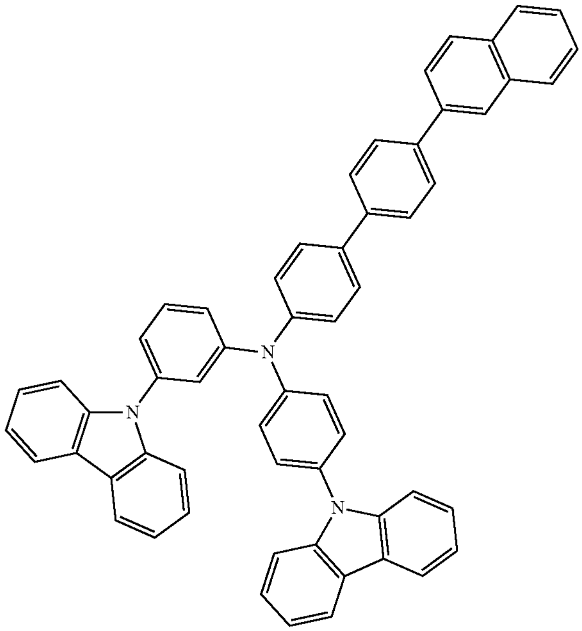
1-310
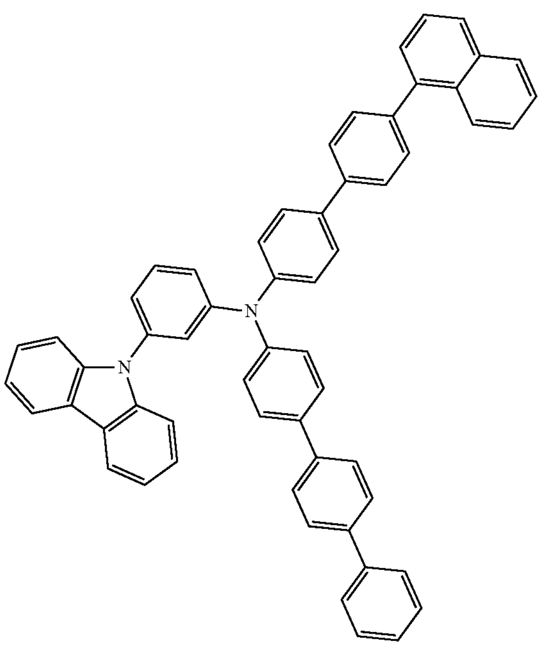
-continued
1-311
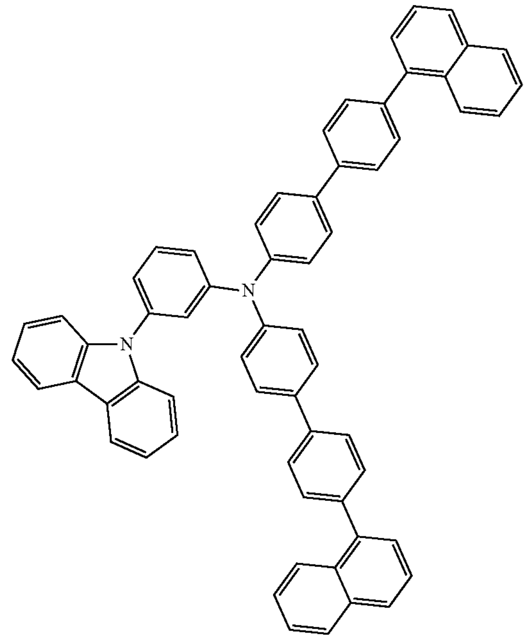
1-312
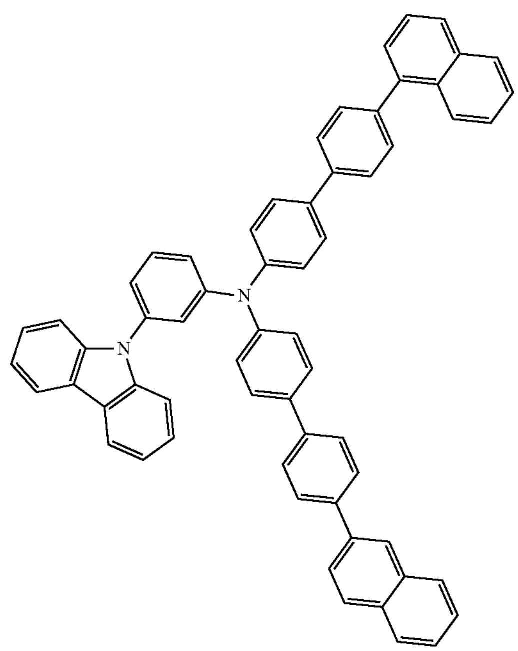

-continued
1-313
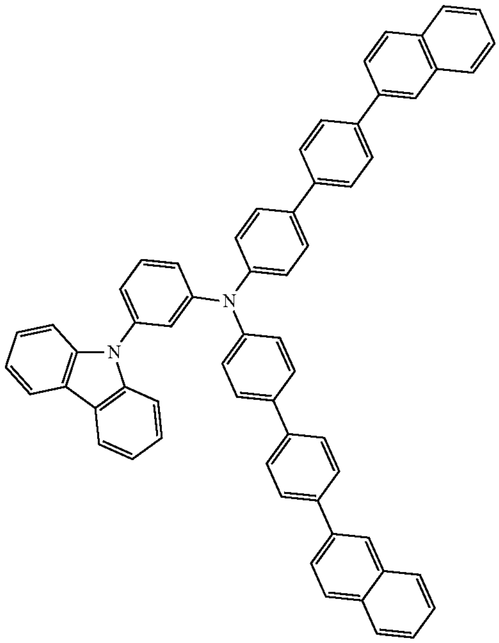
1-314
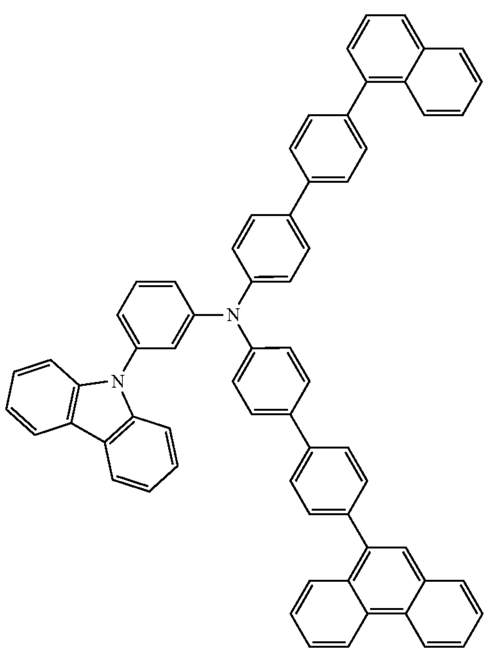
-continued
1-315
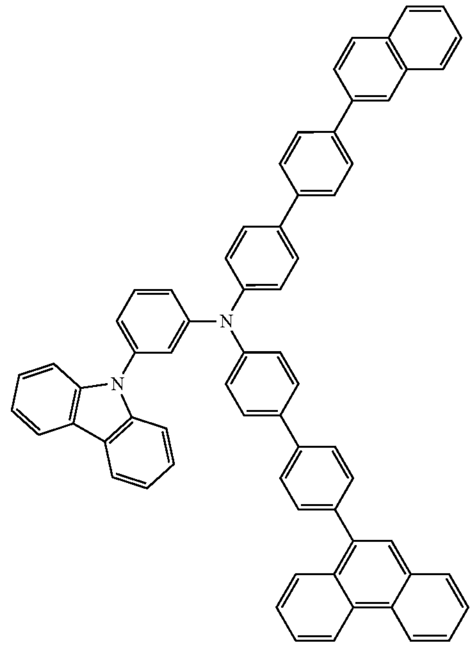
1-316
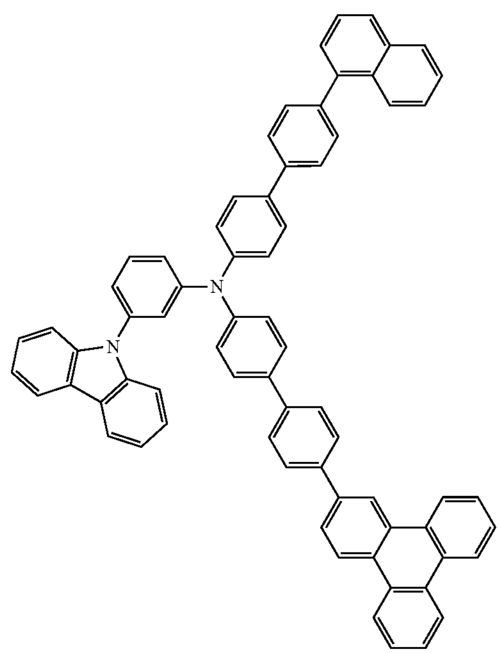

-continued
1-317
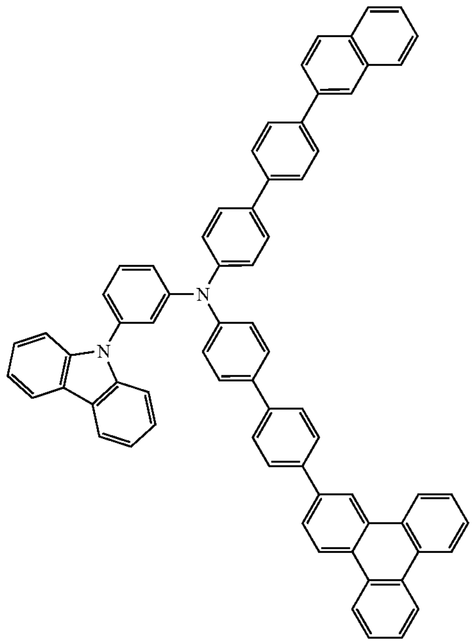
1-318
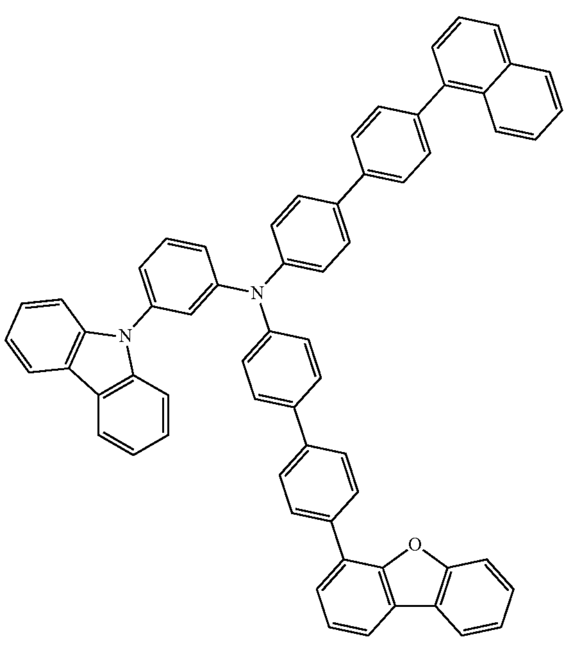
-continued
1-319
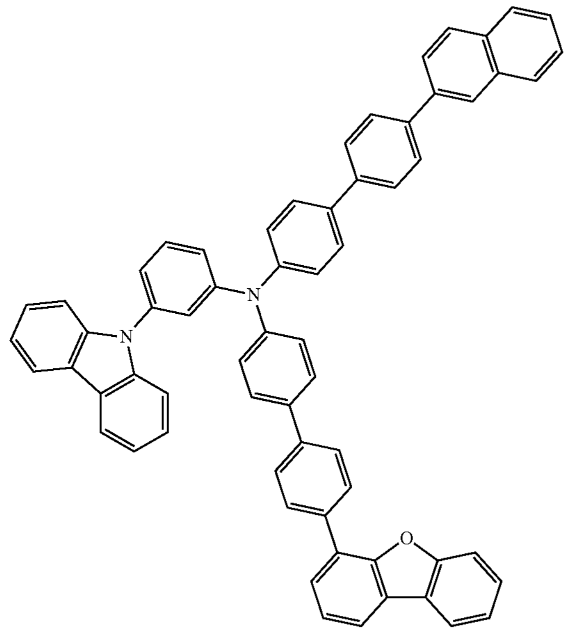
1-320
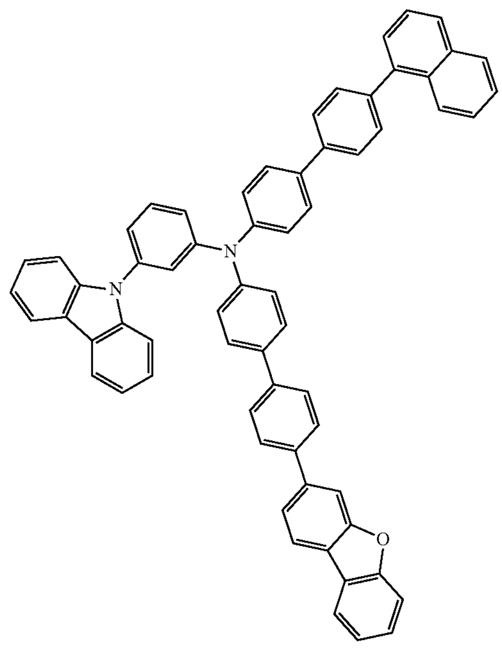

-continued
1-321
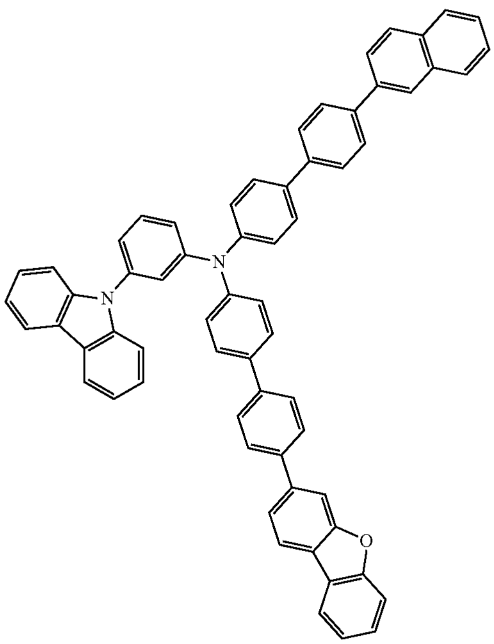
1-322
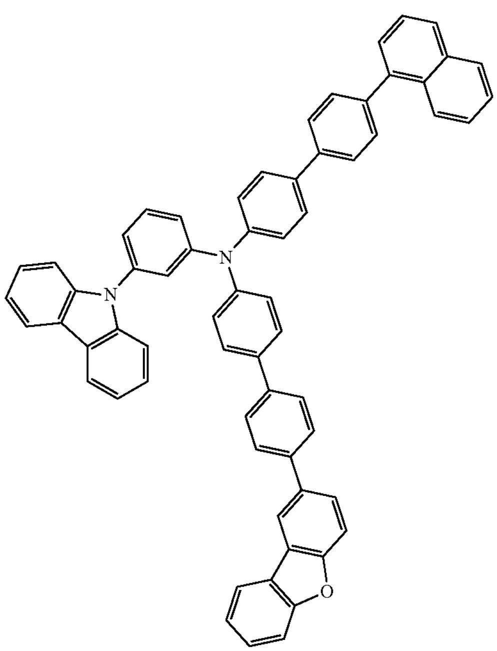
-continued
1-323
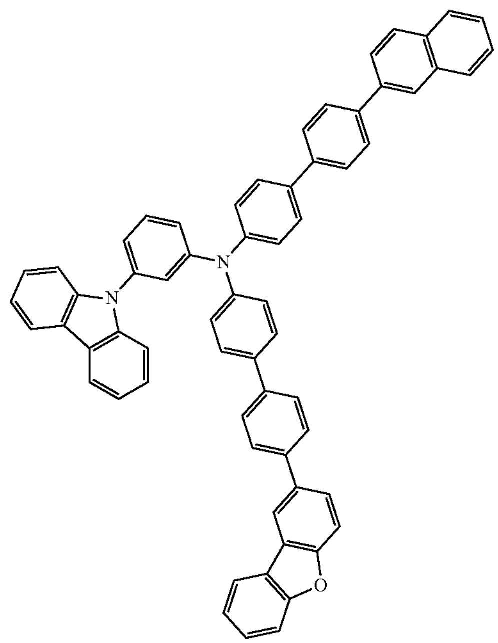
1-324
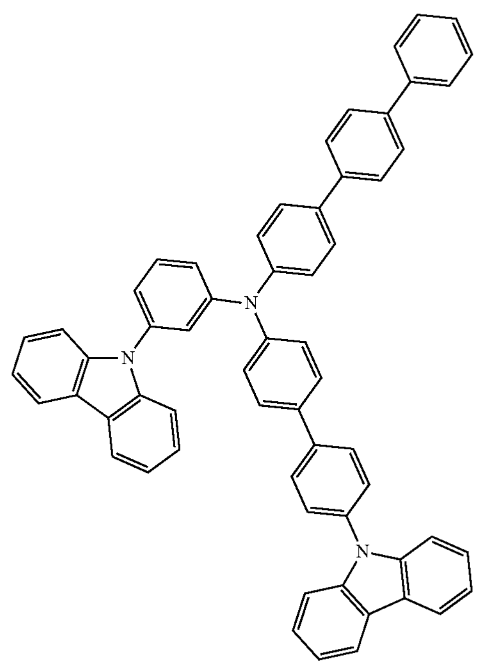

-continued
1-325
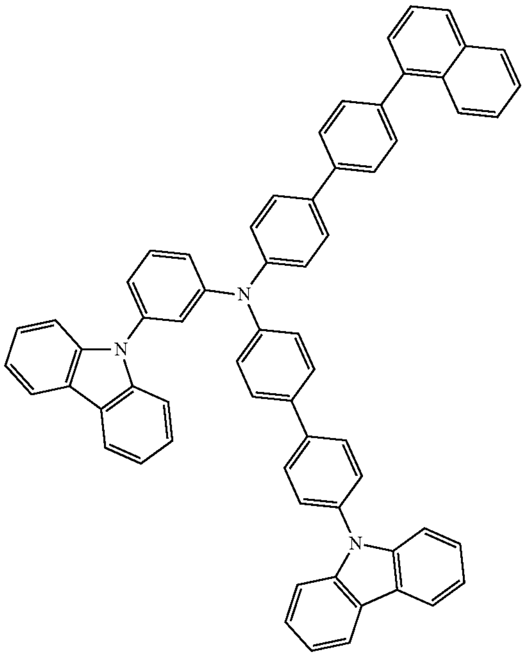
1-326
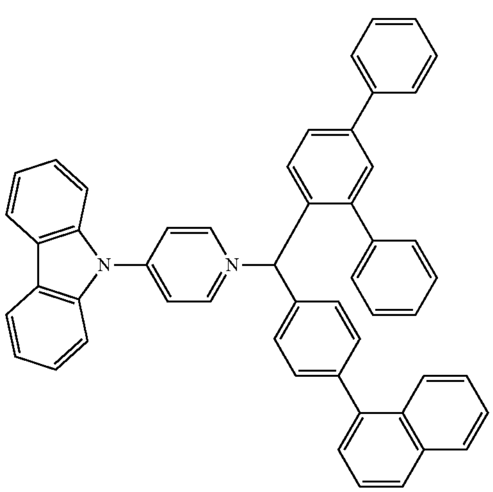
-continued
1-327
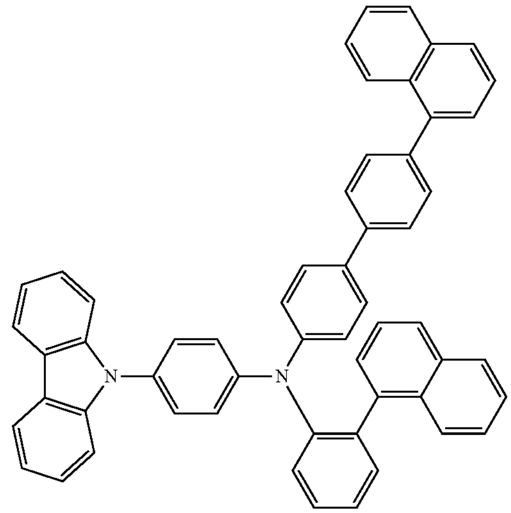
1-328
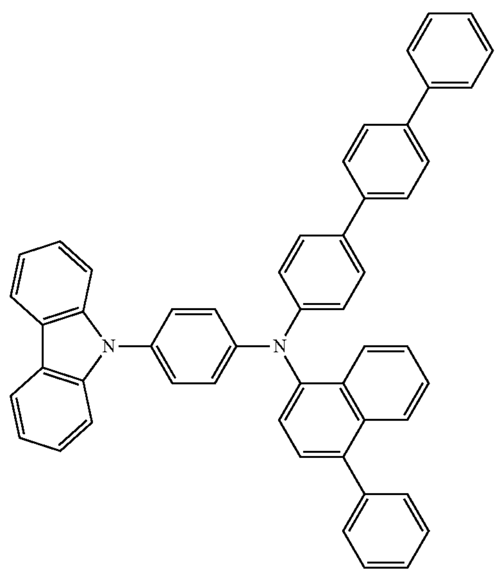
Specifically, the compound corresponding to the Chemical Formula 2 is as follows, but is not limited thereto.
2-1
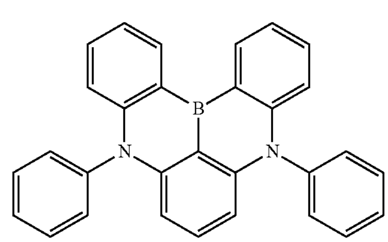

-continued
2-2
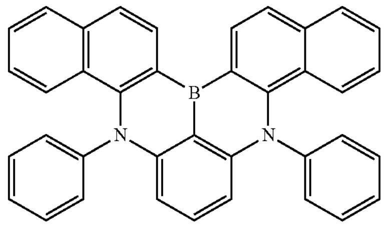
2-3
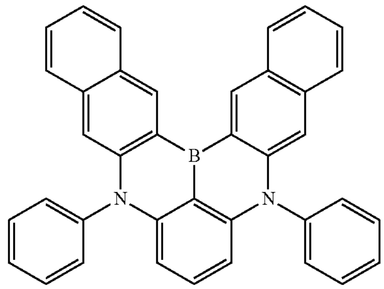
2-4
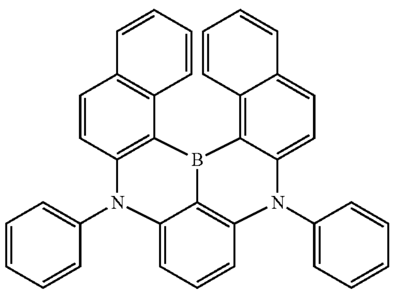
2-5
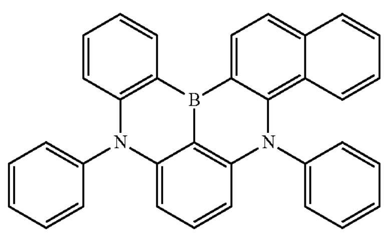
2-6
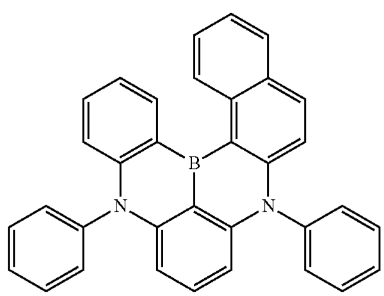
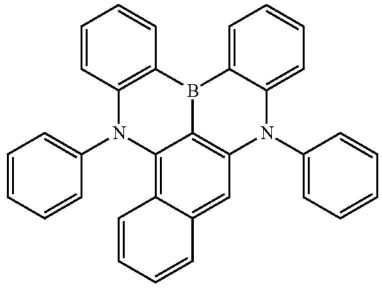
-continued
2-8
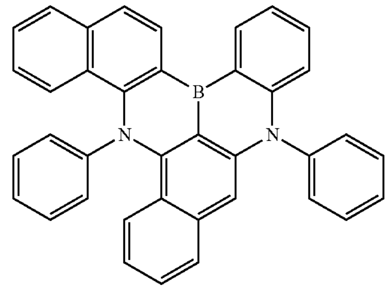
2-9
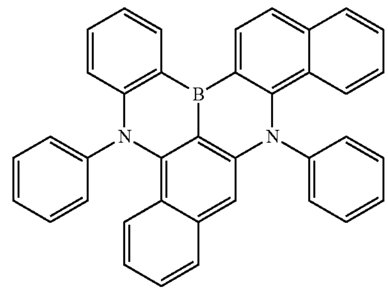
2-10
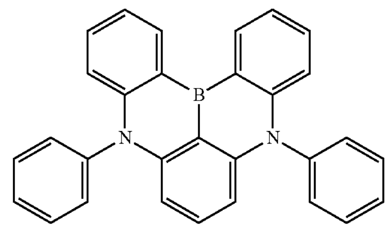
2-11
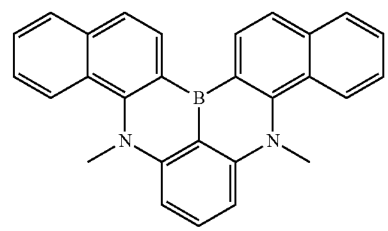
2-12
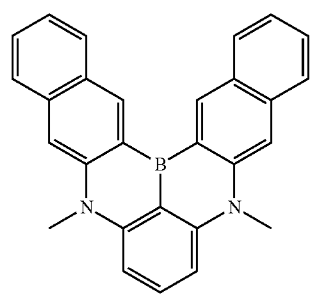
2-13
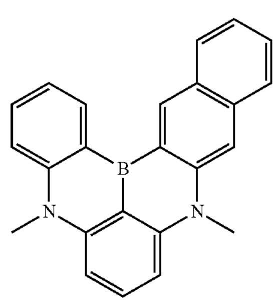

-continued
2-14
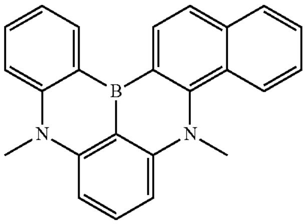
2-15
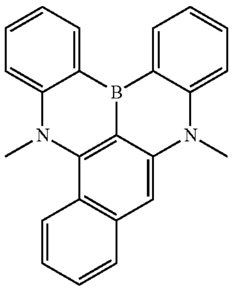
2-16
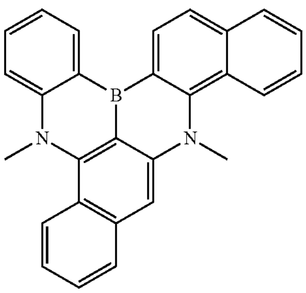
2-17
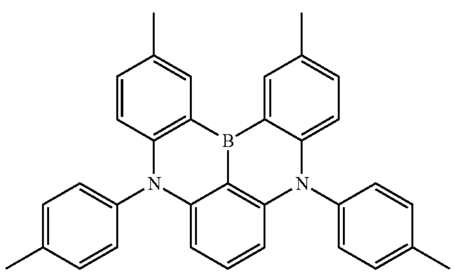
2-18
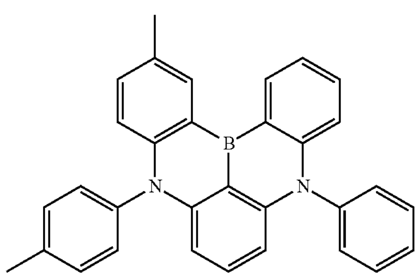
2-19
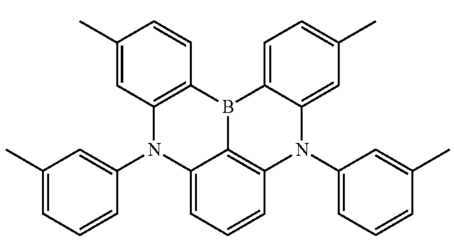
-continued
2-20
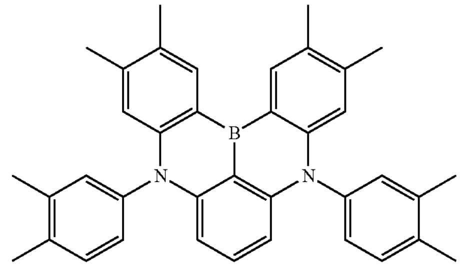
2-21
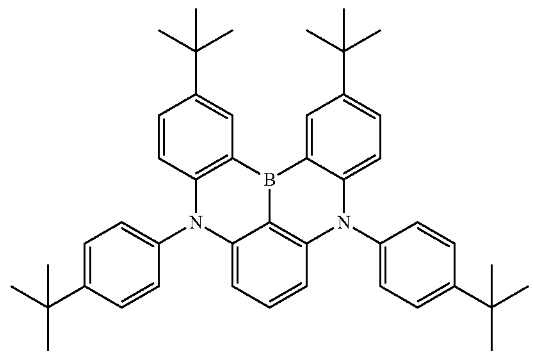
2-22
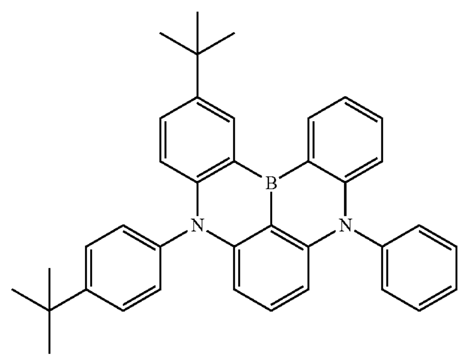
2-23
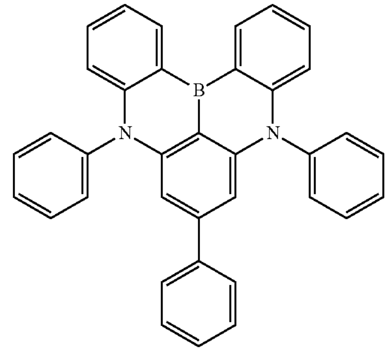

-continued
2-24
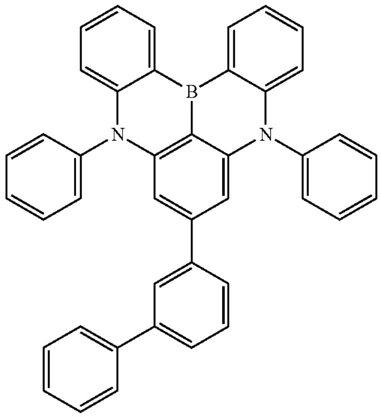
2-25
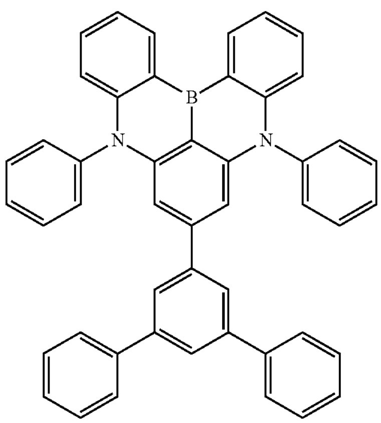
2-26
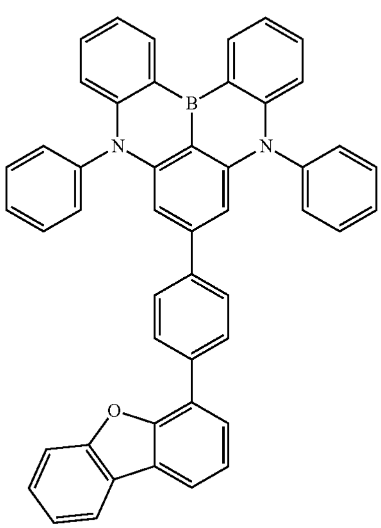
-continued
2-27
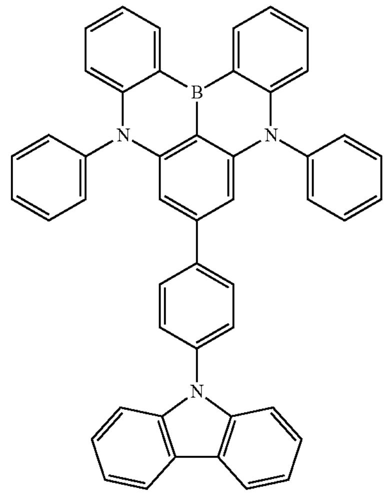
2-28
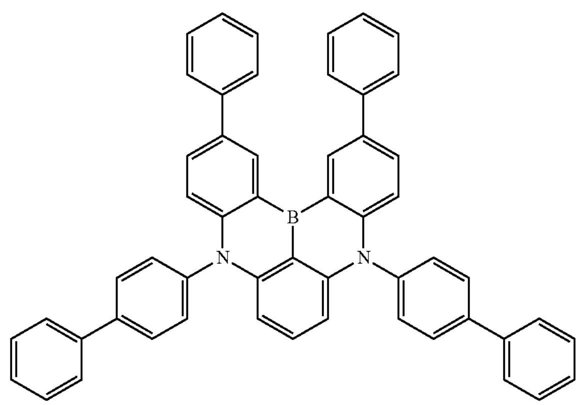
2-29
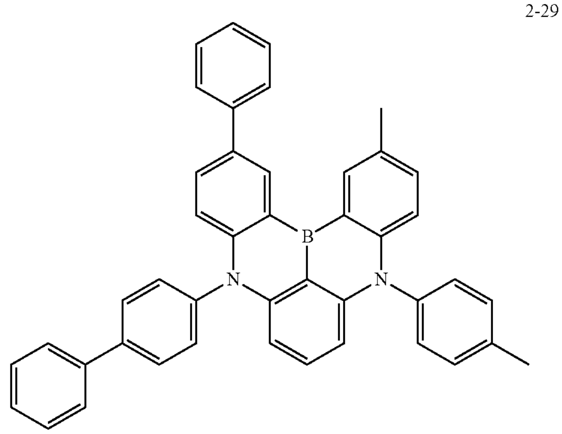

-continued
2-30
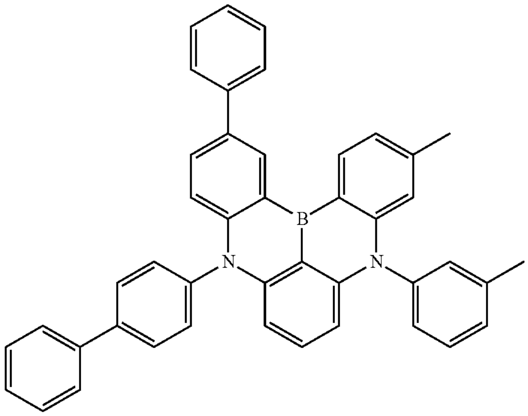
2-31
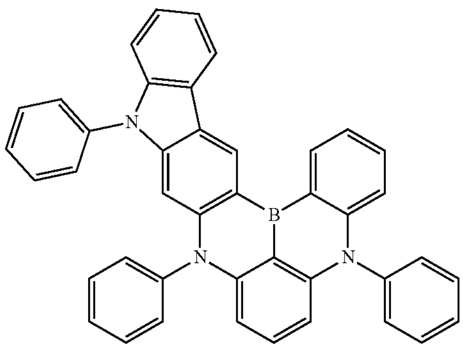
2-32
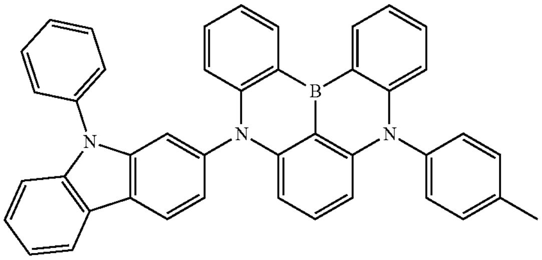
2-33
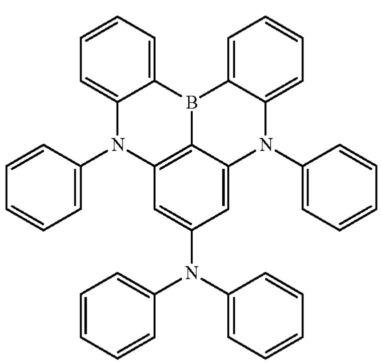
-continued
2-34
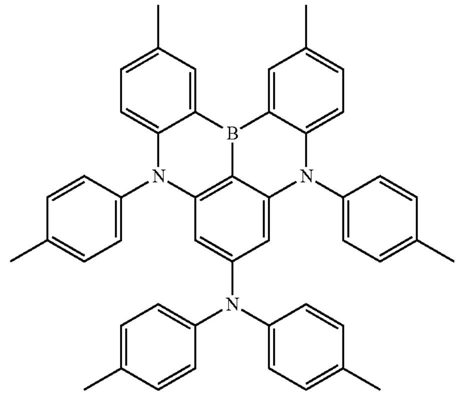
2-35
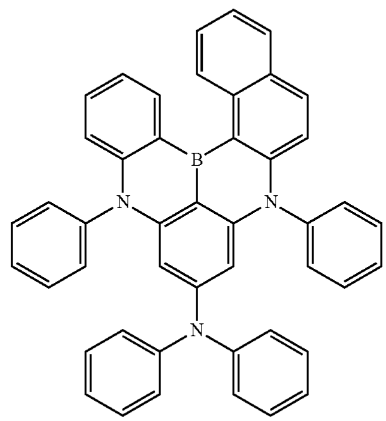
2-36
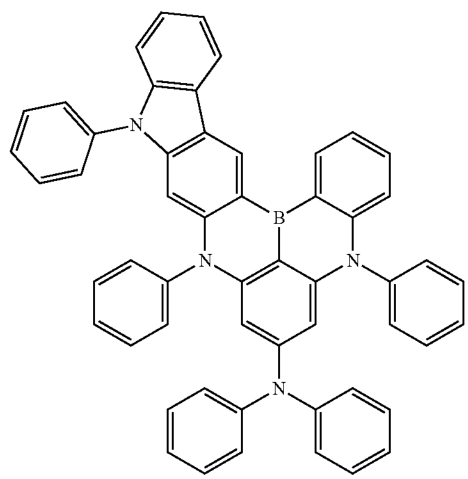
2-37
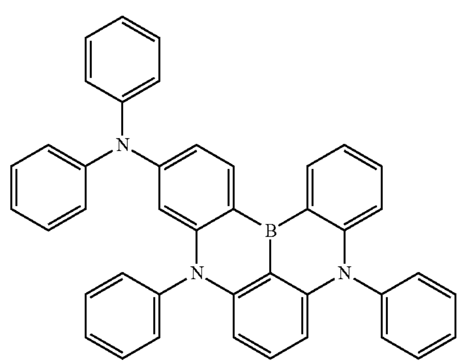

-continued
2-38
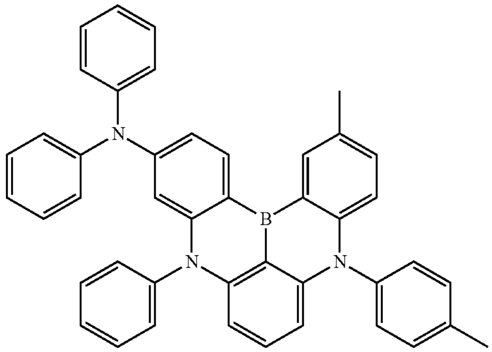
2-39
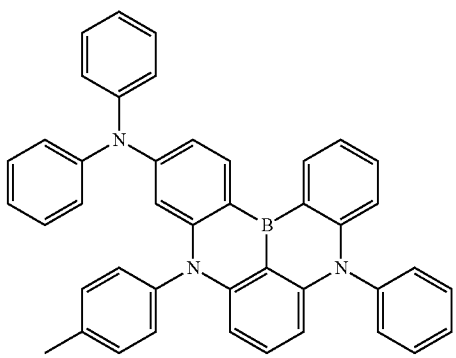
2-40
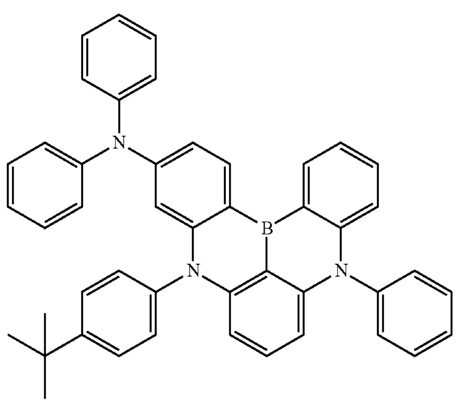
2-41
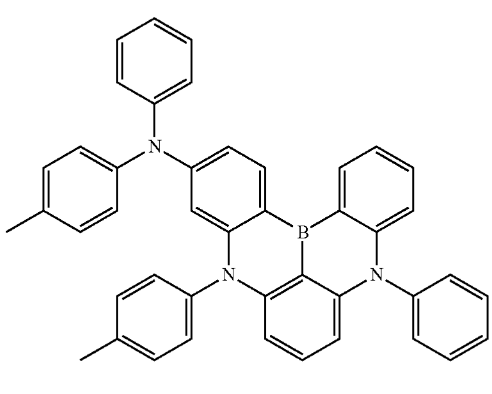
-continued
2-42
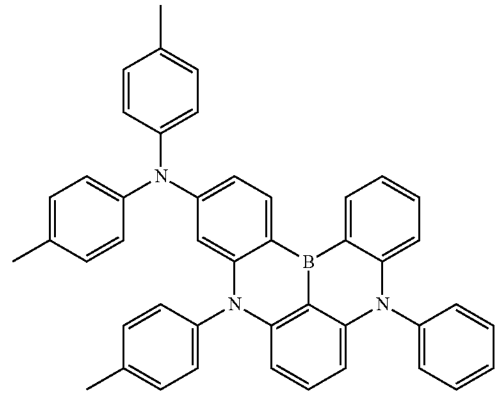
2-43
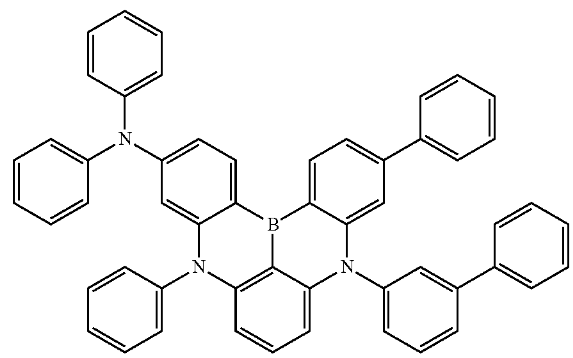
2-44
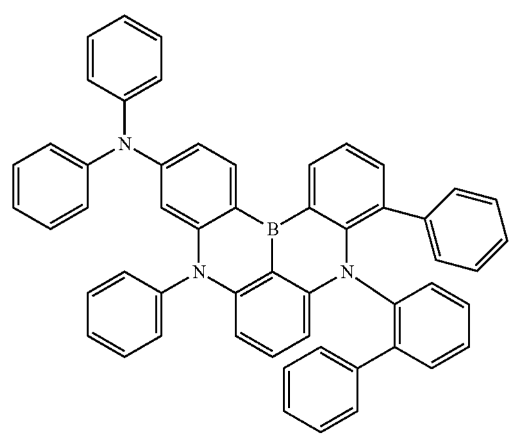
2-45
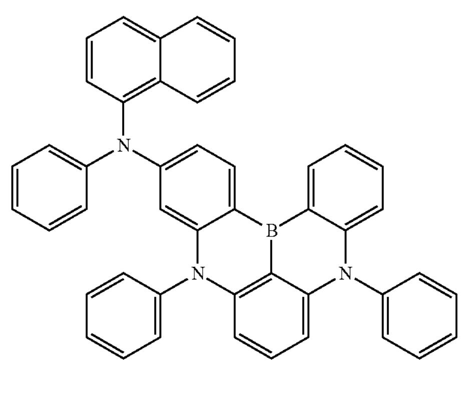

-continued
2-46
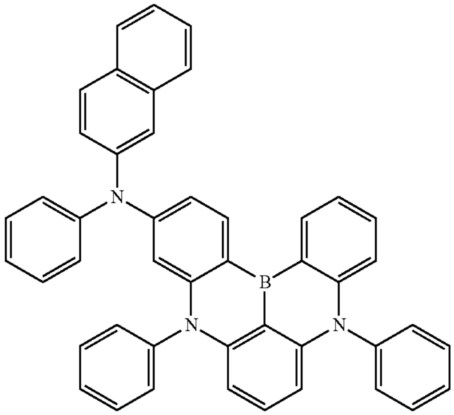
2-47
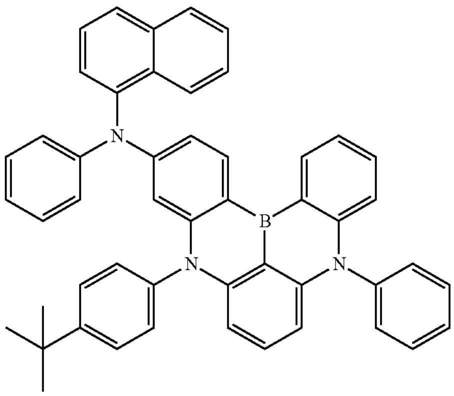
2-48
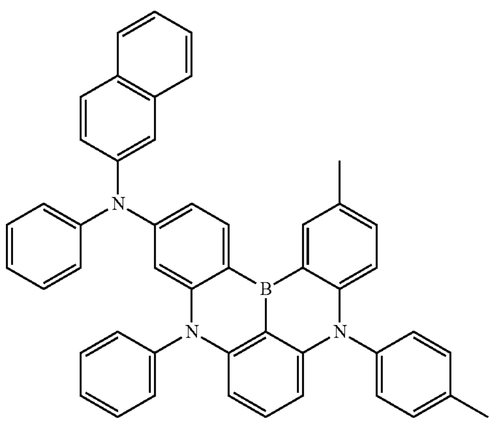
2-49
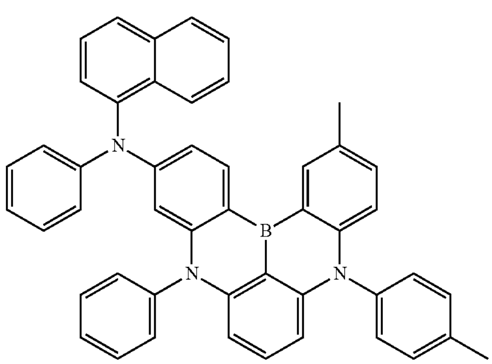
-continued
2-50
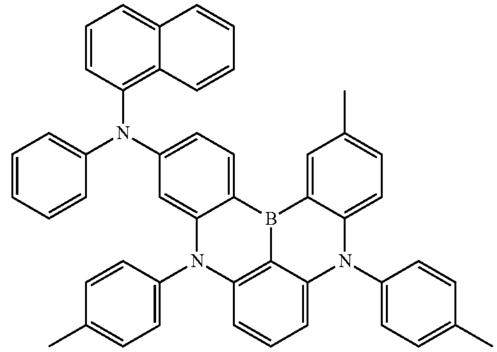
2-51
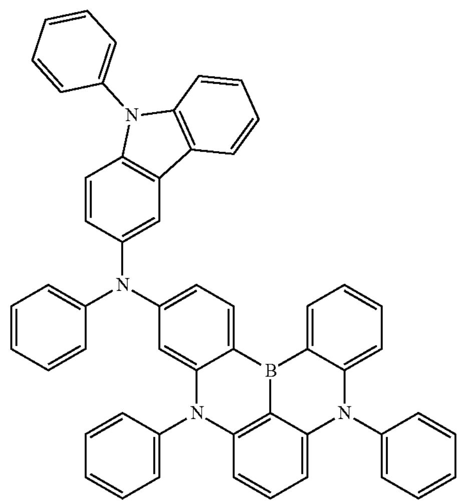
2-52
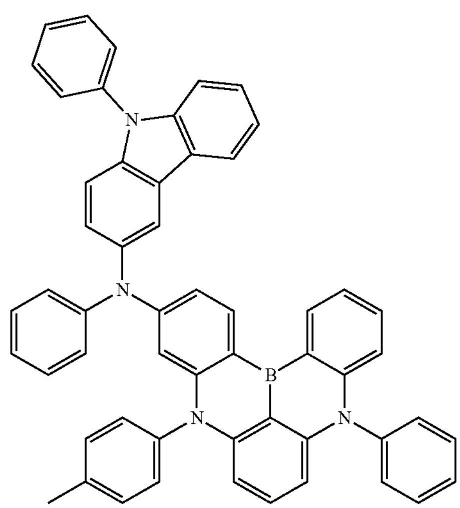

-continued
2-53
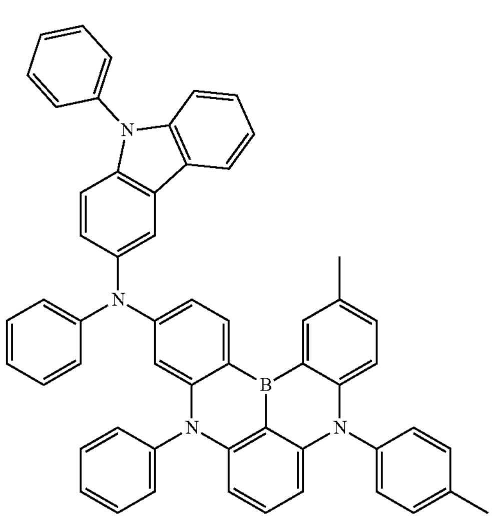
2-54
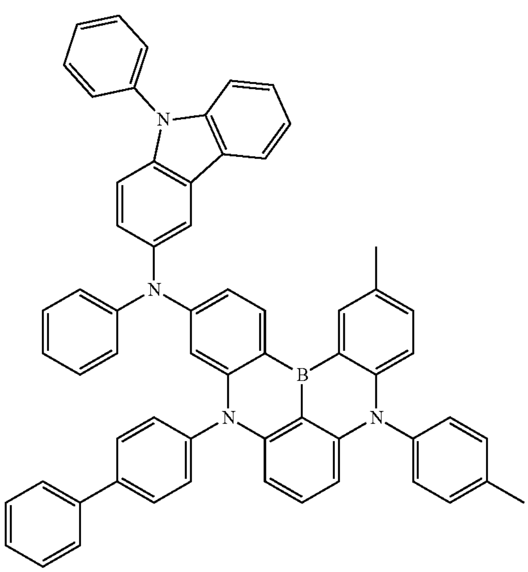
2-55
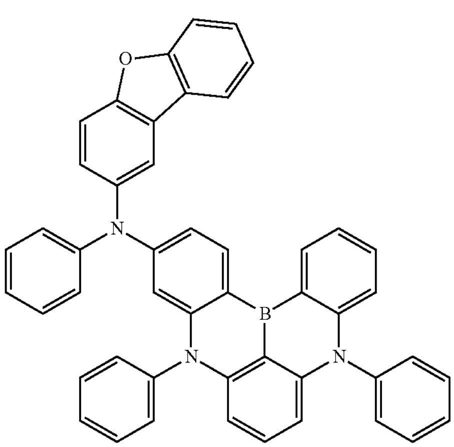
-continued
2-56
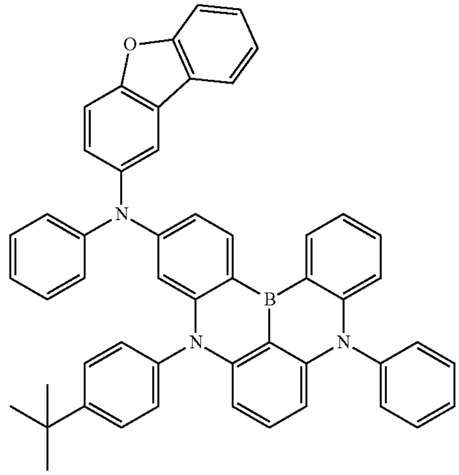
2-57
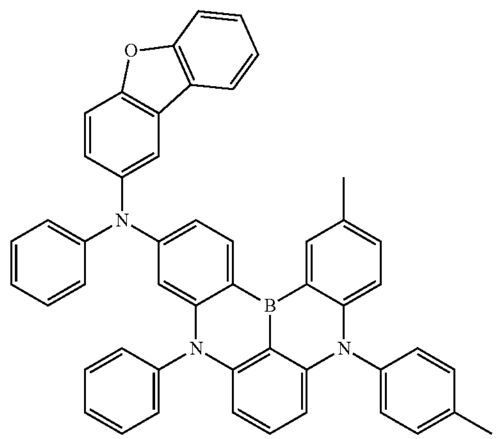
2-58
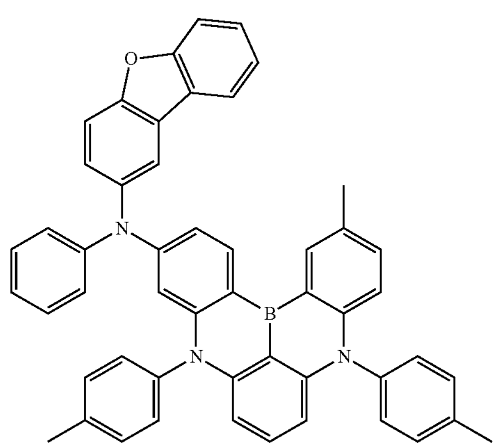

-continued
2-59
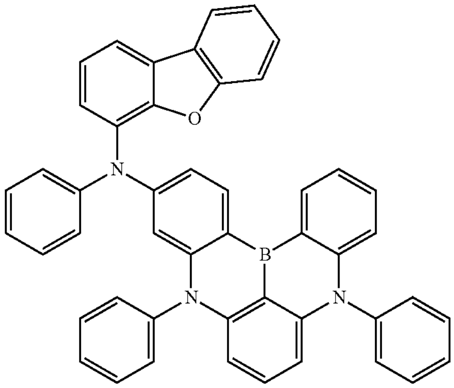
2-60
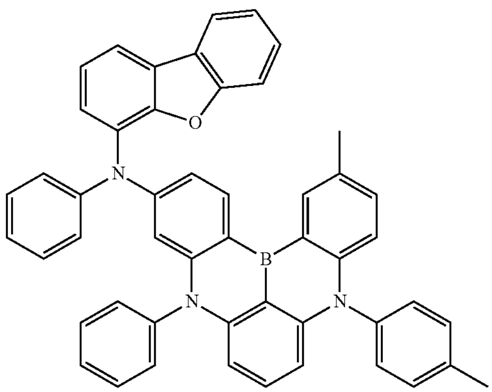
2-61
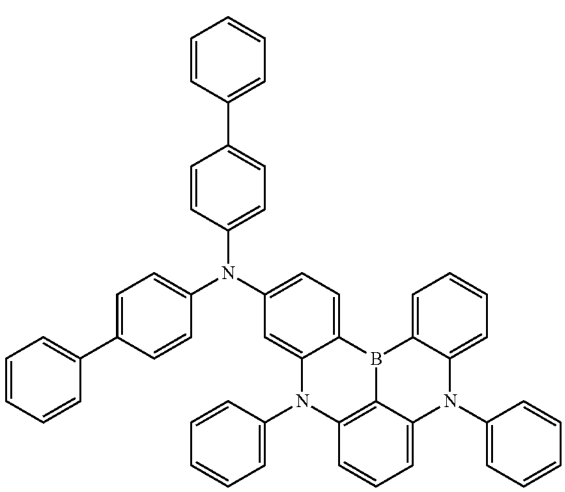
-continued
2-62
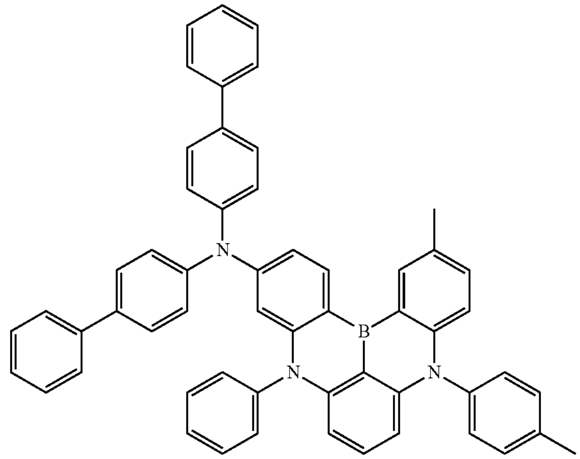
2-63
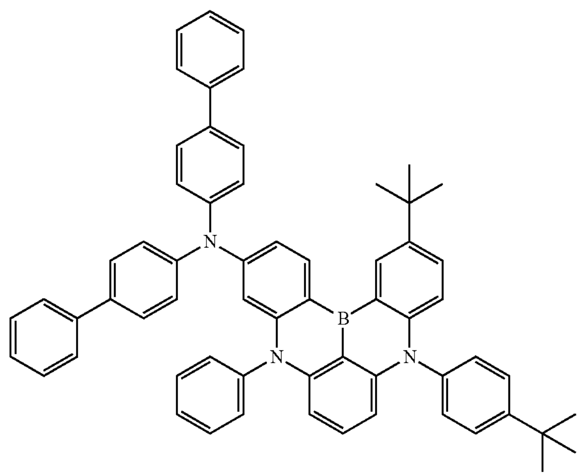
2-64
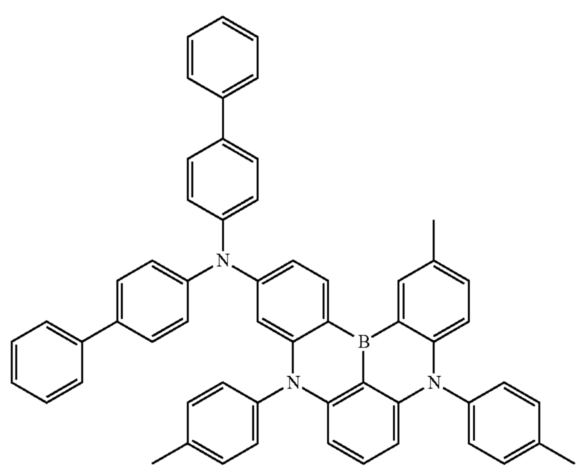

-continued
2-65
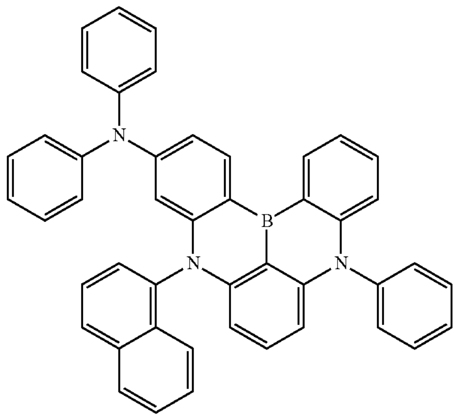
2-66
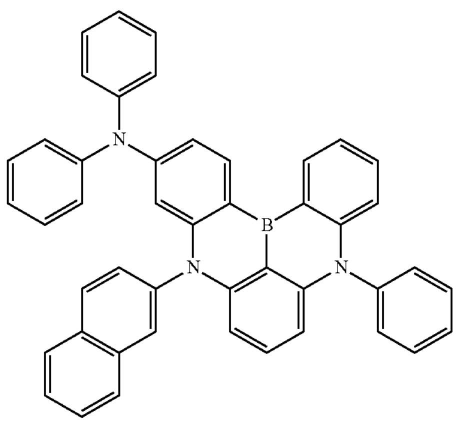
2-67
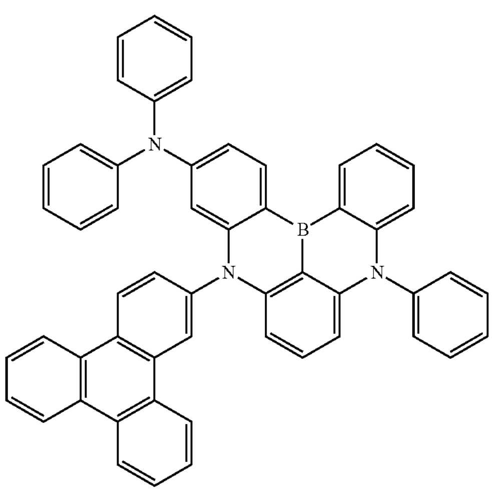
-continued
2-68
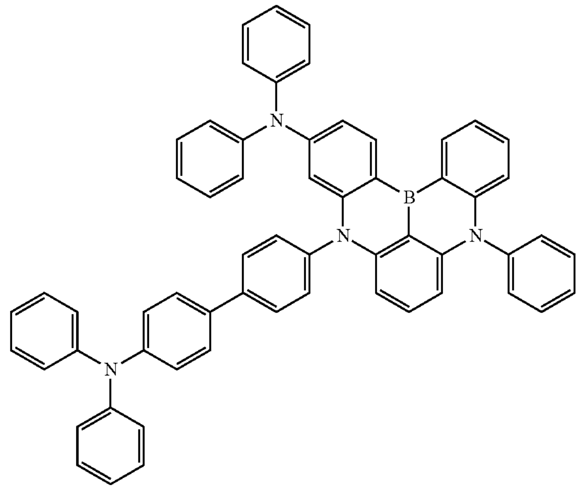
2-69
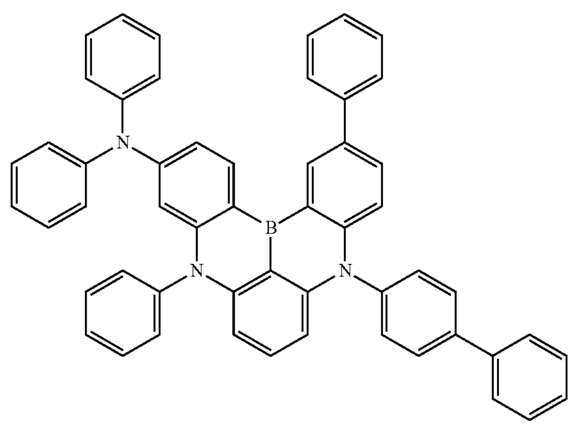
2-70
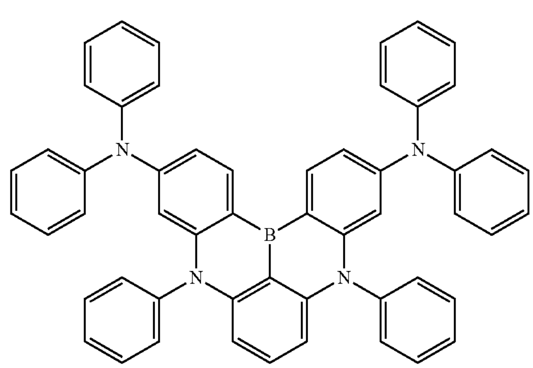

-continued
2-71
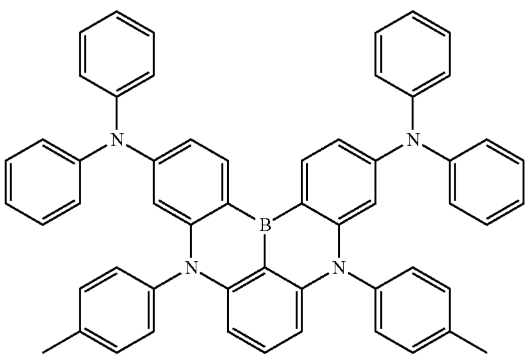
2-72
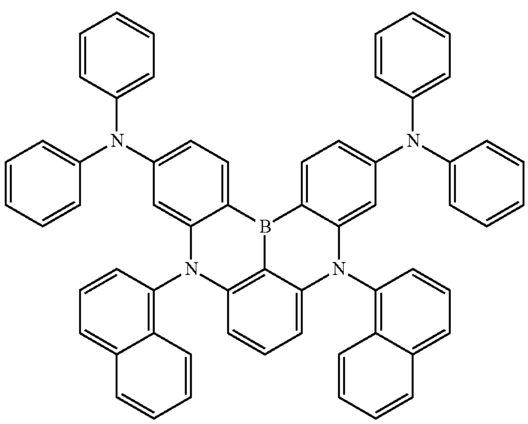
2-73
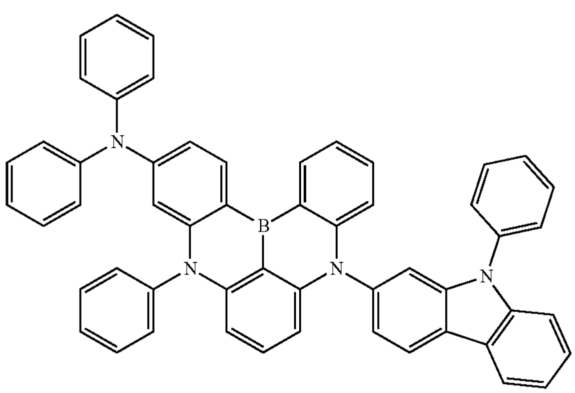
2-74
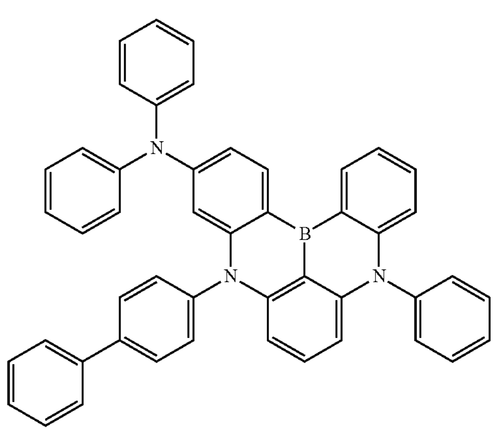
-continued
2-75
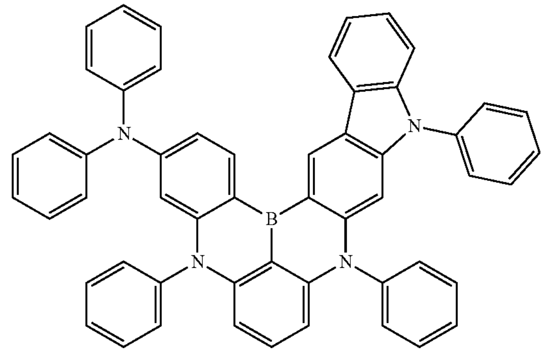
2-76
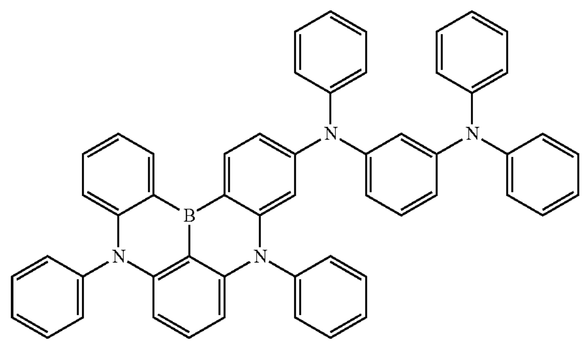
2-77
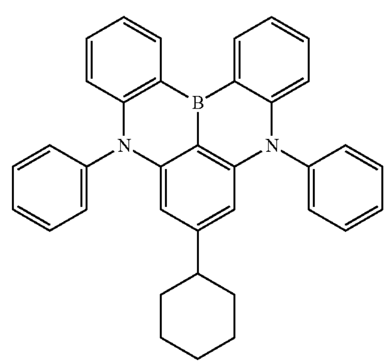
2-78
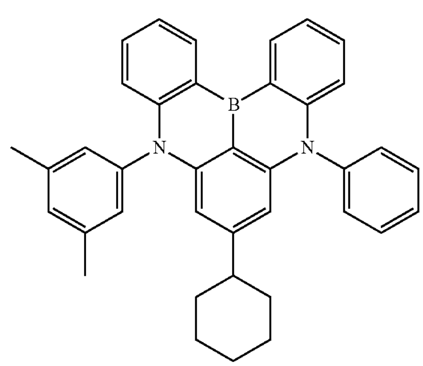

-continued
2-79
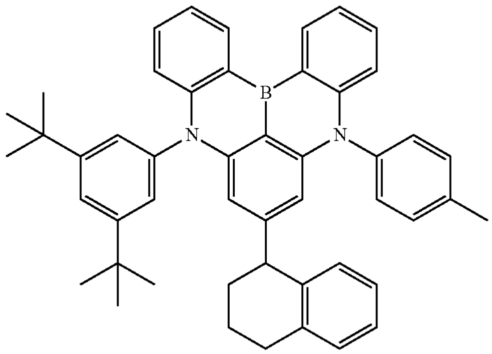
2-80
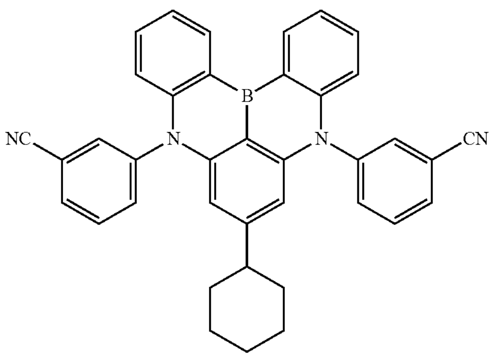
2-81
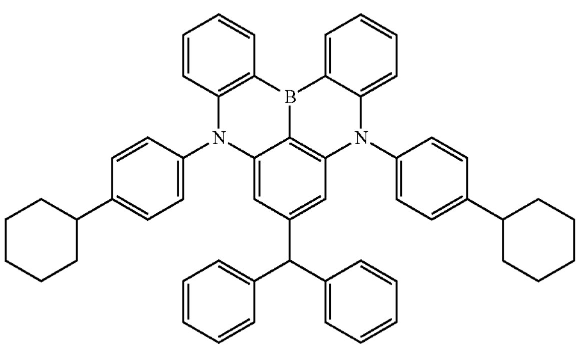
2-82
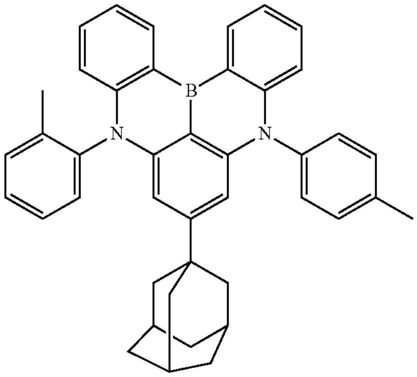
-continued
2-83
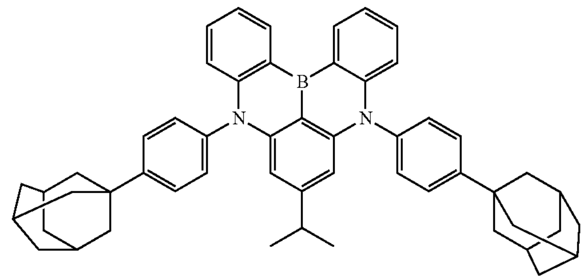
2-84
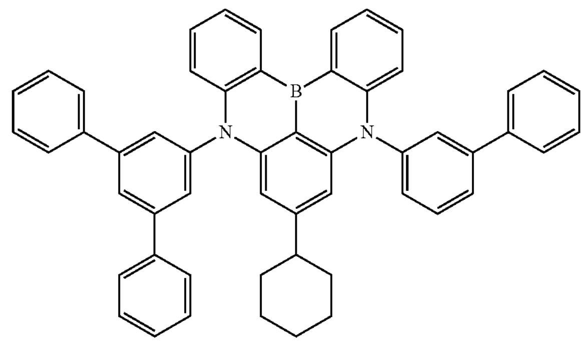
2-85
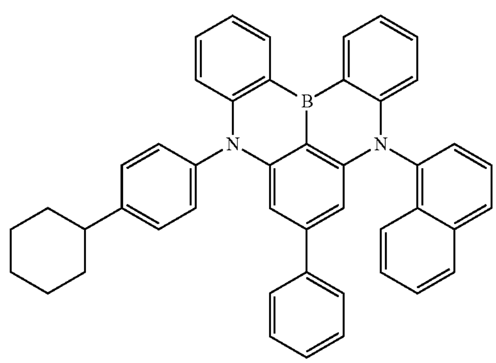
2-86
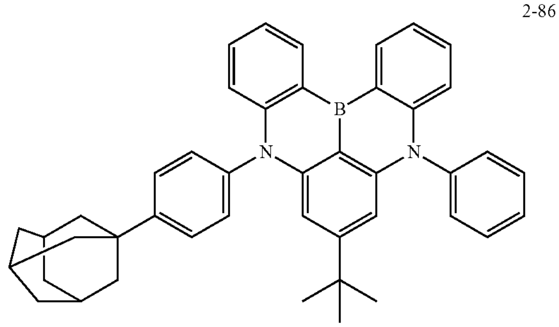

2-87
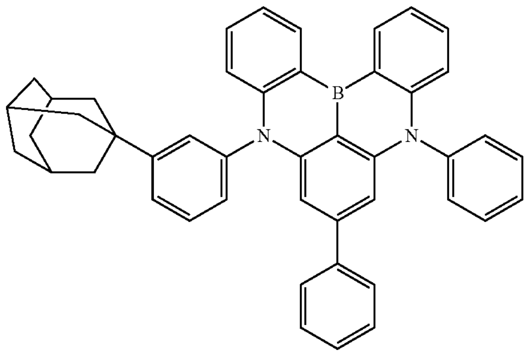
2-88
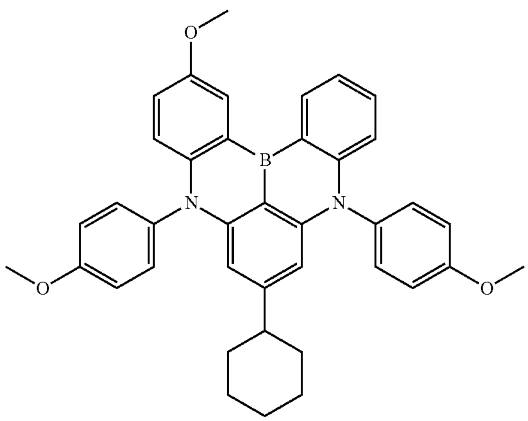
2-89
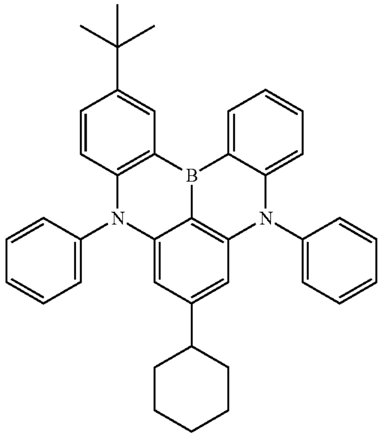
2-90
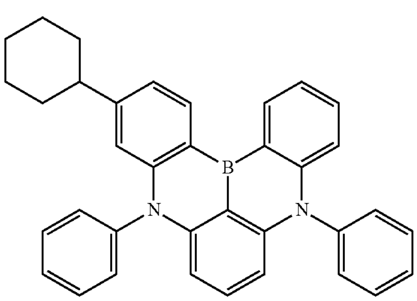
2-91
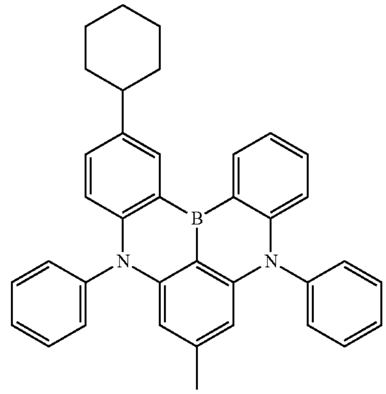
2-92
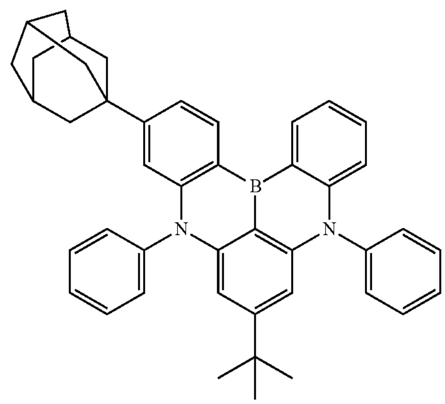
2-93
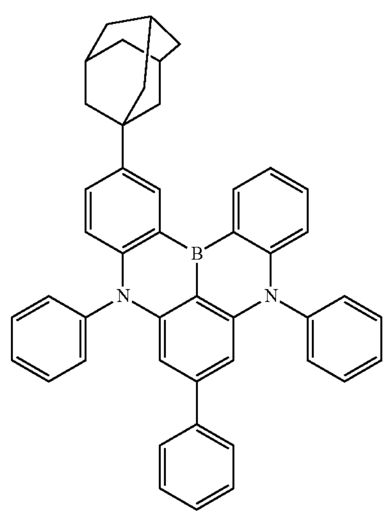

-continued
2-94
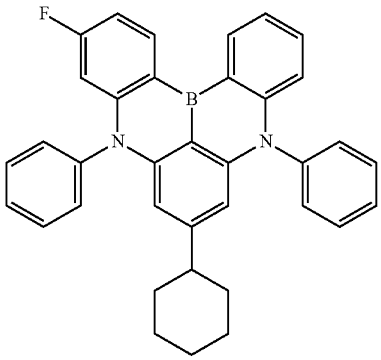
2-95
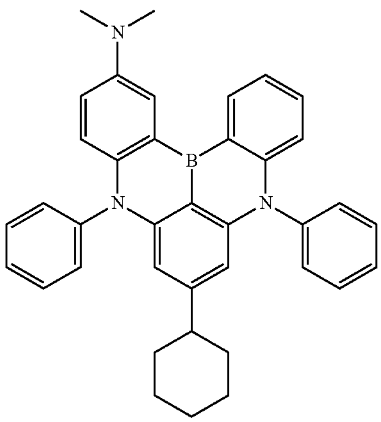
2-96
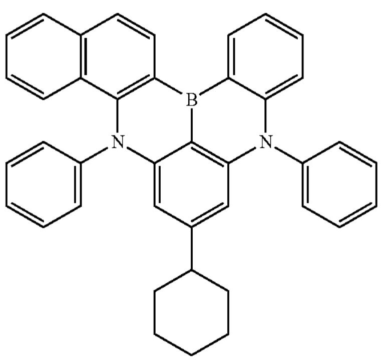
2-97
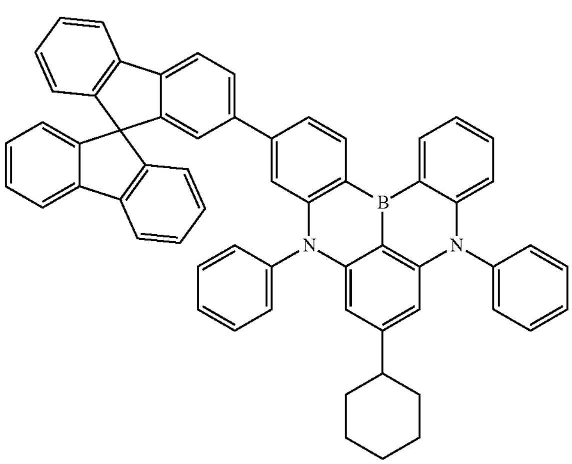
-continued
2-98
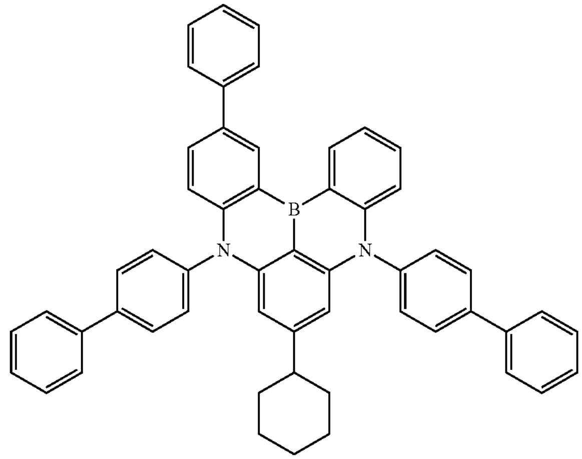
2-99
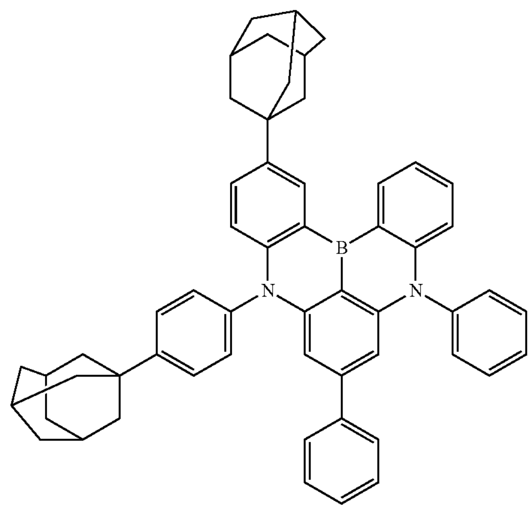
2-100
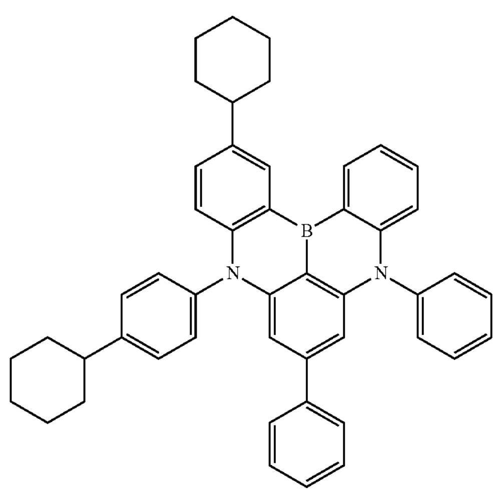

-continued
2-101
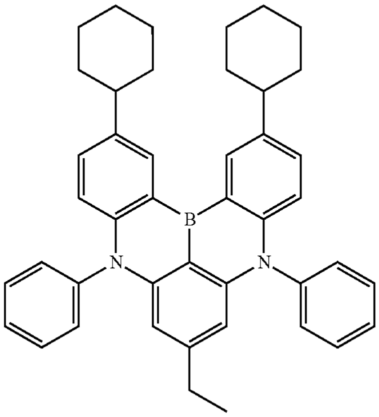
2-102
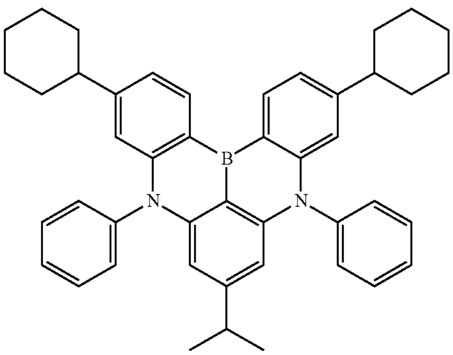
2-103
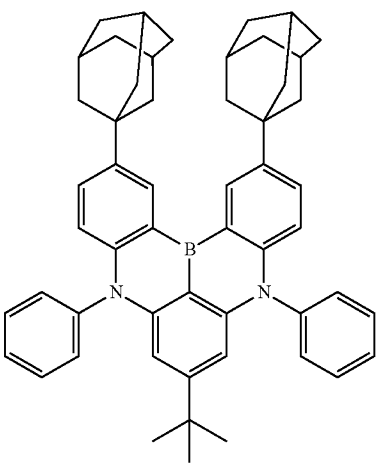
2-104
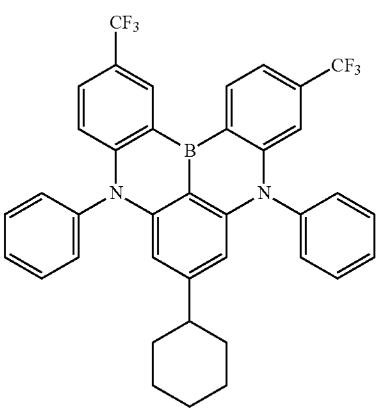
-continued
2-105
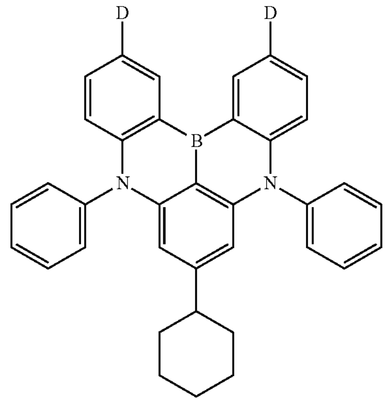
2-106
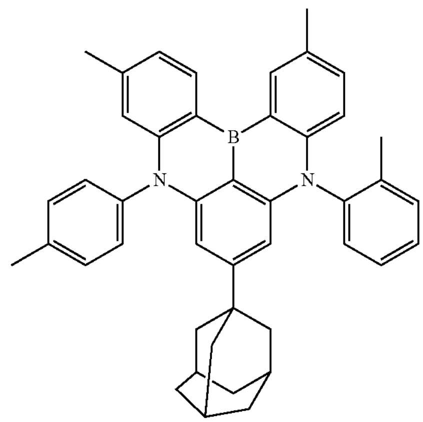
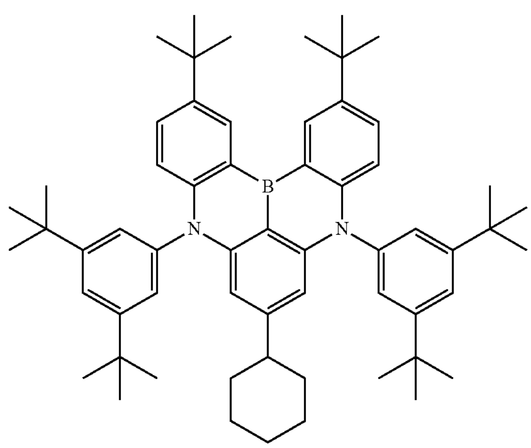

2-108
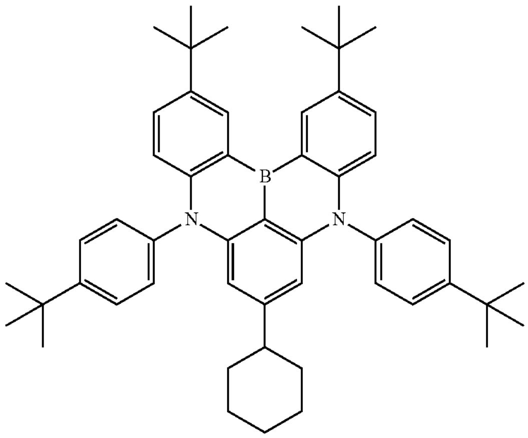
2-109
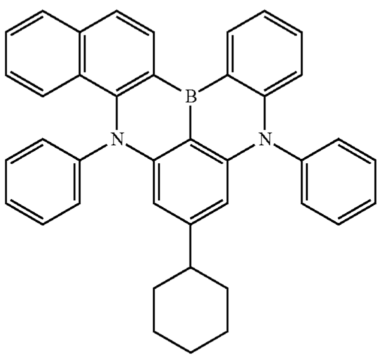
2-110
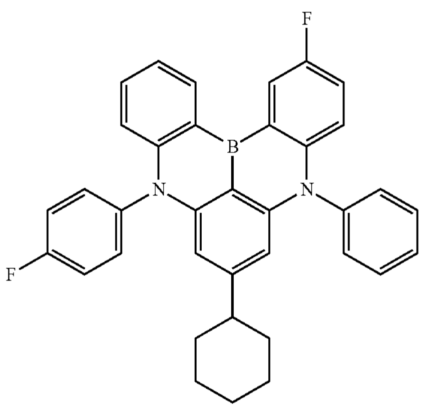
2-111
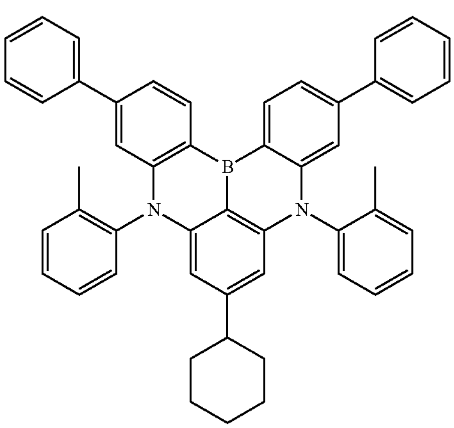
2-112
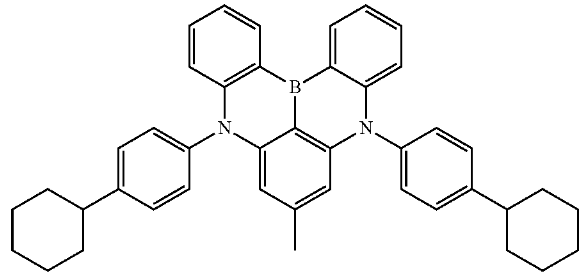
2-113
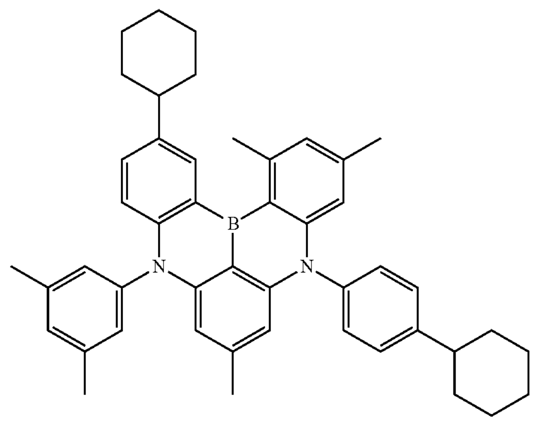
2-114
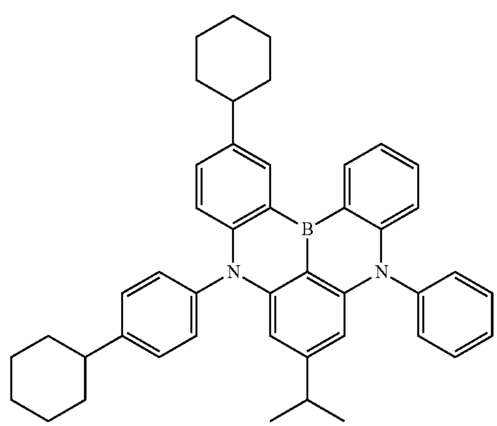

-continued
2-115
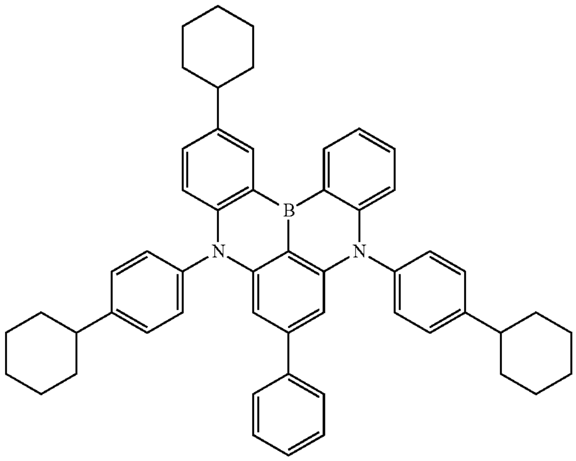
2-116
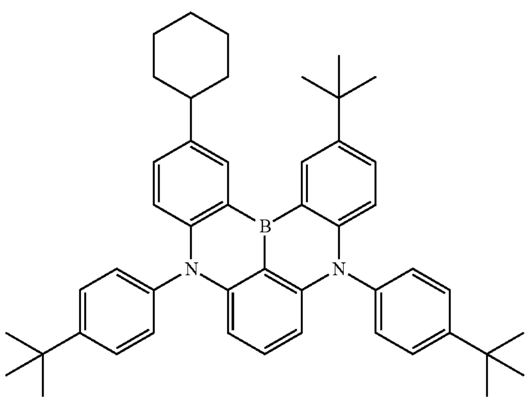
2-117
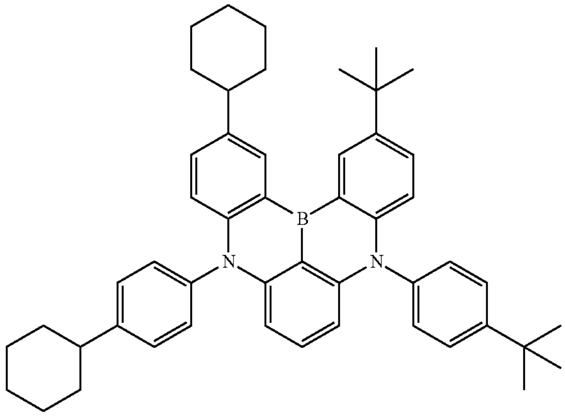
-continued
2-118
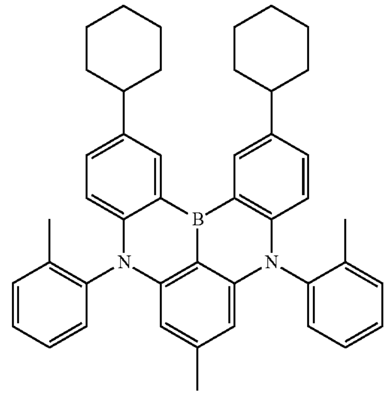
2-119
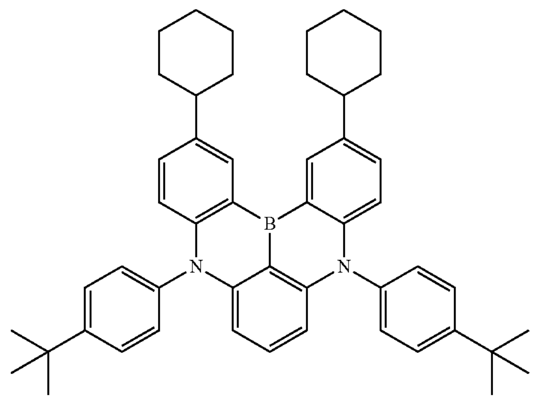
2-120
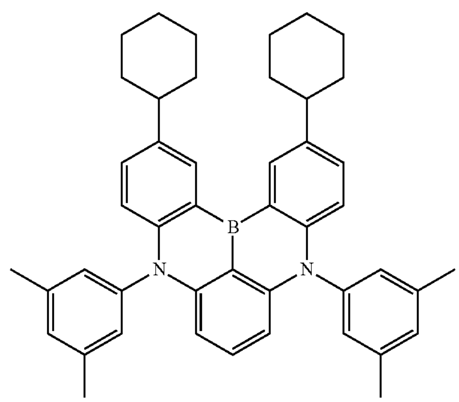
2-121
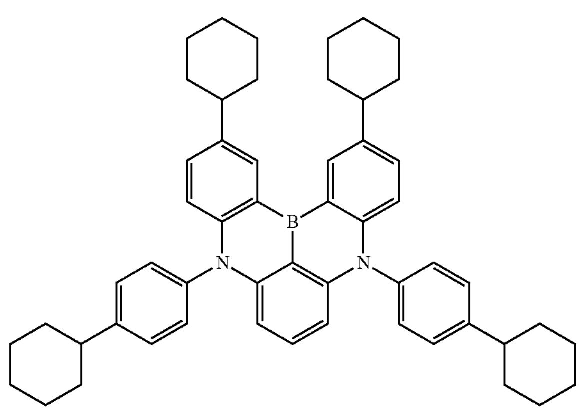

-continued
2-122
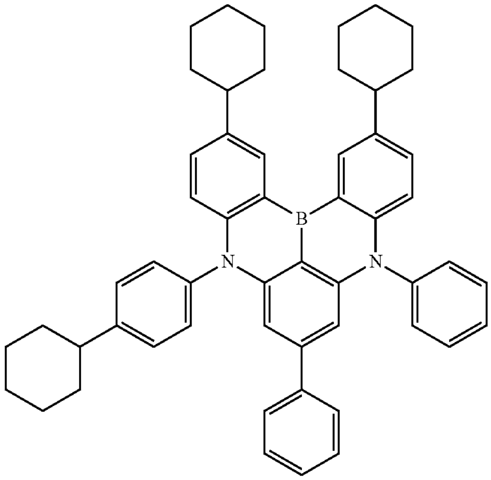
2-123
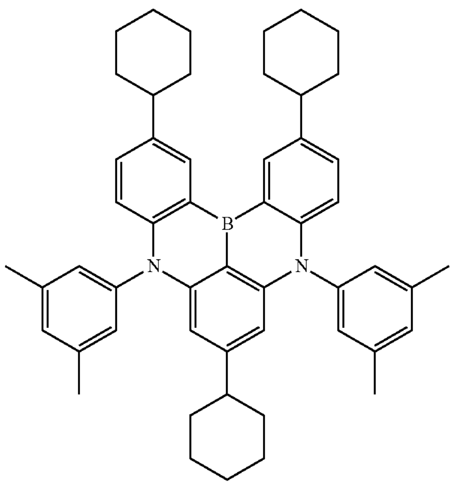
2-124
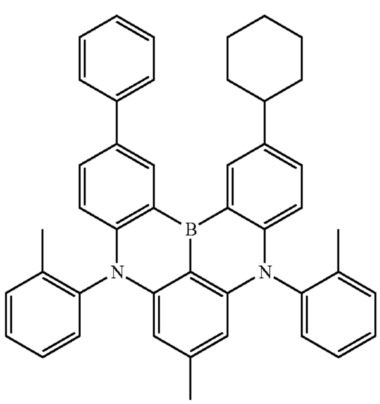
-continued
2-125
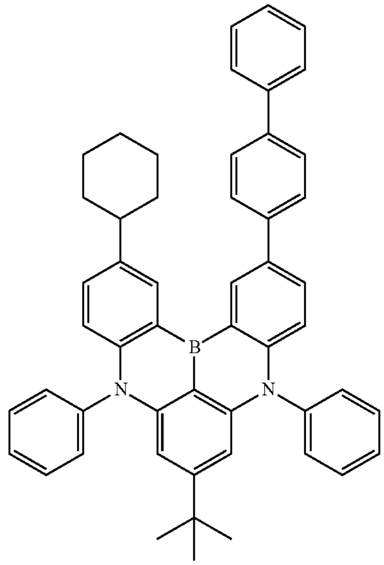
2-126
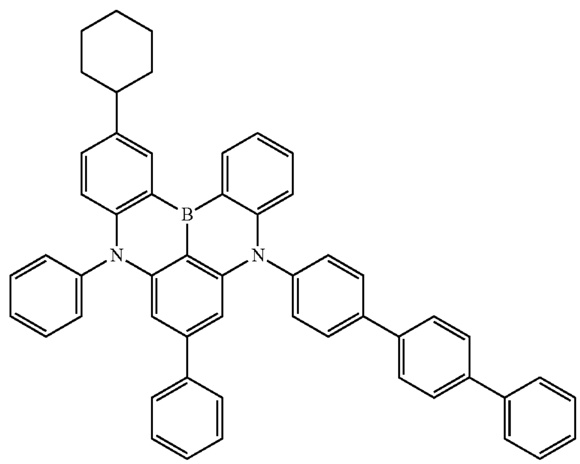
2-127
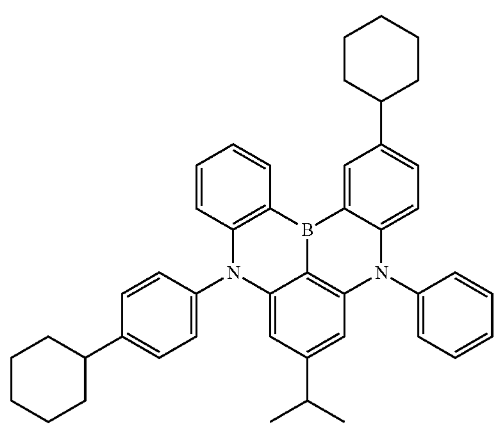

-continued
2-128
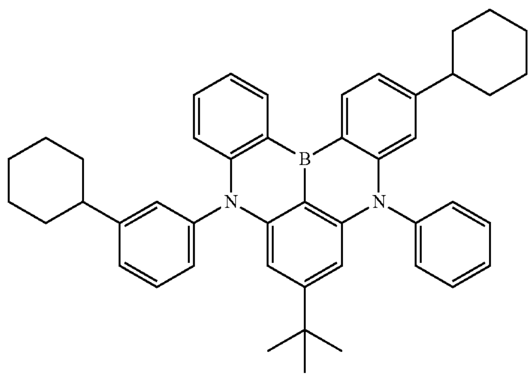
2-129
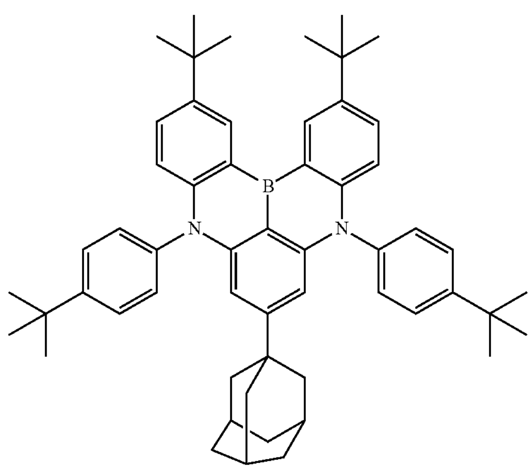
2-130
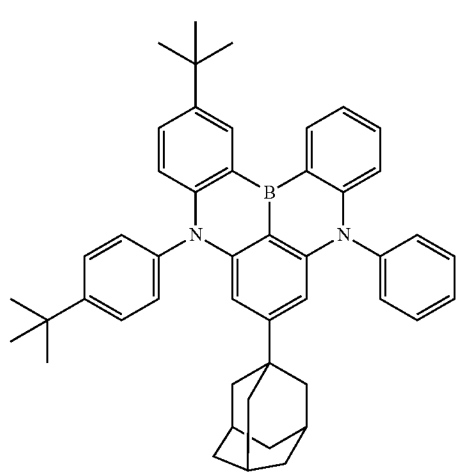
-continued
2-131
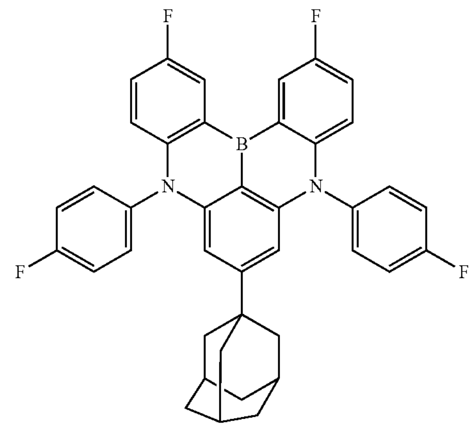
2-132
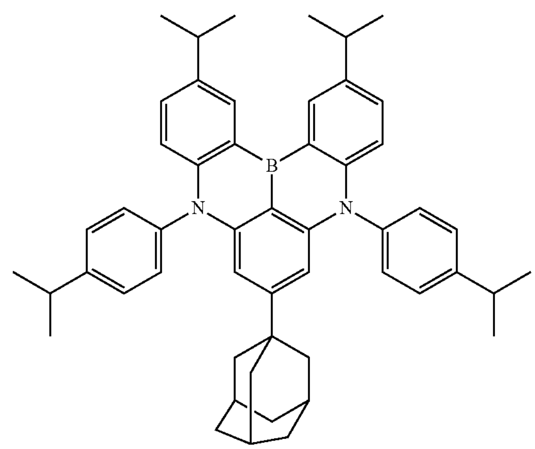
2-133
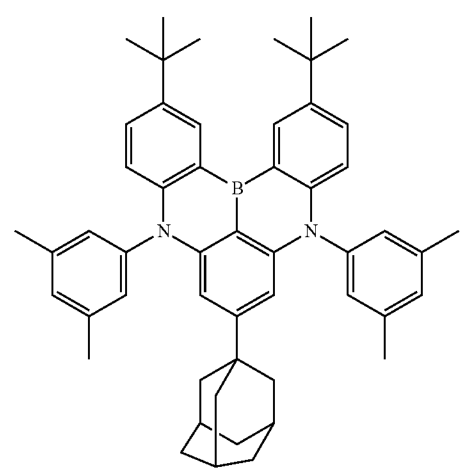

-continued
2-134
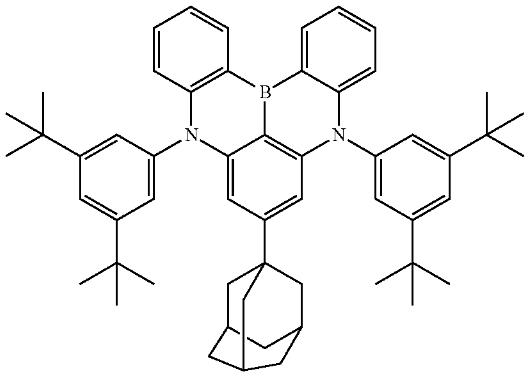
2-135
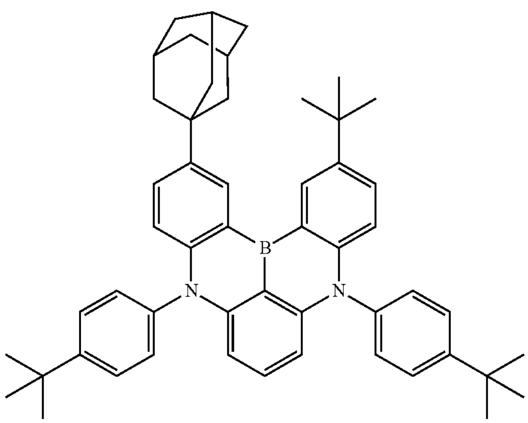
2-136
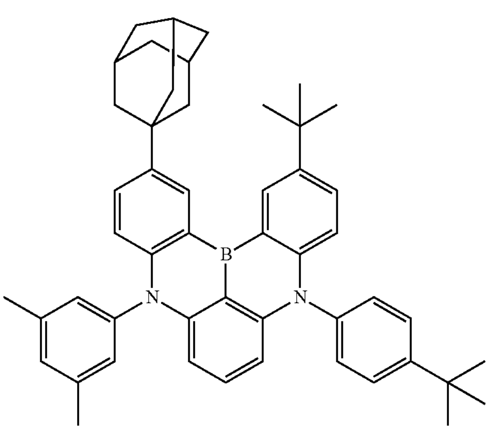
-continued
2-137
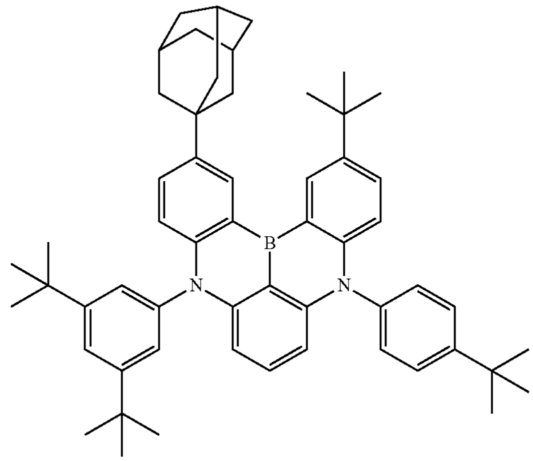
2-138
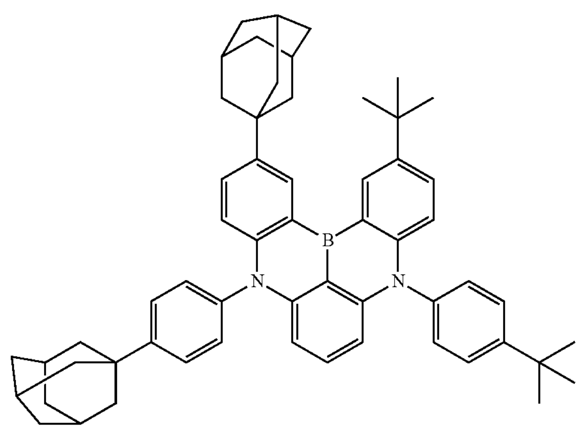
2-139
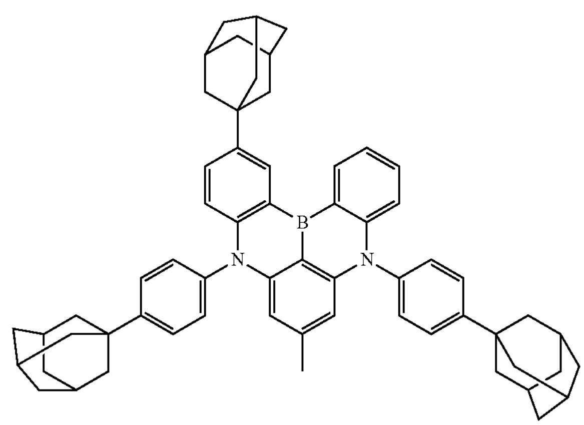

2-140
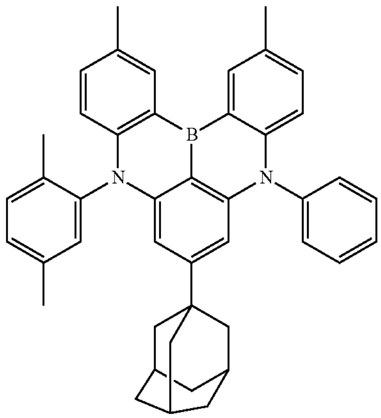
2-141
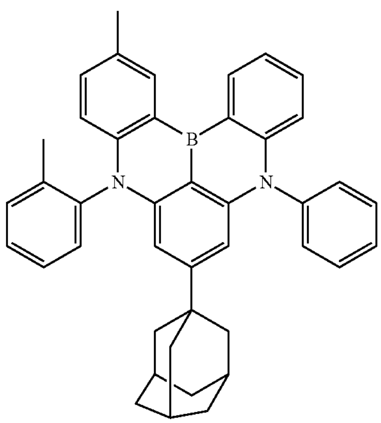
2-142
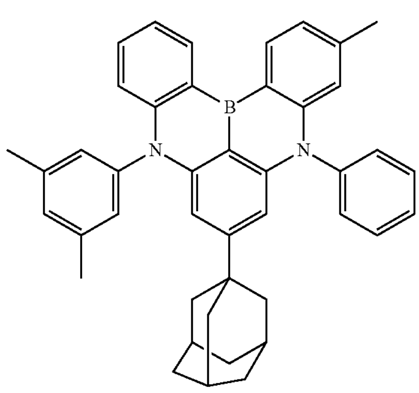
2-143
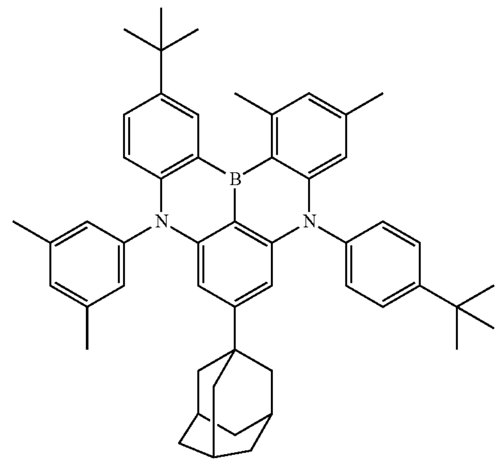
2-144
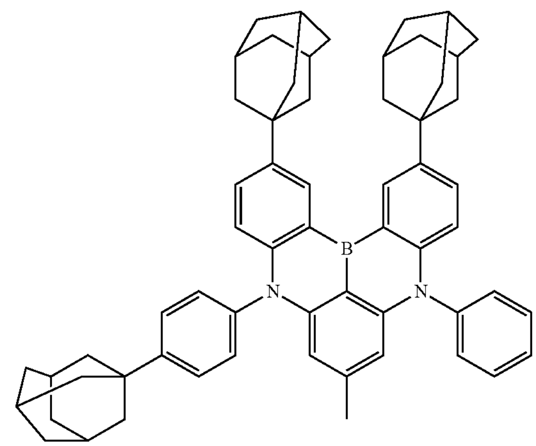
2-145
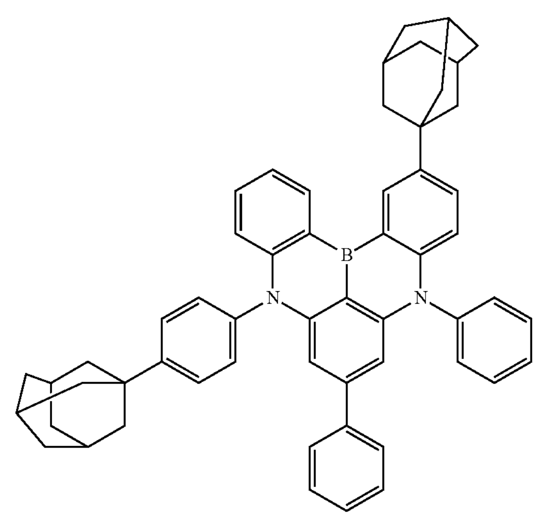

-continued
2-146
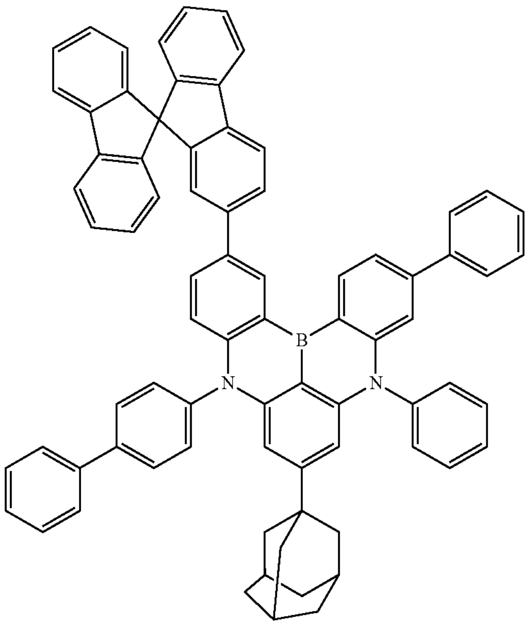
2-147
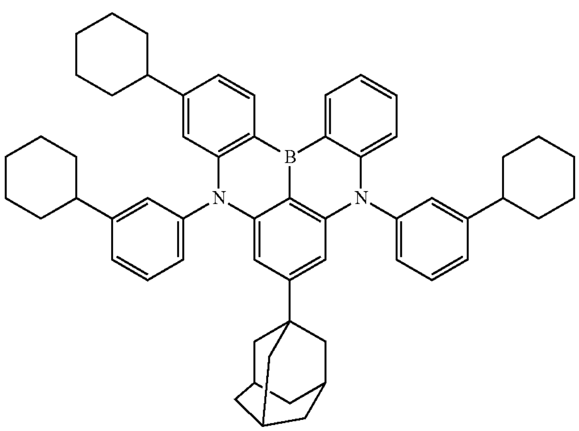
2-148
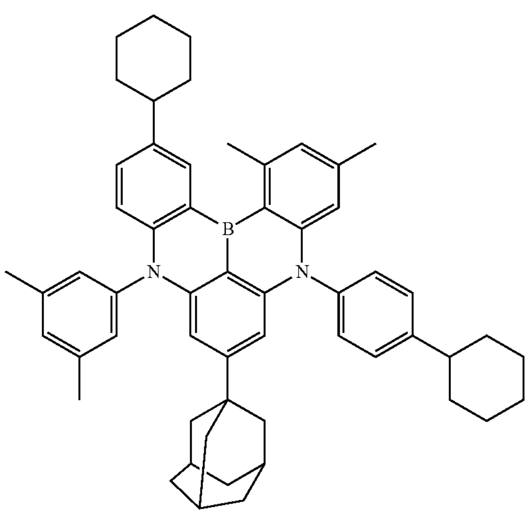
-continued
2-149
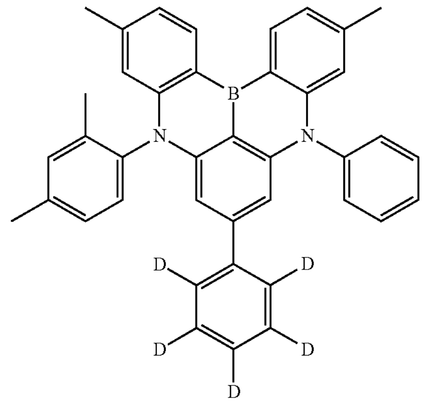
2-150
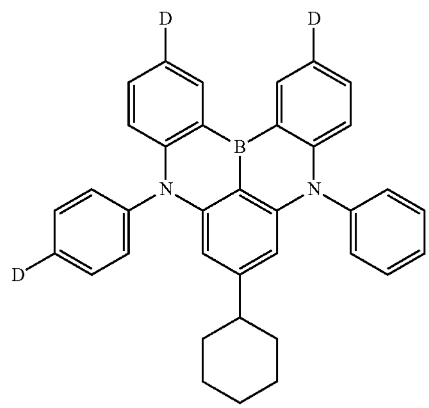
2-151
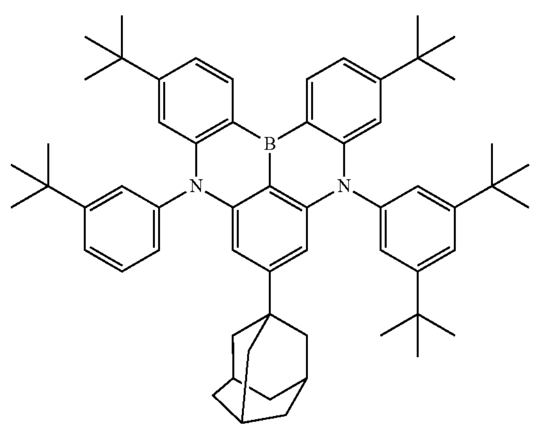

-continued
2-152
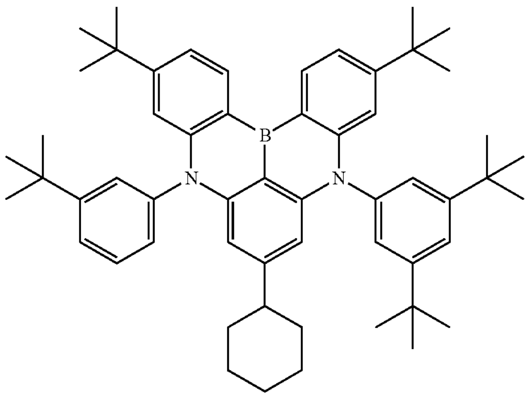
2-153
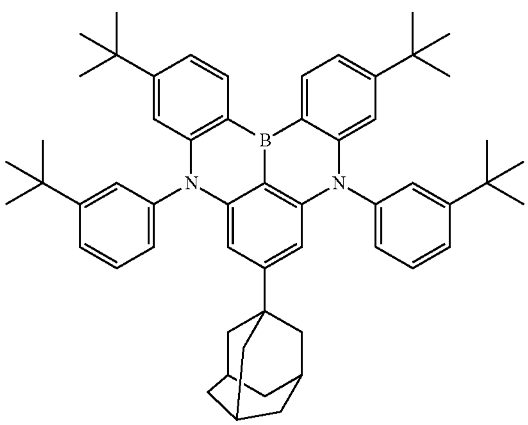
2-154
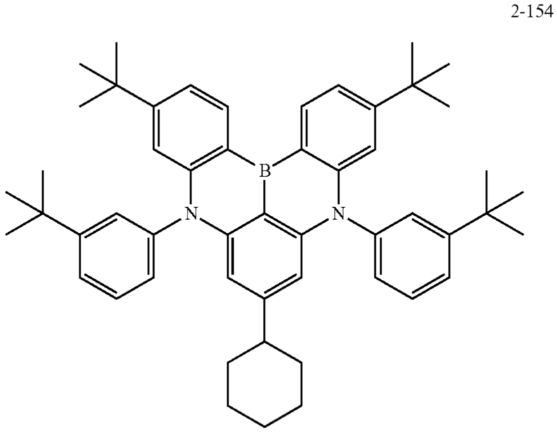
-continued
2-155
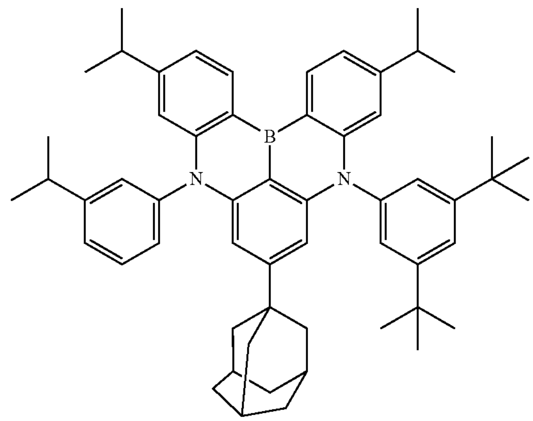
2-156
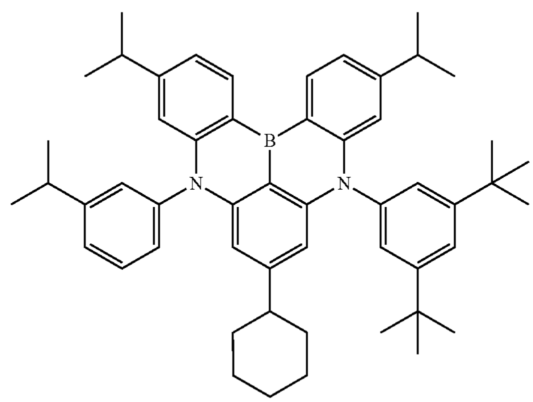
2-157
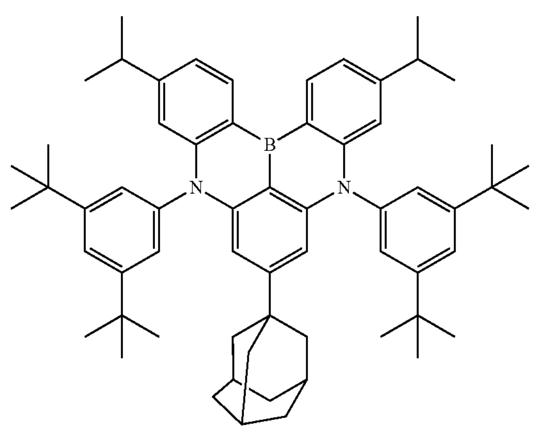

-continued
2-158
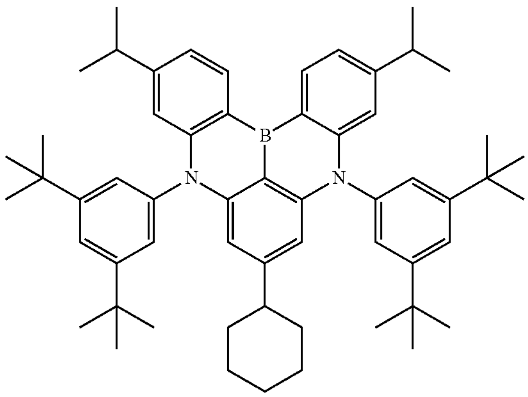
2-159
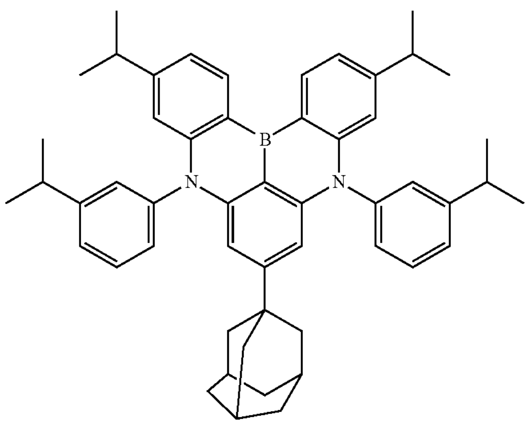
2-160
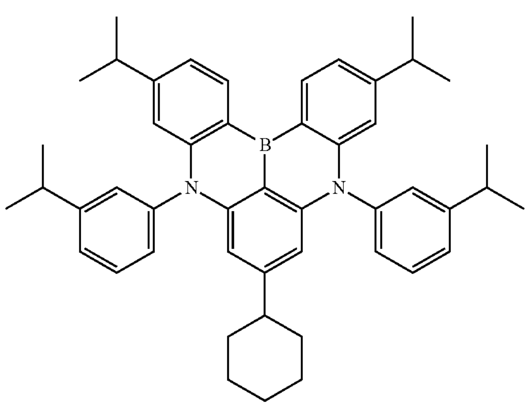
-continued
2-161
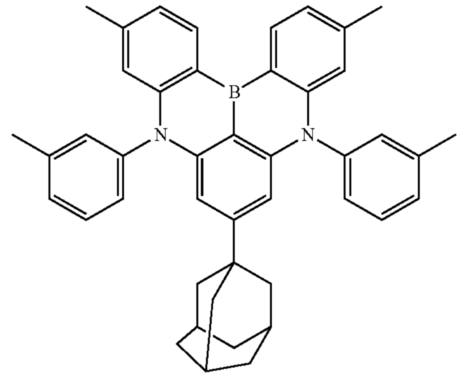
2-162
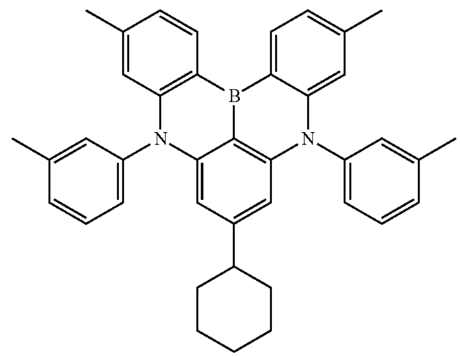
2-163
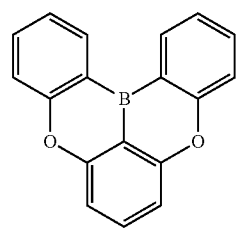
2-164
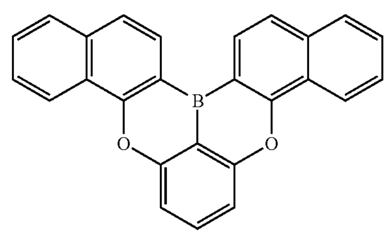
2-165
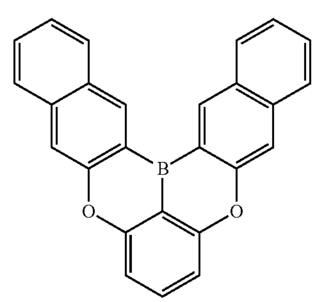

-continued
2-166
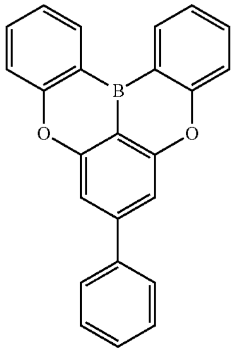
2-167
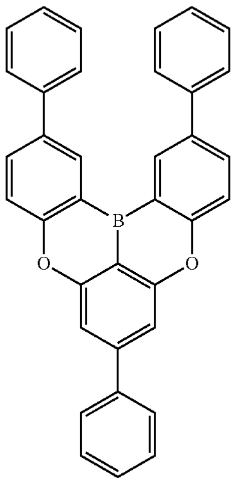
2-168
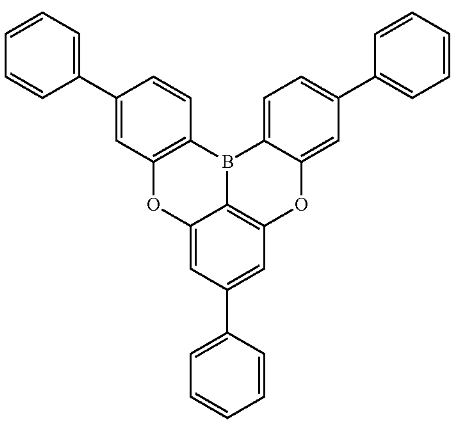
2-169
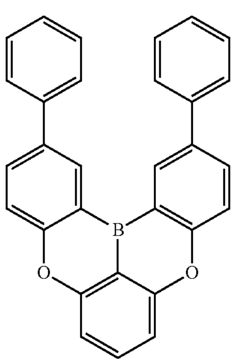
-continued
2-170
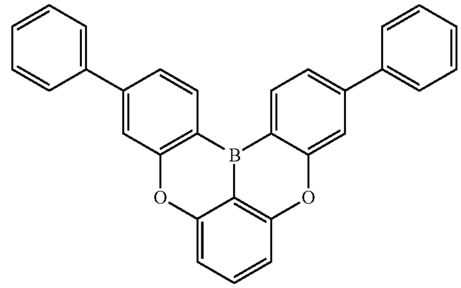
2-171
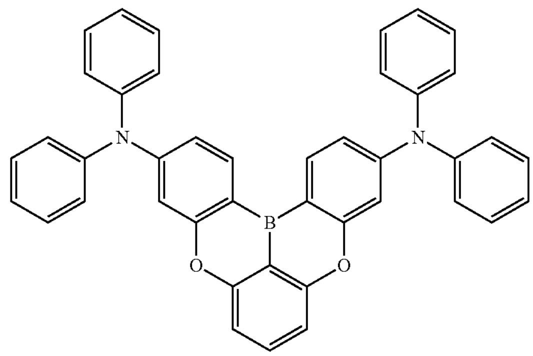
2-172
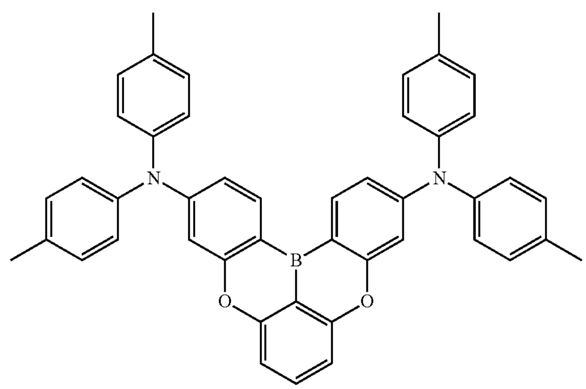
2-173
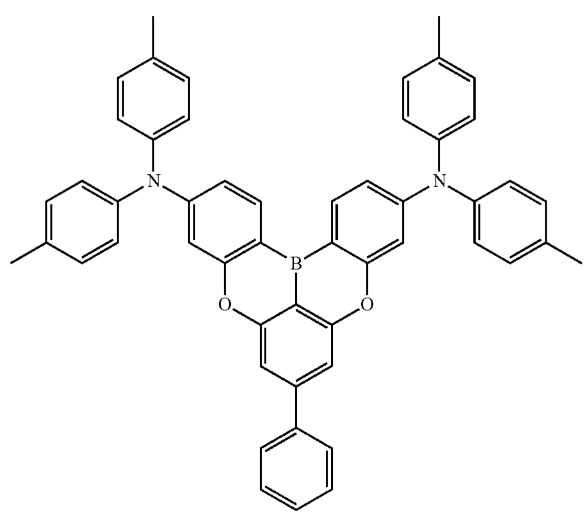

-continued
2-174
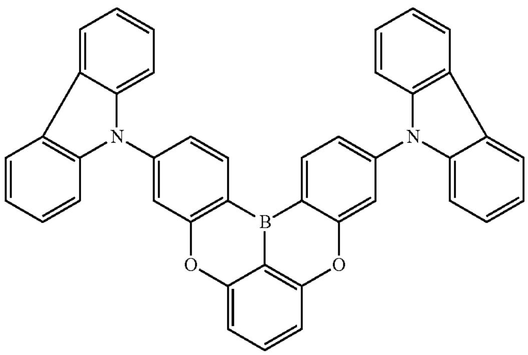
2-175
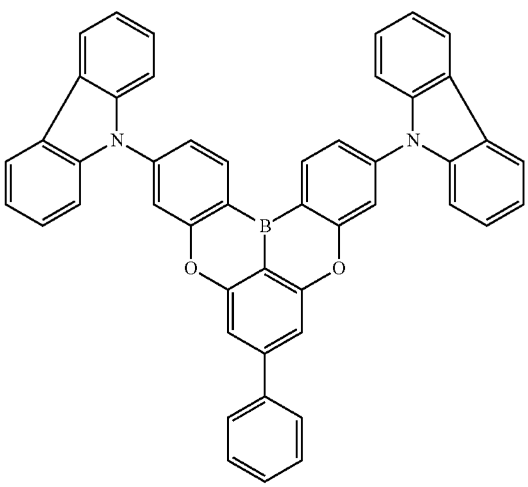
2-176
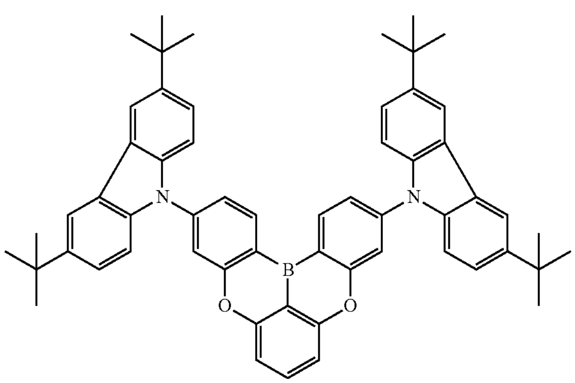
-continued
2-177
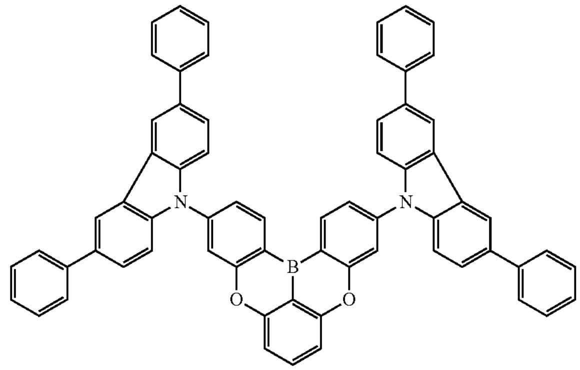
2-178
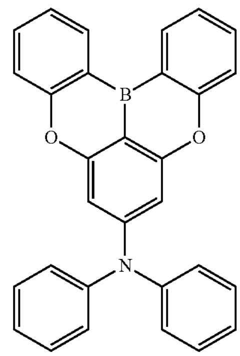
2-179
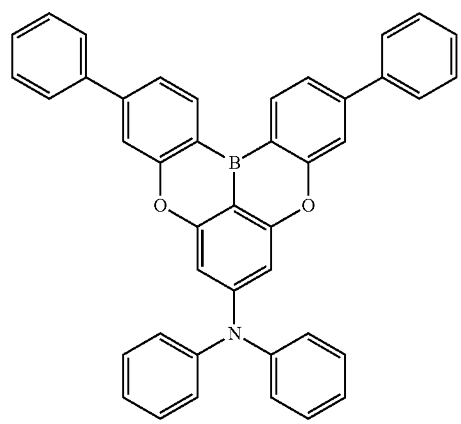
2-180
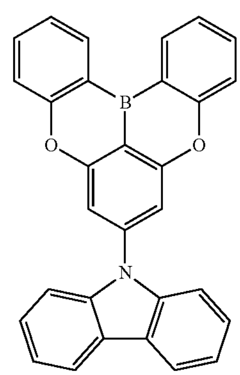

-continued
2-181
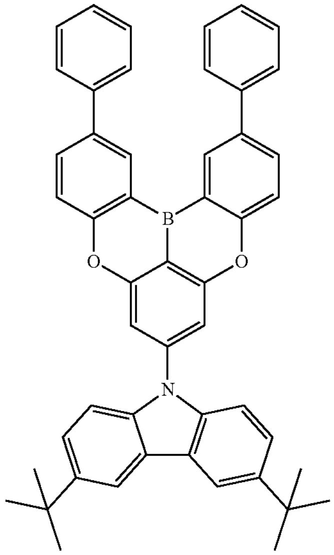
2-182
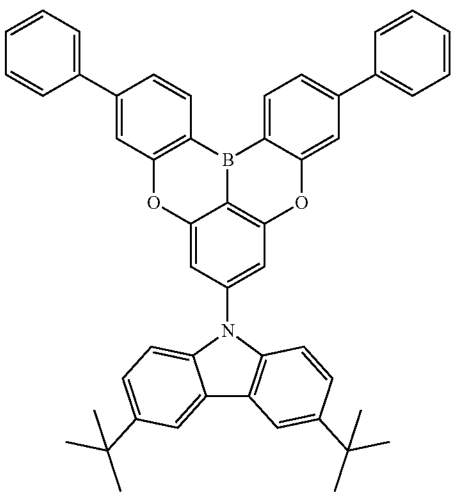
2-183
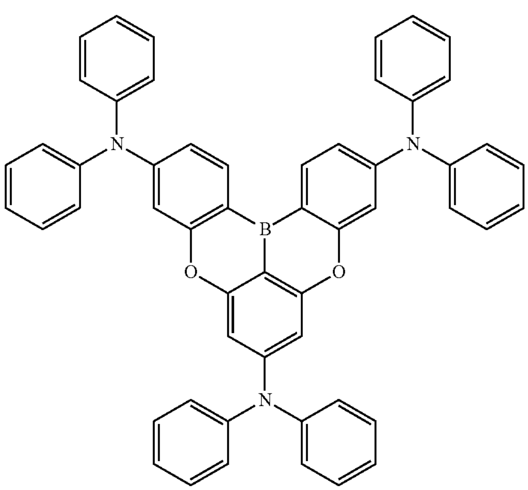
-continued
2-184
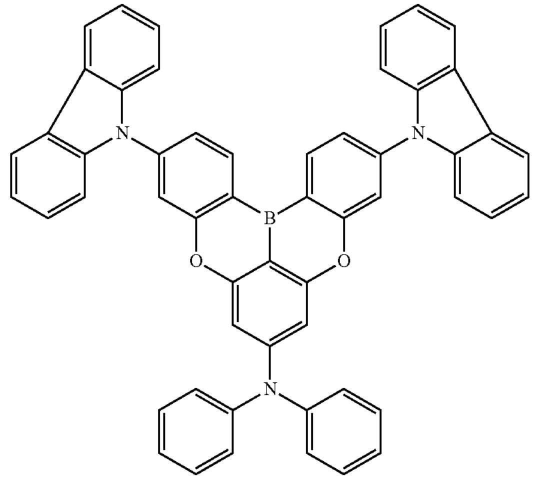
2-185
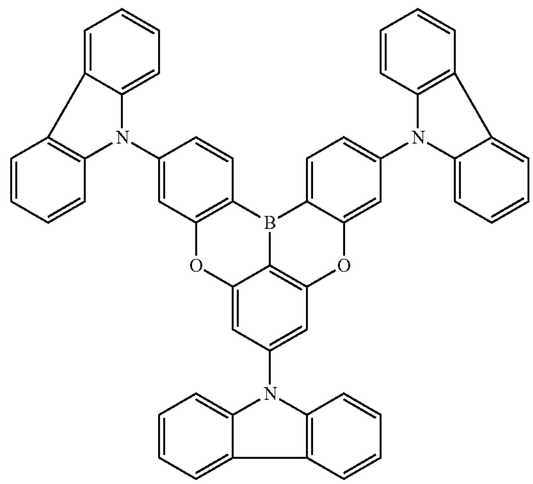
2-186
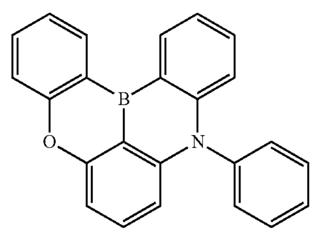
2-187
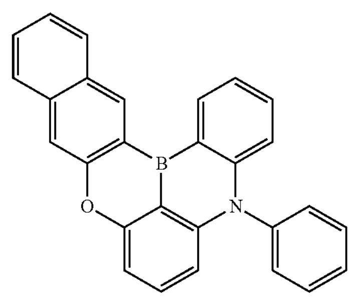

-continued
2-188
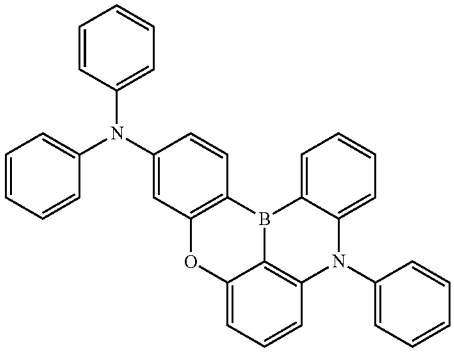
2-189
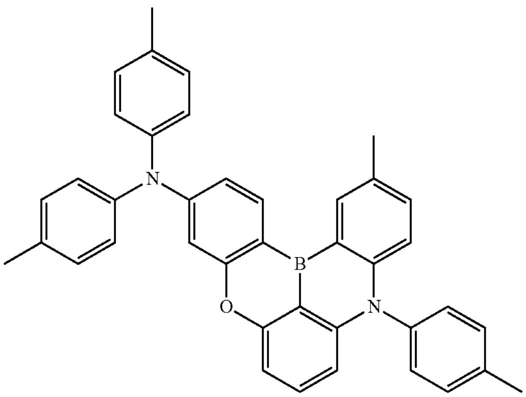
2-190
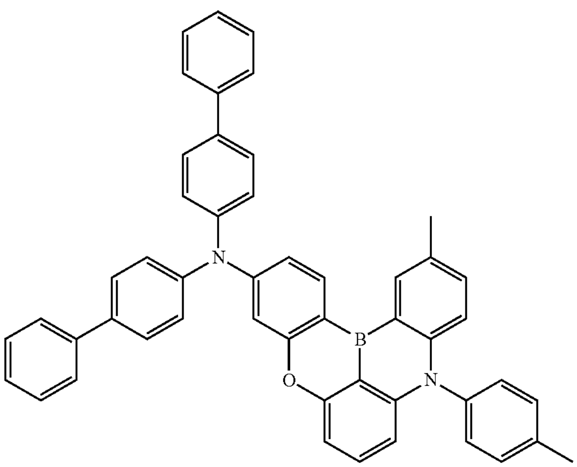
2-191
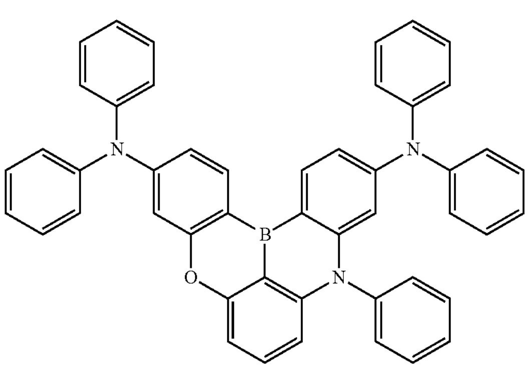
-continued
2-192
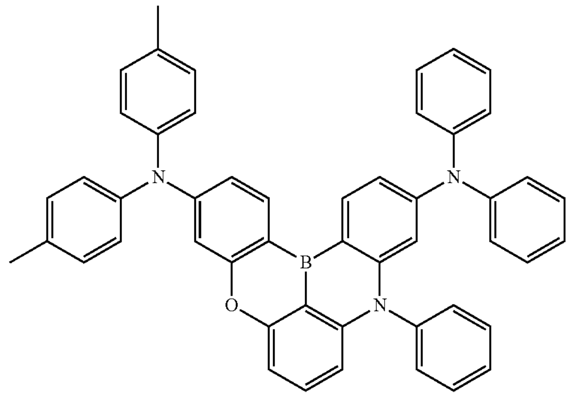
2-193
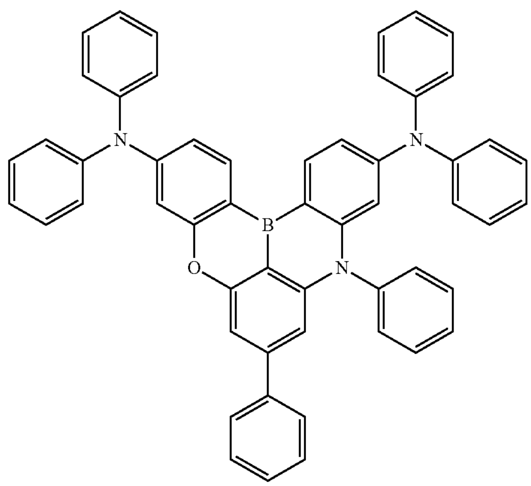
2-194
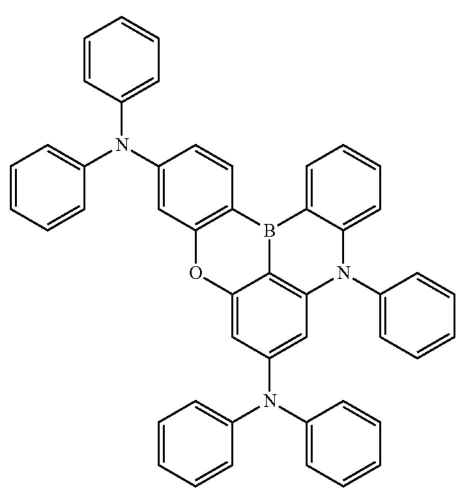

-continued 2-195

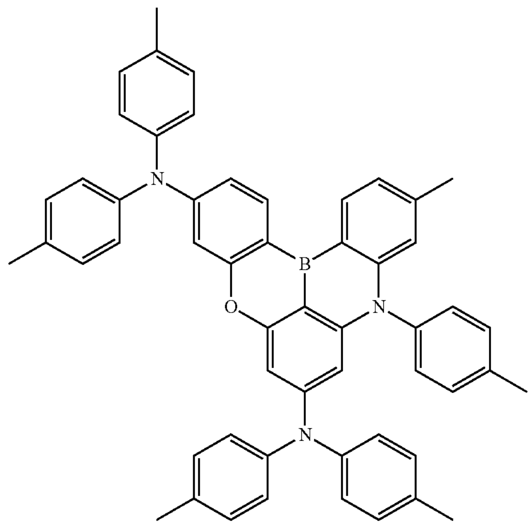

The organic electroluminescent device may include the organic material layer containing the compound represented by the Chemical Formula 1 as described above.

Specifically, the organic material layer containing the compound represented by the Chemical Formula 1 may include a hole transport layer or an auxiliary hole transport layer. In one implementation, the organic material layer includes a hole transport layer or an auxiliary hole transport layer, and contains the compound represented by the Chemical Formula 1.

In one implementation, the organic material layer may contain at least two types of compounds represented by the Chemical Formula 1.

The organic material layer may include, in addition to the organic material layer containing the compound represented by the Chemical Formula 1, at least one organic material layer selected from a group consisting of a hole injection layer, a hole transport layer, an auxiliary hole transport layer, a second light-emitting layer, an auxiliary electron transport layer, an electron transport layer, and an electron injection layer.

According to the present disclosure, the hole transport layer may be embodied as a single layer or a stack of a plurality of layers.

According to the present disclosure, the auxiliary hole transport layer may be embodied as a single layer or a stack of a plurality of layers.

In addition, as described above, the organic electroluminescent device may include a light-emitting layer containing the compound represented by the Chemical Formula 2.

The light emitting layer may contain a blue light emitting host, and the compound represented by the Chemical Formula 2 may be doped into the host as a dopant.

FIG. 1 shows an organic electroluminescent device according to one implementation of the present disclosure. In FIG. 1, the organic electroluminescent device 100 includes an anode 110, a hole injection layer 131, a hole transport layer 132, a light emitting layer 133, an electron transport layer 134, and a cathode 120 in this order.

FIG. 2 shows an organic electroluminescent device according to one implementation of the present disclosure. In FIG. 2, the organic electroluminescent device 200 includes an anode 210, a hole injection layer 231, a hole transport layer 232, an auxiliary hole transport layer 233, a light-emitting layer 234, an electron transport layer 235, and a cathode 220 in this order.

The anode 110 or 210 feeds a hole into the light-emitting layer 133 or 234. The anode may contain a conductive material with a high work function to facilitate the feeding of the hole. When the organic electroluminescent device is applied to a bottom emission organic light-emitting display device, the anode may be a transparent electrode made of a transparent conductive material. When the organic electroluminescent device is applied to a top emission organic light-emitting display device, the anode may be a multilayer structure with a transparent electrode layer and a reflective layer made of a transparent conductive material.

The cathode 120 or 220 feeds electrons to the light-emitting layer 133 or 234. The cathode may contain a conductive material having a low work function to facilitate feeding of electrons. When the organic electroluminescent device is applied to a bottom emission organic light-emitting display device, the cathode may be a reflective electrode made of metal. When the organic electroluminescent device is applied to a top emission organic light-emitting display device, the cathode may be embodied as a transparent electrode made of a metal and having a small thickness.

Each of the light-emitting layers 133 and 234 may emit a blue (B) light beam, and may be made of a phosphorescent material or a fluorescent material.

Each of the light emitting layers 133 and 234 that emit blue light may contain a blue fluorescent host material, and may contain the compound represented by the Chemical Formula 2 as a dopant material.

The blue fluorescent host material may include 4,4'-bis (2,2'-diphenylvinyl)-1,1'-biphenyl (DPVBi), 9,10-di-(2-naphtyl)anthracene (ADN), tetra-t-butylperylene (TBADN), 2-tert-butyl-9,10-di(2-naphthyl)anthracene, 2-methyl-9,10-di(2-naphtyl)anthracene (MADN), and/or (2,2',2"-(1,3,5-benzenetriyl)-tris(1-phenyl-1-H-benzimidazole (TBPi), etc.

Each of the hole injection layers 131 and 231 may facilitate the injection of holes.

Each of the hole injection layers 131 and 231 may be made of at least one selected from a group of consisting of, for example, CuPc(cupper phthalocyanine), PEDOT(poly(3, 4)-ethylenedioxythiophene), PANI(polyaniline), NPD(N,N-dinaphthyl-N,N'-diphenyl benzidine), 1,4,5,8,9,11-hexaazatriphenylene-hexacarbonitrile (HAT-CN) and combinations thereof. However, the present disclosure is not limited thereto.

Each of the hole transport layers 132 and 232 may contain, as a hole transport material, a material electrochemically stabilized via cationization (i.e., by losing electrons). Alternatively, Each of the hole transport layers 132 and 232 may contain a material that produces a stable radical cation as a hole transport material. Each of the hole transport layers 132 and 232 may contain a known hole transport material or the compound represented by the Chemical Formula 1. The detailed description of the compound represented by the Chemical Formula 1 is as described above.

Each of the hole transport layers 132 and 232 may further contain an additional hole transport material other than the compound represented by the Chemical Formula 1.

The known hole transport material or the additional hole transport material may contain aromatic amine to be easily cationized. In one example, the additional hole transport material may include at least one selected from a group of consisting of NPD(N,N-dinaphthyl-N,N'-diphenylbenzidine), TPD(N,N'-bis-(3-methylphenyl)-N,N'-bis-(phenyl)-benzidine), spiro-TAD(2,2',7,7'-tetrakis(N,N-dimethylamino)-9,9-spirofluorene), MTDATA (4,4',4-Tris(N-3-methylphenyl-N-phenylamino)-triphenylamine), N4,N4,N4',N4'-tetra([1,1'-biphenyl]-4-yl)-[1,1'-biphenyl]-4,4'-diamine, and combinations thereof. However, the present disclosure is not limited thereto.

The auxiliary hole transport layer 233 may contain the compound represented by the Chemical Formula 1, or may contain a known auxiliary hole transport material. The detailed description of the compound represented by the Chemical Formula 1 is as described above.

The auxiliary hole transport layer 233 may further contain an additional auxiliary hole transport material other than the compound represented by the Chemical Formula 1.

Each of the known auxiliary hole transport material and the additional auxiliary hole transport material may include at least one selected from a group of consisting of, for example, TCTA, tris[4-(diethylamino)phenylamine, N-(biphenyl-4-yl)-9,9-dimethyl-N-(4-(9-phenyl-9H-carbazol-3-yl)phenyl)-9H-fluorene-2-amine, tri-p-tolylamine, 1,1-bis(4-(N,N'-di(ptolyl)amino)phenyl)cyclohexane (TAPC), MTDATA, mCP, mCBP, CuPc, N,N'-bis[4-[bis(3-methylphenyl)amino]phenyl]-N,N-diphenyl-1,1'-biphenyl]-4,4'-diamine (DNTPD), TDAPB, and combinations thereof. However, the present disclosure is not limited thereto.

The auxiliary electron transport layer may be positioned between each of the electron transport layers 134 and 235 and each of the light-emitting layers 133 and 234. The auxiliary electron transport layer may further contain an auxiliary electron transport material.

The auxiliary electron transport material may include at least one selected from a group of consisting of, for example, oxadiazole, triazole, phenanthroline, benzoxazole, benzothiazole, benzimidazole, triazine, and combinations thereof. However, the present disclosure is not limited thereto.

Each of the electron transport layers 134 and 235 receive electrons from the cathode. Each of the electron transport layers 134 and 235 may transfer the supplied electrons to the light-emitting layer.

Each of the electron transport layers 134 and 235 may serve to facilitate the transport of electrons. Each of the electron transport layers 134 and 235 contains an electron transport material.

The electron transport material may be electrochemically stabilized by being anionic (i.e., by obtaining electrons). Alternatively, the electron transport material may produce the stable radical anion. Alternatively, the electron transport material may contain a heterocyclic ring to be easily anionized by heteroatoms.

In one example, the electron transport material may include at least one selected from a group of consisting of, for example, PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, TPBi(2,2',2-(1,3,5-benzinetriyl)-tris(1-phenyl-1-H-benzimidazole), oxadiazole, triazole, phenanthroline, benzoxazole, benzthiazole, and combinations thereof. However, the present disclosure is not limited thereto.

In one example, the electron transport material may include an organic metal compound such as an organic aluminum compound, or an organic lithium compound including at least one selected from a group of consisting of, for example, Alq3(tris(8-hydroxyquinolino)aluminum), Liq (8-hydroxyquinolinolatolithium), BAlq(bis(2-methyl-8-quinolinolate)-4-(phenylphenolato)aluminium), and SAlq, etc. However, the present disclosure is not limited thereto.

Specifically, the organometallic compound may be an organic lithium compound.

More specifically, a ligand bound to the lithium of the organolithium compound may be a hydroxyquinoline based ligand.

The organic material layer may further include an electron injection layer.

The electron injection layer serves to facilitate the injection of electrons and contains an electron injection material. The electron injection material may include, but is not limited to, at least one selected from a group of consisting of Alq3(tris(8-hydroxyquinolino)aluminum), PBD, TAZ, Spiro-PBD, BAlq, SAlq and combinations thereof. Alternatively, the electron injection layer may be made of a metal compound. The metal compound may include, but is not limited to, at least one selected from a group of consisting of, for example, LiQ, LiF, NaF, KF, RbF, CsF, FrF, $BeF_2$, $MgF_2$, $CaF_2$, $SrF_2$, $BaF_2$ and $RaF_2$.

The organic material layer may further include at least one selected from a group of consisting of the hole injection layer, the hole transport layer, the auxiliary hole transport layer, the second light-emitting layer, the auxiliary electron transport layer, the electron transport layer and the electron injection layer. Each of the light-emitting layer, and the hole injection layer, hole transport layer, auxiliary hole transport layer, second light-emitting layer, auxiliary electron transport layer, electron transport layer and electron injection layer may be embodied as a single layer or a stack of multiple layers.

The organic electroluminescent device according to the present disclosure may be applied to organic light emitting display devices such as a mobile phone and TV. For example, FIG. 3 is a schematic cross-sectional view of an organic light emitting display device applicable to a mobile phone according to an exemplary embodiment of the present disclosure.

As shown in FIG. 3, the organic light-emitting display device 1000 may include a substrate 1100, an organic electroluminescent device 3000, and an encapsulating layer 2200 covering the organic electroluminescent device 3000.

On the substrate 1100, a drive thin-film transistor TFT, which is a drive device, and the organic electroluminescent device 3000, which is connected to the drive thin-film transistor TFT, are positioned.

Although not shown, on the substrate 1100, a gate line and a data line, which define a pixel region, a power line extending parallel to and spaced from either the gate line or the data line, and a switching thin-film transistor connected to the gate line and data line are formed.

The driving thin-film transistor TFT is connected to the switching thin-film transistor, and includes an active layer 1520, a gate electrode 1720, a source electrode 1920 and a drain electrode 1940. A gate insulating film 1600 and an inter-layer insulating film 1800 are interposed therebetween. As shown in FIG. 3, the source electrode 1920 and the drain electrode 1940 are electrically connected to the active layer 1520 via a contact hole formed in the gate insulating film 1600 and the inter-layer insulating film 1800. The drain electrode 1940 is connected to a first electrode 3100 of the organic electroluminescent device 3000.

A storage capacitor Cst is connected to a power line and one electrode of the switching thin-film transistor and includes a storage first electrode 1540, a storage second electrode 1740 and a storage third electrode 1960. As shown in FIG. 3, the gate insulating film 1600 and the inter-layer insulating film 1800 are interposed between the storage first electrode 1540 and the storage second electrode 1740, and between the storage second electrode 1740 and the storage third electrode 1960, respectively.

The substrate 1100 may be made of a flexible material such as polyimide, or may be made of rigid material such as glass.

A multi-buffer layer 1200 made of an insulating material such as silicon oxide or silicon nitride is formed on the entire surface over an entire face of the substrate 1100. The multi-buffer layer 1200 is embodied as a stack of multiple layers, for example, 7 or 8 layers.

A light-blocking layer 1300 is formed on the multi-buffer layer 1200, is made of molybdenum titanium alloy (MoTi) in one example. The light-blocking layer 1300 prevents light from being incident on the active layer 1520, thereby preventing the active layer 1520 from being deteriorated by light. An insulating film 1400 made of an insulating material such as silicon oxide or silicon nitride is formed on the light-blocking layer 1300 over an entire face of the substrate 1100. Alternatively, a contact hole may be formed to connect the active layer 1520 to the light-blocking layer 1300. In order to minimize change in a threshold voltage of the thin film transistor, which may occur when the light-blocking layer 1300 is in a floating state, the light-blocking layer 1300 may be electrically connected to the active layer 1520. The insulating film 1400 may be formed of a single layer.

The active layer 1520 embodied as a semiconductor film is formed on the insulating film 1400. The semiconductor film may be made of an oxide semiconductor material, or a single crystal silicon. Alternatively, the active layer 1520 may be made of polycrystalline silicon. In this case, the active layer 1520 may be doped with impurities into both edges thereof.

The storage first electrode 1540 is formed together with the active layer 1520 on the insulating film 1400. In this connection, the storage first electrode 1540 may be made of polycrystalline silicon in the same manner as the active layer 1520. The storage first electrode 1540 made of polycrystalline silicon is doped with impurities to have conductance.

A gate insulating film 1600 is formed on the insulating film 1400 so that the active layer 1520 and the storage first electrode 1540 are covered with the gate insulating film 1600. The gate insulating film 1600 is formed over an entire face of the substrate 1100. The gate insulating film 1600, for example, may be made of silicon oxide.

A gate electrode 1720 and a storage second electrode 1740 may be formed on the gate insulating film 1600. The gate electrode 1720 and the storage second electrode 1740 overlap the active layer 1520 and the storage first electrode 1540 respectively. Each of the gate electrode 1720 and the storage second electrode 1740 may be formed of a stack of double metal layers, a first layer made of Cu and a second layer made of MoTi alloy.

An inter-layer insulating film 1800 of insulating material is formed on an entire face of the gate insulating film 1600 to cover the gate electrode 1720 and the storage second electrode 1740. The inter-layer insulating film 1800 may be made of an inorganic insulating material such as silicon oxide or silicon nitride, or made of an organic insulating material such benzocyclobutene or photo-acryl.

As shown in FIG. 3, the gate insulating film 1600 and the inter-layer insulating film 1800 have two active layer contact holes defined therein for exposing both sides of the active layer 1520. The two active layer contact holes are respectively located to be spaced from both sides of the gate electrode 1720.

On the inter-layer insulating film 1800, a source electrode 1920 and a drain electrode 1940 made of a conductive material such as a metal are formed. The source electrode 1920 and the drain electrode 1940 are disposed around the gate electrode 1720 and are spaced from each other. The source electrode 1920 and the drain electrode 1940 are electrically connected to both sides of the active layer 1520 via the two active layer contact holes as described above respectively. The source electrode 1920 is connected to the power line (not shown).

Further, on the inter-layer insulating film 1800, a storage third electrode 1960 defining the storage capacitor Cst and made of a conductive material such as a metal together is formed together with the source electrode 1920 and the drain electrode 1940.

The active layer 1520, the gate electrode 1720, the source electrode 1920, and the drain electrode 1940 constitute the drive thin-film transistor TFT. The drive thin-film transistor TFT has a coplanar structure in which the gate electrode 1720, the source electrode 1920 and the drain electrode 1940 are positioned above the active layer 1520.

Alternatively, the drive thin-film transistor TFT may have an inverted staggered structure where the gate electrode is positioned below the active layer, while the source and drain electrodes are positioned above the active layer. In this case, the active layer may be made of amorphous silicon. In one example, the switching thin-film transistor (not shown) may have substantially the same structure as the drive thin-film transistor TFT.

A planarization layer 2000 having a drain contact-hole defined therein for exposing the drain electrode 1940 of the driving thin-film transistor TFT is formed to cover the drive thin-film transistor TFT and the storage capacitor Cst. The planarization layer 2000 may be made of an inorganic insulating material or an organic insulating material.

A first electrode 3100 is formed on the planarization layer 2000 such that the first electrode 3100 is connected to the drain electrode 1940 of the drive thin-film transistor TFT via the drain contact-hole defined in the planarization layer 2000. Accordingly, the active layer 1520 of the drive thin-film transistor TFT is electrically connected to the first electrode 3100.

The first electrode 3100 may act as an anode, and may be made of a conductive material having a relatively large work function value. For example, the first electrode 3100 may be made of transparent conductive material such as ITO, IZO or ZnO.

In one example, when the organic light-emitting display device 1000 is of a top emission type, a reflective electrode or reflective layer may be further formed below the first electrode 3100. For example, the reflective electrode or reflective layer may be made of any one of aluminum (Al), silver (Ag), nickel (Ni), aluminum-palladium-copper (APC alloy).

A bank layer 2100 is formed on the planarization layer 2000 to define each pixel region. The bank layer 2100 may allow a bank hole corresponding to each pixel region to be defined to partially expose the first electrode 3100.

An organic material layer 3300 is formed on the bank layer 2100 and a portion of the first electrode 3100 exposed by the bank hole. A portion of the organic material layer 3300 that is in contact with the first electrode 3100 corresponds to each pixel region, and more specifically to a light-emission region.

A second electrode 3200 is formed on the organic material layer 3300 over an entire face of the substrate 1100. The second electrode 3200 is positioned on an entirety of the expression region and may be made of a conductive material having a relatively small work function value and thus may act as a cathode. For example, the second electrode 3200 may be made of any one of aluminum Al, magnesium Mg, and aluminum-magnesium alloy AlMg.

The first electrode 3100, organic material layer 3300 and second electrode 3200 constitute the organic electroluminescent device 3000.

The encapsulating layer 2200 is formed on the organic electroluminescent device 3000 to prevent external moisture from penetrating the organic electroluminescent device 3000.

The encapsulating layer 2200 may have, but is not limited to, a triple layer structure (not shown) sequentially composed of a first inorganic layer, and an organic layer, and a second inorganic layer.

On top of the encapsulating layer 2200, a barrier layer 2300 may be formed to more effectively prevent external moisture or oxygen from invading the organic electroluminescent device 3000.

The barrier layer 2300 may be manufactured in a form of a film and adhered to the encapsulating layer 2200 via an adhesive.

Hereinafter, Present Examples and Comparative examples will be set forth. The Present Examples may be only an example of the present disclosure. Thus, the present disclosure is not limited to the Present Examples.

PRESENT EXAMPLES

Hereinafter, compounds used in Present Examples and Comparative Examples were synthesized as follows.

Synthesis Example 1-1: Production of Compound 1-151

1-1A) Production of Intermediate 1-1A

[Reaction Formula 1]

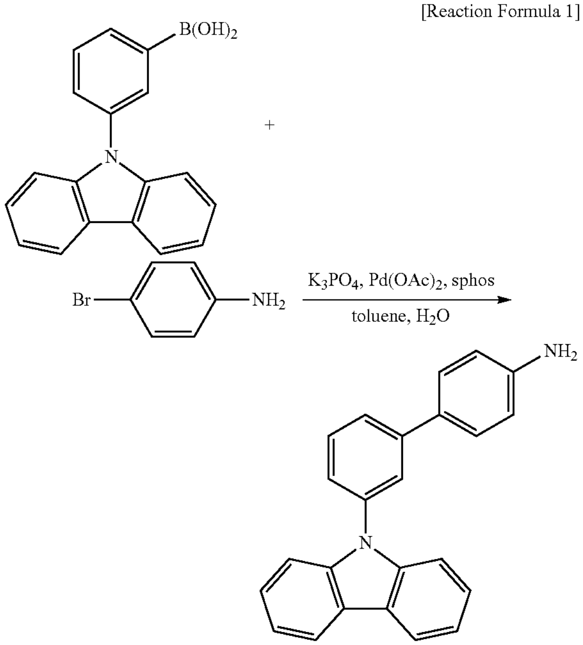

(3-(9H-carbazol-9-yl)phenyl)boronic acid (50.0 g, 174.1 mmol), 4-bromoaniline (32.95 g, 191.6 mmol), tripotassium phosphate (92.41 g, 435.3 mmol), palladium (II) acetate (1.17 g, 5.22 mmol), 2-dicyclohexylphosphino-2',6'-dimethoxybiphenyl (sphos, 4.29 g, 10.45 mmol), toluene (500 mL), and $H_2O$ (50 mL) were added into a 1000 mL flask under a stream of nitrogen. and refluxed while stirring. After completion of reaction, a toluene layer was extracted therefrom with toluene and water. The extracted solution was treated with $MgSO_4$ to remove residual moisture, was concentrated under reduced pressure, and was purified using column chromatography, thereby to obtain 38.49 g of an intermediate 1-1A in 66.1% yield.

1-1B) Production of Intermediate 1-1B

[Reaction Formula 2]

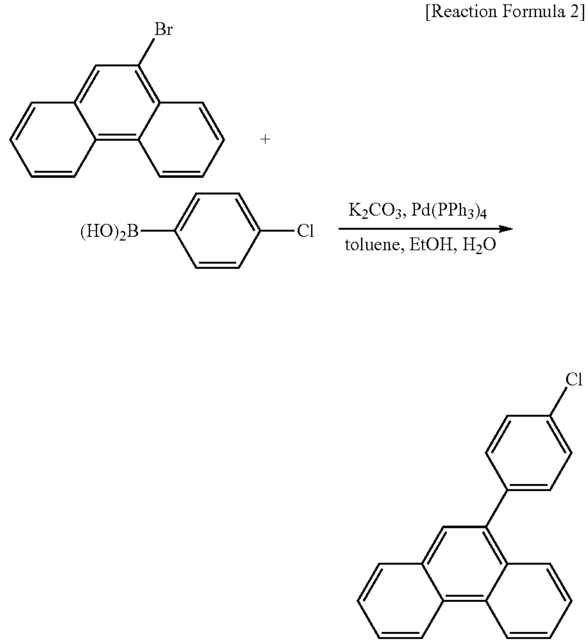

9-bromophenanthrene (40.0 g, 155.6 mmol), (4-chlorophenyl)boronic acid (26.76 g, 171.1 mmol), potassium carbonate (43.0 g, 311.1 mmol), tetrakis(triphenylphosphine) palladium (0) (5.39 g, 4.67 mmol), toluene (300 mL), EtOH (100 mL), and $H_2O$ (100 mL) were added into a 1000 mL flask under a stream of nitrogen, and refluxed while stirring. After completion of reaction, a toluene layer was extracted therefrom with toluene and water. The extracted solution was treated with $MgSO_4$ to remove residual moisture, was concentrated under reduced pressure, and was purified using column chromatography, thereby to obtain 38.51 g of an intermediate 1-1B in 85.7% yield.

1-1C) Intermediate 1-1C Production

[Reaction Formula 3]

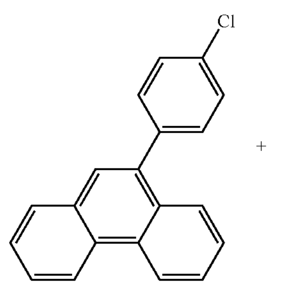

-continued

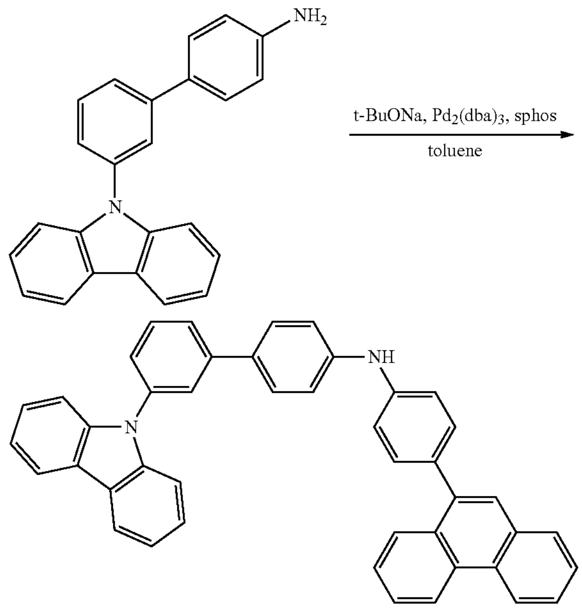

9-(4-chlorophenyl)phenanthrene (30.0 g, 103.9 mmol), 3'-(9H-carbazole-9-yl)-[1,1'-biphenyl]-4-amine (38.22 g, 114.3 mmol), sodium tert butoxide (19.97 g, 207.8 mmol), tris(dibenzylideneacetone)dipalladium (0) (1.90 g, 2.08 mmol), 2-dicyclohexylphosphino-2',6'-dimethoxybiphenyl (1.71 g, 4.16 mmol), and 300 mL of toluene were added into a 1000 mL flask under nitrogen stream and then refluxed while stirring. After completion of reaction, a toluene layer was extracted therefrom using 200 mL of water. The extracted solution was treated with $MgSO_4$ to remove residual moisture, was concentrated under reduced pressure, and was purified using a column chromatography method, and was recrystallized using dichloromethane/methanol to obtain 43.28 g of an intermediate 1-1C in 71.0% yield.

1-1D) Production of Compound 1-151

[Reaction Formula 4]

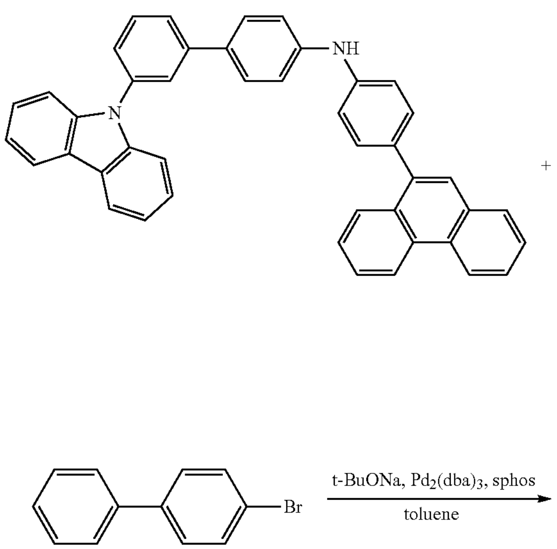

-continued

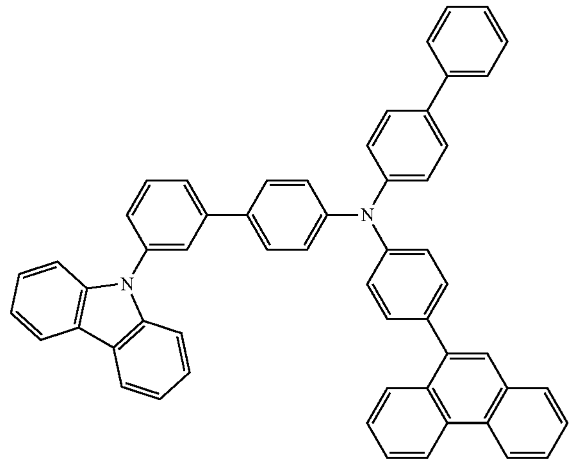

화합물 1-152

3'-(9H-carbazole-9-yl)-N-(4-(phenanthrene-9-yl)phenyl)-[1,1'-biphenyl]-4-amine (8.0 g, 13.63 mmol), 4-bromo-1,1'-biphenyl (3.50 g, 15.00 mmol), sodium tert butoxide (2.62 g, 27.27 mmol), tris(dibenzylideneacetone)dipalladium (0) (0.25 g, 0.27 mmol), 2-dicyclohexylphosphino-2',6'-dimethoxybiphenyl (0.22 g, 0.54 mmol), and 100 mL of toluene were added into a 250 mL flask under nitrogen stream and refluxed while stirring. After completion of reaction, a toluene layer was extracted therefrom using 50 mL of water. The extracted solution was treated with $MgSO_4$ to remove residual moisture, was concentrated under reduced pressure, and was purified using a column chromatography method, and was recrystallized using dichloromethane/methanol, thereby to obtain 5.60 g of a compound 1-151 in 55.6% yield.

MS (MALDI-TOF) m/z: 738 [M]+

Synthesis Example 1-2: Production of Compound 1-152

[Reaction Formula 5]

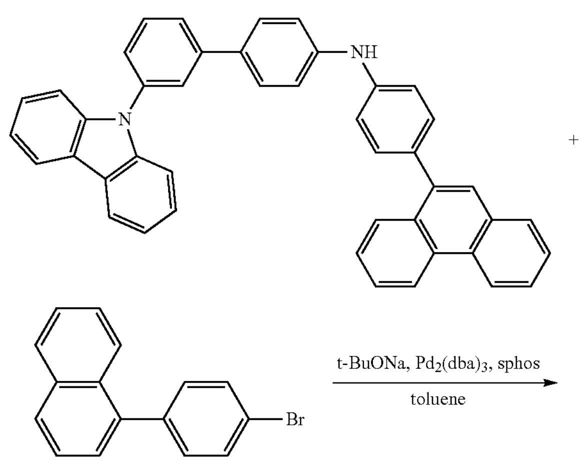

-continued

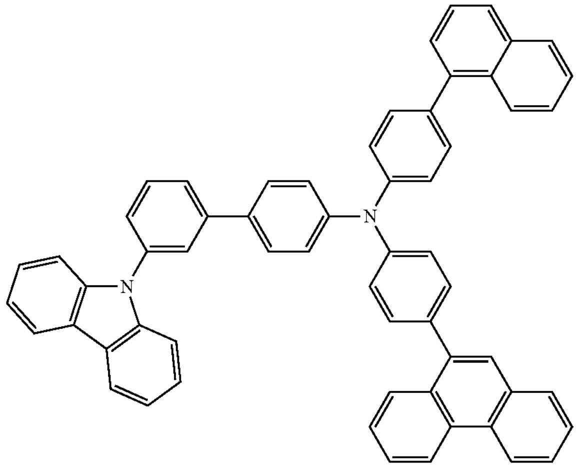

화합물 1-152

5.19 g of a compound 1-152 was obtained in a yield of 48.3% via synthesis and purification in the same manner as in the synthesis example 1-1D except that 1-(4-bromophenyl)naphthalene (4.25 g, 15.00 mmol) was used instead of 4-bromo-1,1'-biphenyl.

MS (MALDI-TOF) m/z: 788 [M]+

Synthesis Example 1-3: Production of Compound 1-153

[Reaction Formula 6]

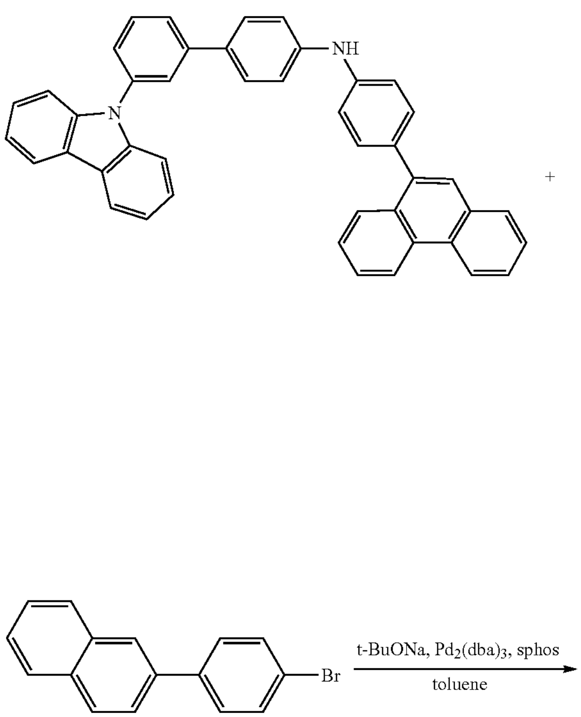

-continued

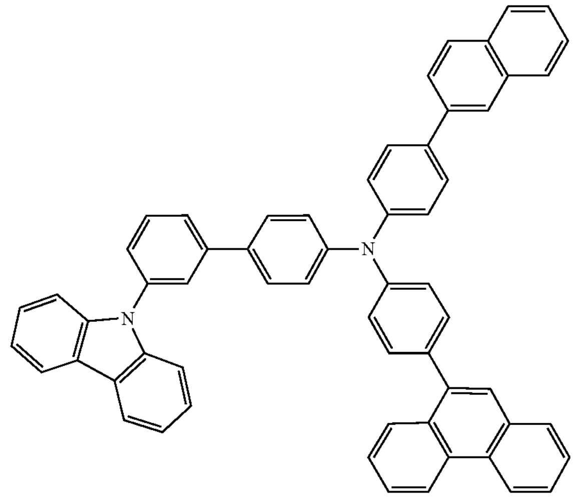

화합물 1-153

5.50 g of a compound 1-153 was obtained in 51.1% yield via synthesis and purification in the same manner as in the synthesis example 1-1D except that 2-(4-bromophenyl)naphthalene (4.25 g, 15.00 mmol) was used instead of 4-bromo-1,1'-biphenyl.

MS (MALDI-TOF) m/z: 788 [M]+

Synthesis Example 1-4: Production of Compound 1-154

[Reaction Formula 7]

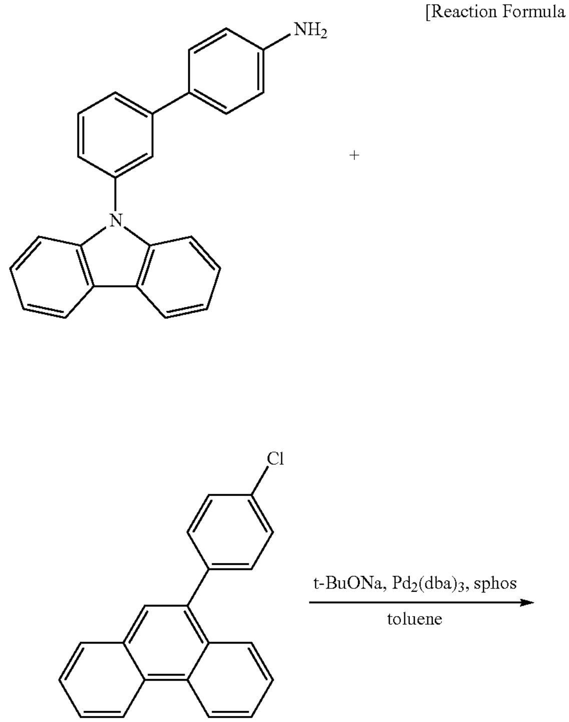

-continued

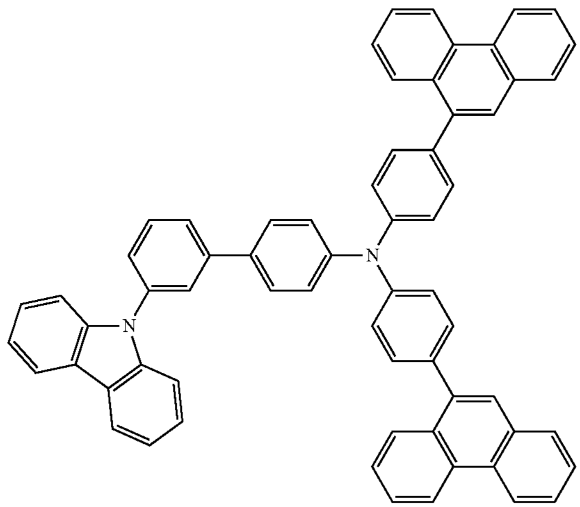

화합물 1-154

5.91 g of a compound 1-154 was obtained in 52.3% yield via synthesis and purification in the same manner as in the synthesis example 1-1D except that 3'-(9H-carbazole-9-yl)-[1,1'-biphenyl]-4-amine (4.5 g, 13.46 mmol) was used instead of 3'-(9H-carbazole-9-yl)-N-(4-(phenanthrene-9-yl) phenyl)-[1,1'-biphenyl]-4-amine, and 9-(4-chlorophenyl) phenanthrene (8.55 g, 29.60 mmol) was used instead of 4-bromo-1,1'-biphenyl (3.50 g, 15.00 mmol).

MS (MALDI-TOF) m/z: 838 [M]+

Synthesis Example 1-5: Production of Compound 1-207

[Reaction Formula 8]

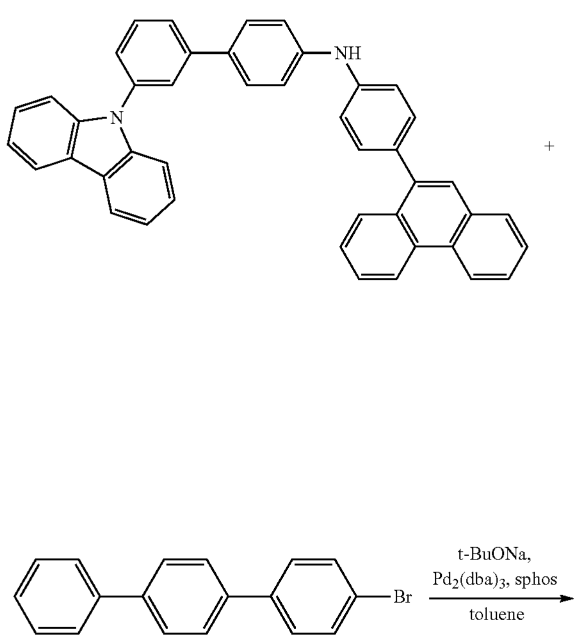

-continued

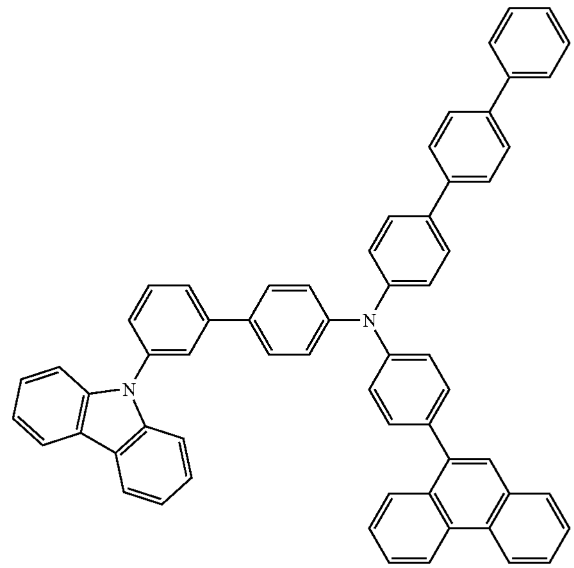

화합물 1-207

6.10 g of a compound 1-207 was obtained in 54.9% yield via synthesis and purification in the same manner as in the synthesis example 1-1D except that 4-bromo-1,1': 4',1"-terphenyl (4.64 g, 15.00 mmol) was used instead of 4-bromo-1,1'-biphenyl.

MS (MALDI-TOF) m/z: 814 [M]+

Synthesis Example 1-6: Production of Compound 1-201

[Reaction Formula 9]

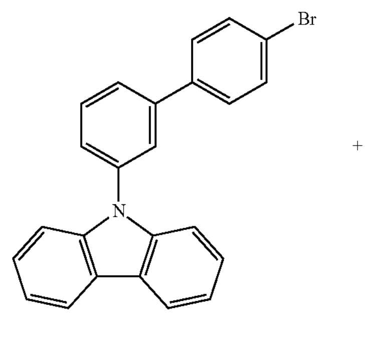

-continued

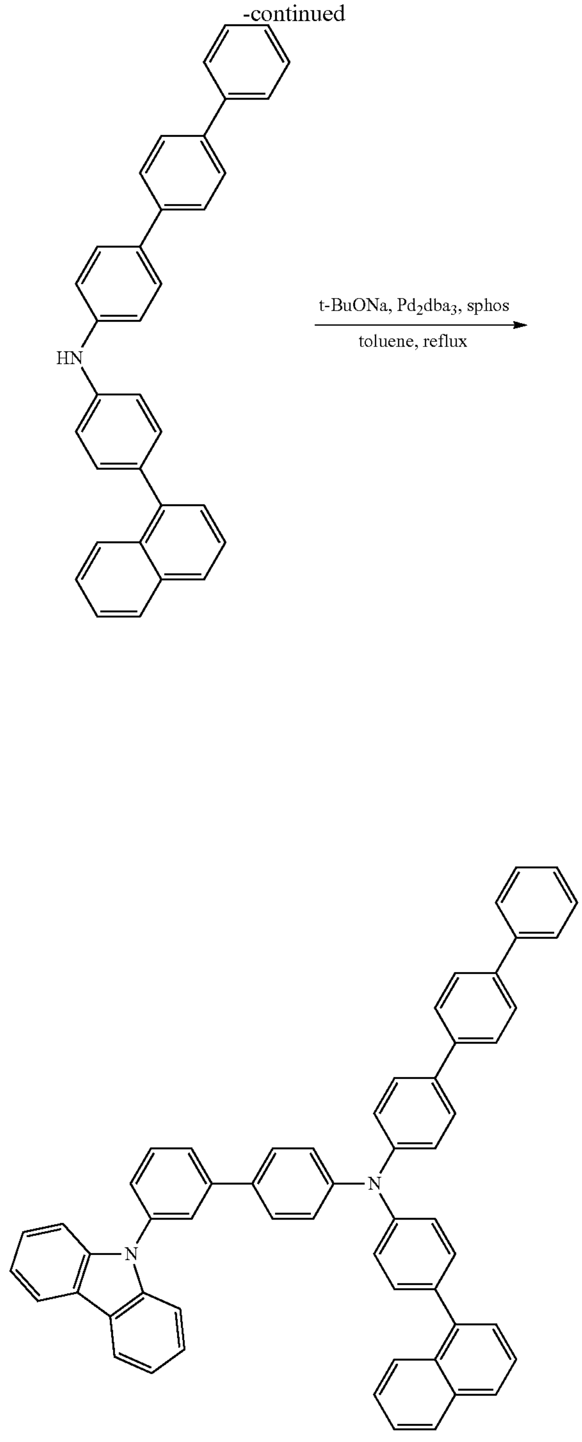

화합물 1-201

5.5 g of a compound 1-201 was obtained in 48% yield via synthesis and purification in the same manner as in the synthesis example 1-1D except that 9-4'-bromo-[1,1'-biphenyl]-3-yl)-9H-carbazole (6.57 g, 16.5 mmol) was used instead of 3'-(9H-carbazole-9-yl)-N-(4-(phenanthrene-9-yl)phenyl)-[1,1'-biphenyl]-4-amine, and N-(4-(naphthalen-1-yl)phenyl)-[1 1,1': 4',1"-terphenyl]-4-amine (6.71 g, 15.0 mmol) was used instead of 4-bromo-1,1'-biphenyl.

MS (MALDI-TOF) m/z: 764 [M]+

Synthesis Example 1-7: Production of Compound 1-155

1-7A) Production of Intermediate 1-7A

[Reaction Formula 10]

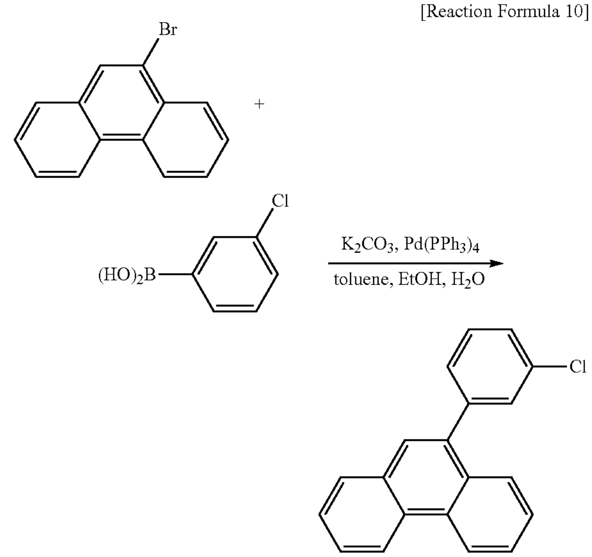

An intermediate 1-7A 32.53 g was obtain in 72.4% yield via synthesis and purification in the same manner as in the synthesis example 1-1B except that (3-chlorophenyl)boronic acid (26.76 g, 171.1 mmol) was used instead of (4-chlorophenyl)boronic acid.

1-7B) Production of Intermediate 1-7B

[Reaction Formula 11]

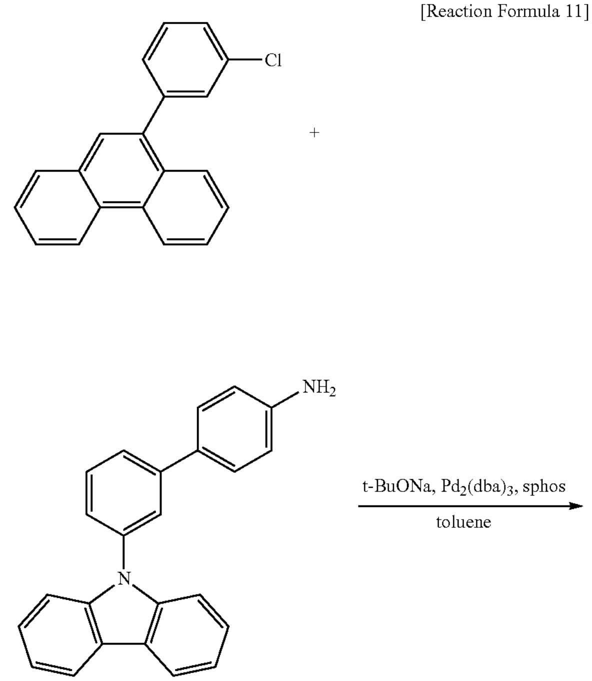

-continued

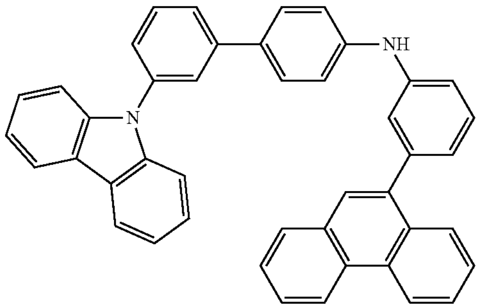

An intermediate 1-7B 36.82 g was obtain in 60.4% yield via synthesis and purification in the same manner as in the synthesis example 1-1C except that 9-(3-chlorophenyl) phenanthrene (30.0 g, 103.9 mmol) was used instead of 9-(4-chlorophenyl) phenanthrene.

1-7C) Production of Compound 1-155

[Reaction Formula 12]

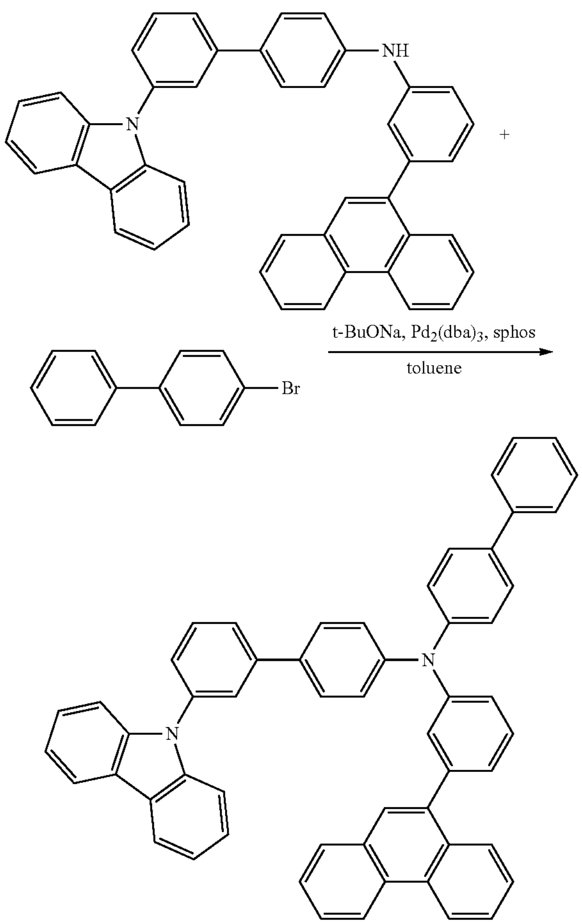

화합물 1-155

5.10 g of a compound 1-155 was obtained in 50.6% yield via synthesis and purification in the same manner as in the synthesis example 1-1D except that 3'-(9H-carbazole-9-yl)-N-(3-(phenanthrene-9-yl)phenyl)-[1,1'-biphenyl]-4-amine (8.0 g, 13.63 mmol) was used instead of 3'-(9H-carbazole-9-yl)-N-(4-(phenanthrene-9-yl)phenyl)-[1,1'-biphenyl]-4-amine.

MS (MALDI-TOF) m/z: 738 [M]+

Synthesis Example 1-8: Production of Compound 1-156

[Reaction Formula 13]

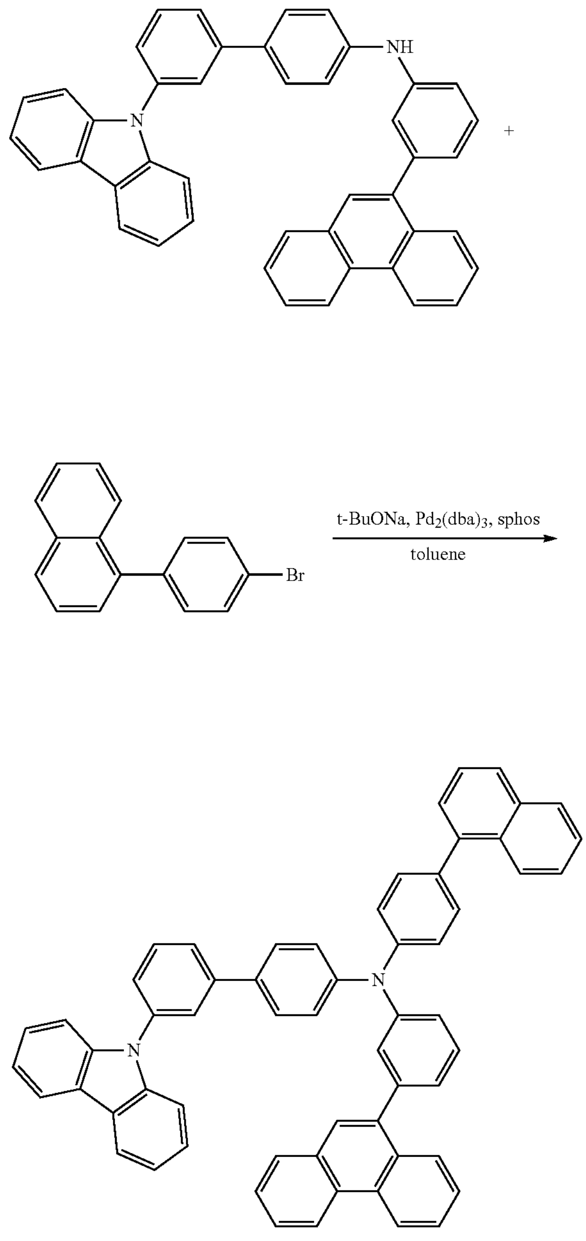

화합물 1-156

A compound 1-156 5.10 g was obtained in 47.4% yield via synthesis and purification in the same manner as in the synthesis example 1-1D except that 3'-(9H-(8.0 g, 13.63 mmol) and 1-(4-bromophenyl)naphthalene (4.25 g, 15.00 mmol) were used.

MS (MALDI-TOF) m/z: 788 [M]+

Synthesis Example 1-9: Production of Compound 1-158

[Reaction Formula 14]

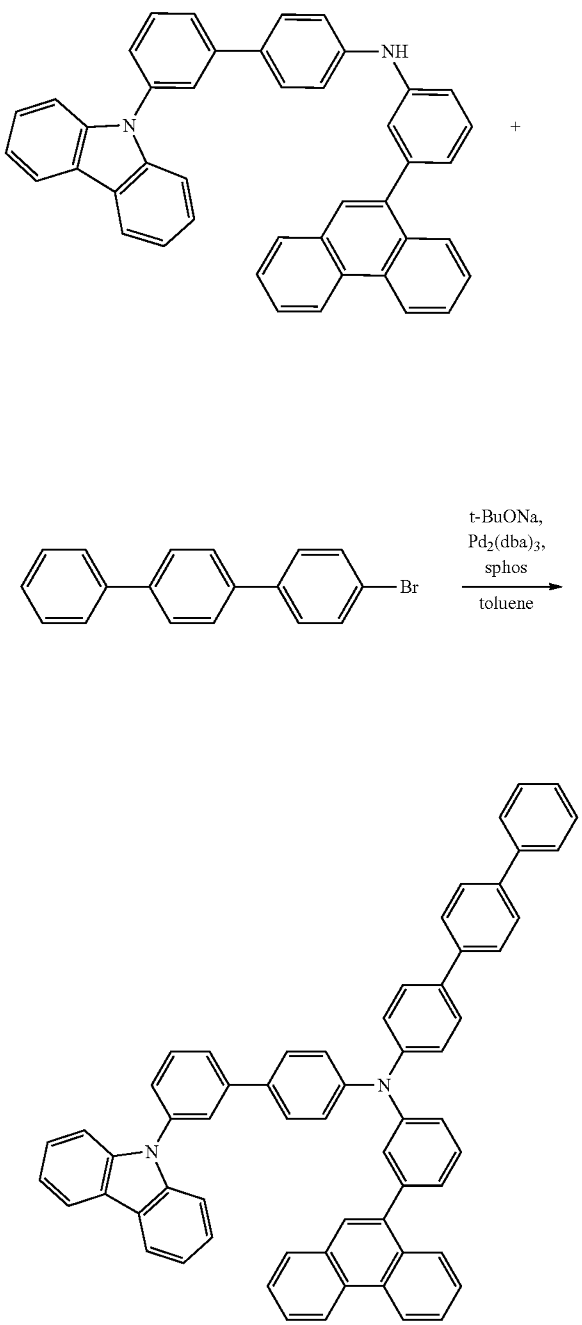

화합물 1-158

A compound 1-158 5.50 g was obtained in 49.5% yield via synthesis and purification in the same manner as in the synthesis example 1-1D except that 3'-(9H-carbazole-9-yl)-N-(3-(phenanthrene-9-yl)phenyl)-[1,1'-biphenyl]-4-amine (8.0 g, 13.63 mmol), and 4-bromo-1,1': 4',1"-terphenyl (4.64 g, 15.00 mmol) were used.

MS (MALDI-TOF) m/z: 814 [M]+

Synthesis Example 1-10: Production of Compound 1-9

1-10A) Production of Intermediate 1-10A

[Reaction Formula 15]

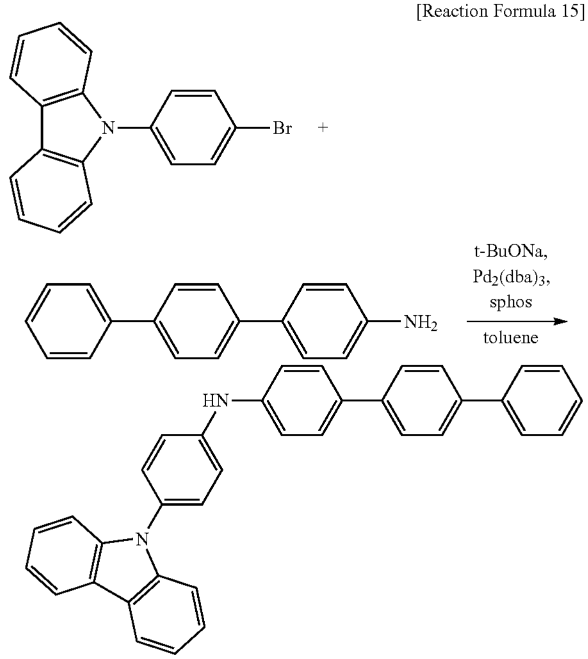

9-(4-bromophenyl)-9H-carbazole (50.0 g, 155.2 mmol), [1,1': 4',1"-terphenyl]-4-amine (41.88 g, 170.7 mmol), sodium tert butoxide (29.83 g, 310.4 mmol), tris(dibenzylideneacetone)dipalladium (0) (2.84 g, 3.10 mmol), 2-dicyclohexylphosphino-2',6'-dimethoxybiphenyl (2.55 g, 6.21 mmol), and 800 mL of toluene were added into a 2000 mL flask under nitrogen stream and refluxed while stirring. After completion of reaction, a toluene layer was extracted therefrom using 500 mL of water. The extracted solution was treated with $MgSO_4$ to remove residual moisture, was concentrated under reduced pressure, and purified using a column chromatography method, and was recrystallized using dichloromethane/heptane, thereby to obtain 57.10 g of an intermediate 1-10A in 75.6% yield.

1-10B) Production of Compound 1-9

[Reaction Formula 16]

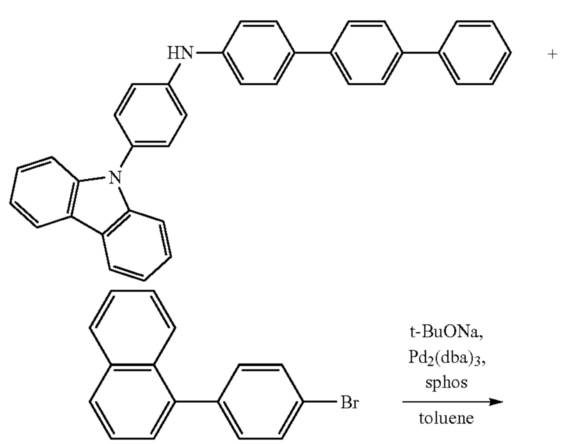

-continued

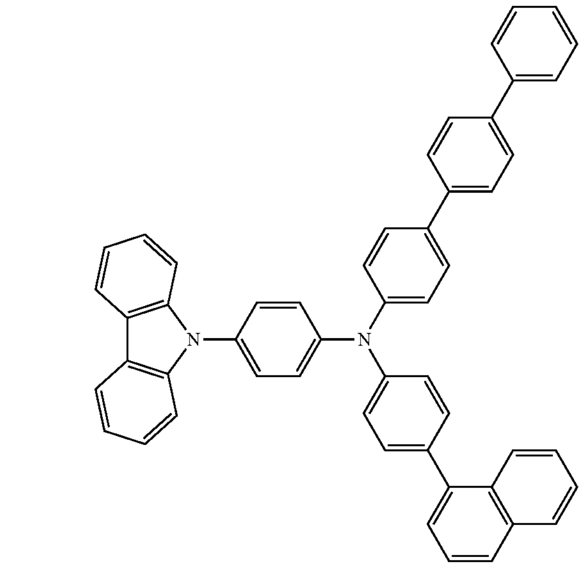

화합물 1-9

N-(4-(9H-carbazole-9-yl)phenyl)-[1,1': 4',1"-terphenyl]-4-amine (8.0 g, 16.44 mmol), 1-(4-bromophenyl)naphthalene (5.12 g, 18.08 mmol), sodium tert butoxide (3.16 g, 32.88 mmol), tris(dibenzylideneacetone)dipalladium (0) (0.30 g, 0.33 mmol), 2-dicyclohexylphosphino-2',6'-dimethoxybiphenyl (0.27 g, 0.66 mmol), and toluene 100 mL were added into a 250 mL flask under nitrogen stream and refluxed while stirring. After completion of reaction, a toluene layer was extracted therefrom using 50 mL of water. The extracted solution was treated with $MgSO_4$ to remove residual moisture, was concentrated under reduced pressure, and purified using a column chromatography method, and then was recrystallized using dichloromethane/heptane, thereby to obtain 6.85 g of a compound 1-9 in 60.5% yield.

MS (MALDI-TOF) m/z: 688 [M]+

Synthesis Example 1-11: Production of Compound 1-10

[Reaction Formula 17]

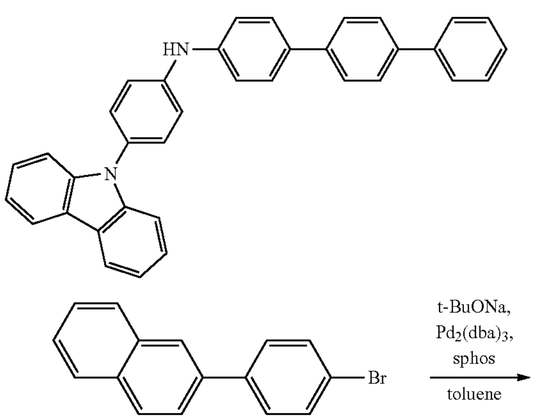

-continued

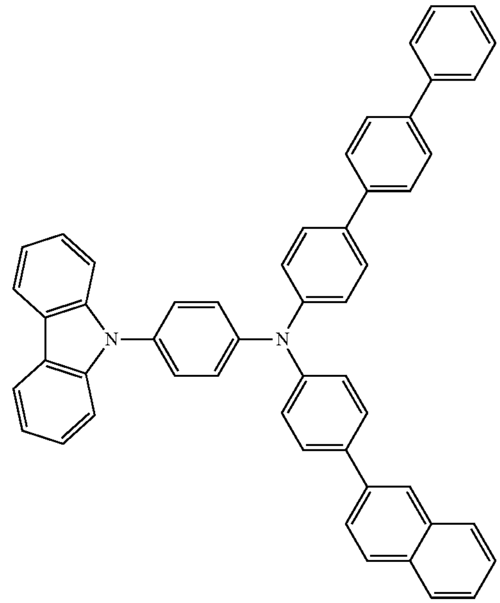

화합물 1-10

A compound 1-10 6.07 g was obtained in 53.6% yield via synthesis and purification in the same manner as in the production of the compound 1-9 except that 2-(4-bromophenyl)naphthalene (5.12 g, 18.08 mmol) was used instead of 1-(4-bromophenyl) naphthalene.

MS (MALDI-TOF) m/z: 688 [M]+

Synthesis Example 1-12: Production of Compound 1-25

[Reaction Formula 18]

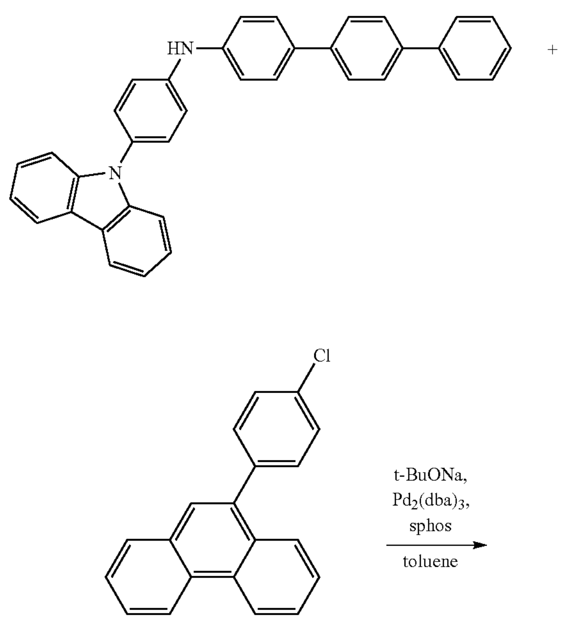

-continued

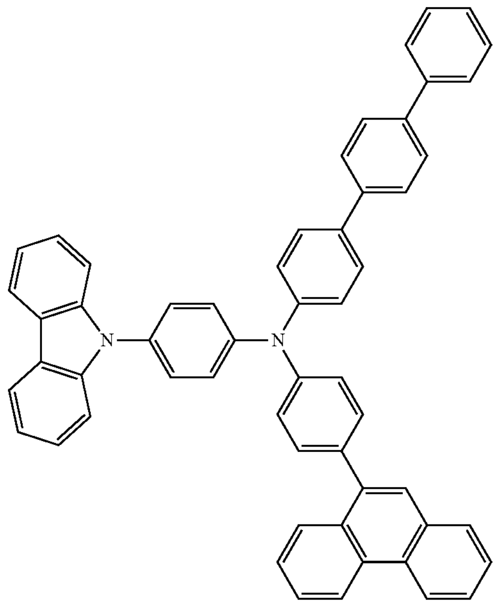

화합물 1-25

A compound 1-25 6.37 g was obtained in 52.4% yield via synthesis and purification in the same manner as in the Synthesis Example 1-10B except that 9-(4-chlorophenyl) phenanthrene (5.22 g, 18.08 mmol) was used instead of 1-(4-bromophenyl) naphthalene.

MS (MALDI-TOF) m/z: 738 [M]+

Synthesis Example 1-13: Production of Compound 1-12

1-13A) Production of Intermediate 1-13A

[Reaction Formula 19]

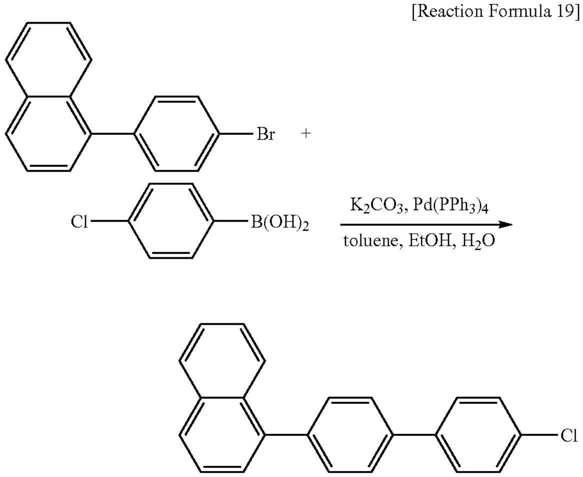

An intermediate 1-13A 39.82 g was obtained in 81.3% yield via synthesis and purification in the same manner as in the Synthesis Example 1-1B except that 1-(4-bromophenyl) naphthalene (44.06 g, 155.6 mmol) was used instead of 9-bromophenanthrene.

1-13B) Production of Compound 1-12

[Reaction Formula 20]

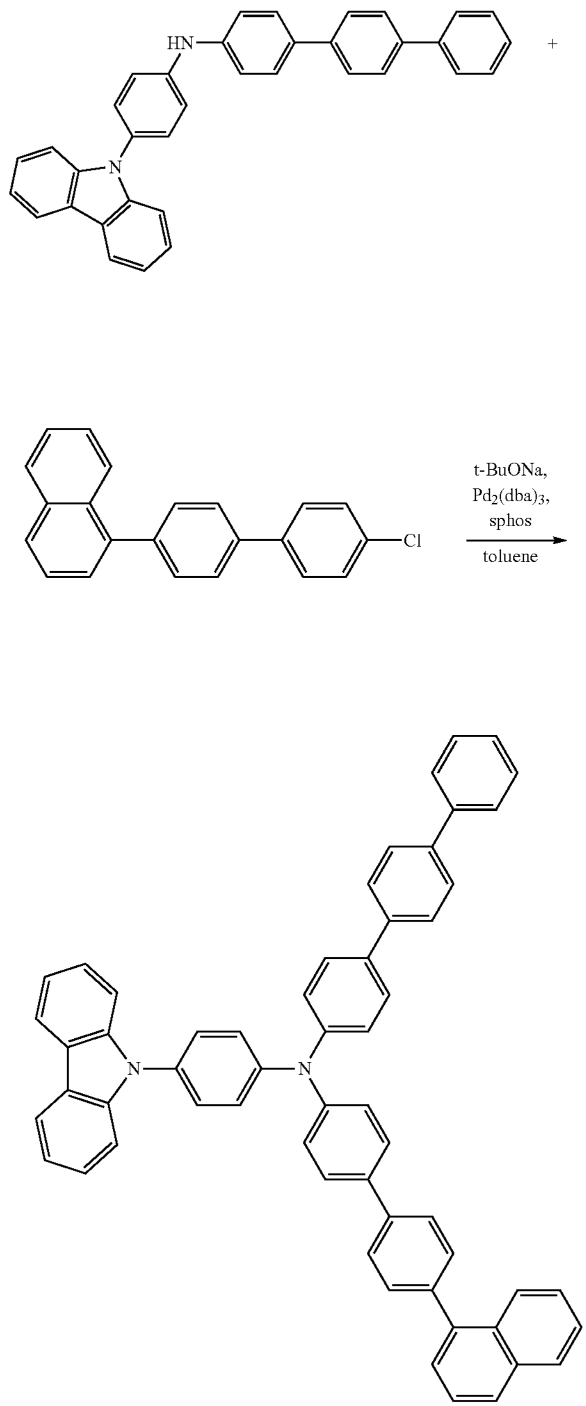

화합물 1-12

A compound 1-12 6.79 g was obtained in 54.0% yield via synthesis and purification in the same manner as in the Synthesis Example 1-10B except that 1-(4'-chloro-[1,1'-biphenyl]-4-yl)naphthalene (5.69 g, 18.08 mmol) was used instead of 1-(4-bromophenyl)naphthalene.

MS (MALDI-TOF) m/z: 764 [M]+

Synthesis Example 1-14: Production of Compound 1-19

1-14A) Production of Intermediate 1-14A

[Reaction Formula 21]

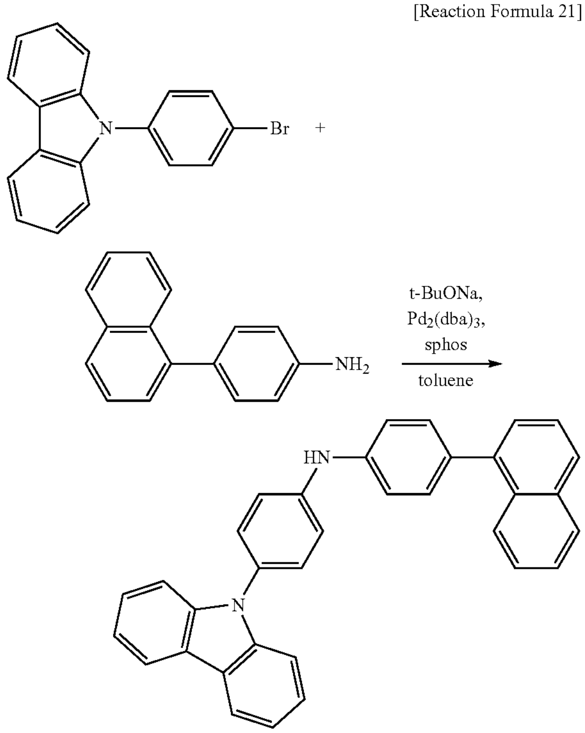

An intermediate 1-14A 45.11 g was obtained in 63.1% yield via synthesis and purification in the same manner as in the Synthesis Example 1-10A except that 4-(naphthalen-1-yl)aniline (37.43 g, 170.7 mmol) was used instead of [1,1':4',1''-terphenyl]-4-amine.

1-14B) Production of Compound 1-19

[Reaction Formula 22]

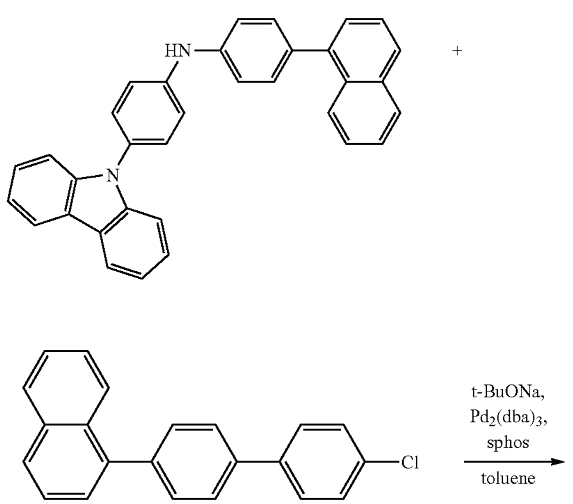

-continued

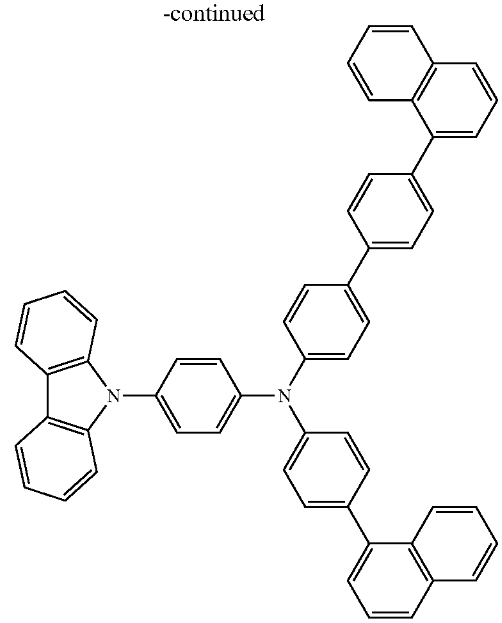

화합물 1-19

A compound 1-19 6.21 g was obtained in 55.3% yield via synthesis and purification in the same manner as in the Synthesis Example 1-10B except that N-(4-(9H-carbazol-9-yl) phenyl)-4-(naphthalen-1-yl)aniline (7.0 g, 15.20 mmol) and 1-(4'-chloro-[1,1'-biphenyl]-4-yl)naphthalene (5.26 g, 16.72 mmol) were used.

MS (MALDI-TOF) m/z: 738 [M]+

Synthesis Example 1-15: Production of Compound 1-20

1-15A) Production of Intermediate 1-15A

[Reaction Formula 23]

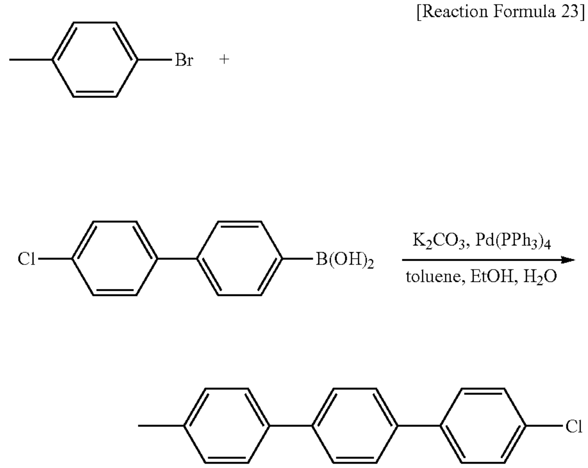

11.85 g of an intermediate 1-15A was obtained in 72.7% yield via synthesis and purification in the same manner as in the Synthesis Example 1-1B except that 1-bromo-4-methylbenzene (10.0 g, 58.47 mmol) and (4'-chloro-[1,1'-biphenyl]-4-yl)boronic acid (14.95 g, 64.31 mmol) were used.

1-15B) Production of Compound 1-20

[Reaction Formula 24]

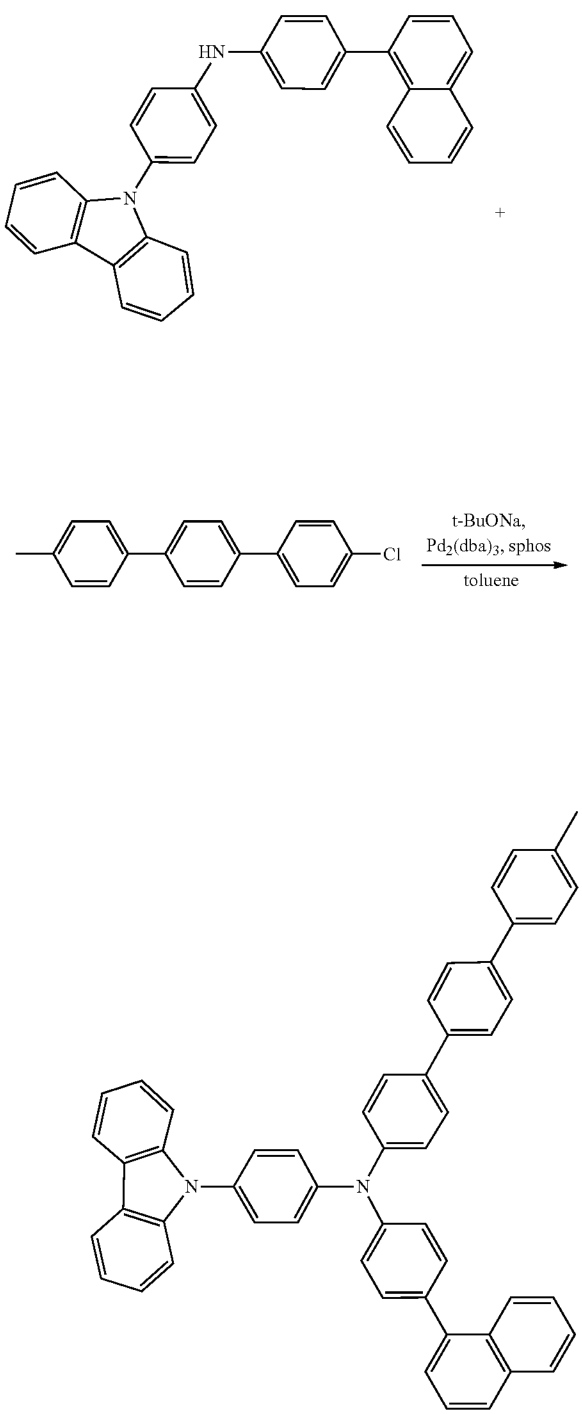

화합물 1-20

A compound 1-20 5.44 g was obtained in 50.9% yield via synthesis and purification in the same manner as in the Synthesis Example 1-10B except that N-(4-(9H-carbazol-9-yl) phenyl)-4-(naphthalen-1-yl)aniline (7.0 g, 15.20 mmol), and 4-chloro-4"-methyl-1,1': 4',1"-terphenyl (4.66 g, 16.72 mmol) were used.

MS (MALDI-TOF) m/z: 702 [M]+

Synthesis Example 1-16: Production of Compound 1-4

[Reaction Formula 25]

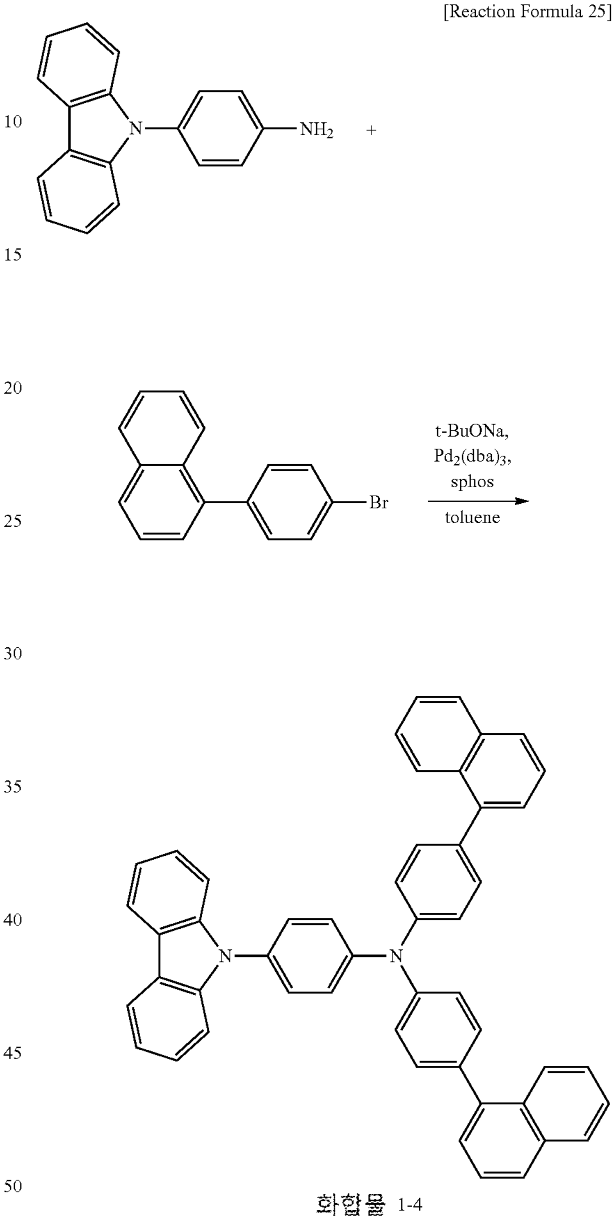

화합물 1-4

4-(9H-carbazol-9-yl)aniline (5.0 g, 19.36 mmol), 1-(4-bromophenyl)naphthalene (12.06 g, 42.58 mmol), sodium tert butoxide (7.44 g, 77.42 mmol), tris(dibenzylideneacetone)dipalladium (0) (0.71 g, 0.77 mmol), 2-dicyclohexylphosphino-2',6'-dimethoxybiphenyl (0.64 g, 1.55 mmol), and toluene 120 mL were added into a 250 mL flask under a stream of nitrogen and refluxed while stirring. After completion of reaction, a toluene layer was extracted therefrom using 80 mL of water. The extracted solution was treated with $MgSO_4$ to remove residual moisture, was concentrated under reduced pressure, and purified using a column chromatography method, and then was recrystallized using dichloromethane/heptane, thereby to obtain 6.94 g of a compound 1-4 in 54.1% yield.

MS (MALDI-TOF) m/z: 662 [M]+

Synthesis Example 1-17: Production of Compound 1-14

[Reaction Formula 26]

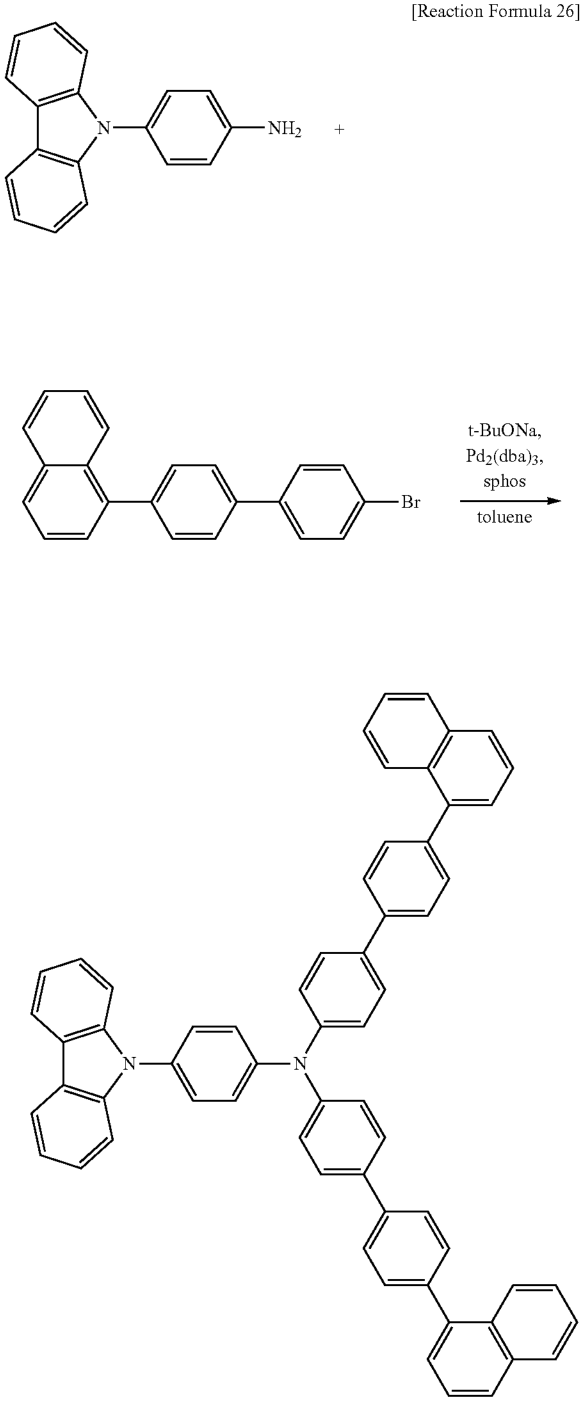

화합물 1-14

A compound 1-14 8.25 g was obtained in 52.3% yield via synthesis and purification in the same manner as in the Synthesis Example 1-16 except that 1-(4'-chloro-[1,1'-biphenyl]-4-yl)naphthalene (13.41 g, 42.58 mmol) was used instead of 1-(4-bromophenyl)naphthalene.

MS (MALDI-TOF) m/z: 814 [M]+

Synthesis Example 1-18: Production of Compound 1-24

[Reaction Formula 27]

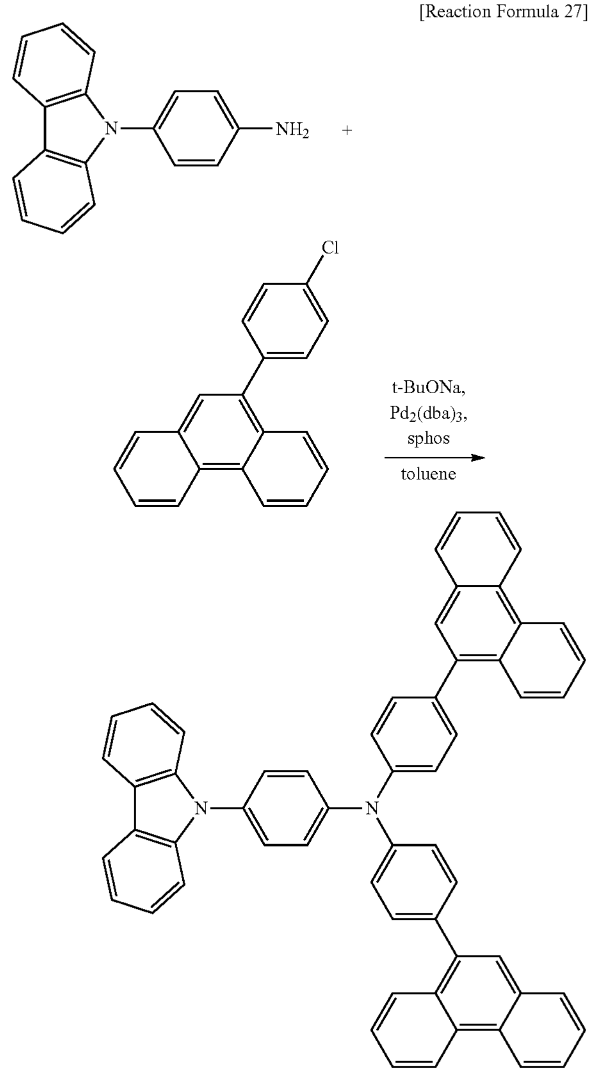

화합물 1-24

A compound 1-24 8.25 g was obtained in 52.3% yield via synthesis and purification in the same manner as in the Synthesis Example 1-16 except that 9-(4-chlorophenyl)phenanthrene (12.30 g, 42.58 mmol) was used instead of 1-(4-bromophenyl)naphthalene.

MS (MALDI-TOF) m/z: 762 [M]+

Synthesis Example 1-19: Production of Compound 1-326

1-19A) Production of Intermediate 1-19A

[Reaction Formula 28]

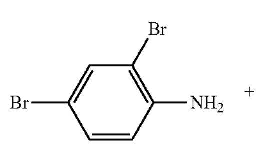

-continued

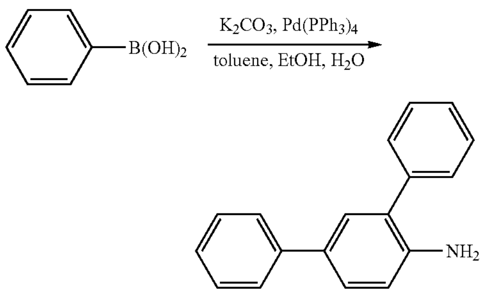

2,4-dibromoaniline (30.0 g, 119.6 mmol), phenylboronic acid (34.99 g, 286.9 mmol), potassium carbonate (66.10 g, 478.2 mmol), tetrakis(triphenylphosphine)palladium (0) (8.29 g, 4.67 mmol), toluene (300 mL), EtOH (100 mL), and $H_2O$ (100 mL) were added into a 1000 mL flask under a nitrogen stream and were refluxed while stirring. After completion of reaction, a toluene layer was extracted therefrom using toluene and water. The extracted solution was treated with $MgSO_4$ to remove residual moisture, was concentrated under reduced pressure, and purified using column chromatography, thereby to obtain 21.94 g of an intermediate 1-19A in 74.8% yield.

1-19B) Production of Intermediate 1-19B

[Reaction Formula 29]

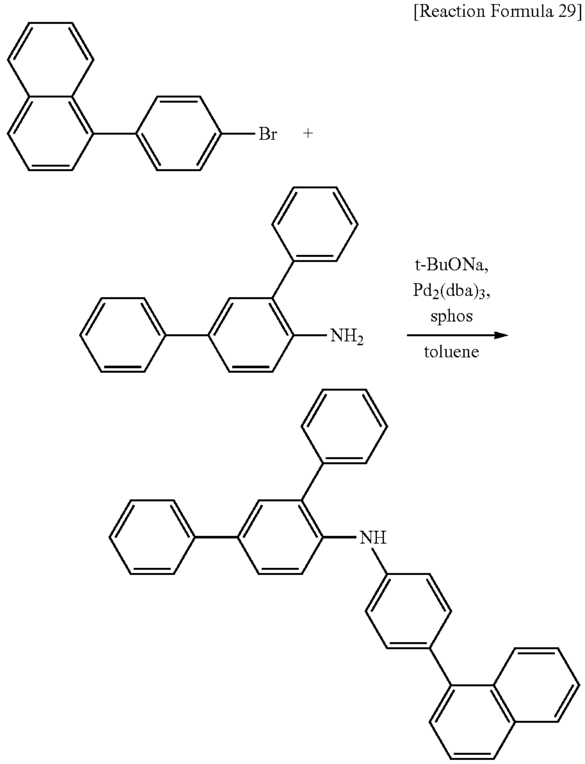

An intermediate 1-19B 16.55 g was obtained in 69.8% yield via synthesis and purification in the same manner as in the Synthesis Example 1-10A except that 1-(4-bromophenyl)naphthalene (15.0 g, 52.97 mmol), and [1,1': 3', 1"-terphenyl]-4'-amine (14.30 g, 58.27 mmol) were used.

1-19C) Production of Compound 1-326

[Reaction Formula 30]

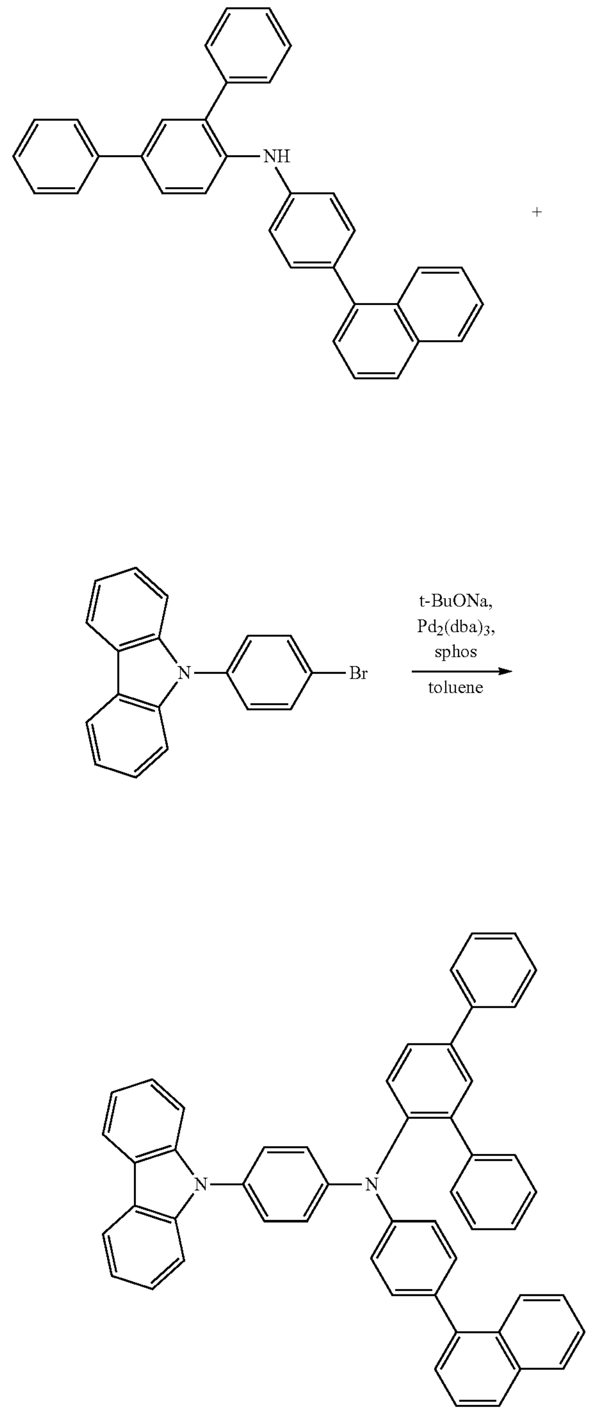

화합물 1-326

A compound 1-326 5.42 g was obtained in yield 50.3% via synthesis and purification in the same manner as in the Synthesis Example 1-10B except that N-(4-(naphthalen-1-yl) phenyl)-[1,1': 3', 1"-terphenyl]-4'-amine (7.0 g, 15.64 mmol), and 9-(4-bromophenyl)-9H-carbazole (5.54 g, 17.20 mmol) were used.

MS (MALDI-TOF) m/z: 688 [M]+

Synthesis Example 1-20: Compound 1-327 Production

-20A) Production of Intermediate 1-20A

[Reaction Formula 31]

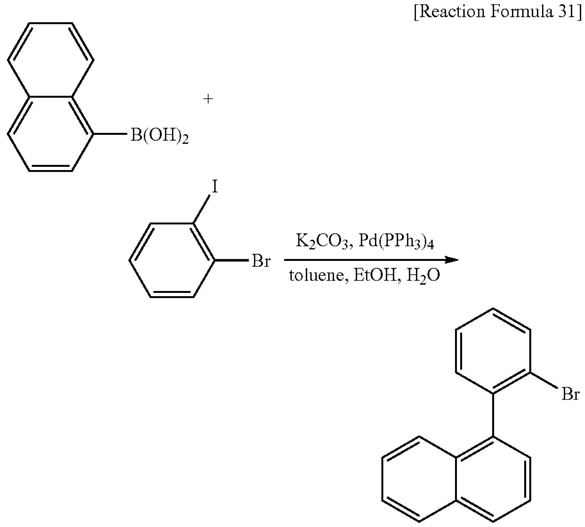

An intermediate 1-20A 15.31 g was obtained in 62.0% yield via synthesis and purification in the same manner as in the Synthesis Example 1-19A except that 1-naphthalene boronic acid (15.0 g, 87.21 mmol), and 1-bromo-2-iodobenzene (27.14 g, 95.94 mmol) were used.

1-20B) Production of Intermediate 1-20B

[Reaction Formula 32]

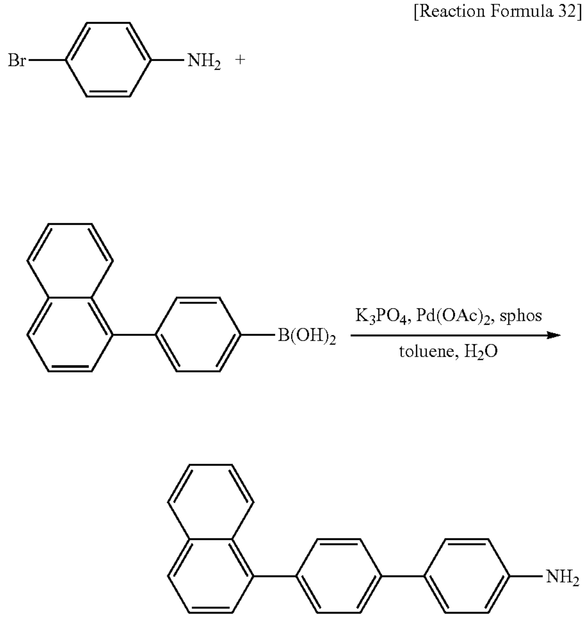

An intermediate 1-20B 17.90 g was obtained in 69.5% yield via synthesis and purification in the same manner as in the Synthesis Example 1-19A except that 4-bromoaniline (15.0 g, 87.19 mmol), and (4-(naphthalen-1-yl)phenyl)boronic acid (27.14 g, 95.91 mmol) were used.

1-20C) Intermediate 1-20C Production

[Reaction Formula 33]

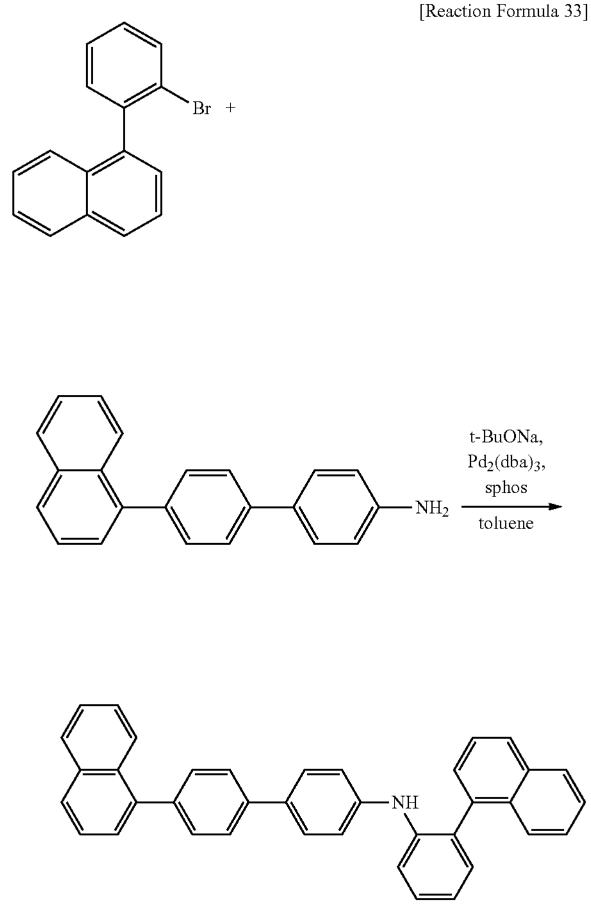

An intermediate 1-20C 12.58 g was obtained in 71.6% yield via synthesis and purification in the same manner as in the Synthesis Example 1-20B except that 1-(2-bromophenyl)naphthalene (10.0 g, 35.31 mmol) and 4'-(naphthalen-1-yl)-[1,1'-biphenyl]-4-amine (11.47 g, 38.85 mmol) were used.

1-20D) Production of Compound 1-327

[Reaction Formula 34]

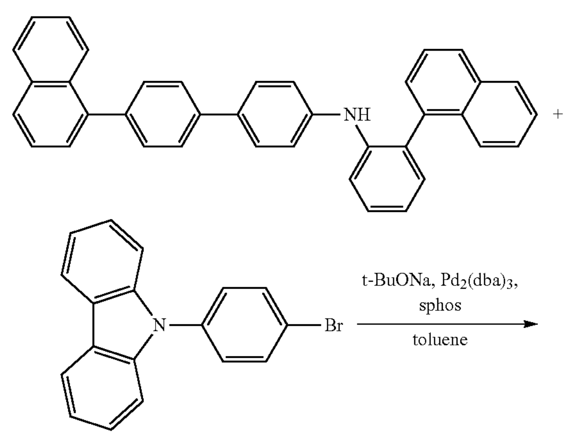

-continued

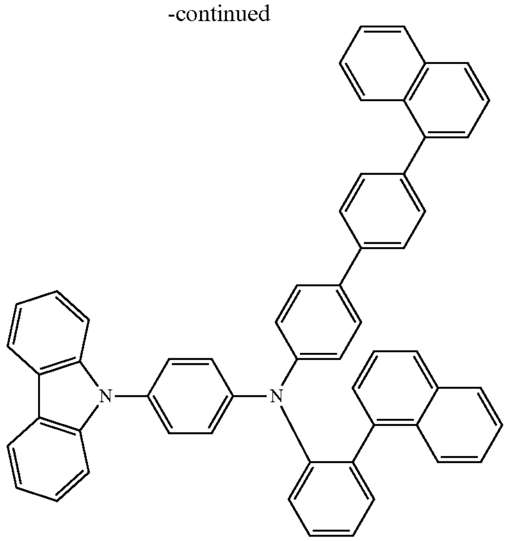

화합물 1-327

A compound 1-327 6.25 g was obtained in 52.6% yield via synthesis and purification in the same manner as in the Synthesis Example 1-10B except that 4'-(naphthalen-1-yl)-N-(2-(naphthalen-1-yl)phenyl)-[1,1'-biphenyl]-4-amine (8.0 g, 16.08 mmol), and 9-(4-bromophenyl)-9H-carbazole (5.70 g, 17.68 mmol) were used.

MS (MALDI-TOF) m/z: 738 [M]+

Synthesis Example 1-21: Production of Compound 1-328

1-21A) production of Intermediate 1-21A

[Reaction Scheme 35]

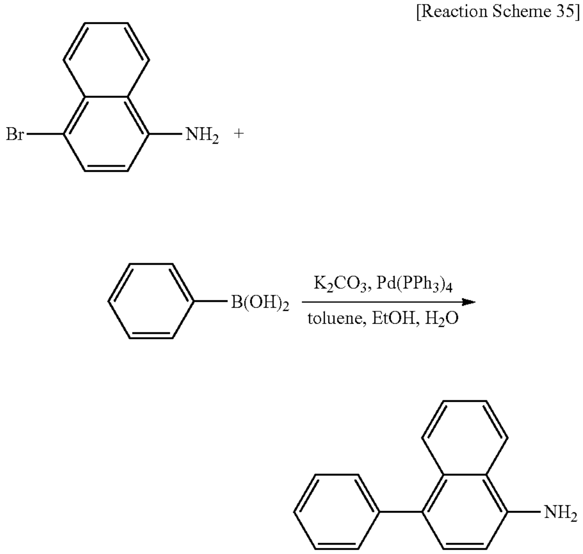

An intermediate 1-21A 13.35 g was obtained in 67.6% yield via synthesis and purification in the same manner as in the Synthesis Example 1-19A except that 4-bromonaphthalen-1-amine (20.0 g, 90.05 mmol) and phenylboronic acid (12.08 g, 99.06 mmol) were used.

1-21B) Production of Intermediate 1-21B

[Reaction Formula 36]

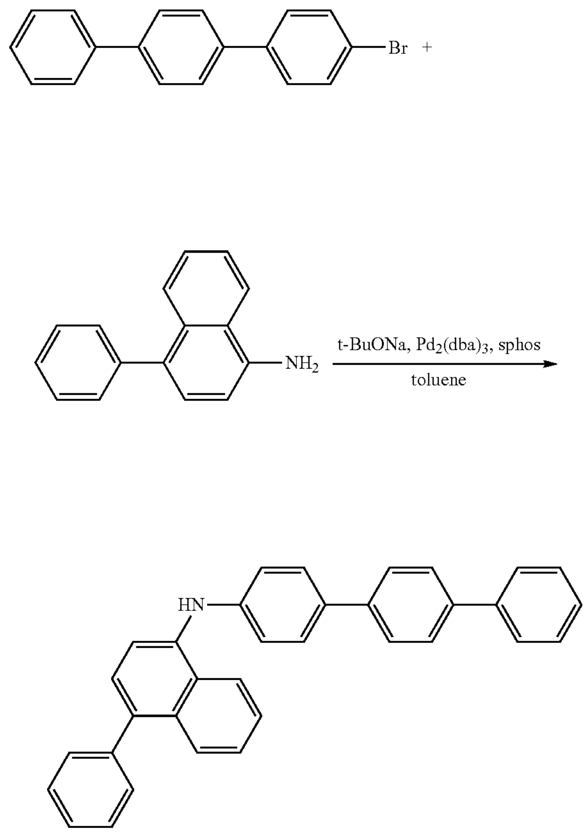

An intermediate 1-21B 10.16 g was obtained in 70.2% yield via synthesis and purification in the same manner as in the Synthesis Example 1-19A except that 4-bromo-1,1':4',1"-terphenyl (10.0 g, 32.34 mmol), and 4-phenylnaphthalen-1-amine (7.80 g, 35.57 mmol) were used.

1-21C) Production of Compound 1-328

[Reaction Formula 37]

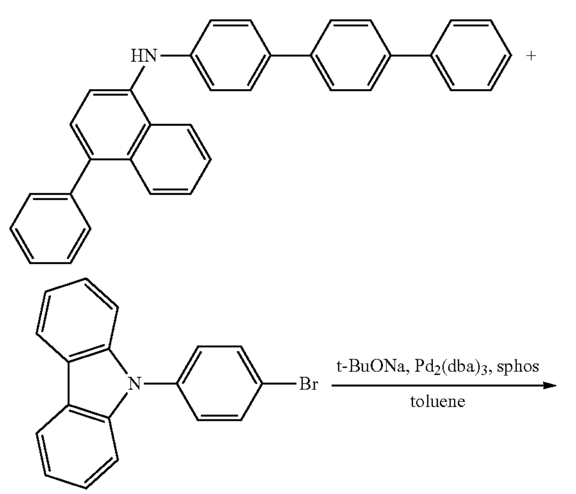

-continued

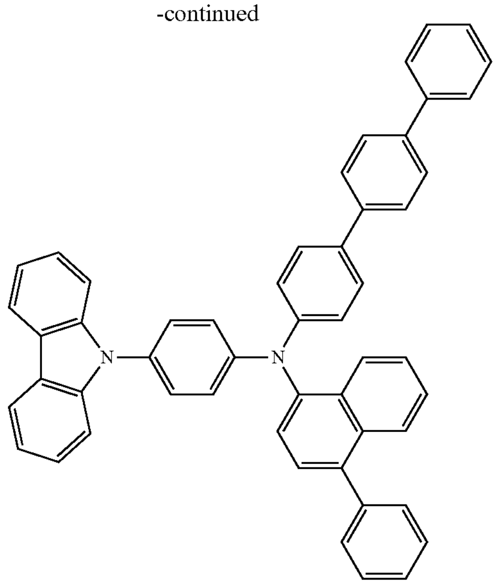

화합물 1-328

A compound 1-328 6.01 g was obtained in a yield of 55.8% via synthesis and purification in the same manner as in the Synthesis Example 1-10B except that N-([1,1': 4', 1"-terphenyl]-4-yl)-4-phenylnaphthalen-1-amine (7.0 g, 15.64 mmol), and 9-(4-bromophenyl)-9H-carbazole (5.54 g, 17.20 mmol) were used.

MS (MALDI-TOF) m/z: 688 [M]+

Synthesis Example 1-22: Production of Compound 1-146

1-22A) production of Intermediate 1-22A

[Reaction Formula 38]

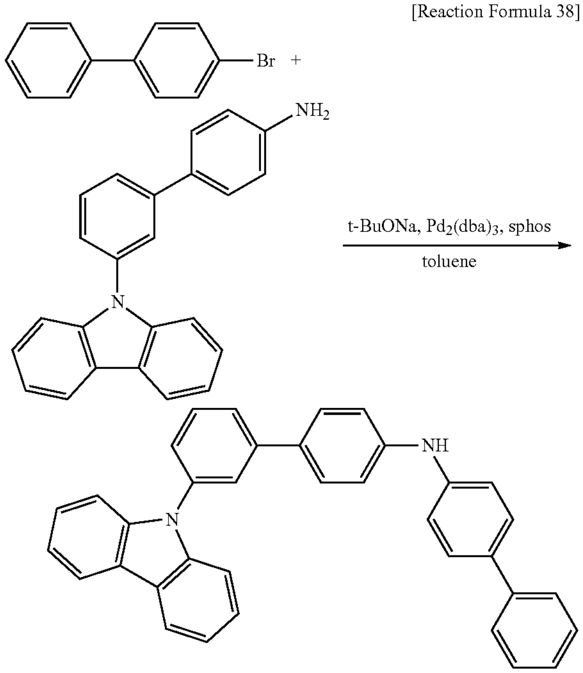

An intermediate 1-22A 13.43 g was obtained in 64.4% yield via synthesis and purification in the same manner as in the Synthesis Example 1-1C except that 4-bromo-1,1'-biphenyl (10.0 g, 42.90 mmol) was used instead of 9-(4-chlorophenyl)phenanthrene.

1-22B) Production of Compound 1-146

[Reaction Formula 39]

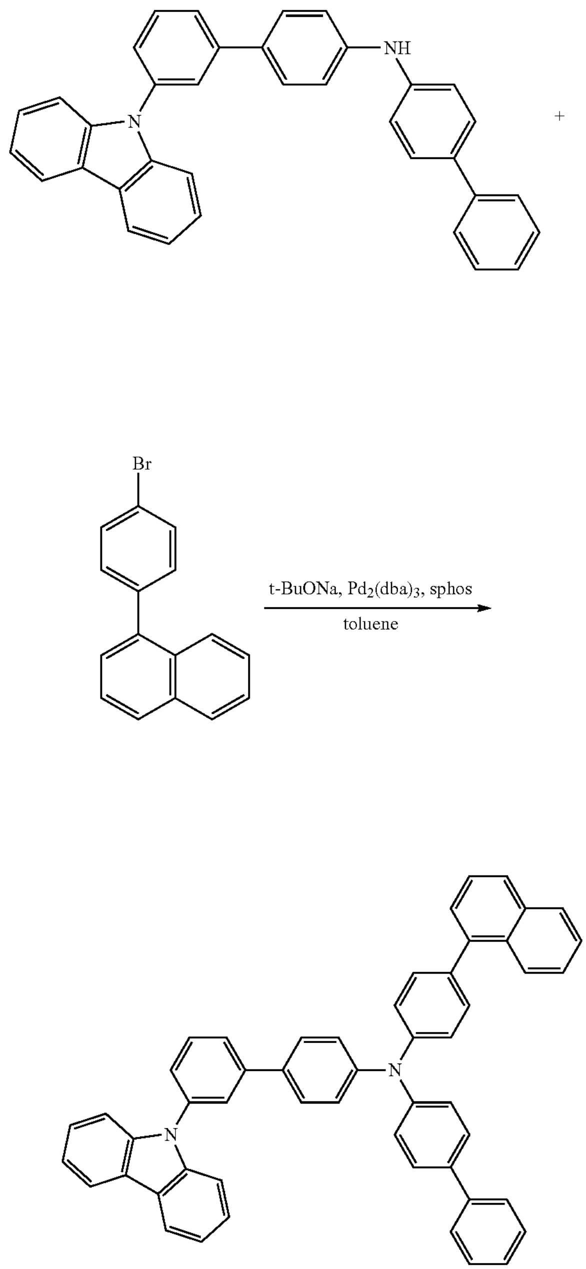

화합물1-146

A compound 1-146 5.61 g was obtained in 49.5% yield via synthesis and purification in the same manner as in the Synthesis Example 1-1D except that N-([1,1'-biphenyl]-4-yl)-3'-(9H-carbazole-9-yl)-[1,1'-biphenyl]-4-amine (8.0 g, 16.44 mmol), and 1-(4-bromophenyl)naphthalene (5.12 g, 18.08 mmol) were used.

MS (MALDI-TOF) m/z: 688 [M]+

Synthesis Example 1-23: Production of Compound 1-178

[Reaction Formula 40]

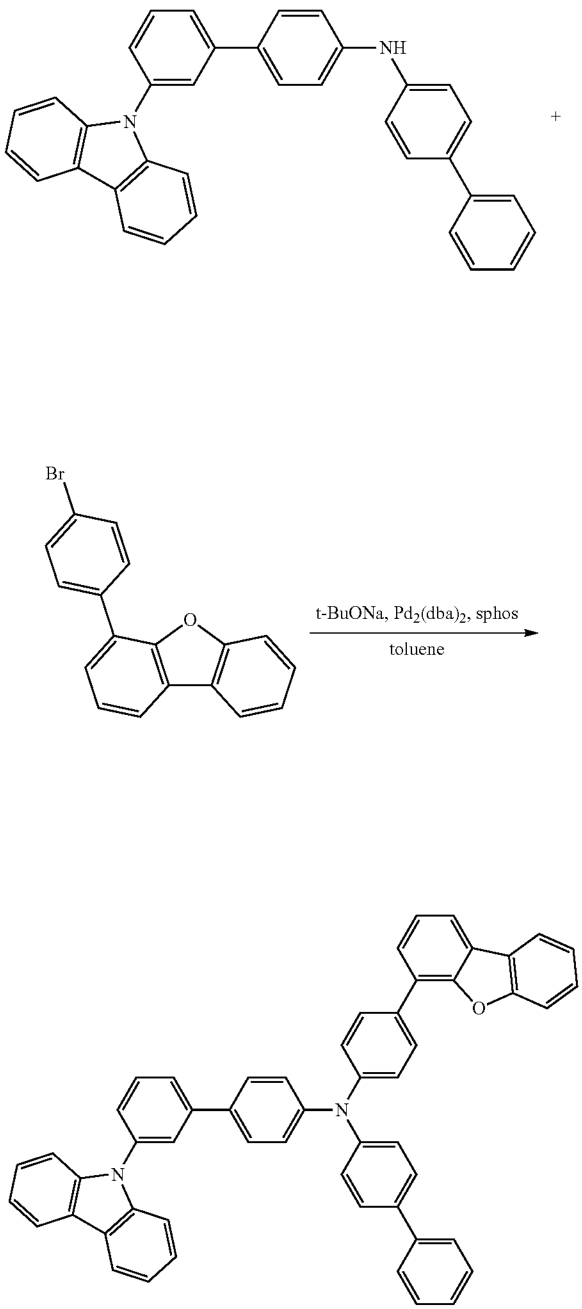

화합물 1-178

A compound 1-178 6.14 g was obtained in 51.2% yield via synthesis and purification in the same manner as in the Synthesis Example 1-1D except that N-([1,1'-biphenyl]-4-yl)-3'-(9H-carbazole-9-yl)-[1,1'-biphenyl]-4-amine (8.0 g, 16.44 mmol), and 4-(4-bromophenyl) dibenzofuran (5.84 g, 18.08 mmol) were used.

MS (MALDI-TOF) m/z: 728 [M]+

Synthesis Example 1-24: Production of Compound 1-39

[Reaction Formula 41]

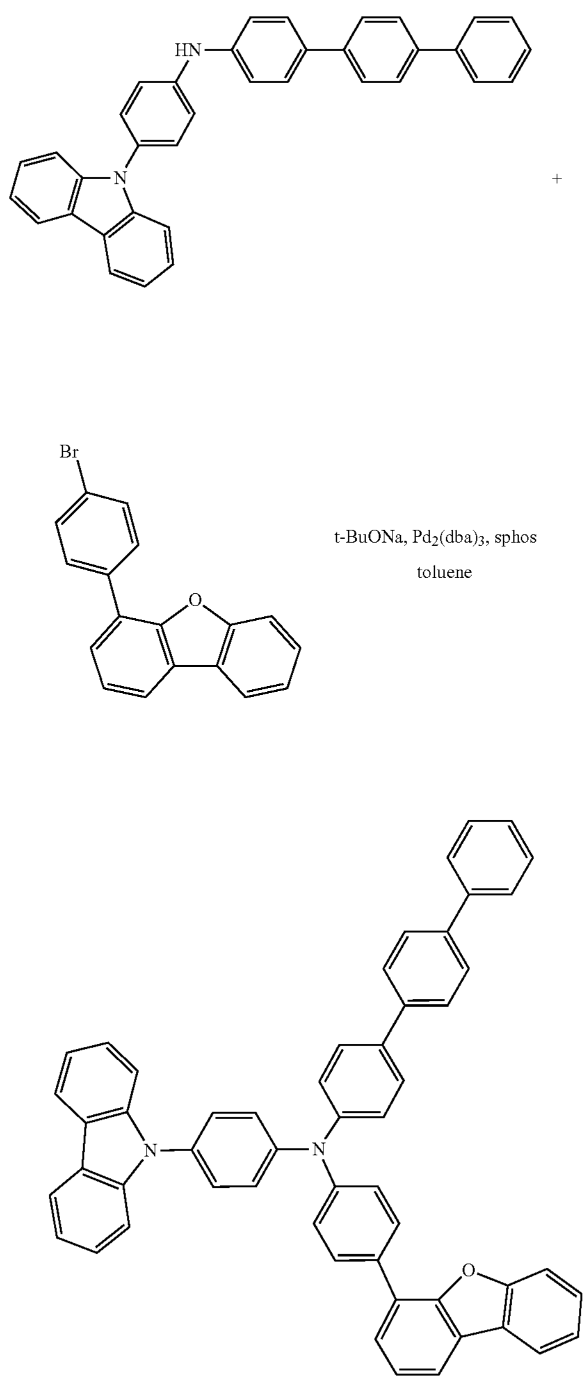

[illegible] 1-39

A compound 1-39 6.64 g was obtained in 55.4% yield via synthesis and purification in the same manner as in the Synthesis Example 1-10B except that 4-(4-bromophenyl) dibenzofuran (5.84 g, 18.08 mmol) was used instead of 1-(4-bromophenyl)naphthalene.

MS (MALDI-TOF) m/z: 728 [M]+

Synthesis Example 1-25: Production of Compound 1-82

[Reaction Formula 42]

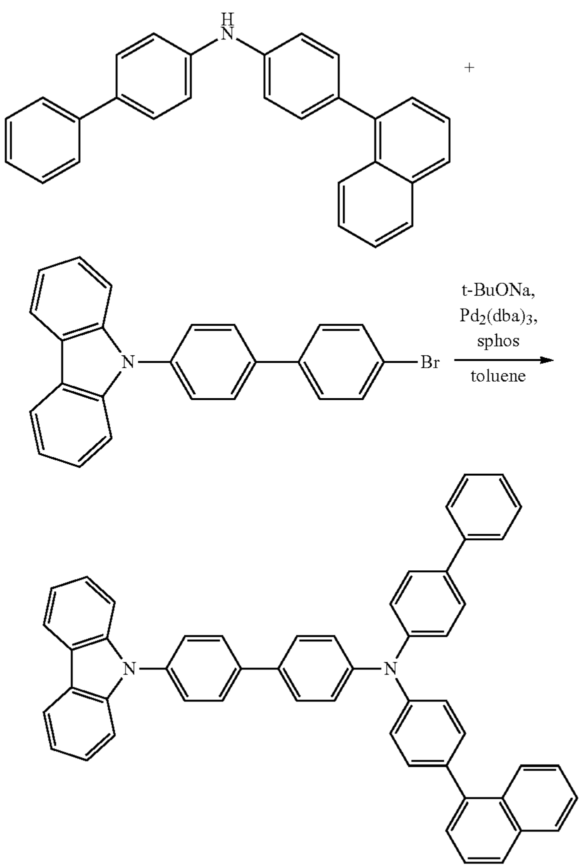

화합물 1-82

A compound 1-82 7.50 g was obtained in 57.8% yield via synthesis and purification in the same manner as in the Synthesis Example 1-1D except that N-(4-naphthalen-1-yl) phenyl)-[1,1'-biphenyl]-4-amine (7.0 g, 18.84 mmol), and 9-(4'-bromo-[1, 1'-biphenyl]-4-yl)-9H-carbazole (8.26 g, 20.73 mmol) were used.

MS (MALDI-TOF) m/z: 688 [M]+

Synthesis Example 1-26: Production of Compound 1-136

[Reaction Formula 43]

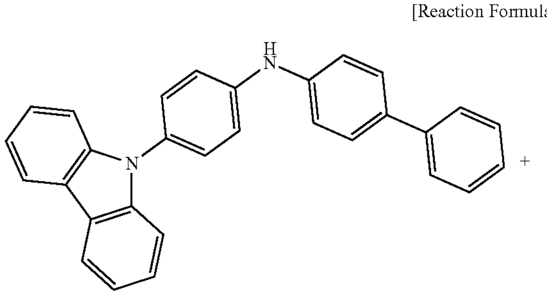

-continued

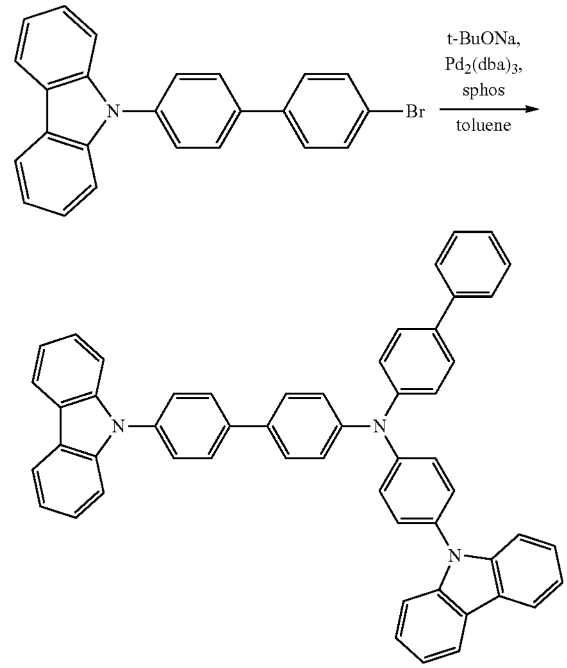

화합물 1-136

A compound 1-136 8.21 g was obtained in 57.8% yield via synthesis and purification in the same manner as in the Synthesis Example 1-1D except that N-(4-(9H-carbazole-9-yl) phenyl)-[1,1'-biphenyl]-4-amine (7.73 g, 18.84 mmol), and 9-(4'-bromo-[1,1'-biphenyl]-4-yl)-9H-carbazole (8.26 g, 20.73 mmol) were used.

MS (MALDI-TOF) m/z: 727 [M]+

Synthesis Example 1-27: Production of Compound 1-91

[Reaction Formula 44]

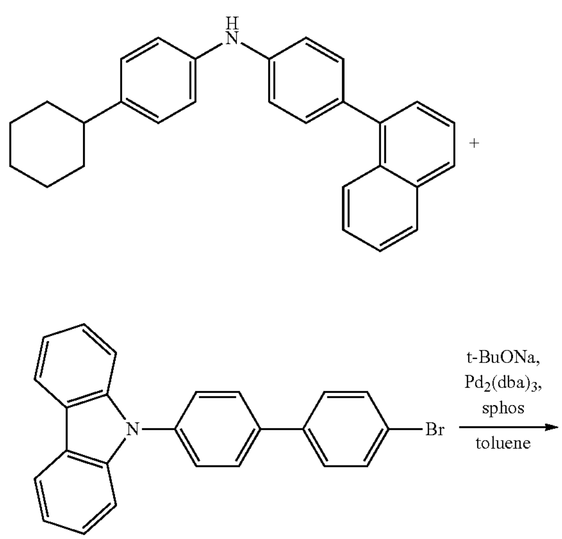

-continued

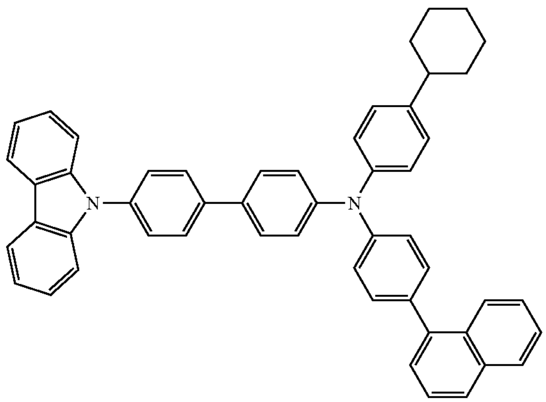

화합물 1-91

A compound 1-91 7.3 g was obtained in 55.8% yield via synthesis and purification in the same manner as in the Synthesis Example 1-1D except that 4-cyclohexyl-N-(4-(naphthalen-1-yl)phenyl)aniline (7.1 g, 18.84 mmol), and 9-(4'-bromo-[1,1'-biphenyl]-4-yl)-9H-carbazole (8.26 g, 20.73 mmol) were used.

MS (MALDI-TOF) m/z: 694 [M]+

Synthesis Example 1-28: Compound 1-121 Production

[Reaction Formula 45]

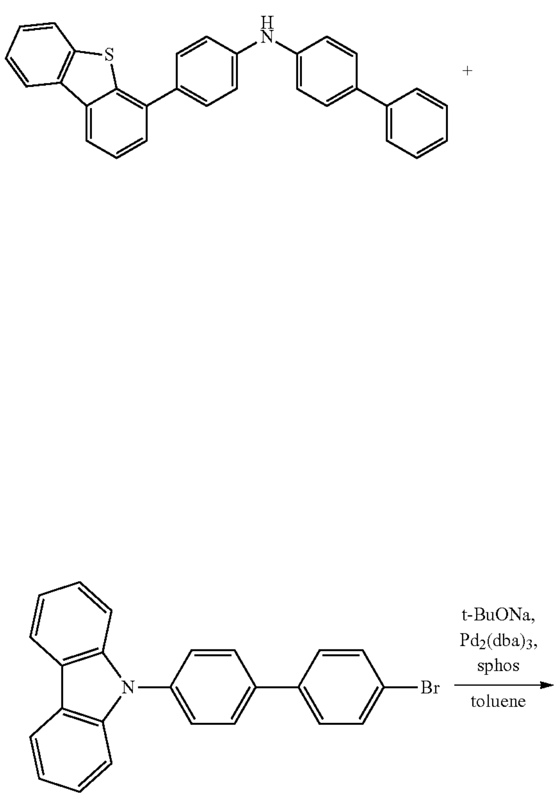

-continued

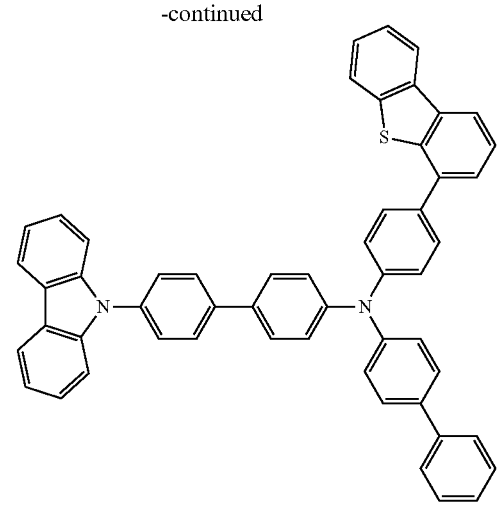

화합물 1-121

A compound 1-121 7.8 g was obtained in yield 55.8% via synthesis and purification in the same manner as in the Synthesis Example 1-1D except that biphenyl-4-yl-(4-dibenzothiophen-4-yl-phenyl)-amine (8.0 g, 18.84 mmol), and 9-(4'-bromo-[1,1'-biphenyl]-4-yl)-9H-carbazole (8.26 g, 20.73 mmol) were used.

MS (MALDI-TOF) m/z: 744 [M]+

Synthesis Example 1-29: Production of Compound 1-271

1-29A) Intermediate 1-29A Production

[Reaction Formula 46]

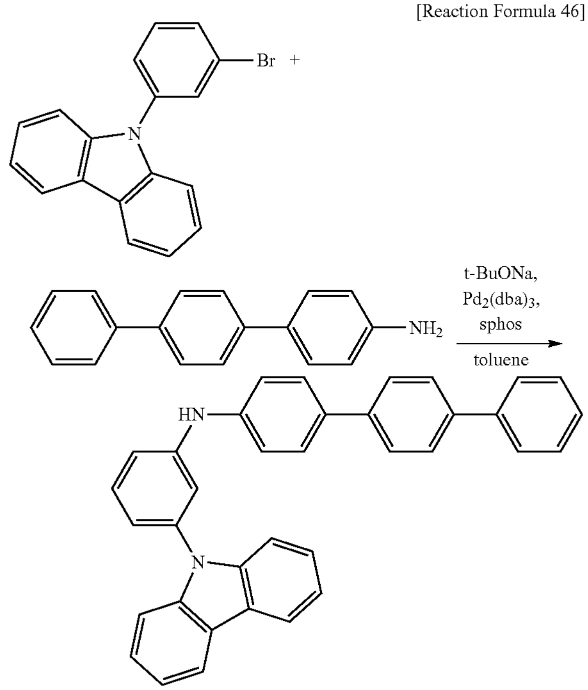

9-(3-bromophenyl)-9H-carbazole (50.0 g, 155.2 mmol), [1,1': 4', 1"-terphenyl]-4-amine (41.88 g, 170.7 mmol), sodium tert butoxide (29.83 g, 310.4 mmol), tris(dibenzylideneacetone)dipalladium (0) (2.84 g, 3.10 mmol), 2-dicyclohexylphosphino-2',6'-dimethoxybiphenyl (2.55 g, 6.21 mmol), and 800 mL of toluene were added into a 2000 mL flask under nitrogen stream and refluxed while stirring. After completion of reaction, a toluene layer was extracted therefrom using 500 mL of water. The extracted solution was treated with $MgSO_4$ to remove residual moisture, was concentrated under reduced pressure, purified using a column chromatography method, and was recrystallized using dichloromethane/heptane, thereby to obtain 57.10 g of an intermediate 1-29A in 75.6% yield.

1-29B) Production of Compound 1-271

[Reaction Formula 47]

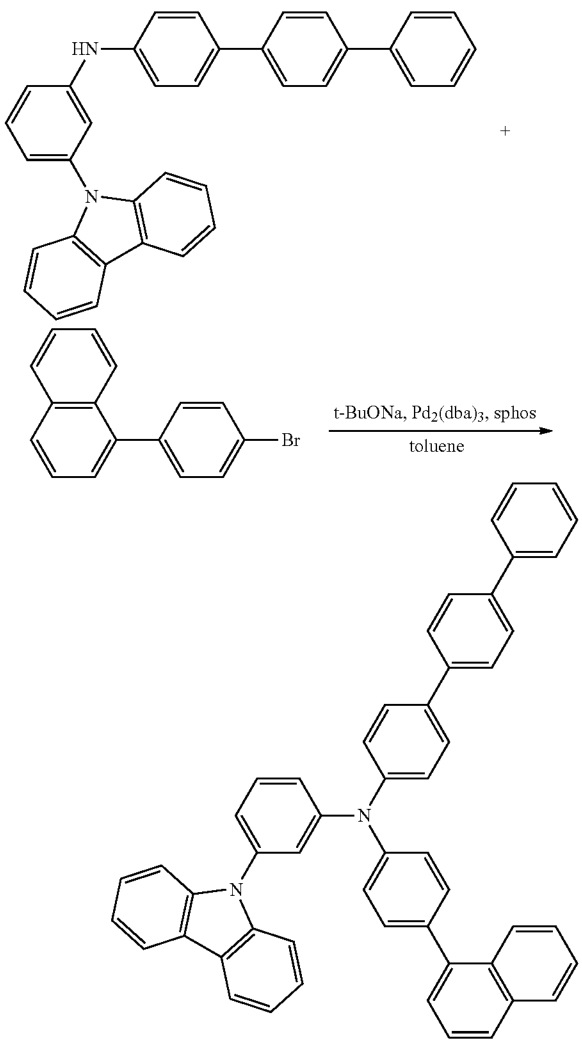

화합물 1-271

N-(3-(9H-carbazol-9-yl)phenyl)[1,1':4',1"-terphenyl]-4-amine (8.0 g, 16.44 mmol), 1-(4-bromophenyl)naphthalene (5.12 g, 18.08 mmol), sodium tert butoxide (3.16 g, 32.88 mmol), tris(dibenzylideneacetone)dipalladium (0) (0.30 g, 0.33 mmol), 2-dicyclohexylphosphino-2',6'-dimethoxybiphenyl (0.27 g, 0.66 mmol), and toluene 100 mL were added into a 250 mL flask under a stream of nitrogen and refluxed while stirring. After completion of reaction, a toluene layer was extracted therefrom using 50 mL of water. The extracted solution was treated with $MgSO_4$ to remove residual moisture, was concentrated under reduced pressure, and purified using a column chromatography method, and was recrystallized using dichloromethane/heptane, thereby to obtain 7.3 g of a compound 1-271 in a 64.5% yield.

MS (MALDI-TOF) m/z: 688 [M]+

Synthesis Example 1-30: Production of Compound 1-278

[Reaction Formula 48]

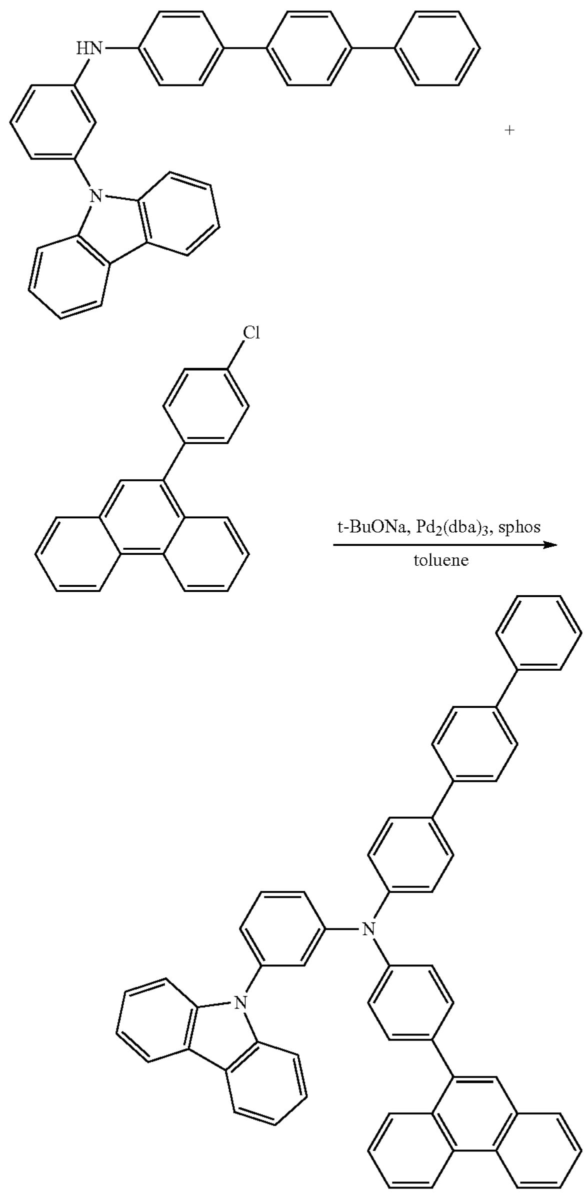

화합물 1-278

A compound 1-278 6.71 g was obtained in 55.3% yield via synthesis and purification in the same manner as in the Synthesis Example 1-29B except that 9-(4-chlorophenyl) phenanthrene (5.22 g, 18.08 mmol) was used instead of 1-(4-bromophenyl)naphthalene.

MS (MALDI-TOF) m/z: 738 [M]+

Synthesis Example 2-1: Production of Compound 2-1

[Reaction Formula 49]

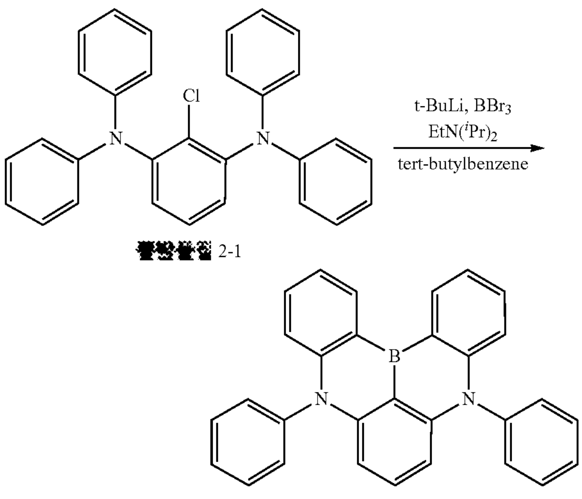

출발물질 2-1

화합물 2-1

A starting material 2-1 8.9 g (20 mmol) was dissolved in tert-butylbenzene (250 ml) and the solution was cooled to 0° C. Under nitrogen atmosphere, 24.7 ml (42 mmol) of a 1.7 M tert-butyllithium solution (in Pentane) was added thereto and then the mixed solution was stirred at 60° C. for 2 hours.

Then, the reactant was cooled to 0° C. again, and 4.0 ml (42 mmol) of BBr3 was added thereto, followed by stirring at room temperature for 0.5 hour. The reactant was again cooled to 0° C. Then, N,N-diisopropylethylamine 7.3 ml (42 mmol) was added thereto, followed by stirring at 60° C. for 2 hours.

The reaction solution was cooled to room temperature, and an organic layer was extracted therefrom using ethyl acetate and water. The solvent was removed from the extracted organic layer which in turn was purified using silica gel column chromatography (DCM/hexane). Thereafter, the purified product was recrystallized and purified using DCM/acetone mixed solvent, thereby to obtain 1.7 g of the compound 2-1 in a 20.2% yield.

MS (MALDI-TOF) m/z: 420 [M]+

Synthesis Example 2-2: Production of Compound 2-6

[Reaction Formula 50]

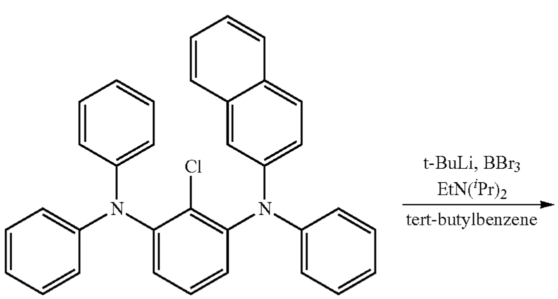

출발물질 2-2

-continued

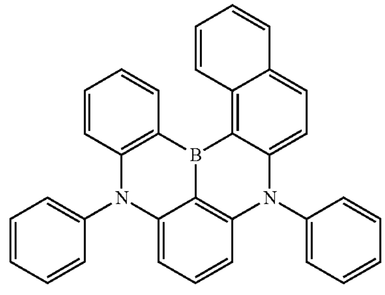

화합물 2-6

2.16 g of a compound 2-6 was obtained in a 23.0% yield via synthesis and purification in the same manner as in the Synthesis Example 2-1 except that 9.9 g (20 mmol) of a starting material 2-2 was used instead of the starting material 2-1.

MS (MALDI-TOF) m/z: 470 [M]+

Synthesis Example 2-3: Production of Compound 2-21

[Reaction Formula 51]

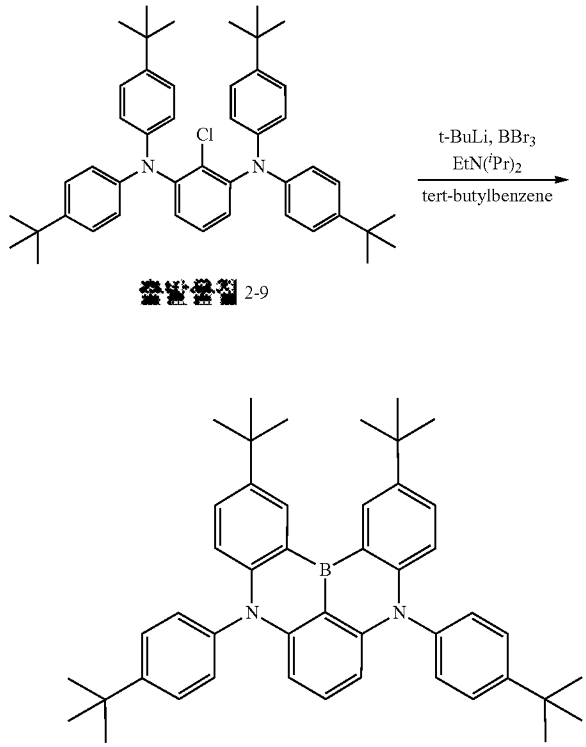

출발물질 2-9

화합물 2-21

2.7 g of a compound 2-21 was obtained in a 21.7% yield via synthesis and purification in the same manner as in the Synthesis Example 2-1 except that 13.4 g of a starting material 2-9 was used instead of the starting material 2-1.

MS (MALDI-TOF) m/z: 644 [M]+

Synthesis Example 2-4: Production of Compound 2-34

[Reaction Formula 52]

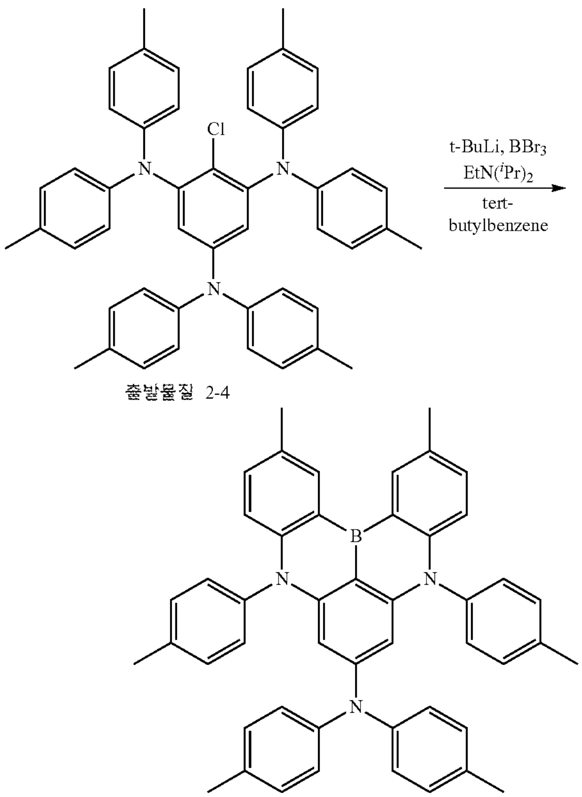

출발물질 2-4

화합물 2-34

1.95 g of a compound 2-34 was obtained a 13.4% yield via synthesis and purification in the same manner as in the Synthesis Example 2-1 except that 16.4 g of a starting material 2-4 was used instead of the starting material 2-1.

MS (MALDI-TOF) m/z: 672 [M]+

Synthesis Example 2-5: Production of Compound 2-38

[Reaction Formula 53]

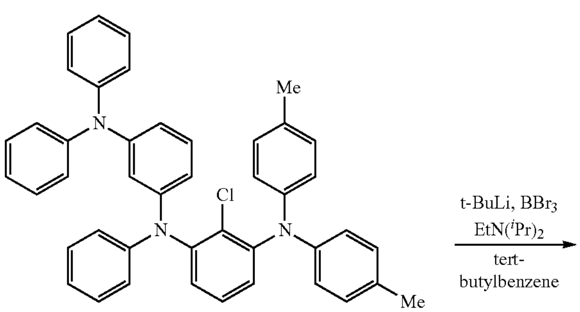

출발물질 2-11

-continued

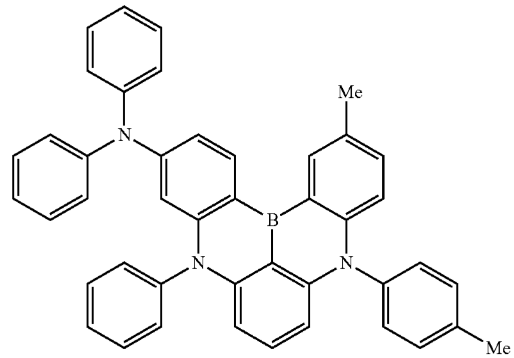

화합물 2-38

2.21 g of a compound 2-38 was obtained in a 18.0% yield via synthesis and purification in the same manner as in the Synthesis Example 2-1 except that 12.8 g of a starting material 2-11 was used instead of the starting material 2-1.

MS (MALDI-TOF) m/z: 615 [M]+

Synthesis Example 2-6: Production of Compound 2-43

[Reaction Formula 54]

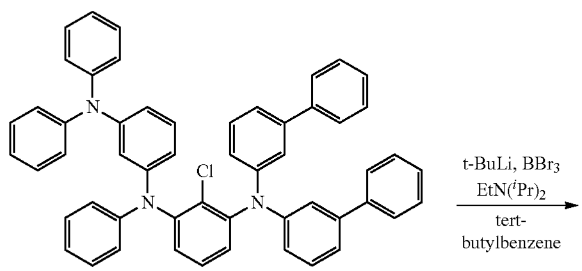

출발물질 2-10

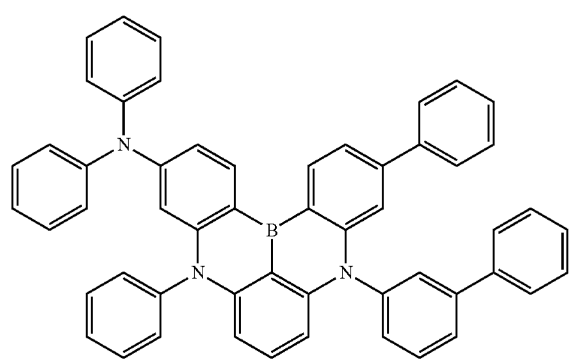

화합물 2-43

2.29 g of a compound 2-43 was obtained in a 15.0% yield via synthesis and purification in the same manner as in the Synthesis Example 2-1 except that 15.3 g of a starting material 2-10 was used instead of the starting material 2-1.

MS (MALDI-TOF) m/z: 739 [M]+

Synthesis Example 2-7: Production of Compound 2-73

[Reaction Formula 55]

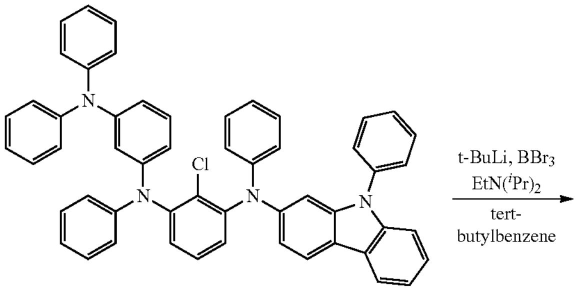

출발물질 2-13

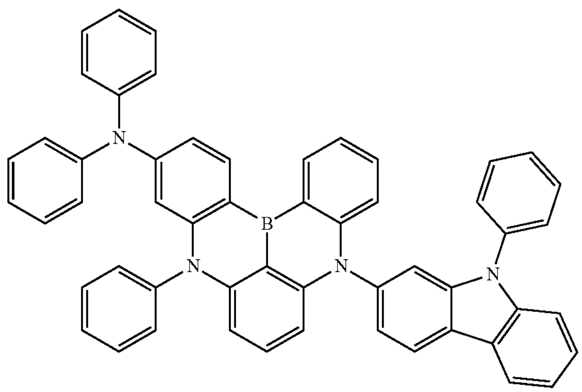

화합물 2-73

0.15 g of a compound 2-73 was obtained in a 1.1% yield via synthesis and purification in the same manner as in the Synthesis Example 2-1 except that 15.5 g of a starting material 2-13 was used instead of the starting material 2-1.

MS (MALDI-TOF) m/z: 752 [M]+

Synthesis Example 2-8: Production of Compound 2-75

[Reaction Formula 56]

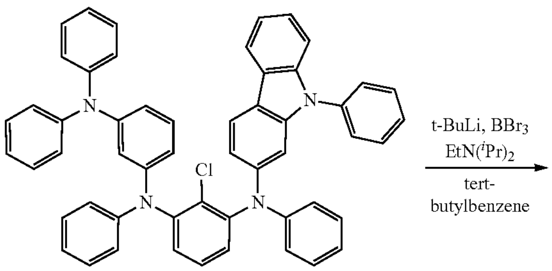

출발물질 2-12

-continued

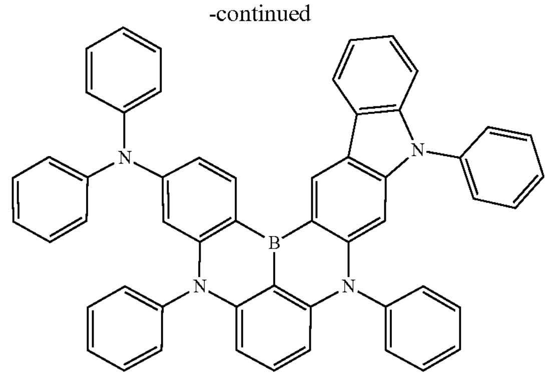

화합물 2-75

1.05 g of a compound 2-75 was obtained in 7.0% yield via synthesis and purification in the same manner as in the Synthesis Example 2-1 except that 15.5 g of a starting material 2-12 was used instead of the starting material 2-1.

MS (MALDI-TOF) m/z: 752 [M]+

Synthesis Example 2-9: Production of Compound 2-77

[Reaction Formula 57]

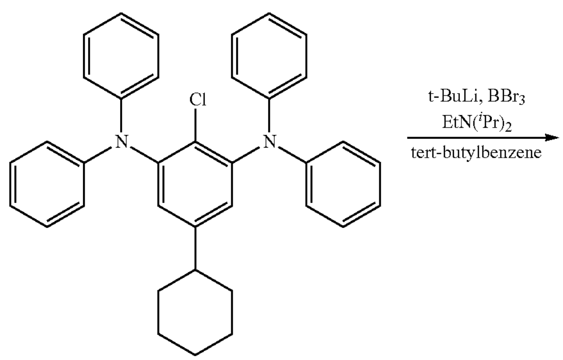

출발물질 2-3

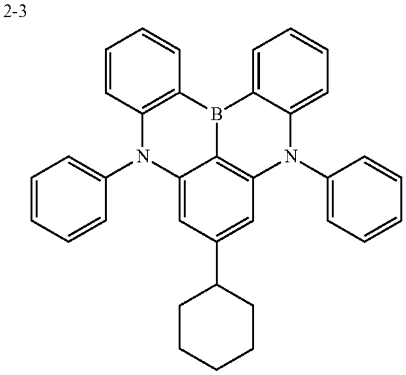

화합물 2-77

2.3 g of a compound 2-77 was obtained in a 23.2% yield via synthesis and purification in the same manner as in the Synthesis Example 2-1 except that 10.6 g (20 mmol) of a starting material 2-3 was used instead of the starting material 2-1.

MS (MALDI-TOF) m/z: 502 [M]+

Synthesis Example 2-10: Production of Compound 2-96

[Reaction Formula 58]

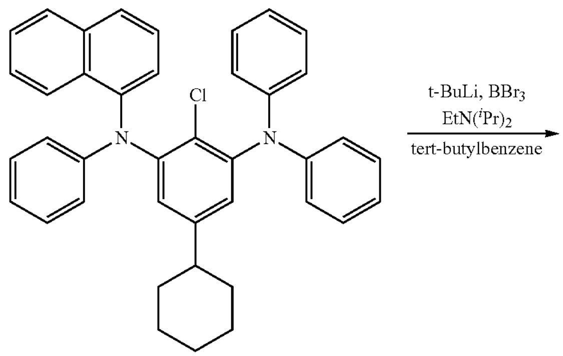

출발물질 2-6

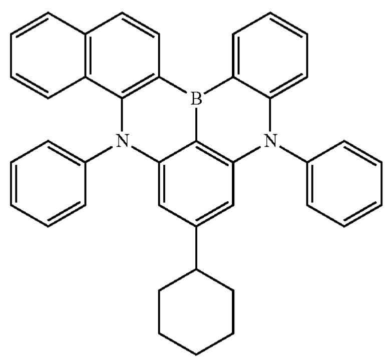

화합물 2-96

0.9 g of a compound 2-96 was obtained in 8.4% yield via synthesis and purification in the same manner as in the Synthesis Example 2-1 except that 11.6 g of a starting material 2-6 was used instead of the starting material 2-1.

MS (MALDI-TOF) m/z: 552 [M]+

Synthesis Example 2-11: Production of Compound 2-108

[Reaction Formula 59]

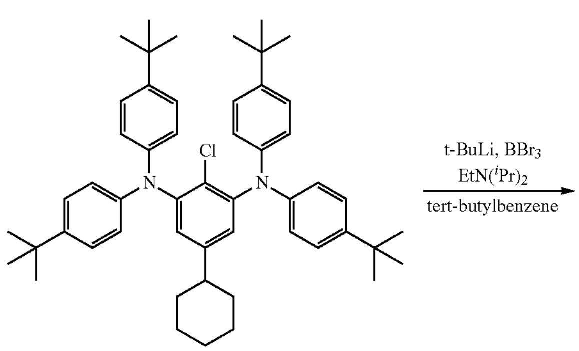

출발물질 2-14

-continued

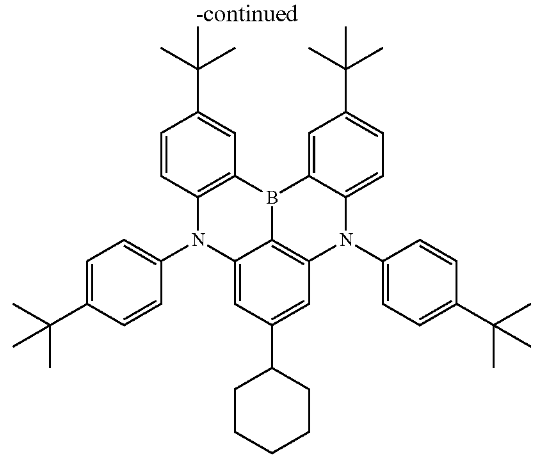

화합물 2-108

3.1 g of a compound 2-108 was obtained in a 21.2% yield via synthesis and purification in the same manner as in the Synthesis Example 2-1 except that 15.1 g of a starting material 2-14 was used instead of the starting material 2-1.

MS (MALDI-TOF) m/z: 726 [M]+

Synthesis Example 2-12: Production of Compound 2-116

[Reaction Formula 60]

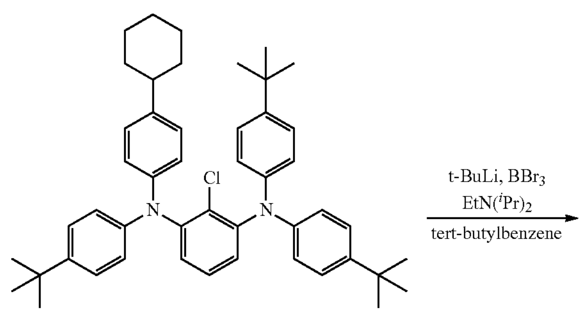

출발물질 2-15

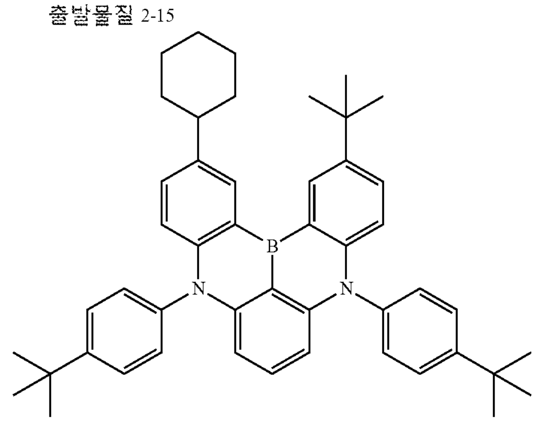

화합물 2-116

2.6 g of a compound 2-116 was obtained in a 19.2% yield via synthesis and purification in the same manner as in the Synthesis Example 2-1 except that 13.9 g of a starting material 2-15 was used instead of the starting material 2-1.

MS (MALDI-TOF) m/z: 670 [M]+

Synthesis Example 2-13: Production of Compound 2-120

[Reaction Formula 61]

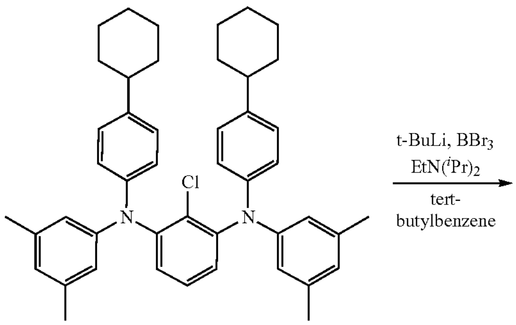

출발물질 2-16

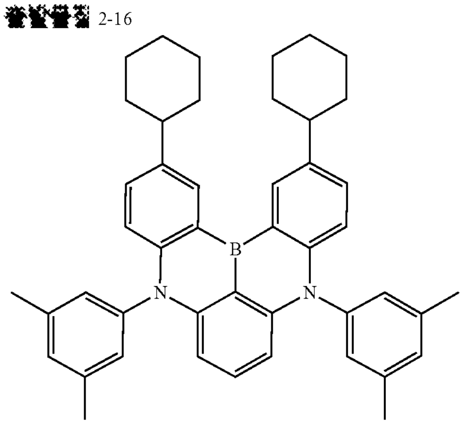

화합물 2-120

2.3 g of a compound 2-120 was obtained in a 17.8% yield via synthesis and purification in the same manner as in the Synthesis Example 2-1 except that 13.3 g of a starting material 2-16 was used instead of the starting material 2-1.

MS (MALDI-TOF) m/z: 640 [M]+

Synthesis Example 2-14: Production of Compound 2-129

[Reaction Formula 62]

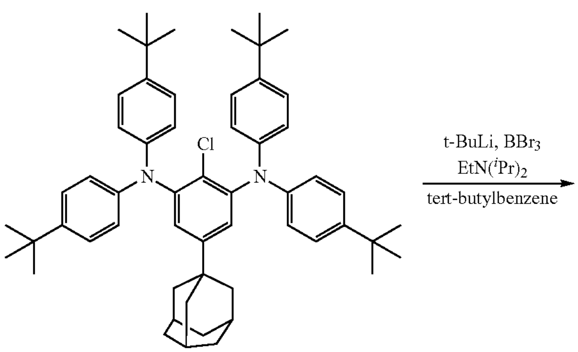

출발물질 2-17

-continued

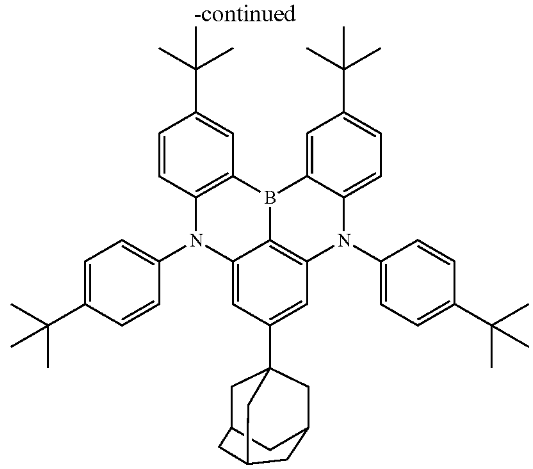

화합물 2-129

3.2 g of a compound 2-129 was obtained in a 20.7% yield via synthesis and purification in the same manner as in the Synthesis Example 2-1 except that 16.1 g (20 mmol) of a starting material 2-17 was used instead of the starting material 2-1.

MS (MALDI-TOF) m/z: 778 [M]+

Synthesis Example 2-15: Production of Compound 2-132

[Reaction Formula 63]

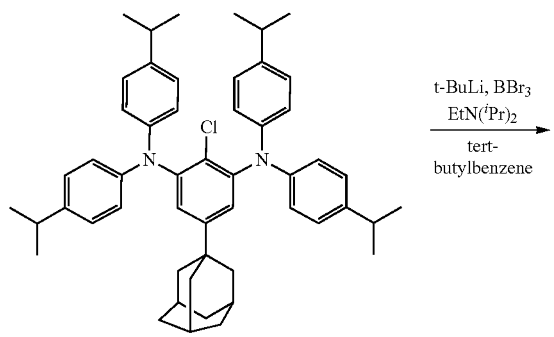

출발물질 2-18

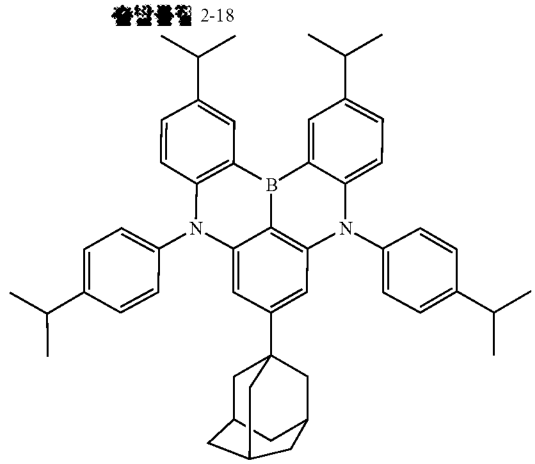

화합물 2-132

2.8 g of a compound 2-132 was obtained in a 19.1% yield via synthesis and purification in the same manner as in the Synthesis Example 2-1 except that 15.0 g of a starting material 2-18 was used instead of the starting material 2-1.

MS (MALDI-TOF) m/z: 722 [M]+

Synthesis Example 2-16: Production of Compound 2-137

[Reaction Formula 64]

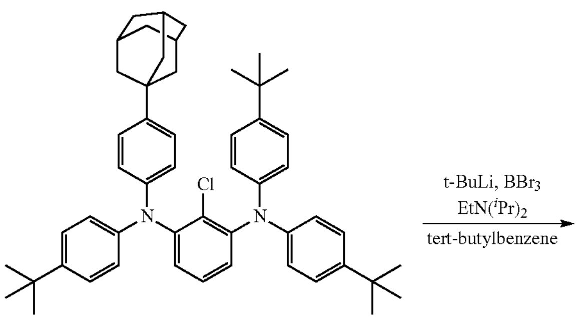

출발물질 2-19

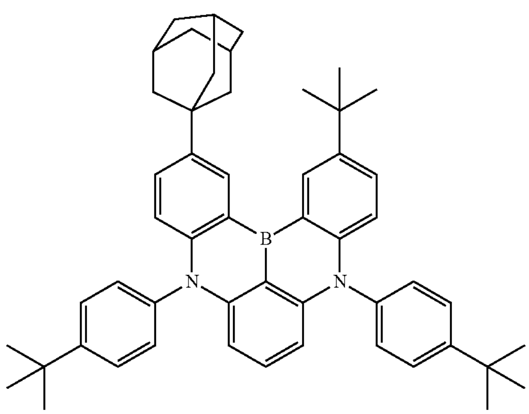

화합물 2-137

2.7 g of a compound 2-137 was obtained in 18.8% yield via synthesis and purification in the same manner as in the Synthesis Example 2-1 except that 15.0 g of a starting material 2-19 was used instead of the starting material 2-1.

MS (MALDI-TOF) m/z: 722 [M]+

Synthesis Example 2-17: Production of Compound 2-143

[Reaction Formula 65]

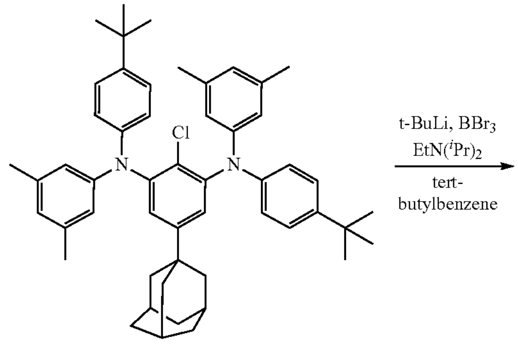

출발물질 2-20

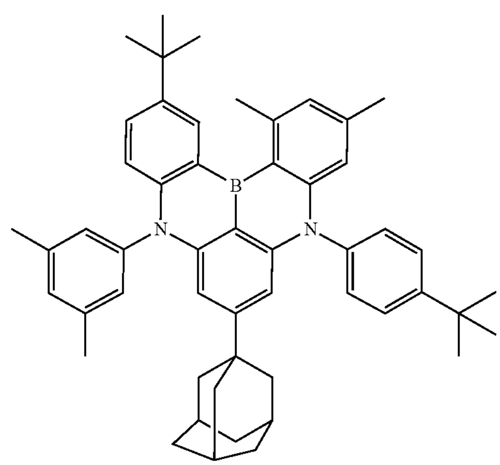

화합물 2-143

3.06 g of a compound 2-143 was obtained in a 21.2% yield via synthesis and purification in the same manner as in the Synthesis Example 2-1 except that 14.8 g of a starting material 2-20 was used instead of the starting material 2-1.

MS (MALDI-TOF) m/z: 722 [M]+

Synthesis Example 2-18: Production of Compound 2-148

[Reaction Formula 66]

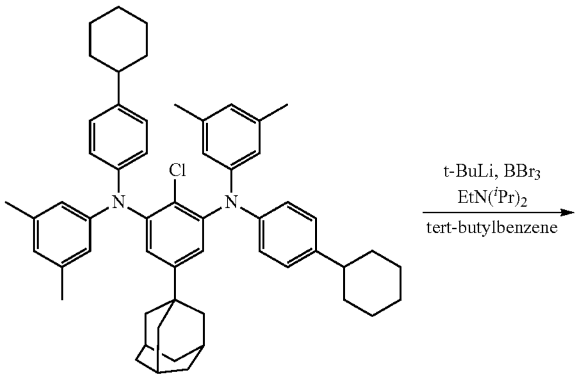

출발물질 2-21

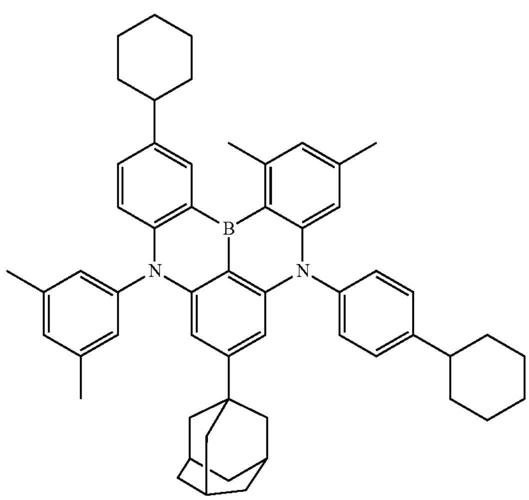

화합물 2-148

3.63 g of a compound 2-148 was obtained in a 23.4% yield via synthesis and purification in the same manner as in the Synthesis Example 2-1 except that 16.0 g of a starting material 2-21 was used instead of the starting material 2-1.

MS (MALDI-TOF) m/z: 774 [M]+

Synthesis Example 2-19: Production of Compound 2-153

[Reaction Formula 67]

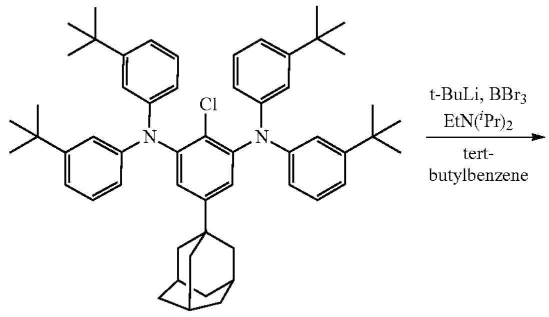

출발물질 2-22

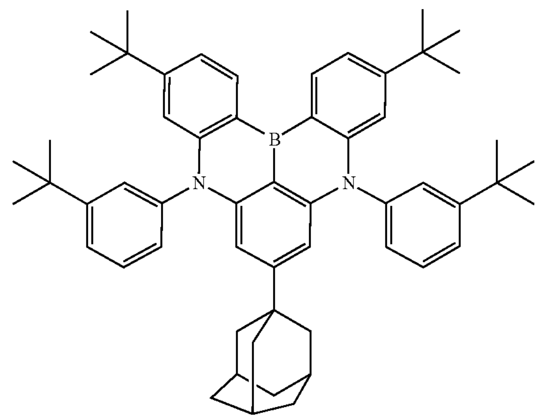

화합물 2-153

3.50 g of a compound 2-153 was obtained in a 25.4% yield via synthesis and purification in the same manner as in the Synthesis Example 2-1 except that 16.1 g of a starting material 2-22 was used instead of the starting material 2-1.

MS (MALDI-TOF) m/z: 778 [M]+

Synthesis Example 2-20: Production of Compound 2-154

[Reaction Formula 68]

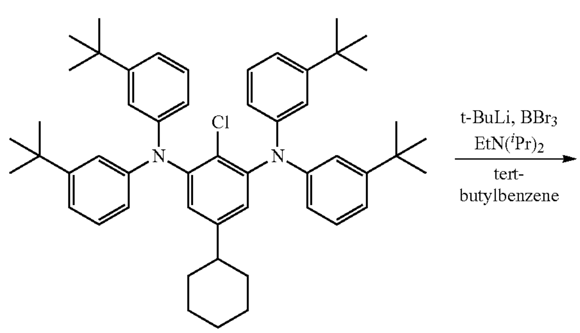

출발물질 2-23

-continued

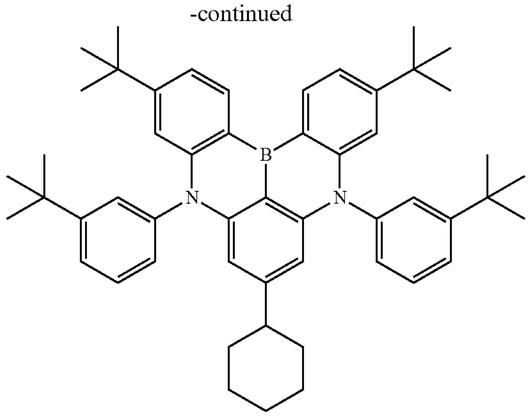

화합물 2-154

2.92 g of a compound 2-154 was obtained in a 20.1% yield via synthesis and purification in the same manner as in the Synthesis Example 2-1 except that 15.6 g of a starting material 2-23 was used instead of the starting material 2-1.

MS (MALDI-TOF) m/z: 726 [M]+

[Present Example 1] Production of Organic Electroluminescent Device

A light-reflective layer, and an anode (ITO) of an organic electroluminescent device were sequentially stacked on a substrate. Afterwards, a surface thereof was treated with $N_2$ plasma or UV-ozone. On the anode, a hole injection layer (HIL) made of 1,4,5,8,9,11-hexaazatriphenylene-hexacarbonitrile (HAT-CN) was formed to have a thickness of 10 nm. Subsequently, on the hole injection layer, N4,N4,N4',N4'-tetra([1,1'-biphenyl]-4-yl)-[1,1'-biphenyl]-4,4'-diamine was deposited to form a hole transport layer (HTL) having a thickness of 110 nm.

On the hole transport layer (HTL), an auxiliary hole transport layer having a thickness of 15 nm was formed by vacuum-depositing the compound 1-151 on the hole transport layer (HTL). Then, on the auxiliary hole transport layer, a light emission layer (EML) composed of 9,10-bis(2-naphthyl)anthracene (ADN) as a host material capable of forming a blue EML was deposited while doping the compound 2-1 as dopant at about 2 wt % into the host material. Thus, a light emitting layer with a thickness of 25 nm was formed.

Then, on the light emitting layer (EML), an electron transport layer (ETL) was formed to have a thickness of 30 nm by mixing anthracene derivative and LiQ at a 2:1 ratio and then depositing the mixture on the light emitting layer (EML). Then, an electron injection layer (EIL) of a thickness of 1 nm was formed on the EML by depositing LiQ thereon. Then, a mixture of magnesium (Mg) and silver (Ag) at a ratio of 1:4 was deposited on the EIL layer, thereby to form a cathode of a thickness of 15 nm. Then, on the cathode, N4,N4'-bis[4-[bis(3-methylphenyl)amino]phenyl]-N4,N4'-diphenyl-[1,1'-biphenyl]-4,4'-diamine (DNTPD) was deposited, thereby to form a capping layer of a thickness of 60 nm.

Then, a seal cap was bonded to the capping layer (CPL) using a UV curable adhesive to protect an organic electroluminescent device from $O_2$ or moisture in the atmosphere. In this way, the organic electroluminescent device was produced.

[Present Examples 2 to 25] Production of Organic Electroluminescent Devices

Organic electroluminescent devices were manufactured in the same manner as in Present Example 1 except that the compounds selected based on a following Table 1 from the compounds synthesized in the Synthesis Examples 1-2 to 1-30 respectively were used as a material of the auxiliary hole transport layer instead of the compound 1-151, while the compounds selected based on a following Table 1 from the compounds synthesized in the Synthesis Examples 2-2 to 2-20 respectively were used as the dopant compound instead of the compound 2-1.

[Comparative Examples 1 to 2] Production of Organic Electroluminescent Devices

Organic electroluminescent devices were manufactured in the same manner as in Present Example 1 except that NPB and a compound A as used as a material for a conventional auxiliary hole transport layer were used instead of the compound 1-151.

[NPB]

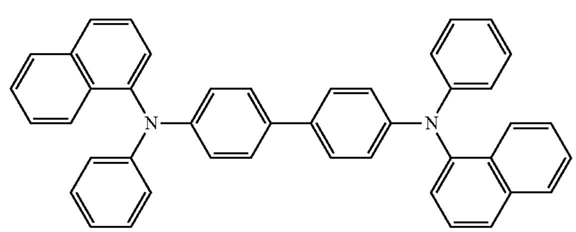 [SMILES: c1ccc(N(c2ccc(-c3ccc(N(c4ccccc4)c4cccc5ccccc45)cc3)cc2)c2cccc3ccccc23)cc1]

[Compound A]

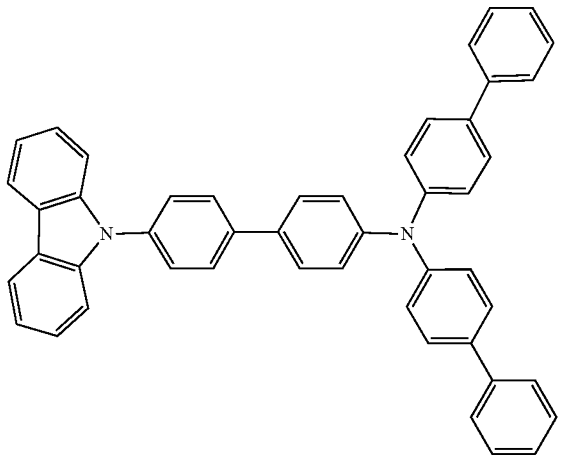

[Compound B]

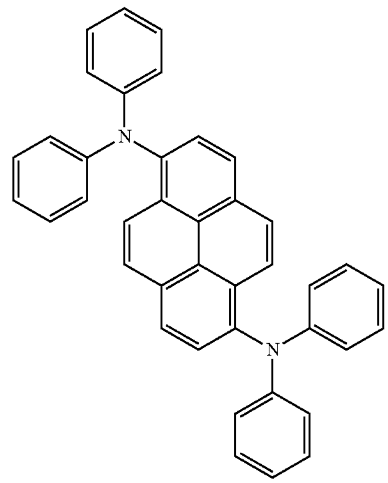

[Comparative Example 3] Production of Organic Electroluminescent Device

An organic electroluminescent device was manufactured in the same manner as in Present Example 1 except that a compound B as used as a conventional dopant compound was used instead of the compound 2-1.

Experimental Example 1: Device Performance Evaluation

The devices of Present Examples 1 to 25 and Comparative Examples 1 to 3 are measured in terms of electro-optical properties at a constant current of 10 $mA/cm^2$, and a lifespan at a drive condition of 20 $mA/cm^2$. The measurements are shown in Table 1.

TABLE 1

| Examples | Auxiliary hole transport layer | Dopant | Voltage (v) | Current-efficiency (Cd/A) | Optical efficiency (lm/W) | EQE(%) | Color Coordinates CIEx | Color Coordinates CIEy | Lifespan T95 (hrs) |
|---|---|---|---|---|---|---|---|---|---|
| Present Example 1 | Compound 1-151 | Compound 2-1 | 4.02 | 7.4 | 5.8 | 15.1 | 0.138 | 0.046 | 210 |
| Present Example 2 | Compound 1-152 | Compound 2-1 | 4.03 | 7.4 | 5.8 | 15.2 | 0.139 | 0.045 | 290 |
| Present Example 3 | Compound 1-153 | Compound 2-1 | 4.05 | 7.1 | 5.5 | 15.6 | 0.139 | 0.045 | 210 |
| Present Example 4 | Compound 1-207 | Compound 2-34 | 4.02 | 8.1 | 6.3 | 17.1 | 0.138 | 0.045 | 250 |
| Present Example 5 | Compound 1-201 | Compound 2-34 | 3.93 | 8.5 | 6.8 | 17.8 | 0.137 | 0.046 | 275 |
| Present Example 6 | Compound 1-156 | Compound 2-38 | 3.98 | 7.9 | 6.2 | 14.8 | 0.134 | 0.054 | 240 |
| Present Example 7 | Compound 1-10 | Compound 2-73 | 3.91 | 7.4 | 5.9 | 15.6 | 0.138 | 0.046 | 210 |
| Present Example 8 | Compound 1-158 | Compound 2-75 | 4.05 | 7.6 | 5.9 | 14.8 | 0.137 | 0.051 | 250 |
| Present Example 9 | Compound 1-9 | Compound 2-75 | 3.97 | 8.1 | 6.4 | 16.7 | 0.137 | 0.048 | 260 |
| Present Example 10 | Compound 1-25 | Compound 2-108 | 3.87 | 8.0 | 6.5 | 17.1 | 0.138 | 0.045 | 230 |
| Present Example 11 | Compound 1-12 | Compound 2-116 | 4.06 | 8.7 | 6.7 | 18.1 | 0.137 | 0.046 | 250 |
| Present Example 12 | Compound 1-19 | Compound 2-129 | 3.88 | 8.2 | 6.6 | 16.4 | 0.136 | 0.049 | 220 |
| Present Example 13 | Compound 1-20 | Compound 2-132 | 3.88 | 8.1 | 6.6 | 16.1 | 0.136 | 0.049 | 200 |
| Present Example 14 | Compound 1-4 | Compound 2-154 | 3.97 | 6.9 | 5.5 | 14.6 | 0.142 | 0.045 | 240 |
| Present Example 15 | Compound 1-326 | Compound 2-34 | 3.88 | 8.4 | 6.8 | 17.1 | 0.138 | 0.048 | 290 |

TABLE 1-continued

| Examples | Auxiliary hole transport layer | Dopant | Voltage (v) | Current-efficiency (Cd/A) | Optical efficiency (lm/W) | EQE(%) | Color Coordinates CIEx | CIEy | Lifespan T95 (hrs) |
|---|---|---|---|---|---|---|---|---|---|
| Present Example 16 | Compound 1-327 | Compound 2-34 | 4.05 | 7.4 | 5.7 | 15.6 | 0.139 | 0.045 | 280 |
| Present Example 17 | Compound 1-146 | Compound 2-38 | 3.98 | 7.9 | 6.2 | 14.8 | 0.134 | 0.054 | 210 |
| Present Example 18 | Compound 1-328 | Compound 2-43 | 3.93 | 7.6 | 6.1 | 16.3 | 0.135 | 0.05 | 230 |
| Present Example 19 | Compound 1-178 | Compound 2-75 | 3.89 | 7.4 | 6.0 | 15.6 | 0.138 | 0.046 | 205 |
| Present Example 20 | Compound 1-39 | Compound 2-129 | 3.83 | 7.5 | 6.15 | 15.9 | 0.136 | 0.048 | 200 |
| Present Example 21 | Compound 1-136 | Compound 2-129 | 3.82 | 7.4 | 6.1 | 15.8 | 0.135 | 0.047 | 210 |
| Present Example 22 | Compound 1-91 | Compound 2-154 | 3.88 | 8.0 | 6.5 | 16.0 | 0.136 | 0.049 | 200 |
| Present Example 23 | Compound 1-121 | Compound 2-34 | 3.93 | 7.2 | 6.0 | 15.4 | 0.137 | 0.046 | 200 |
| Present Example 24 | Compound 1-271 | Compound 2-108 | 3.97 | 7.0 | 5.5 | 15.2 | 0.142 | 0.045 | 210 |
| Present Example 25 | Compound 1-278 | Compound 2-38 | 4.02 | 7.9 | 6.2 | 14.6 | 0.134 | 0.054 | 240 |
| Comparative Example 1 | NPB | Compound 2-1 | 4.4 | 6.5 | 4.6 | 13.2 | 0.141 | 0.047 | 80 |
| Comparative Example 2 | Compound A | Compound 2-1 | 4.02 | 6.9 | 5.4 | 14.6 | 0.142 | 0.045 | 105 |
| Comparative Example 3 | Compound 1-155 | Compound B | 4.2 | 6.0 | 4.5 | 12.5 | 0.142 | 0.046 | 200 |

Table 1 indicates that the devices using the compounds according to Present Examples as the auxiliary hole transport layer material and the dopant material are excellent in terms of drive voltage, current efficiency, external quantum efficiency (EQE), and the life span compared to the devices using the compounds according to the Comparative Examples as the conventional auxiliary hole transport layer material and/or dopant material.

Table 1 indicates that the devices using the compounds according to Present Examples as the hole transport layer material and the dopant material exhibit the lifespan longer by maximum 4 times than that of the device using the compound NPB according to the Comparative Example 1 or that of the device using the compound A according to the Comparative Example 2.

Further, Table 1 indicates that the devices using the compounds according to Present Examples as the hole transport layer material and the dopant material exhibit the lifespan longer than or equal to that of the device using the compound B as the dopant according to the Comparative Example 3. Further, Table 1 indicates that the devices using the compounds according to Present Examples as the hole transport layer material and the dopant material exhibit lowered drive voltage, and improved current efficiency, optical efficiency and external quantum efficiency (EQE), compared to the device using the compound B as the dopant according to the Comparative Example 3.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic electroluminescent device including:

a first electrode, one or more organic material layers including one or more layers containing a compound represented by Chemical Formula 1, the one or more organic material layers including:

a hole injection layer including 1,4,5,8,9,11-hexaazatriphenylene-hexacarbonitrile, a hole transport layer including N4,N4,N4',N4'-tetra([1,1'-biphenyl]-4-yl)-[1,1'-biphenyl]-4,4'-diamine, an auxiliary hole transport layer including the compound represented by Chemical Formula 1, an electron transport layer including LiQ, an electron injection layer including LiQ, and a light emitting layer containing:

a blue light emitting host that includes 9,10-bis(2-naphthyl)anthracene (ADN), and a compound represented by Chemical Formula 2 that is a dopant doped into the host, and a second electrode, wherein the Chemical Formula 1 and the Chemical Formula 2 are:

[Chemical Formula 1]

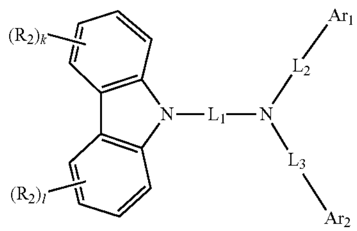

where in the Chemical Formula 1, each of $L_1$ to $L_3$ independently represents a substituted or unsubstituted C6 to C30 arylene group, each of $Ar_1$ and $Ar_2$ independently represents one selected from the group consisting of a substituted or unsubstituted C6 to C30 aryl group, a substituted or unsubstituted C3 to C30 heteroaryl group, and a substituted or unsubstituted C3 to C20 cycloalkyl group, each of $R_1$ and $R_2$ independently represents hydrogen, each of k and l independently denotes an integer from 0 to 4,

[Chemical Formula 2]

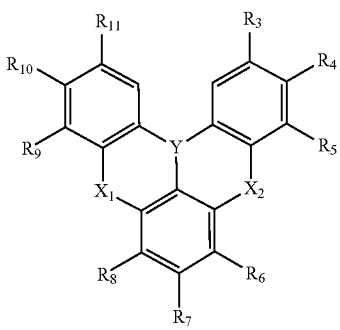

where in the Chemical Formula 2,

Y is B, each of $X_1$ and $X_2$ independently represents $N(R_{12})$, $R_3$ to $R_{12}$ are the same as or different from each other, and each of $R_3$ to $R_{12}$ independently represents one selected from the group consisting of hydrogen, a substituted or unsubstituted C1 to C20 alkyl group, an unsubstituted C3 to C30 cycloalkyl group, a substituted or unsubstituted C7 to C30 aralkyl group, a substituted or unsubstituted C6 to C30 aryl group, and a substituted or unsubstituted C6 to C30 arylamino group, wherein adjacent two of $R_3$ to $R_{12}$ are optionally coupled to each other to form a substituted or unsubstituted ring.

2. The organic electroluminescent device of claim 1, wherein the one or more organic material layers further includes at least one layer selected from the group consisting of a second light-emitting layer, and an auxiliary electron transport layer.

3. The organic electroluminescent device of claim 1, further comprising an encapsulation layer formed on the second electrode.

4. The organic electroluminescent device of claim 3, further comprising a barrier layer formed on the encapsulation layer.

5. The organic electroluminescent device of claim 1, further comprising a driving thin-film transistor including an active layer electrically connected to the first electrode.

6. The organic electroluminescent device of claim 5, wherein the active layer includes an oxide semiconductor layer.

7. The organic electroluminescent device of claim 5, wherein the driving thin-film transistor includes a gate insulating film formed on the active layer, and a gate electrode formed on the gate insulating film.

8. The organic electroluminescent device of claim 1, wherein the compound represented by the Chemical Formula 1 is selected from the following compounds:

1-1

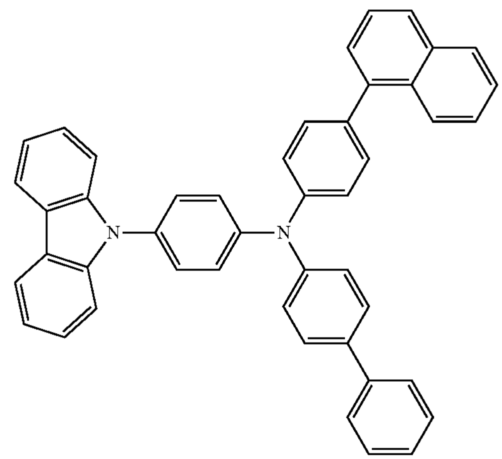

1-2

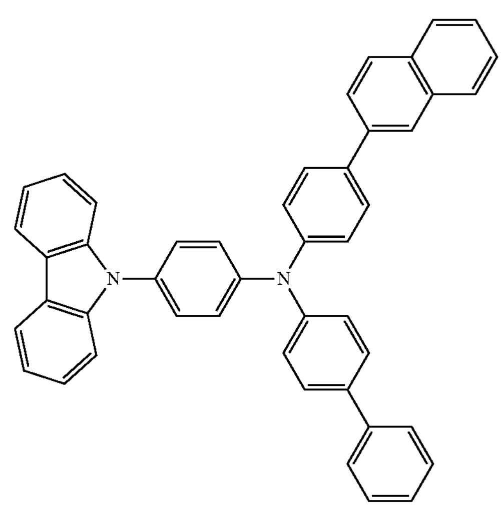

-continued
1-3
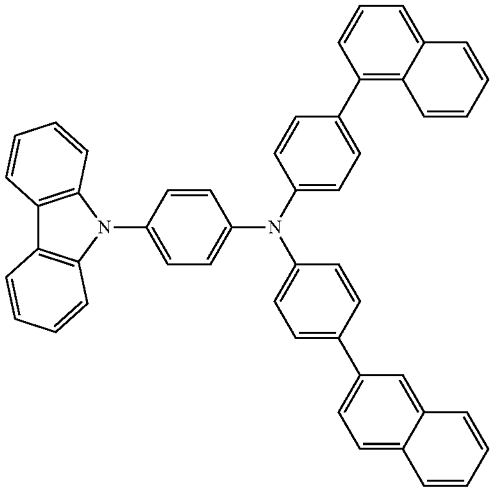
1-4
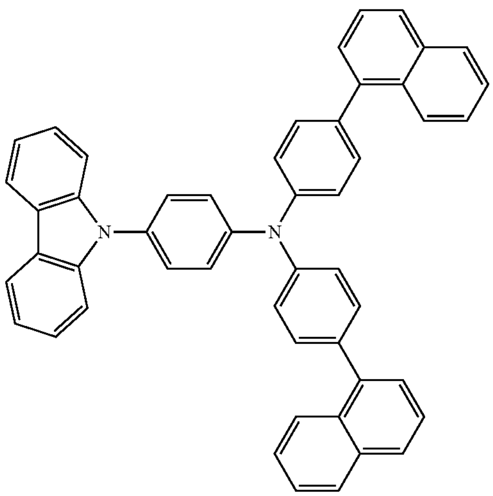
1-5
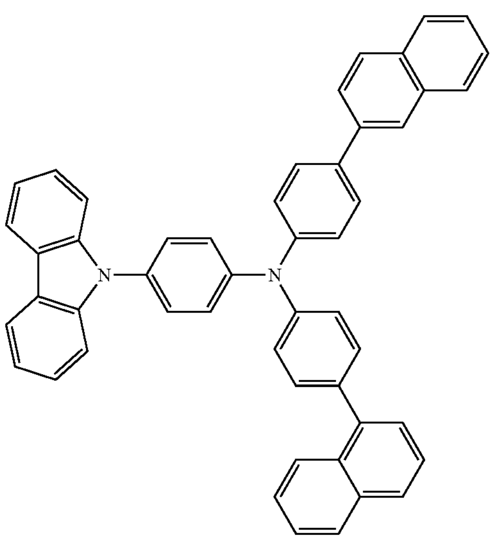
-continued
1-6
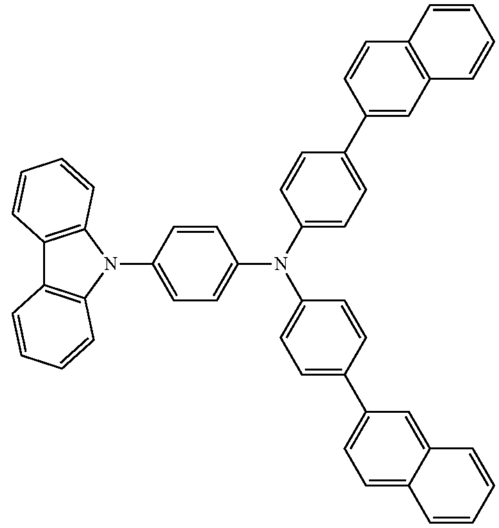
1-7
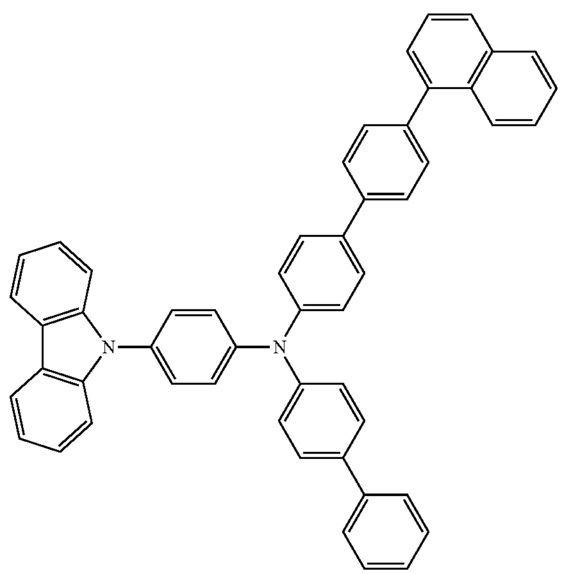

1-8
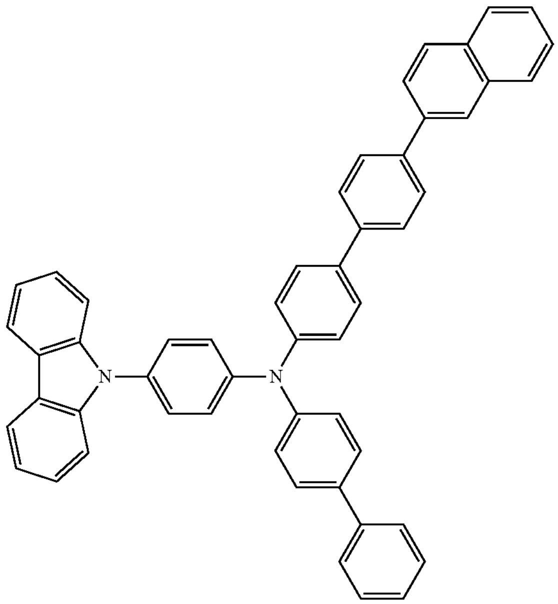
1-10
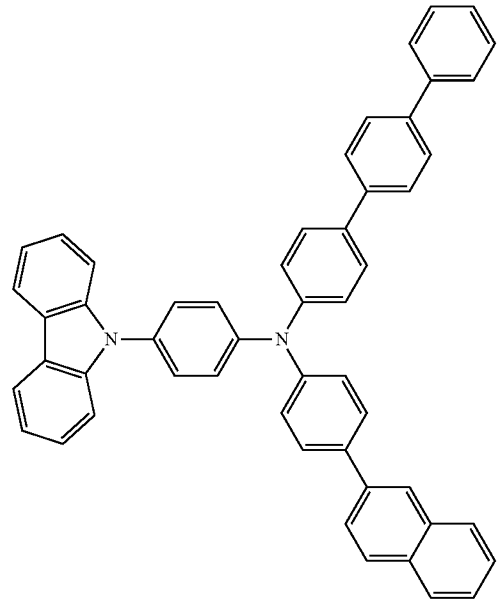
1-9
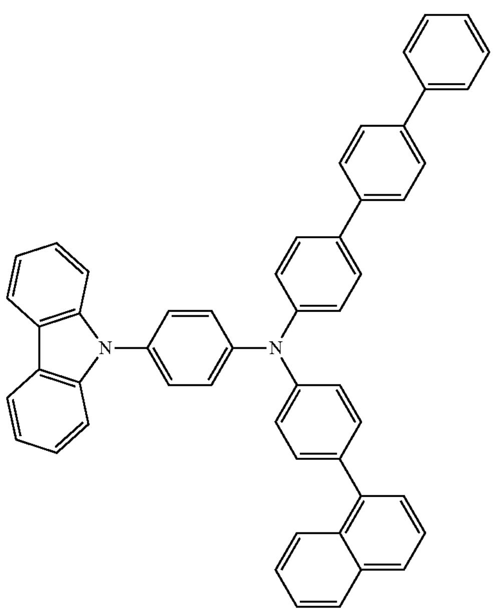
1-11
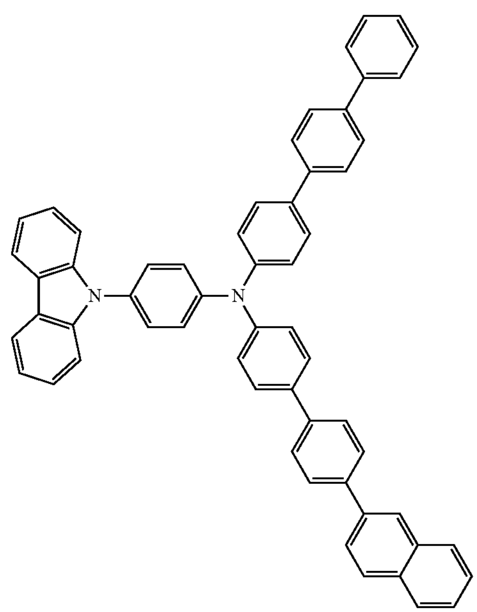

-continued
1-12
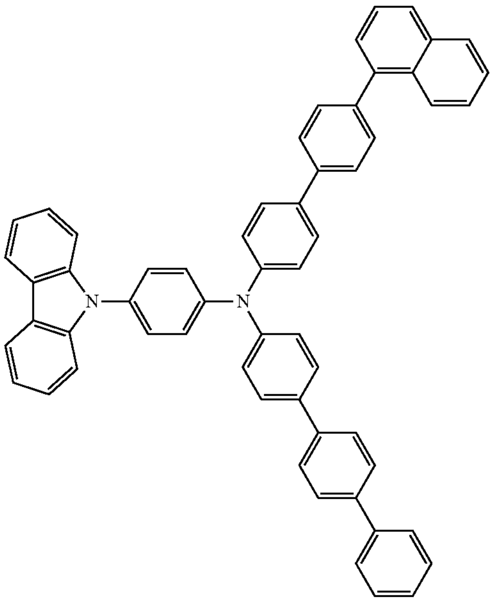
1-13
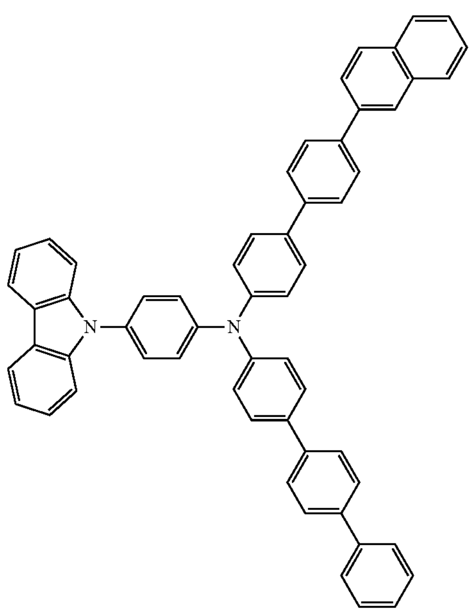
-continued
1-14
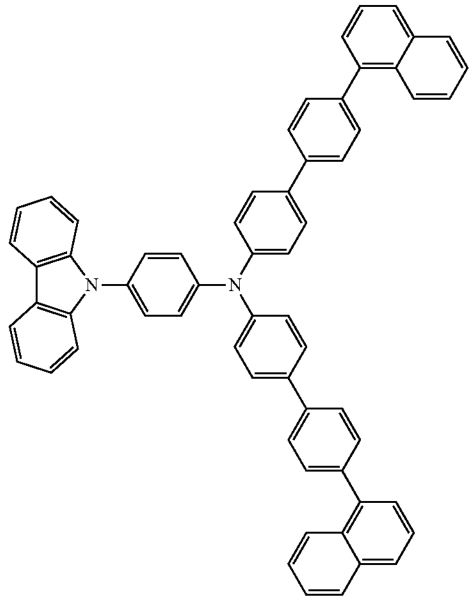
1-15
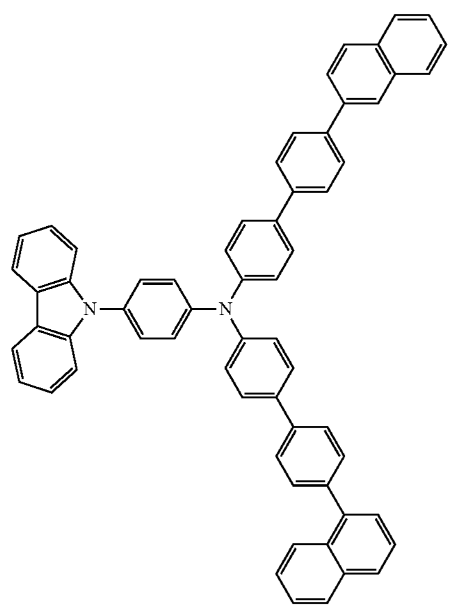

1-16
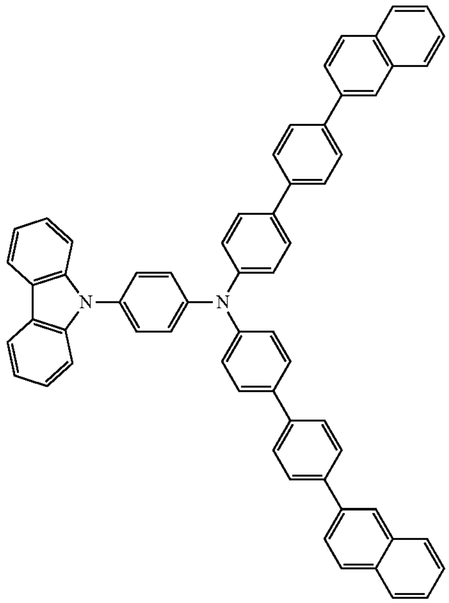
1-17
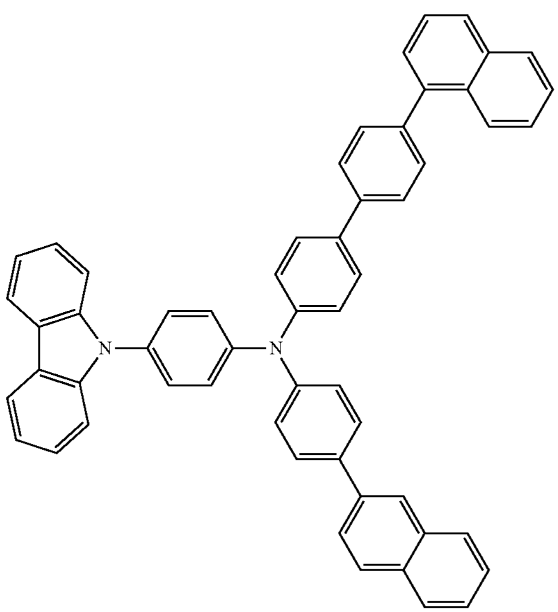
1-18
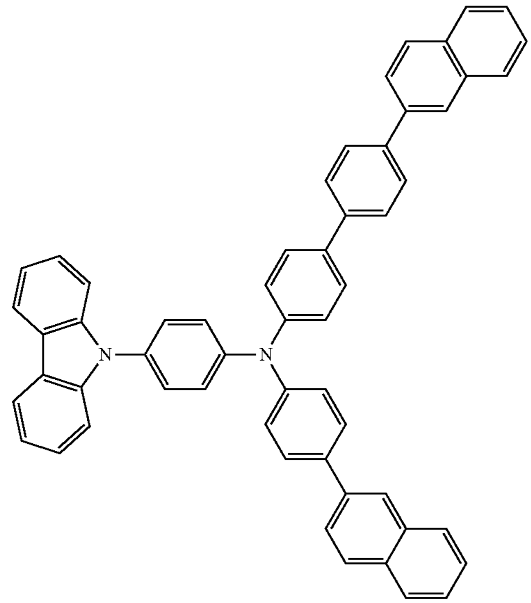
1-19
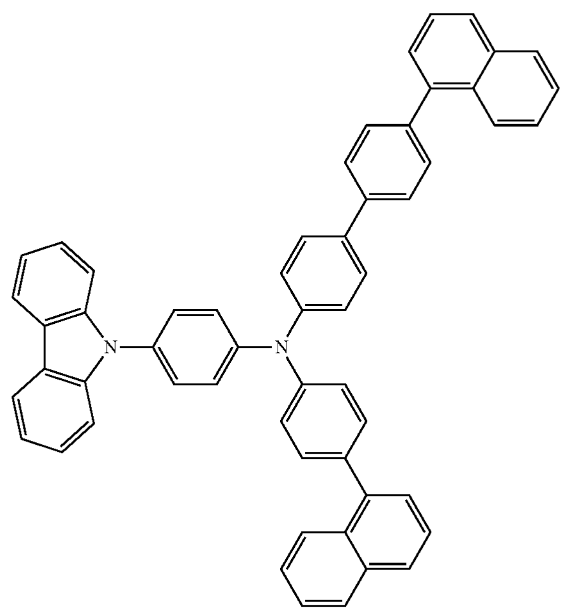

-continued
1-20
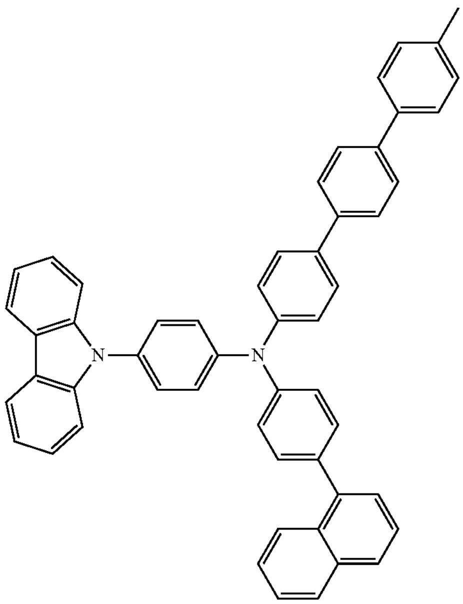
1-21
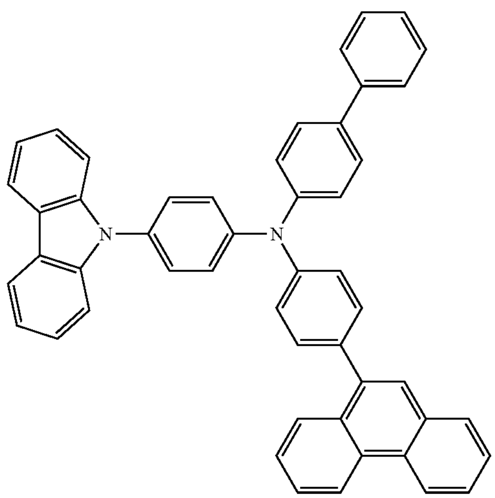
1-22
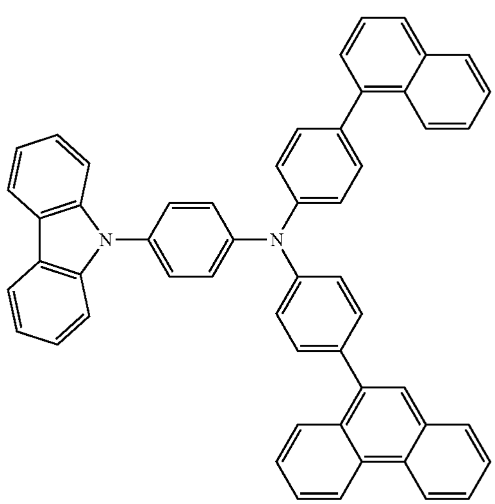
-continued
1-23
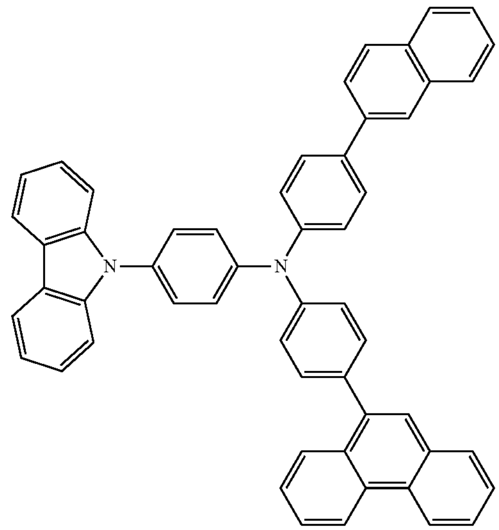
1-24
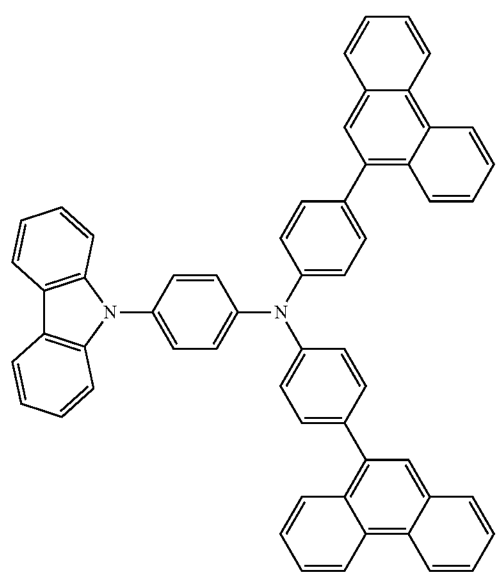

1-25
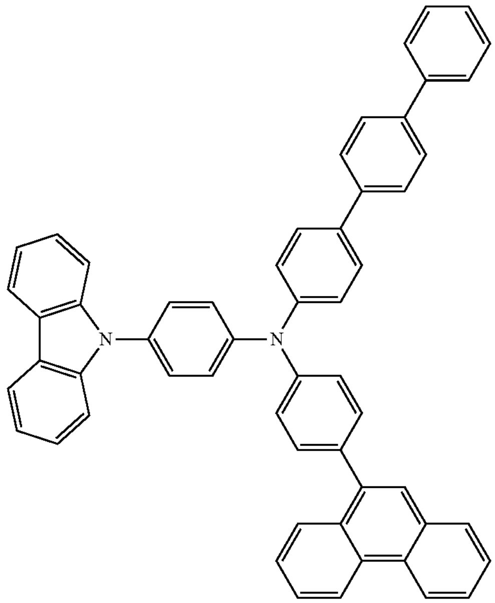
1-26
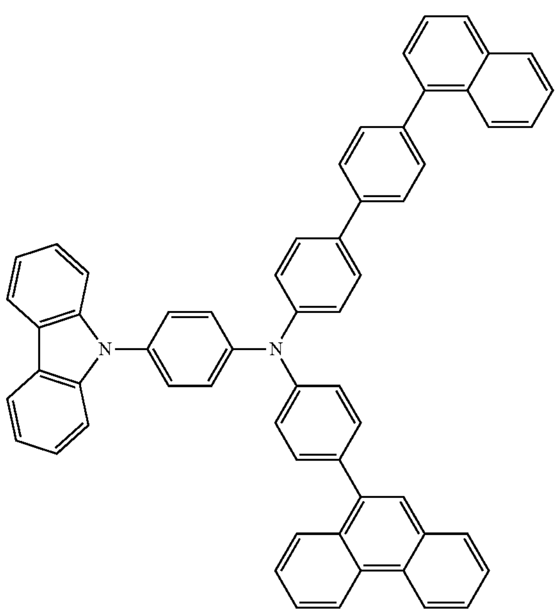
1-27
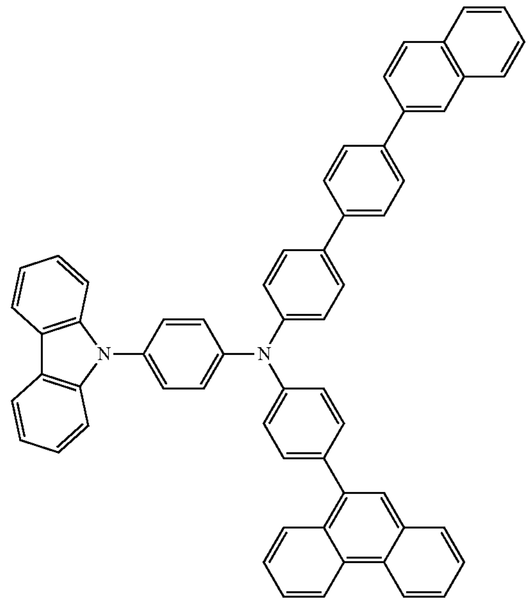
1-28
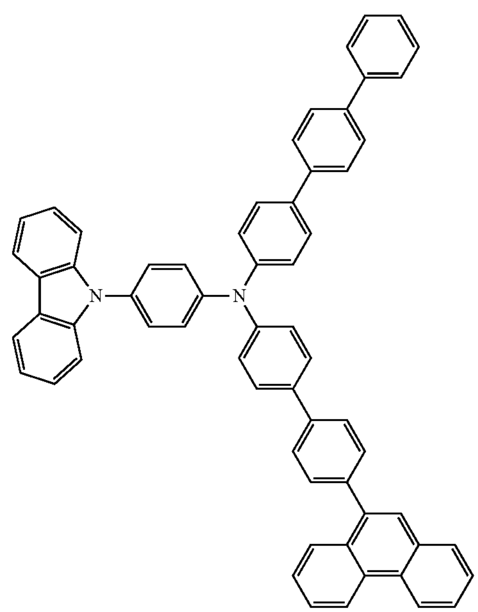

-continued
1-29
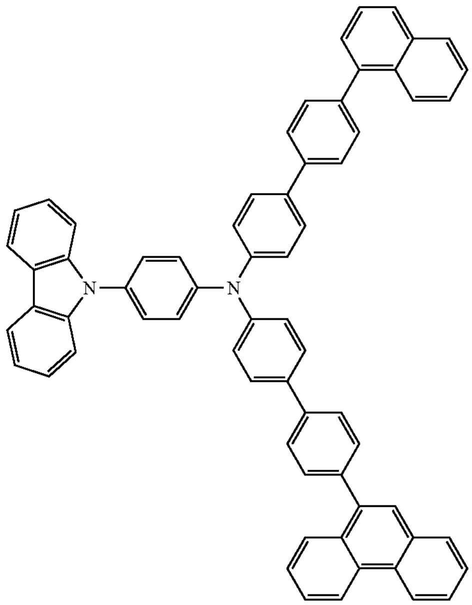
1-31
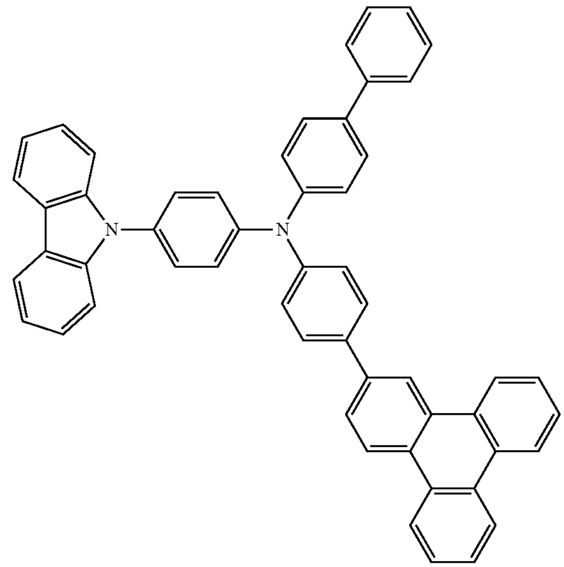
1-30
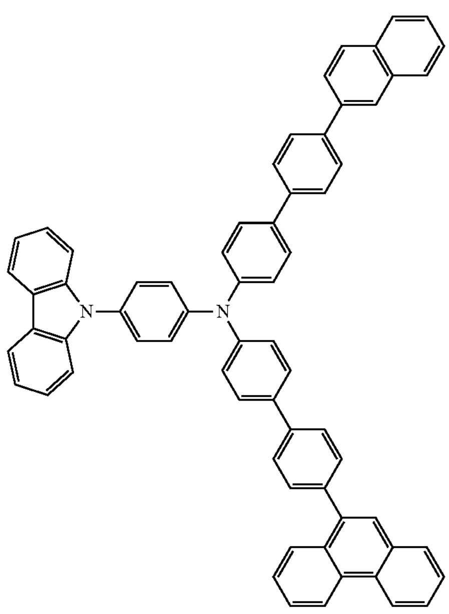
1-32
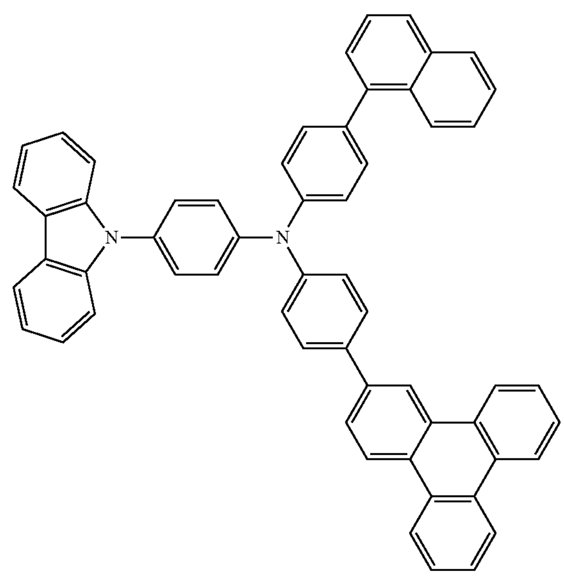

-continued
1-33
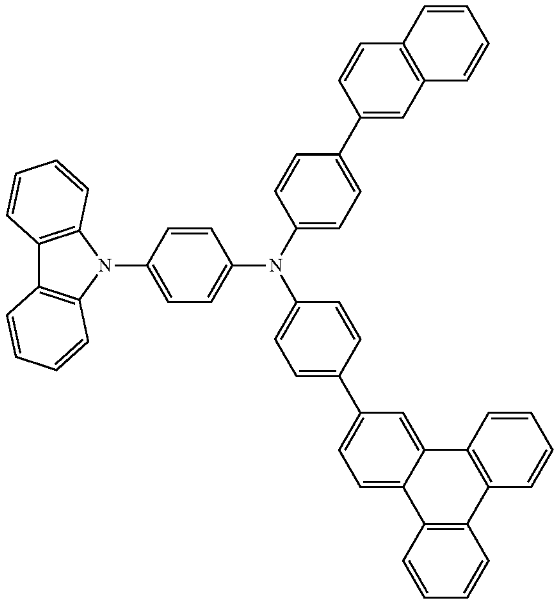
1-34
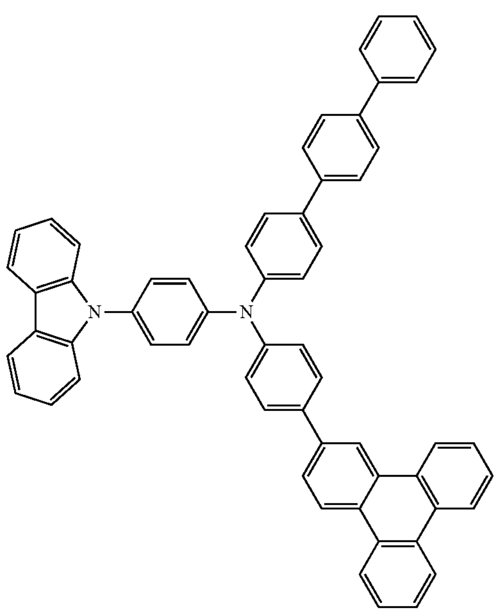
-continued
1-35
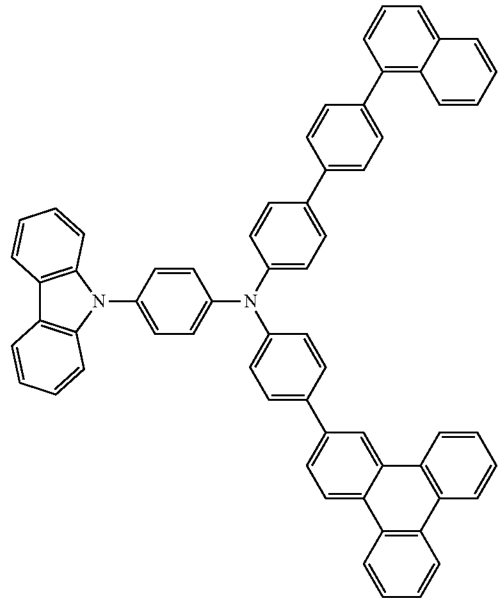
1-36
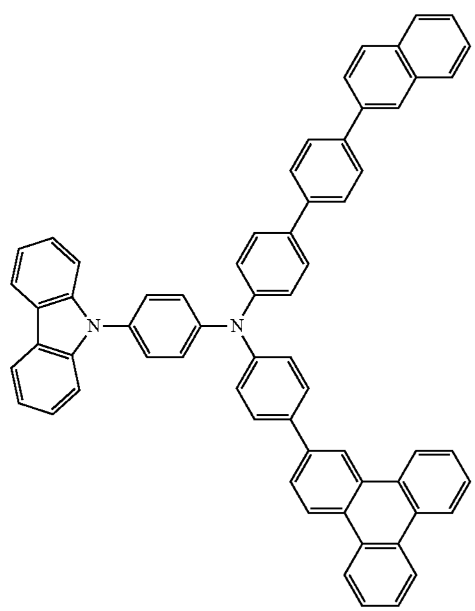

1-37
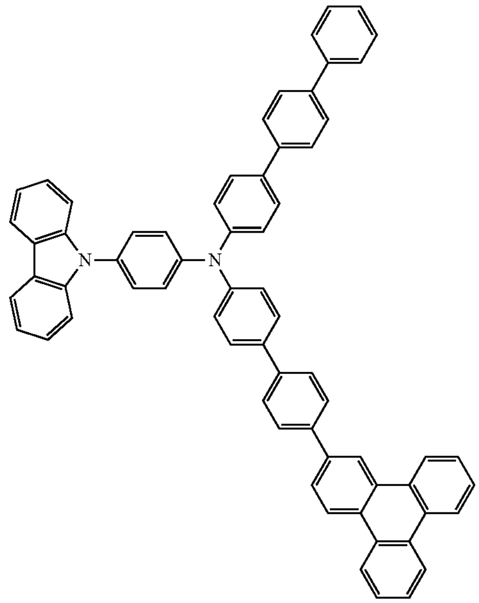
1-38
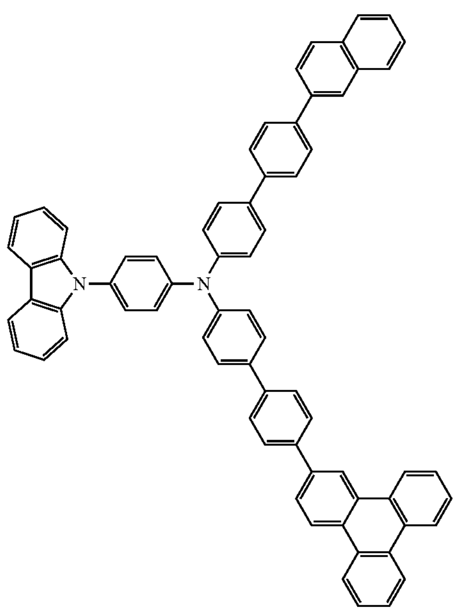
1-39
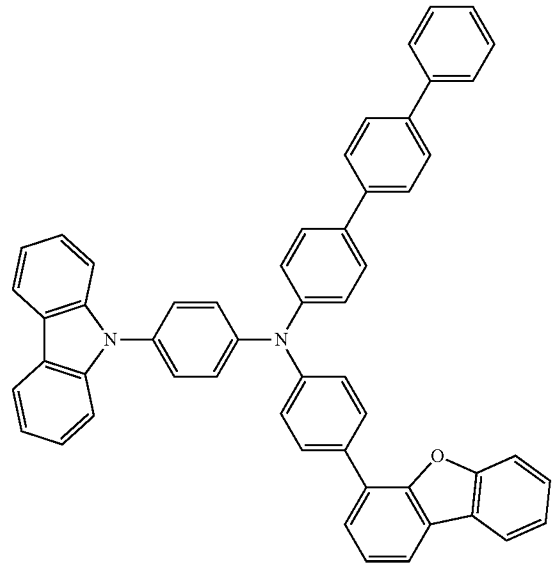
1-40
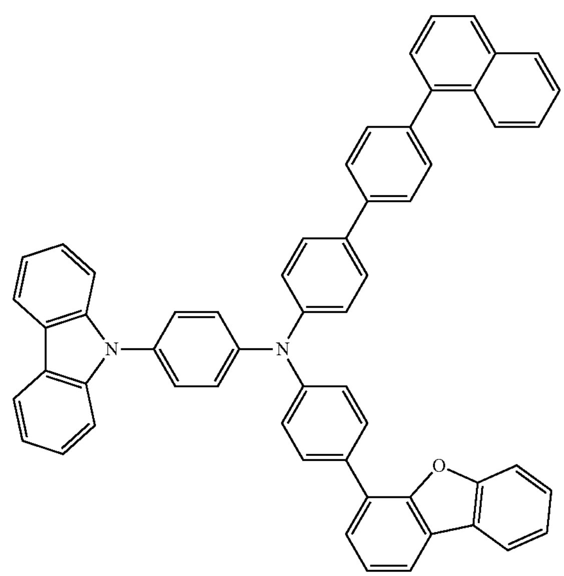

-continued
1-41
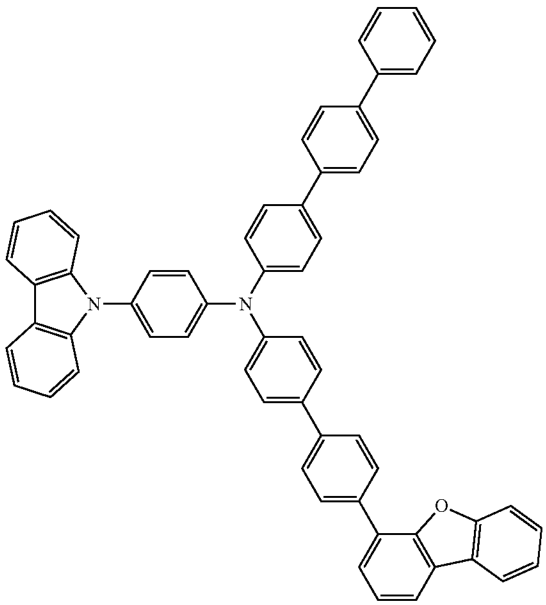
1-42
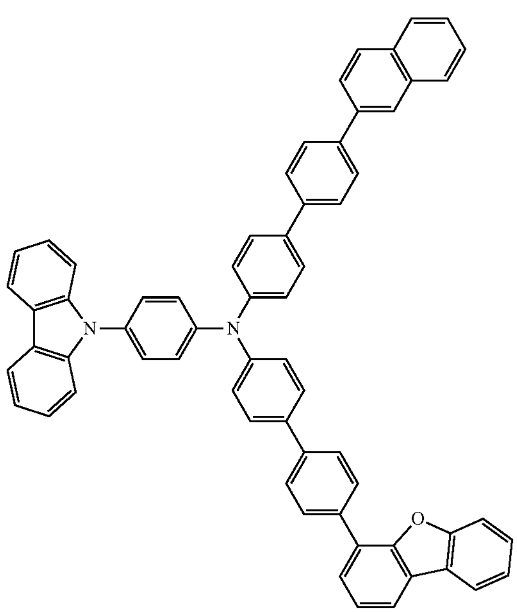
-continued
1-43
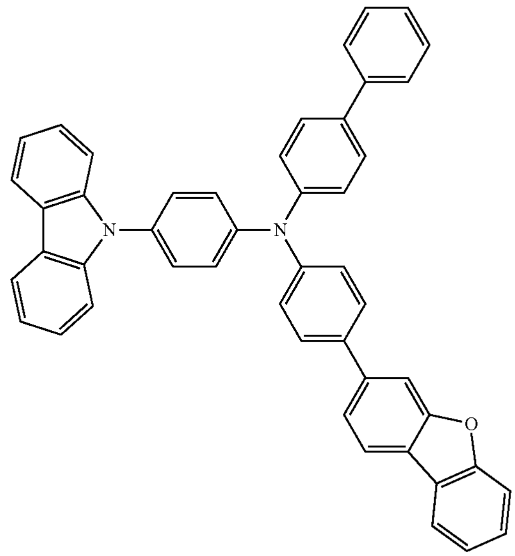
1-44
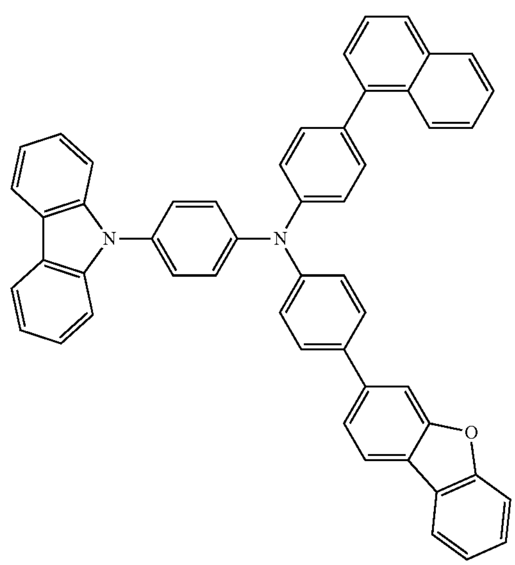

1-45
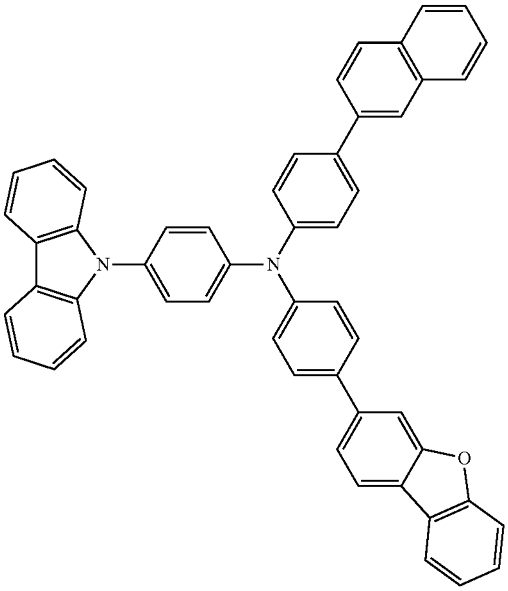
1-46
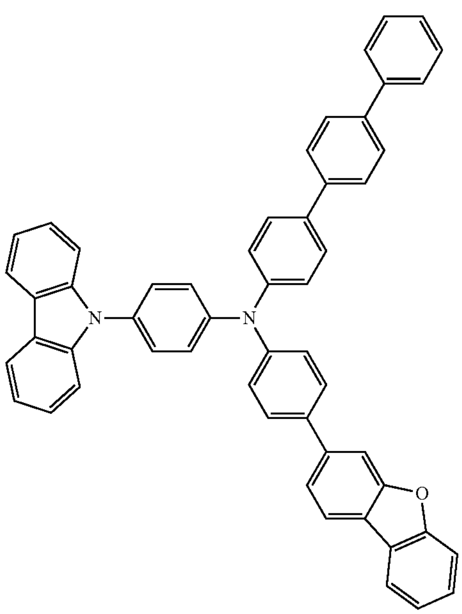
1-47
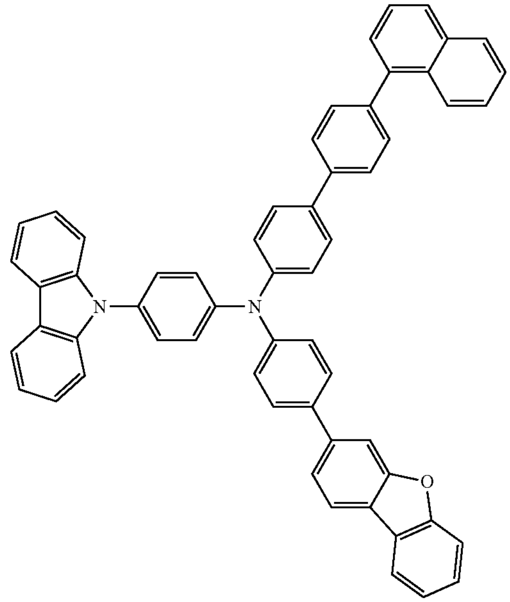
1-48
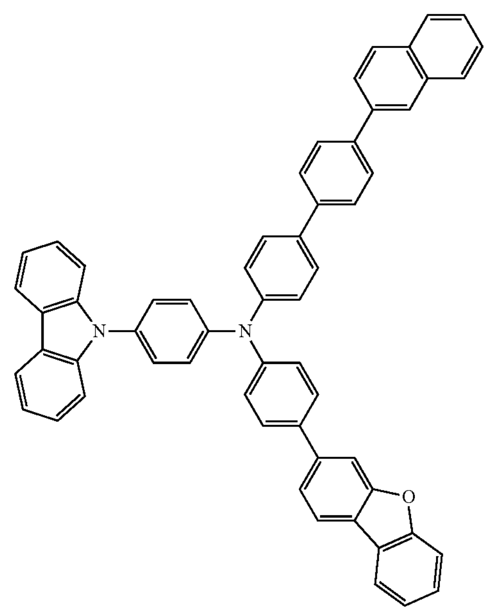

1-49
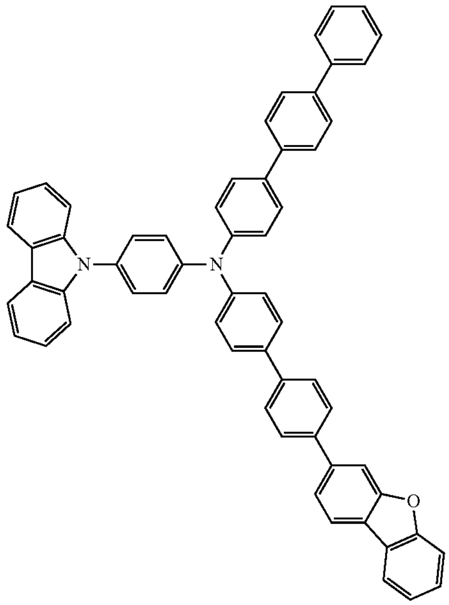
1-50
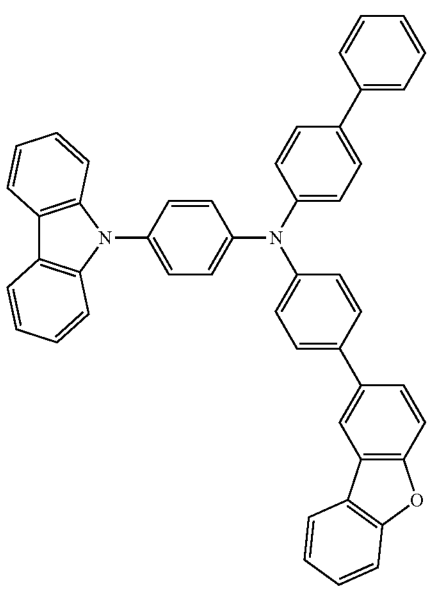
1-51
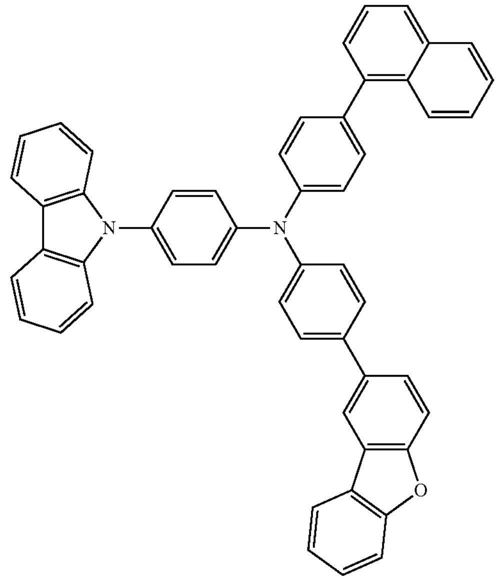
1-52
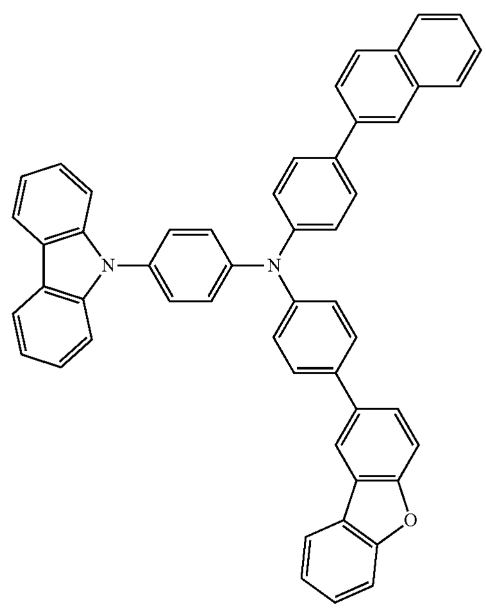

-continued
1-53
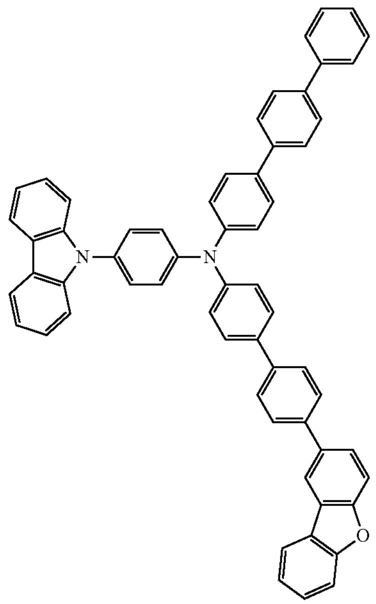
1-55
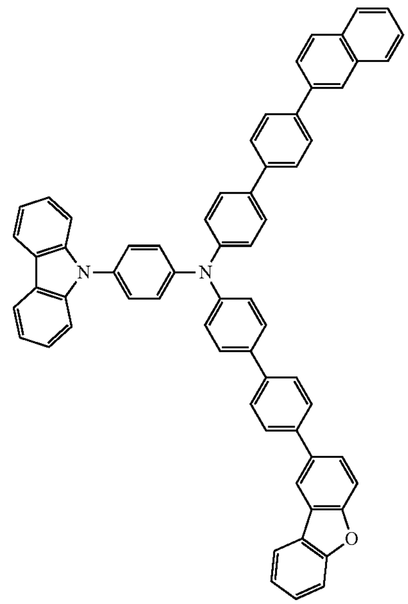
1-54
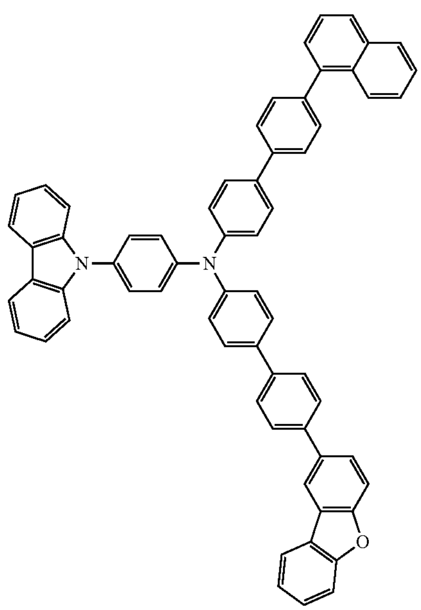
1-56
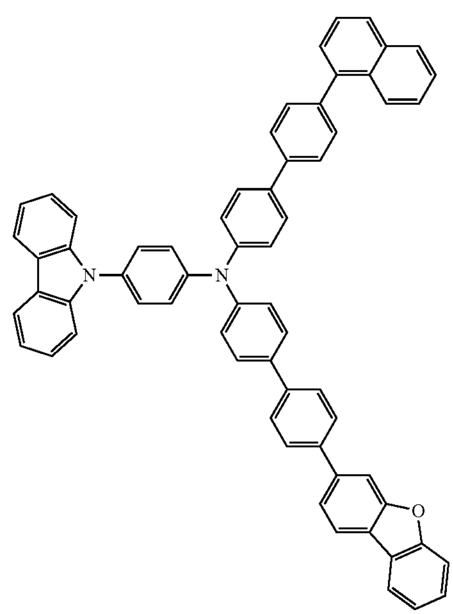

-continued
1-57
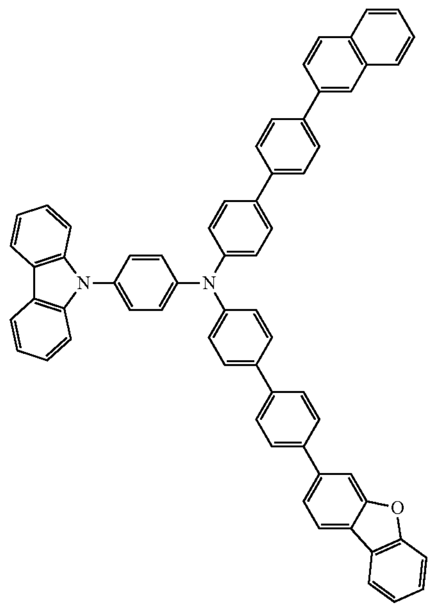
-continued
1-59
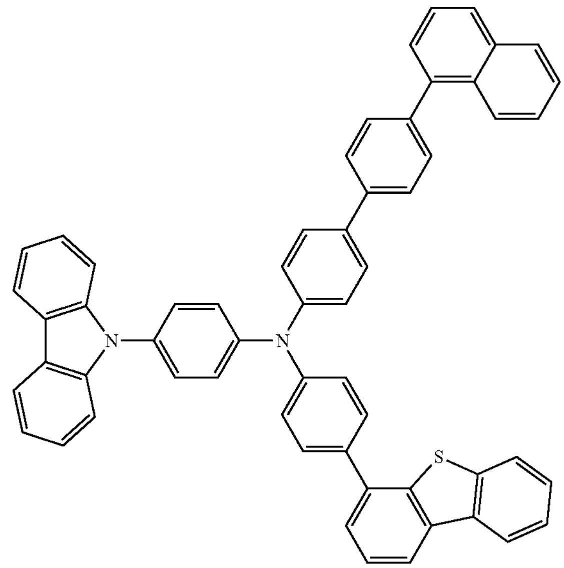
1-58
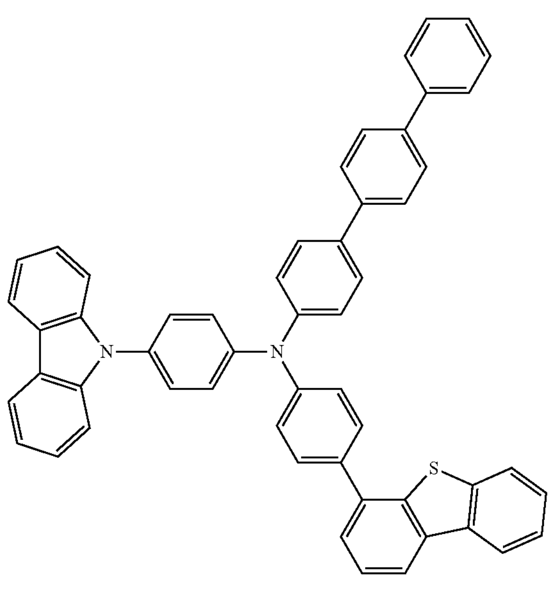
1-60
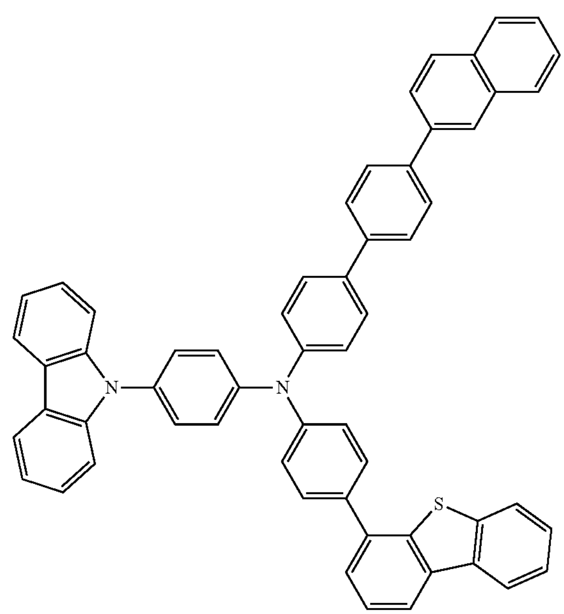

-continued
1-61
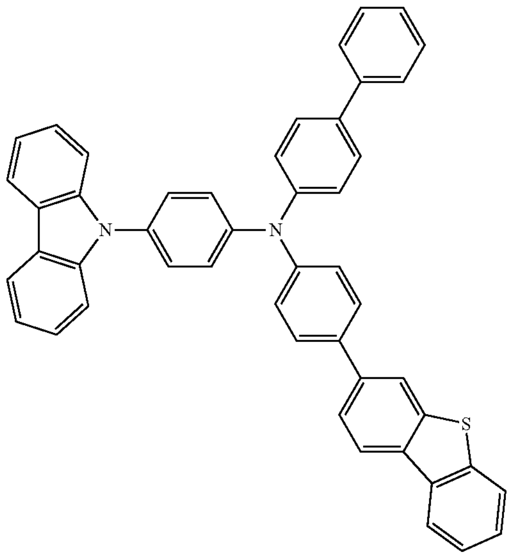
1-62
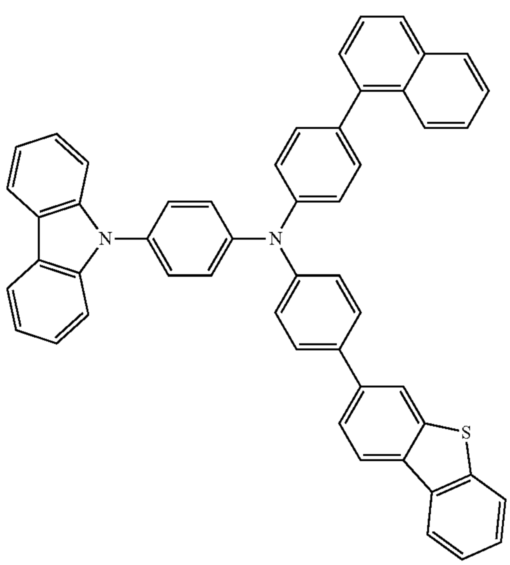
-continued
1-63
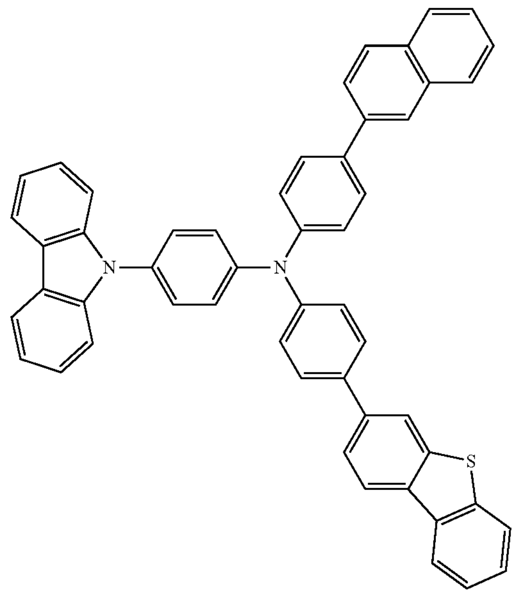
1-64
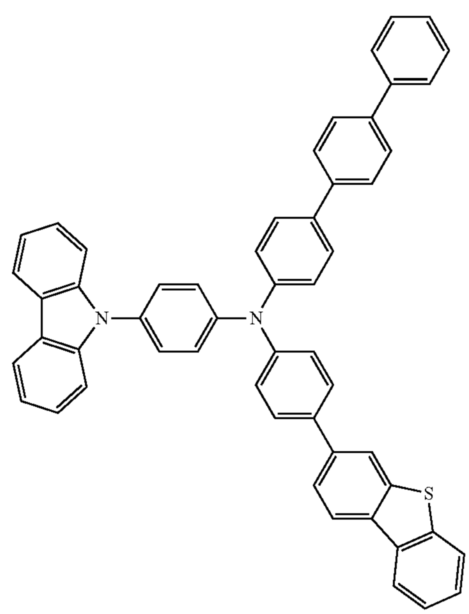

1-65
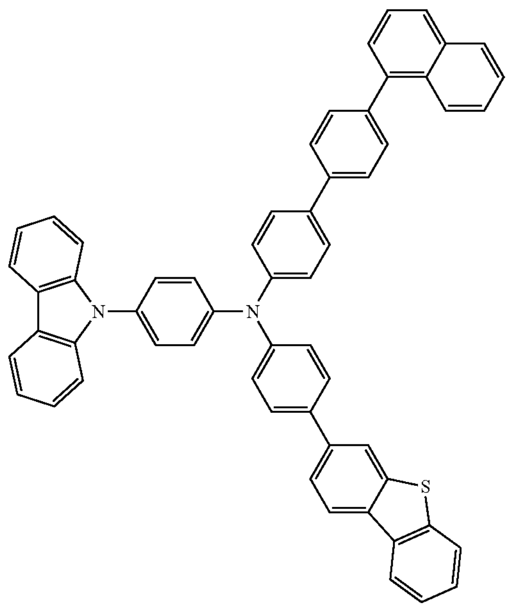
1-67
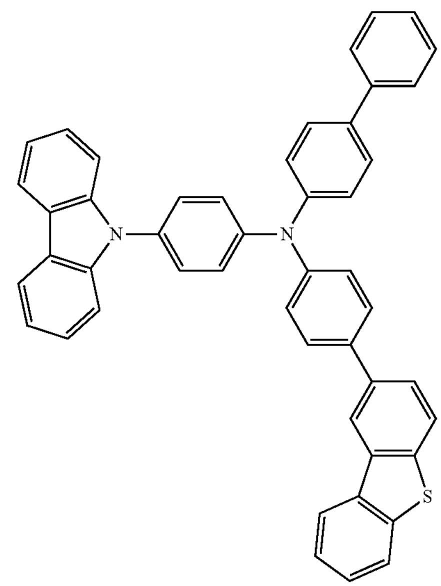
1-66
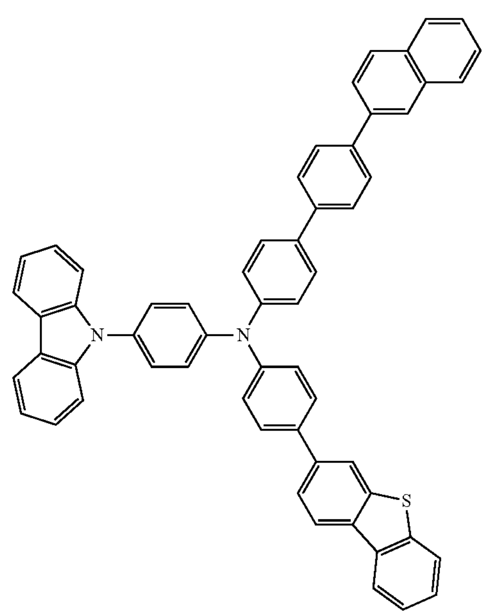
1-68
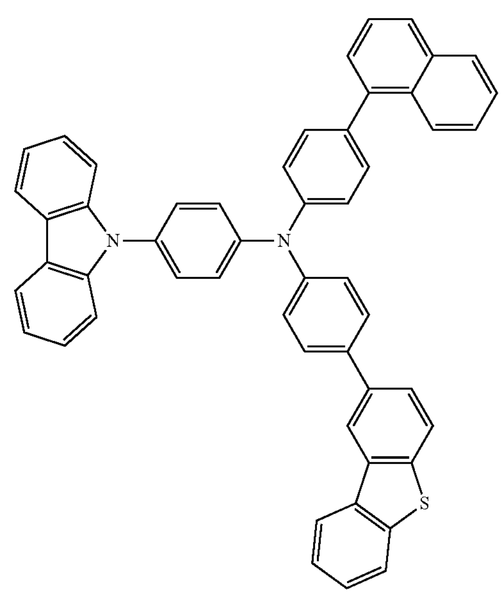

-continued
1-69
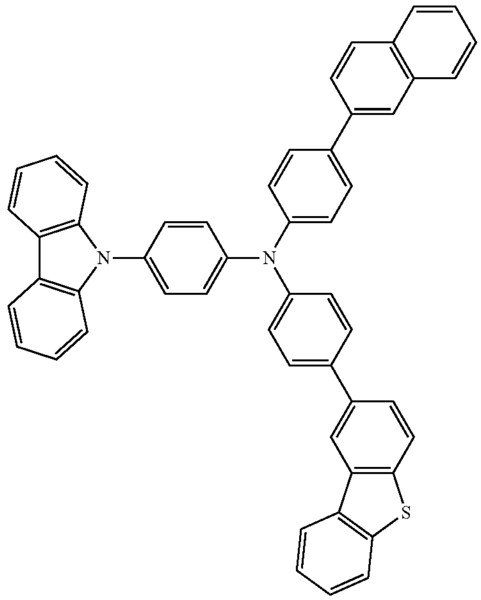
1-70
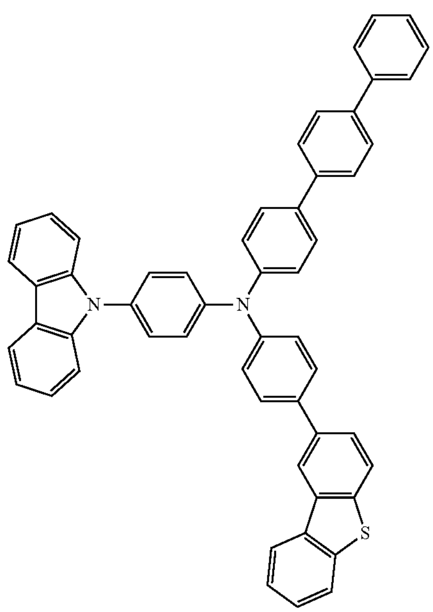
-continued
1-71
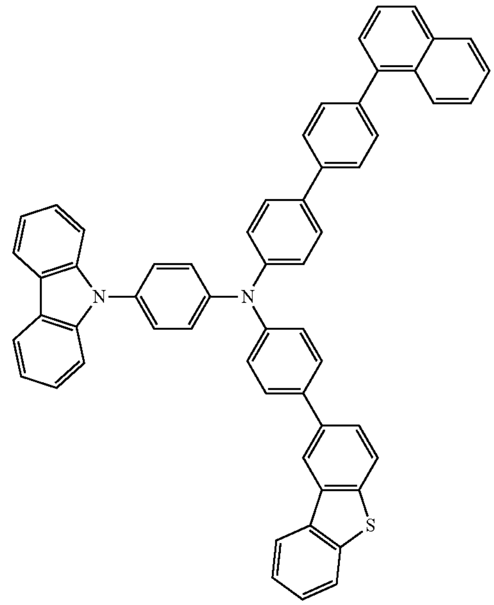
1-72
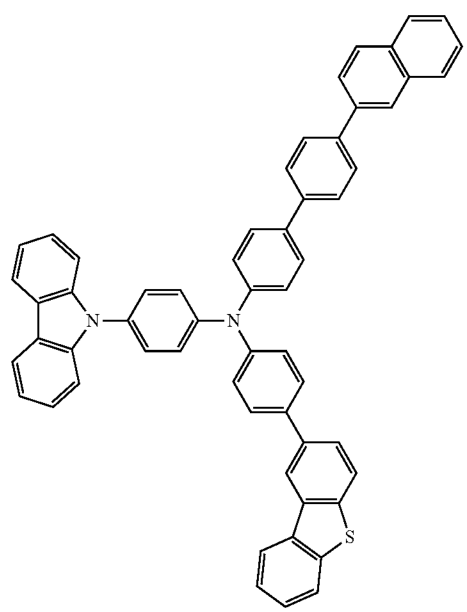

1-73
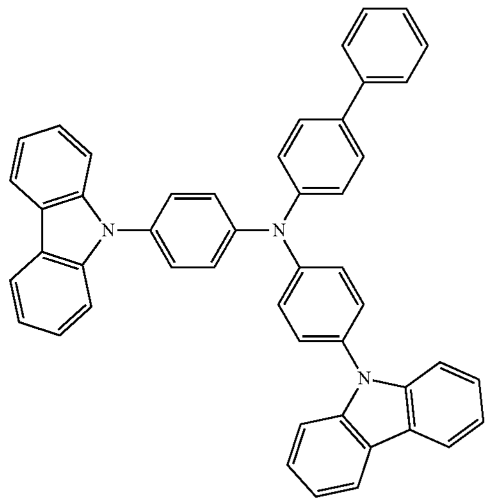
1-74
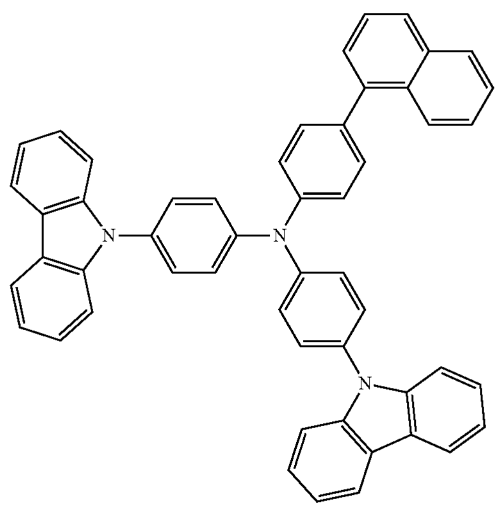
1-75
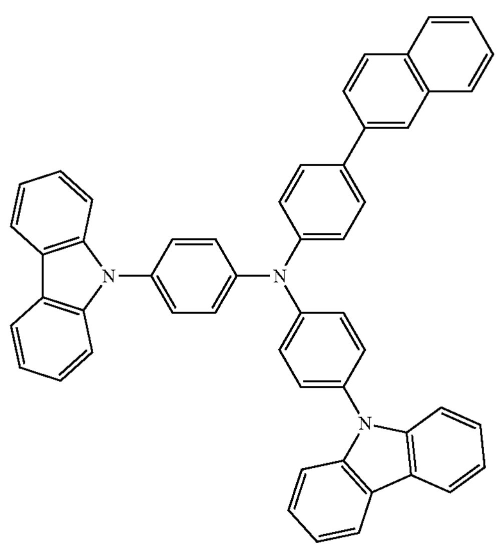
1-76
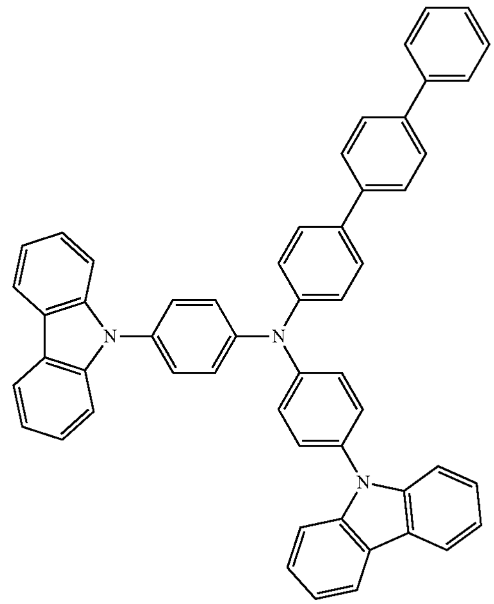
1-77
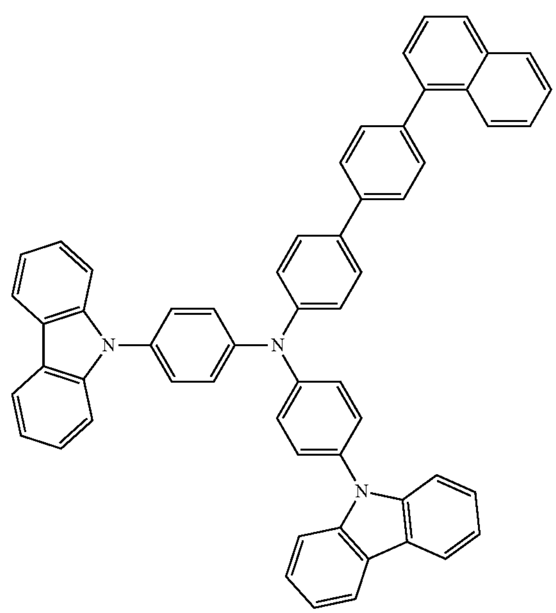

-continued
1-78
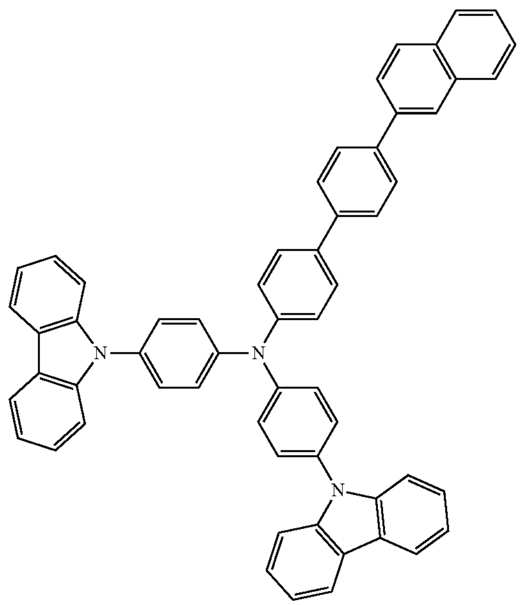
1-79
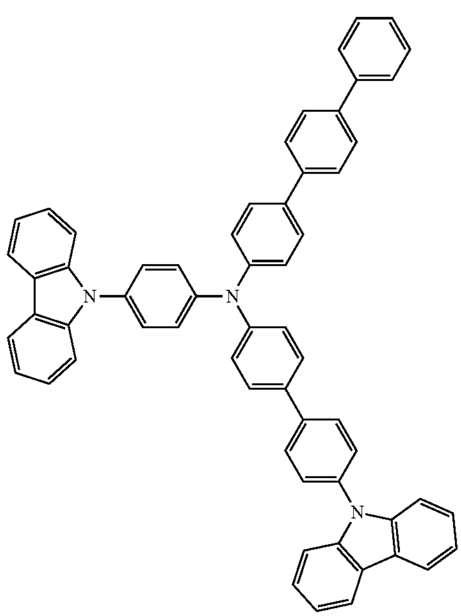
-continued
1-80
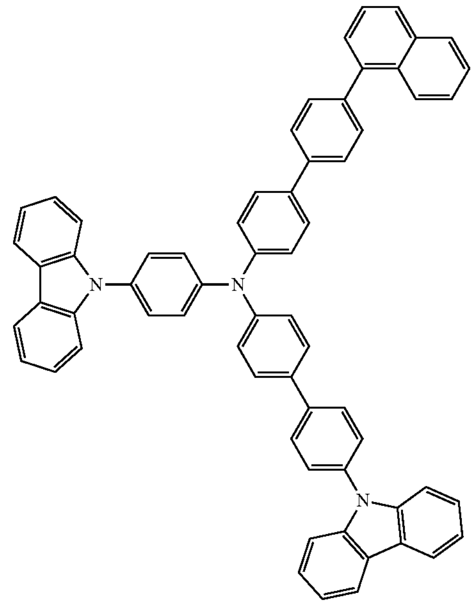
1-81
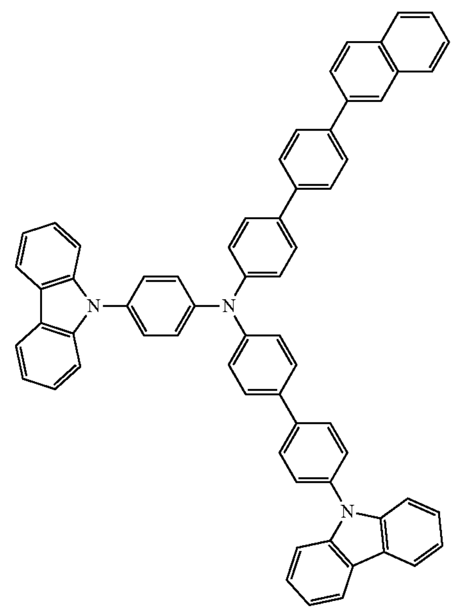
1-82
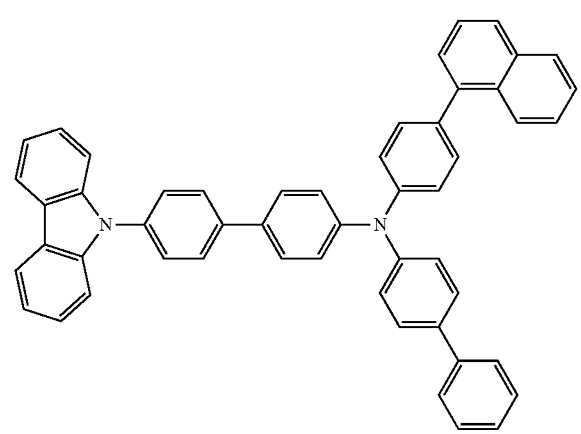

-continued
1-83
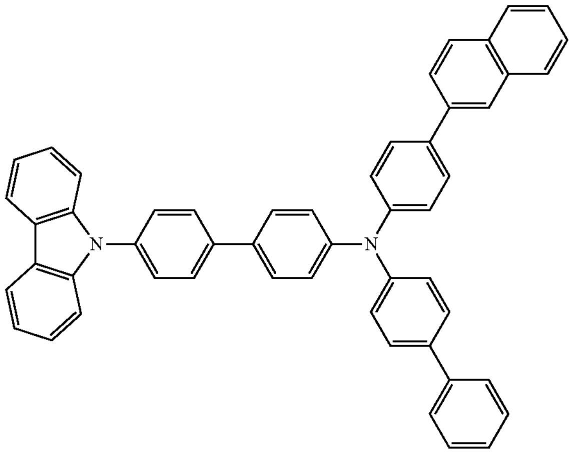
1-84
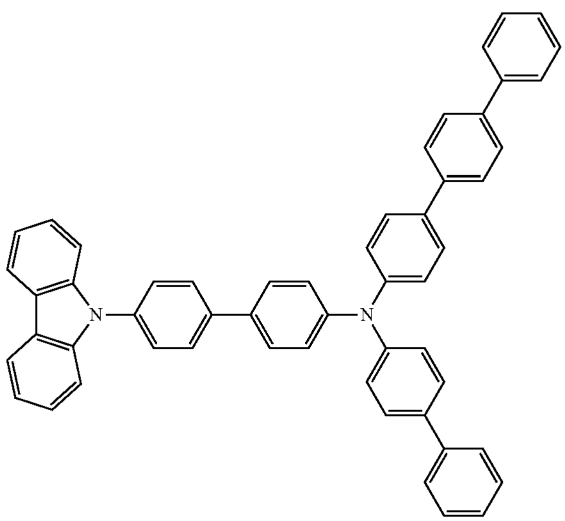
1-85
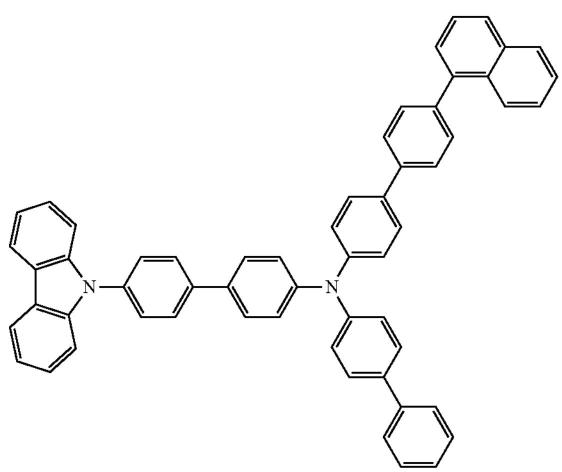
-continued
1-86
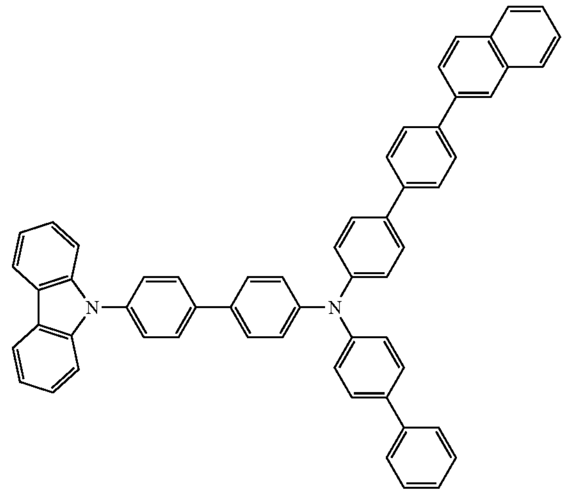
1-87
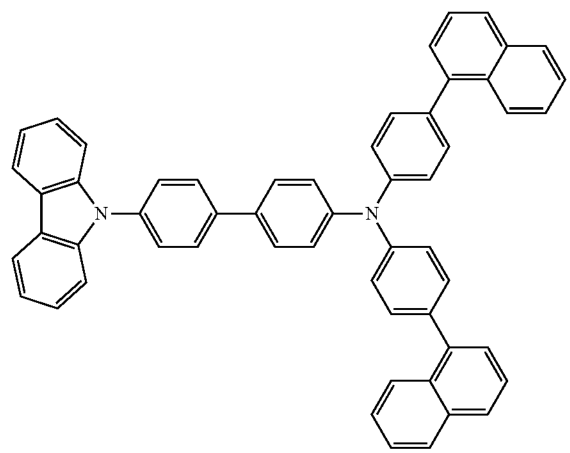
1-88
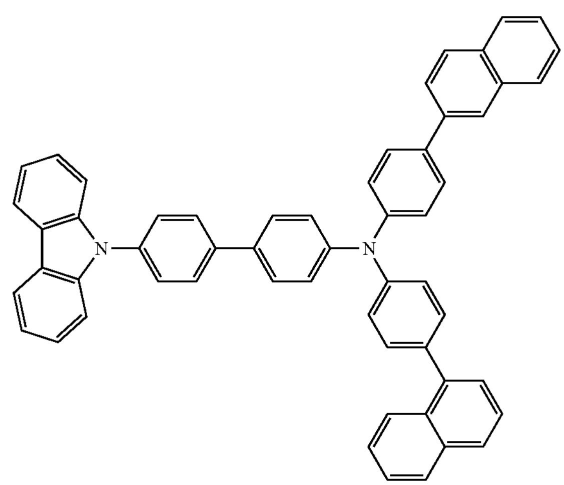

-continued
1-89
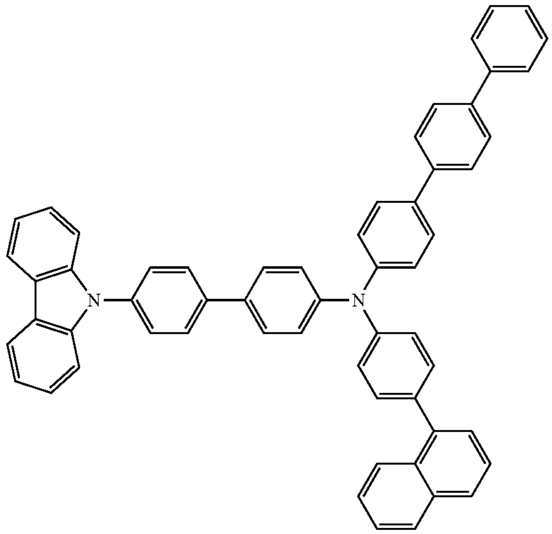
1-90
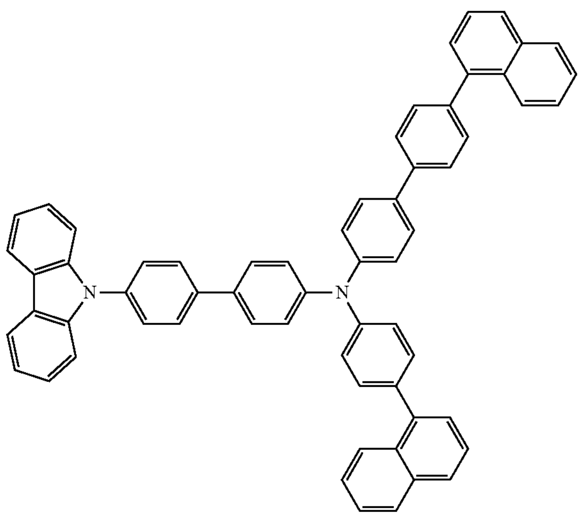
1-91
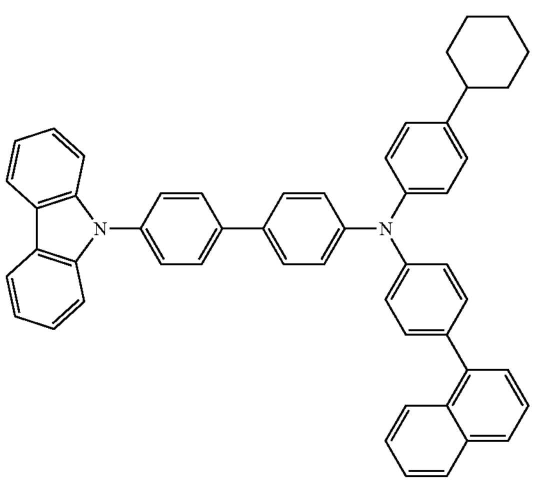
-continued
1-92
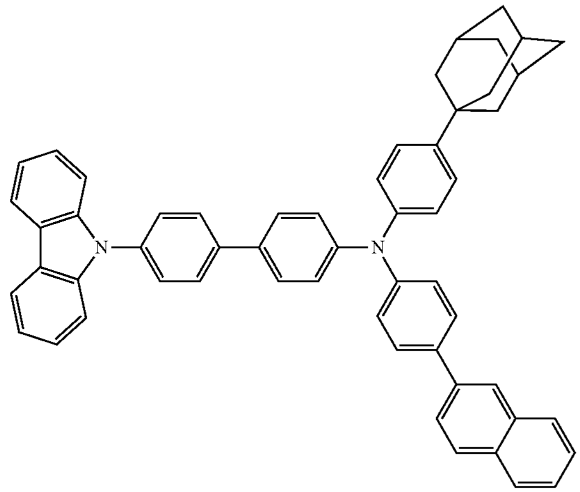
1-93
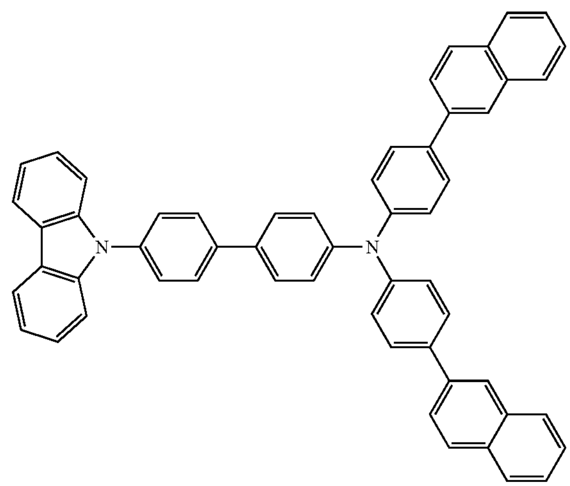
1-94
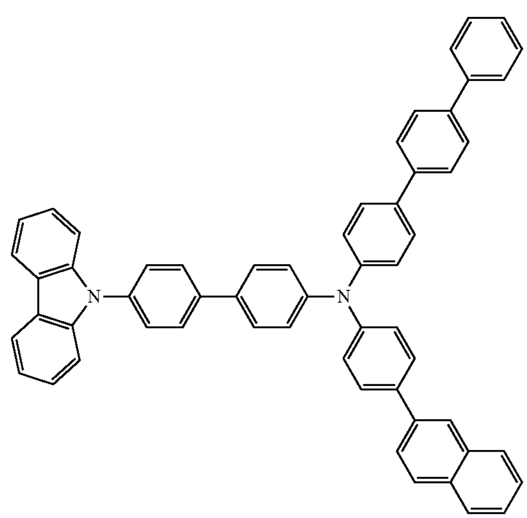

-continued
1-95
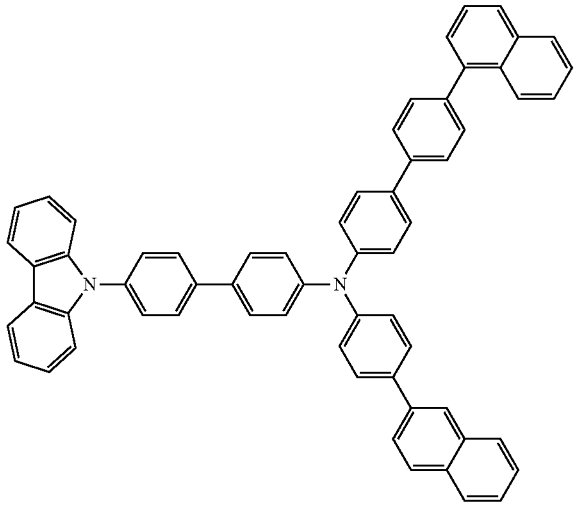
1-96
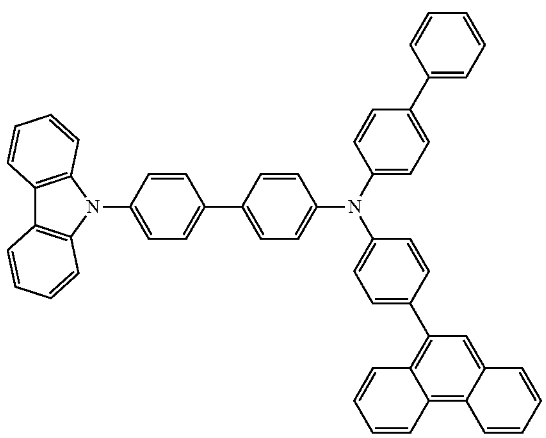
1-97
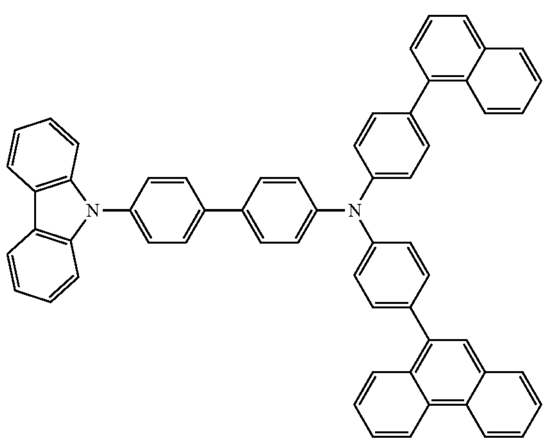
-continued
1-98
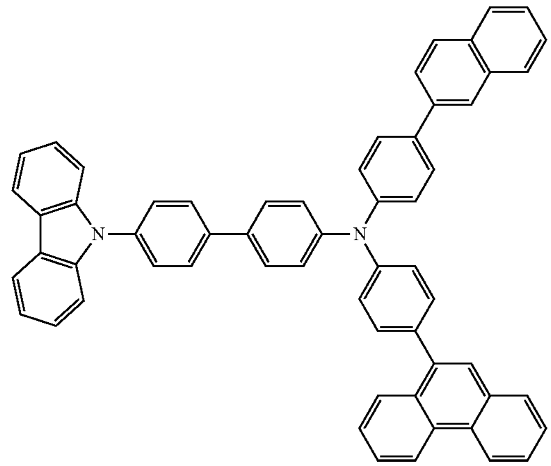
1-99
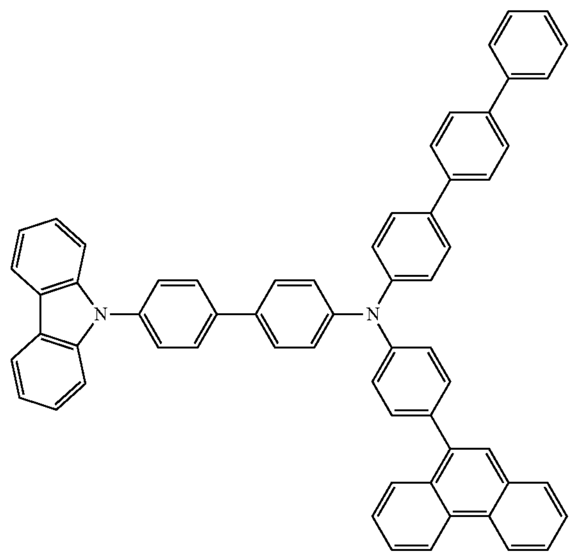
1-100
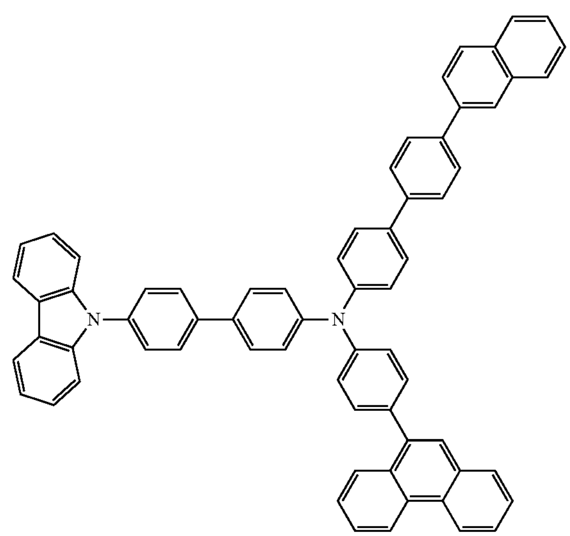

-continued
1-101
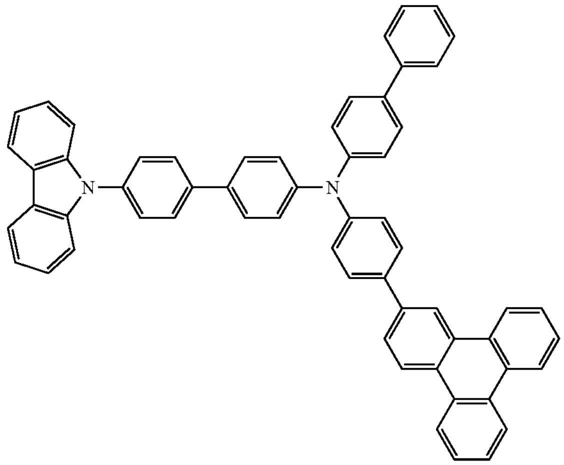
1-102
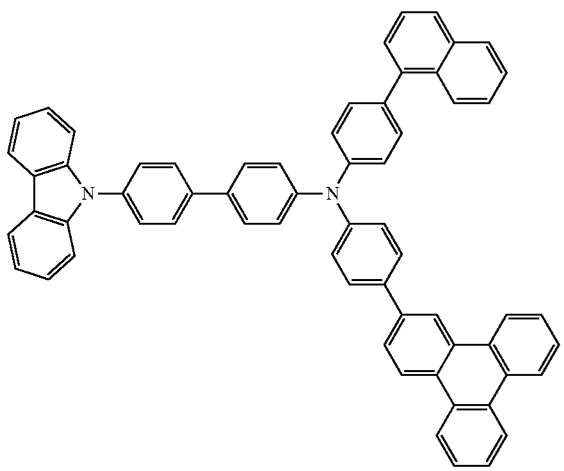
1-103
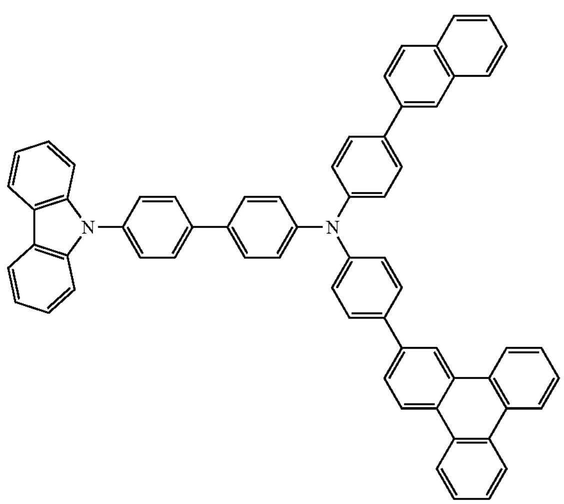
-continued
1-104
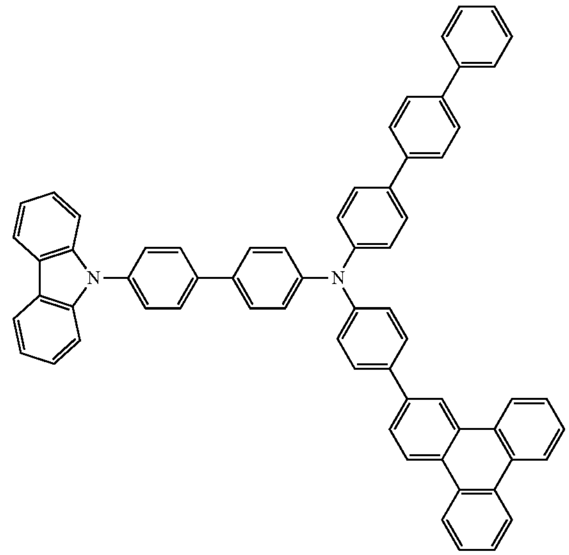
1-105
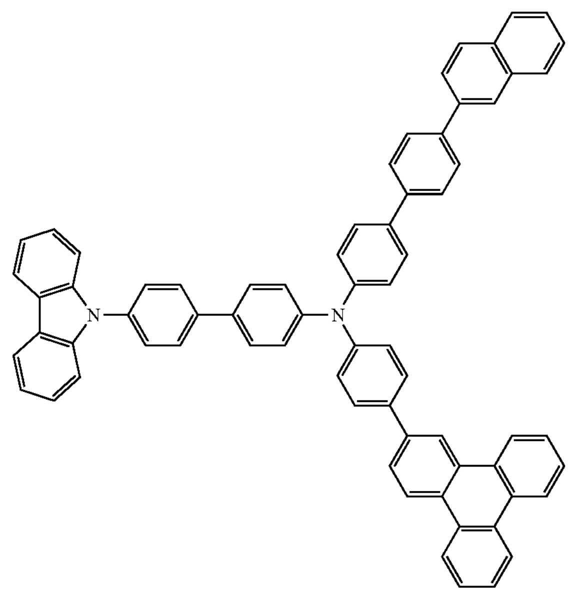
1-106
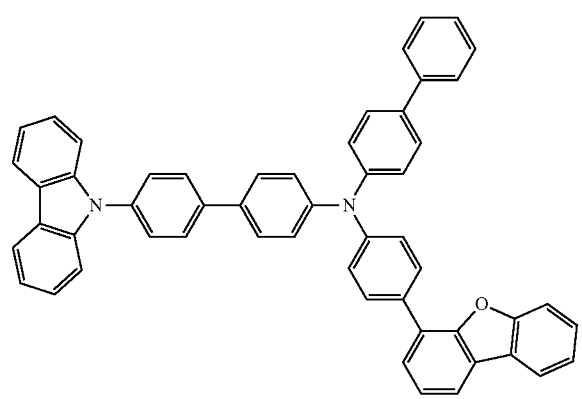

-continued
1-107
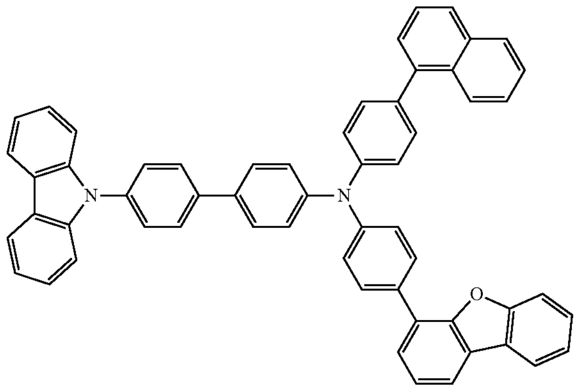
1-108
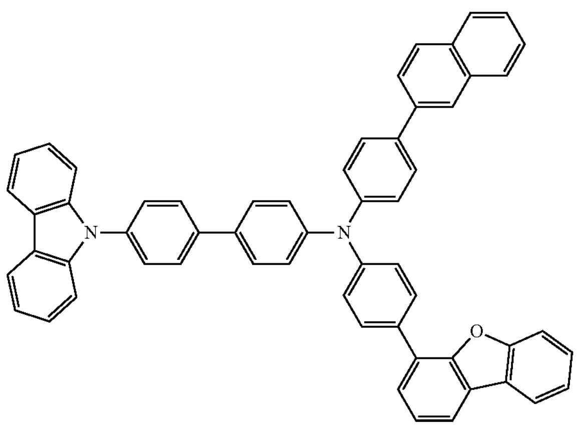
1-109
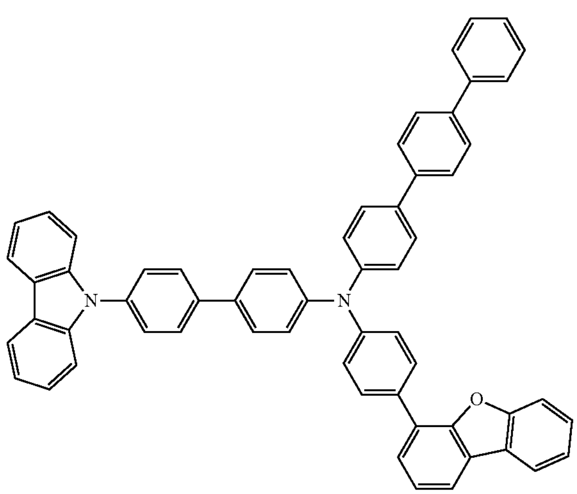
-continued
1-110
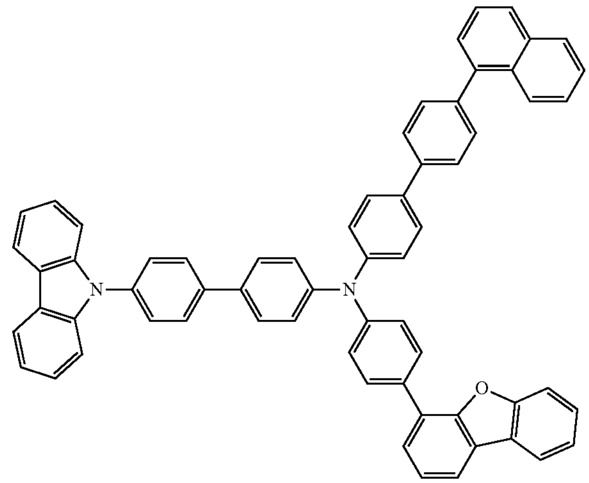
1-111
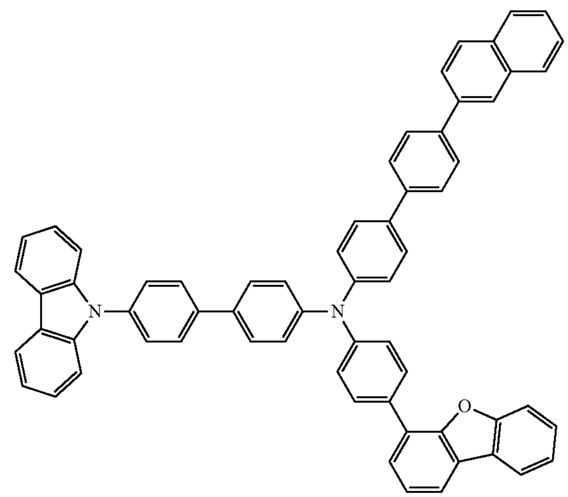
1-112
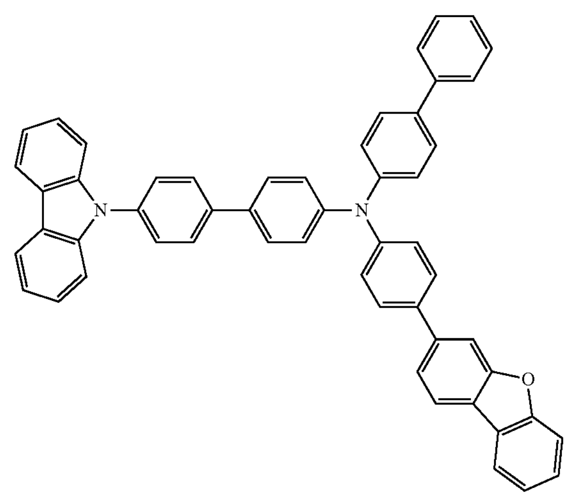

-continued
1-113
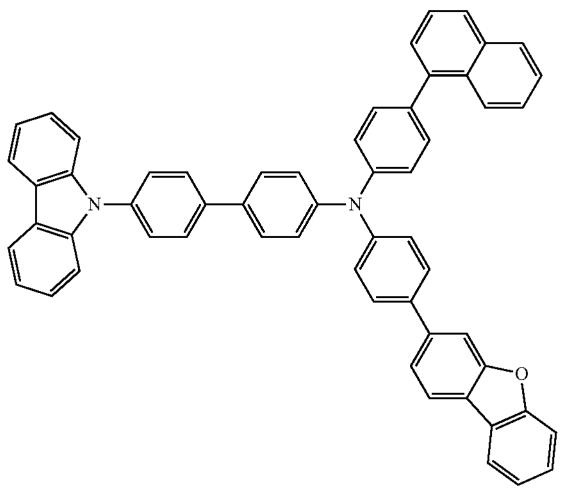
1-114
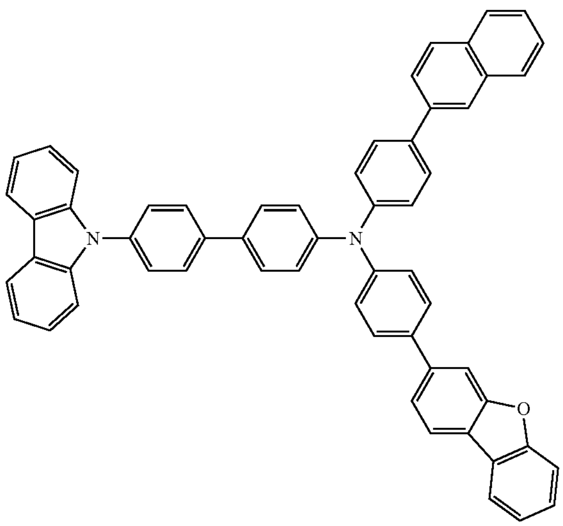
1-115
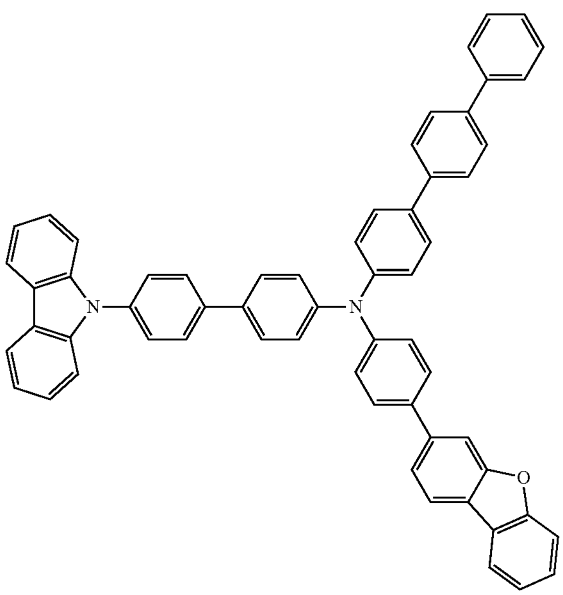
-continued
1-116
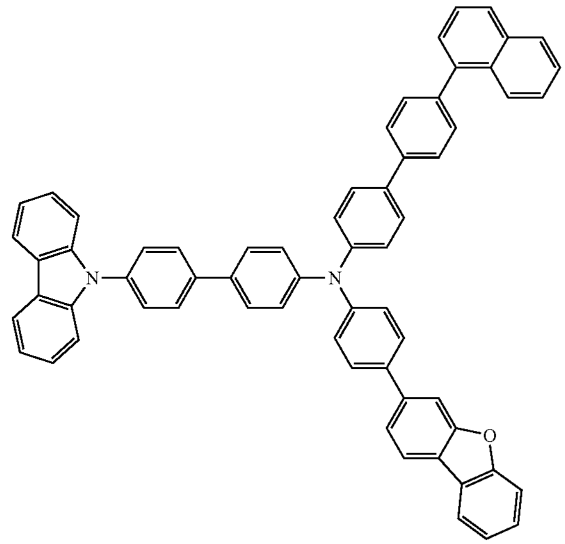
1-117
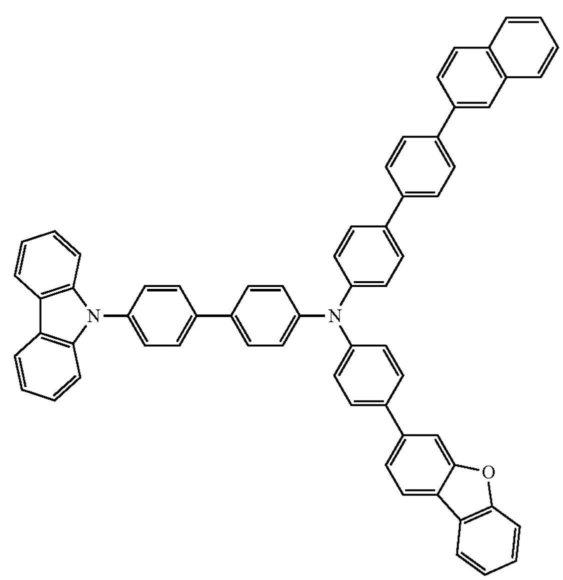

1-118
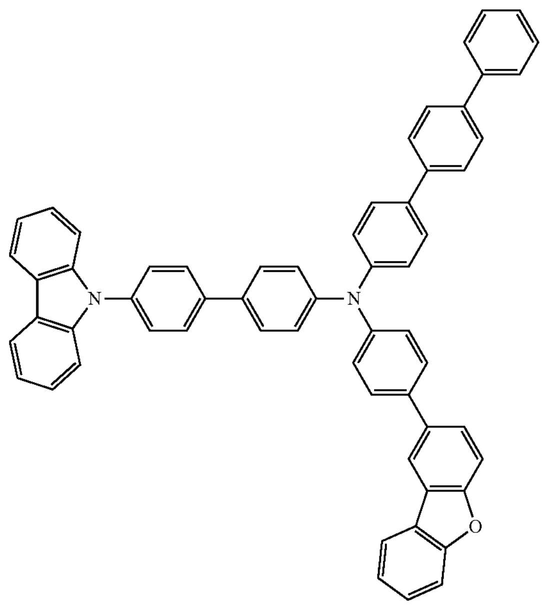
1-119
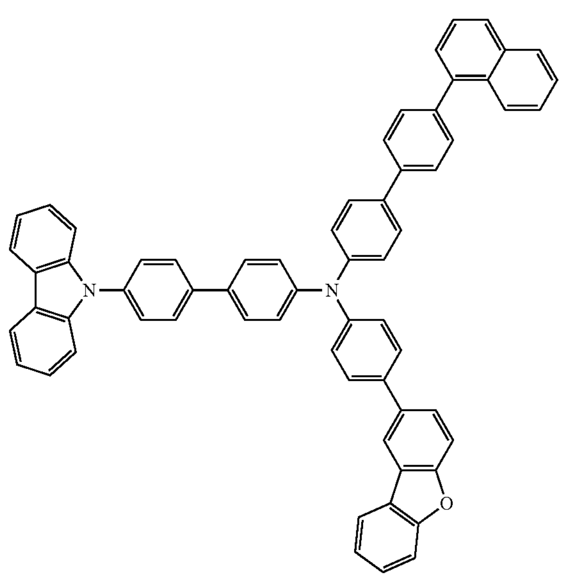
1-120
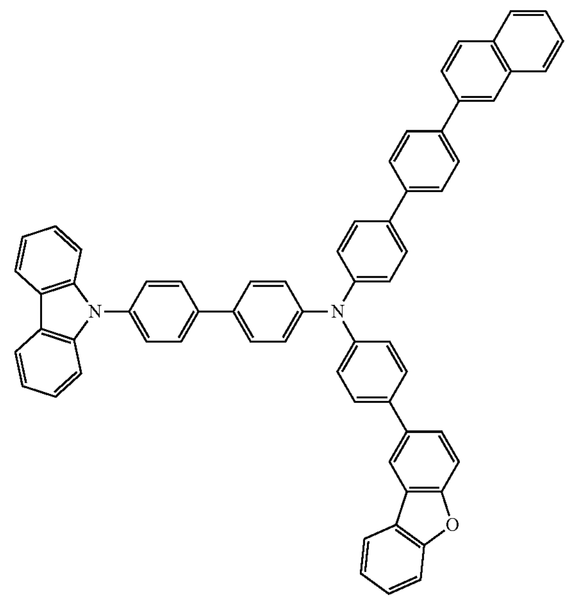
1-121
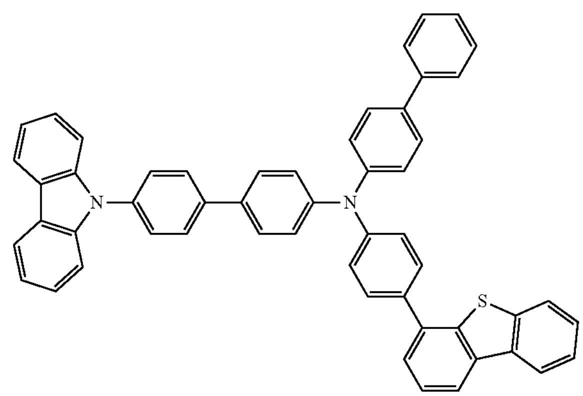
1-122
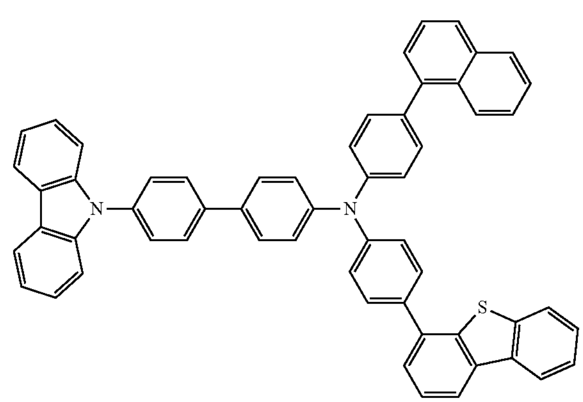

1-123
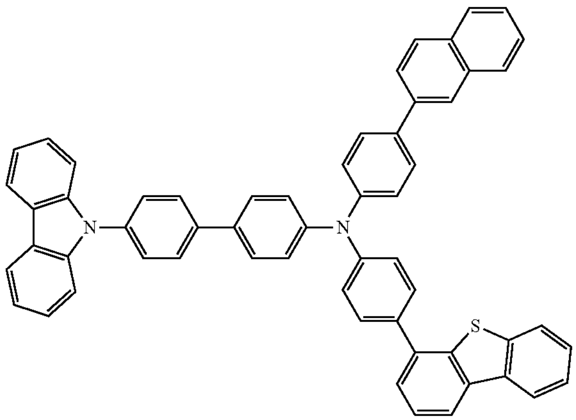
1-124
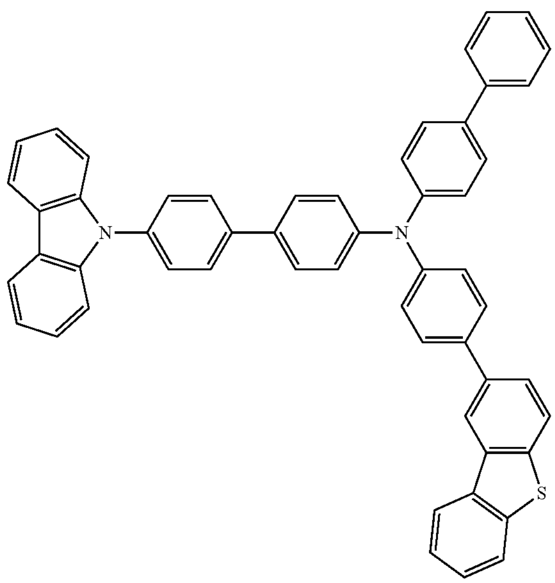
1-125
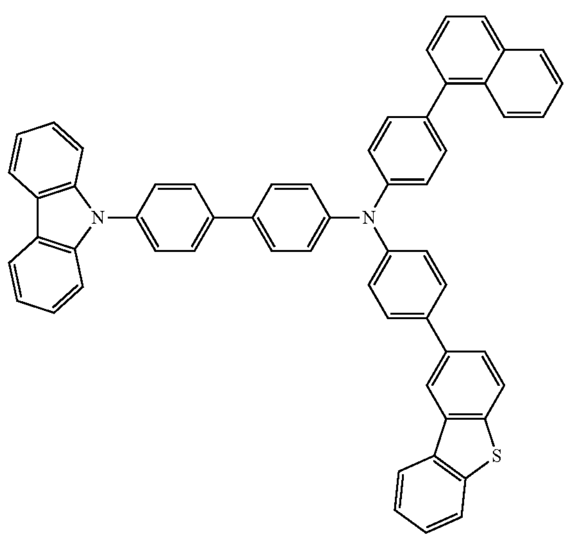
1-126
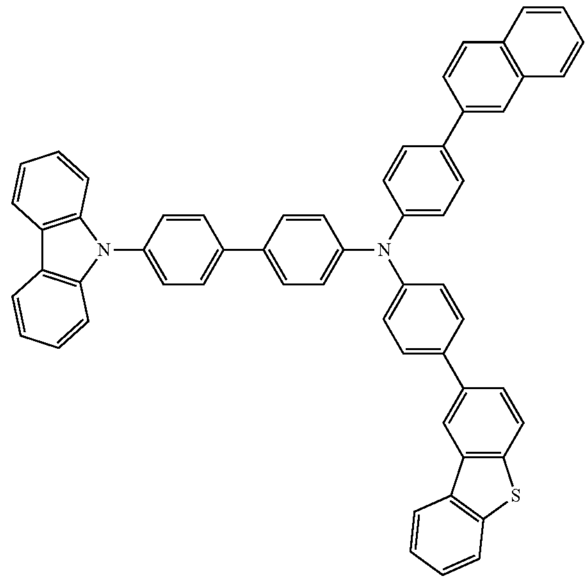
1-127
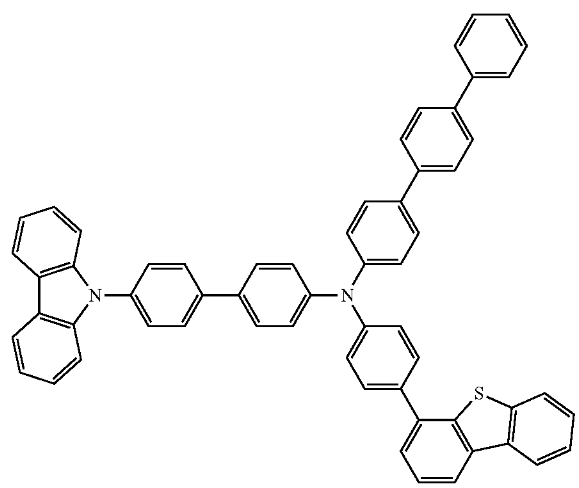
1-128
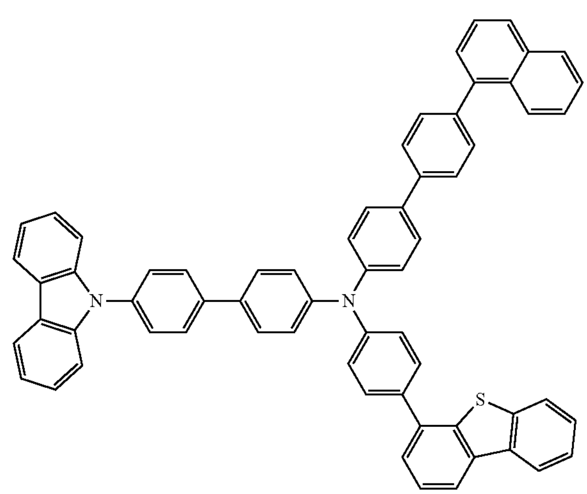

-continued
1-129
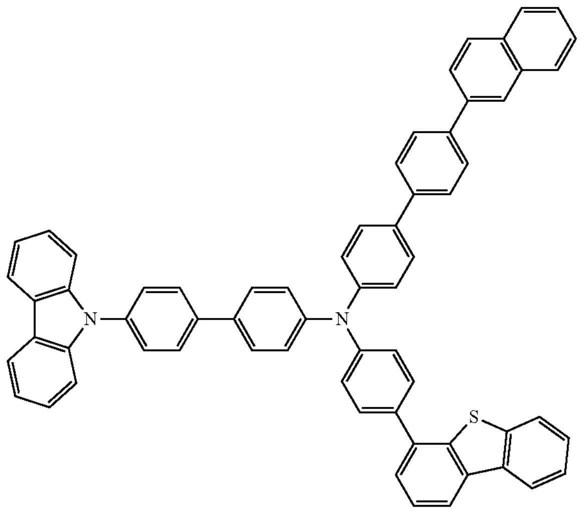
1-130
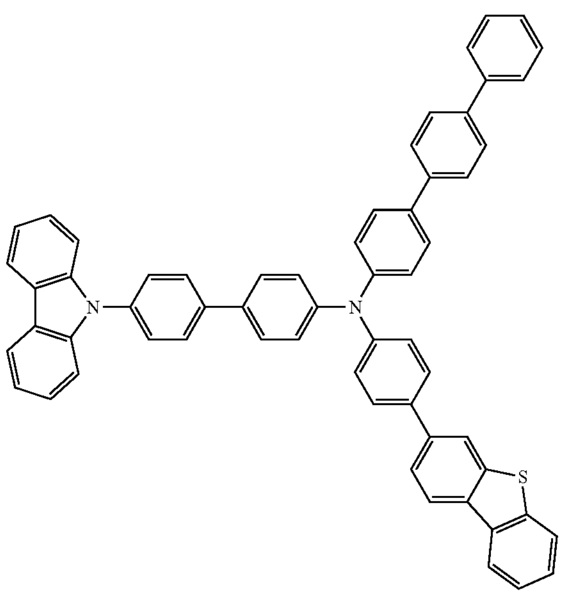
-continued
1-131
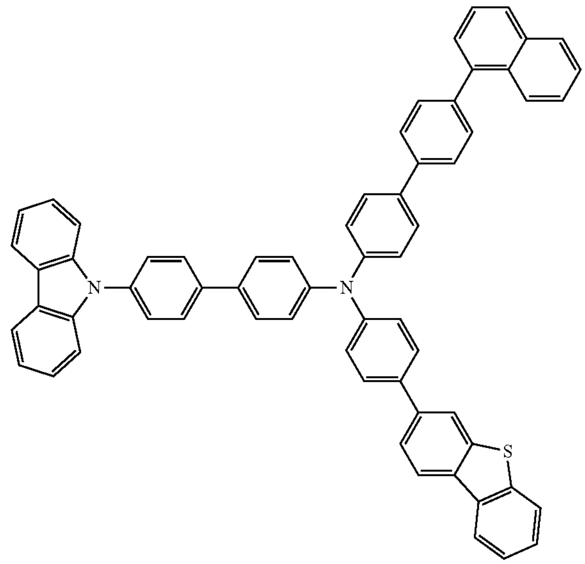
1-132
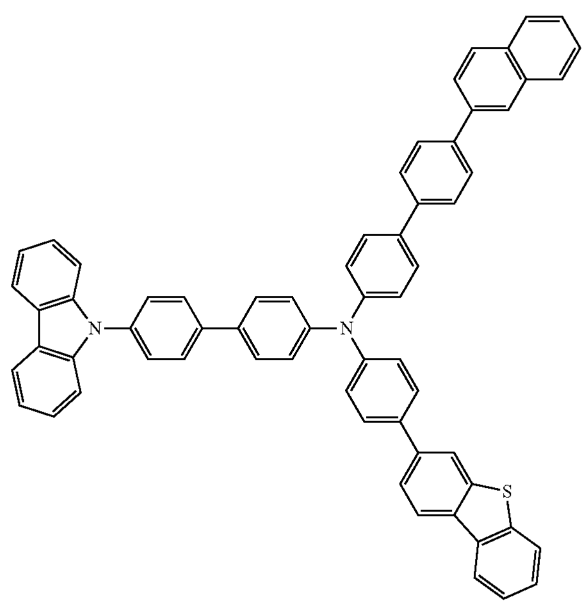

1-133
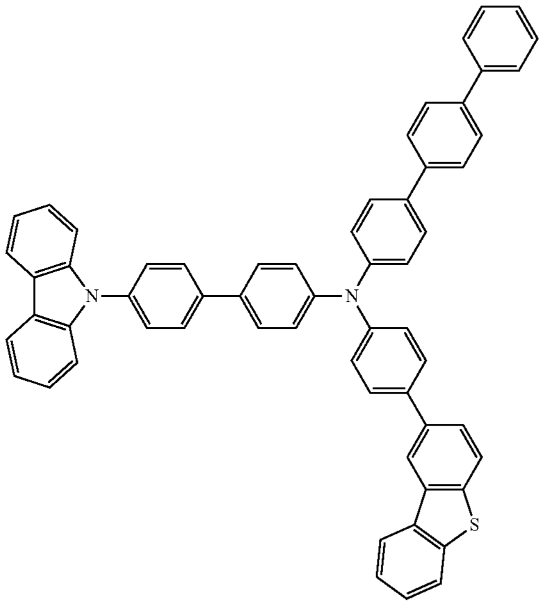
1-134
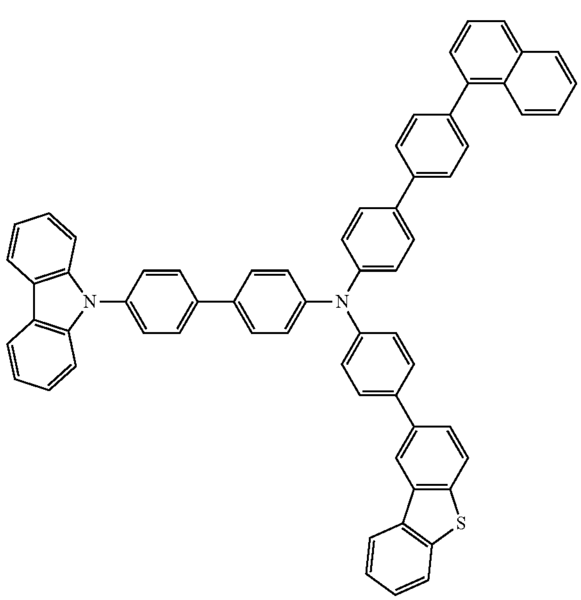
1-135
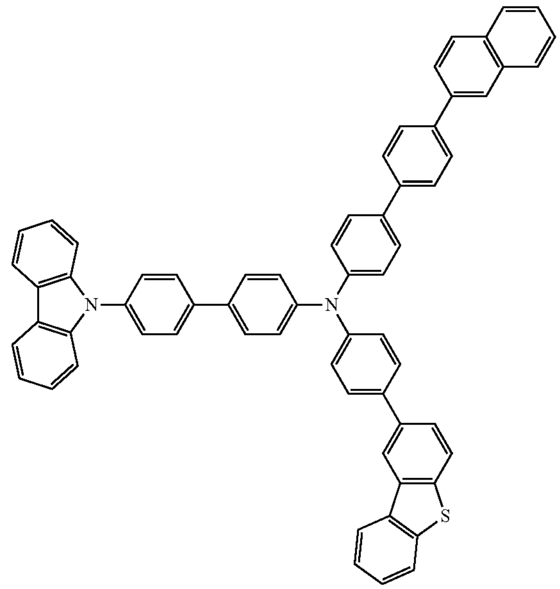
1-136
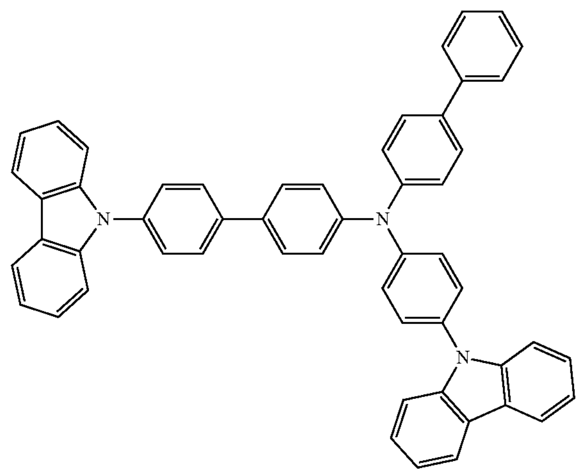
1-137
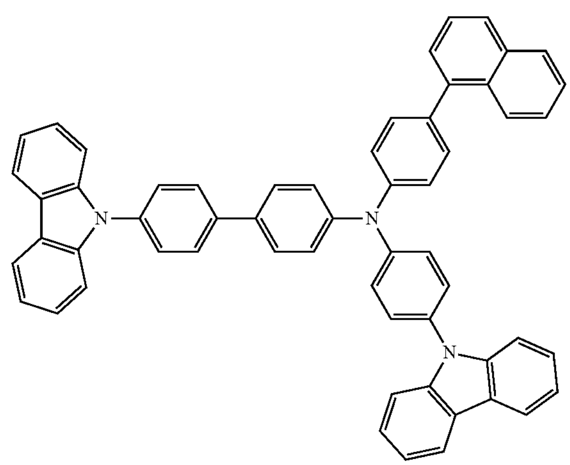

-continued
1-138
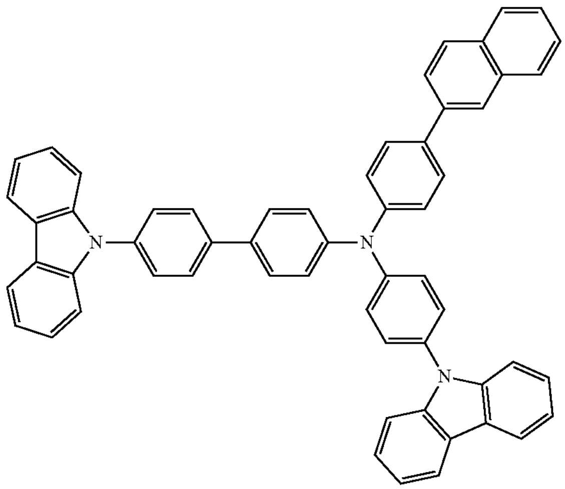
1-139
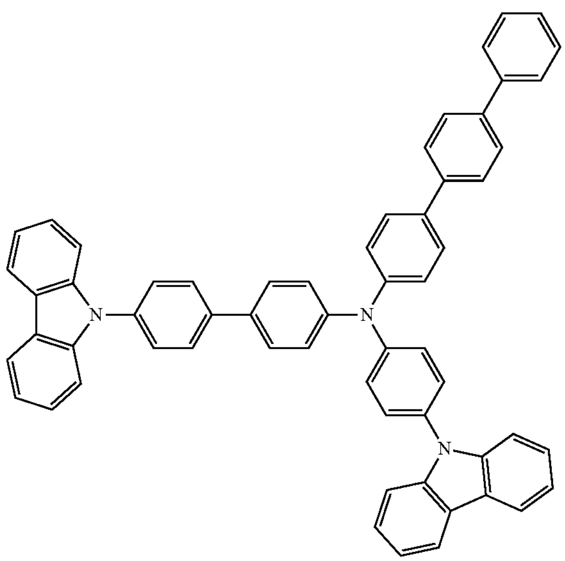
1-140
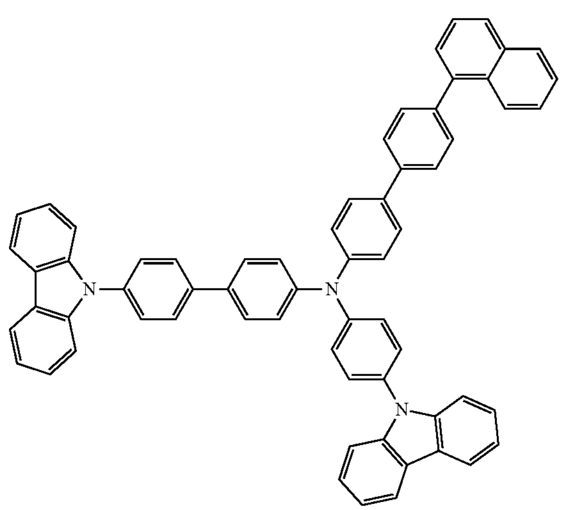
-continued
1-141
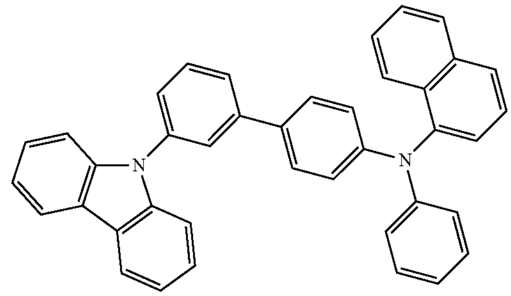
1-142
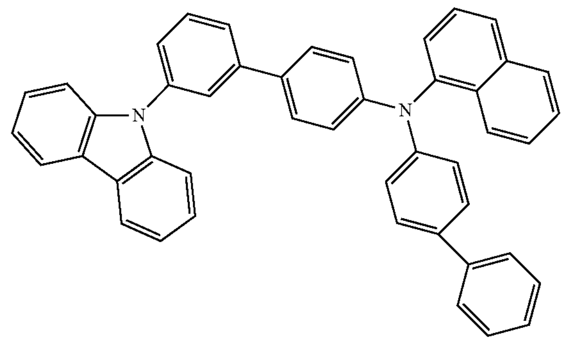
1-143
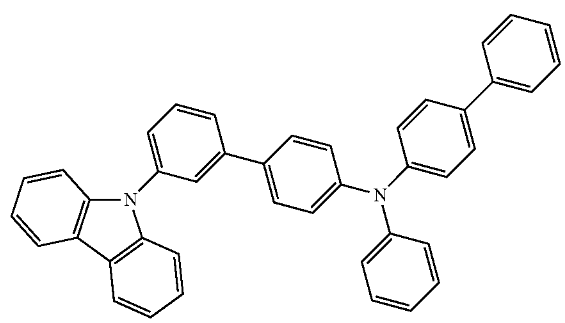
1-144
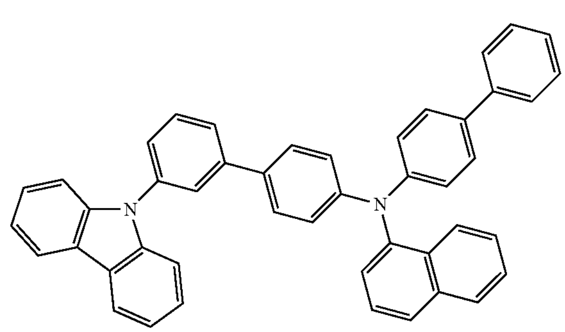

-continued
1-145
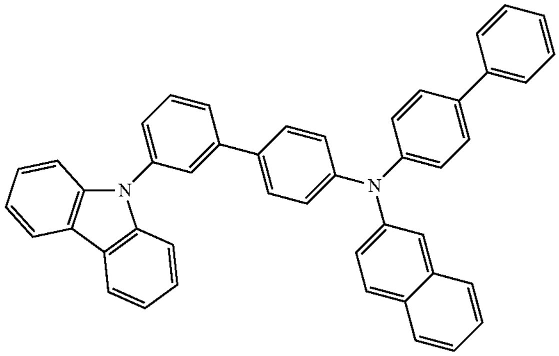
1-146
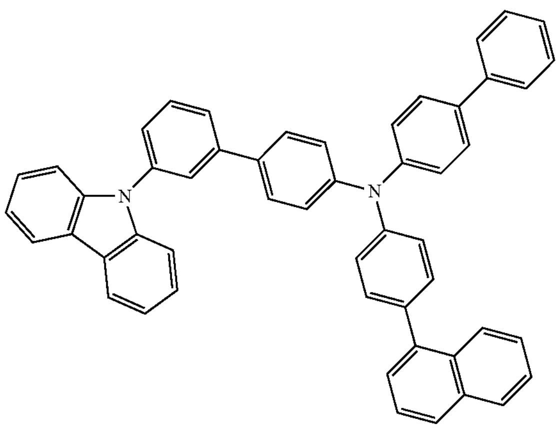
1-147
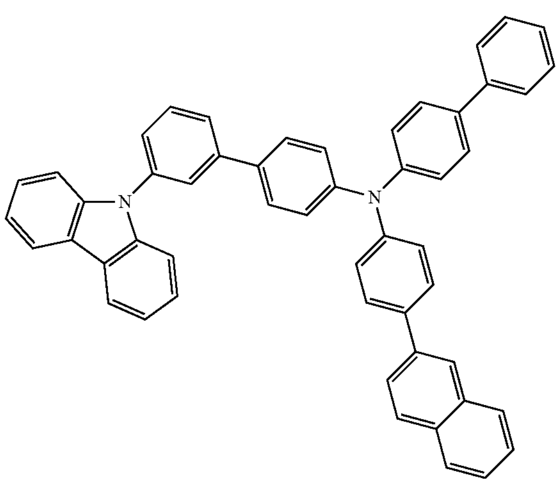
-continued
1-148
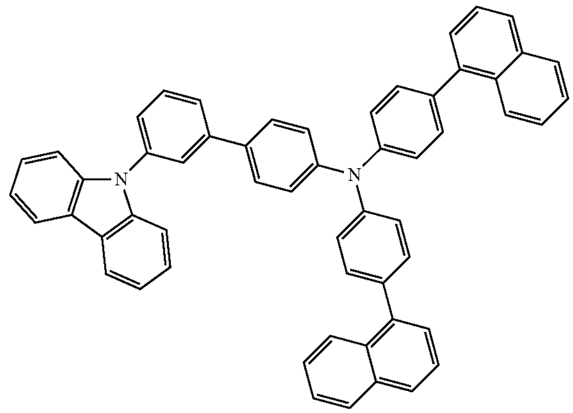
1-149
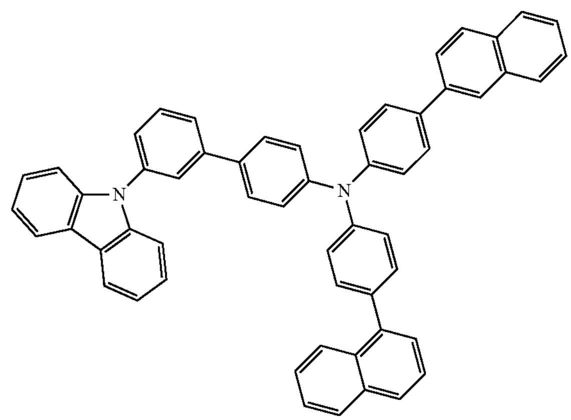
1-150
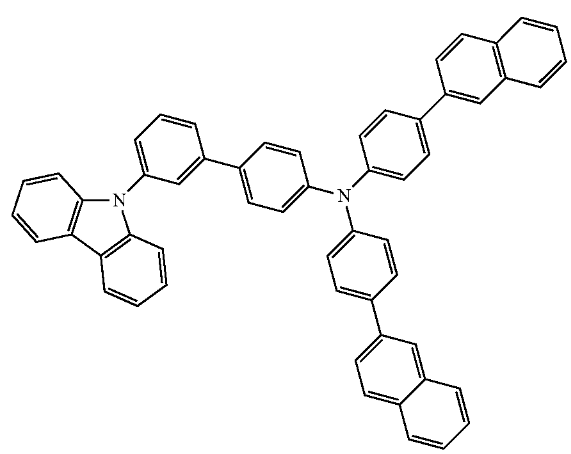

1-151
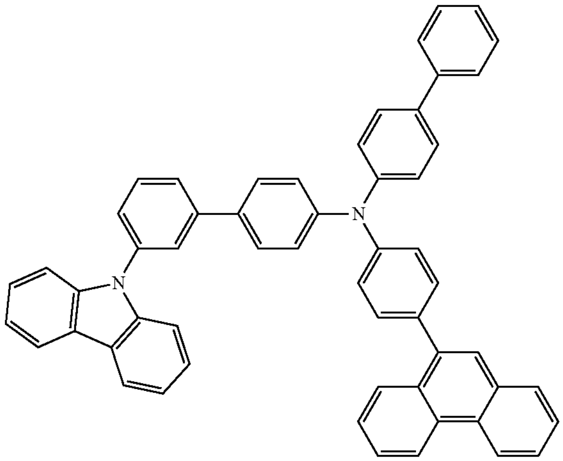
1-152
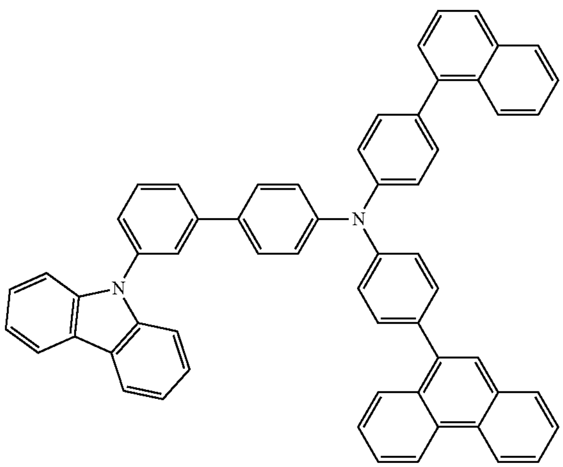
1-153
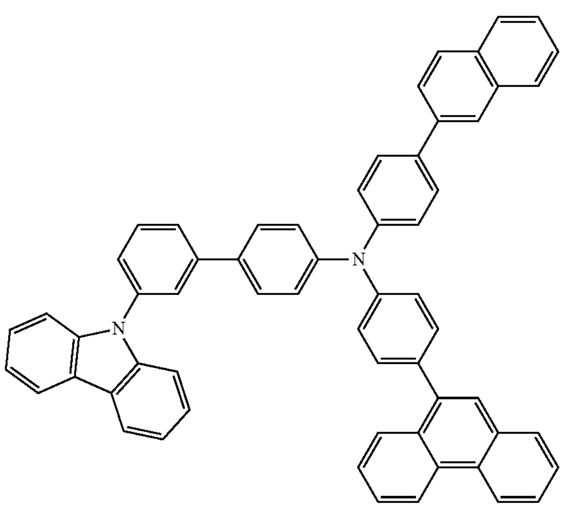
1-154
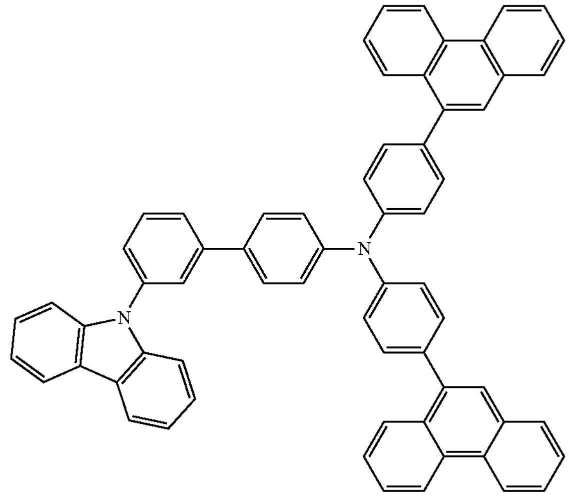
1-155
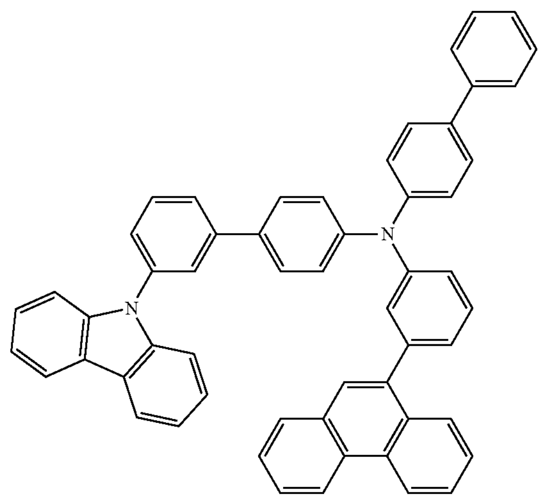
1-156
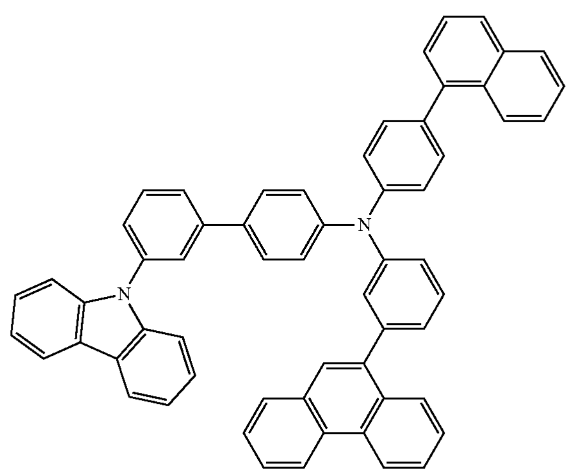

-continued
1-157
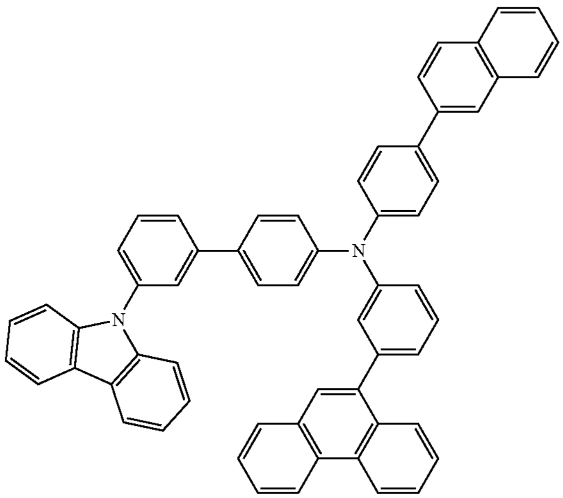
1-158
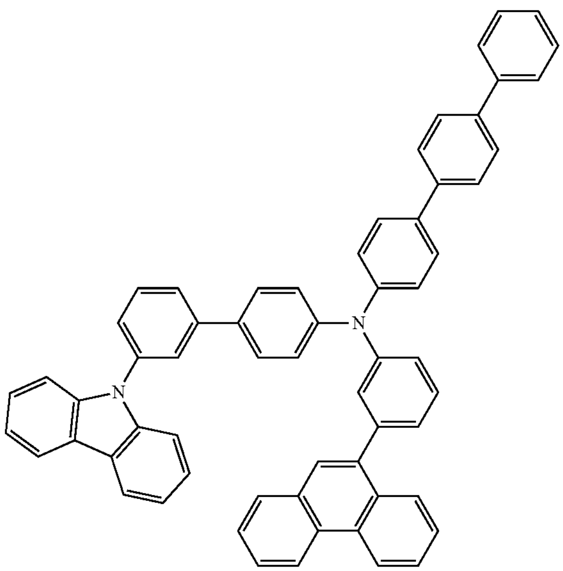
1-159
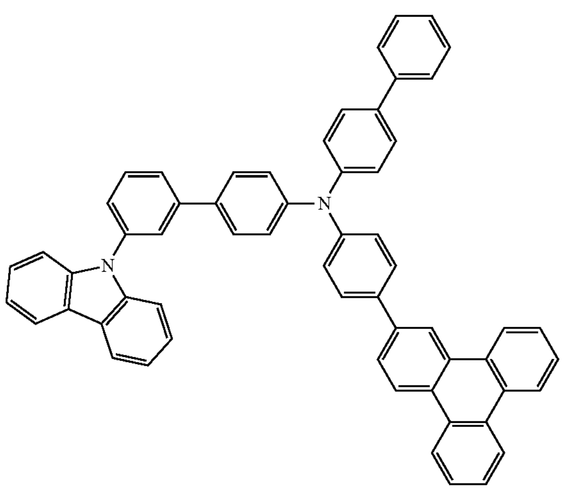
-continued
1--160
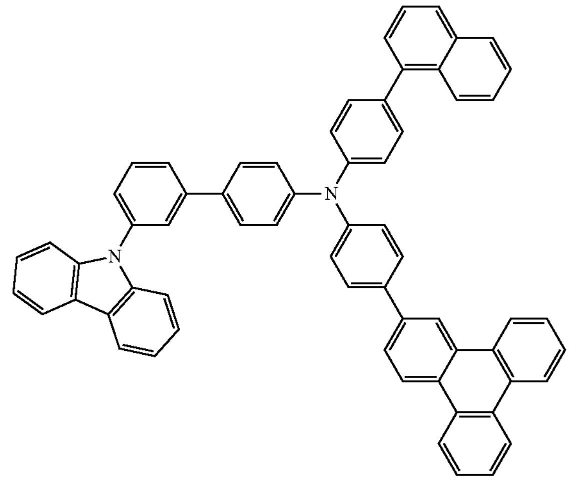
1-161
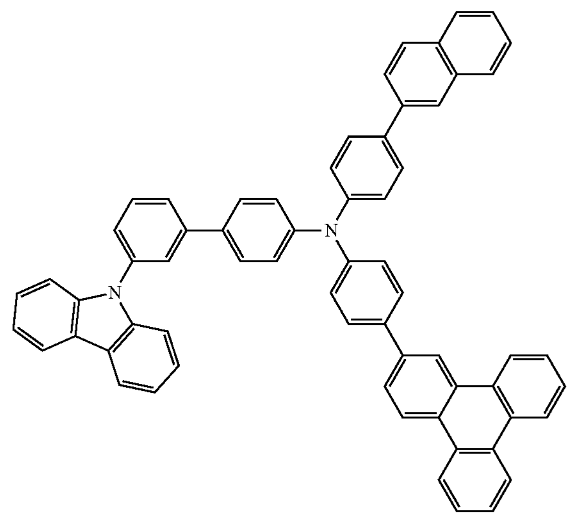
1-162
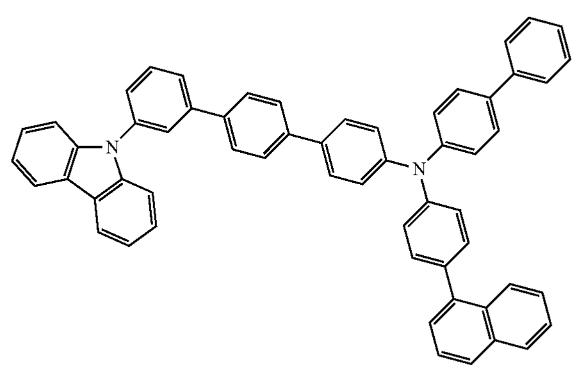

-continued
1-163
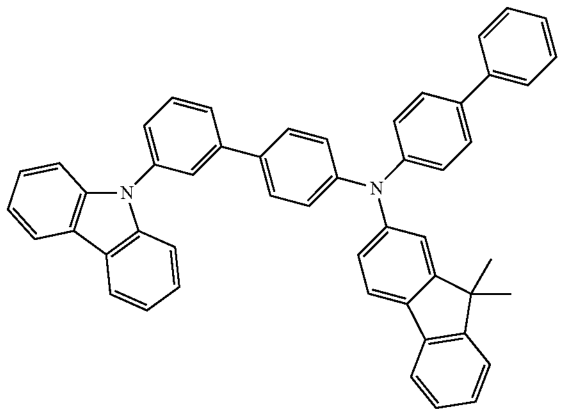
1-164
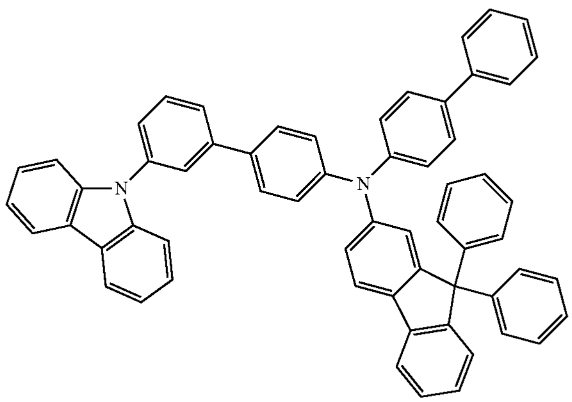
1-165
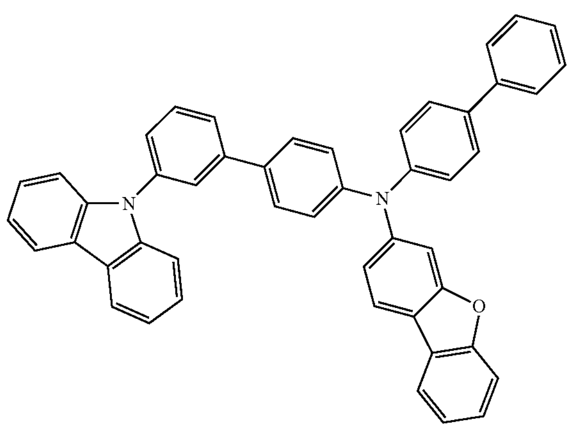
-continued
1-166
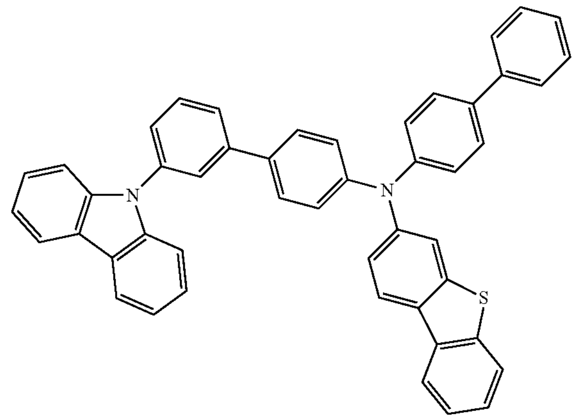
1-167
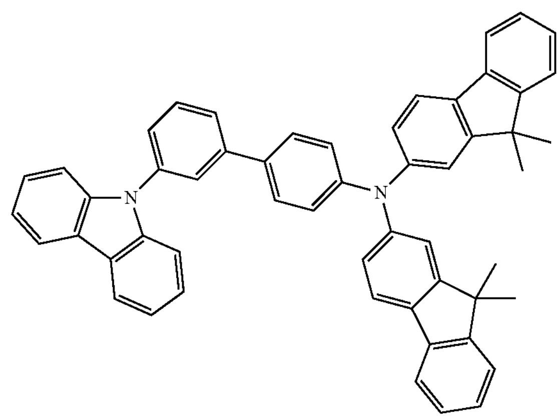
1-168
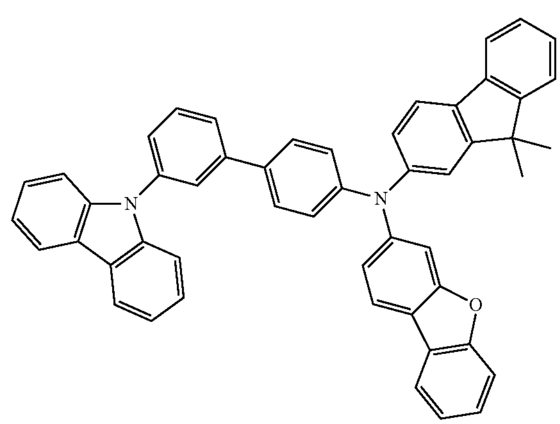

-continued
1-169
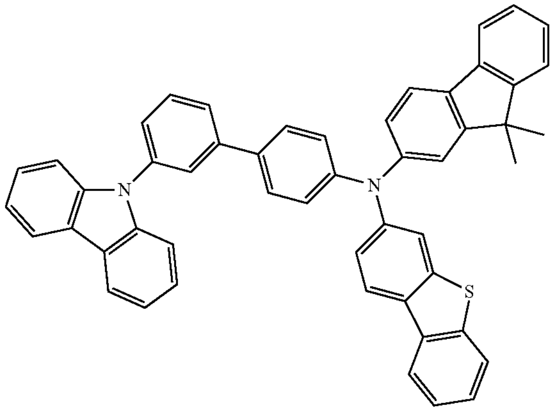
1-170
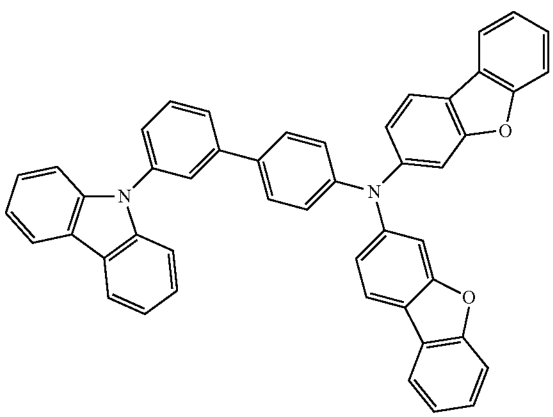
1-171
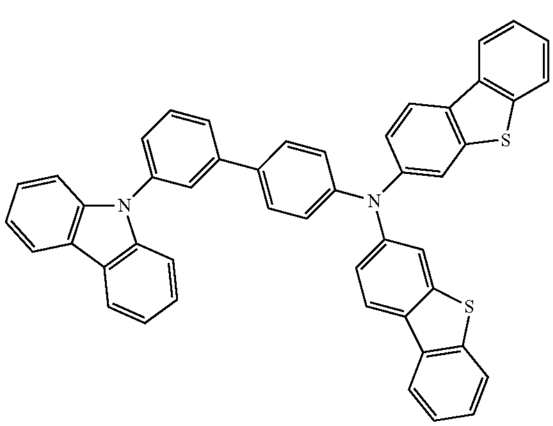
-continued
1-172
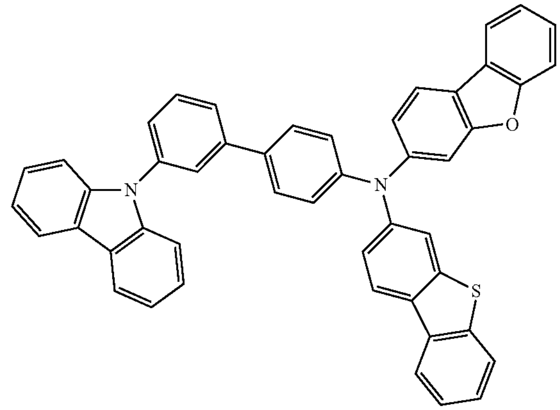
1-173
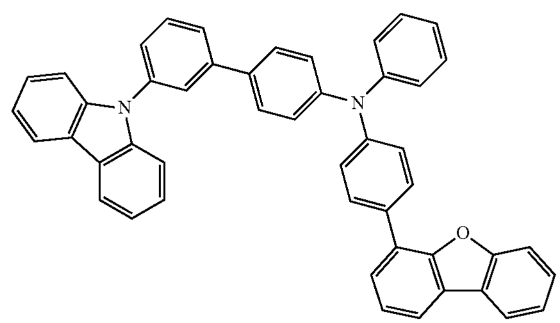
1-174
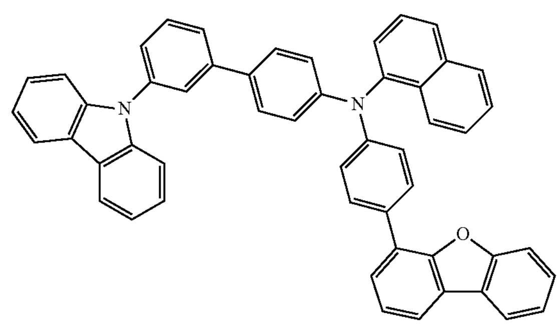
1-175
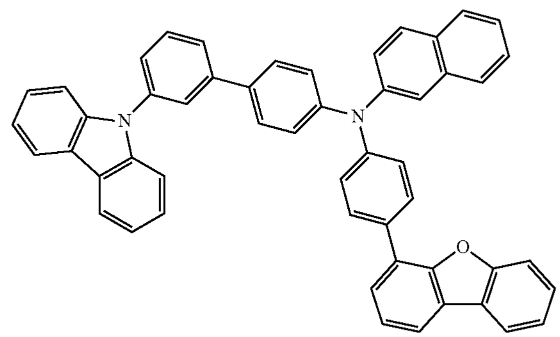

-continued
1-176
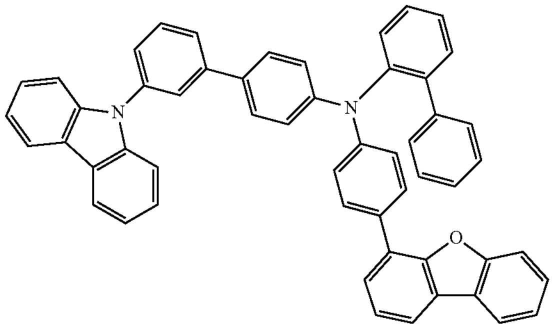
1-177
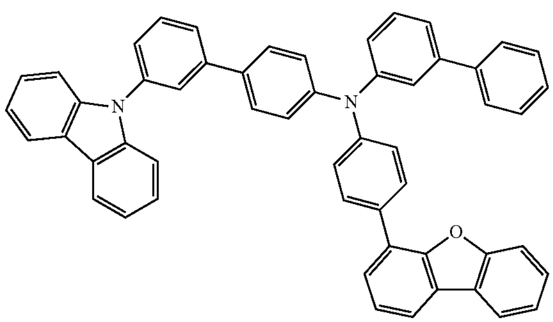
1-178
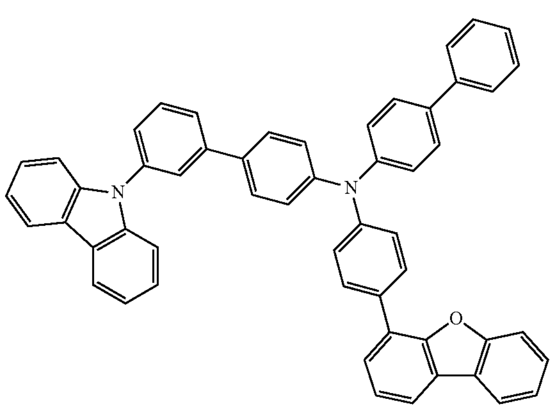
-continued
1-179
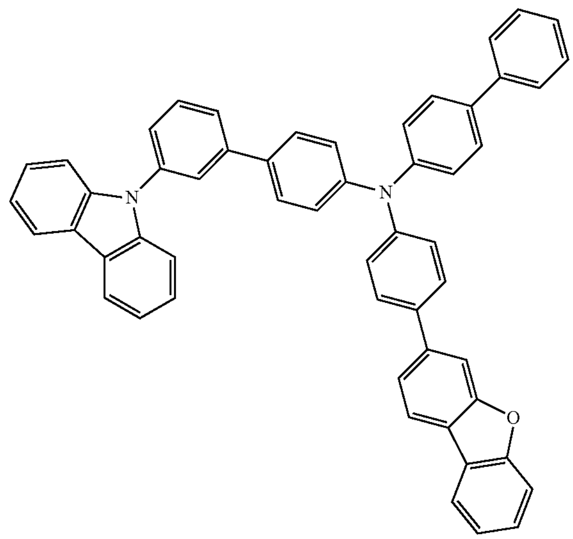
1-180
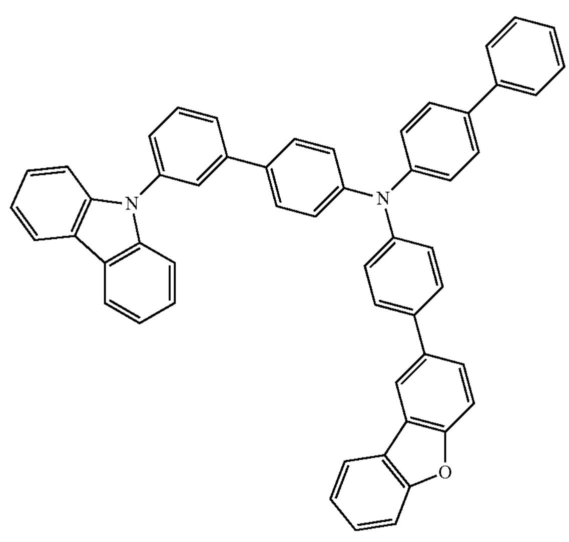

-continued
1-181
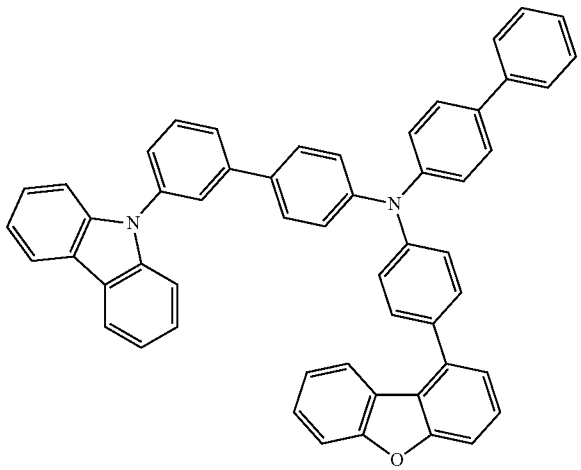
1-182
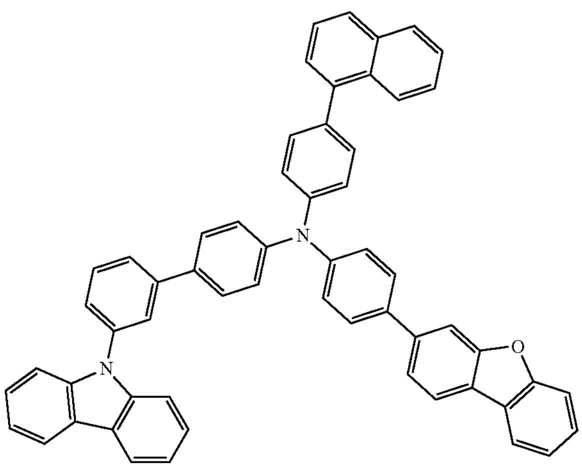
1-183
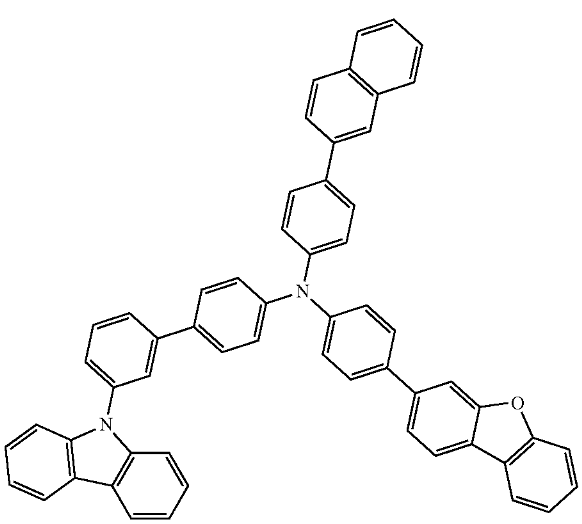
1-184
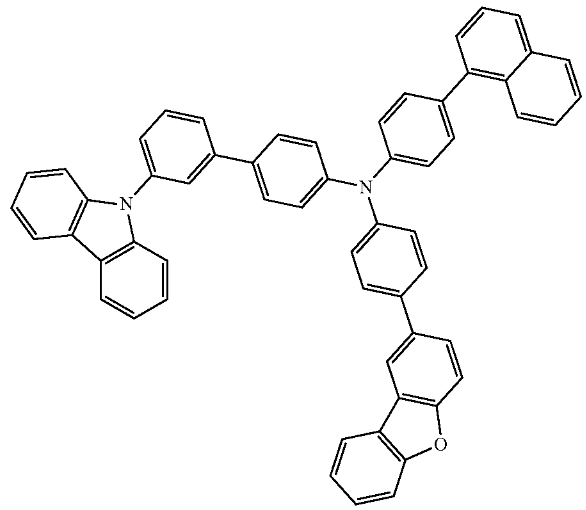
1-185
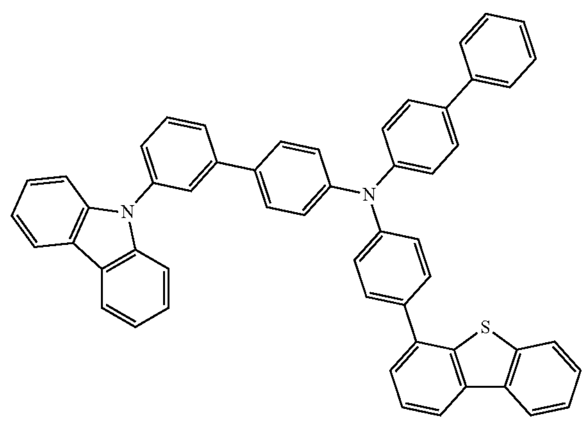
1-186
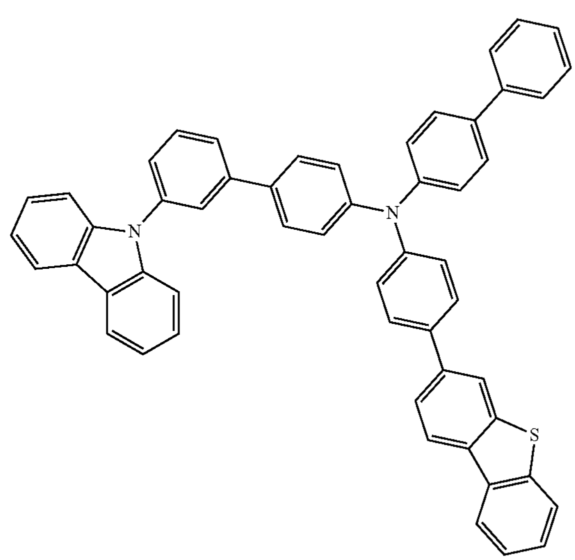

-continued
1-187
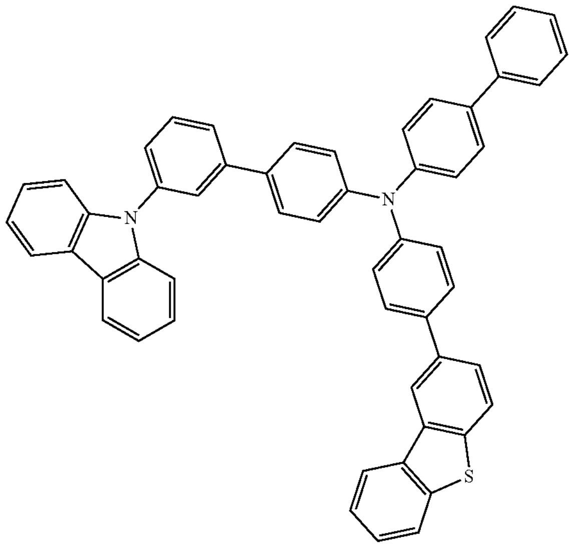
1-188
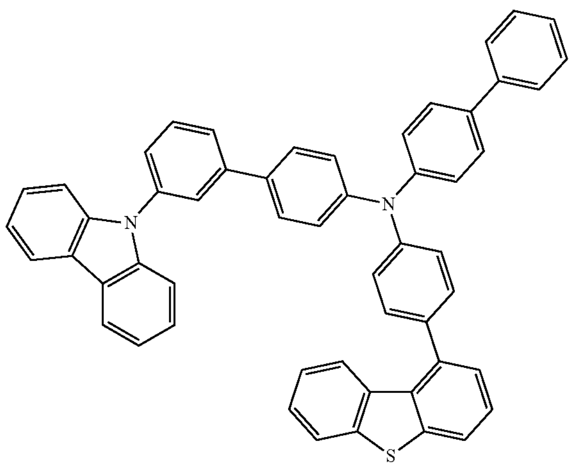
1-189
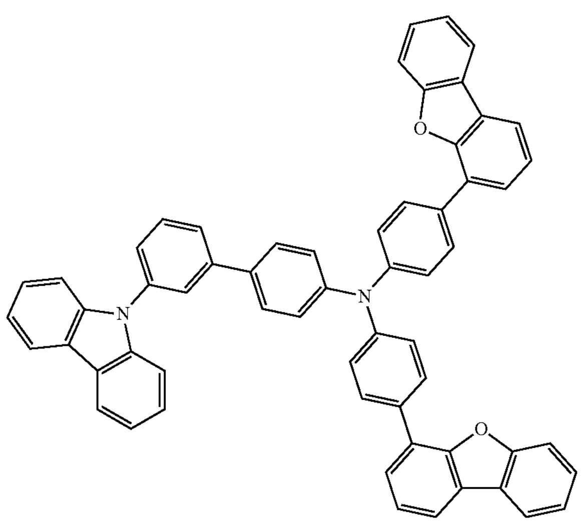
-continued
1-190
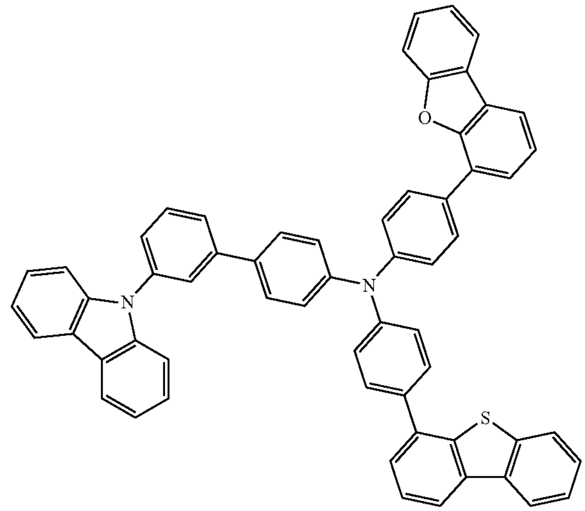
1-191
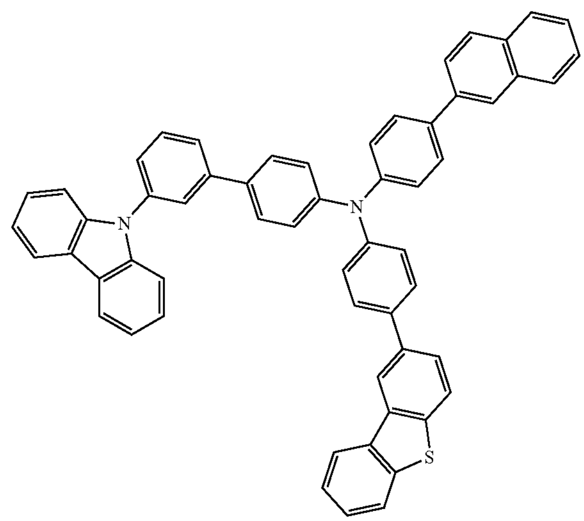
1-192
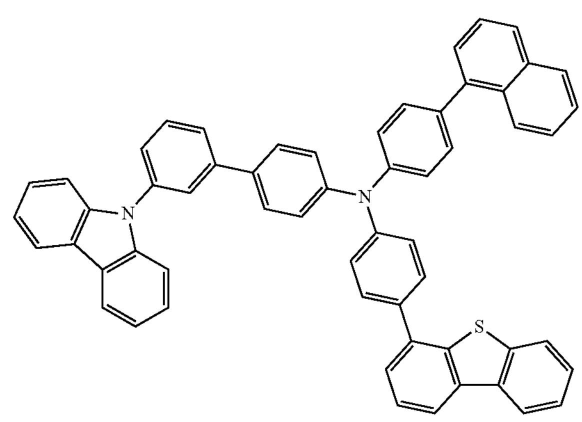

-continued
1-193
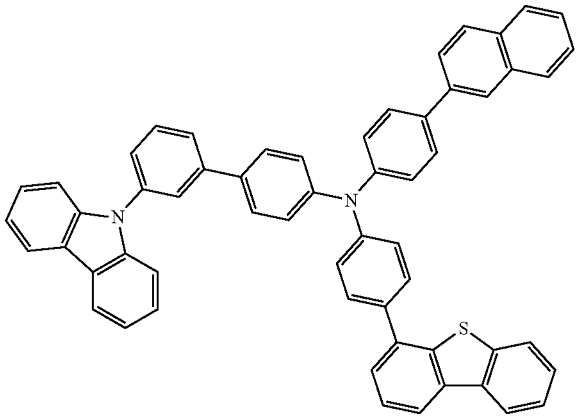
1-194
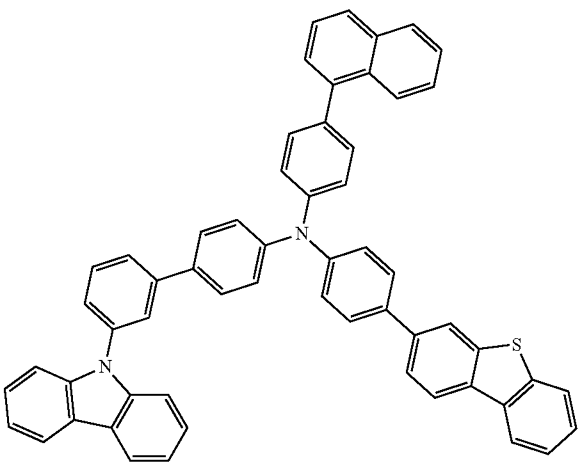
1-195
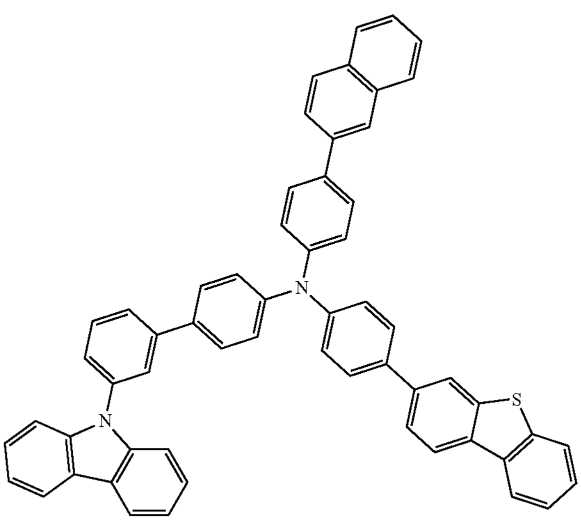
-continued
1-196
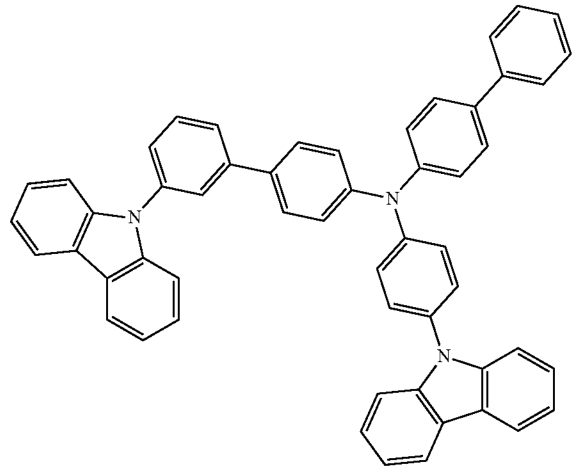
1-197
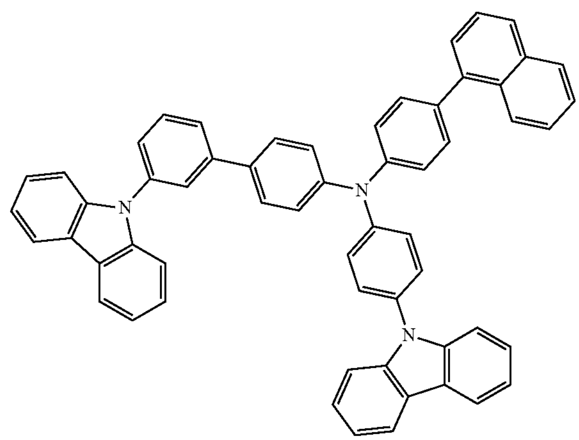
1-198
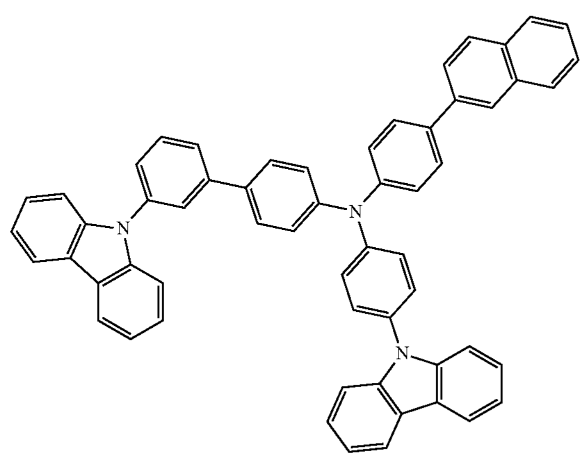

-continued
1-199
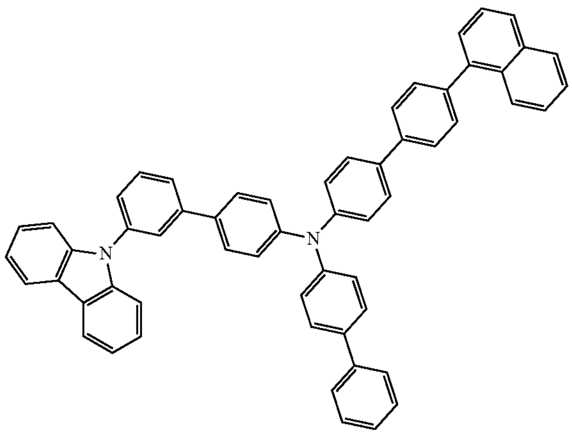
1-200
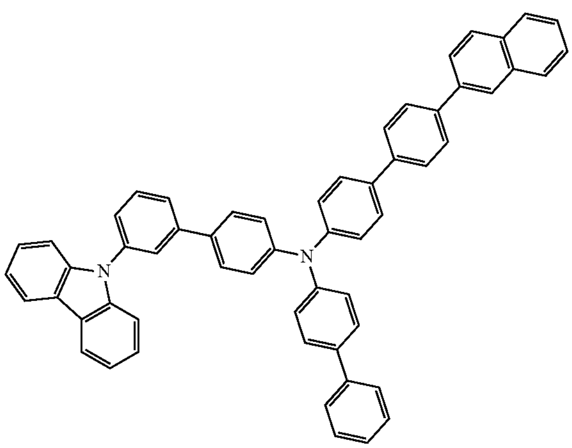
1-201
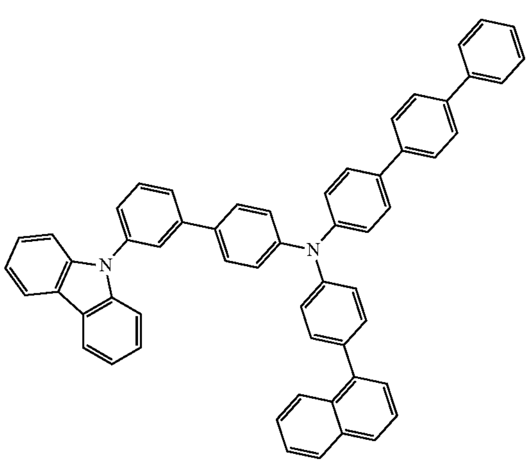
-continued
1-202
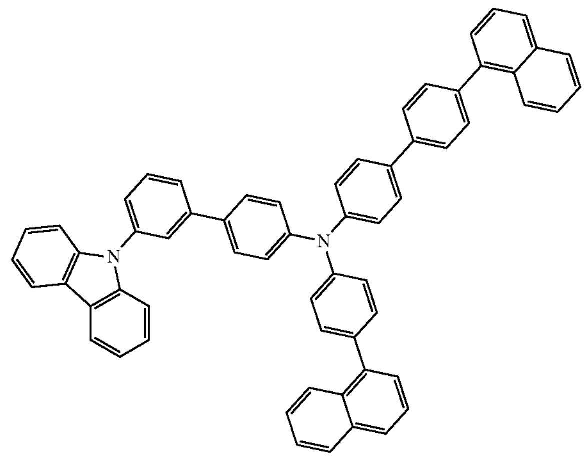
1-203
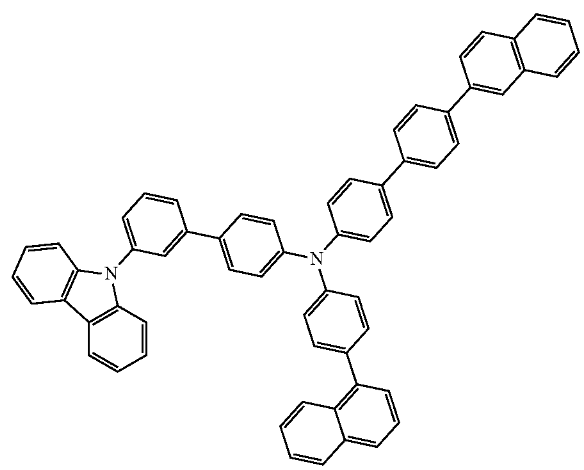
1-204
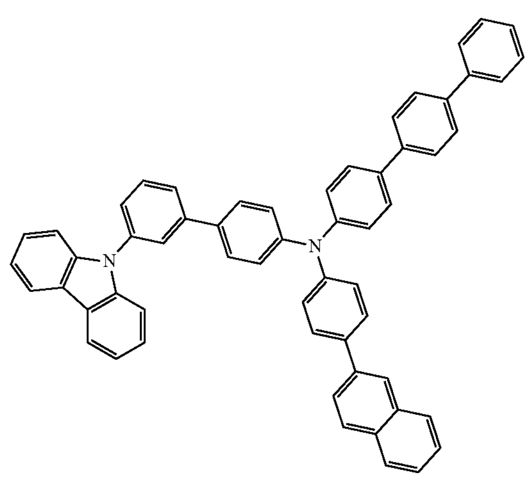

-continued
1-205
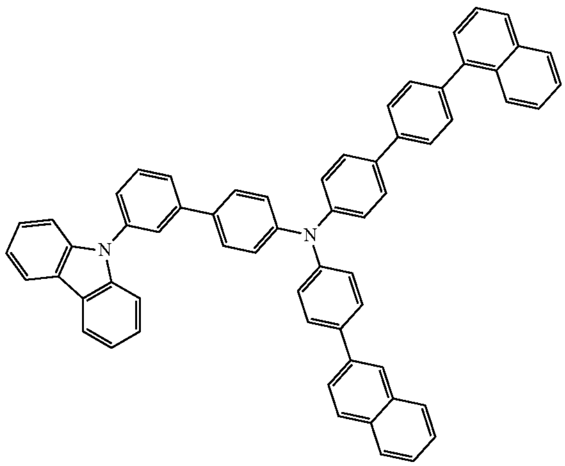
1-206
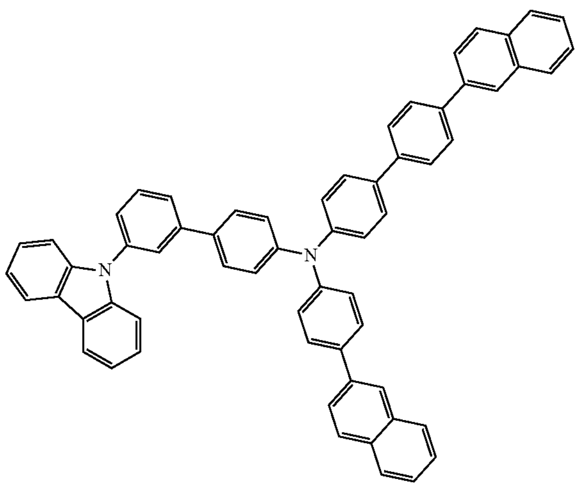
1-207
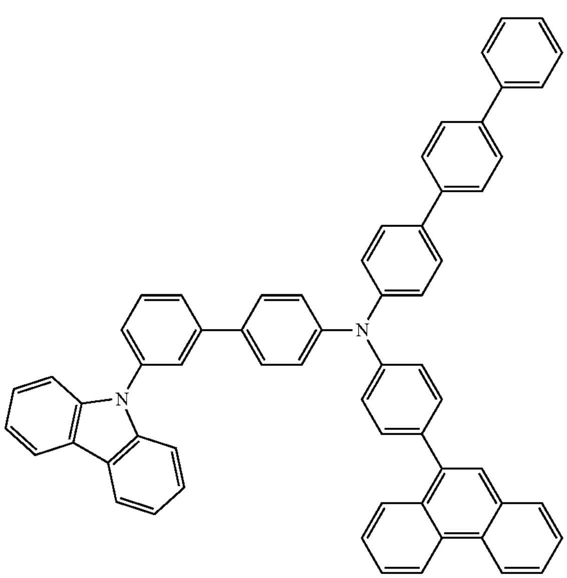
-continued
1-208
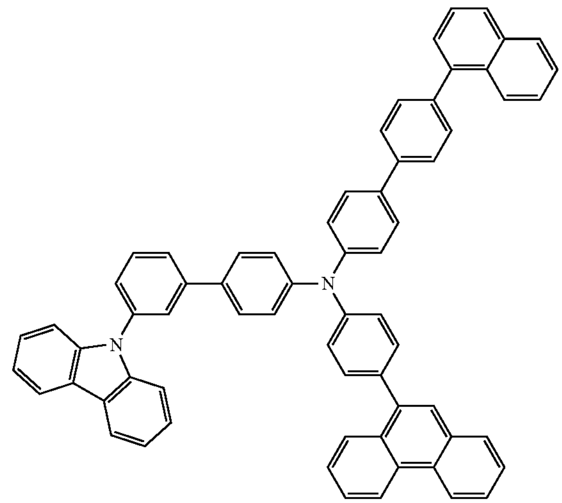
1-209
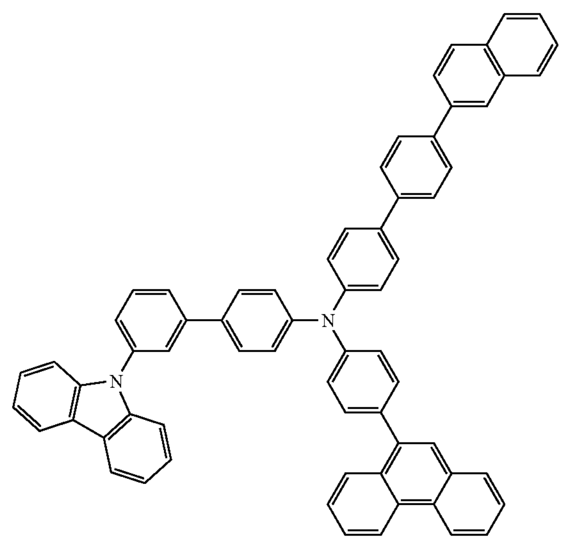
1-210
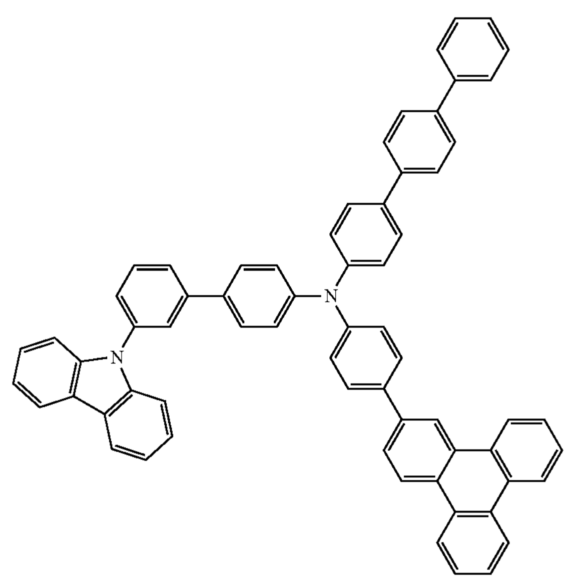

-continued
1-211
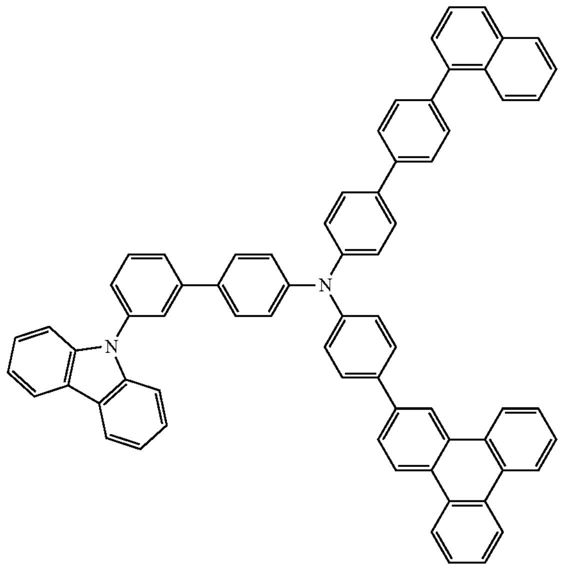
1-212
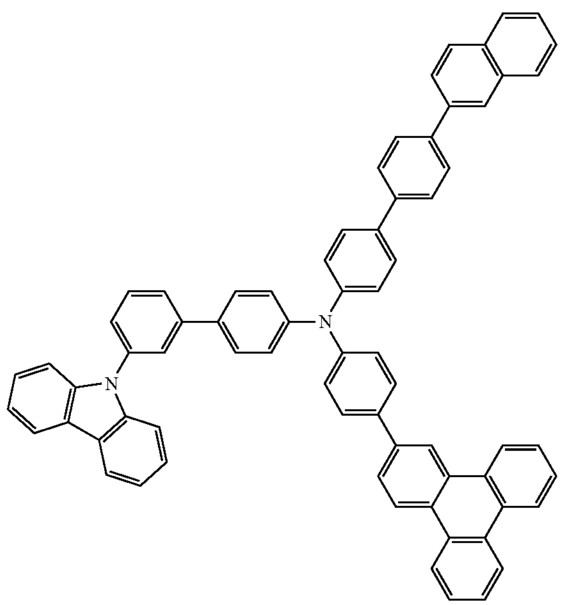
1-213
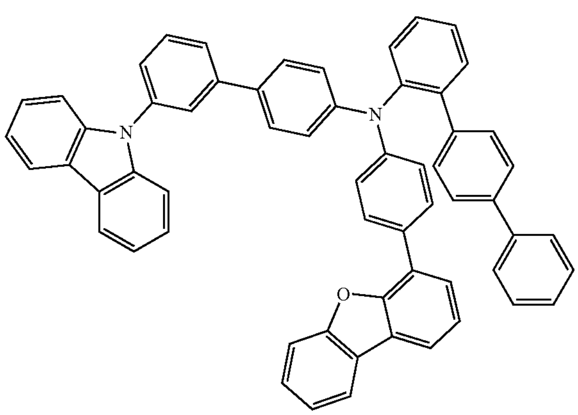
-continued
1-214
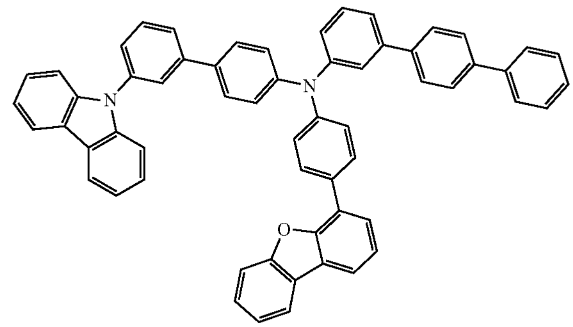
1-215
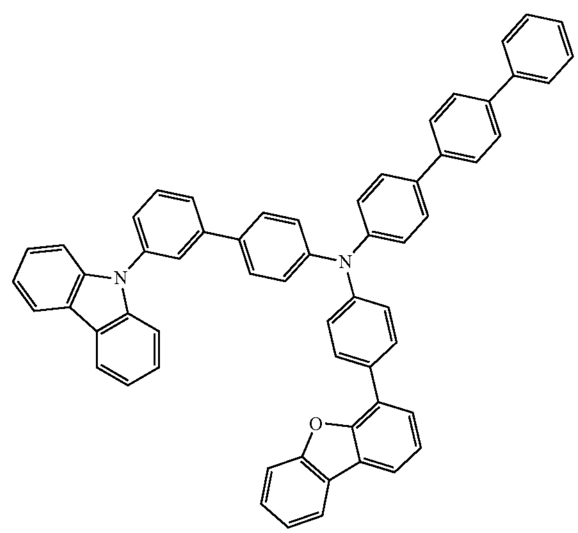
1-216
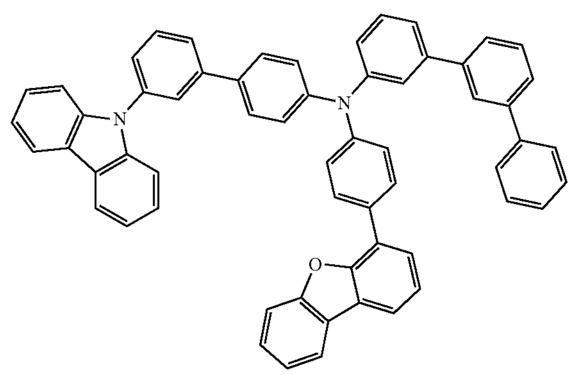

1-217
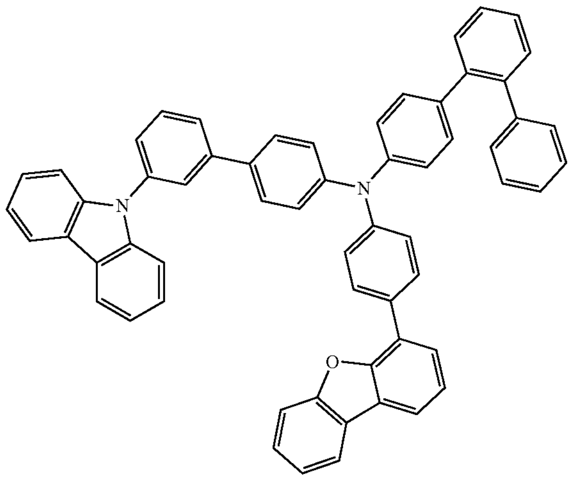
1-218
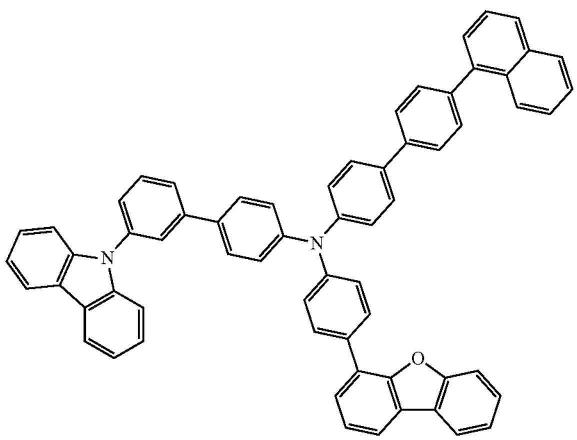
1-219
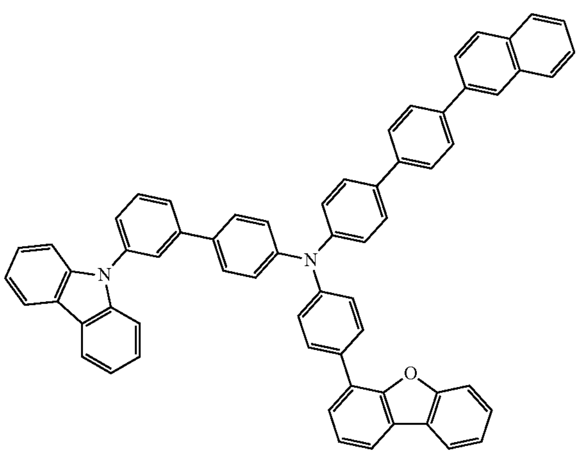
1-220
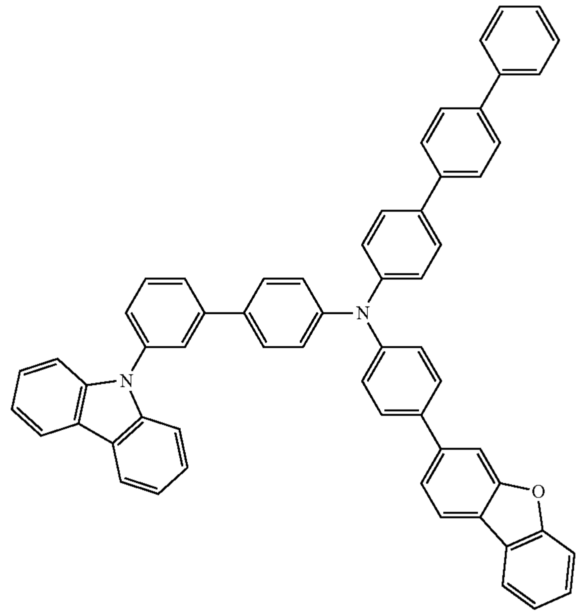
1-221
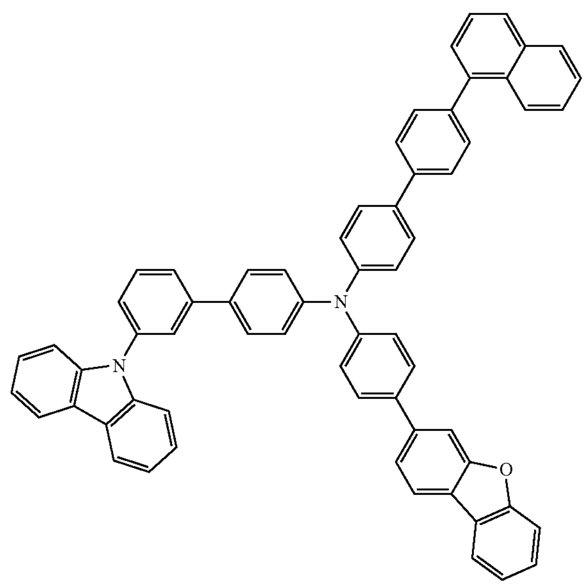

-continued
1-222
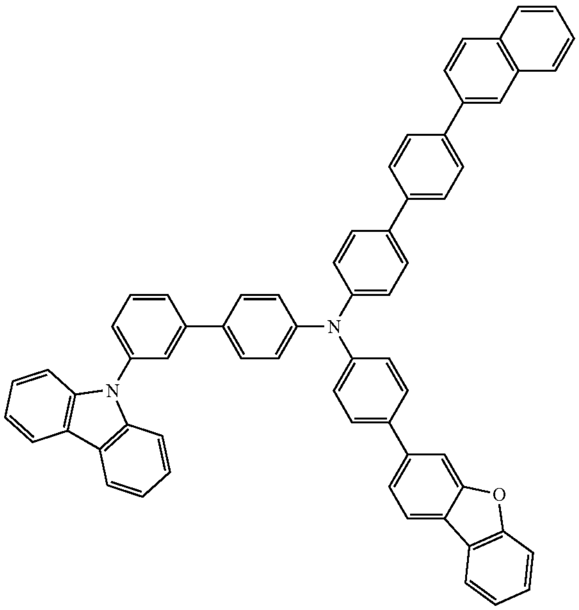
1-223
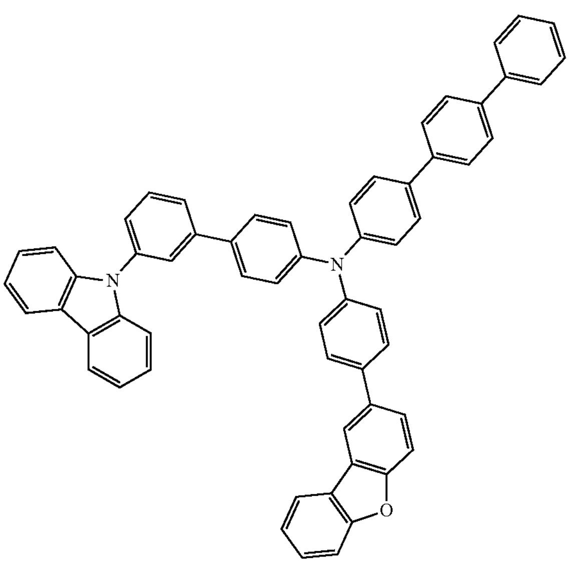
-continued
1-224
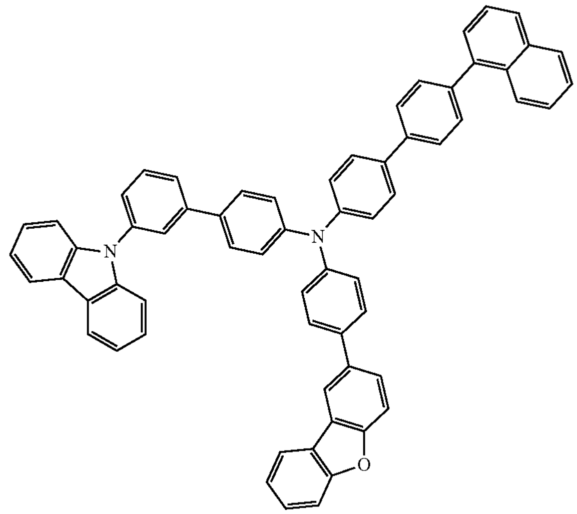
1-225
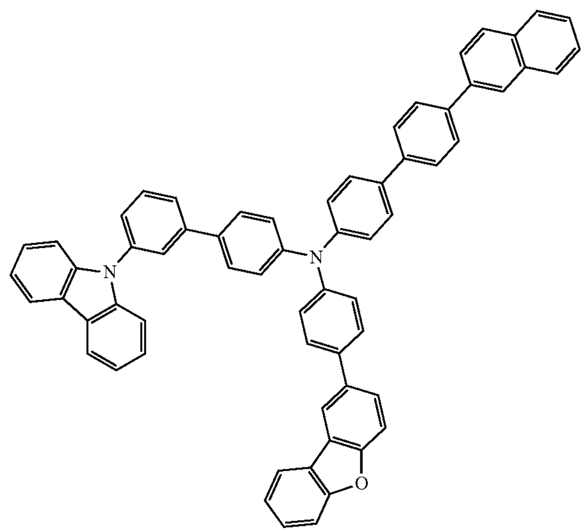
1-226
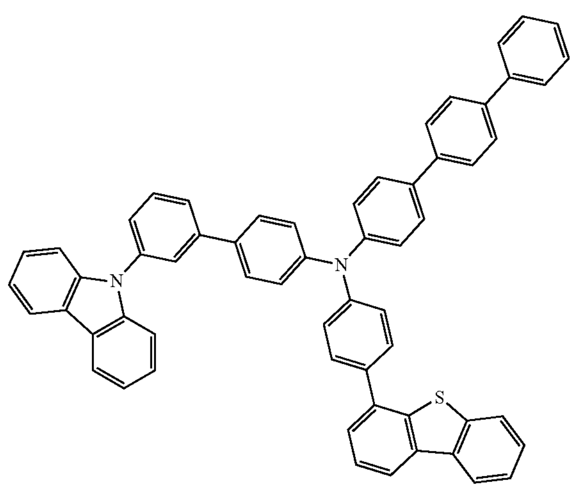

-continued
1-227
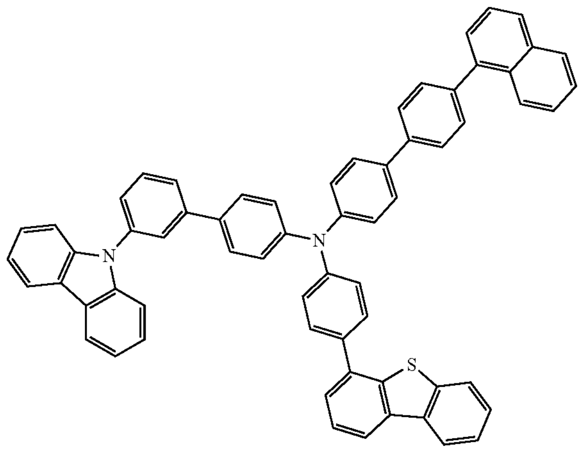
1-228
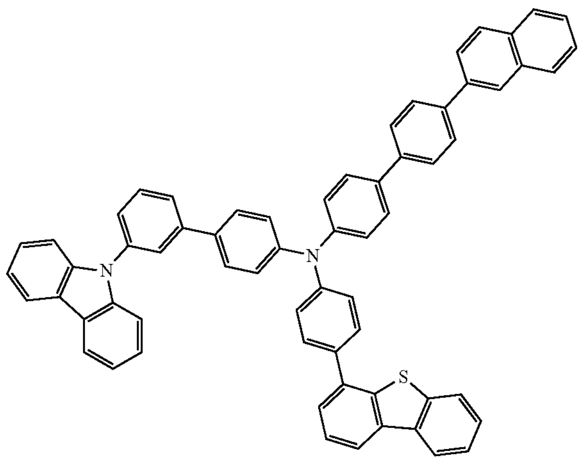
1-229
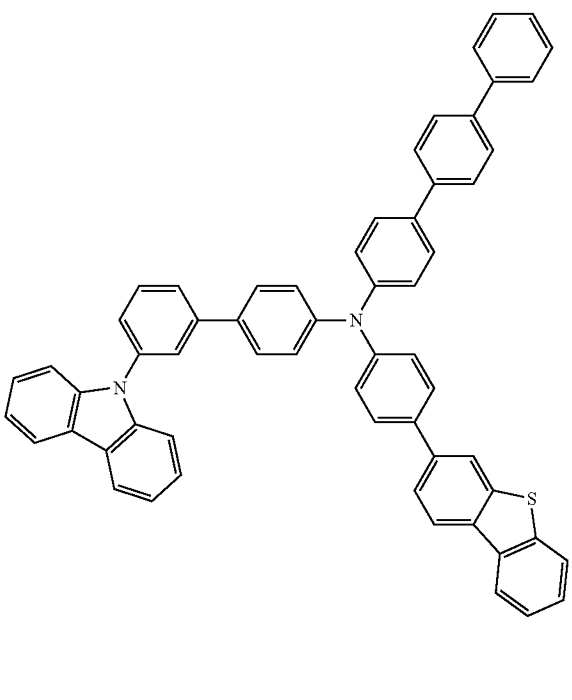
-continued
1-230
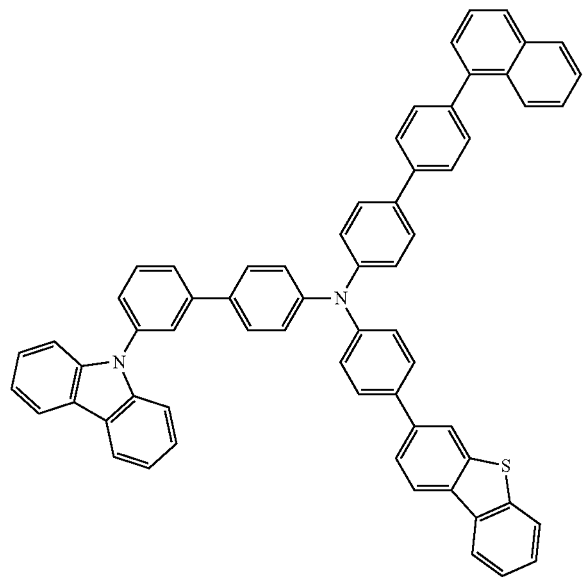
1-231
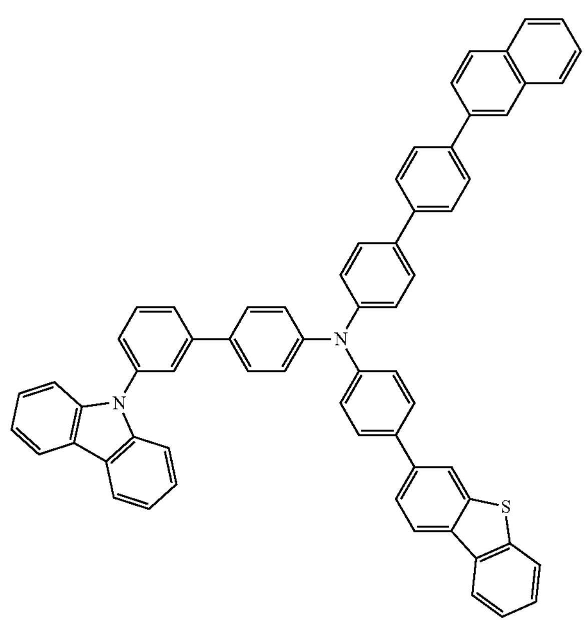

1-232
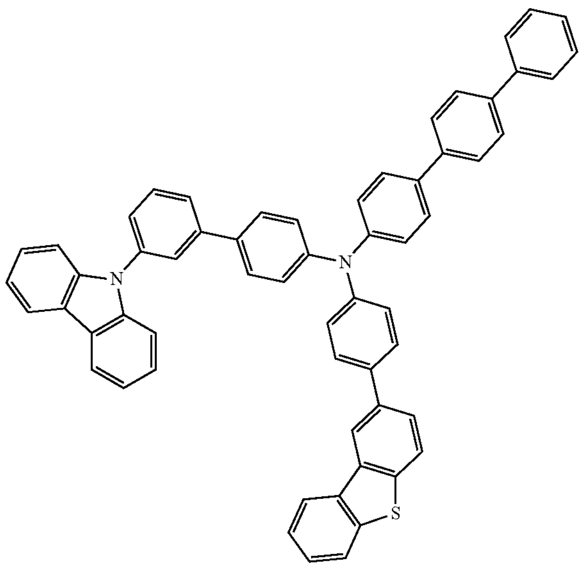
1-233
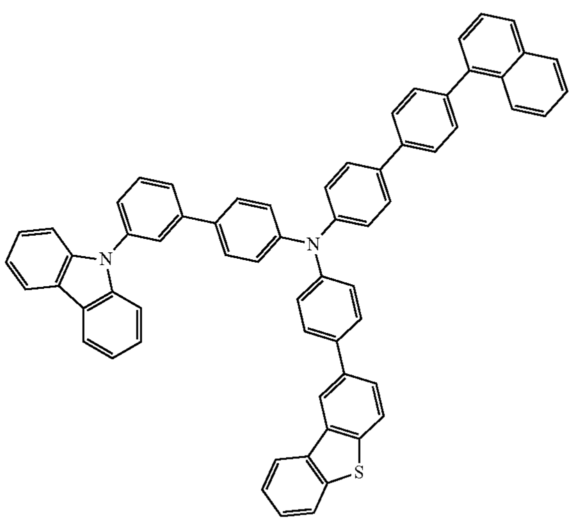
1-234
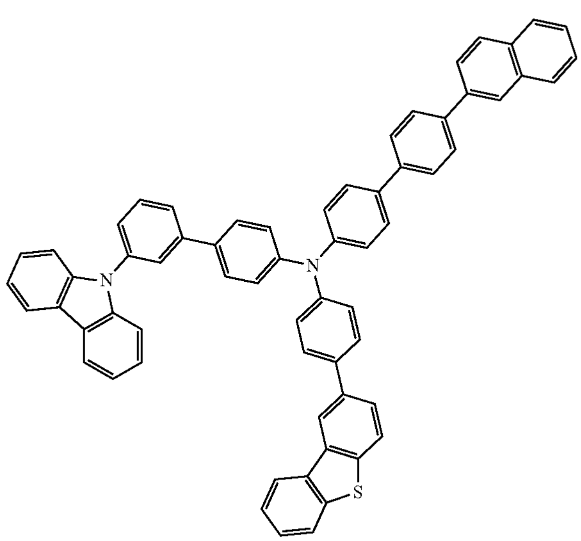
1-235
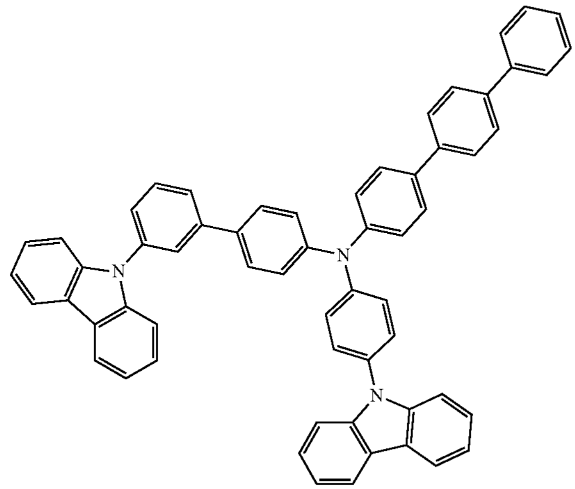
1-236
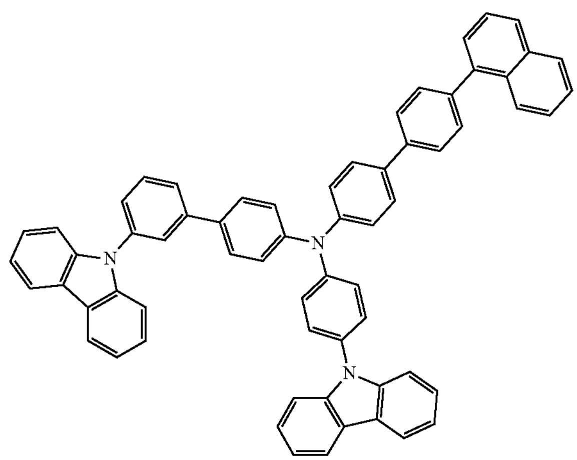
1-237
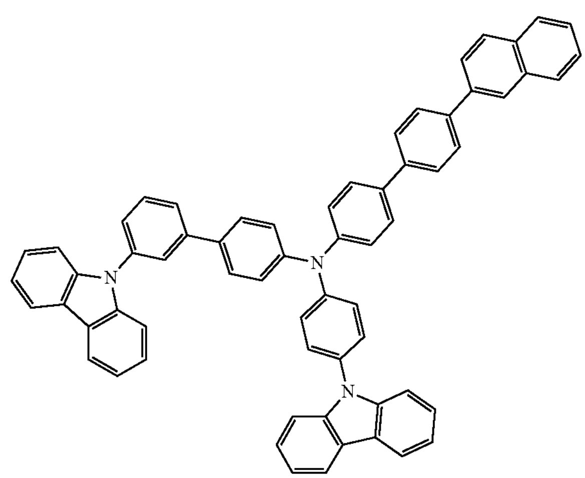

-continued
1-238
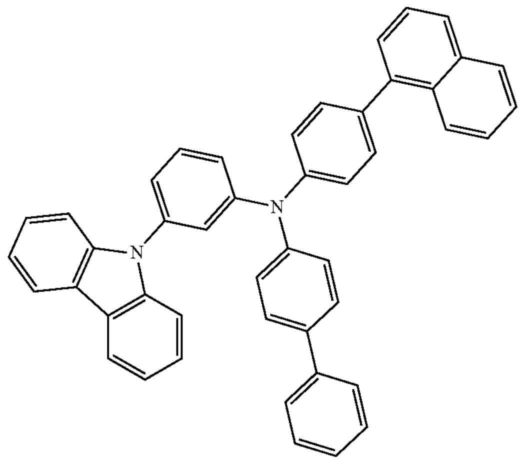
1-239
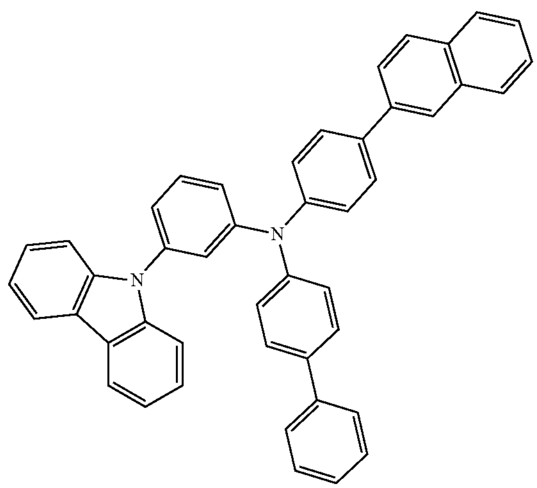
1-240
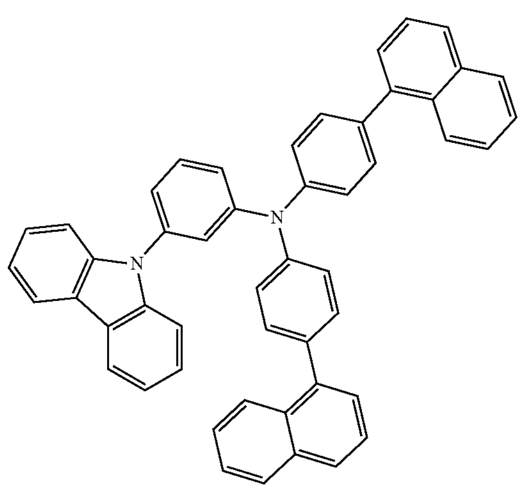
-continued
1-241
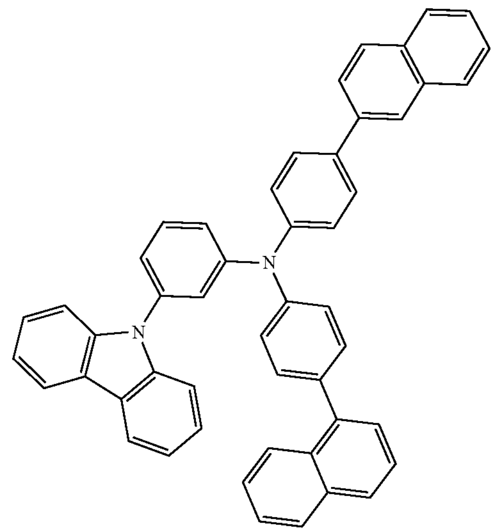
1-242
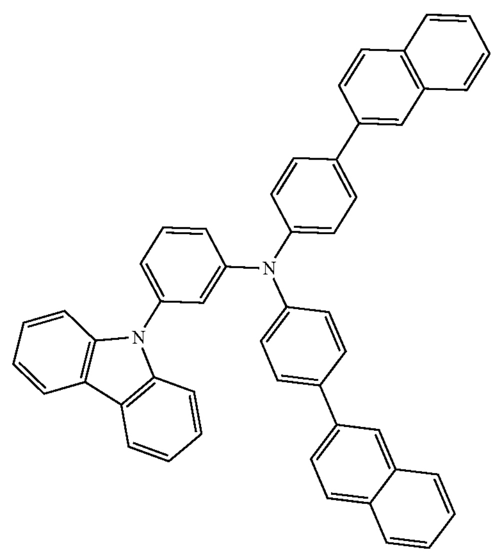
1-243
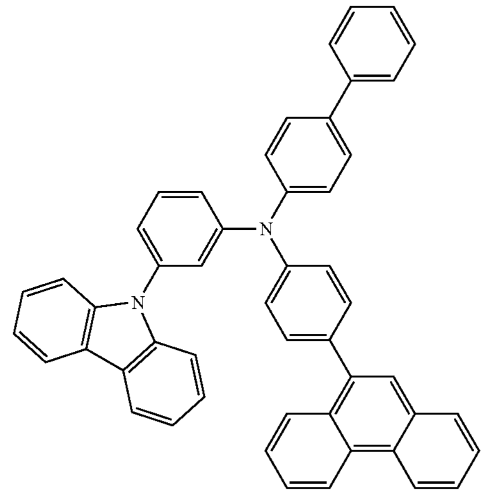

-continued
1-244
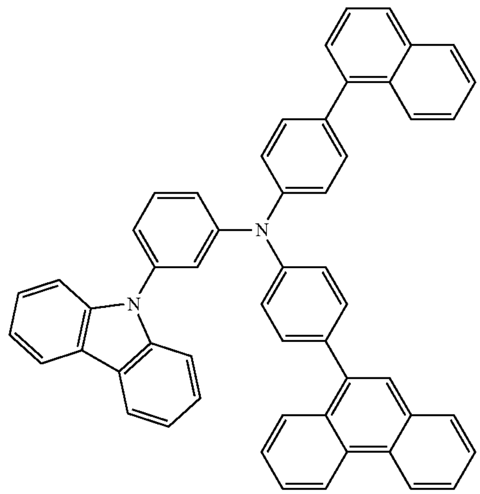
1-245
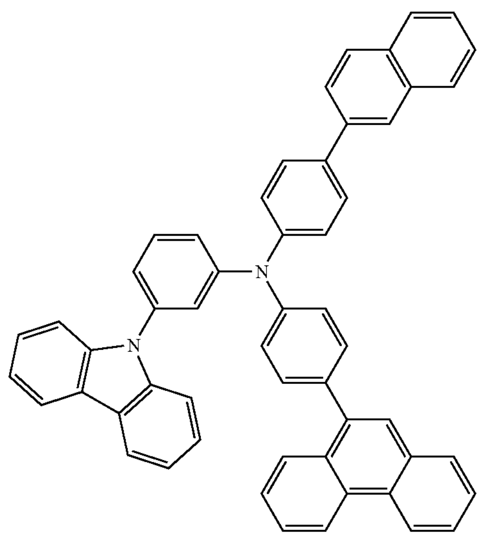
1-246
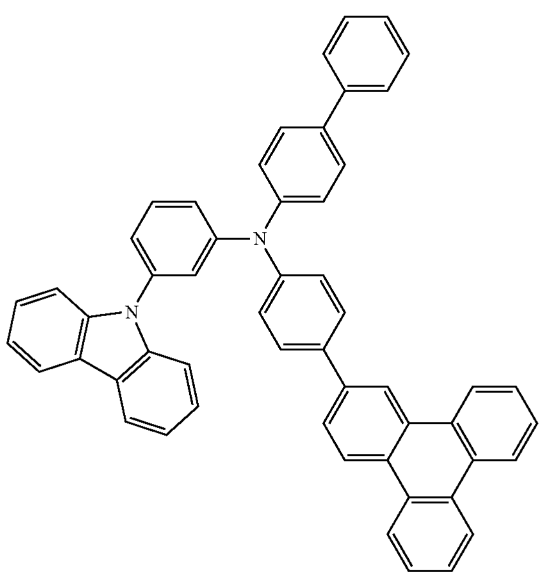
-continued
1-247
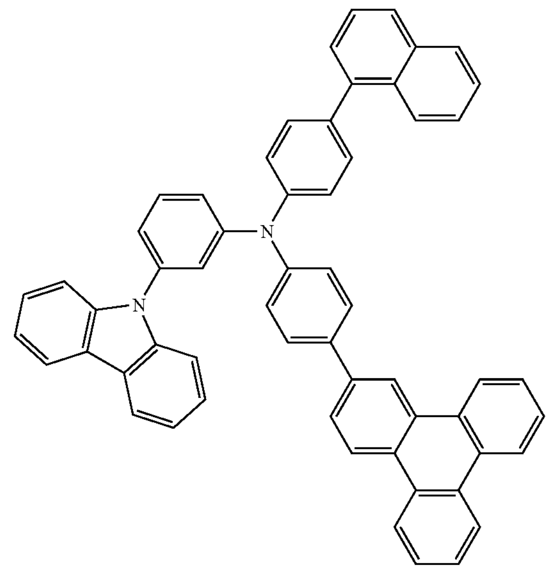
1-248
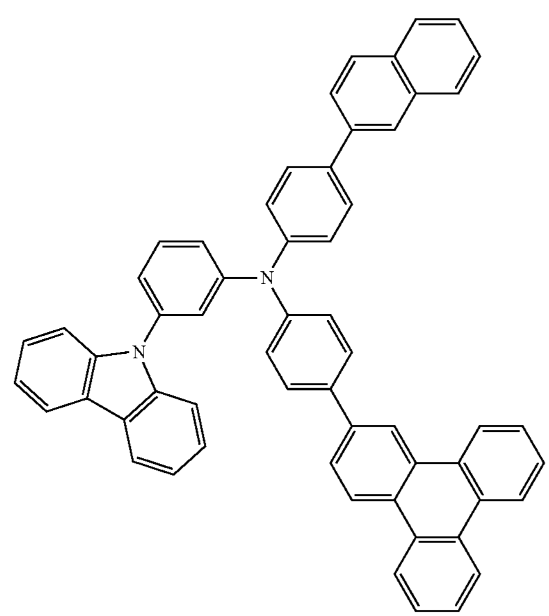

-continued
1-249
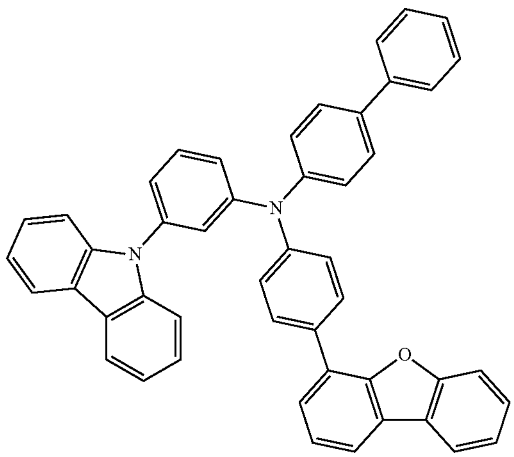
1-250
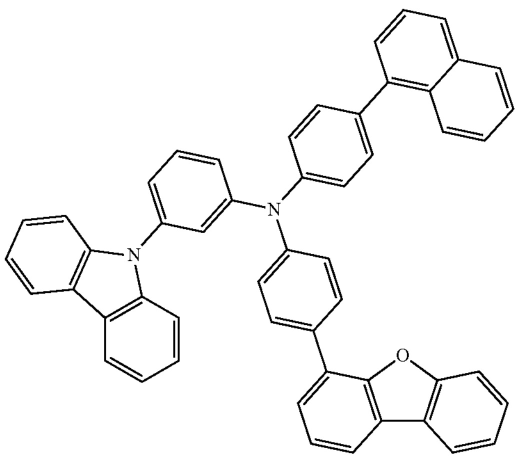
1-251
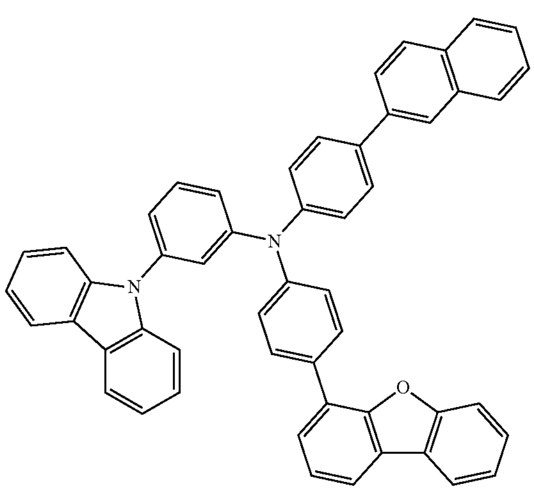
-continued
1-252
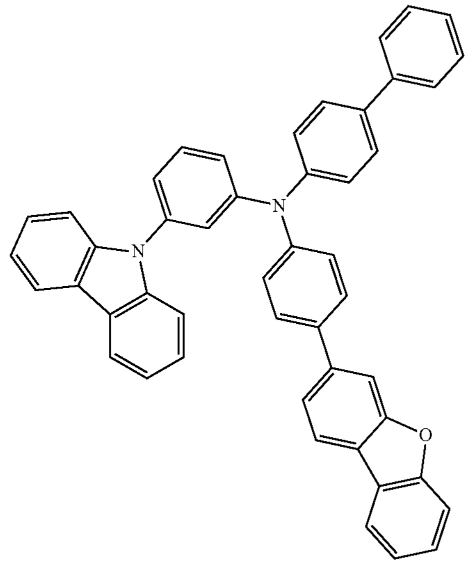
1-253
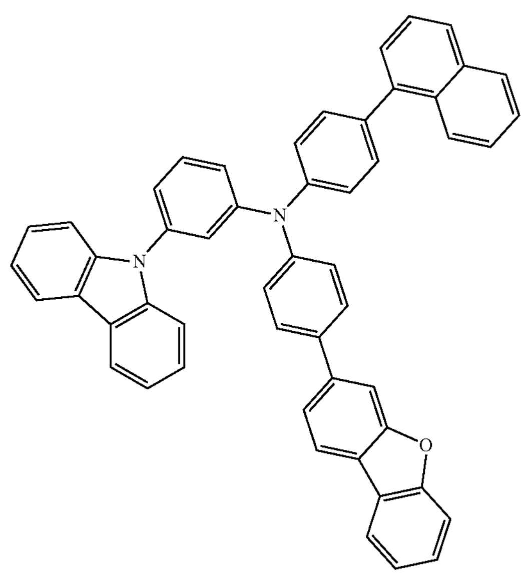

-continued
1-254
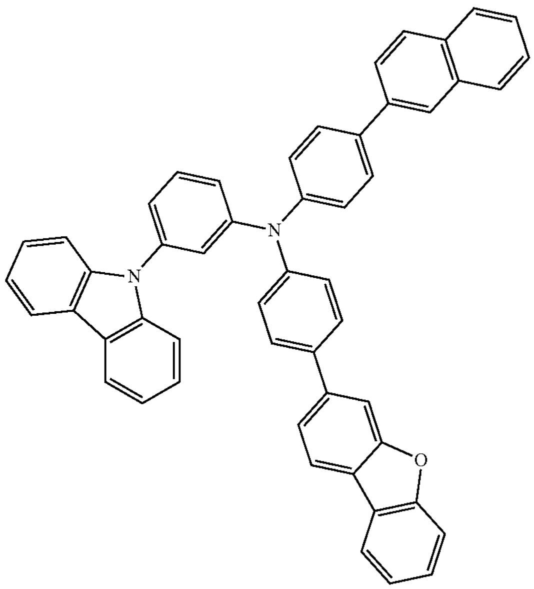
1-255
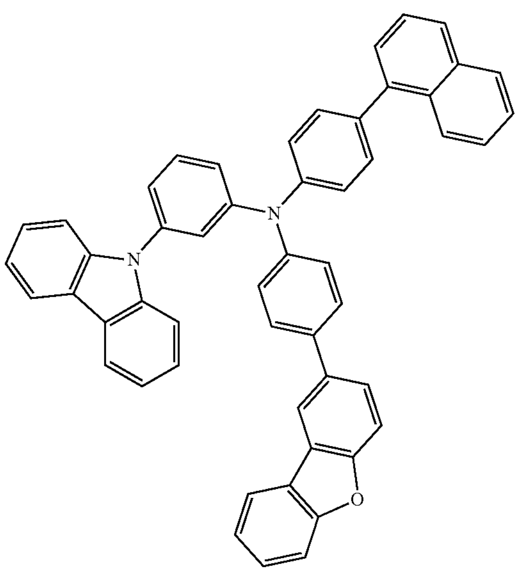
-continued
1-256
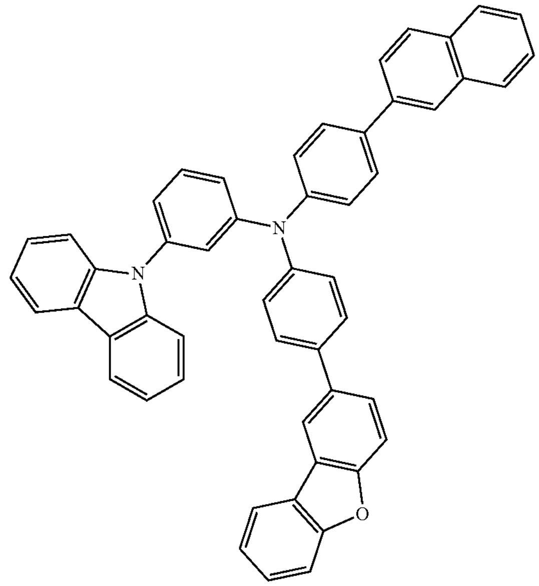
1-257
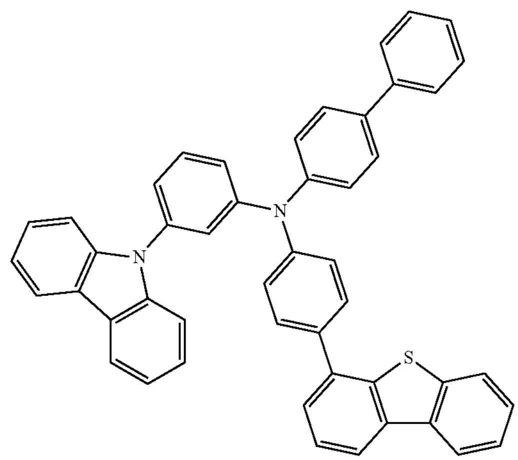
1-258
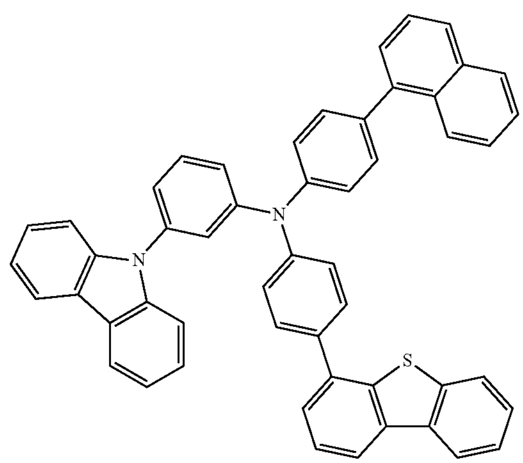

-continued
1-259
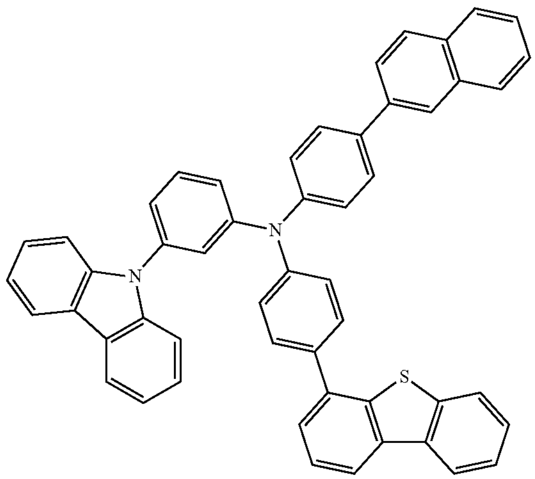
1-260
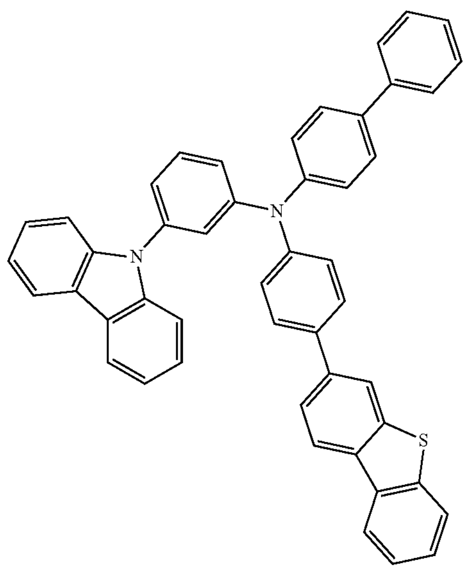
1-261
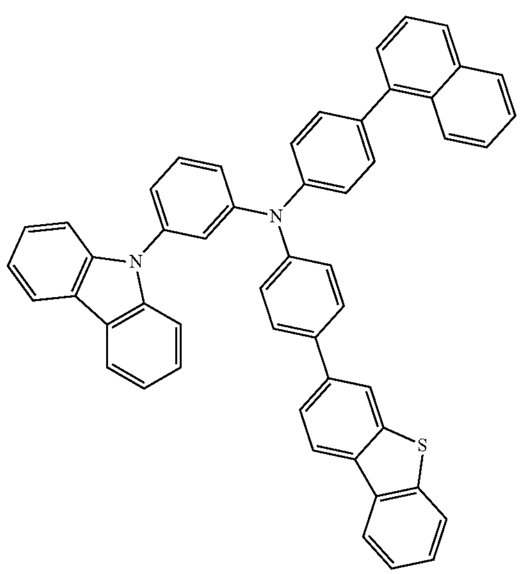
-continued
1-262
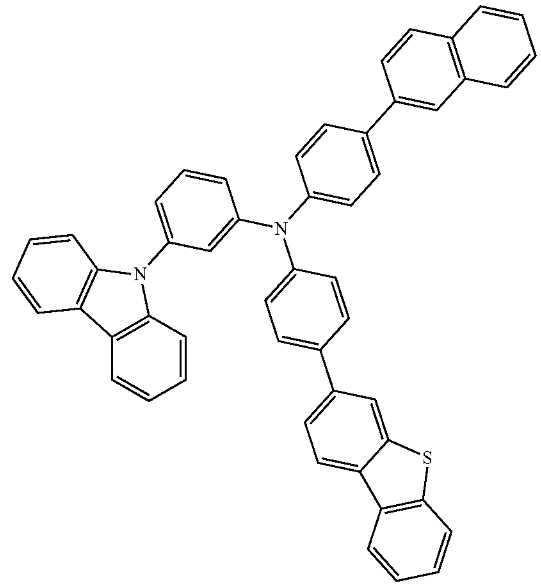
1-263
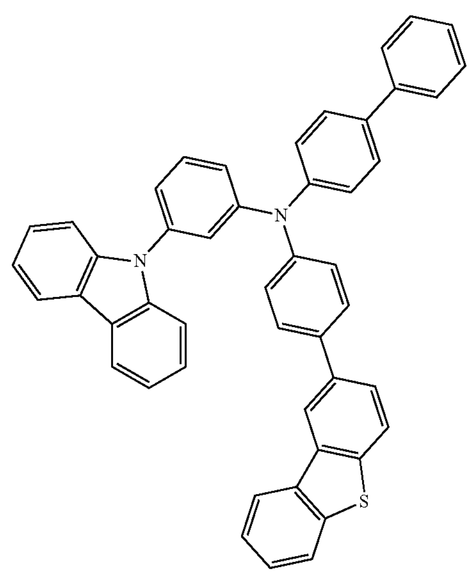

-continued
1-264
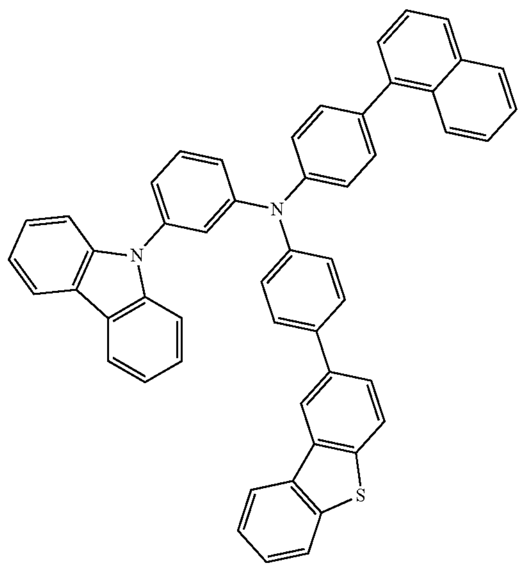
1-265
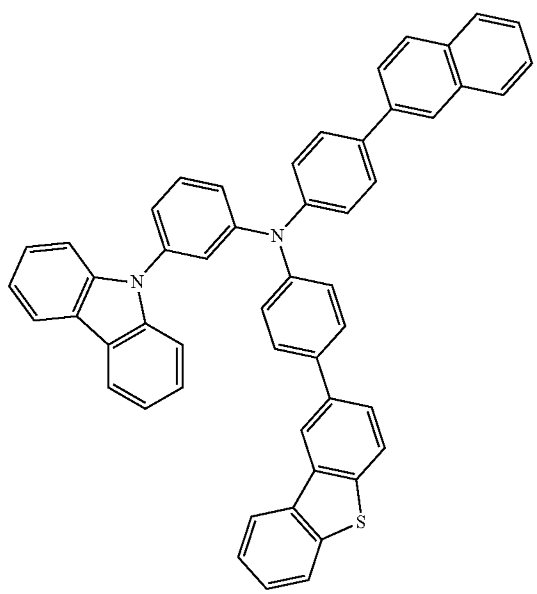
1-266
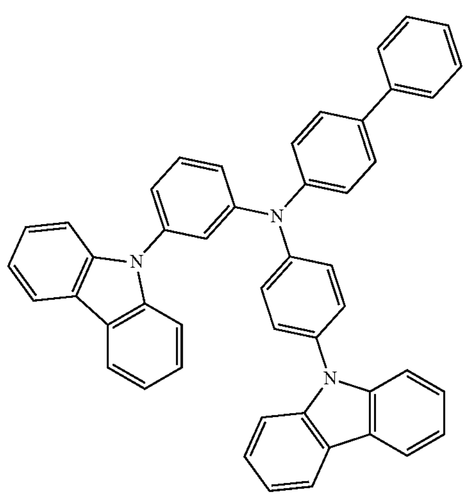
-continued
1-267
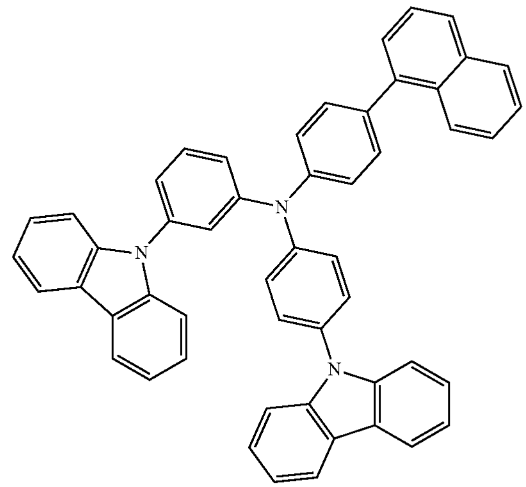
1-268
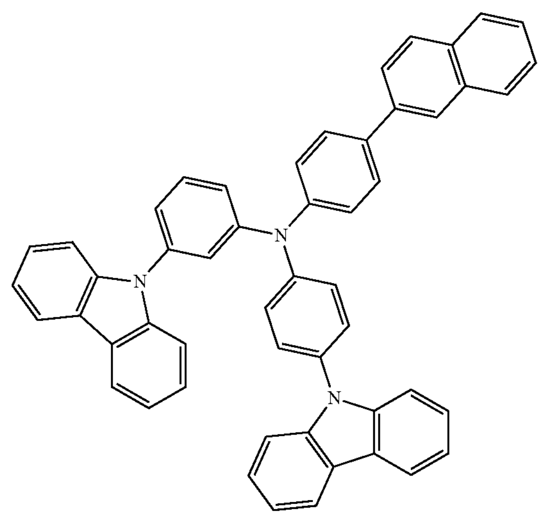
1-269
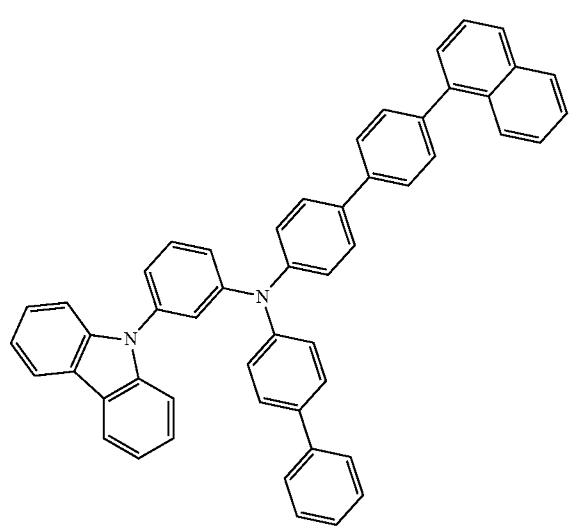

-continued
1-270
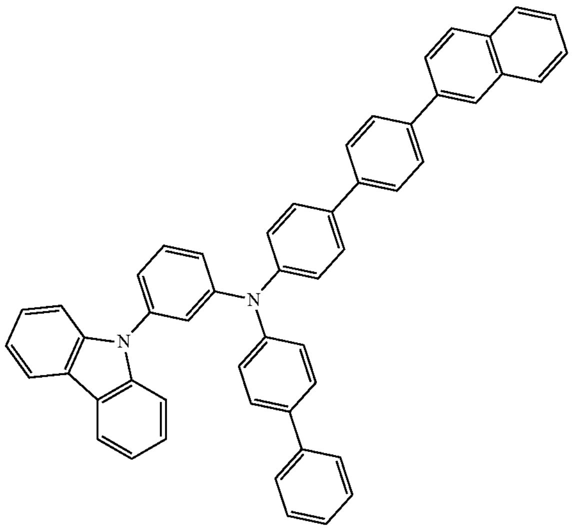
1-271
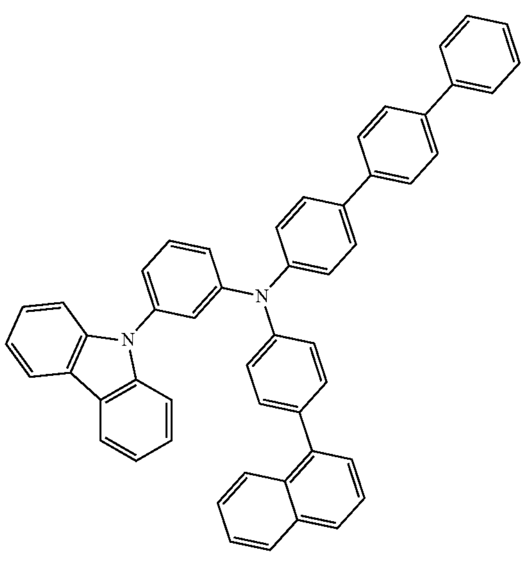
-continued
1-272
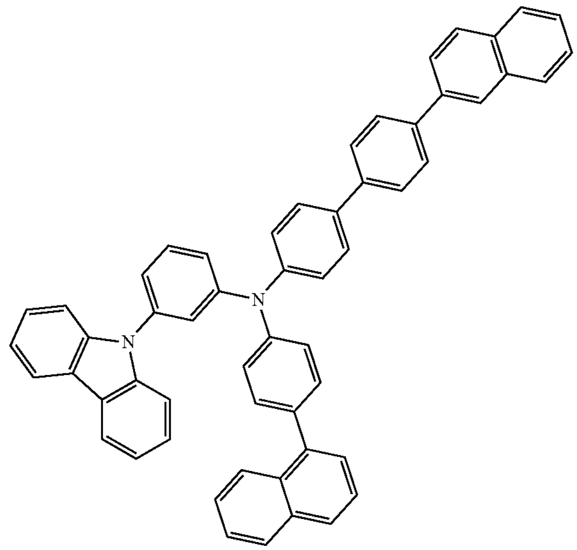
1-273
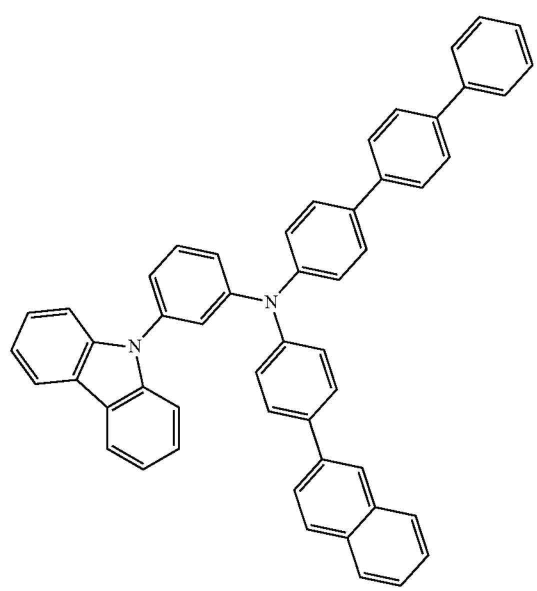

-continued
1-274
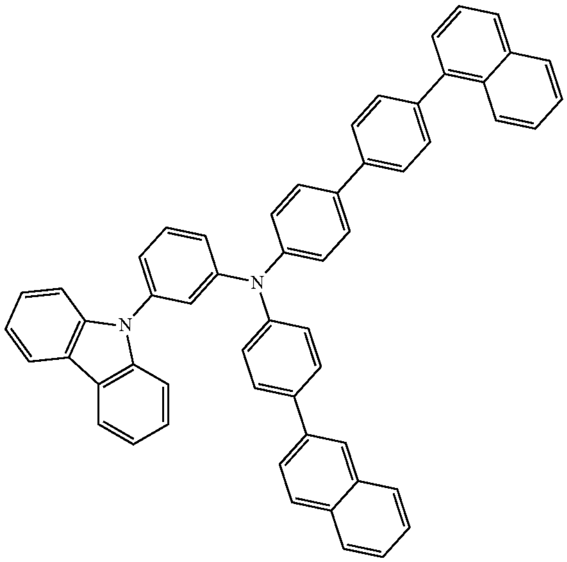
1-275
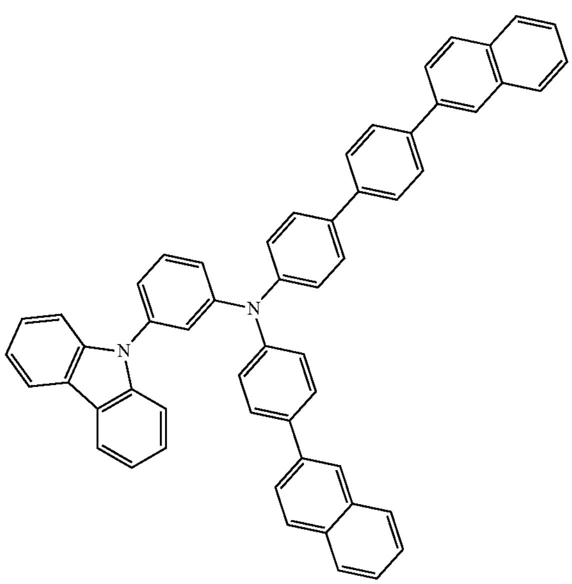
-continued
1-276
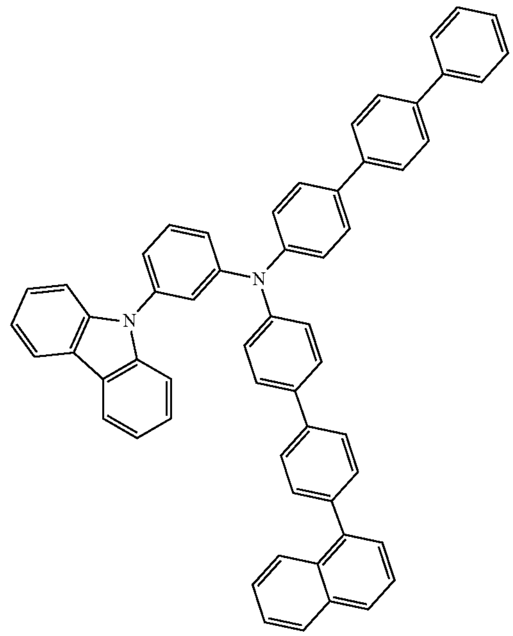
1-277
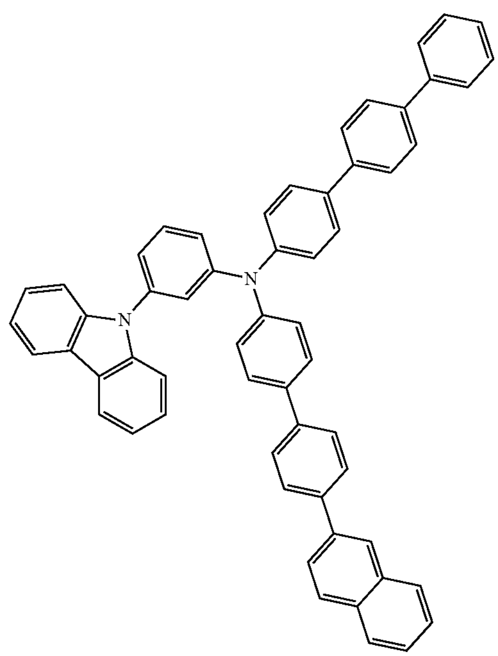

-continued
1-278
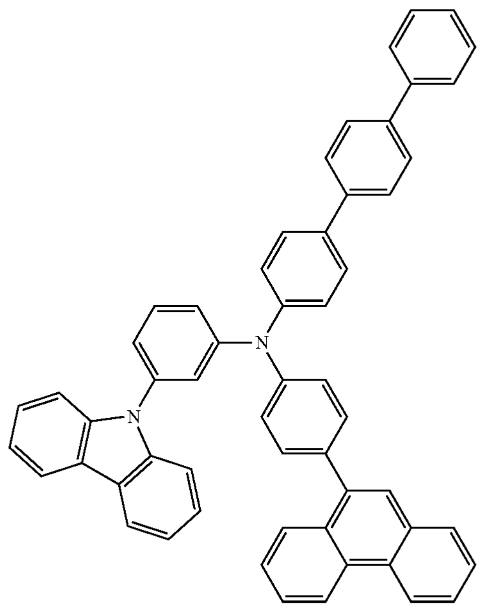
1-279
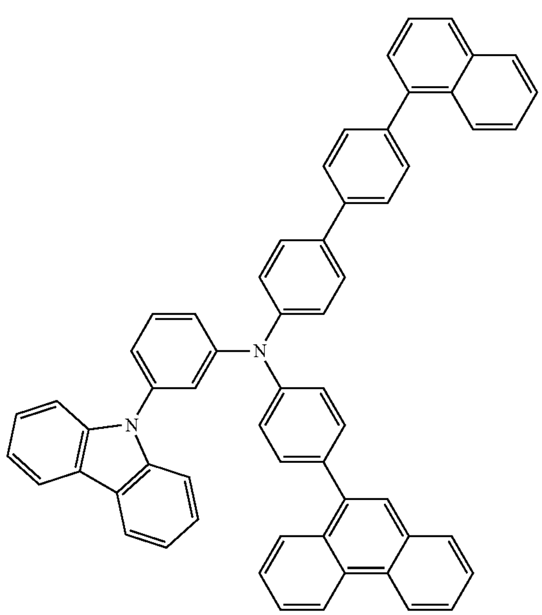
-continued
1-280
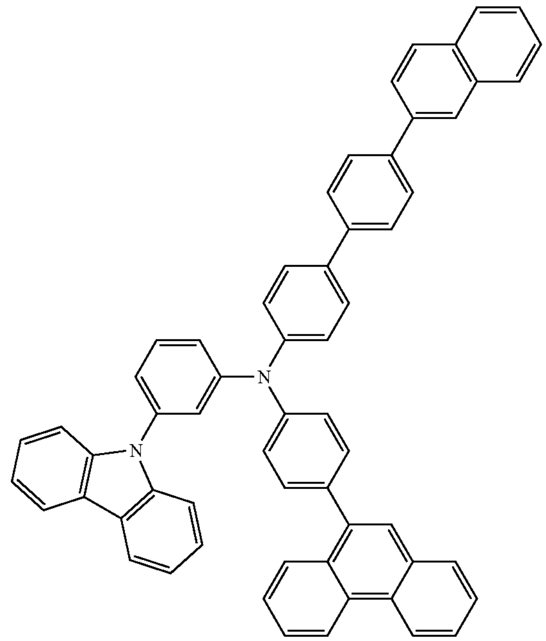
1-281
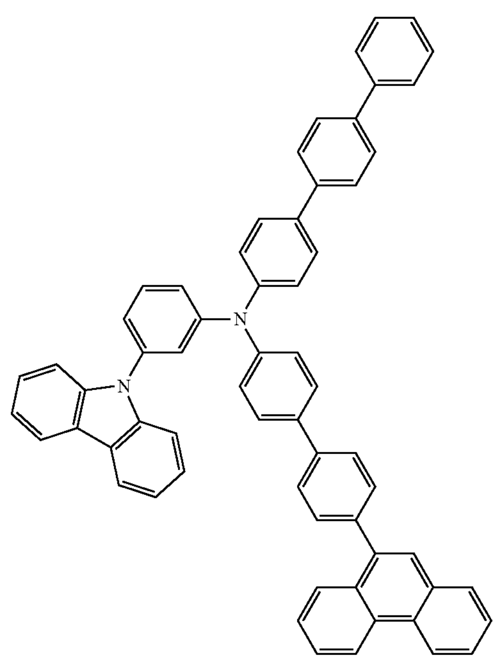

-continued
1-282
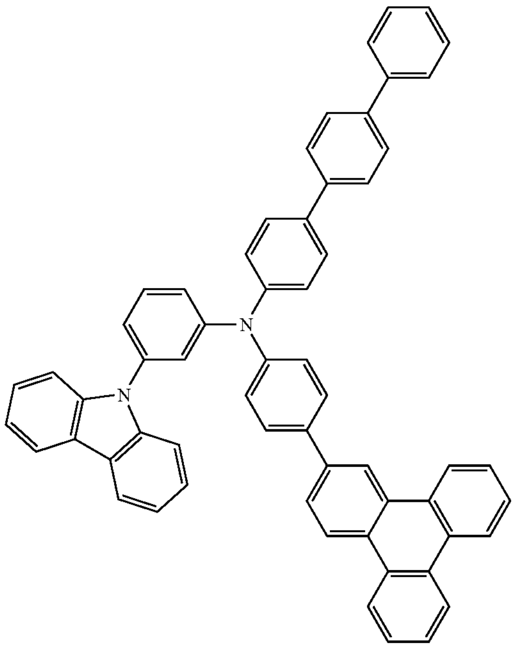
1-283
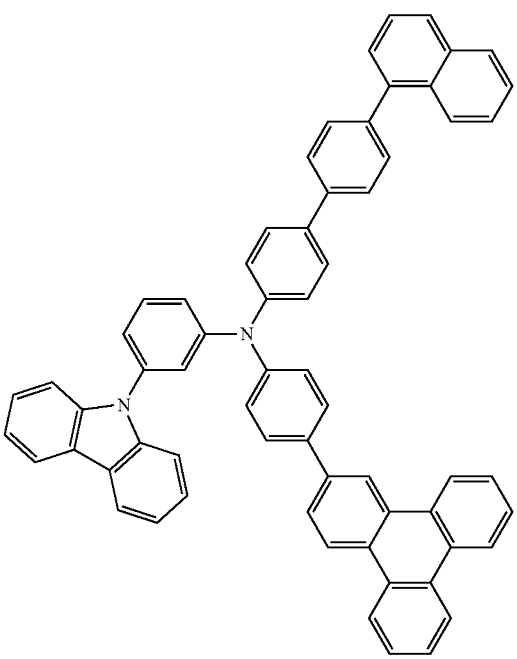
-continued
1-284
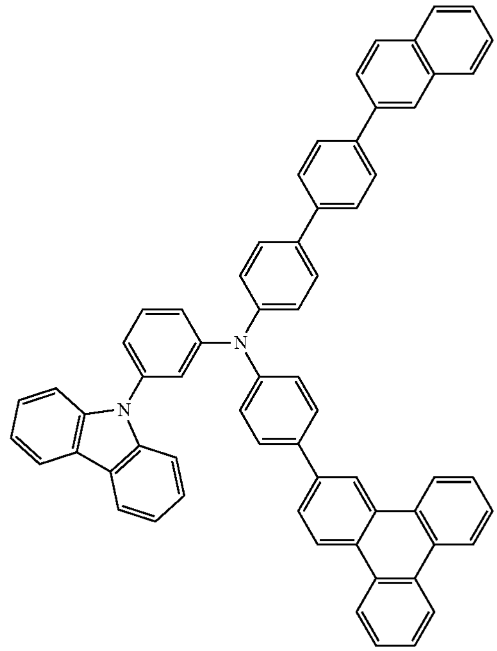
1-285
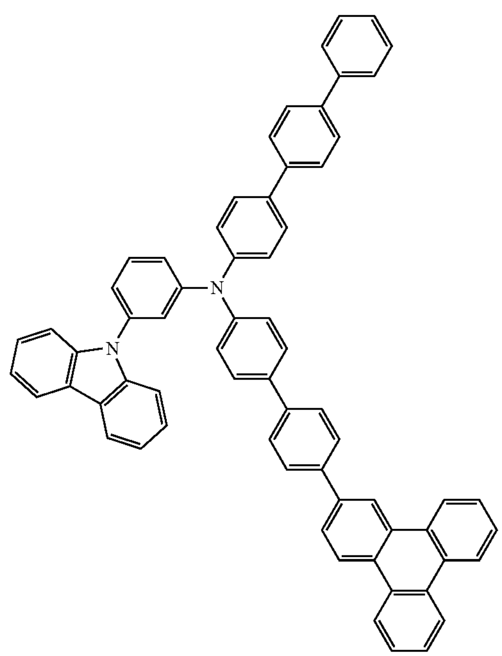

-continued
1-286
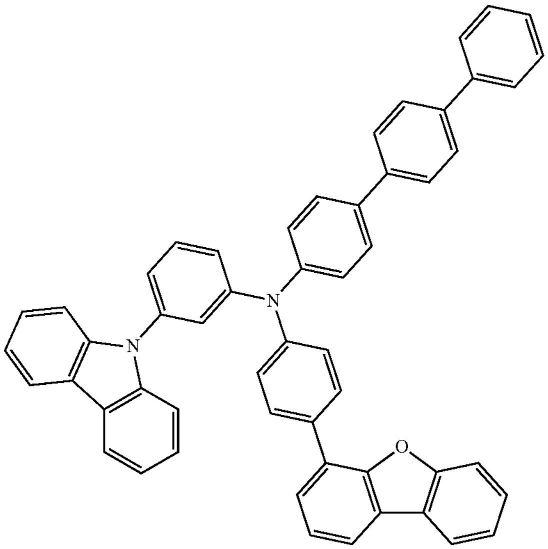
1-287
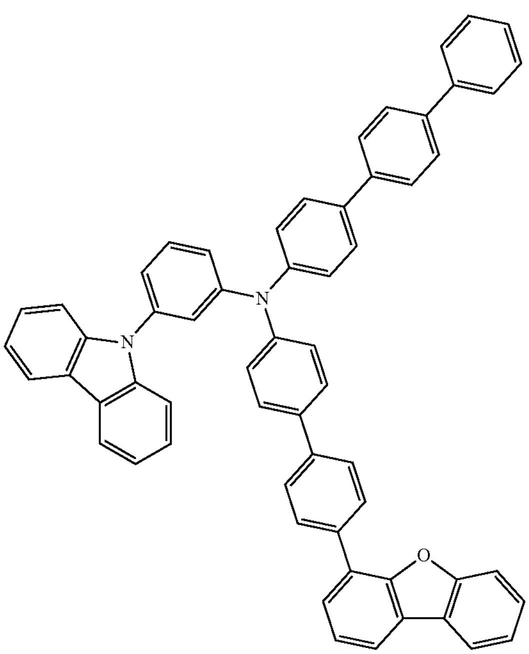
-continued
1-288
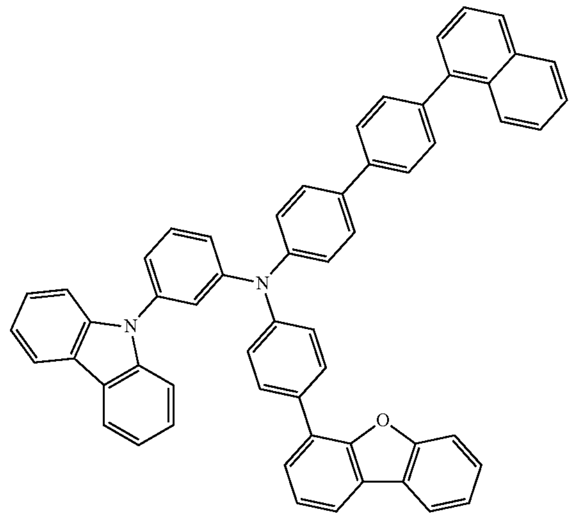
1-289
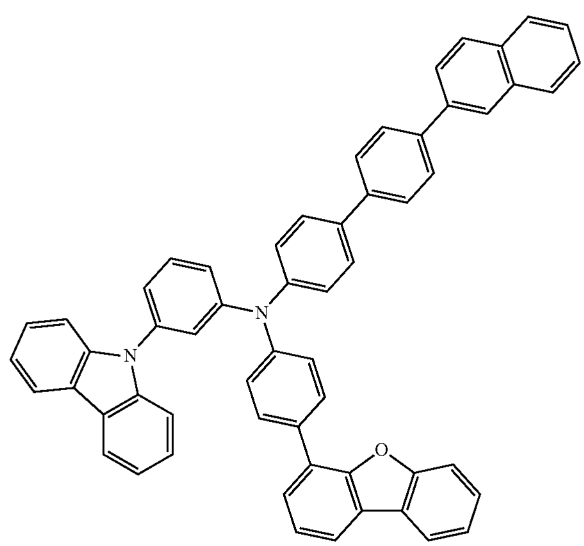

-continued
1-290
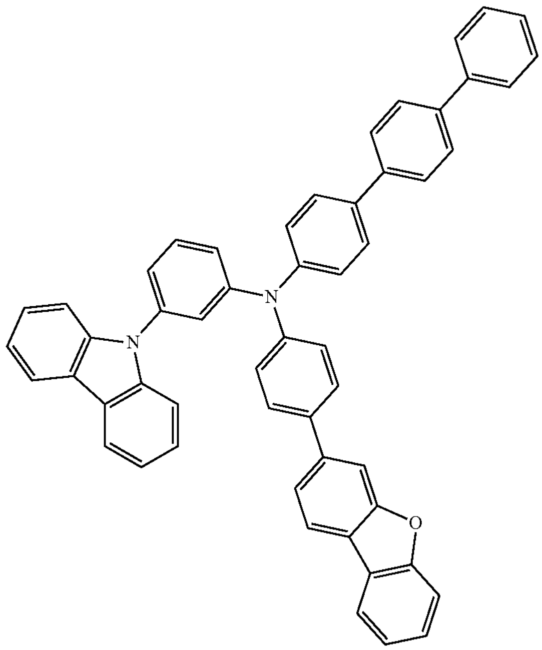
1-291
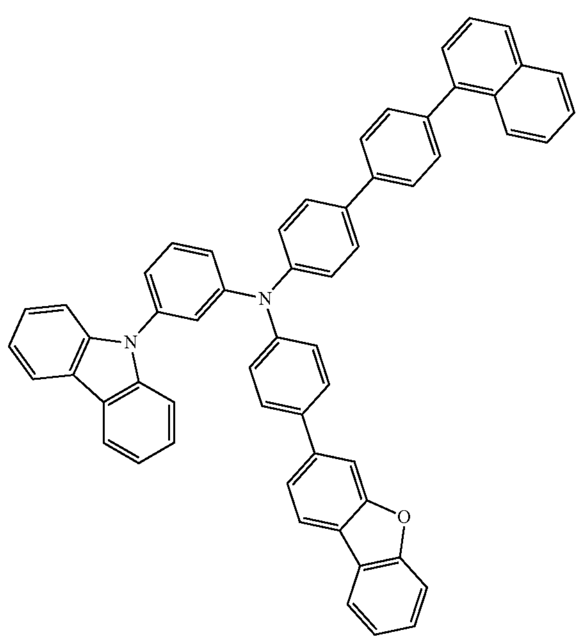
-continued
1-292
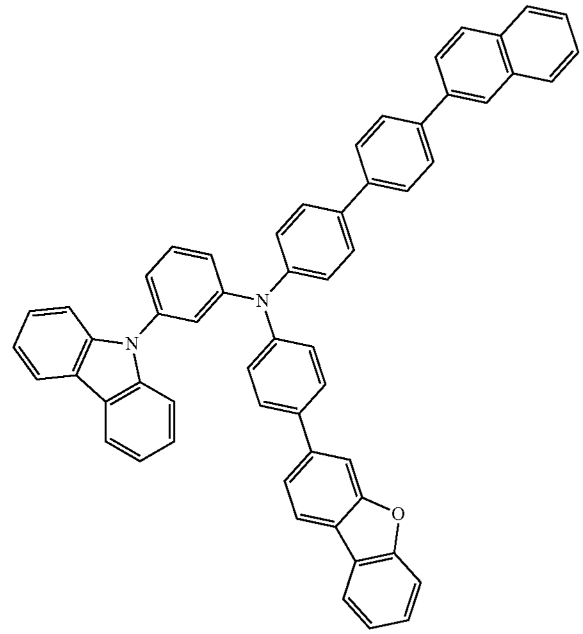
1-293
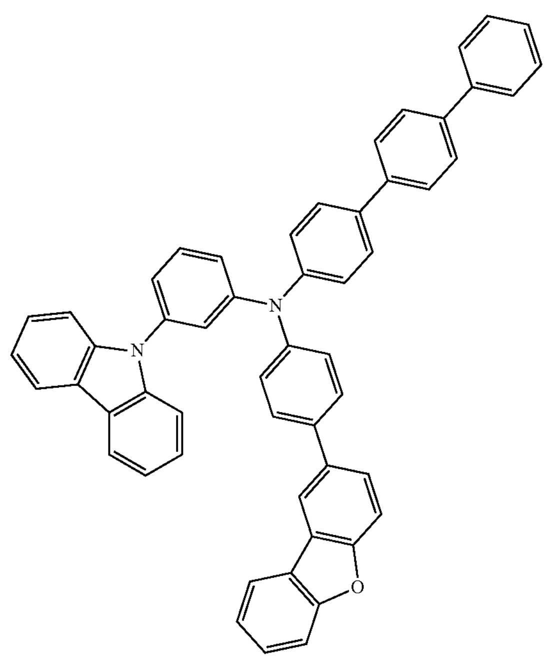

-continued
1-294
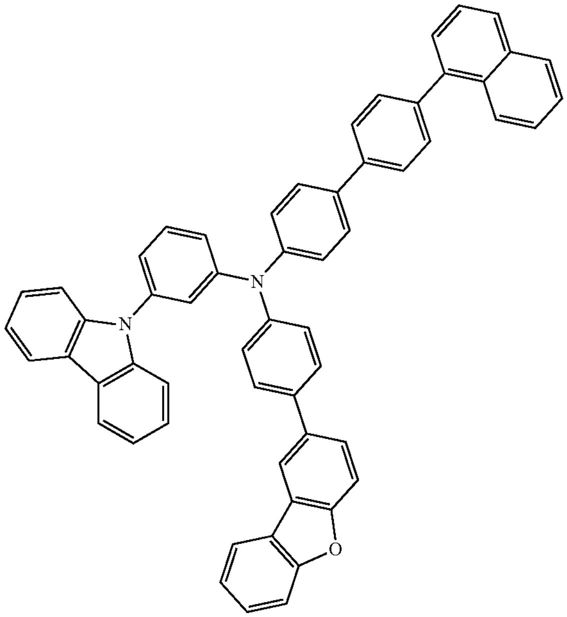
1-295
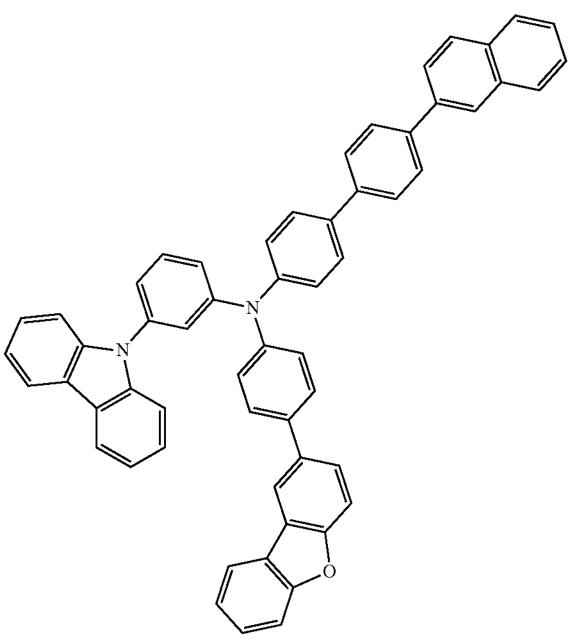
-continued
1-296
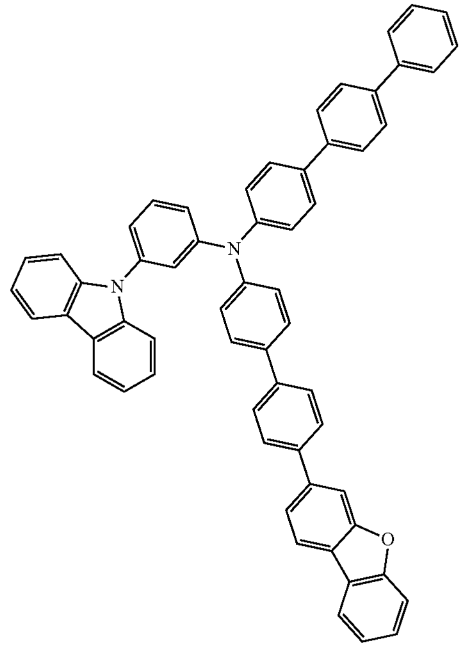
1-297
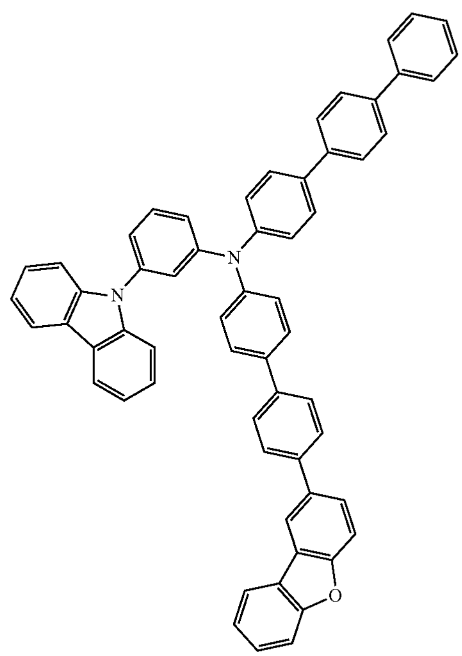

-continued
1-298
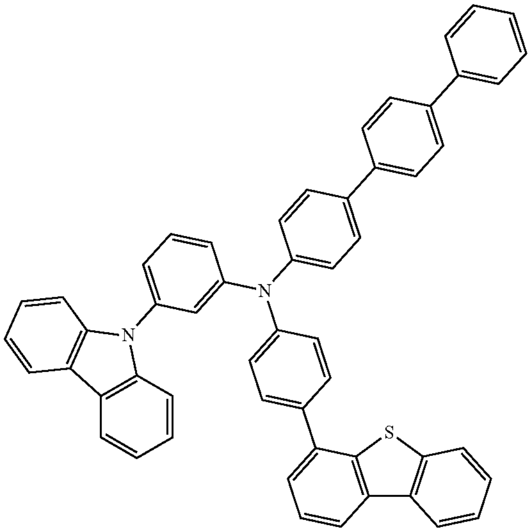
1-299
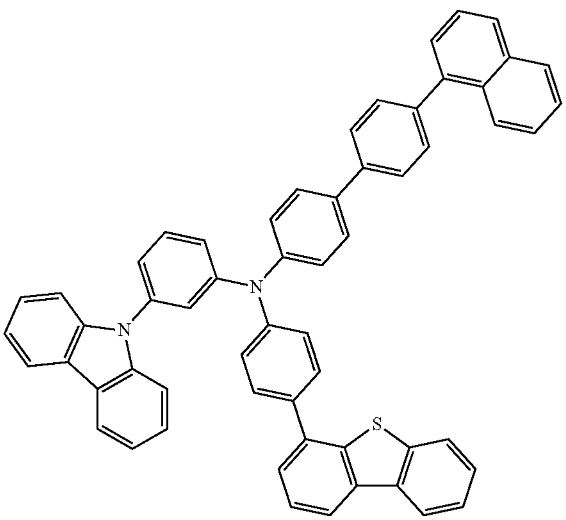
1-300
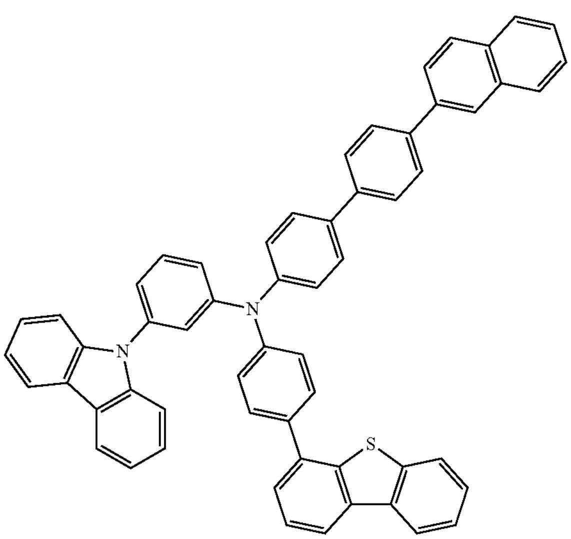
-continued
1-301
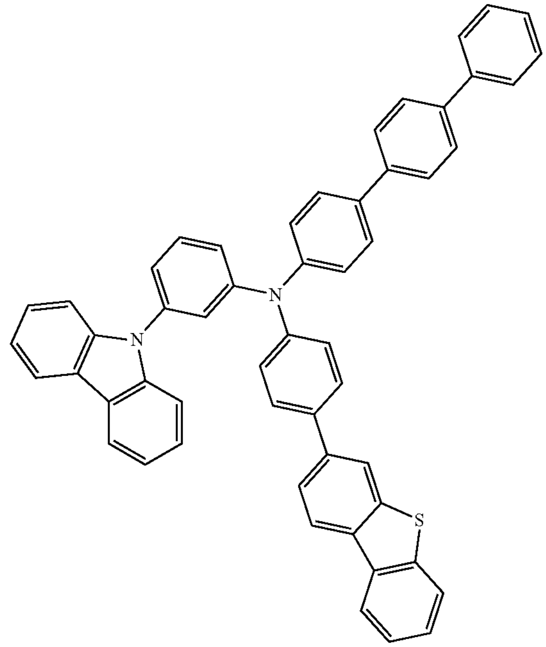
1-302
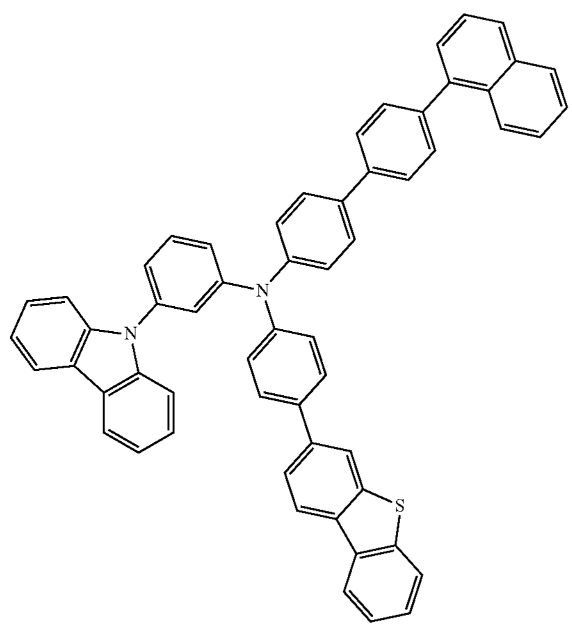

-continued
1-303
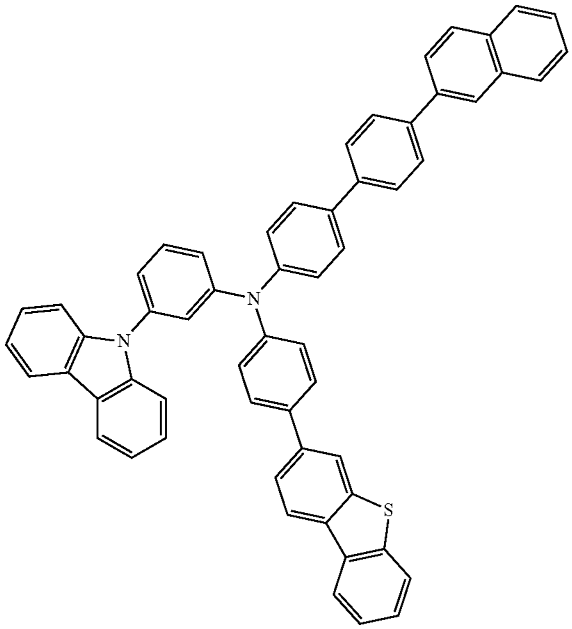
1-304
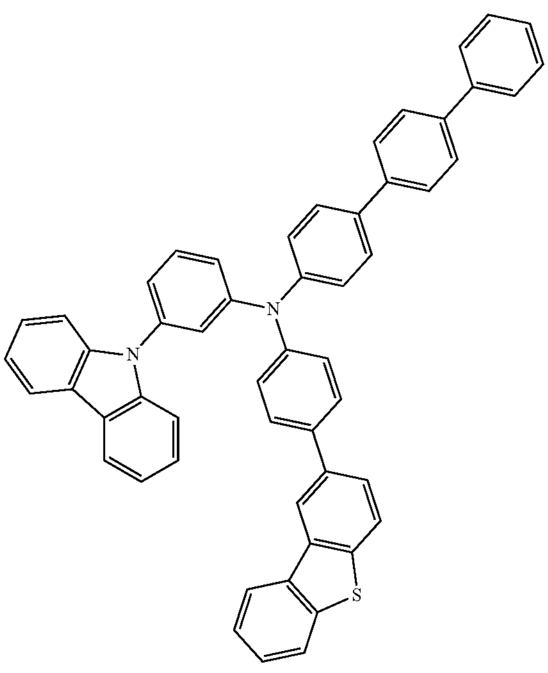
-continued
1-305
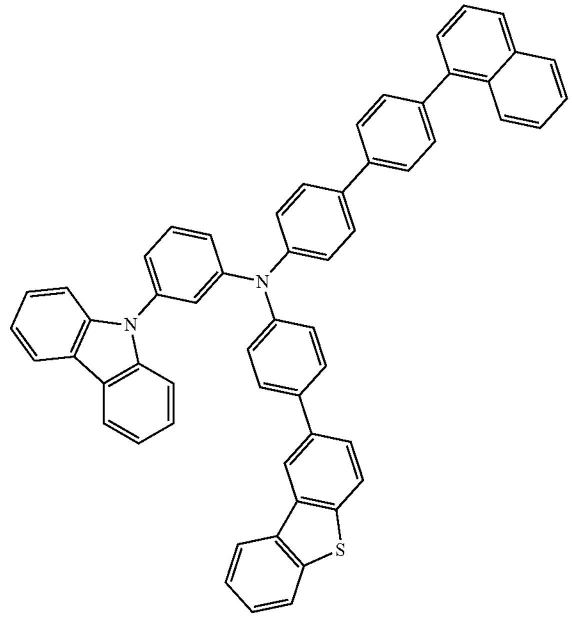
1-306
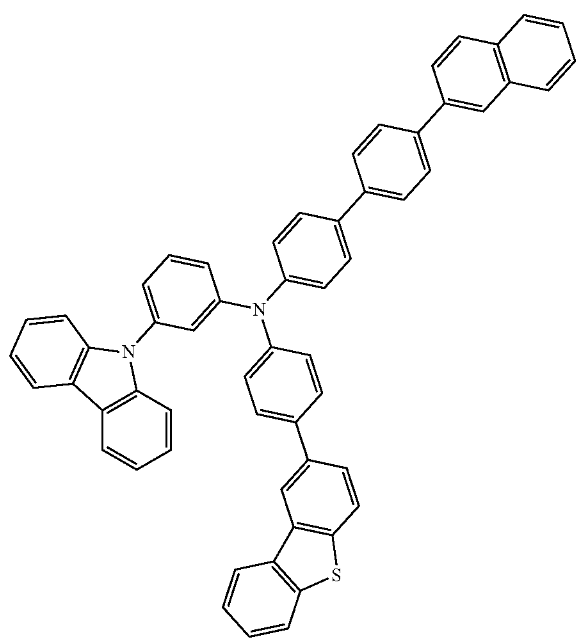

-continued
1-307
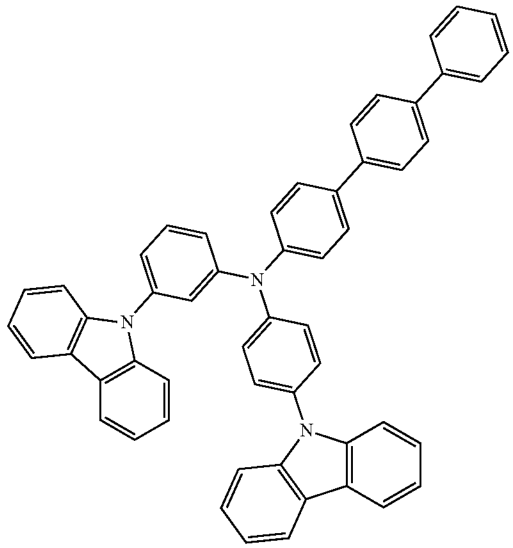
1-308
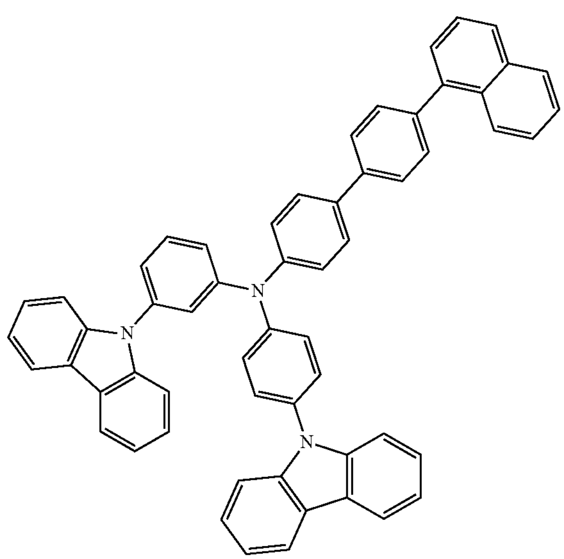
-continued
1-309
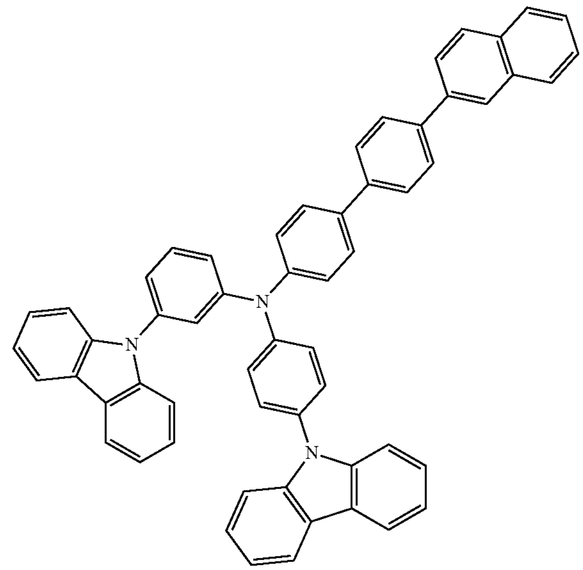
1-310
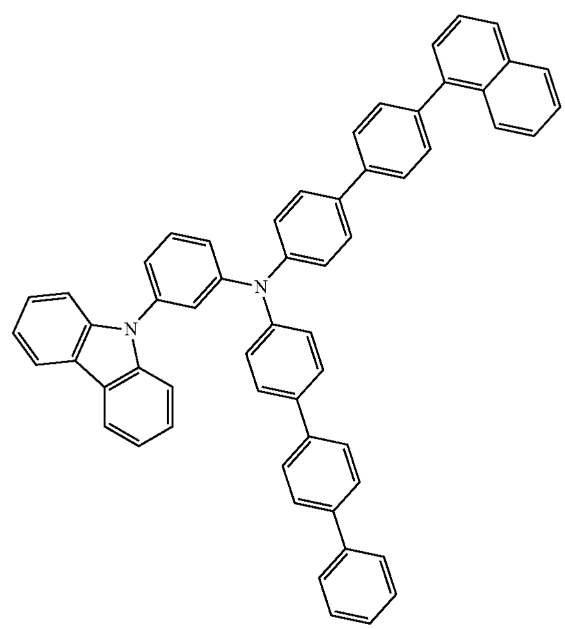

-continued
1-311
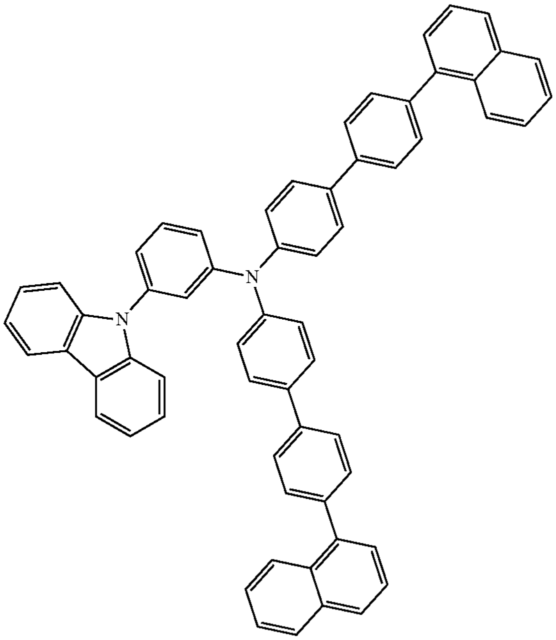
1-312
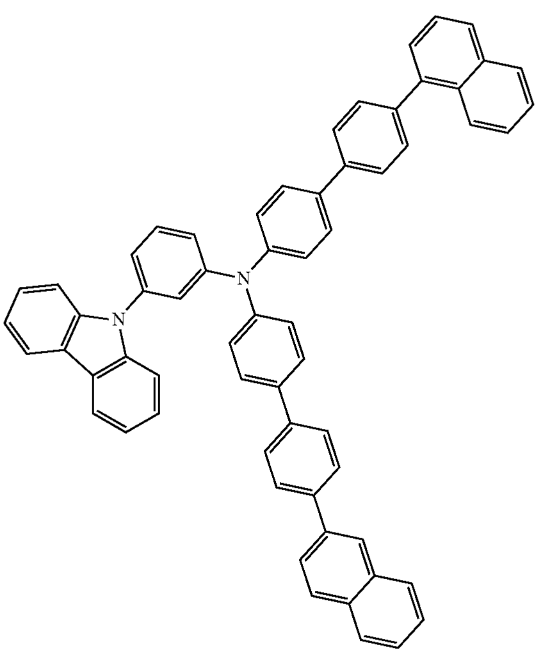
-continued
1-313
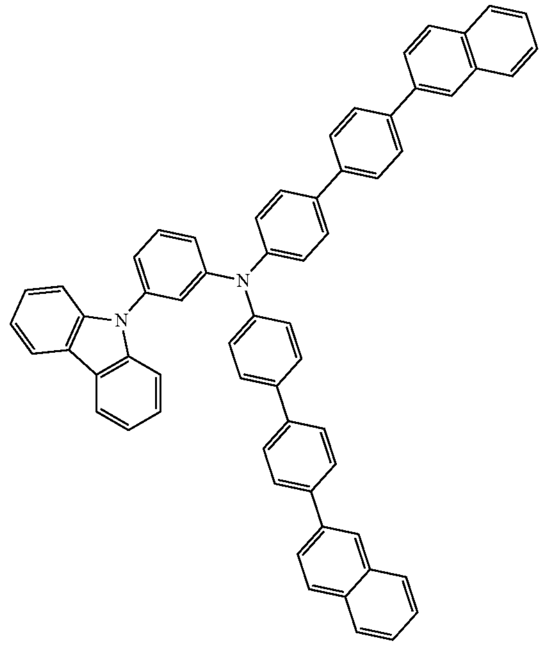
1-314
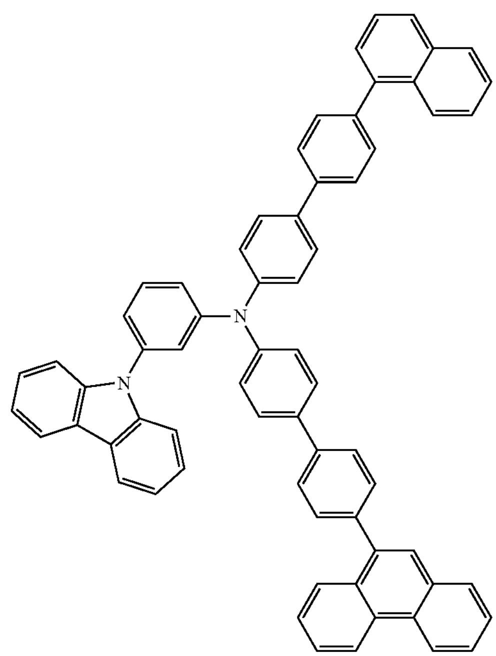

-continued
1-315
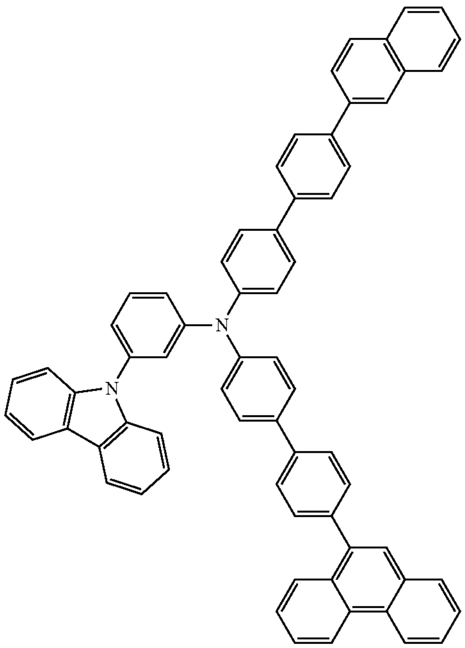
-continued
1-317
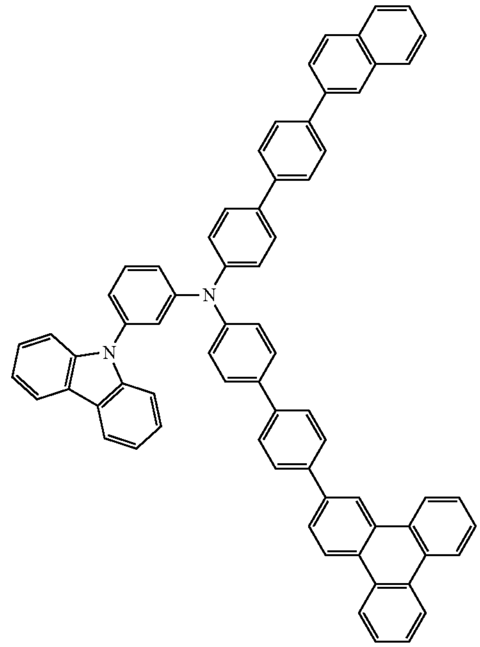
1-316
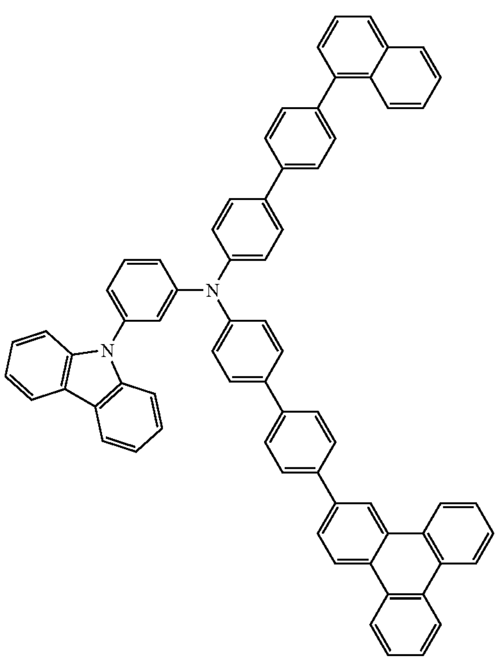
1-318
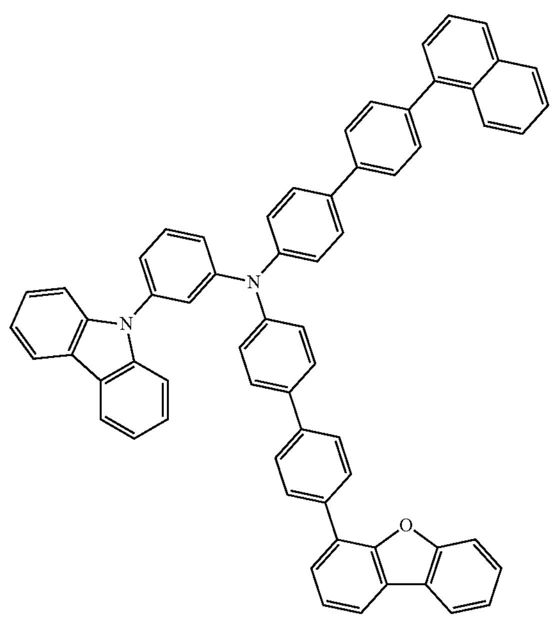

-continued
1-319
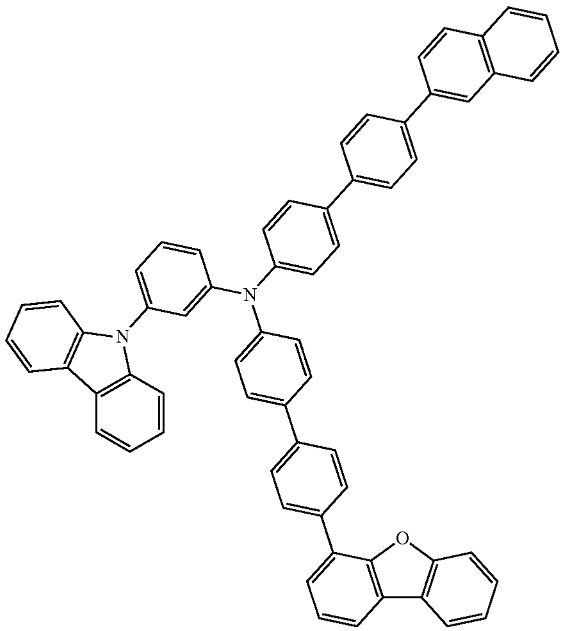
1-320
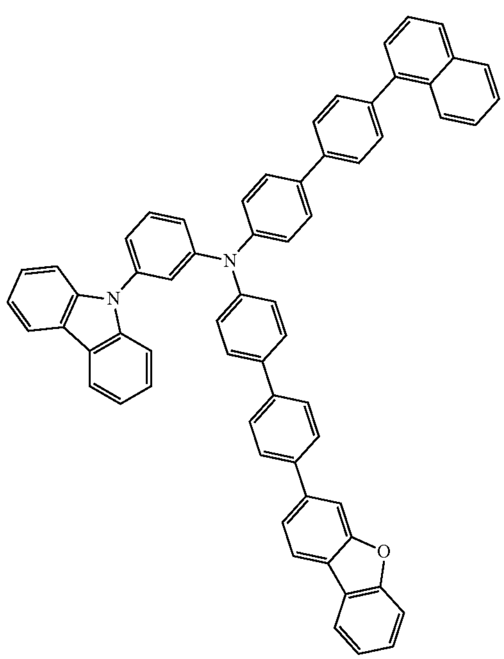
-continued
1-321
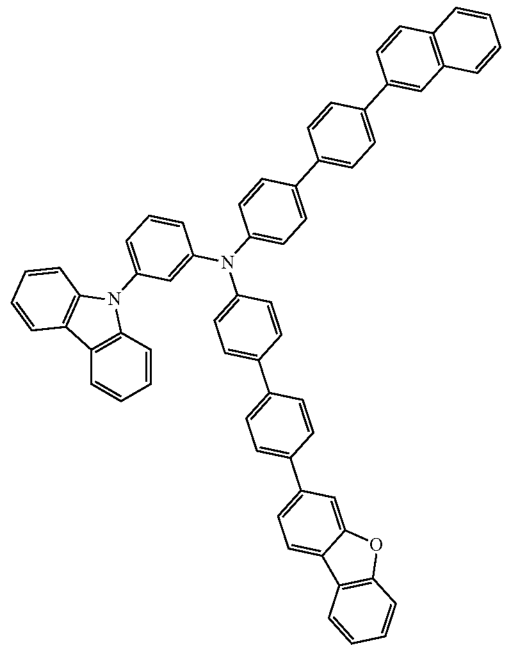
1-322
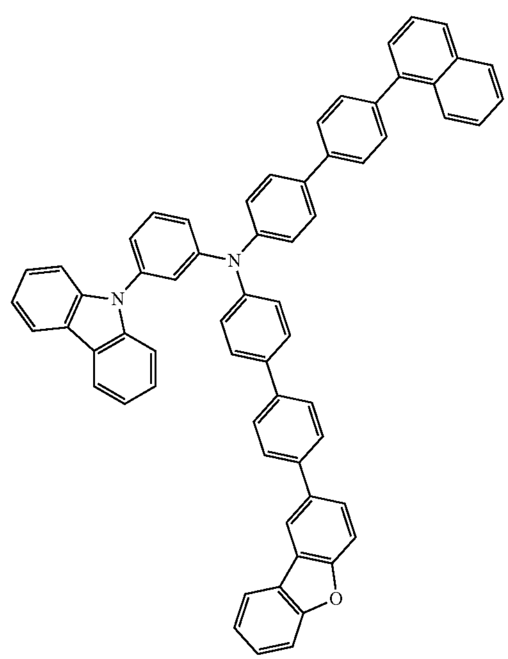

-continued
1-323
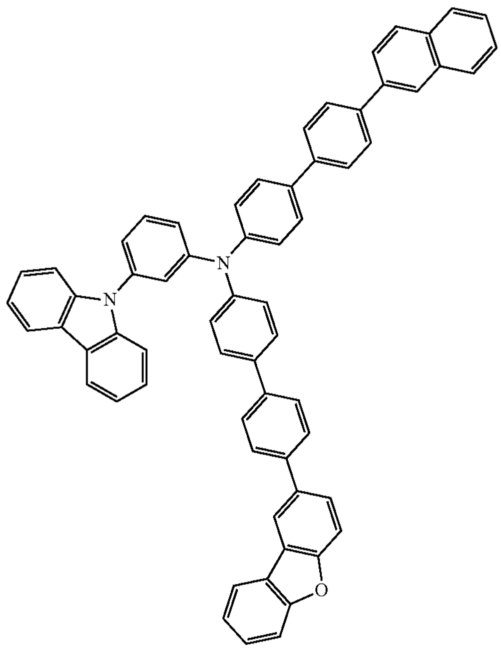
1-324
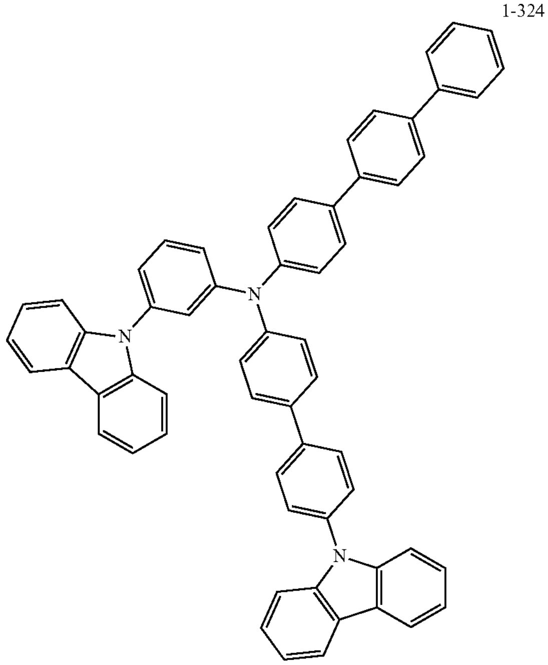
-continued
1-325
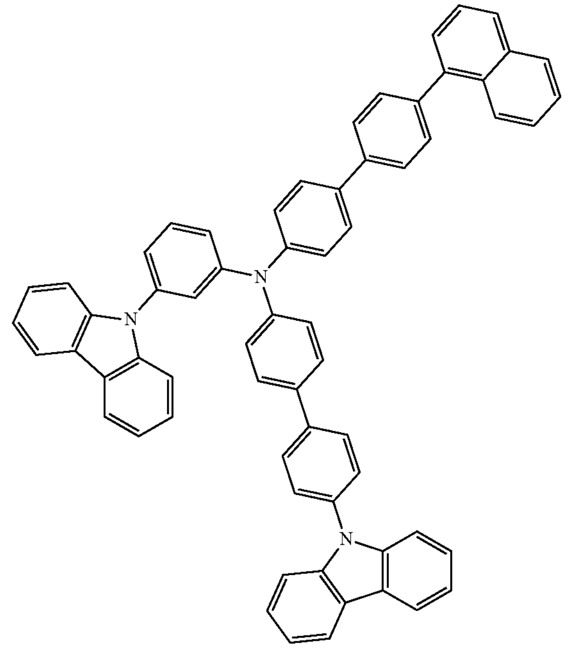
1-326
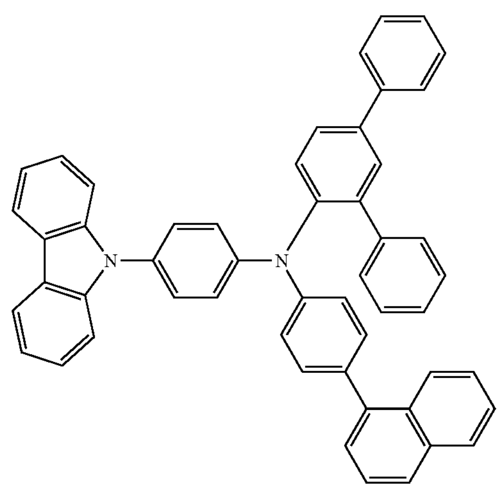

-continued
1-327
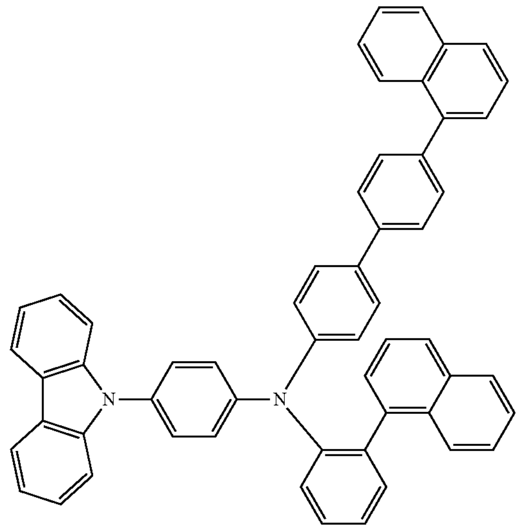
1-328
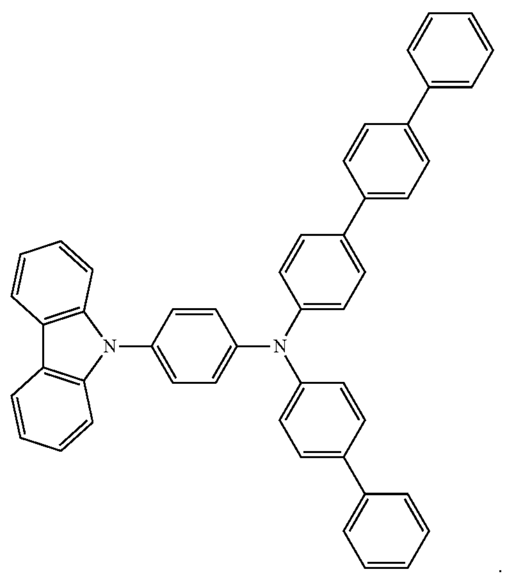
9. The organic electroluminescent device of claim 1, wherein the compound represented by the Chemical Formula 2 is selected from the following compounds:
2-1
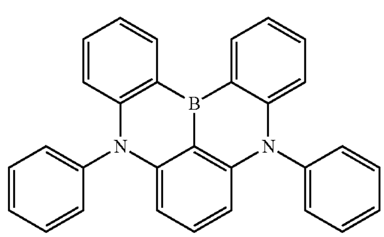
-continued
2-2
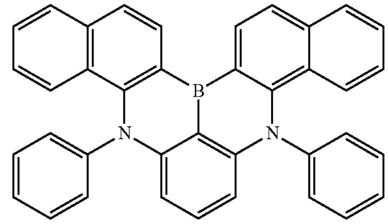
2-3
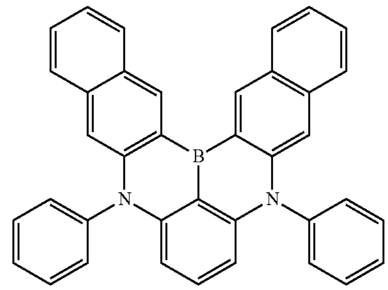
2-4
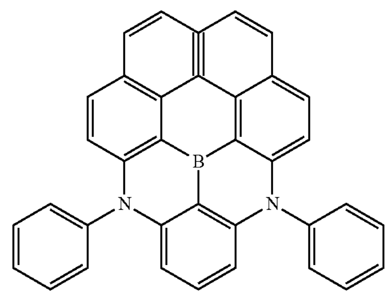
2-5
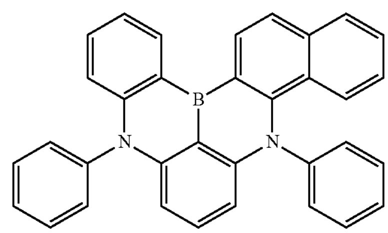
2-6
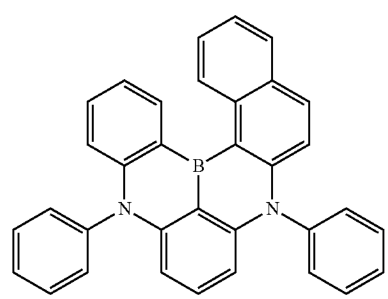
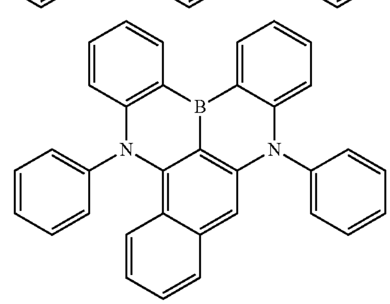

-continued
2-8
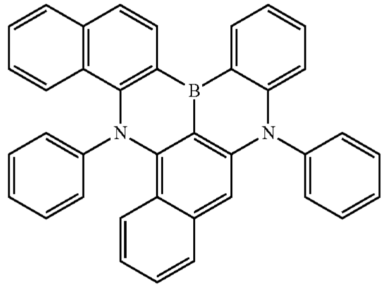
2-9
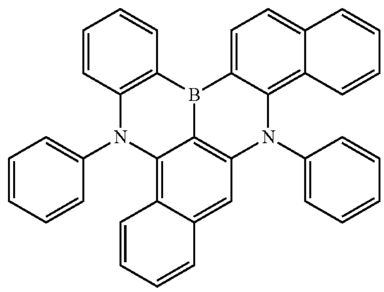
2-10
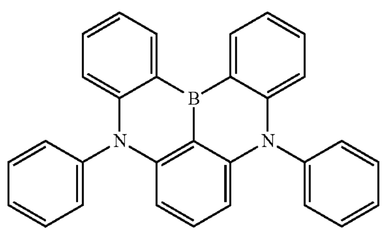
2-11
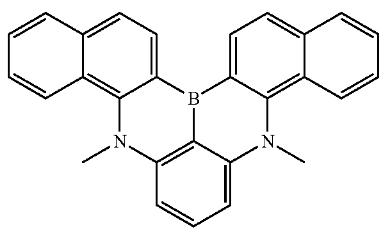
2-12
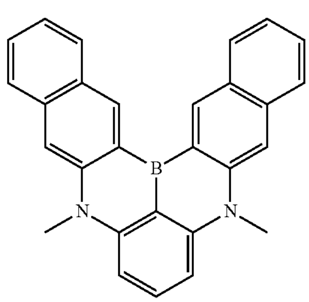
2-13
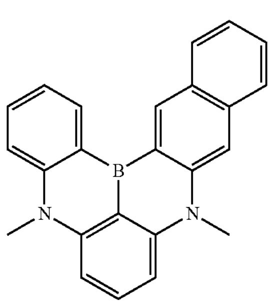
-continued
2-14
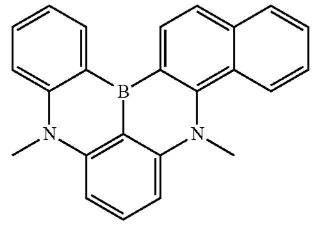
2-15
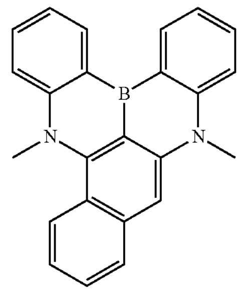
2-16
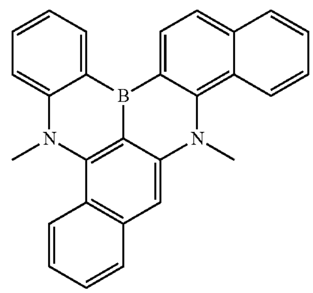
2-17
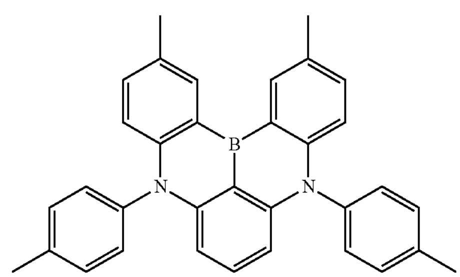
2-18
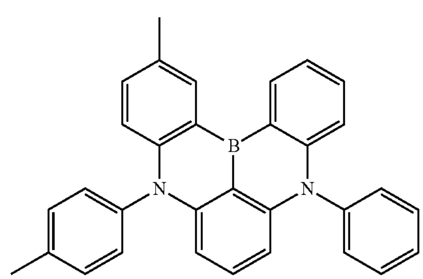
2-19
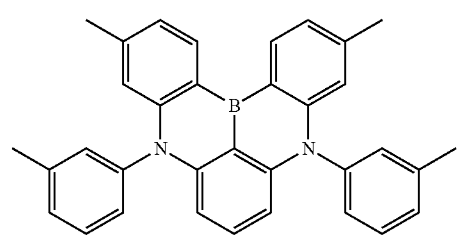

-continued
2-20
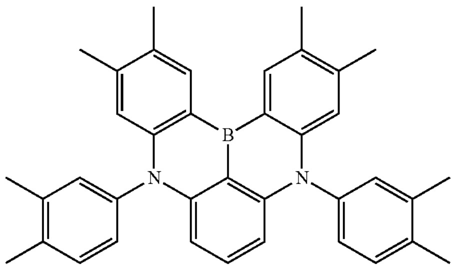
2-21
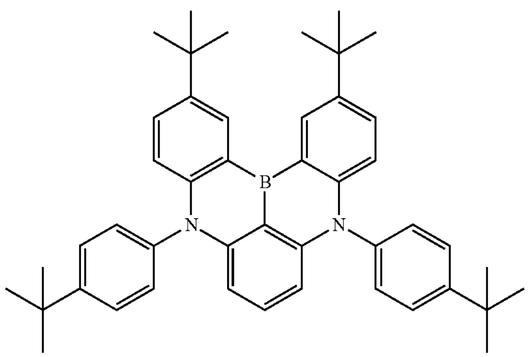
2-22
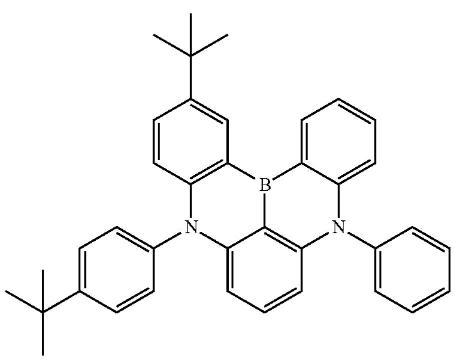
2-23
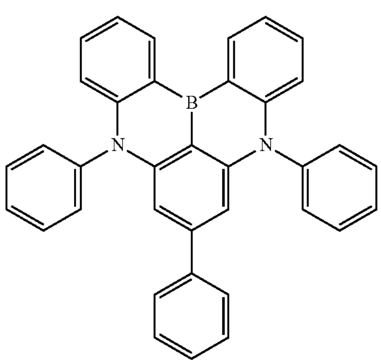
-continued
2-24
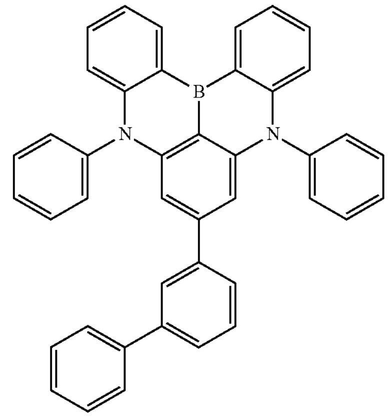
2-25
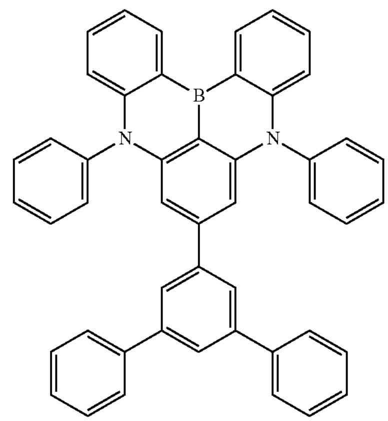
2-26
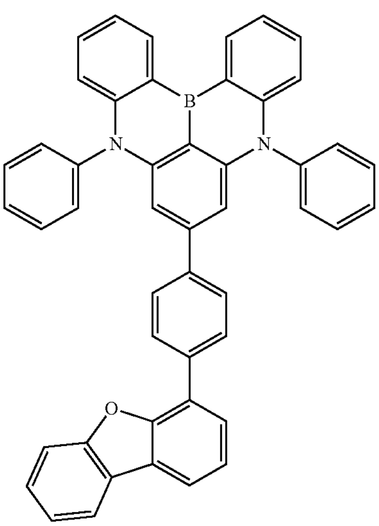

-continued
2-27
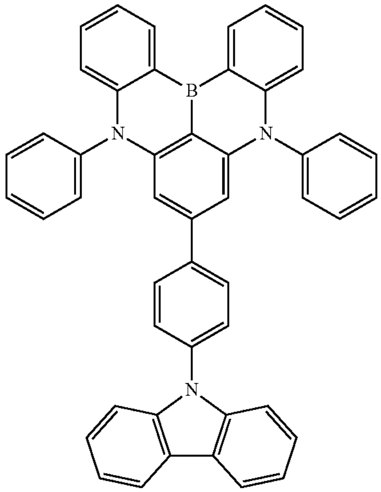
2-28
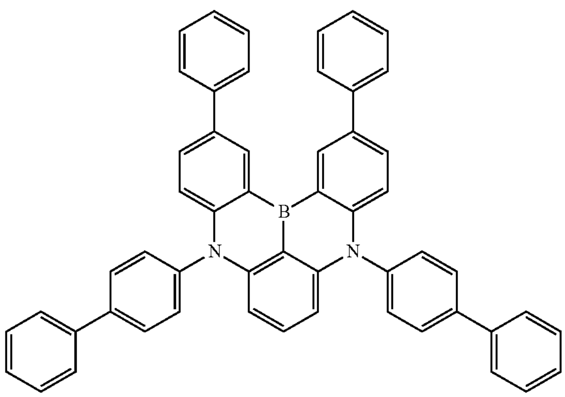
2-29
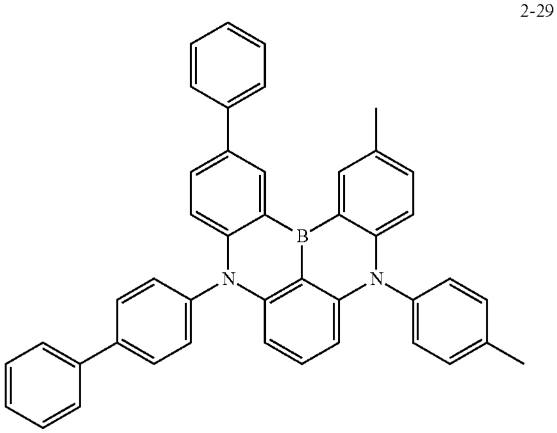
-continued
2-30
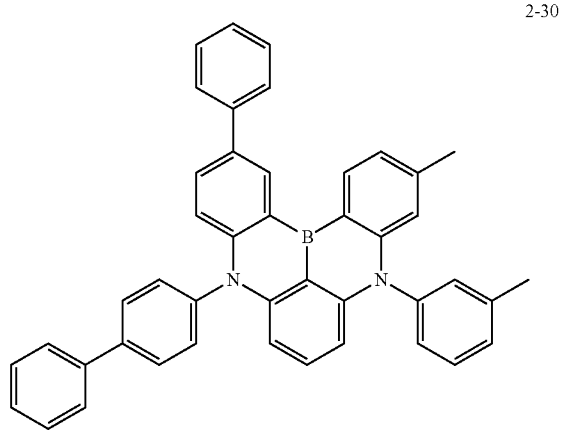
2-31
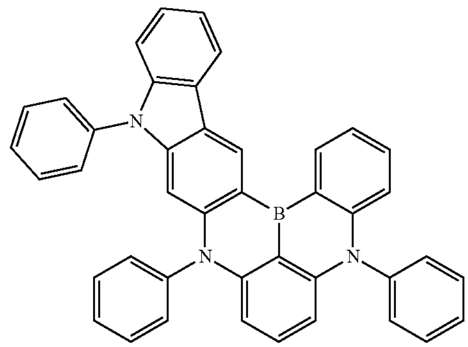
2-32
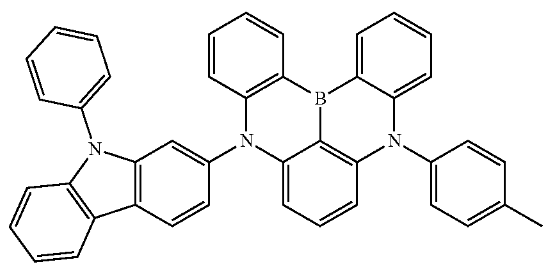
2-33
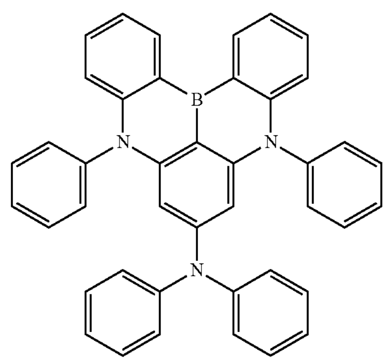

-continued
2-34
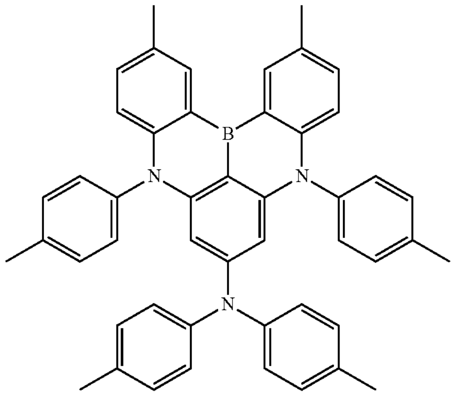
2-35
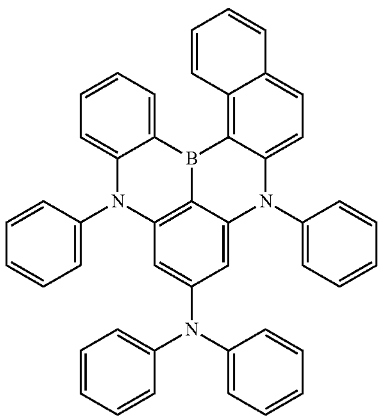
2-36
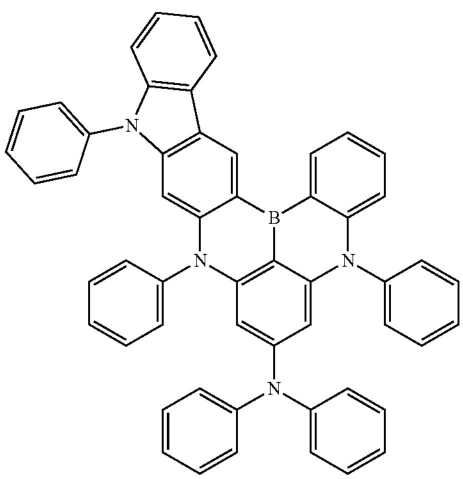
2-37
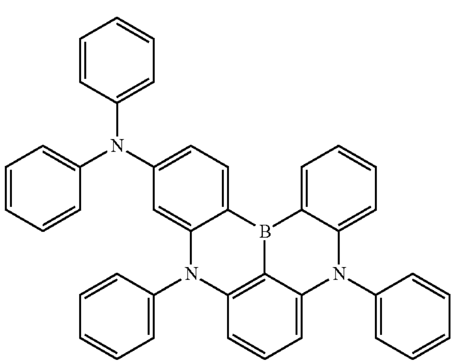
-continued
2-38
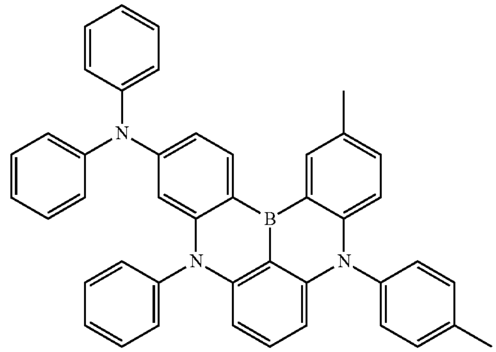
2-39
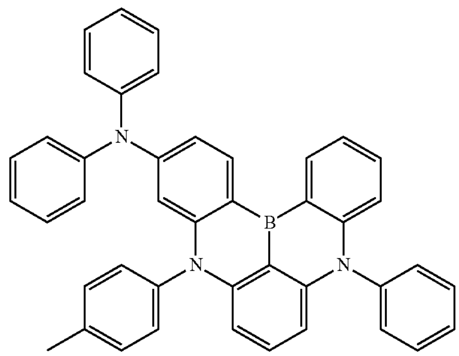
2-40
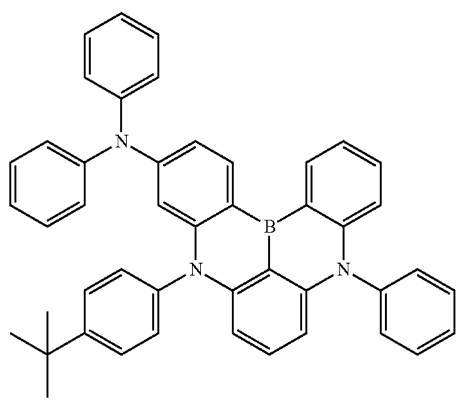
2-41
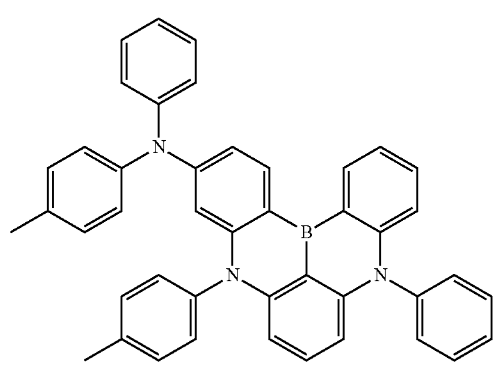

-continued
2-42
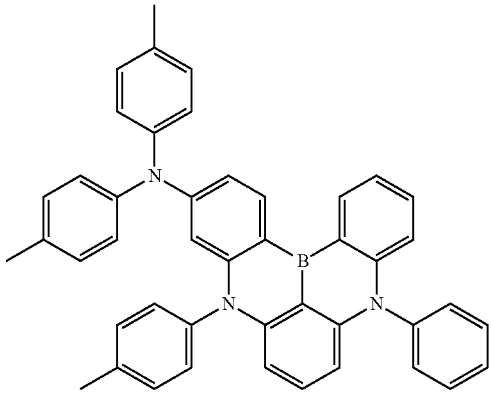
2-43
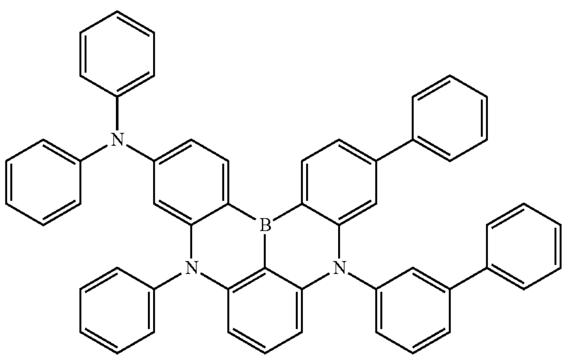
2-44
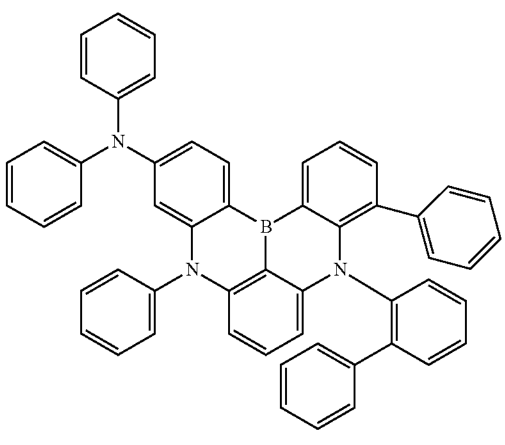
2-45
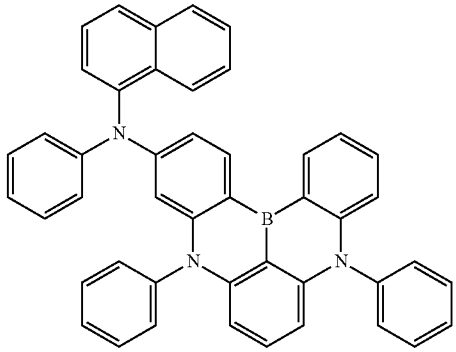
-continued
2-46
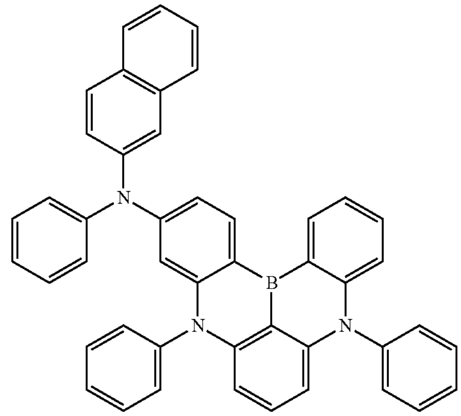
2-47
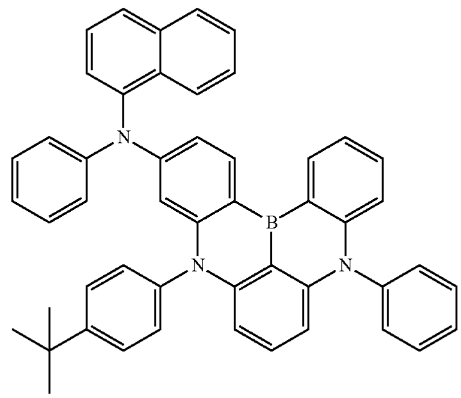
2-48
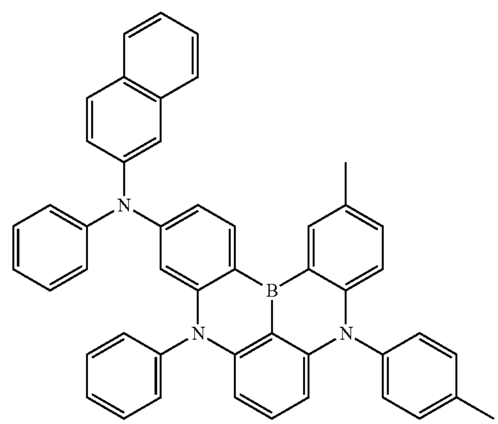
2-49
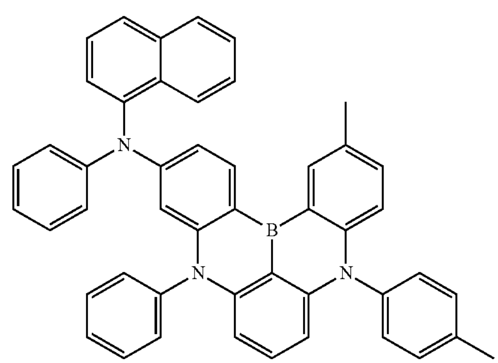

-continued
2-50
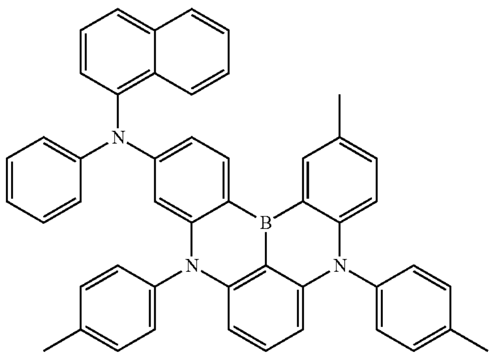
2-51
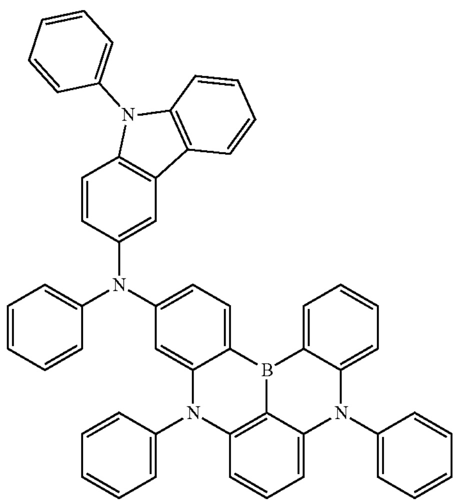
2-52
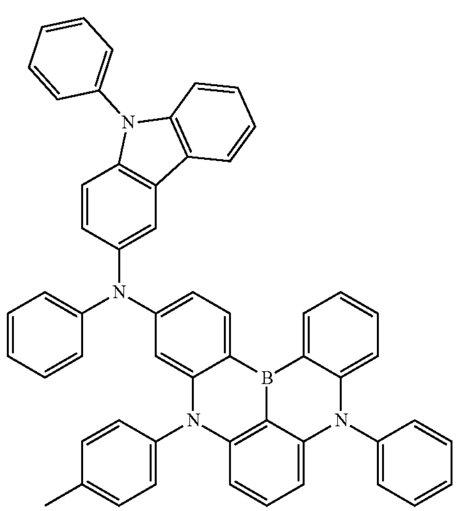
-continued
2-53
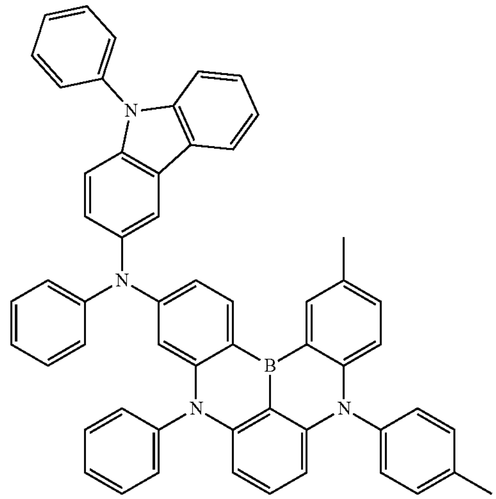
2-54
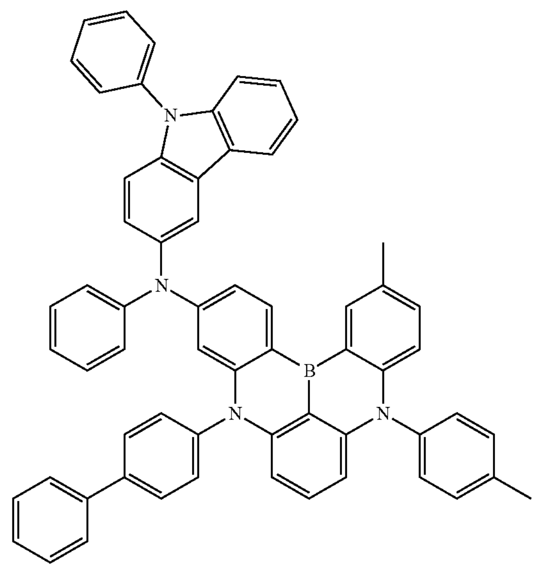
2-55
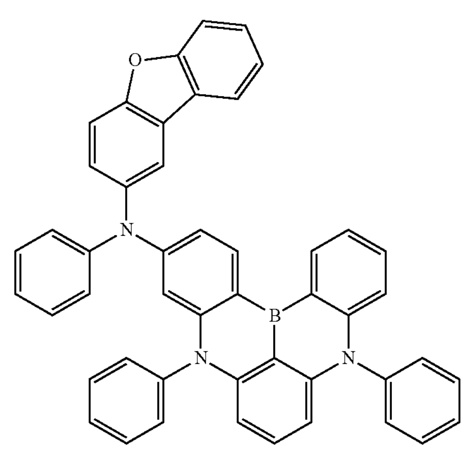

-continued
2-56
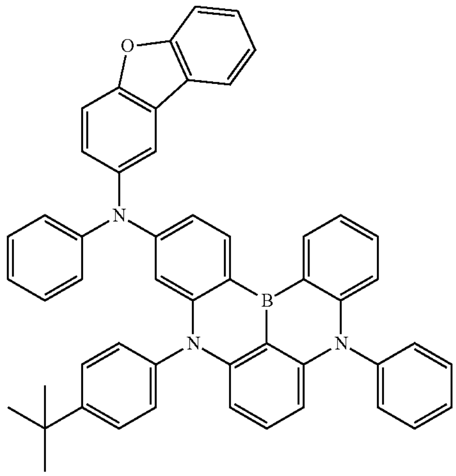
2-57
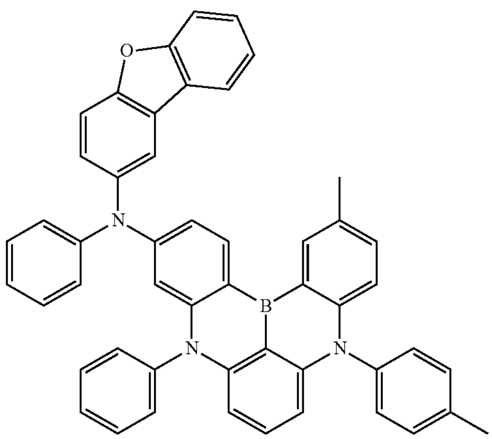
2-58
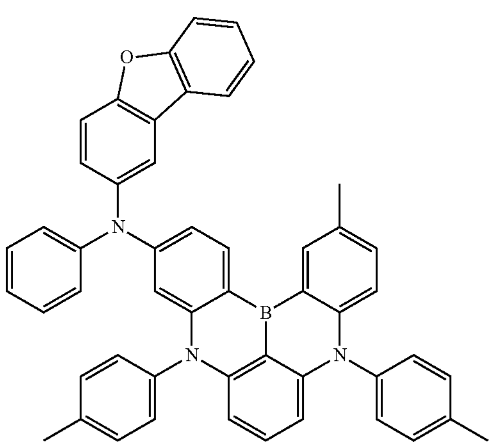
-continued
2-59
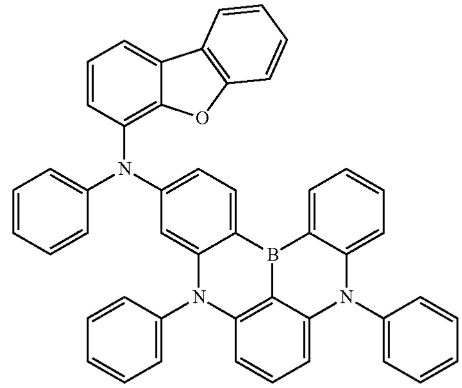
2-60
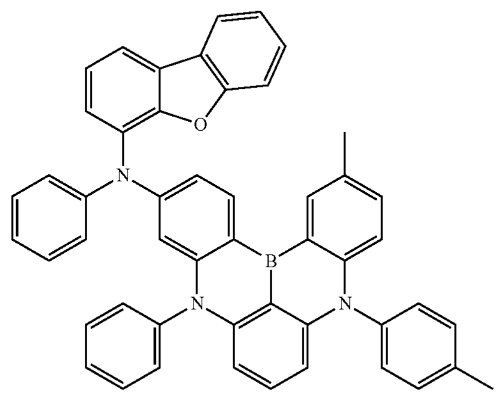
2-61
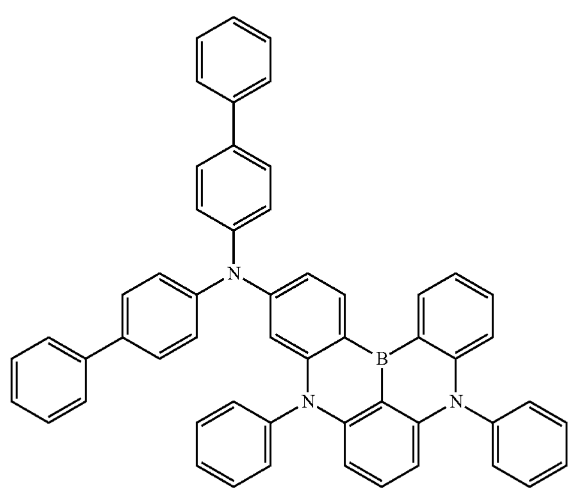

-continued
2-62
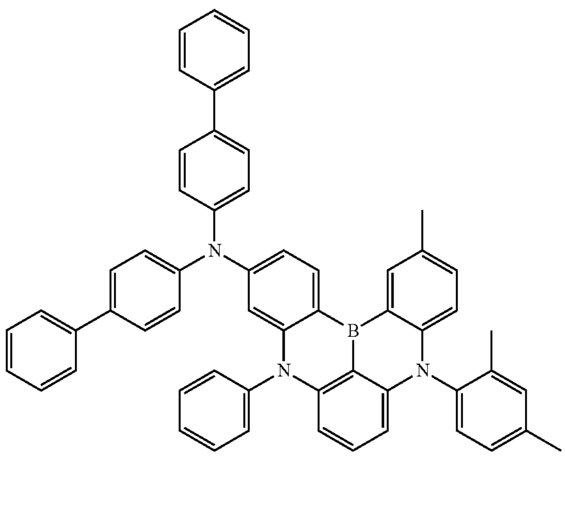
2-63
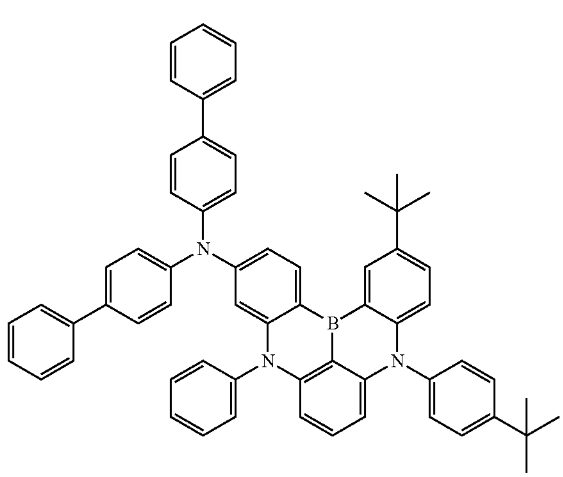
2-64
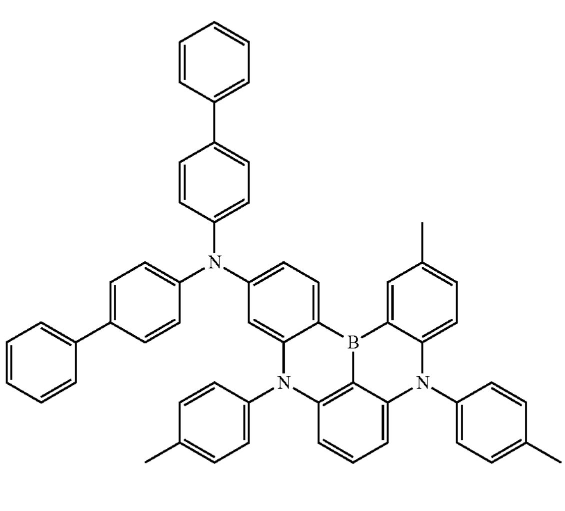
-continued
2-65
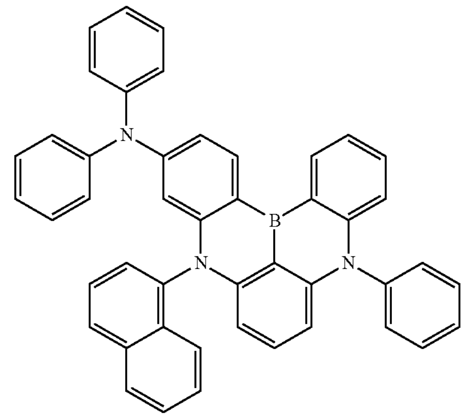
2-66
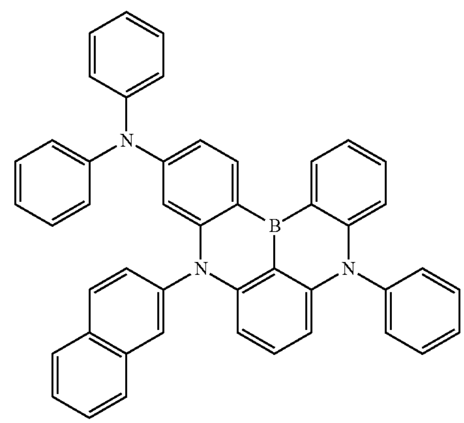
2-67
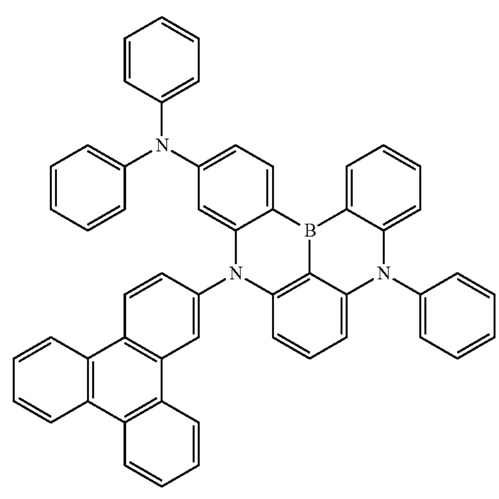

2-68
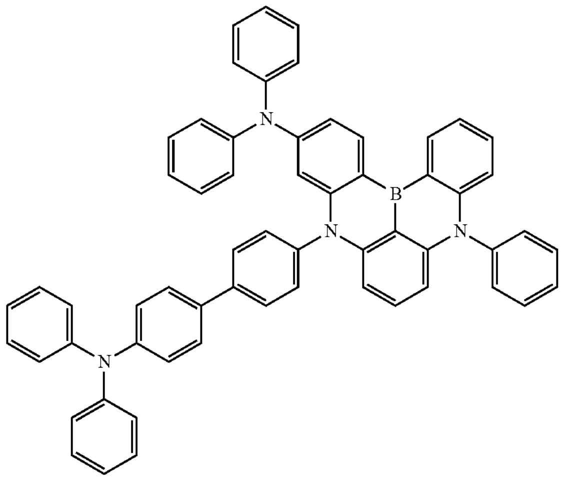
2-69
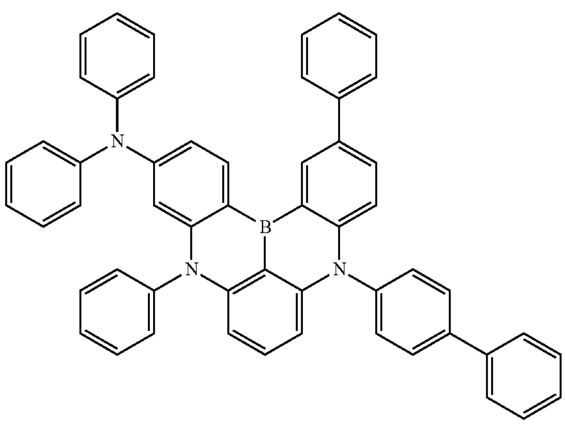
2-70
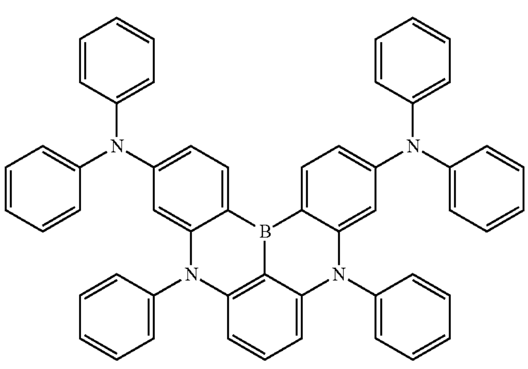
2-71
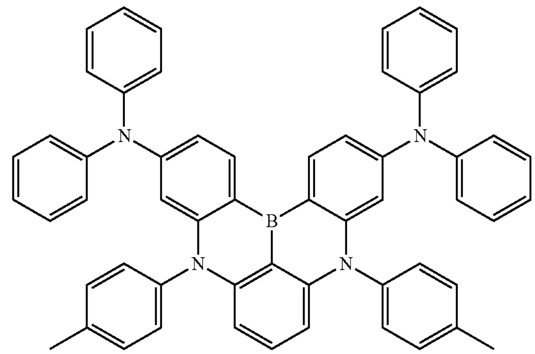
2-72
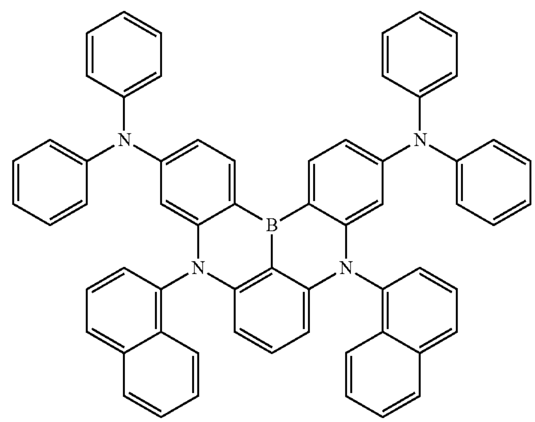
2-73
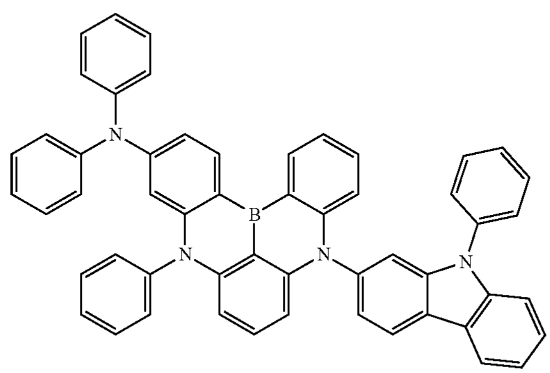
2-74
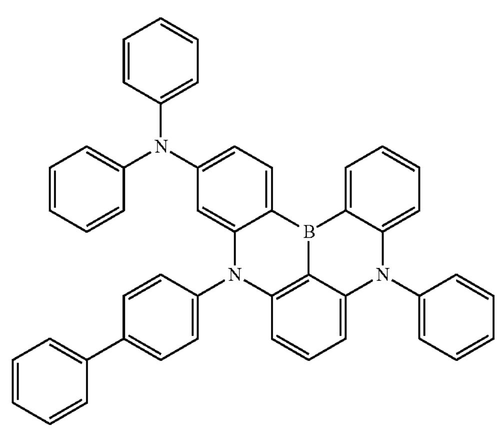

-continued
2-75
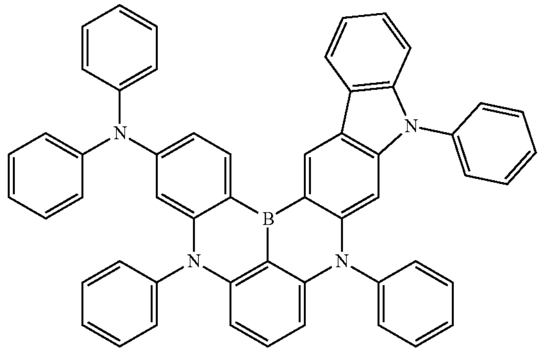
2-76
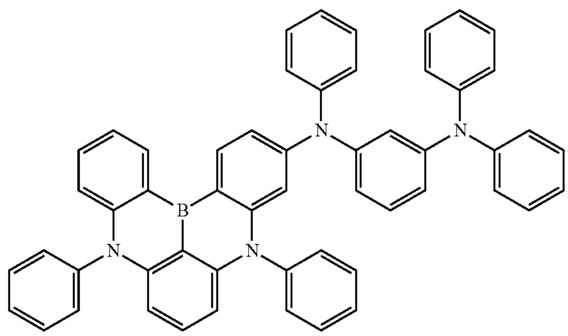
2-77
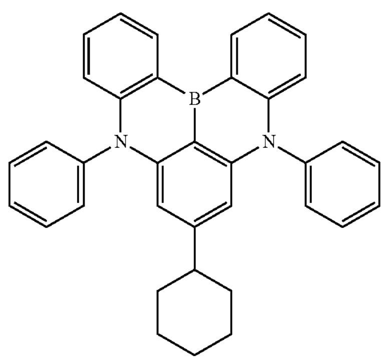
2-78
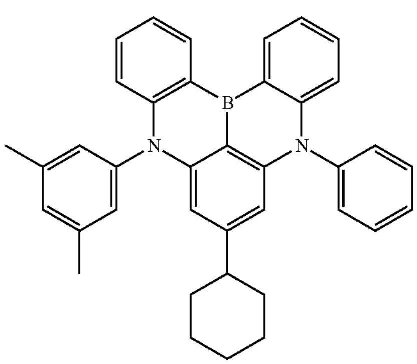
-continued
2-79
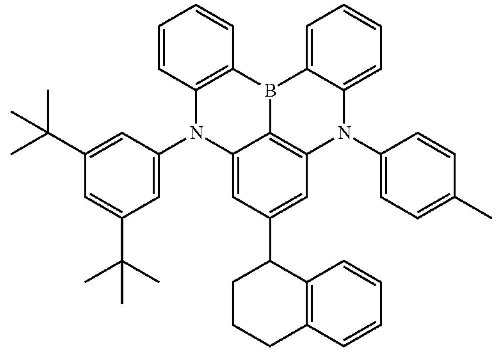
2-80
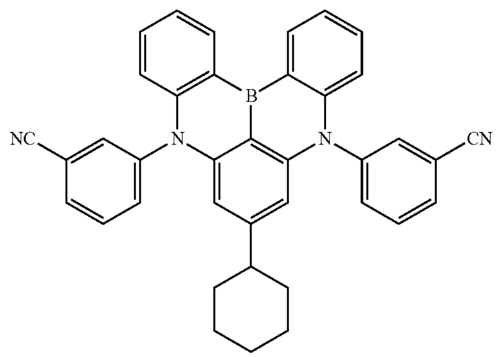
2-81
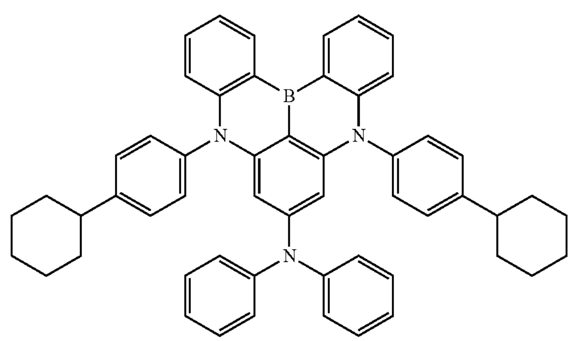
2-82
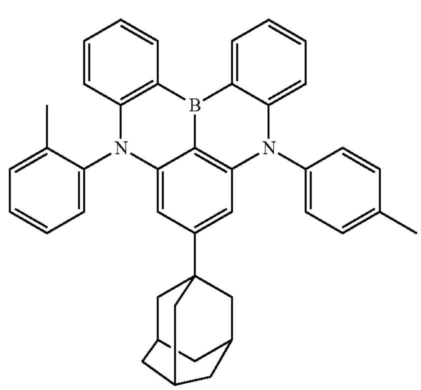

-continued
2-83
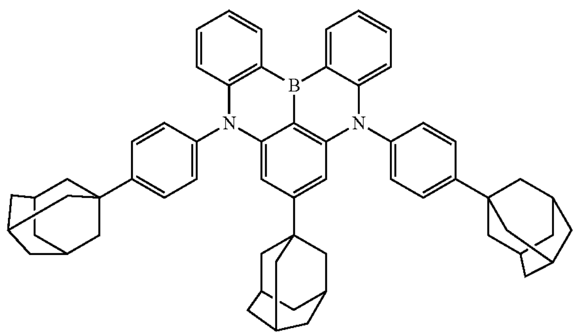
2-84
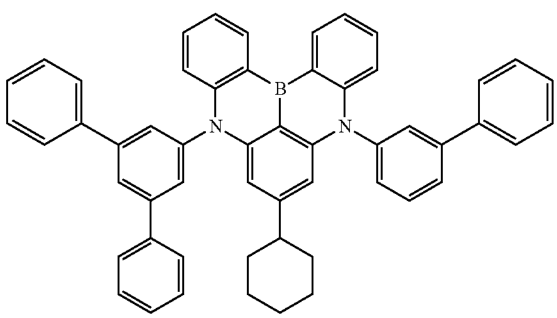
2-85
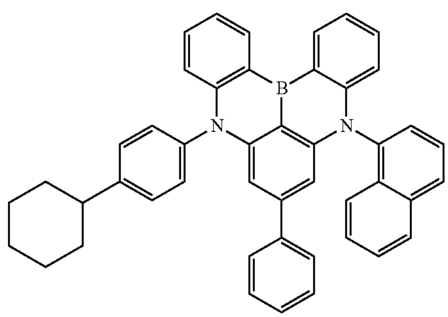
2-86
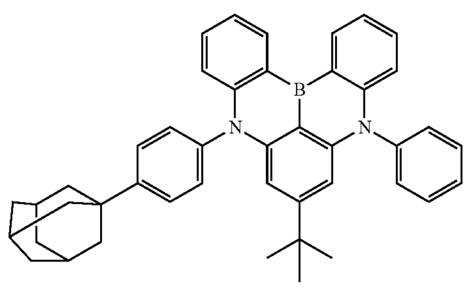
2-87
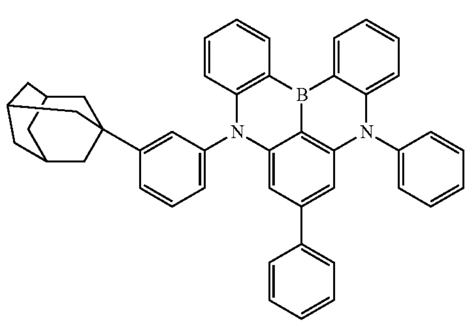
-continued
2-88
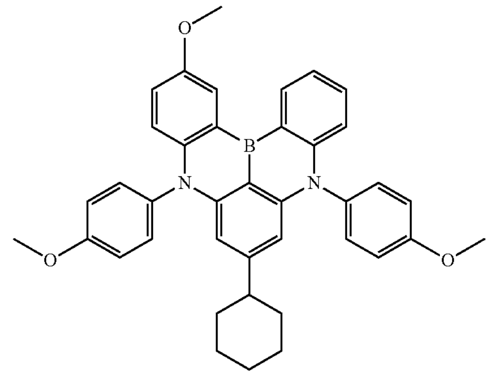
2-89
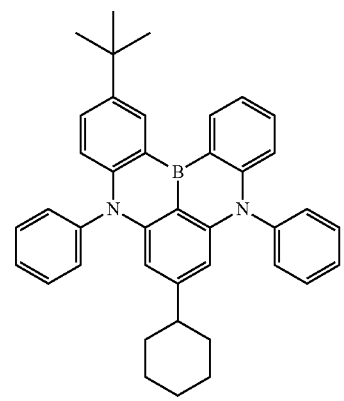
2-90
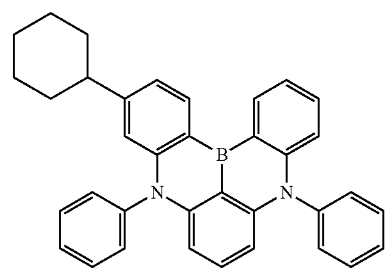
2-91
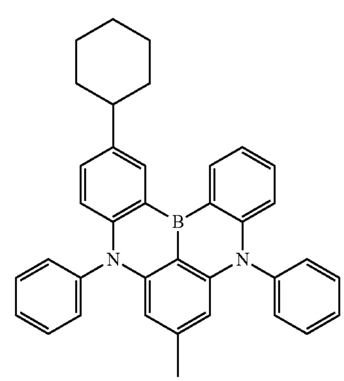

-continued
2-92
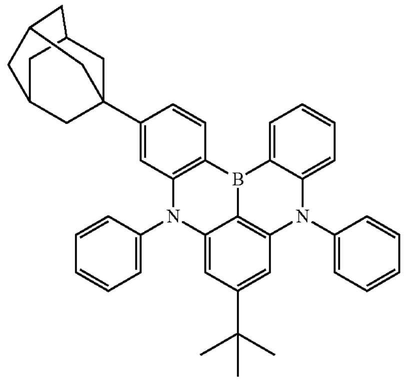
2-93
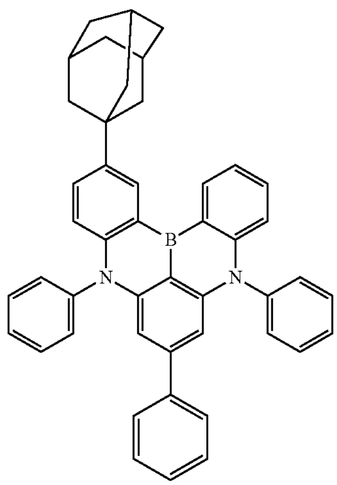
2-94
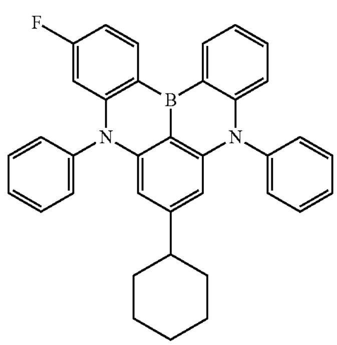
2-95
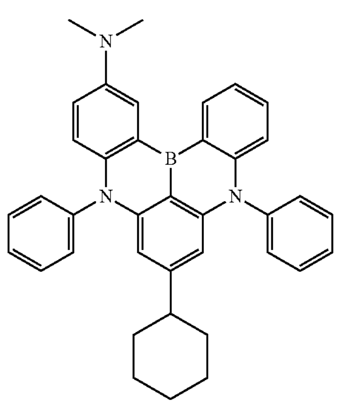
-continued
2-96
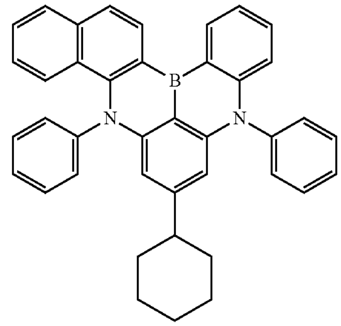
2-97
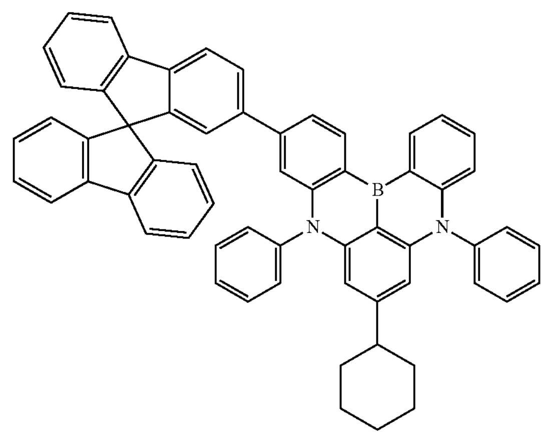
2-98
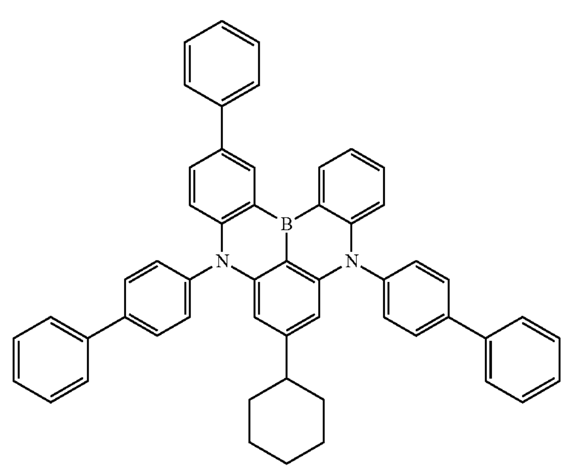

2-99
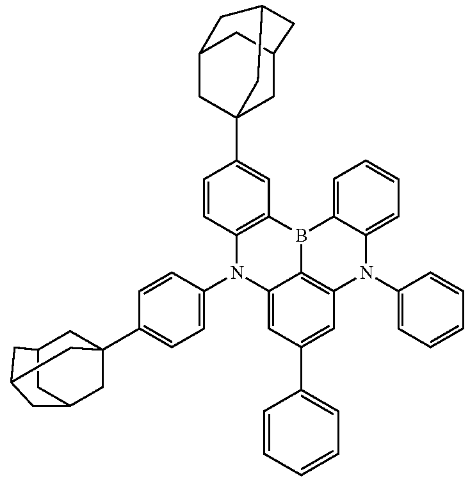
2-100
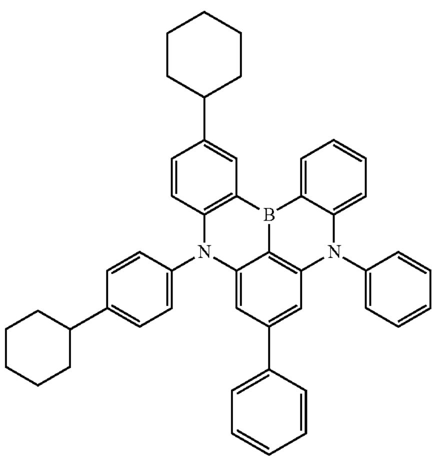
2-101
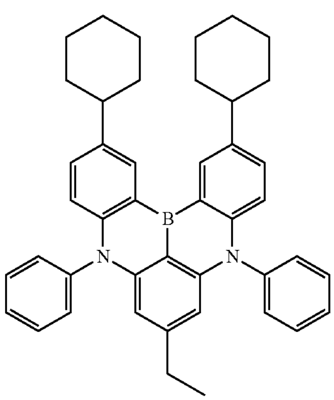
2-102
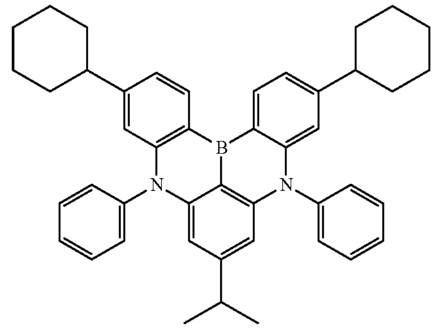
2-103
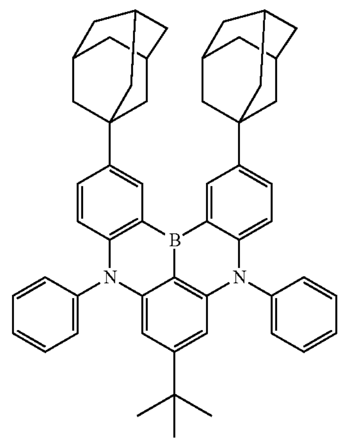
2-104
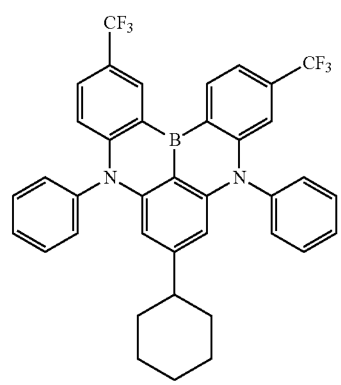
2-105
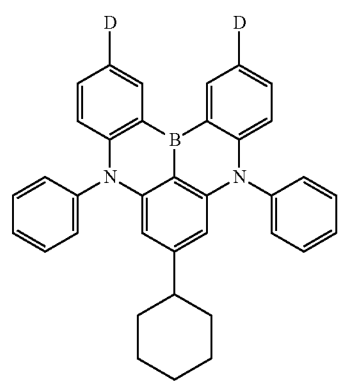

-continued
2-106
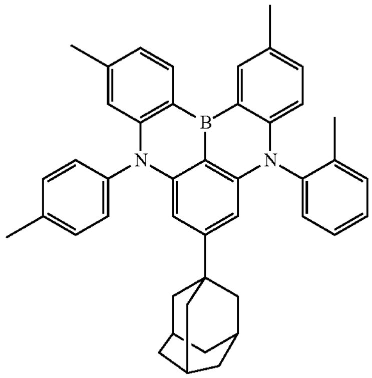
2-107
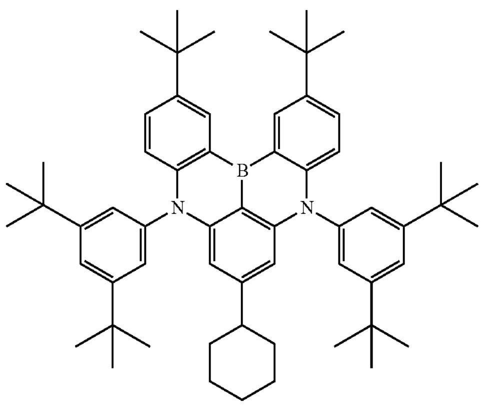
2-108
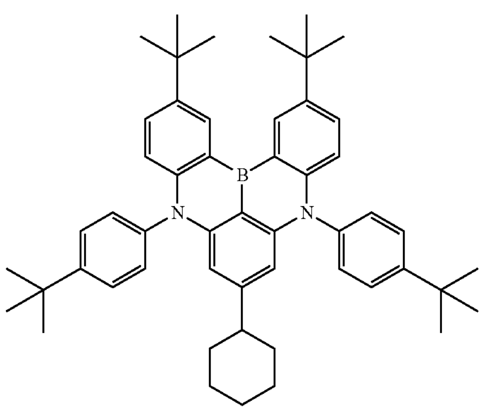
2-109
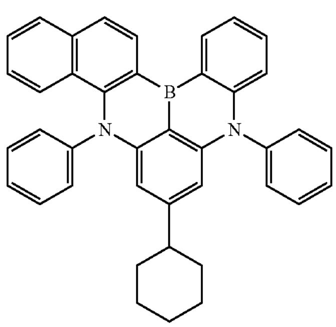
-continued
2-110
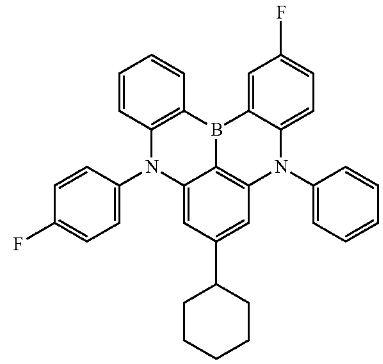
2-111
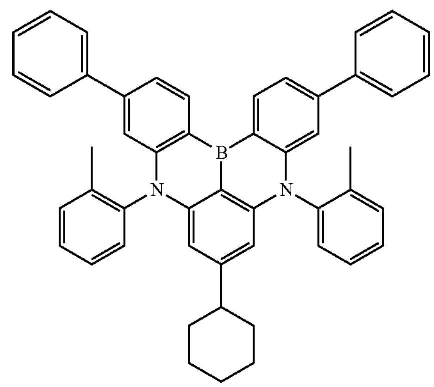
2-112
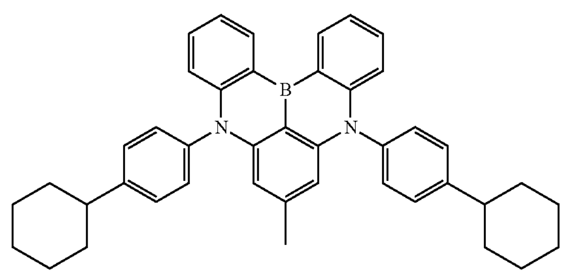
2-113
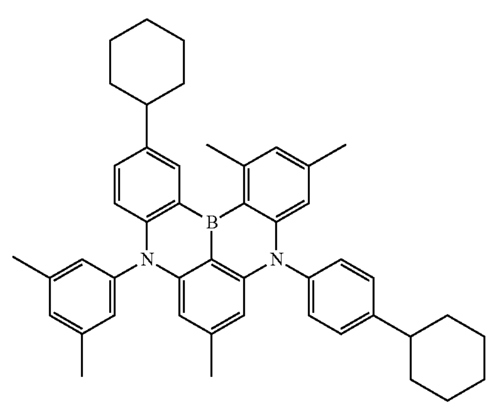

-continued
2-114
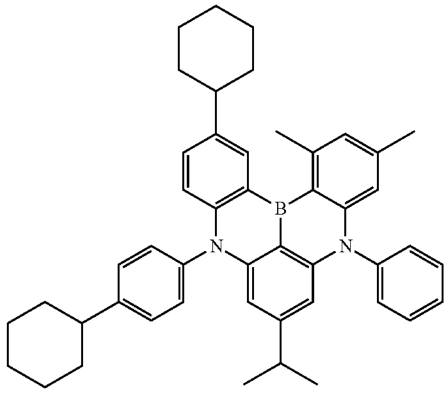
2-115
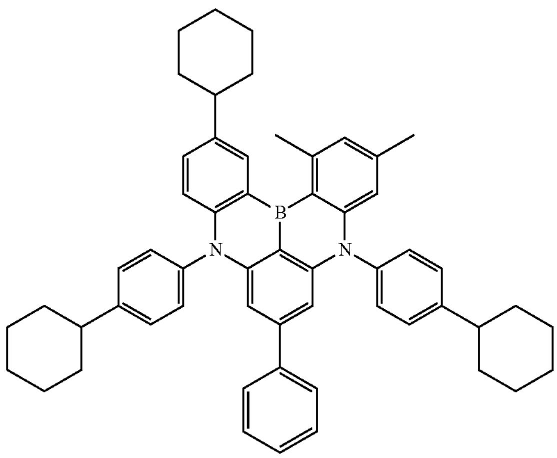
2-116
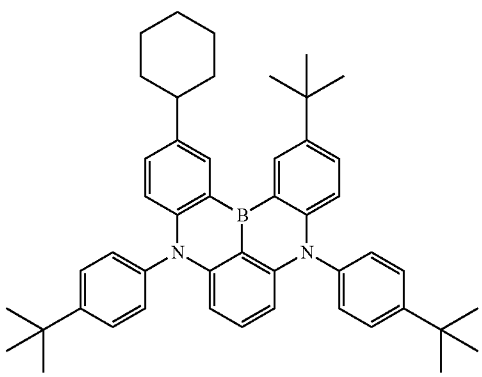
2-117
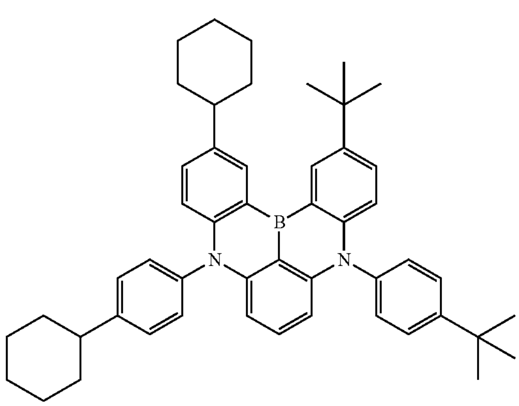
-continued
2-118
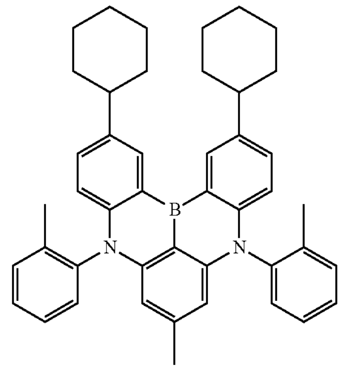
2-119
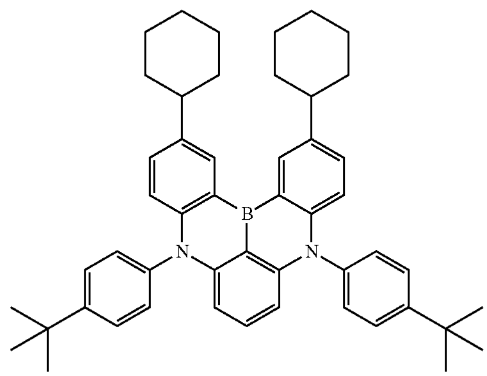
2-120
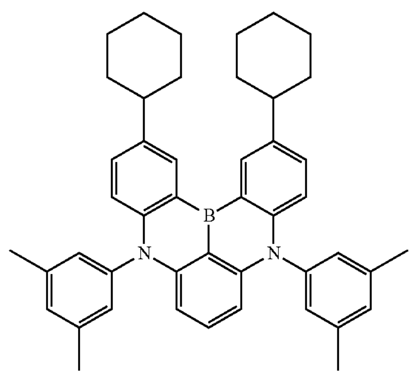
2-121
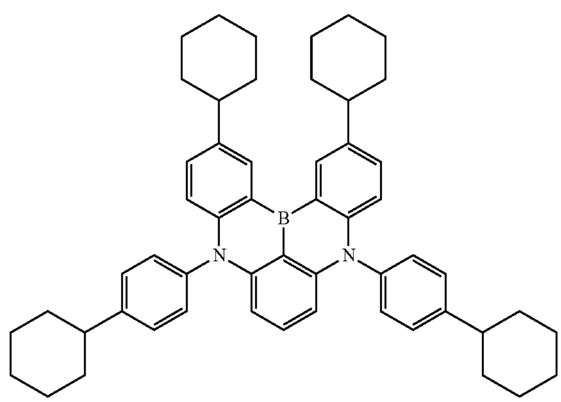

-continued
2-122
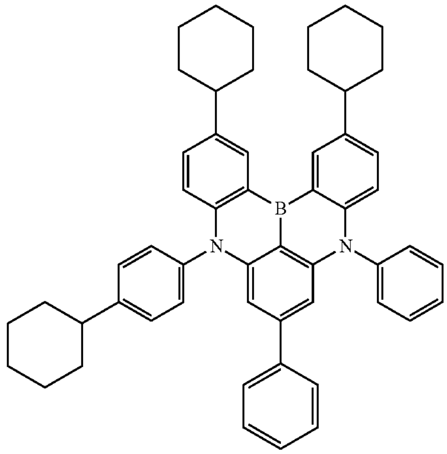
2-123
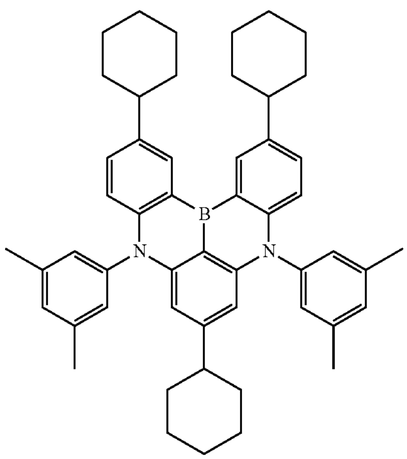
2-124
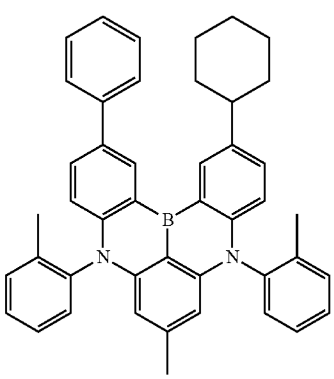
-continued
2-125
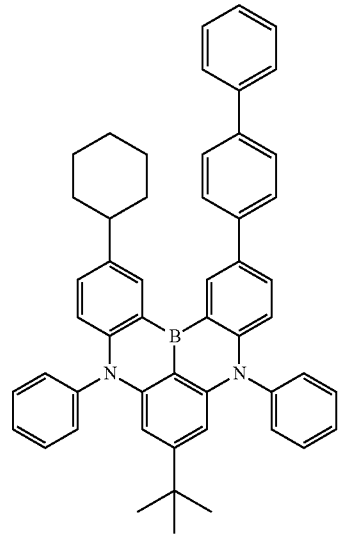
2-126
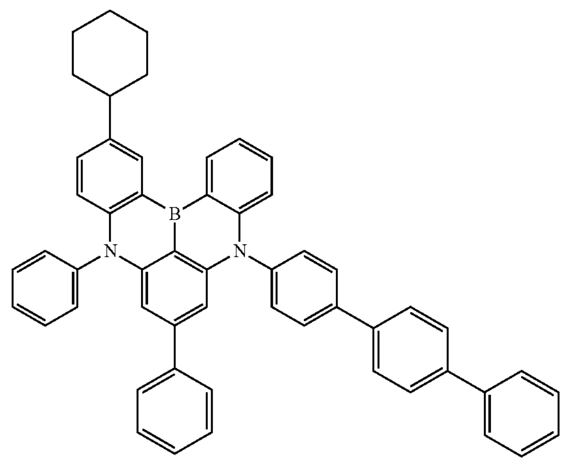
2-127
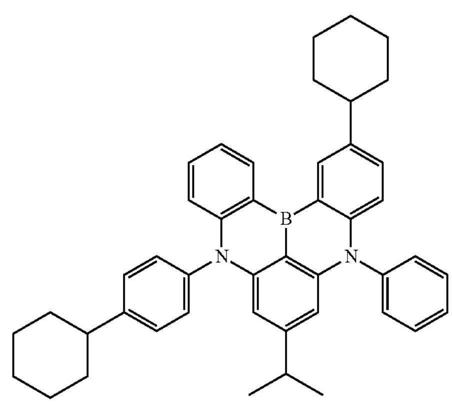

-continued
2-128
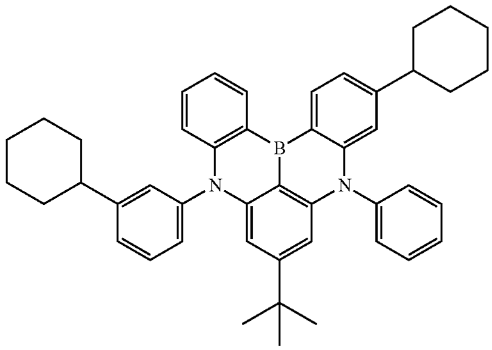
2-129
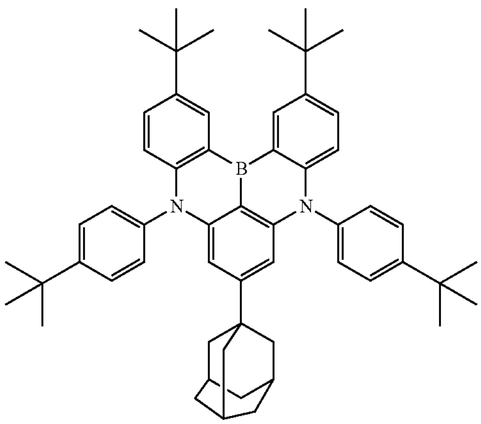
2-130
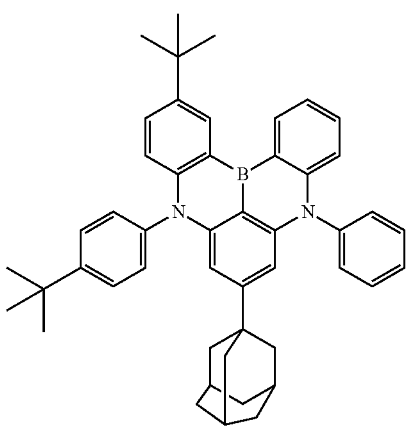
2-131
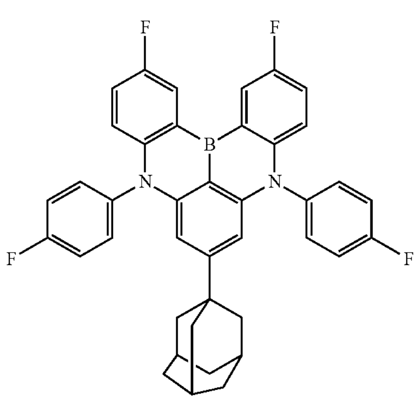
-continued
2-132
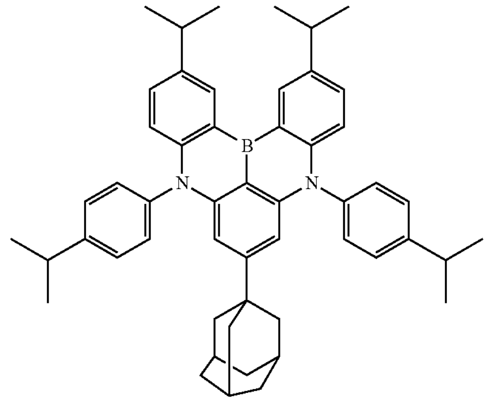
2-133
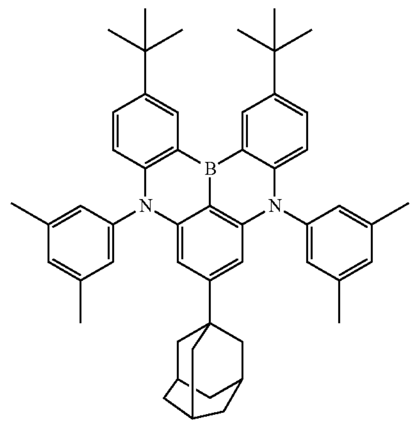
2-134
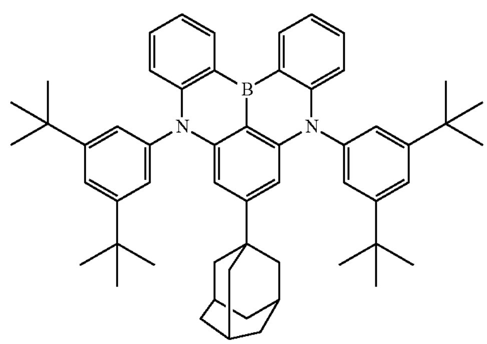
2-135
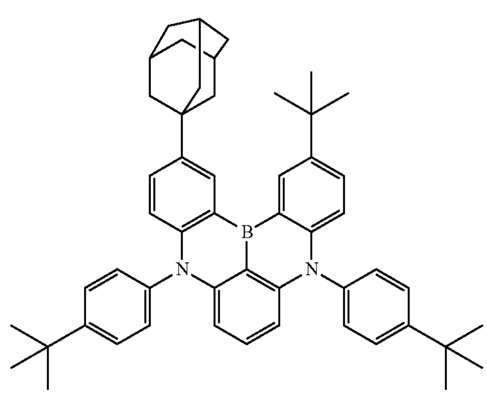

-continued
2-136
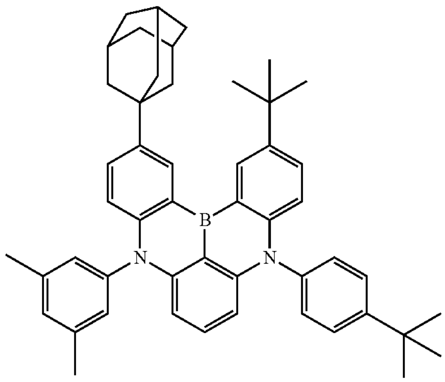
2-137
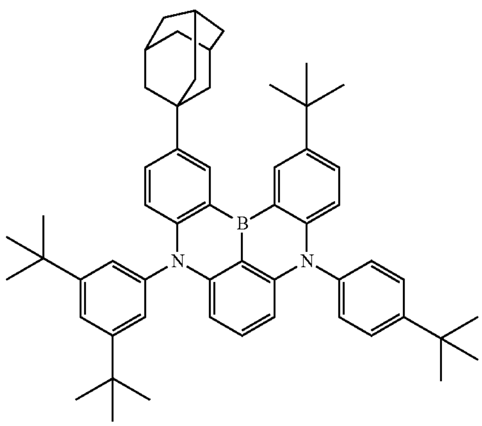
2-138
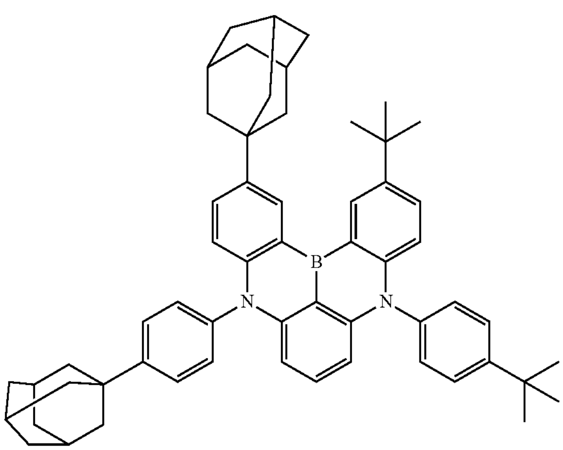
-continued
2-139
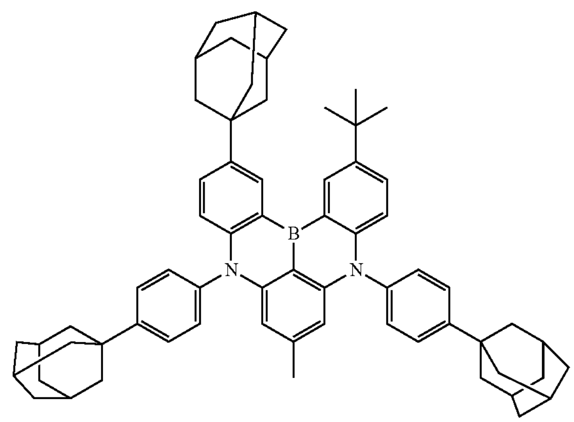
2-140
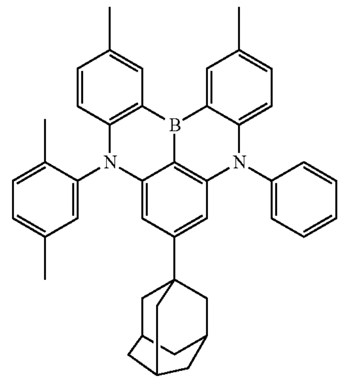
2-141
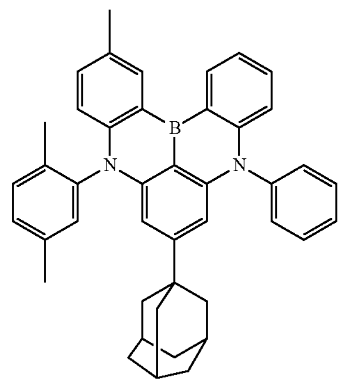
2-142
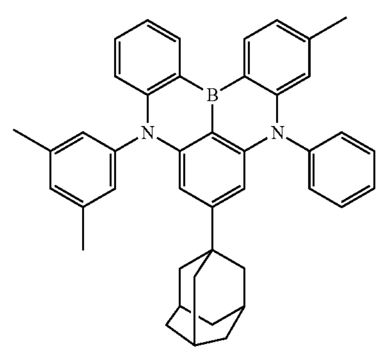

-continued
2-143
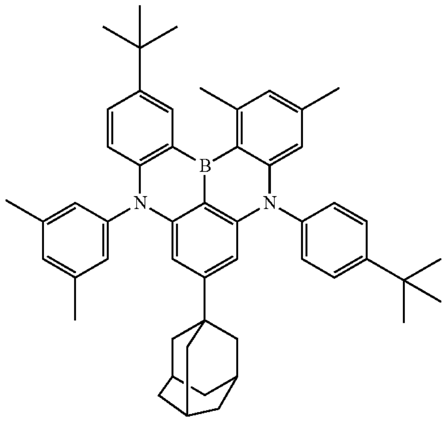
2-144
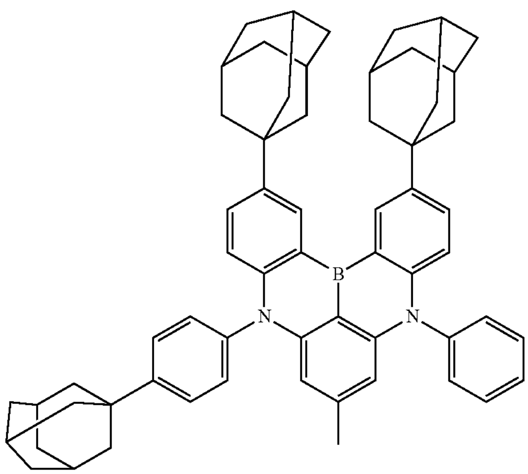
2-145
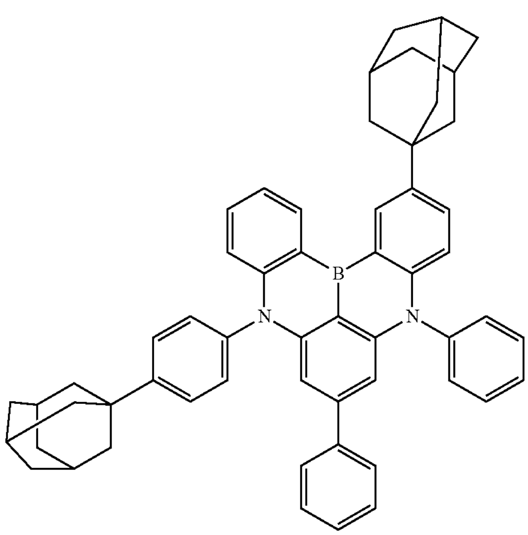
-continued
2-146
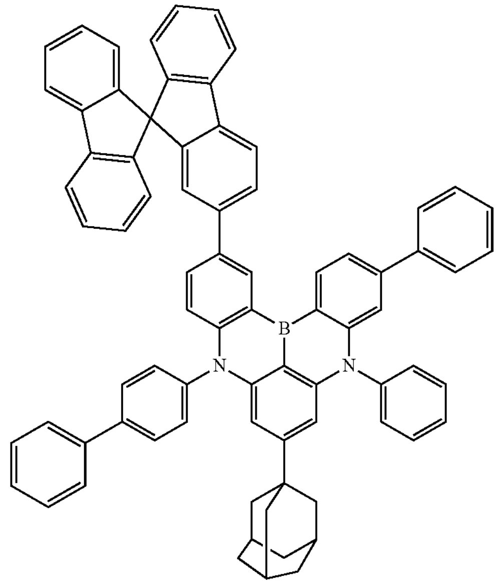
2-147
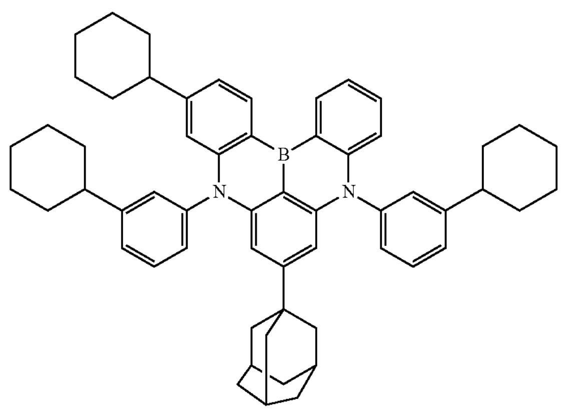
2-148
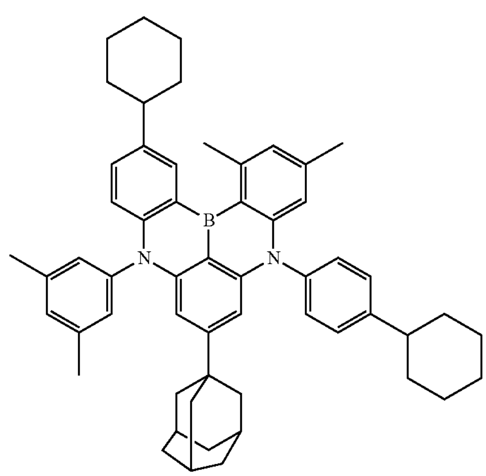

2-149
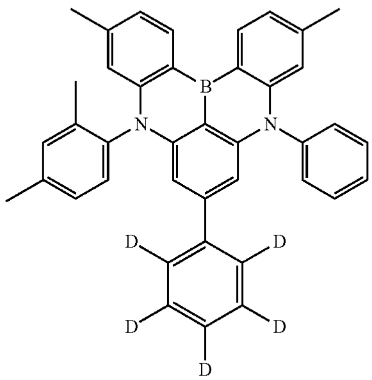
2-150
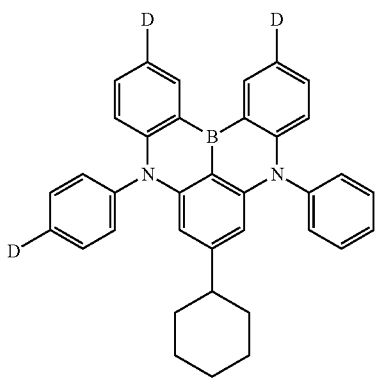
2-151
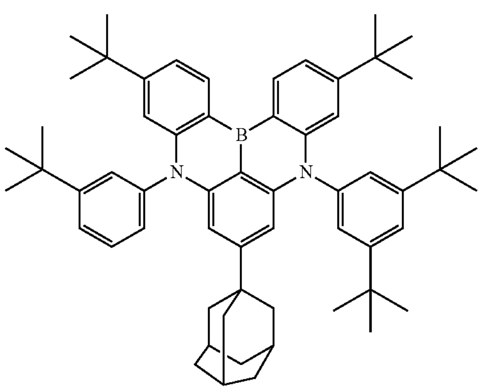
2-152
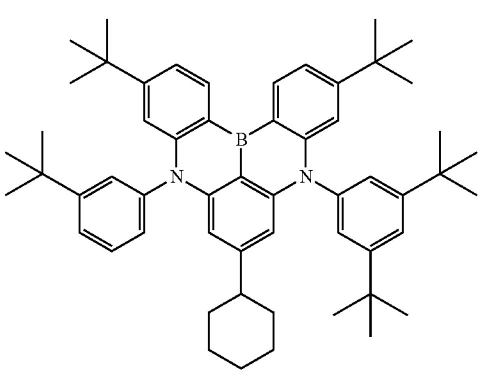
2-153
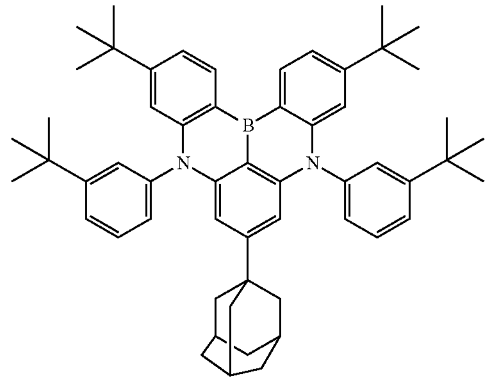
2-154
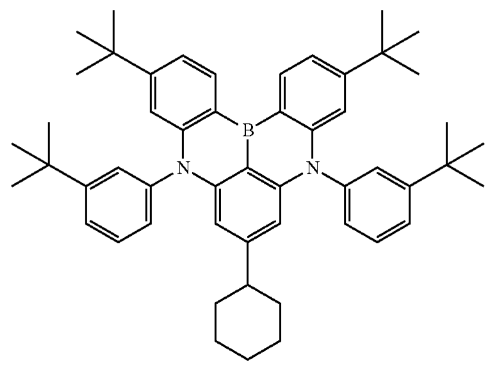
2-155
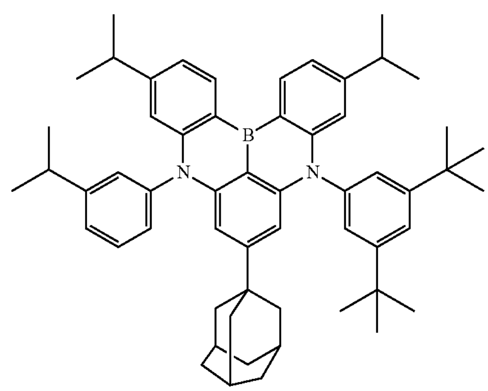
2-156
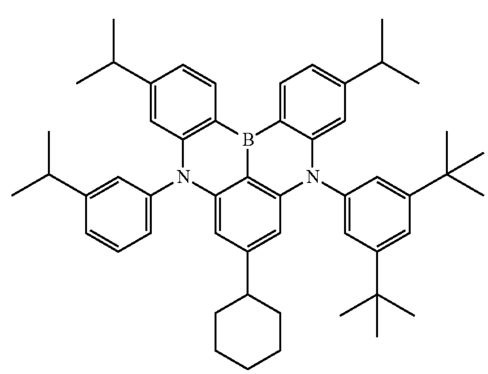

2-157
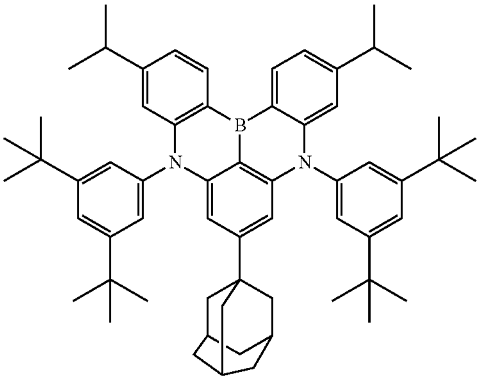
2-158
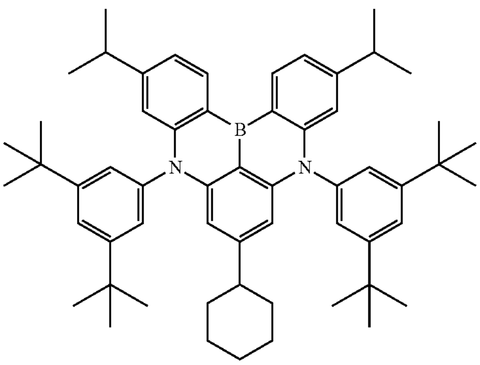
2-159
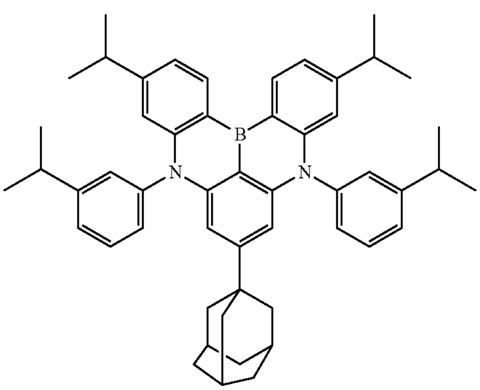
2-160
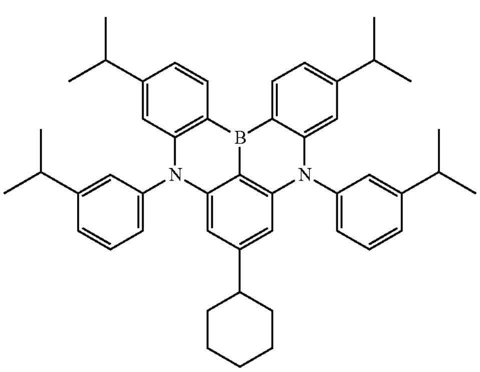
2-161
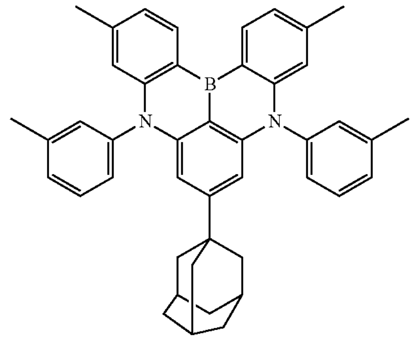
2-162
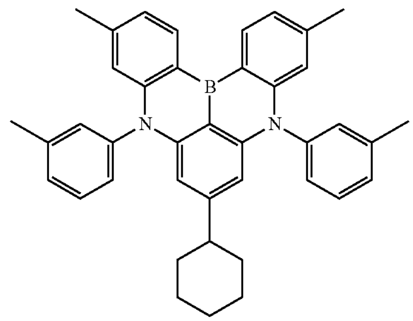
2-163
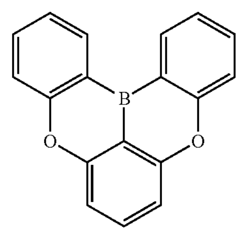
2-164
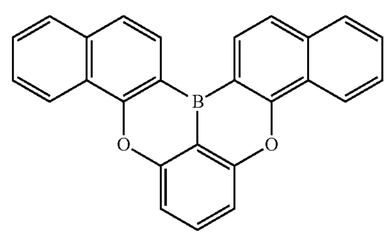
2-165
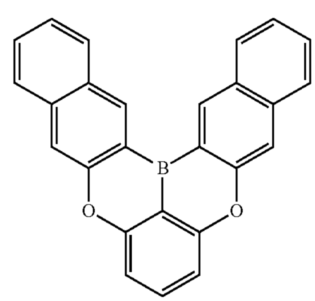

-continued
2-166
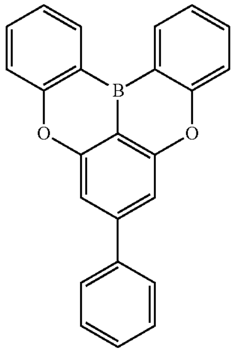
2-167
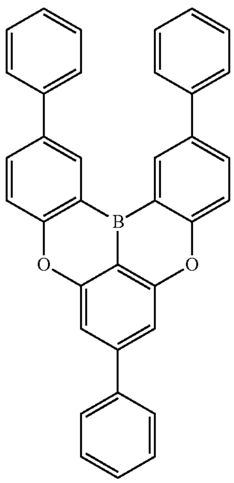
2-168
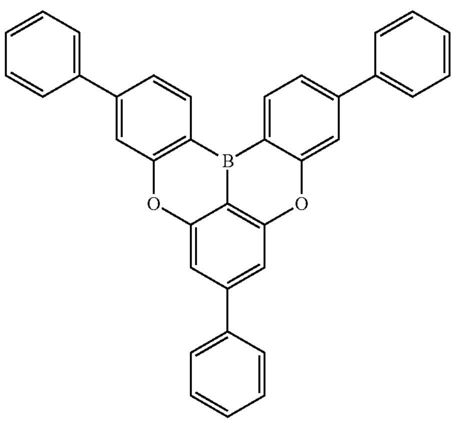
2-169
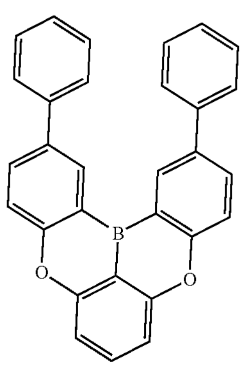
-continued
2-170
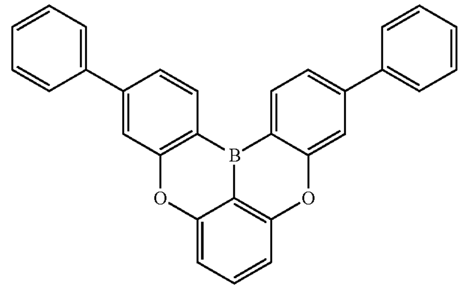
2-171
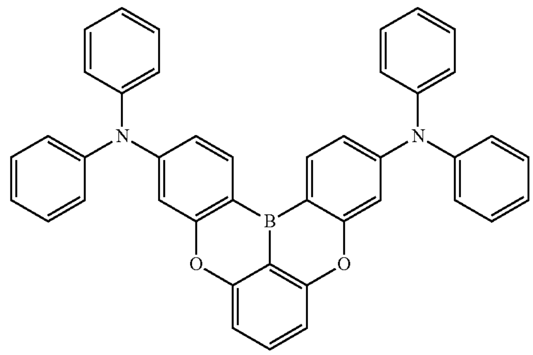
2-172
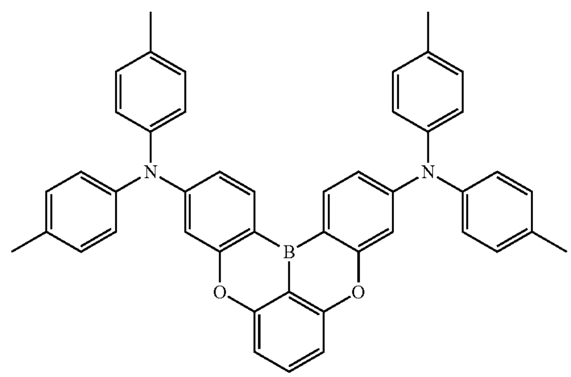
2-173
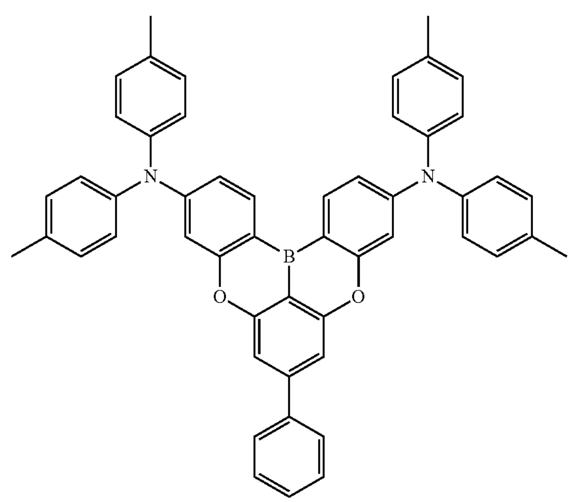

-continued
2-174
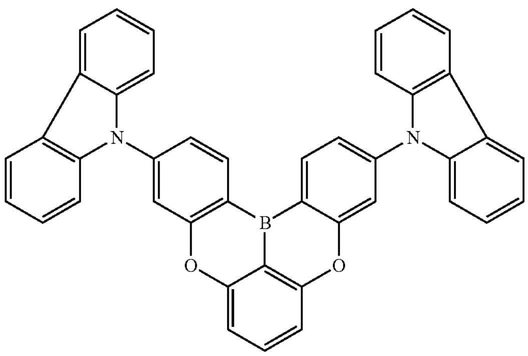
2-175
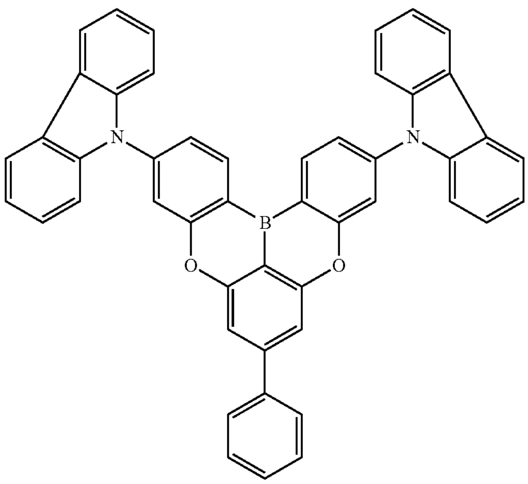
2-176
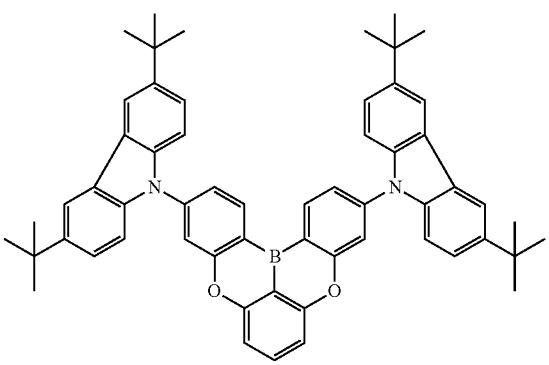
2-177
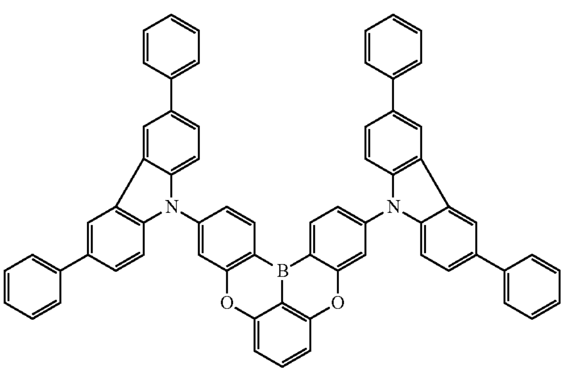
-continued
2-178
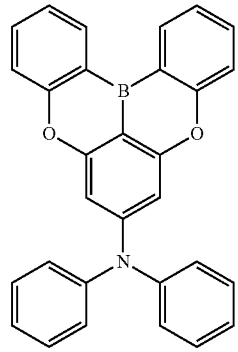
2-179
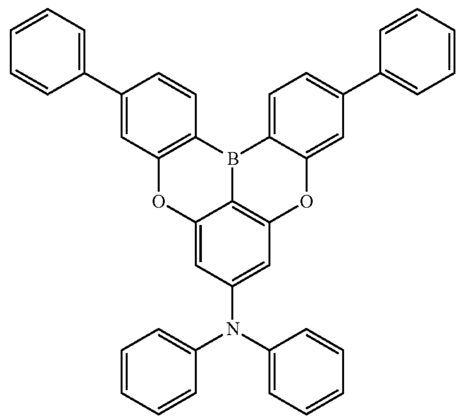
2-180
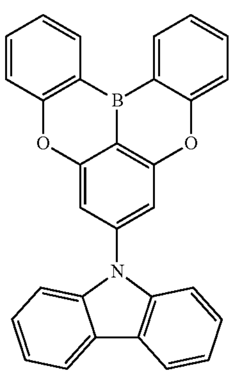

-continued
2-181
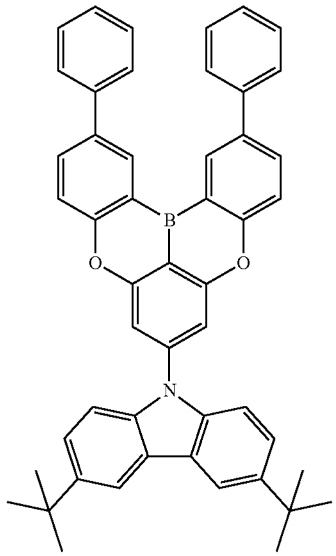
2-182
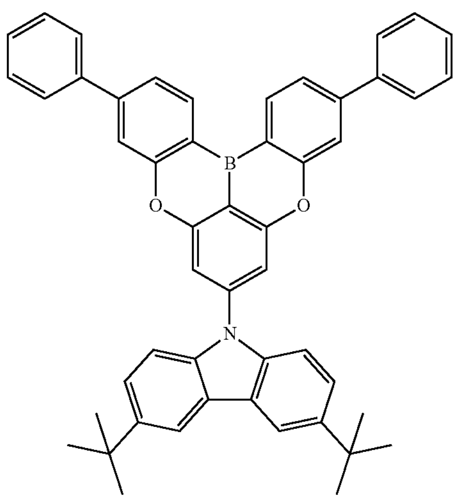
2-183
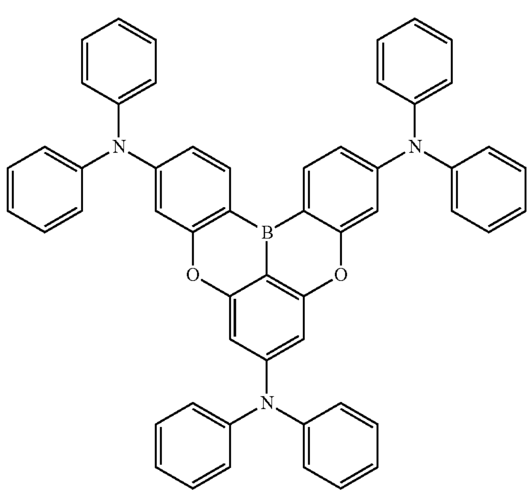
-continued
2-184
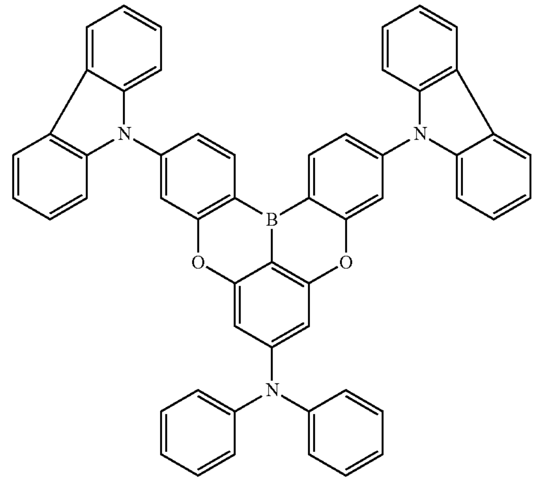
2-185
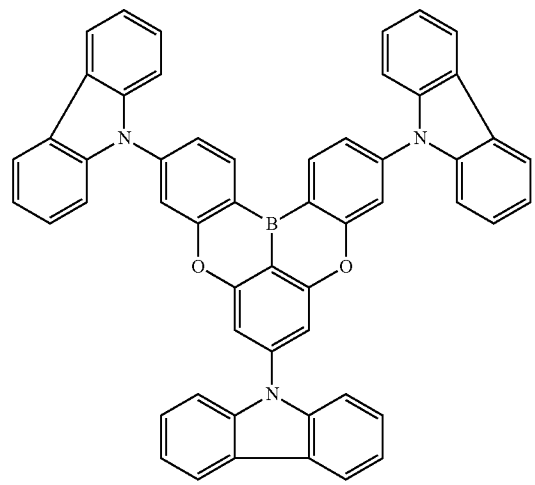
2-186
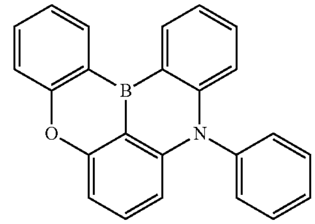
2-187
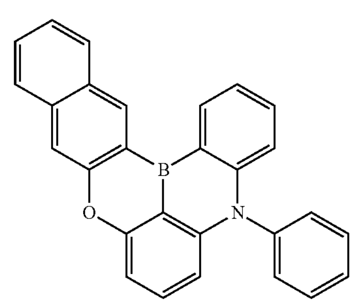

-continued
2-188
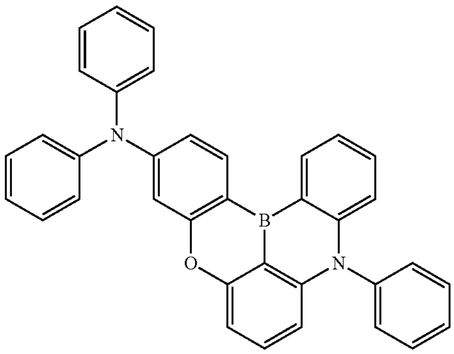
2-189
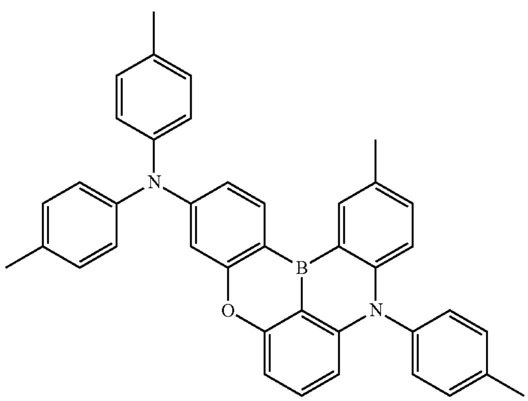
2-190
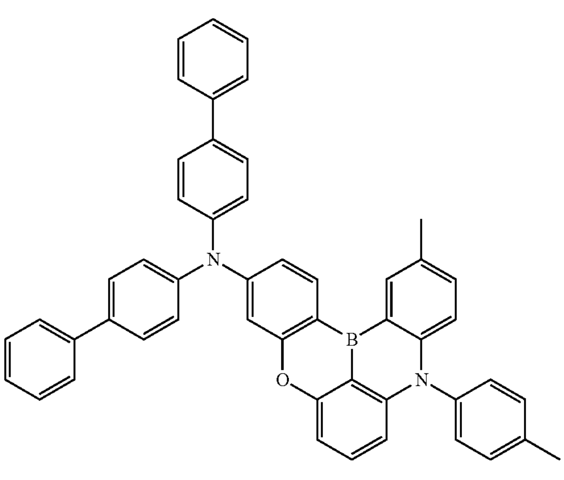
-continued
2-191
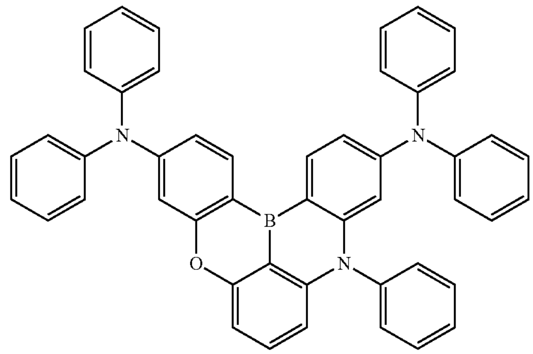
2-192
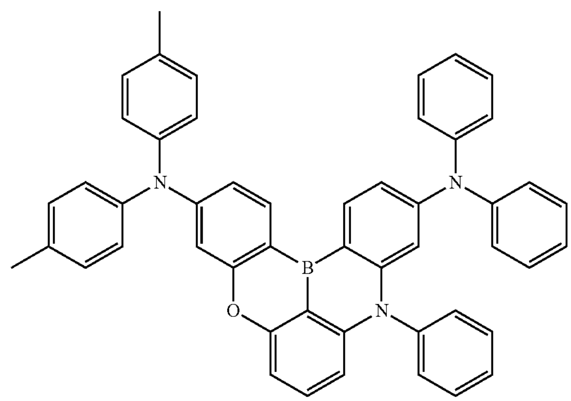
2-193
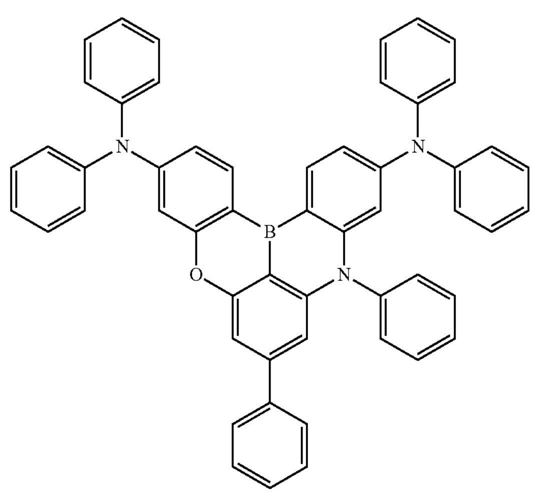

-continued 2-194

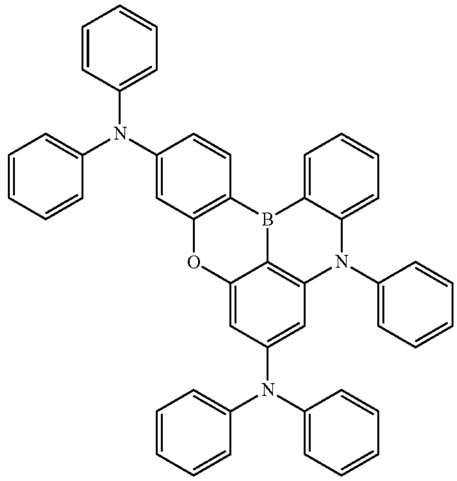

2-195

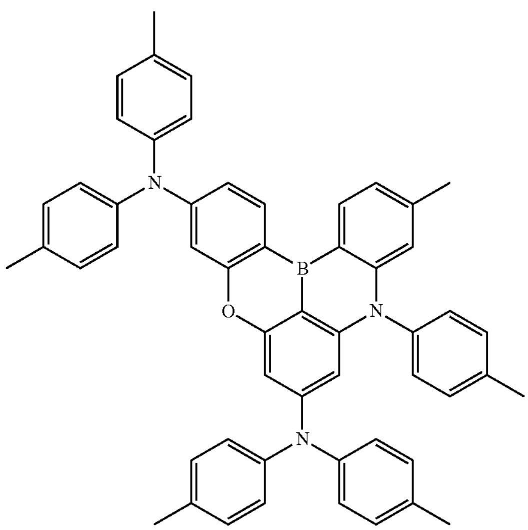

10. A display device, comprising the organic electroluminescent device of claim 1.

11. The display device of claim 10, wherein the display device is a flat display device.

12. The display device of claim 10, wherein the display device is a flexible display device.

13. The organic electroluminescent device of claim 1, wherein each of $L_1$ to $L_3$ independently represents a substituted or unsubstituted C6 or C10 arylene group, and each of $Ar_1$ and $Ar_2$ independently represents one selected from the group consisting of a substituted or unsubstituted C6 or C10 or C14 aryl group, a substituted or unsubstituted C12 heteroaryl group, a substituted or unsubstituted C6 cycloalkyl group.

14. The organic electroluminescent device of claim 13, wherein each of $R_3$ to $R_{12}$ independently represents one selected from the group consisting of hydrogen, a substituted or unsubstituted C1 or C3 or C4 alkyl group, a substituted or unsubstituted C6 or C10 cycloalkyl group, a substituted or unsubstituted C6 aryl group, a substituted or unsubstituted C7 to C30 aralkyl group, and a substituted or unsubstituted C12 arylamino group.

15. The organic electroluminescent device of claim 14, wherein adjacent two of $R_3$ to $R_{12}$ are coupled to each other to form a substituted or unsubstituted ring.

16. The organic electroluminescent device of claim 1, wherein the compound represented by the Chemical Formula 1 includes at least one selected from the following compounds:

1-4

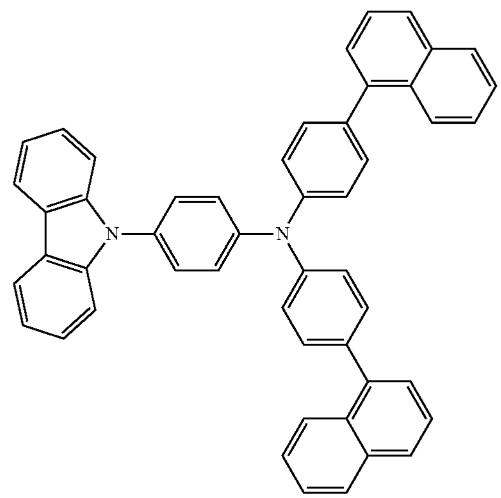

1-9

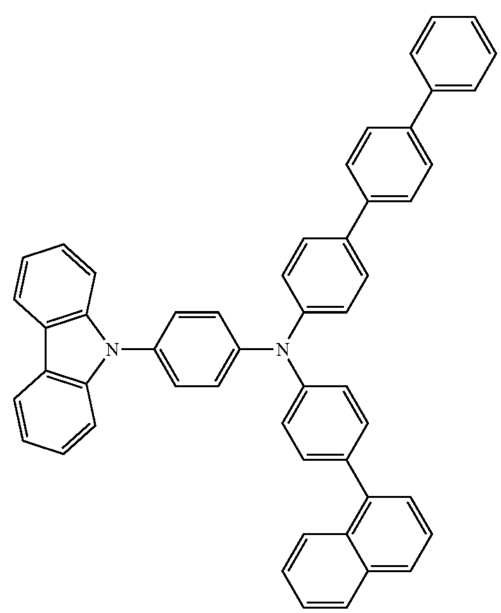

1-10
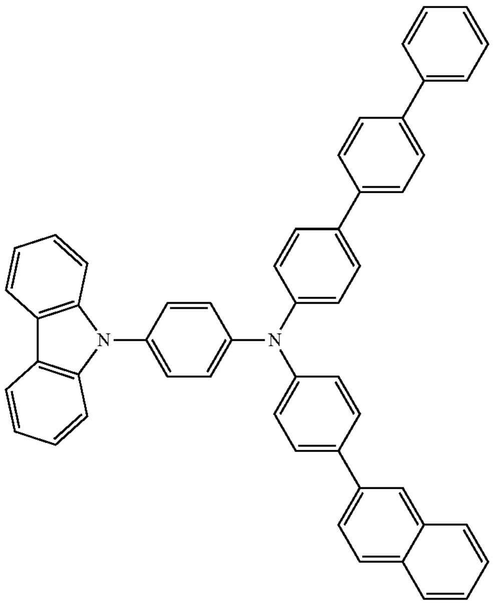
1-19
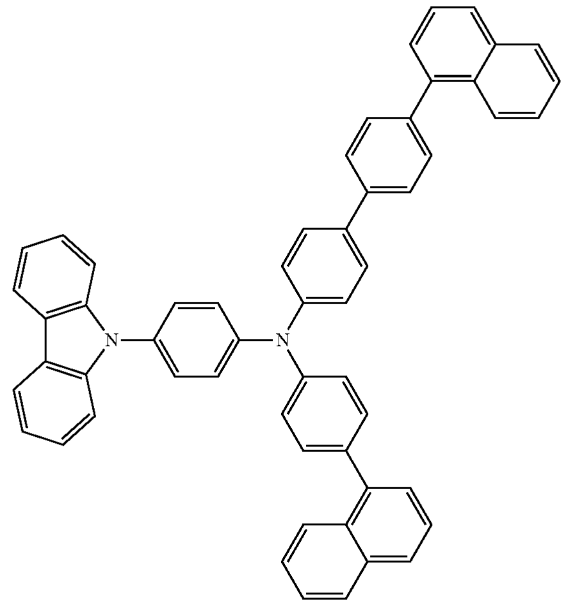
1-12
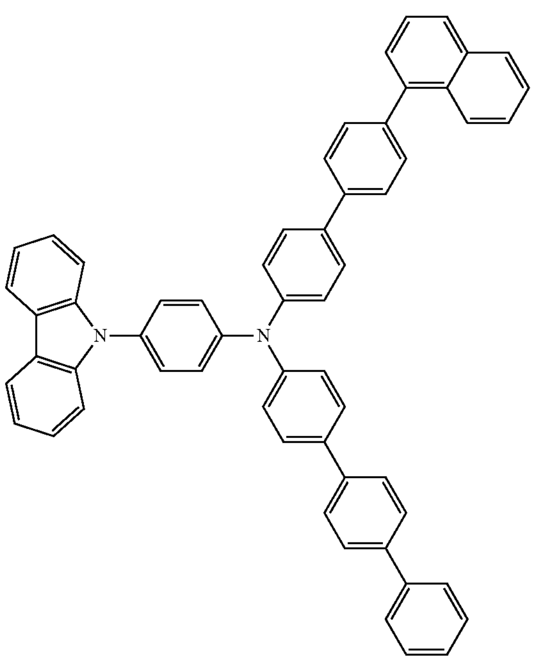
1-20
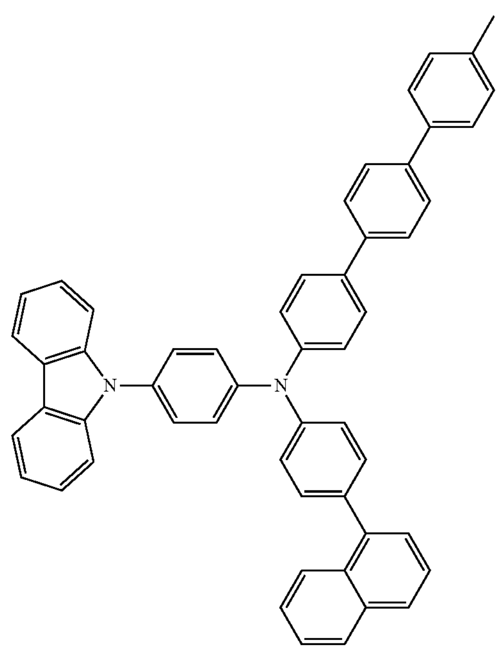

-continued
1-25
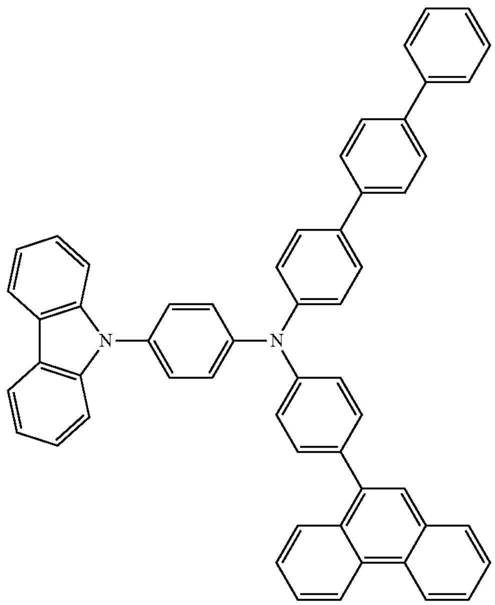
1-91
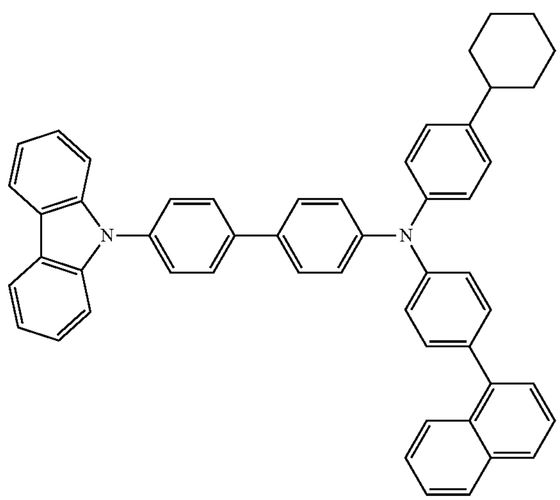
1-146
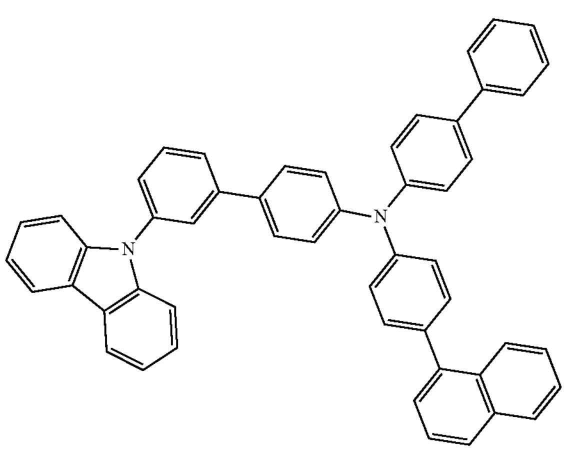
-continued
1-151
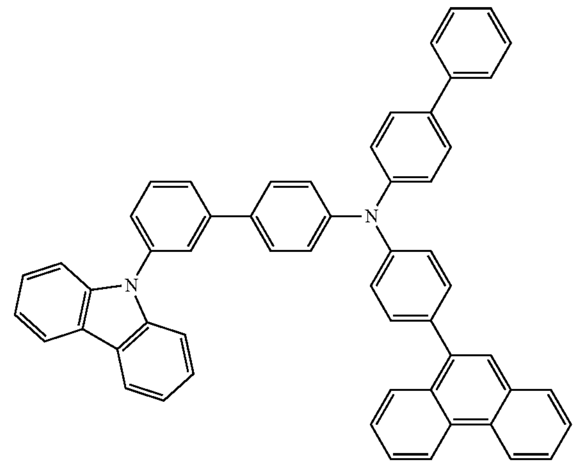
1-52
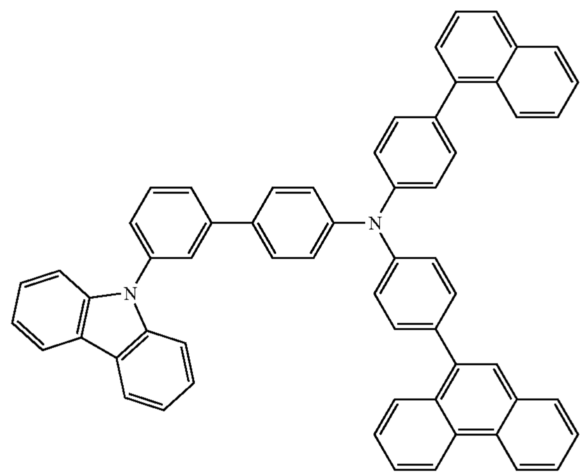
1-153
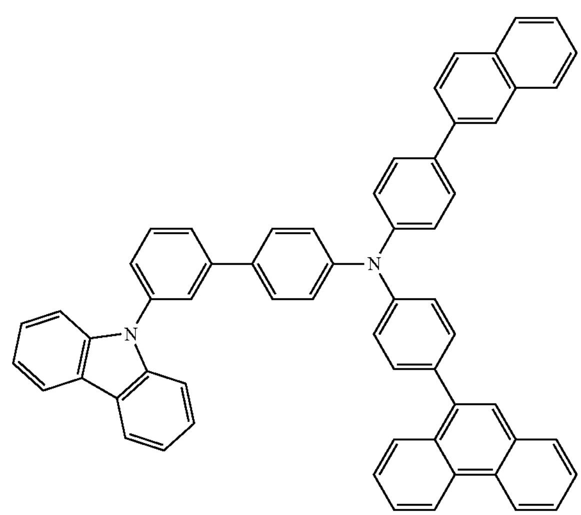

-continued
1-156
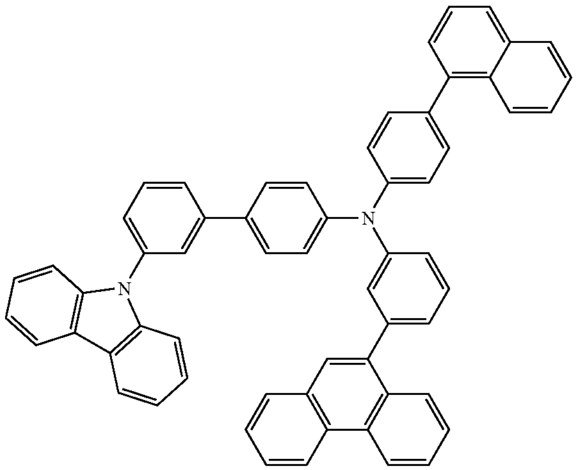
1-158
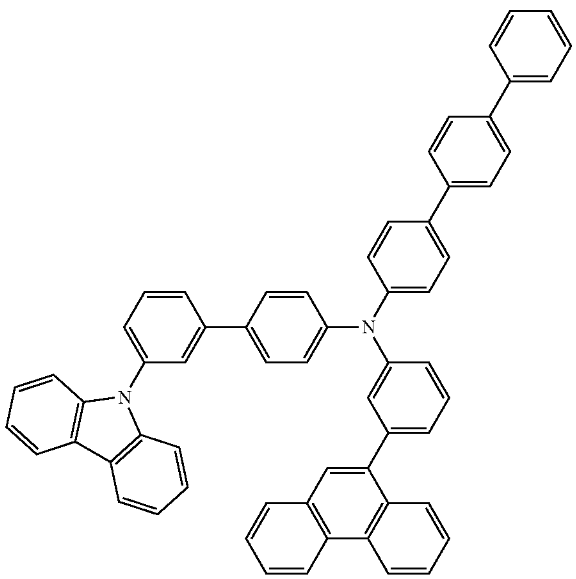
1-201
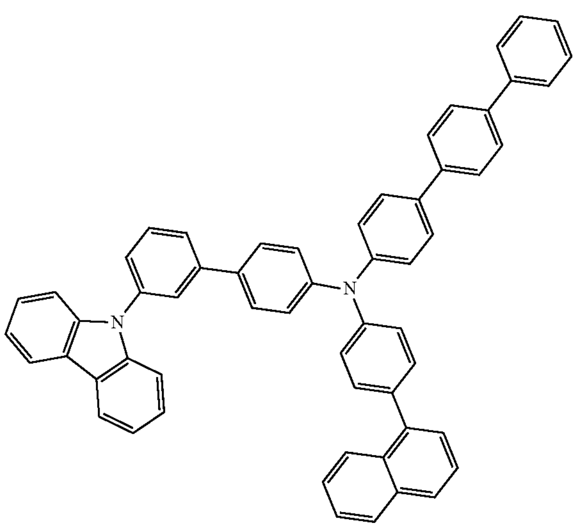
-continued
1-207
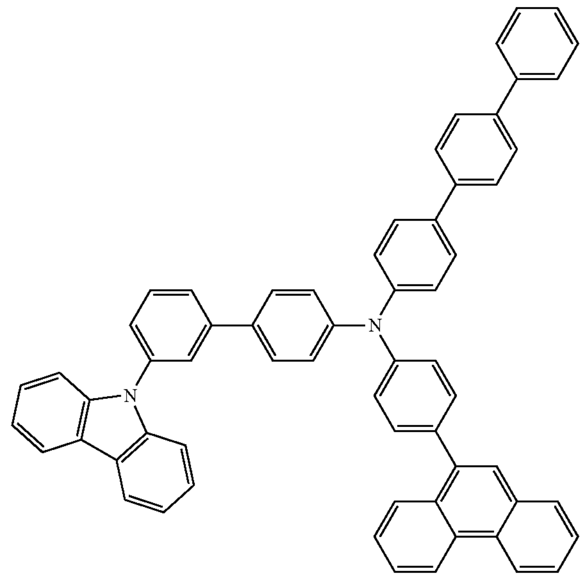
1-271
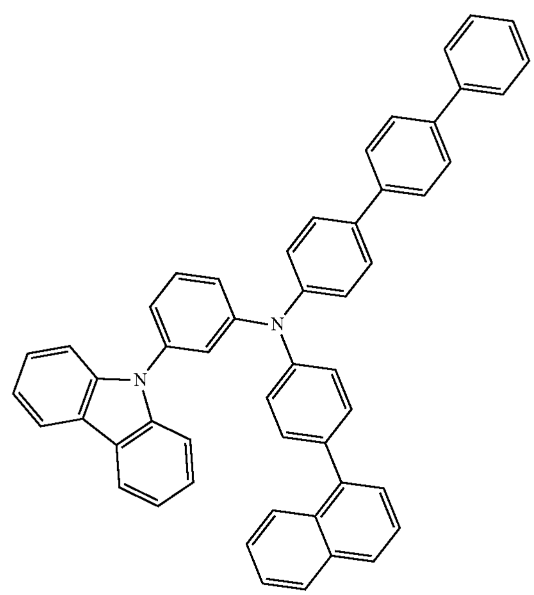

-continued
1-278
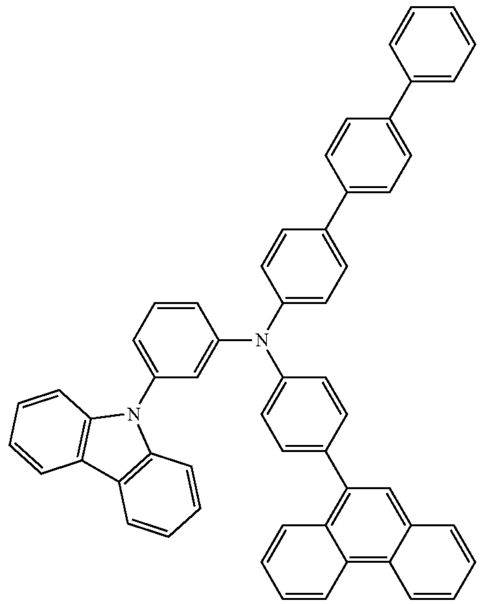
1-326
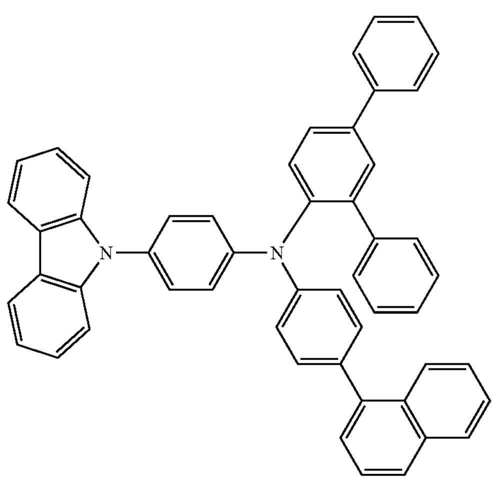
-continued
1-327
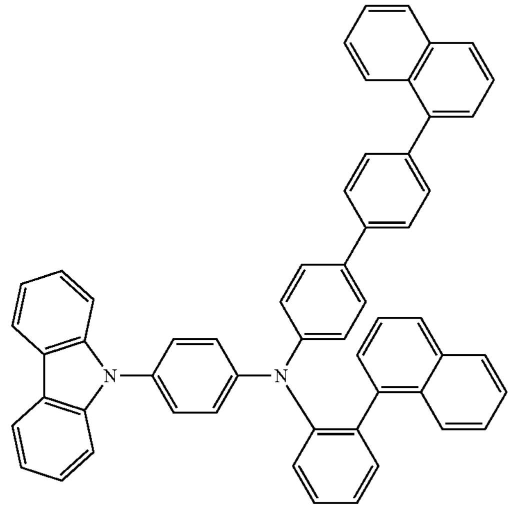
1-328
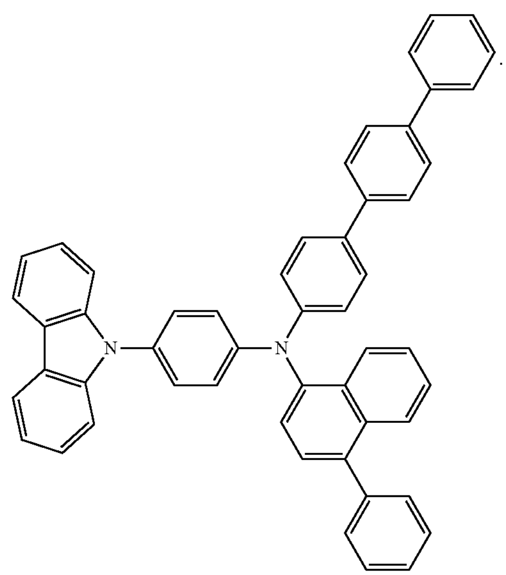
17. The organic electroluminescent device of claim 1, wherein the compound represented by the Chemical Formula 2 includes at least one selected from the following compounds:

-continued
2-108
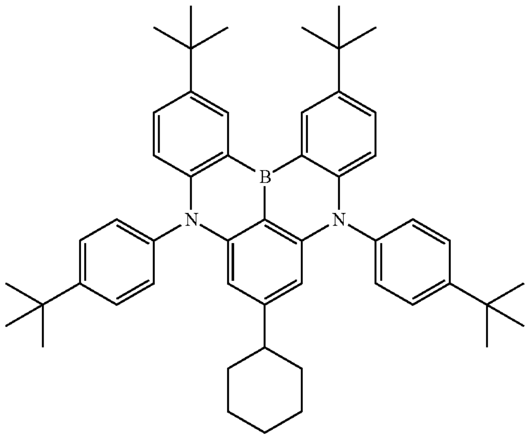
2-116
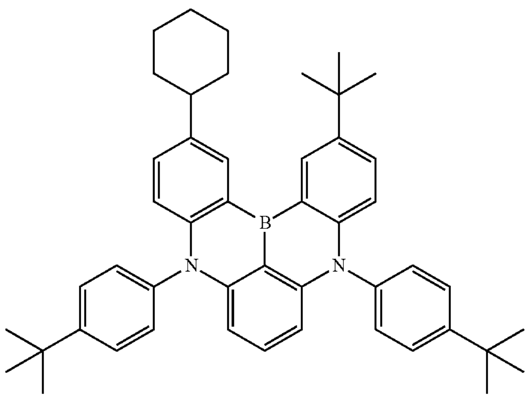
2-129
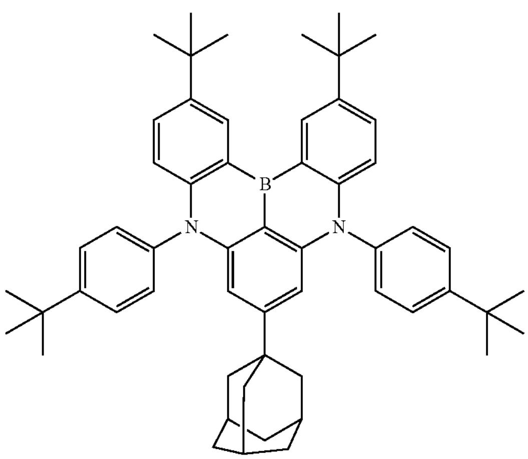
2-132
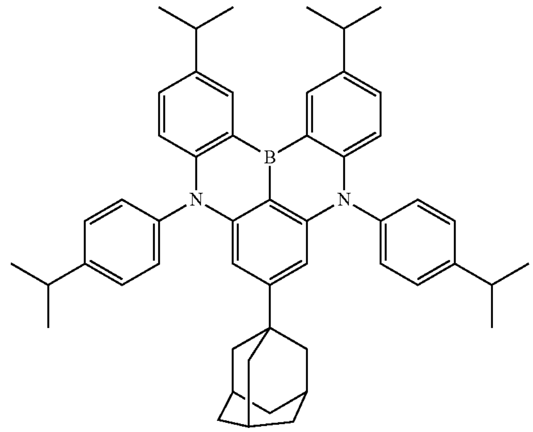
2-154
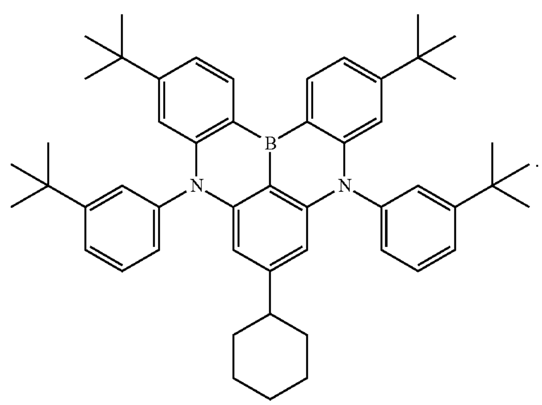
* * * * *